US005319755A

United States Patent [19]

Farmwald et al.

[11] Patent Number: 5,319,755

[45] Date of Patent: Jun. 7, 1994

[54] INTEGRATED CIRCUIT I/O USING HIGH PERFORMANCE BUS INTERFACE

[75] Inventors: Michael Farmwald, Berkeley; Mark Horowitz, Palo Alto, both of Calif.

[73] Assignee: Rambus, Inc., Mountain View, Calif.

[21] Appl. No.: 954,945

[22] Filed: Sep. 30, 1992

Related U.S. Application Data

[63] Continuation of Ser. No. 510,898, Apr. 18, 1990, abandoned.

[51] Int. Cl.[5] .............................................. G06F 13/00

[52] U.S. Cl. .................................. 395/325; 395/425; 364/240.3; 364/240.1; 364/243; 364/DIG. 1; 364/935.47; 364/940.2; 364/964; 364/DIG. 2

[58] Field of Search ....................... 395/325, 425, 725; 364/240.3, 240.1, 243, DIG. 1, 935.47, 940.2, 964, DIG. 2

[56] References Cited

U.S. PATENT DOCUMENTS

| | | | |
|---|---|---|---|
| 3,740,723 | 6/1973 | Beausoleil et al. | 395/425 |
| 3,758,761 | 9/1973 | Henrion | 371/8.1 |
| 3,771,145 | 11/1973 | Wiener | 365/240 |
| 3,821,715 | 6/1974 | Hoff et al. | 340/173 |
| 3,882,470 | 5/1975 | Hunter | 364/200 |
| 3,924,241 | 12/1975 | Kronies | 395/425 |
| 3,969,706 | 7/1976 | Proebsting et al. | 365/189.02 |
| 3,972,028 | 7/1976 | Weber et al. | 395/425 |
| 3,975,714 | 8/1976 | Weber et al. | 395/800 |
| 3,983,537 | 9/1976 | Parsons et al. | 395/425 |
| 4,007,452 | 2/1977 | Hoff | 365/63 |
| 4,038,648 | 7/1977 | Chesley | 365/201 |
| 4,099,231 | 7/1978 | Kotok et al. | 395/425 |
| 4,191,996 | 3/1980 | Chesley | 395/425 |
| 4,205,373 | 5/1980 | Shah | 395/425 |
| 4,247,817 | 1/1981 | Heller | 307/354 |
| 4,249,247 | 2/1981 | Patel | 395/425 |
| 4,286,321 | 8/1981 | Baker et al. | 364/200 |
| 4,306,298 | 12/1981 | McElroy | 395/425 |
| 4,315,308 | 2/1982 | Jackson | 364/200 |
| 4,333,142 | 6/1982 | Chesley | 395/500 |
| 4,355,376 | 10/1982 | Gould | 365/200 |
| 4,373,183 | 2/1983 | Means et al. | 395/400 |
| 4,385,350 | 5/1983 | Hansen et al. | 365/229 |
| 4,443,864 | 4/1984 | McElroy | 395/325 |
| 4,449,207 | 5/1984 | Kung et al. | 365/189.02 |
| 4,468,738 | 8/1984 | Hansen et al. | 395/325 |
| 4,470,114 | 9/1984 | Gerhold | 395/325 |
| 4,481,625 | 11/1984 | Roberts et al. | 370/85 |
| 4,488,218 | 12/1984 | Grimes | 395/325 |
| 4,500,905 | 2/1985 | Shibata | 357/68 |
| 4,519,034 | 5/1985 | Smith et al. | 395/550 |
| 4,595,923 | 6/1986 | McFarland, Jr. | 340/825.5 |
| 4,630,193 | 12/1986 | Kris | 395/325 |
| 4,646,270 | 2/1987 | Voss | 365/189.02 |
| 4,649,511 | 3/1987 | Gdula | 395/425 |
| 4,649,516 | 3/1987 | Chung et al. | 395/250 |

(List continued on next page.)

FOREIGN PATENT DOCUMENTS 1-166545 6/1989 Japan .

[57] ABSTRACT

An apparatus for storing and retrieving data is described. The apparatus includes a circuitry for initiating data transmission, a first memory, a second memory, and a multiline bus for transferring control information, addresses, and the data. The control information includes information for selecting one of the first and second memories without using any separate memory select line. Configuration circuitry is provided for assigning a first identification value to the first memory and a second identification value to the second memory. The configuration circuitry includes a first reset line for coupling the circuitry for initiating data transmission to the first memory, a second reset line for coupling the first memory to the second memory, a first identification register for the first memory, a second identification register for the second memory, circuitry for generating a first reset signal and a second reset signal and for sending the first and second reset signals to the first identification register, circuitry for propagating the first and second reset signals from the first identification register to the second identification register, circuitry for resetting the first and second identification registers in response to the first reset signal, and circuitry for setting the first identification register to the first identification value and the second identification register to the second identification value in response to the second reset signal.

59 Claims, 8 Drawing Sheets

U.S. PATENT DOCUMENTS

| | | | |
|---|---|---|---|
| 4,654,655 | 3/1987 | Kowalski | 340/825.5 |
| 4,706,166 | 11/1987 | Go | 361/403 |
| 4,719,627 | 1/1988 | Peterson et al. | 371/40.2 |
| 4,745,548 | 5/1988 | Blahut | 395/425 |
| 4,764,846 | 8/1988 | Go | 361/388 |
| 4,770,640 | 9/1988 | Walter | 439/69 |
| 4,779,089 | 10/1988 | Theus | 340/825.5 |
| 4,785,394 | 11/1988 | Fischer | 395/325 |
| 4,811,202 | 3/1989 | Schabowski | 395/325 |
| 4,818,985 | 4/1989 | Ikeda | 340/825.5 |
| 4,837,682 | 6/1989 | Culler | 395/325 |
| 4,860,198 | 8/1989 | Takenaka | 364/200 |
| 4,933,835 | 6/1990 | Sachs et al. | 364/200 |
| 4,975,763 | 12/1990 | Baudouin et al. | 357/74 |
| 5,023,488 | 6/1991 | Gunning | 307/475 |
| 5,179,670 | 1/1993 | Farmwald et al. | 395/325 |

OTHER PUBLICATIONS

Hawley, David, "Superfast Bus Supports Sophisticated Transactions", *High Performance Systems,* Sep. 1989.

International Search Report Dated Jul. 8, 1991 for PCT Pat. Application No. PCT/US91/02590 filed Apr. 16, 1991.

T. Yang, M. Horowitz, B. Wooley, "A 4-ns 4K×1-bit Two-Port BiCMOS SRAM," IEEE Journal of Solid-State Circuits, vol. 23, No. 5, pp. 1030-1040 (Oct. 1988).

"Burndy Connects" Advertisement, Electronic Engineering Times, pp. T24-T25 (Feb. 24, 1986).

J. Frisone, "A Classification for Serial Loop Data Communications Systems," Raleigh Patent Operations (Nov. 2, 1972).

A. Khan, "What's the Best Way to Minimize Memory Traffic," High Performance Systems, pp. 59-67 (Sep. 1989).

N. Margulis, "Single Chip RISC CPU Eases System Design," High Performance Systems, pp. 34-36, 40-41, 44 (Sep. 1989).

R. Matick, "Comparison of Memory Chip Organizations vs. Reliability in Virtual Memories," FTCS 12th Annual International Symposium Fault-Tolerant Computing, IEEE Computer Society Fault-Tolerant Technical Commitee, pp. 223-227 (Jun. 22, 1984).

U.S. Pat. Application Ser. No. 444, 643, filed Dec. 1, 1989, of Farmwald.

Agarwal et al., "Scaleable Director Schemes for Cache Consistency," 15th Intern. Sump. Comp. Architecture, pp. 280-289 (Jun. 1988).

Agarwal et al., "An Analytic Cache Model," ACM Trans. on Comp Sys., vol. 7(2), pp. 184-215 (May 1989).

Davidson, "Electrical Design of a High Speed Computer Package," IBM J. Res. Develop., vol. 26, No. 3, pp. 349-361 (1982).

Hart, "Multiple Chips Speed CPU Subsystems," High-Performance Systems, pp. 46-55 (Sep. 1989).

Beresford, "How to Tame High Speed Design," High-Performance Systems, pp. 78-83 (Sep. 1989).

Carson, "Advance On-Focal Plane Signal Processing for Non-Planar Infrared Mosaics," SPIE, vol. 311, pp. 53-58 (1981).

Chesley, "Virtual Memory Integration," Submitted to IEETC (Sep. 1983).

Horowitz et al., "MIPS-X: A 20-MIPS Peak 32-Bit Microprocessor with ON-Chip Cache," IEEE J. Solid State Circuits, vol. SC-22, No. 5, pp. 790-798 (Oct. 1987).

Kwon et al., "Memory Chip Organizations for Improved Reliability in Virtual Memories," IBM Technical Disclosure Bulletin, vol. 25, No. 6, pp. 2952-2957 (Nov. 1982).

Pease et al., "Physical Limits to the Useful Packaging Density of Electronic Systems," (Sep. 1988).

Peterson, "System-Level Concerns Set Performance Gains," High-Performance Systems, pp. 71-77 (Sep. 1989).

Wooley et al., "Active Substrate System Integration," Private Communication, Semiconductor Research Corporation, 4 pages (Mar. 15, 1988).

H. Schumacher, "CMOS Subnanosecond True-ECL Output Buffer", IEEE Journal of Solid-State Circuits, vol. 25, No. 1, pp. 150-154 (Feb. 1990).

*Primary Examiner*—Michael R. Fleming
*Assistant Examiner*—Glenn A. Auve
*Attorney, Agent, or Firm*—Blakely, Sokoloff, Taylor & Zafman FIG_1
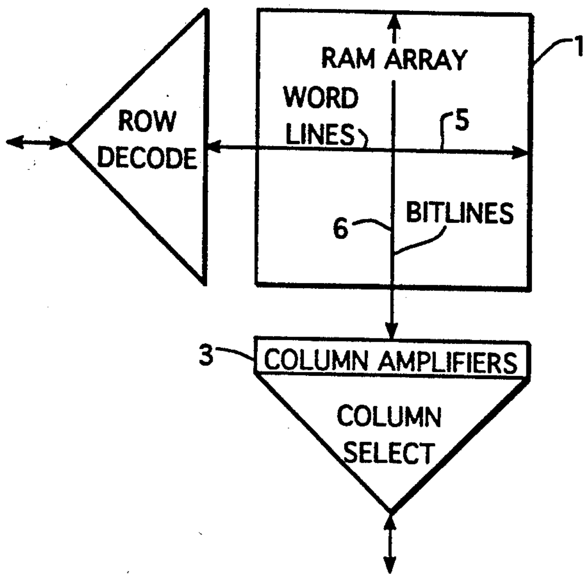
FIG_2
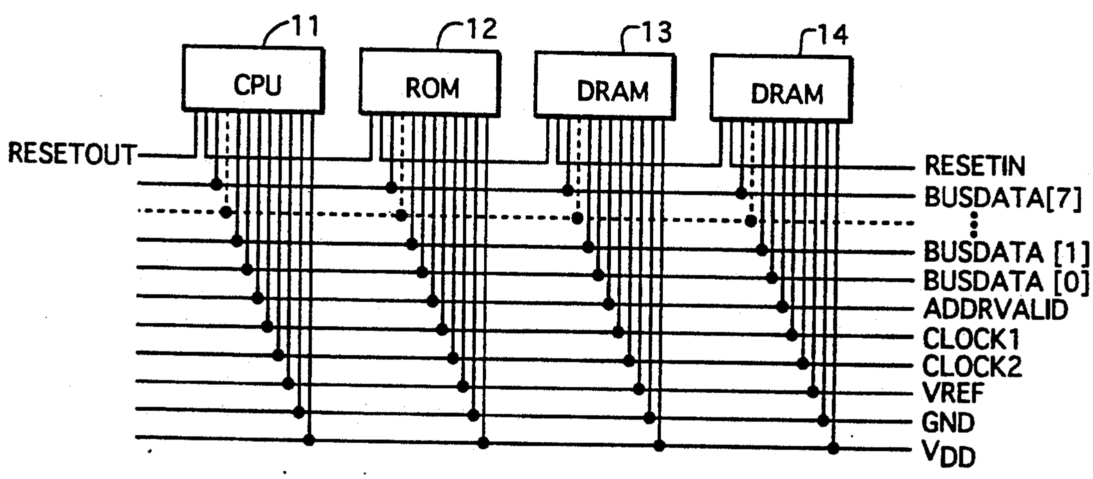
FIG_3
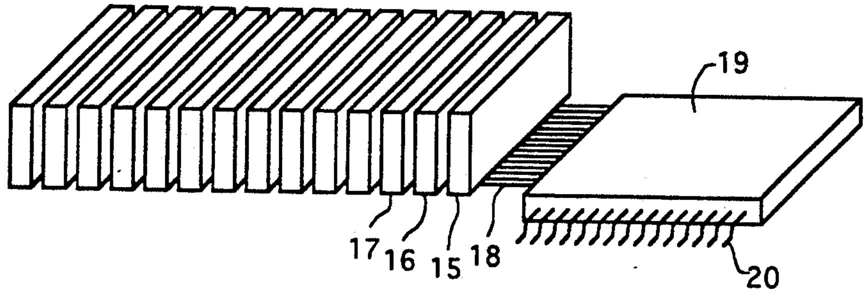

FIG_4 REGULAR ACCESS
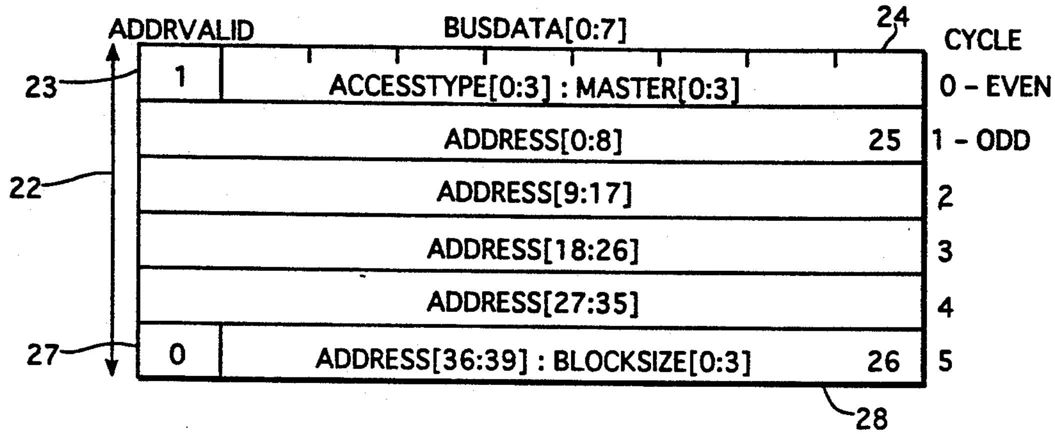
FIG_5 REJECT (NACK) CONTROL PACKET
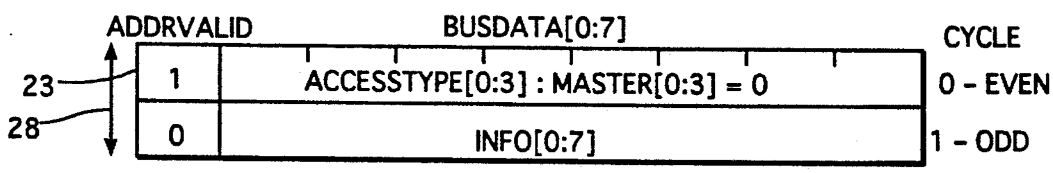
FIG_6
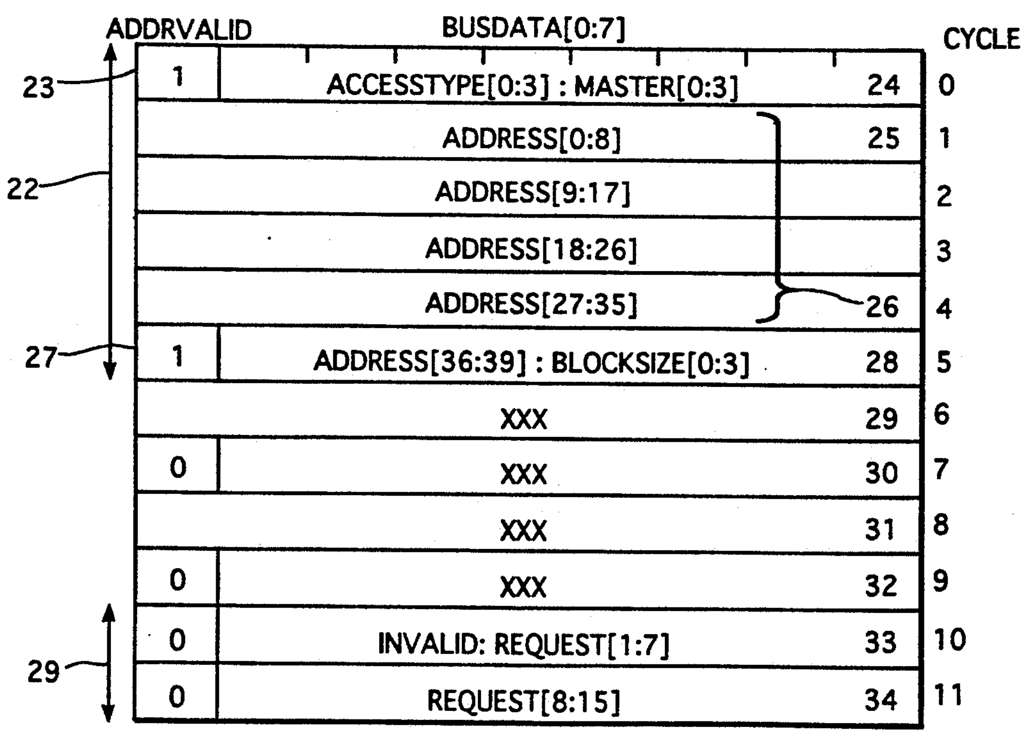

FIG_7A
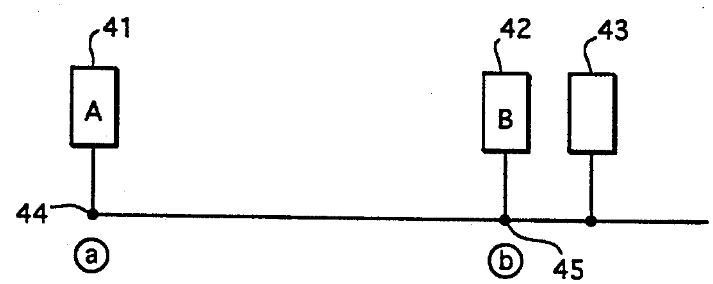
FIG_7B
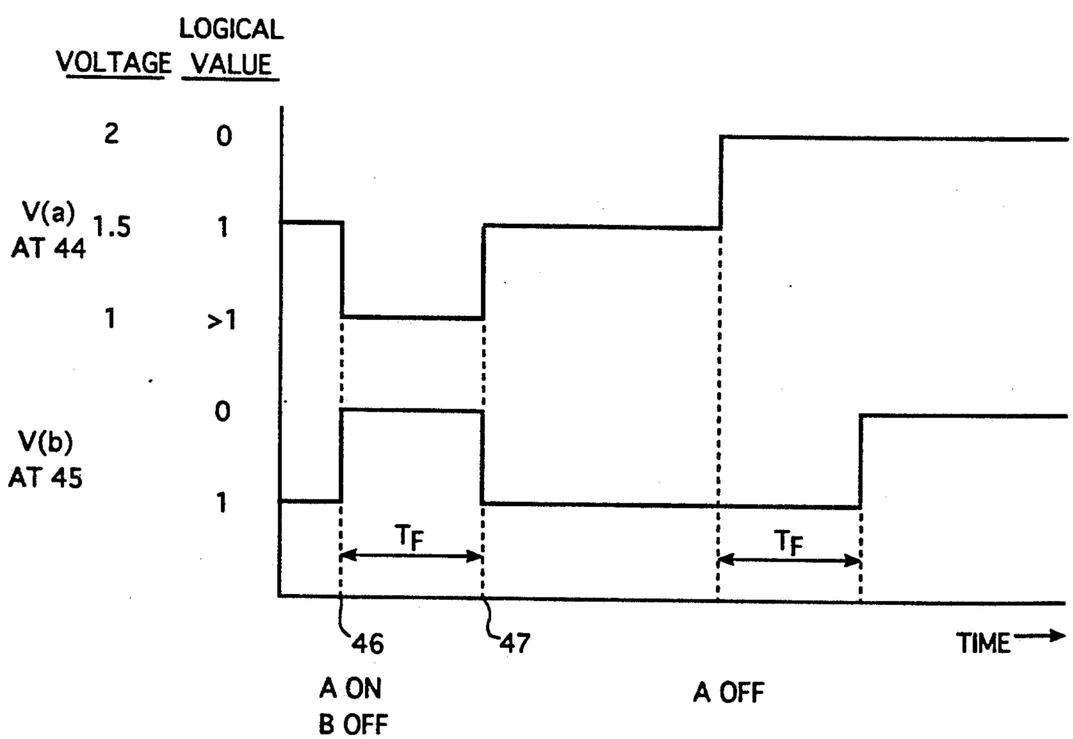

FIG_8A
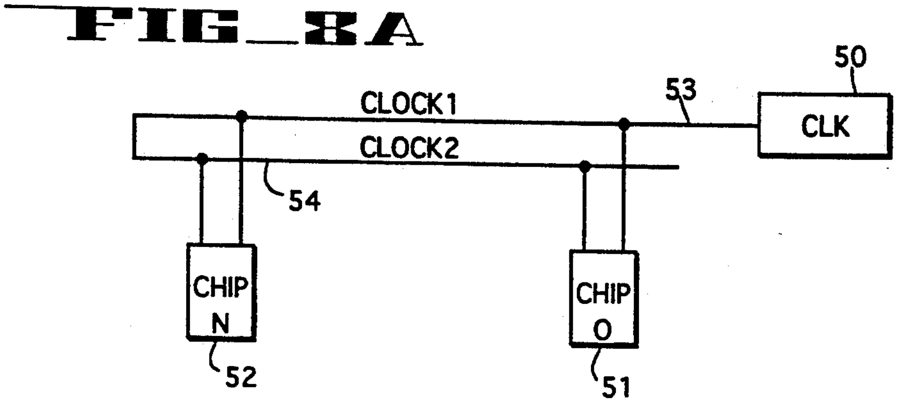
FIG_8B
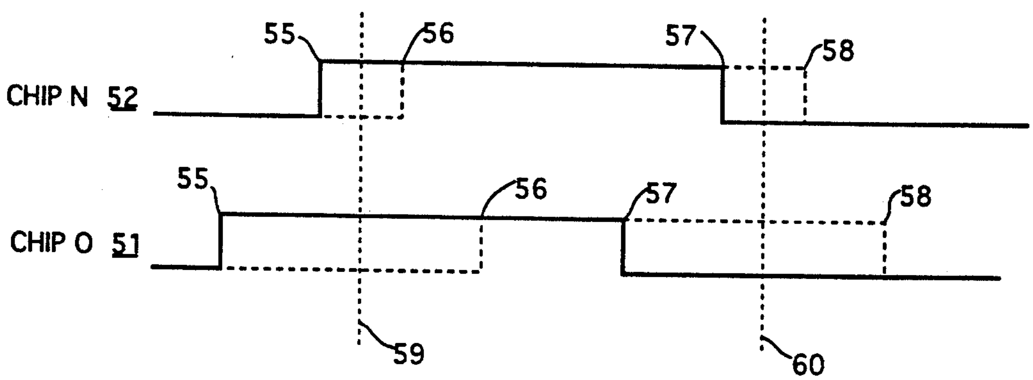
FIG_9
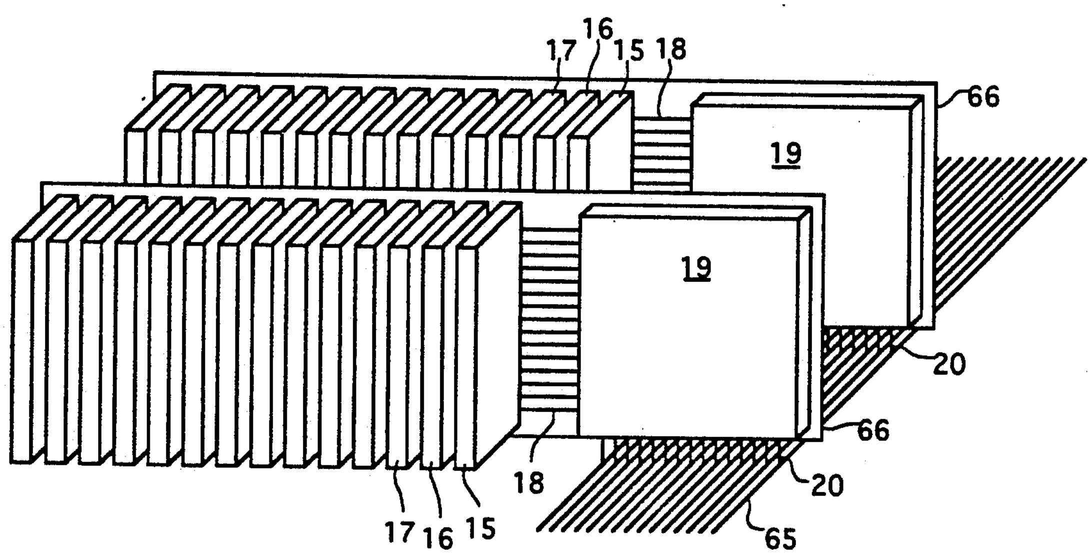

FIG_10
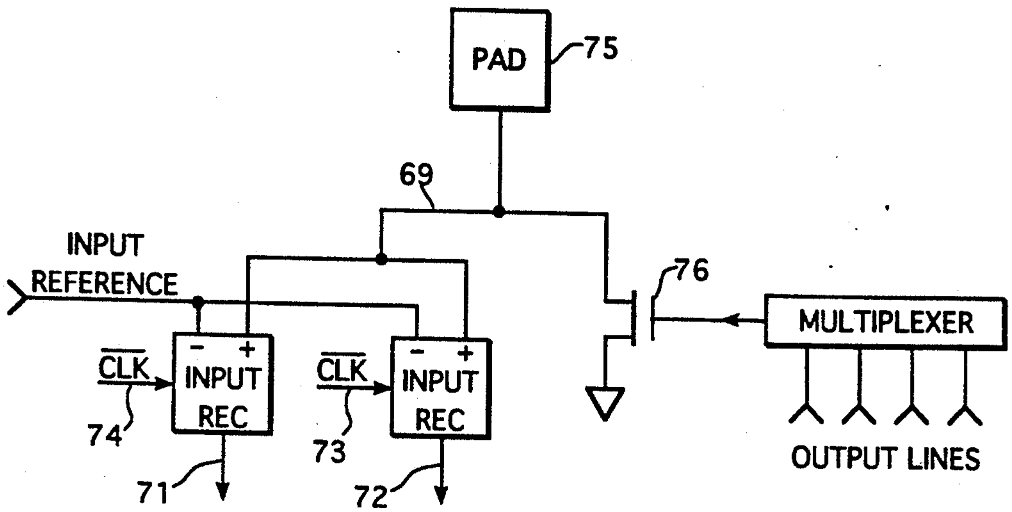
FIG_11
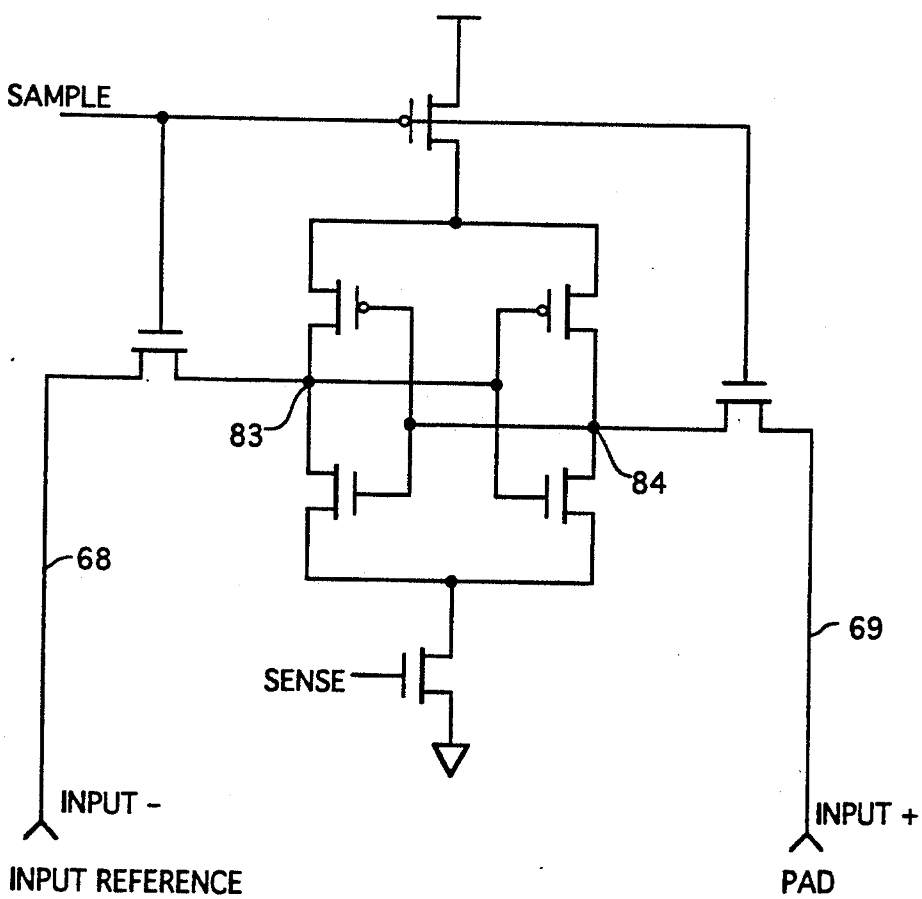

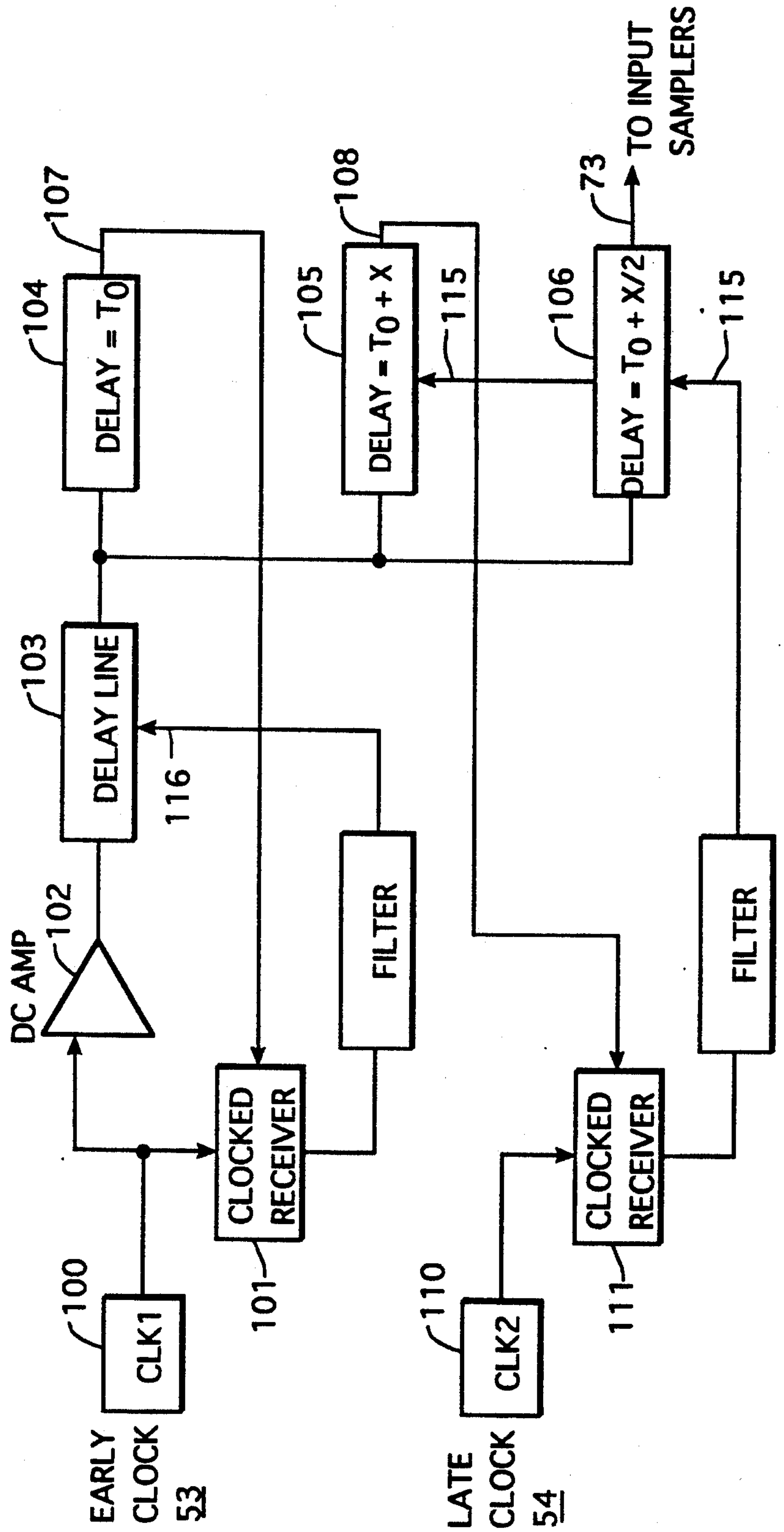
FIG_12

FIG_13
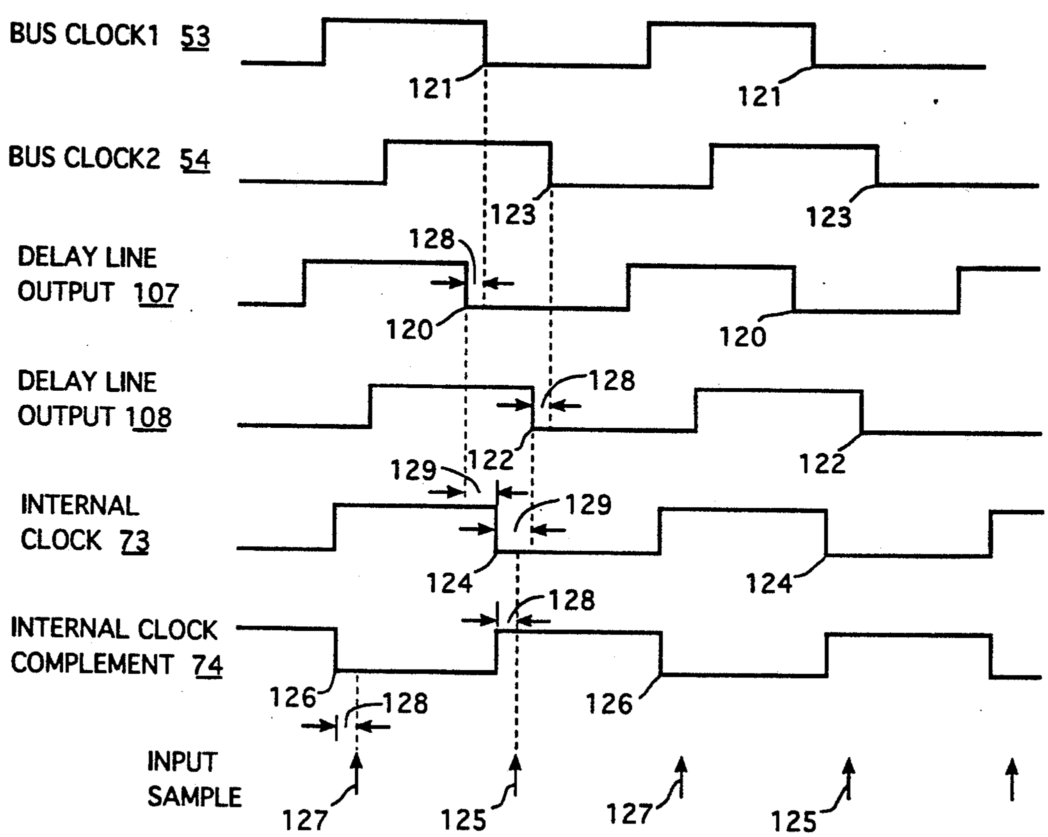
FIG_14
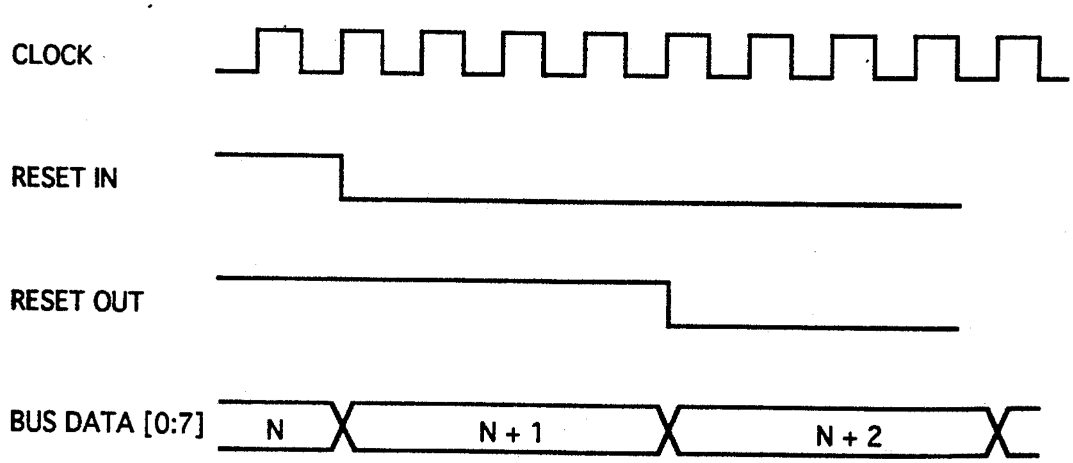

FIG_15
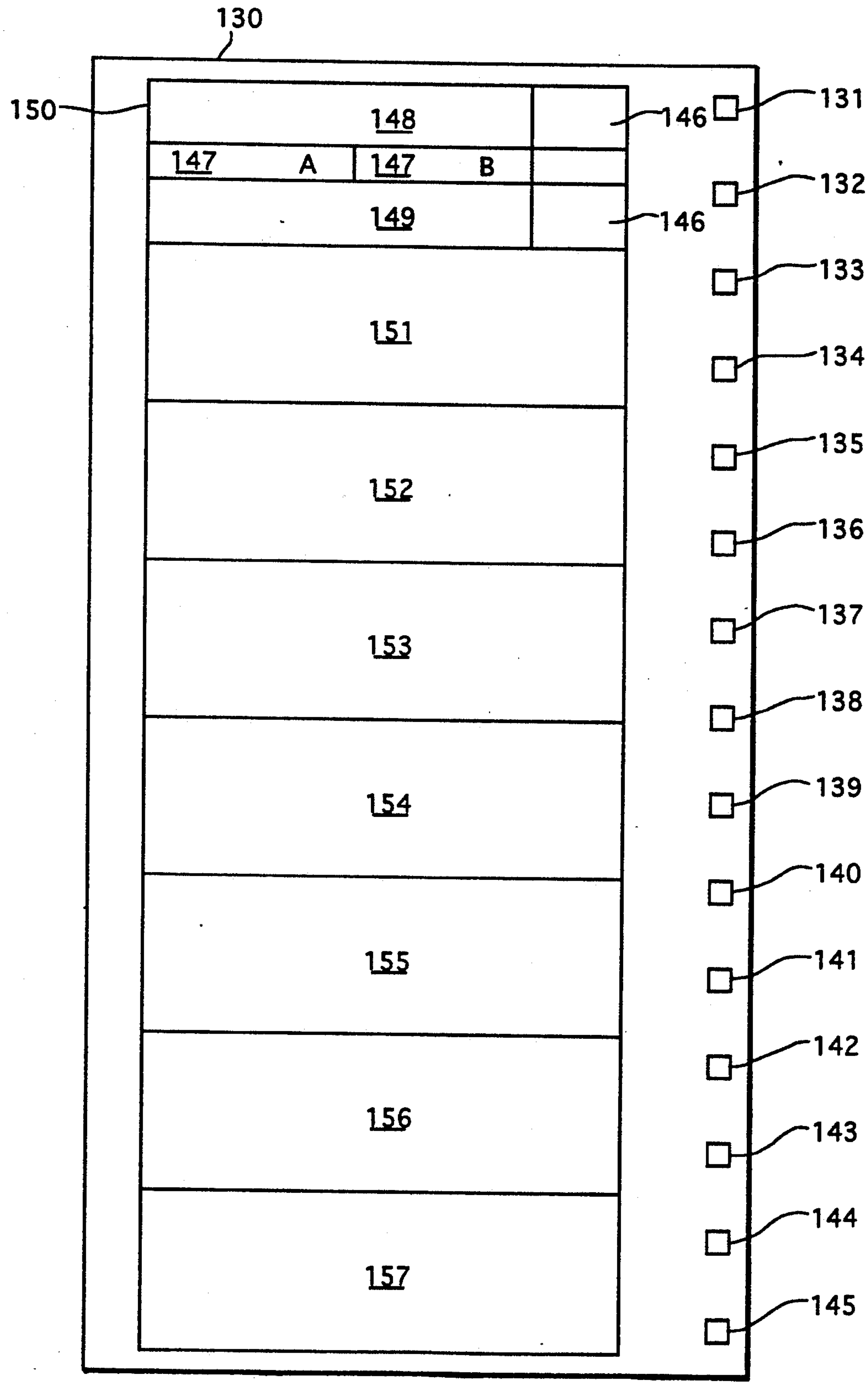

INTEGRATED CIRCUIT I/O USING HIGH PERFORMANCE BUS INTERFACE

This is a continuation of application Ser. No. 07/510,898, filed Apr. 18, 1990, now abandoned.

FIELD OF THE INVENTION

An integrated circuit bus interface for computer and video systems is described which allows high speed transfer of blocks of data, particularly to and from memory devices, with reduced power consumption and increased system reliability. A new method of physically implementing the bus architecture is also described.

BACKGROUND OF THE INVENTION

Semiconductor computer memories have traditionally been designed and structured to use one memory device for each bit, or small group of bits, of any individual computer word, where the word size is governed by the choice of computer. Typical word sizes range from 4 to 64 bits. Each memory device typically is connected in parallel to a series of address lines and connected to one of a series of data lines. When the computer seeks to read from or write to a specific memory location, an address is put on the address lines and some or all of the memory devices are activated using a separate device select line for each needed device. One or more devices may be connected to each data line but typically only a small number of data lines are connected to a single memory device. Thus data line 0 is connected to device(s) 0 data line 1 is connected to device(s) 1, and so on. Data is thus accessed or provided in parallel for each memory read or write operation. For the system to operate properly, every single memory bit in every memory device must operate dependably and correctly.

To understand the concept of the present invention, it is helpful to review the architecture of conventional memory devices. Internal to nearly all types of memory devices (including the most widely used Dynamic Random Access Memory (DRAM), Static RAM (SRAM) and Read Only Memory (ROM) devices), a large number of bits are accessed in parallel each time the system carries out a memory access cycle. However, only a small percentage of accessed bits which are available internally each time the memory device is cycled ever make it across the device boundary to the external world.

Referring to FIG. 1, all modern DRAM, SRAM and ROM designs have internal architectures with row (word) lines 5 and column (bit) lines 6 to allow the memory cells to tile a two dimensional area 1. One bit of data is stored at the intersection of each word and bit line. When a particular word line is enabled, all of the corresponding data bits are transferred onto the bit lines. Some prior art DRAMs take advantage of this organization to reduce the number of pins needed to transmit the address. The address of a given memory cell is split into two addresses, row and column, each of which can be multiplexed over a bus only half as wide as the memory cell address of the prior art would have required.

COMPARISON WITH PRIOR ART

Prior art memory systems have attempted to solve the problem of high speed access to memory with limited success. U.S. Pat. No. 3,821,715 (Hoff et. al.), was issued to Intel Corporation for the earliest 4-bit microprocessor. That patent describes a bus connecting a single central processing unit (CPU) with multiple RAMs and ROMs. That bus multiplexes addresses and data over a 4-bit wide bus and uses point-to-point control signals to select particular RAMs or ROMs. The access time is fixed and only a single processing element is permitted. There is no block-mode type of operation, and most important, not all of the interface signals between the devices are bused (the ROM and RAM control lines and the RAM select lines are point-to-point).

In U.S. Pat. No. 4,315,308 (Jackson), a bus connecting a single CPU to a bus interface unit is described. The invention uses multiplexed address, data, and control information over a single 16-bit wide bus. Block-mode operations are defined, with the length of the block sent as part of the control sequence. In addition, variable access-time operations using a "stretch" cycle signal are provided. There are no multiple processing elements and no capability for multiple outstanding requests, and again, not all of the interface signals are bused.

In U.S. Pat. No. 4,449,207 (Kung, et. al.), a DRAM is described which multiplexes address and data on an internal bus. The external interface to this DRAM is conventional, with separate control, address and data connections.

In U.S. Pat. Nos. 4,764,846 and 4,706,166 (Go), a 3-D package arrangement of stacked die with connections along a single edge is described. Such packages are difficult to use because of the point-to-point wiring required to interconnect conventional memory devices with processing elements. Both patents describe complex schemes for solving these problems. No attempt is made to solve the problem by changing the interface.

In U.S. Pat. No. 3,969,706 (Proebsting, et. al.), the current state-of-the-art DRAM interface is described. The address is two-way multiplexed, and there are separate pins for data and control (RAS, CAS, WE, CS). The number of pins grows with the size of the DRAM, and many of the connections must be made point-to-point in a memory system using such DRAMs.

There are many backplane buses described in the prior art, but not in the combination described or having the features of this invention. Many backplane buses multiplex addresses and data on a single bus (e.g., the NU bus). ELXSI and others have implemented split-transaction buses (U.S. Pat. Nos. 4,595,923 and 4,481,625 (Roberts)). ELXSI has also implemented a relatively low-voltage-swing current-mode ECL driver (approximately 1 V swing). Address-space registers are implemented on most backplane buses, as is some form of block mode operation.

Nearly all modern backplane buses implement some type of arbitration scheme, but the arbitration scheme used in this invention differs from each of these. U.S. Pat. No. 4,837,682 (Culler), U.S. Pat. No. 4,818,985 (Ikeda), U.S. Pat. No. 4,779,089 (Theus) and U.S. Pat. No. 4,745,548 (Blahut) describe prior art schemes. All involve either log N extra signals, (Theus, Blahut), where N is the number of potential bus requestors, or additional delay to get control of the bus (Ikeda, Culler). None of the buses described in patents or other literature use only bused connections. All contain some point-to-point connections on the backplane. None of the other aspects of this invention such as power reduction by fetching each data block from a single device or compact and low-cost 3-D packaging even apply to backplane buses.

The clocking scheme used in this invention has not been used before and in fact would be difficult to implement in backplane buses due to the signal degradation caused by connector stubs. U.S. Pat. No. 4,247,817 (Heller) describes a clocking scheme using two clock lines, but relies on ramp-shaped clock signals in contrast to the normal rise-time signals used in the present invention.

In U.S. Pat. No. 4,646,279 (Voss), a video RAM is described which implements a parallel-load, serial-out shift register on the output of a DRAM. This generally allows greatly improved bandwidth (and has been extended to 2, 4 and greater width shift-out paths.) The rest of the interfaces to the DRAM (RAS, CAS, multiplexed address, etc.) remain the same as for conventional DRAMS.

One object of the present invention is to use a new bus interface built into semiconductor devices to support high-speed access to large blocks of data from a single memory device by an external user of the data, such as a microprocessor, in an efficient and cost-effective manner Another object of this invention is to provide a clocking scheme to permit high speed clock signals to be sent along the bus with minimal clock skew between devices.

Another object of this invention is to allow mapping out defective memory devices or portions of memory devices.

Another object of this invention is to provide a method for distinguishing otherwise identical devices by assigning a unique identifier to each device.

Yet another object of this invention is to provide a method for transferring address, data and control information over a relatively narrow bus and to provide a method of bus arbitration when multiple devices seek to use the bus simultaneously.

Another object of this invention is to provide a method of distributing a high-speed memory cache within the DRAM chips of a memory system which is much more effective than previous cache methods.

Another object of this invention is to provide devices, especially DRAMs, suitable for use with the bus architecture of the invention.

SUMMARY OF INVENTION

The present invention includes a memory subsystem comprising at least two semiconductor devices, including at least one memory device, connected in parallel to a bus, where the bus includes a plurality of bus lines for carrying substantially all address, data and control information needed by said memory devices, where the control information includes device-select information and the bus has substantially fewer bus lines than the number of bits in a single address, and the bus carries device-select information without the need for separate device-select lines connected directly to individual devices.

Referring to FIG. 2, a standard DRAM 13, 14, ROM (or SRAM) 12, microprocessor CPU 11, I/0 device, disk controller or other special purpose device such as a high speed switch is modified to use a wholly bus-based interface rather than the prior art combination of point-to-point and bus-based wiring used with conventional versions of these devices. The new bus includes clock signals, power and multiplexed address, data and control signals. In a preferred implementation, 8 bus data lines and an AddressValid bus line carry address, data and control information for memory addresses up to 40 bits wide. Persons skilled in the art will recognize that 16 bus data lines or other numbers of bus data lines can be used to implement the teaching of this invention. The new bus is used to connect elements such as memory, peripheral, switch and processing units.

In the system of this invention, DRAMs and other devices receive address and control information over the bus and transmit or receive requested data over the same bus. Each memory device contains only a single bus interface with no other signal pins. Other devices that may be included in the system can connect to the bus and other non-bus lines, such as input/output lines. The bus supports large data block transfers and split transactions to allow a user to achieve high bus utilization. This ability to rapidly read or write a large block of data to one single device at a time is an important advantage of this invention.

The DRAMs that connect to this bus differ from conventional DRAMs in a number of ways. Registers are provided which may store control information, device identification, device-type and other information appropriate for the chip such as the address range for each independent portion of the device. New bus interface circuits must be added and the internals of prior art DRAM devices need to be modified so they can provide and accept data to and from the bus at the peak data rate of the bus. This requires changes to the column access circuitry in the DRAM, with only a minimal increase in die size. A circuit is provided to generate a low skew internal device clock for devices on the bus, and other circuits provide for demultiplexing input and multiplexing output signals.

High bus bandwidth is achieved by running the bus at a very high clock rate (hundreds of MHz). This high clock rate is made possible by the constrained environment of the bus. The bus lines are controlled-impedance, doubly-terminated lines. For a data rate of 500 MHz, the maximum bus propagation time is less than 1 ns (the physical bus length is about 10 cm). In addition, because of the packaging used, the pitch of the pins can be very close to the pitch of the pads. The loading on the bus resulting from the individual devices is very small. In a preferred implementation, this generally allows stub capacitances of 1–2 pF and inductances of 0.5–2 nH. Each device 15, 16, 17, shown in FIG. 3, only has pins on one side and these pins connect directly to the bus 18. A transceiver device 19 can be included to interface multiple units to a higher order bus through pins 20.

A primary result of the architecture of this invention is to increase the bandwidth of DRAM access. The invention also reduces manufacturing and production costs, power consumption, and increases packing density and system reliability.

BRIEF DESCRIPTION OF THE DRAWINGS

FIG. 1 is a diagram which illustrates the basic 2-D organization of memory devices.

FIG. 2 is a schematic block diagram which illustrates the parallel connection of all bus lines and the serial Reset line to each device in the system.

FIG. 3 is a perspective view of a system of the invention which illustrates the 3-D packaging of semiconductor devices on the primary bus.

FIG. 4 shows the format of a request packet.

FIG. 5 shows the format of a retry response from a slave.

FIG. 6 shows the bus cycles after a request packet collision occurs on the bus and how arbitration is handled.

FIGS. 7*a* and 7*b* show the timing whereby signals from two devices can overlap temporarily and drive the bus at the same time.

FIGS. 8*a* and 8*b* show the connection and timing between bus clocks and devices on the bus.

FIG. 9 is a perspective view showing how transceivers can be used to connect a number of bus units to a transceiver bus. FIG. 10 is a block and schematic diagram of input/output circuitry used to connect devices to the bus.

FIG. 11 is a schematic diagram of a clocked sense-amplifier used as a bus input receiver.

FIG. 12 is a block diagram showing how the internal device clock is generated from two bus clock signals using a set of adjustable delay lines.

FIG. 13 is a timing diagram showing the relationship of signals in the block diagram of FIG. 12.

FIG. 14 is timing diagram of a preferred means of implementing the reset procedure of this invention.

FIG. 15 is a diagram illustrating the general organization of a 4 Mbit DRAM divided into 8 subarrays.

DETAILED DESCRIPTION

The present invention is designed to provide a high speed, multiplexed bus for communication between processing devices and memory devices and to provide devices adapted for use in the bus system. The invention can also be used to connect processing devices and other devices, such as I/0 interfaces or disk controllers, with or without memory devices on the bus. The bus consists of a relatively small number of lines connected in parallel to each device on the bus. The bus carries substantially all address, data and control information needed by devices for communication with other devices on the bus. In many systems using the present invention, the bus carries almost every signal between every device in the entire system. There is no need for separate device-select lines since device-select information for each device on the bus is carried over the bus. There is no need for separate address and data lines because address and data information can be sent over the same lines. Using the organization described herein, very large addresses (40 bits in the preferred implementation) and large data blocks (1024 bytes) can be sent over a small number of bus lines (8 plus one control line in the preferred implementation).

Virtually all of the signals needed by a computer system can be sent over the bus. Persons skilled in the art recognize that certain devices, such as CPUs, may be connected to other signal lines and possibly to independent buses, for example a bus to an independent cache memory, in addition to the bus of this invention. Certain devices, for example cross-point switches, could be connected to multiple, independent buses of this invention. In the preferred implementation, memory devices are provided that have no connections other than the bus connections described herein and CPUs are provided that use the bus of this invention as the principal, if not exclusive, connection to memory and to other devices on the bus.

All modern DRAM, SRAM and ROM designs have internal architectures with row (word) and column (bit) lines to efficiently tile a 2-D area. Referring to FIG. 1, one bit of data is stored at the intersection of each word line 5 and bit line 6. When a particular word line is enabled, all of the corresponding data bits are transferred onto the bit lines. This data, about 4000 bits at a time in a 4 MBit DRAM, is then loaded into column sense amplifiers 3 and held for use by the I/0 circuits.

In the invention presented here, the data from the sense amplifiers is enabled 32 bits at a time onto an internal device bus running at approximately 125 MHz. This internal device bus moves the data to the periphery of the devices where the data is multiplexed into an 8-bit wide external bus interface, running at approximately 500 MHz.

The bus architecture of this invention connects master or bus controller devices, such as CPUs, Direct Memory Access devices (DMAs) or Floating Point Units (FPUs), and slave devices, such as DRAM, SRAM or ROM memory devices. A slave device responds to control signals; a master sends control signals. Persons skilled in the art realize that some devices may behave as both master and slave at various times, depending on the mode of operation and the state of the system. For example, a memory device will typically have only slave functions, while a DMA controller, disk controller or CPU may include both slave and master functions. Many other semiconductor devices, including I/0 devices, disk controllers, or other special purpose devices such as high speed switches can be modified for use with the bus of this invention.

Each semiconductor device contains a set of internal registers, preferably including a device identification (device ID) register, a device-type descriptor register, control registers and other registers containing other information relevant to that type of device. In a preferred implementation, semiconductor devices connected to the bus contain registers which specify the memory addresses contained within that device and access-time registers which store a set of one or more delay times at which the device can or should be available to send or receive data.

Most of these registers can be modified and preferably are set as part of an initialization sequence that occurs when the system is powered up or reset. During the initialization sequence each device on the bus is assigned a unique device ID number, which is stored in the device ID register. A bus master can then use these device ID numbers to access and set appropriate registers in other devices, including access-time registers, control registers, and memory registers, to configure the system. Each slave may have one or several access-time registers (four in a preferred embodiment). In a preferred embodiment, one access-time register in each slave is permanently or semi-permanently programmed with a fixed value to facilitate certain control functions. A preferred implementation of an initialization sequence is described below in more detail.

All information sent between master devices and slave devices is sent over the external bus, which, for example, may be 8 bits wide. This is accomplished by defining a protocol whereby a master device, such as a microprocessor, seizes exclusive control of the external bus (i.e., becomes the bus master) and initiates a bus transaction by sending a request packet (a sequence of bytes comprising address and control information) to one or more slave devices on the bus. An address can consist of 16 to 40 or more bits according to the teachings of this invention. Each slave on the bus must decode the request packet to see if that slave needs to respond to the packet. The slave that the packet is directed to must then begin any internal processes needed to carry out the requested bus transaction at the requested time. The requesting master may also need to transact certain internal processes before the bus transaction begins. After a specified access time the slave(s) respond by returning one or more bytes (8 bits) of data or by storing information made available from the bus. More than one access time can be provided to allow different types of responses to occur at different times.

A request packet and the corresponding bus access are separated by a selected number of bus cycles, allowing the bus to be used in the intervening bus cycles by the same or other masters for additional requests or brief bus accesses. Thus multiple, independent accesses are permitted, allowing maximum utilization of the bus for transfer of short blocks of data. Transfers of long blocks of data use the bus efficiently even without overlap because the overhead due to bus address, control and access times is small compared to the total time to request and transfer the block.

DEVICE ADDRESS MAPPING

Another unique aspect of this invention is that each memory device is a complete, independent memory subsystem with all the functionality of a prior art memory board in a conventional backplane-bus computer system. Individual memory devices may contain a single memory section or may be subdivided into more than one discrete memory section. Memory devices preferably include memory address registers for each discrete memory section. A failed memory device (or even a subsection of a device) can be "mapped out" with only the loss of a small fraction of the memory, maintaining essentially full system capability. Mapping out bad devices can be accomplished in two ways, both compatible with this invention.

The preferred method uses address registers in each memory device (or independent discrete portion thereof) to store information which defines the range of bus addresses to which this memory device will respond. This is similar to prior art schemes used in memory boards in conventional backplane bus systems. The address registers can include a single pointer, usually pointing to a block of known size, a pointer and a fixed or variable block size value or two pointers, one pointing to the beginning and one to the end (or to the "top" and "bottom") of each memory block. By appropriate settings of the address registers, a series of functional memory devices or discrete memory sections can be made to respond to a contiguous range of addresses, giving the system access to a contiguous block of good memory, limited primarily by the number of good devices connected to the bus. A block of memory in a first memory device or memory section can be assigned a certain range of addresses, then a block of memory in a next memory device or memory section can be assigned addresses starting with an address one higher (or lower, depending on the memory structure) than the last address of the previous block.

Preferred devices for use in this invention include device-type register information specifying the type of chip, including how much memory is available in what configuration on that device. A master can perform an appropriate memory test, such as reading and writing each memory cell in one or more selected orders, to test proper functioning of each accessible discrete portion of memory (based in part on information like device ID number and device-type) and write address values (up to 40 bits in the preferred embodiment, $10^{12}$ bytes), preferably contiguous, into device address-space registers. Non-functional or impaired memory sections can be assigned a special address value which the system can interpret to avoid using that memory.

The second approach puts the burden of avoiding the bad devices on the system master or masters. CPUs and DMA controllers typically have some sort of translation look-aside buffers (TLBs) which map virtual to physical (bus) addresses. With relatively simple software, the TLBs can be programmed to use only working memory (data structures describing functional memories are easily generated). For masters which don't contain TLBs (for example, a video display generator), a small, simple RAM can be used to map a contiguous range of addresses onto the addresses of the functional memory devices.

Either scheme works and permits a system to have a significant percentage of non-functional devices and still continue to operate with the memory which remains. This means that systems built with this invention will have much improved reliability over existing systems, including the ability to build systems with almost no field failures.

BUS

The preferred bus architecture of this invention comprises 11 signals: BusData[0:7]; AddrValid; Clk1 and Clk2; plus an input reference level and power and ground lines connected in parallel to each device. Signals are driven onto the bus during conventional bus cycles. The notation "Signal[i:j]" refers to a specific range of signals or lines, for example, BusData[0:7] means BusData0, BusData1, . . . , BusData7. The bus lines for BusData[0:7] signals form a byte-wide, multiplexed data/address/control bus. AddrValid is used to indicate when the bus is holding a valid address request, and instructs a slave to decode the bus data as an address and, if the address is included on that slave, to handle the pending request. The two clocks together provide a synchronized, high speed clock for all the devices on the bus. In addition to the bused signals, there is one other line (ResetIn, ResetOut) connecting each device in series for use during initialization to assign every device in the system a unique device ID number (described below in detail).

To facilitate the extremely high data rate of this external bus relative to the gate delays of the internal logic, the bus cycles are grouped into pairs of even/odd cycles. Note that all devices connected to a bus should preferably use the same even/odd labeling of bus cycles and preferably should begin operations on even cycles. This is enforced by the clocking scheme.

PROTOCOL AND BUS OPERATION

The bus uses a relatively simple, synchronous, split-transaction, block-oriented protocol for bus transactions. One of the goals of the system is to keep the intelligence concentrated in the masters, thus keeping the slaves as simple as possible (since there are typically many more slaves than masters). To reduce the complexity of the slaves, a slave should preferably respond to a request in a specified time, sufficient to allow the slave to begin or possibly complete a device-internal phase including any internal actions that must precede the subsequent bus access phase. The time for this bus access phase is known to all devices on the bus—each master being responsible for making sure that the bus will be free when the bus access begins. Thus the slaves never worry about arbitrating for the bus. This approach eliminates arbitration in single master systems, and also makes the slave-bus interface simpler.

In a preferred implementation of the invention, to initiate a bus transfer over the bus, a master sends out a request packet, a contiguous series of bytes containing address and control information. It is preferable to use a request packet containing an even number of bytes and also preferable to start each packet on an even bus cycle.

The device-select function is handled using the bus data lines. AddrValid is driven, which instructs all slaves to decode the request packet address, determine whether they contain the requested address, and if they do, provide the data back to the master (in the case of a read request) or accept data from the master (in the case of a write request) in a data block transfer. A master can also select a specific device by transmitting a device ID number in a request packet. In a preferred implementation, a special device ID number is chosen to indicate that the packet should be interpreted by all devices on the bus. This allows a master to broadcast a message, for example to set a selected control register of all devices with the same value.

The data block transfer occurs later at a time specified in the request packet control information, preferably beginning on an even cycle. A device begins a data block transfer almost immediately with a device-internal phase as the device initiates certain functions, such as setting up memory addressing, before the bus access phase begins. The time after which a data block is driven onto the bus lines is selected from values stored in slave access-time registers. The timing of data for reads and writes is preferably the same; the only difference is which device drives the bus. For reads, the slave drives the bus and the master latches the values from the bus. For writes the master drives the bus and the selected slave latches the values from the bus.

In a preferred implementation of this invention shown in FIG. 4, a request packet 22 contains 6 bytes of data—4.5 address bytes and 1.5 control bytes. Each request packet uses all nine bits of the multiplexed data/address lines (AddrValid 23 +BusData[0:7] 24) for all six bytes of the request packet. Setting 23 AddrValid=1 in an otherwise unused even cycle indicates the start of an request packet (control information). In a valid request packet, AddrValid 27 must be 0 in the last byte. Asserting this signal in the last byte invalidates the request packet. This is used for the collision detection and arbitration logic (described below). Bytes 25–26 contain the first 35 address bits, Address[0:35]. The last byte contains AddrValid 27 (the invalidation switch) and 28, the remaining address bits, Address[36:39], and BlockSize[0:3] (control information).

The first byte contains two 4 bit fields containing control information, AccessType[0:3], an op code (operation code) which, for example, specifies the type of access, and Master[0:3], a position reserved for the master sending the packet to include its master ID number. Only master numbers 1 through 15 are allowed—master number 0 is reserved for special system commands. Any packet with Master[0:3]=0 is an invalid or special packet and is treated accordingly.

The AccessType field specifies whether the requested operation is a read or write and the type of access, for example, whether it is to the control registers or other parts of the device, such as memory. In a preferred implementation, AccessType[0] is a Read/Write switch: if it is a 1, then the operation calls for a read from the slave (the slave to read the requested memory block and drive the memory contents onto the bus); if it is a 0, the operation calls for a write into the slave (the slave to read data from the bus and write it to memory). AccessType[1:3] provides up to 8 different access types for a slave. AccessType[1:2] preferably indicates the timing of the response, which is stored in an access-time register, AccessRegN. The choice of access-time register can be selected directly by having a certain op code select that register, or indirectly by having a slave respond to selected op codes with pre-selected access times (see table below). The remaining bit, AccessType[3] may be used to send additional information about the request to the slaves.

One special type of access is control register access, which involves addressing a selected register in a selected slave. In the preferred implementation of this invention, AccessType[1:3] equal to zero indicates a control register request and the address field of the packet indicates the desired control register. For example, the most significant two bytes can be the device ID number (specifying which slave is being addressed) and the least significant three bytes can specify a register address and may also represent or include data to be loaded into that control register. Control register accesses are used to initialize the access-time registers, so it is preferable to use a fixed response time which can be preprogrammed or even hard wired, for example the value in AccessReg0, preferably 8 cycles. Control register access can also be used to initialize or modify other registers, including address registers.

The method of this invention provides for access mode control specifically for the DRAMs. One such access mode determines whether the access is page mode or normal RAS access. In normal mode (in conventional DRAMS and in this invention), the DRAM column sense amps or latches have been precharged to a value intermediate between logical 0 and 1. This precharging allows access to a row in the RAM to begin as soon as the access request for either inputs (writes) or outputs (reads) is received and allows the column sense amps to sense data quickly. In page mode (both conventional and in this invention), the DRAM holds the data in the column sense amps or latches from the previous read or write operation. If a subsequent request to access data is directed to the same row, the DRAM does not need to wait for the data to be sensed (it has been sensed already) and access time for this data is much shorter than the normal access time. Page mode generally allows much faster access to data but to a smaller block of data (equal to the number of sense amps). However, if the requested data is not in the selected row, the access time is longer than the normal access time, since the request must wait for the RAM to precharge before the normal mode access can start. Two access-time registers in each DRAM preferably contain the access times to be used for normal and for page-mode accesses, respectively.

The access mode also determines whether the DRAM should precharge the sense amplifiers or should save the contents of the sense amps for a subsequent page mode access. Typical settings are "precharge after normal access" and "save after page mode access" but "precharge after page mode access" or "save after normal access" are allowed, selectable modes of operation.

The DRAM can also be set to precharge the sense amps if they are not accessed for a selected period of time.

In page mode, the data stored in the DRAM sense amplifiers may be accessed within much less time than it takes to read out data in normal mode (~10-20 nS vs. 40-100 nS). This data may be kept available for long periods. However, if these sense amps (and hence bit lines) are not precharged after an access, a subsequent access to a different memory word (row) will suffer a precharge time penalty of about 40-100 nS because the sense amps must precharge before latching in a new value.

The contents of the sense amps thus may be held and used as a cache, allowing faster, repetitive access to small blocks of data. DRAM-based page-mode caches have been attempted in the prior art using conventional DRAM organizations but they are not very effective because several chips are required per computer word. Such a conventional page-mode cache contains many bits (for example, 32 chips×4Kbits) but has very few independent storage entries. In other words, at any given point in time the sense amps hold only a few different blocks or memory "locales" (a single block of 4K words, in the example above). Simulations have shown that upwards of 100 blocks are required to achieve high hit rates (>90% of requests find the requested data already in cache memory) regardless of the size of each block. See, for example, Anant Agarwal, et. al., "An Analytic Cache Model," *ACM Transactions on Computer Systems*, Vol. 7(2), pp. 184-215 (May 1989).

The organization of memory in the present invention allows each DRAM to hold one or more (4 for 4Mbit DRAMS) separately- addressed and independent blocks of data. A personal computer or workstation with 100 such DRAMs (i.e. 400 blocks or locales) can achieve extremely high, very repeatable hit rates (98-99% on average) as compared to the lower (50-80%), widely varying hit rate using DRAMS organized in the conventional fashion. Further, because of the time penalty associated with the deferred precharge on a "miss" of the page-mode cache, the conventional DRAM-based page-mode cache generally has been found to work less well than no cache at all.

For DRAM slave access, the access types are preferably used in the following way:

| AccessType[1:31] | Use | AccessTime |
|---|---|---|
| 0 | Control Register Access | Fixed, 8[AccessReg0] |
| 1 | Unused | Fixed, 8[AccessReg0] |
| 2-3 | Unused | AccessReg1 |
| 4-5 | Page Mode DRAM access | AccessReg2 |
| 6-7 | Normal DRAM access | AccessReg3 |

Persons skilled in the art will recognize that a series of available bits could be designated as switches for controlling these access modes. For example:

AccessType[2]=page mode/normal switch

AccessType[3]=precharge/save-data switch

BlockSize[0:3] specifies the size of the data block transfer. If BlockSize[0] is 0, the remaining bits are the binary representation of the block size (0-7). If BlockSize[0] is 1, then the remaining bits give the block size as a binary power of 2, from 8 to 1024. A zero-length block can be interpreted as a special command, for example, to refresh a DRAM without returning any data, or to change the DRAM from page mode to normal access mode or vice-versa.

| BlockSize[0:21] | Number of Bytes in Block |
|---|---|
| 0-7 | 0-7 respectively |
| 8 | 8 |
| 9 | 16 |
| 10 | 32 |
| 11 | 64 |
| 12 | 128 |
| 13 | 256 |
| 14 | 512 |
| 15 | 1024 |

Persons skilled in the art will recognize that other block size encoding schemes or values can be used.

In most cases, a slave will respond at the selected access time by reading or writing data from or to the bus over bus lines BusData[0:7] and AddrValid will be at logical 0. In a preferred embodiment, substantially each memory access will involve only a single memory device, that is, a single block will be read from or written to a single memory device.

RETRY FORMAT

In some cases, a slave may not be able to respond correctly to a request, e.g., for a read or write. In such a situation, the slave should return an error message, sometimes called a N(o)ACK(nowledge) or retry message. The retry message can include information about the condition requiring a retry, but this increases system requirements for circuitry in both slave and masters. A simple message indicating only that an error has occurred allows for a less complex slave, and the master can take whatever action is needed to understand and correct the cause of the error.

For example, under certain conditions a slave might not be able to supply the requested data. During a page-mode access, the DRAM selected must be in page mode and the requested address must match the address of the data held in the sense amps or latches. Each DRAM can check for this match during a page-mode access. If no match is found, the DRAM begins precharging and returns a retry message to the master during the first cycle of the data block (the rest of the returned block is ignored). The master then must wait for the precharge time (which is set to accommodate the type of slave in question, stored in a special register, PreChargeReg), and then resend the request as a normal DRAM access (AccessType=6 or 7).

In the preferred form of the present invention, a slave signals a retry by driving AddrValid true at the time the slave was supposed to begin reading or writing data. A master which expected to write to that slave must monitor AddrValid during the write and take corrective action if it detects a retry message. FIG. 5 illustrates the format of a retry message 28 which is useful for read requests, consisting of 23 AddrValid=1 with Master[0:3]=0 in the first (even) cycle. Note that AddrValid is normally 0 for data block transfers and that there is no master 0 (only 1 through 15 are allowed). All DRAMs and masters can easily recognize such a packet as an invalid request packet, and therefore a retry message. In this type of bus transaction all of the fields except for Master[0:3] and AddrValid 23 may be used as information fields, although in the implementation described, the contents are undefined. Persons skilled in the art recognize that another method of signifying a retry message is to add a DataInvalid line and signal to the bus. This signal could be asserted in the case of a NACK.

BUS ARBITRATION

In the case of a single master, there are by definition no arbitration problems. The master sends request packets and keeps track of periods when the bus will be busy in response to that packet. The master can schedule multiple requests so that the corresponding data block transfers do not overlap.

The bus architecture of this invention is also useful in configurations with multiple masters. When two or more masters are on the same bus, each master must keep track of all the pending transactions, so each master knows when it can send a request packet and access the corresponding data block transfer. Situations will arise, however, where two or more masters send a request packet at about the same time and the multiple requests must be detected, then sorted out by some sort of bus arbitration.

There are many ways for each master to keep track of when the bus is and will be busy. A simple method is for each master to maintain a bus-busy data structure, for example by maintaining two pointers, one to indicate the earliest point in the future when the bus will be busy and the other to indicate the earliest point in the future when the bus will be free, that is, the end of the latest pending data block transfer. Using this information, each master can determine whether and when there is enough time to send a request packet (as described above under Protocol) before the bus becomes busy with another data block transfer and whether the corresponding data block transfer will interfere with pending bus transactions. Thus each master must read every request packet and update its bus-busy data structure to maintain information about when the bus is and will be free.

With two or more masters on the bus, masters will occasionally transmit independent request packets during the same bus cycle. Those multiple requests will collide as each such master drives the bus simultaneously with different information, resulting in scrambled request information and neither desired data block transfer. In a preferred form of the invention, each device on the bus seeking to write a logical 1 on a BusData or AddrValid line drives that line with a current sufficient to sustain a voltage greater than or equal to the high-logic value for the system. Devices do not drive lines that should have a logical 0; those lines are simply held at a voltage corresponding to a low-logic value. Each master tests the voltage on at least some, preferably all, bus data and the AddrValid lines so the master can detect a logical '1' where the expected level is '0' on a line that it does not drive during a given bus cycle but another master does drive.

Another way to detect collisions is to select one or more bus lines for collision signalling. Each master sending a request drives that line or lines and monitors the selected lines for more than the normal drive current (or a logical value of "$>1$"), indicating requests by more than one master. Persons skilled in the art will recognize that this can be implemented with a protocol involving BusData and AddrValid lines or could be implemented using an additional bus line.

In the preferred form of this invention, each master detects collisions by monitoring lines which it does not drive to see if another master is driving those lines. Referring to FIG. 4, the first byte of the request packet includes the number of each master attempting to use the bus (Master[0:3]). If two masters send packet requests starting at the same point in time, the master numbers will be logical "or"ed together by at least those masters, and thus one or both of the masters, by monitoring the data on the bus and comparing what it sent, can detect a collision. For instance if requests by masters number 2 (0010) and 5 (0101) collide, the bus will be driven with the value Master[0:3]=7 (0010+0101=0111). Master number 5 will detect that the signal Master[2]=1 and master 2 will detect that Master[1] and Master[3]=1, telling both masters that a collision has occurred. Another example is masters 2 and 11, for which the bus will be driven with the value Master[0:3]=11 (0010 +1011=1011), and although master 11 can't readily detect this collision, master 2 can. When any collision is detected, each master detecting a collision drives the value of AddrValid 27 in byte 5 of the request packet 22 to 1, which is detected by all masters, including master 11 in the second example above, and forces a bus arbitration cycle, described below.

Another collision condition may arise where master A sends a request packet in cycle 0 and master B tries to send a request packet starting in cycle 2 of the first request packet, thereby overlapping the first request packet. This will occur from time to time because the bus operates at high speeds, thus the logic in a second-initiating master may not be fast enough to detect a request initiated by a first master in cycle 0 and to react fast enough by delaying its own request. Master B eventually notices that it wasn't supposed to try to send a request packet (and consequently almost surely destroyed the address that master A was trying to send), and, as in the example above of a simultaneous collision, drives a 1 on AddrValid during byte 5 of the first request packet 27 forcing an arbitration. The logic in the preferred implementation is fast enough that a master should detect a request packet by another master by cycle 3 of the first request packet, so no master is likely to attempt to send a potentially colliding request packet later than cycle 2.

Slave devices do not need to detect a collision directly, but they must wait to do anything irrecoverable until the last byte (byte 5) is read to ensure that the packet is valid. A request packet with Master[0:3] equal to 0 (a retry signal) is ignored and does not cause a collision. The subsequent bytes of such a packet are ignored.

To begin arbitration after a collision, the masters wait a preselected number of cycles after the aborted request packet (4 cycles in a preferred implementation), then use the next free cycle to arbitrate for the bus (the next available even cycle in the preferred implementation). Each colliding master signals to all other colliding masters that it seeks to send a request packet, a priority is assigned to each of the colliding masters, then each master is allowed to make its request in the order of that priority.

FIG. 6 illustrates one preferred way of implementing this arbitration. Each colliding master signals its intent to send a request packet by driving a single BusData line during a single bus cycle corresponding to its assigned master number (1-15 in the present example). During two-byte arbitration cycle 29, byte 0 is allocated to requests 1-7 from masters 1-7, respectively, (bit 0 is not used) and byte 1 is allocated to requests 8-15 from masters 8-15, respectively. At least one device and preferably each colliding master reads the values on the bus during the arbitration cycles to determine and store which masters desire to use the bus. Persons skilled in the art will recognize that a single byte can be allocated for arbitration requests if the system includes more bus lines than masters. More than 15 masters can be accommodated by using additional bus cycles.

A fixed priority scheme (preferably using the master numbers, selecting lowest numbers first) is then used to prioritize, then sequence the requests in a bus arbitration queue which is maintained by at least one device. These requests are queued by each master in the bus-busy data structure and no further requests are allowed until the bus arbitration queue is cleared. Persons skilled in the art will recognize that other priority schemes can be used, including assigning priority according to the physical location of each master.

SYSTEM CONFIGURATION/RESET

In the bus-based system of this invention, a mechanism is provided to give each device on the bus a unique device identifier (device ID) after power-up or under other conditions as desired or needed by the system. A master can then use this device ID to access a specific device, particularly to set or modify registers of the specified device, including the control and address registers. In the preferred embodiment, one master is assigned to carry out the entire system configuration process. The master provides a series of unique device ID numbers for each unique device connected to the bus system. In the preferred embodiment, each device connected to the bus contains a special device-type register which specifies the type of device, for instance CPU, 4 MBit memory, 64 MBit memory or disk controller. The configuration master should check each device, determine the device type and set appropriate control registers, including access-time registers. The configuration master should check each memory device and set all appropriate memory address registers.

One means to set up unique device ID numbers is to have each device to select a device ID in sequence and store the value in an internal device ID register. For example, a master can pass sequential device ID numbers through shift registers in each of a series of devices, or pass a token from device to device whereby the device with the token reads in device ID information from another line or lines. In a preferred embodiment, device ID numbers are assigned to devices according to their physical relationship, for instance, their order along the bus.

In a preferred embodiment of this invention, the device ID setting is accomplished using a pair of pins on each device, ResetIn and ResetOut. These pins handle normal logic signals and are used only during device ID configuration. On each rising edge of the clock, each device copies ResetIn (an input) into a four-stage reset shift register. The output of the reset shift register is connected to ResetOut, which in turn connects to ResetIn for the next sequentially connected device. Substantially all devices on the bus are thereby daisy-chained together. A first reset signal, for example, while ResetIn at a device is a logical 1, or when a selected bit of the reset shift register goes from zero to non-zero, causes the device to hard reset, for example by clearing all internal registers and resetting all state machines. A second reset signal, for example the falling edge of ResetIn combined with changeable values on the external bus, causes that device to latch the contents of the external bus into the internal device ID register (Device[0:7]).

To reset all devices on a bus, a master sets the ResetIn line of the first device to a "1" for long enough to ensure that all devices on the bus have been reset (4 cycles times the number of devices—note that the maximum number of devices on the preferred bus configuration is 256 (8 bits), so that 1024 cycles is always enough time to reset all devices.) Then ResetIn is dropped to "0" and the BusData lines are driven with the first followed by successive device ID numbers, changing after every 4 clock pulses. Successive devices set those device ID numbers into the corresponding device ID register as the falling edge of ResetIn propagates through the shift registers of the daisy-chained devices. FIG. 14 shows ResetIn at a first device going low while a master drives a first device ID onto the bus data lines BusData[0:3]. The first device then latches in that first device ID. After four clock cycles, the master changes BusData[0:3] to the next device ID number and ResetOut at the first device goes low, which pulls ResetIn for the next daisy-chained device low, allowing the next device to latch in the next device ID number from BusData[0:3]. In the preferred embodiment, one master is assigned device ID 0 and it is the responsibility of that master to control the ResetIn line and to drive successive device ID numbers onto the bus at the appropriate times. In the preferred embodiment, each device waits two clock cycles after ResetIn goes low before latching in a device ID number from BusData[0:3].

Persons skilled in the art recognize that longer device ID numbers could be distributed to devices by having each device read in multiple bytes from the bus and latch the values into the device ID register. Persons skilled in the art also recognize that there are alternative ways of getting device ID numbers to unique devices. For instance, a series of sequential numbers could be clocked along the ResetIn line and at a certain time each device could be instructed to latch the current reset shift register value into the device ID register.

The configuration master should choose and set an access time in each access-time register in each slave to a period sufficiently long to allow the slave to perform an actual, desired memory access. For example, for a normal DRAM access, this time must be longer than the row address strobe (RAS) access time. If this condition is not met, the slave may not deliver the correct data. The value stored in a slave access-time register is preferably one-half the number of bus cycles for which the slave device should wait before using the bus in response to a request. Thus an access time value of '1' would indicate that the slave should not access the bus until at least two cycles after the last byte of the request packet has been received. The value of AccessReg0 is preferably fixed at 8 (cycles) to facilitate access to control registers.

The bus architecture of this invention can include more than one master device. The reset or initialization sequence should also include a determination of whether there are multiple masters on the bus, and if so to assign unique master ID numbers to each. Persons skilled in the art will recognize that there are many ways of doing this. For instance, the master could poll each device to determine what type of device it is, for example, by reading a special register then, for each master device, write the next available master ID number into a special register.

ECC

Error detection and correction ("ECC") methods well known in the art can be implemented in this system. ECC information typically is calculated for a block of data at the time that block of data is first written into memory. The data block usually has an integral binary size, e.g. 256 bits, and the ECC information uses significantly fewer bits. A potential problem arises in that each binary data block in prior art schemes typically is stored with the ECC bits appended, resulting in a block size that is not an integral binary power.

In a preferred embodiment of this invention, ECC information is stored separately from the corresponding data, which can then be stored in blocks having integral binary size. ECC information and corresponding data can be stored, for example, in separate DRAM devices. Data can be read without ECC using a single request packet, but to write or read error-corrected data requires two request packets, one for the data and a second for the corresponding ECC information. ECC information may not always be stored permanently and in some situations the ECC information may be available without sending a request packet or without a bus data block transfer.

In a preferred embodiment, a standard data block size can be selected for use with ECC, and the ECC method will determine the required number of bits of information in a corresponding ECC block. RAMs containing ECC information can be programmed to store an access time that is equal to: (1) the access time of the normal RAM (containing data) plus the time to access a standard data block (for corrected data) minus the time to send a request packet (6 bytes); or (2) the access time of a normal RAM minus the time to access a standard ECC block minus the time to send a request packet. To read a data block and the corresponding ECC block, the master simply issues a request for the data immediately followed by a request for the ECC block. The ECC RAM will wait for the selected access time then drive its data onto the bus right after (in case (1) above)) the data RAM has finished driving out the data block. Persons skilled in the art will recognize that the access time described in case (2) above can be used to drive ECC data before the data is driven onto the bus lines and will recognize that writing data can be done by analogy with the method described for a read. Persons skilled in the art will also recognize the adjustments that must be made in the bus-busy structure and the request packet arbitration methods of this invention in order to accommodate these paired ECC requests.

Since this system is quite flexible, the system designer can choose the size of the data blocks and the number of ECC bits using the memory devices of this invention. Note that the data stream on the bus can be interpreted in various ways. For instance the sequence can be $2^n$ data bytes followed by $2^m$ ECC bytes (or vice versa), or the sequence can be $2^k$ iterations of 8 data bytes plus 1 ECC byte. Other information, such as information used by a directory-based cache coherence scheme, can also be managed this way. See, for example, Anant Agarwal, et al., "Scaleable Directory Schemes for Cache Consistency," 15th *International Symposium on Computer Architecture*, June 1988, pp. 280–289. Those skilled in the art will recognize alternative methods of implementing ECC schemes that are within the teachings of this invention.

LOW POWER 3-D PACKAGING

Another major advantage of this invention is that it drastically reduces the memory system power consumption. Nearly all the power consumed by a prior art DRAM is dissipated in performing row access. By using a single row access in a single RAM to supply all the bits for a block request (compared to a row-access in each of multiple RAMs in conventional memory systems) the power per bit can be made very small. Since the power dissipated by memory devices using this invention is significantly reduced, the devices potentially can be placed much closer together than with conventional designs.

The bus architecture of this invention makes possible an innovative 3-D packaging technology. By using a narrow, multiplexed (time-shared) bus, the pin count for an arbitrarily large memory device can be kept quite small—on the order of 20 pins. Moreover, this pin count can be kept constant from one generation of DRAM density to the next. The low power dissipation allows each package to be smaller, with narrower pin pitches (spacing between the IC pins). With current surface mount technology supporting pin pitches as low as 20 mils, all off-device connections can be implemented on a single edge of the memory device. Semiconductor die useful in this invention preferably have connections or pads along one edge of the die which can then be wired or otherwise connected to the package pins with wires having similar lengths. This geometry also allows for very short leads, preferably with an effective lead length of less than 4 mm. Furthermore, this invention uses only bused interconnections, i.e., each pad on each device is connected by the bus to the corresponding pad of each other device.

The use of a low pin count and an edge-connected bus permits a simple 3-D package, whereby the devices are stacked and the bus is connected along a single edge of the stack. The fact that all of the signals are bused is important for the implementation of a simple 3-D structure. Without this, the complexity of the "backplane" would be too difficult to make cost effectively with current technology. The individual devices in a stack of the present invention can be packed quite tightly because of the low power dissipated by the entire memory system, permitting the devices to be stacked bumper-to-bumper or top to bottom. Conventional plastic-injection molded small outline (SO) packages can be used with a pitch of about 2.5 mm (100 mils), but the ultimate limit would be the device die thickness, which is about an order of magnitude smaller, 0.2–0.5 mm using current wafer technology.

BUS ELECTRICAL DESCRIPTION

By using devices with very low power dissipation and close physical packing, the bus can be made quite short, which in turn allows for short propagation times and high data rates. The bus of a preferred embodiment of the present invention consists of a set of resistor-terminated controlled impedance transmission lines which can operate up to a data rate of 500 MHz (2 ns cycles). The characteristics of the transmission lines are strongly affected by the loading caused by the DRAMs (or other slaves) mounted on the bus. These devices add lumped capacitance to the lines which both lowers the impedance of the lines and decreases the transmission speed.

In the loaded environment, the bus impedance is likely to be on the order of 25 ohms and the propagation velocity about c/4 (c=the speed of light) or 7.5 cm/ns. To operate at a 2 ns data rate, the transit time on the bus should preferably be kept under 1 ns, to leave 1 ns for the setup and hold time of the input receivers (described below) plus clock skew. Thus the bus lines must be kept quite short, under about 8 cm for maximum performance. Lower performance systems may have much longer lines, e.g. a 4 ns bus may have 24 cm lines (3 ns transit time, 1 ns setup and hold time).

In the preferred embodiment, the bus uses current source drivers. Each output must be able to sink 50 mA, which provides an output swing of about 500 mV or more. In the preferred embodiment of this invention, the bus is active low. The unasserted state (the high value) is preferably considered a logical zero, and the asserted value (low state) is therefore a logical 1. Those skilled in the art understand that the method of this invention can also be implemented using the opposite logical relation to voltage. The value of the unasserted state is set by the voltage on the termination resistors, and should be high enough to allow the outputs to act as current sources, while being as low as possible to reduce power dissipation. These constraints may yield a termination voltage about 2V above ground in the preferred implementation. Current source drivers cause the output voltage to be proportional to the sum of the sources driving the bus.

Referring to FIG. 7, although there is no stable condition where two devices drive the bus at the same time, conditions can arise because of propagation delay on the wires where one device, A 41, can start driving its part of the bus 44 while the bus is still being driven by another device, B 42 (already asserting a logical 1 on the bus). In a system using current drivers, when B 42 is driving the bus (before time 46), the value at points 44 and 45 is logical 1. If B 42 switches off at time 46 just when A 41 switches on, the additional drive by device A 41 causes the voltage at the output 44 of A 41 to drop briefly below the normal value. The voltage returns to its normal value at time 47 when the effect of device B 42 turning off is felt. The voltage at point 45 goes to logical 0 when device B 42 turns off, then drops at time 47 when the effect of device A 41 turning on is felt. Since the logical 1 driven by current from device A 41 is propagated irrespective of the previous value on the bus, the value on the bus is guaranteed to settle after one time of flight ($t_f$) delay, that is, the time it takes a signal to propagate from one end of the bus to the other. If a voltage drive was used (as in ECL wired-ORing), a logical 1 on the bus (from device B 42 being previously driven) would prevent the transition put out by device A 41 being felt at the most remote part of the system, e.g., device 43, until the turnoff waveform from device B 42 reached device A 41 plus one time of flight delay, giving a worst case settling time of twice the time of flight delay.

CLOCKING

Clocking a high speed bus accurately without introducing error due to propagation delays can be implemented by having each device monitor two bus clock signals and then derive internally a device clock, the true system clock. The bus clock information can be sent on one or two lines to provide a mechanism for each bused device to generate an internal device clock with zero skew relative to all the other device clocks.

Referring to FIG. 8, in the preferred implementation, a bus clock generator 50 at one end of the bus propagates an early bus clock signal in one direction along the bus, for example on line 53 from left to right, to the far end of the bus. The same clock signal then is passed through the direct connection shown to a second line 54, and returns as a late bus clock signal along the bus from the far end to the origin, propagating from right to left. A single bus clock line can be used if it is left unterminated at the far end of the bus, allowing the early bus clock signal to reflect back along the same line as a late bus clock signal.

FIG. 8*b* illustrates how each device 51, 52 receives each of the two bus clock signals at a different time (because of propagation delay along the wires), with constant midpoint in time between the two bus clocks along the bus. At each device 51, 52, the rising edge 55 of Clock1 53 is followed by the rising edge 56 of Clock2 54. Similarly, the falling edge 57 of Clock1 53 is followed by the falling edge 58 of Clock2 54. This waveform relationship is observed at all other devices along the bus. Devices which are closer to the clock generator have a greater separation between Clock1 and Clock2 relative to devices farther from the generator because of the longer time required for each clock pulse to traverse the bus and return along line 54, but the midpoint in time 59, 60 between corresponding rising or falling edges is fixed because, for any given device, the length of each clock line between the far end of the bus and that device is equal. Each device must sample the two bus clocks and generate its own internal device clock at the midpoint of the two.

Clock distribution problems can be further reduced by using a bus clock and device clockrate equal to the bus cycle data rate divided by two, that is, the bus clock period is twice the bus cycle period. Thus a 500 MHz bus preferably uses a 250 MHz clock rate. This reduction in frequency provides two benefits. First it makes all signals on the bus have the same worst case data rates—data on a 500 MHz bus can only change every 2 ns. Second, clocking at half the bus cycle data rate makes the labeling of the odd and even bus cycles trivial, for example, by defining even cycles to be those when the internal device clock is 0 and odd cycles when the internal device clock is 1.

MULTIPLE BUSES

The limitation on bus length described above restricts the total number of devices that can be placed on a single bus. Using 2.5 mm spacing between devices, a single 8 cm bus will hold about 32 devices. Persons skilled in the art will recognize certain applications of the present invention wherein the overall data rate on the bus is adequate but memory or processing requirements necessitate a much larger number of devices (many more than 32). Larger systems can easily be built using the teachings of this invention by using one or more memory subsystems, designated primary bus units, each of which consists of two or more devices, typically 32 or close to the maximum allowed by bus design requirements, connected to a transceiver device.

Referring to FIG. 9, each primary bus unit can be mounted on a single circuit board 66, sometimes called a memory stick. Each transceiver device 19 in turn connects to a transceiver bus 65, similar or identical in electrical and other respects to the primary bus 18 described at length above. In a preferred implementation, all masters are situated on the transceiver bus so there are no transceiver delays between masters and all memory devices are on primary bus units so that all memory accesses experience an equivalent transceiver delay, but persons skilled in the art will recognize how to implement systems which have masters on more than one bus unit and memory devices on the transceiver bus as well as on primary bus units. In general, each teaching of this invention which refers to a memory device can be practiced using a transceiver device and one or more memory devices on an attached primary bus unit. Other devices, generically referred to as peripheral devices, including disk controllers, video controllers or I/O devices can also be attached to either the transceiver bus or a primary bus unit, as desired. Persons skilled in the art will recognize how to use a single primary bus unit or multiple primary bus units as needed with a transceiver bus in certain system designs.

The transceivers are quite simple in function. They detect request packets on the transceiver bus and transmit them to their primary bus unit. If the request packet calls for a write to a device on a transceiver's primary bus unit, that transceiver keeps track of the access time and block size and forwards all data from the transceiver bus to the primary bus unit during that time. The transceivers also watch their primary bus unit, forwarding any data that occurs there to the transceiver bus. The high speed of the buses means that the transceivers will need to be pipelined, and will require an additional one or two cycle delay for data to pass through the transceiver in either direction. Access times stored in masters on the transceiver bus must be increased to account for transceiver delay but access times stored in slaves on a primary bus unit should not be modified.

Persons skilled in the art will recognize that a more sophisticated transceiver can control transmissions to and from primary bus units. An additional control line, TrncvrRW can be bused to all devices on the transceiver bus, using that line in conjunction with the AddrValid line to indicate to all devices on the transceiver bus that the information on the data lines is: 1) a request packet, 2) valid data to a slave, 3) valid data from a slave, or 4) invalid data (or idle bus). Using this extra control line obviates the need for the transceivers to keep track of when data needs to be forwarded from its primary bus to the transceiver bus—all transceivers send all data from their primary bus to the transceiver bus whenever the control signal indicates condition 2) above. In a preferred implementation of this invention, if AddrValid and TrncvrRW are both low, there is no bus activity and the transceivers should remain in an idle state. A controller sending a request packet will drive AddrValid high, indicating to all devices on the transceiver bus that a request packet is being sent which each transceiver should forward to its primary bus unit. Each controller seeking to write to a slave should drive both AddrValid and TrncvrRW high, indicating valid data for a slave is present on the data lines. Each transceiver device will then transmit all data from the transceiver bus lines to each primary bus unit. Any controller expecting to receive information from a slave should also drive the TrncvrRW line high, but not drive AddrValid, thereby indicating to each transceiver to transmit any data coming from any slave on its primary local bus to the transceiver bus. A still more sophisticated transceiver would recognize signals addressed to or coming from its primary bus unit and transmit signals only at requested times.

An example of the physical mounting of the transceivers is shown in FIG. 9. One important feature of this physical arrangement is to integrate the bus of each transceiver 19 with the original bus of DRAMs or other devices 15, 16, 17 on the primary bus unit 66. The transceivers 19 have pins on two sides, and are preferably mounted flat on the primary bus unit with a first set of pins connected to primary bus 18. A second set of transceiver pins 20, preferably orthogonal to the first set of pins, are oriented to allow the transceiver 19 to be attached to the transceiver bus 65 in much the same way as the DRAMs were attached to the primary bus unit. The transceiver bus can be generally planar and in a different plane, preferably orthogonal to the plane of each primary bus unit. The transceiver bus can also be generally circular with primary bus units mounted perpendicular and tangential to the transceiver bus.

Using this two level scheme allows one to easily build a system that contains over 500 saves (16 buses of 32 DRAMs each). Persons skilled in the art can modify the device ID scheme described above to accommodate more than 256 devices, for example by using a longer device ID or by using additional registers to hold some of the device ID. This scheme can be extended in yet a third dimension to make a second-order transceiver bus, connecting multiple transceiver buses by aligning transceiver bus units parallel to and on top of each other and busing corresponding signal lines through a suitable transceiver. Using such a second-order transceiver bus, one could connect many thousands of slave devices into what is effectively a single bus.

DEVICE INTERFACE

The device interface to the high-speed bus can be divided into three main parts. The first part is the electrical interface. This part includes the input receivers, bus drivers and clock generation circuitry. The second part contains the address comparison circuitry and timing registers. This part takes the input request packet and determines if the request is for this device, and if it is, starts the internal access and delivers the data to the pins at the correct time. The final part, specifically for memory devices such as DRAMs, is the DRAM column access path. This part needs to provide bandwidth into and out of the DRAM sense amps greater than the bandwidth provided by conventional DRAMs. The implementation of the electrical interface and DRAM column access path are described in more detail in the following sections. Persons skilled in the art recognize how to modify prior-art address comparison circuitry and prior-art register circuitry in order to practice the present invention.

ELECTRICAL INTERFACE—INPUT/OUTPUT CIRCUITRY

A block diagram of the preferred input/output circuit for address/data/control lines is shown in FIG. 10. This circuitry is particularly well-suited for use in DRAM devices but it can be used or modified by one skilled in the art for use in other devices connected to the bus of this invention. It consists of a set of input receivers 71, 72 and output driver 76 connected to input/output line 69 and pad 75 and circuitry to use the internal clock 73 and internal clock complement 74 to drive the input interface. The clocked input receivers take advantage of the synchronous nature of the bus. To further reduce the performance requirements for device input receivers, each device pin, and thus each bus line, is connected to two clocked receivers, one to sample the even cycle inputs, the other to sample the odd cycle inputs. By thus de-multiplexing the input 70 at the pin, each clocked amplifier is given a full 2 ns cycle to amplify the bus low-voltage-swing signal into a full value CMOS logic signal. Persons skilled in the art will recognize that additional clocked input receivers can be used within the teachings of this invention. For example, four input receivers could be connected to each device pin and clocked by a modified internal device clock to transfer sequential bits from the bus to internal device circuits, allowing still higher external bus speeds or still longer settling times to amplify the bus low-voltage-swing signal into a full value CMOS logic signal.

The output drivers are quite simple, and consist of a single NMOS pulldown transistor 76. This transistor is sized so that under worst case conditions it can still sink the 50 mA required by the bus. For 0.8 micron CMOS technology, the transistor will need to be about 200 microns long. Overall bus performance can be improved by using feedback techniques to control output transistor current so that the current through the device is roughly 50 mA under all operating conditions, although this is not absolutely necessary for proper bus operation. An example of one of many methods known to persons skilled in the art for using feedback techniques to control current is described in Hans Schumacher, et al., "CMOS Subnanosecond True-ECL Output Buffer," *J. Solid State Circuits,* Vol. 25 (1), pp. 150–154 (Feb. 1990). Controlling this current improves performance and reduces power dissipation. This output driver which can be operated at 500 MHz, can in turn be controlled by a suitable multiplexer with two or more (preferably four) inputs connected to other internal chip circuitry, all of which can be designed according to well known prior art.

The input receivers of every slave must be able to operate during every cycle to determine whether the signal on the bus is a valid request packet. This requirement leads to a number of constraints on the input circuitry. In addition to requiring small acquisition and resolution delays, the circuits must take little or no DC power, little AC power and inject very little current back into the input or reference lines. The standard clocked DRAM sense amp shown in FIG. 11 satisfies all these requirements except the need for low input currents. When this sense amp goes from sense to sample, the capacitance of the internal nodes 83 and 84 in FIG. 11 is discharged through the reference line 68 and input 69, respectively. This particular current is small, but the sum of such currents from all the inputs into the reference lines summed over all devices can be reasonably large.

The fact that the sign of the current depends upon on the previous received data makes matters worse. One way to solve this problem is to divide the sample period into two phases. During the first phase, the inputs are shorted to a buffered version of the reference level (which may have an offset). During the second phase, the inputs are connected to the true inputs. This scheme does not remove the input current completely, since the input must still charge nodes 83 and 84 from the reference value to the current input value, but it does reduce the total charge required by about a factor of 10 (requiring only a 0.25 V change rather than a 2.5 V change). Persons skilled in the art will recognize that many other methods can be used to provide a clocked amplifier that will operate on very low input currents.

One important part of the input/output circuitry generates an internal device clock based on early and late bus clocks. Controlling clock skew (the difference in clock timing between devices) is important in a system running with 2 ns cycles, thus the internal device clock is generated so the input sampler and the output driver operate as close in time as possible to midway between the two bus clocks.

A block diagram of the internal device clock generating circuit is shown in FIG. 12 and the corresponding timing diagram in FIG. 13. The basic idea behind this circuit is relatively simple. A DC amplifier 102 is used to convert the small-swing bus clock into a full-swing CMOS signal. This signal is then fed into a variable delay line 103. The output of delay line 103 feeds three additional delay lines: 104 having a fixed delay; 105 having the same fixed delay plus a second variable delay; and 106 having the same fixed delay plus one half of the second variable delay. The outputs 107, 108 of the delay lines 104 and 105 drive clocked input receivers 101 and 111 connected to early and late bus clock inputs 100 and 110, respectively. These input receivers 101 and 111 have the same design as the receivers described above and shown in FIG. 11. Variable delay lines 103 and 105 are adjusted via feedback lines 116, 115 so that input receivers 101 and 111 sample the bus clocks just as they transition. Delay lines 103 and 105 are adjusted so that the falling edge 120 of output 107 precedes the falling edge 121 of the early bus clock, Clock1 53, by an amount of time 128 equal to the delay in input sampler 101. Delay line 108 is adjusted in the same way so that falling edge 122 precedes the falling edge 123 of late bus clock, Clock2 54, by the delay 128 in input sampler 111.

Since the outputs 107 and 108 are synchronized with the two bus clocks and the output 73 of the last delay line 106 is midway between outputs 107 and 108, that is, output 73 follows output 107 by the same amount of time 129 that output 73 precedes output 108, output 73 provides an internal device clock midway between the bus clocks. The falling edge 124 of internal device clock 73 precedes the time of actual input sampling 125 by one sample delay. Note that this circuit organization automatically balances the delay in substantially all device input receivers 71 and 72 (FIG. 10), since outputs 107 and 108 are adjusted so the bus clocks are sampled by input receivers 101 and 111 just as the bus clocks transition.

In the preferred embodiment, two sets of these delay lines are used, one to generate the true value of the internal device clock 73, and the other to generate the complement 74 without adding any inverter delay. The dual circuit allows generation of truly complementary clocks, with extremely small skew. The complement internal device clock is used to clock the 'even' input receivers to sample at time 127, while the true internal device clock is used to clock the ,odd, input receivers to sample at time 125. The true and complement internal device clocks are also used to select which data is driven to the output drivers. The gate delay between the internal device clock and output circuits driving the bus is slightly greater than the corresponding delay for the input circuits, which means that the new data always ill be driven on the bus slightly after the old data has been sampled.

DRAM COLUMN ACCESS MODIFICATION

A block diagram of a conventional 4 MBit DRAM 130 is shown in FIG. 15. The DRAM memory array is divided into a number of subarrays 150–157, for example, 8. Each subarray is divided into arrays 148, 149 of memory cells. Row address selection is performed by decoders 146. A column decoder 147A, 147B, including column sense amps on either side of the decoder, runs through the core of each subarray. These column sense amps can be set to precharge or latch the most-recently stored value, as described in detail above. Internal I/O lines connect each set of sense-amps, as gated by corresponding column decoders, to input and output circuitry connected ultimately to the device pins. These internal I/O lines are used to drive the data from the selected bit lines to the data pins (some of pins 131–145), or to take the data from the pins and write the selected bit lines. Such a column access path organized by prior art constraints does not have sufficient bandwidth to interface with a high speed bus. The method of this invention does not require changing the overall method used for column access, but does change implementation details. Many of these details have been implemented selectively in certain fast memory devices, but never in conjunction with the bus architecture of this invention.

Running the internal I/O lines in the conventional way at high bus cycle rates is not possible. In the preferred method, several (preferably 4) bytes are read or written during each cycle and the column access path is modified to run at a lower rate (the inverse of the number of bytes accessed per cycle, preferably ¼ of the bus cycle rate). Three different techniques are used to provide the additional internal I/O lines required and to supply data to memory cells at this rate First, the number of I/O bit lines in each subarray running through the column decoder 147 A, B is increased, for example, to 16, eight for each of the two columns of column sense amps and the column decoder selects one set of columns from the "top" half 148 of subarray 150 and one set of columns from the "bottom" half 149 during each cycle, where the column decoder selects one column sense amp per I/O bit line. Second, each column I/O line is divided into two halves, carrying data independently over separate internal I/O lines from the left half 147A and right half 147B of each subarray (dividing each subarray into quadrants and the column decoder selects sense amps from each right and left half of the subarray, doubling the number of bits available at each cycle. Thus each column decode selection turns on n column sense amps, where n equals four (top left and right, bottom left and right quadrants) times the number of I/O lines in the bus to each subarray quadrant (8 lines each×4=32 lines in the preferred implementation). Finally, during each RAS cycle, two different subarrays, e.g. 157 and 153, are accessed. This doubles again the available number of I/O lines containing data. Taken together, these changes increase the internal I/O bandwidth by at least a factor of 8. Four internal buses are used to route these internal I/O lines. Increasing the number of I/O lines and then splitting them in the middle greatly reduces the capacitance of each internal I/O line which in turn reduces the column access time, increasing the column access bandwidth even further.

The multiple, gated input receivers described above allow high speed input from the device pins onto the internal I/O lines and ultimately into memory. The multiplexed output driver described above is used to keep up with the data flow available using these techniques. Control means are provided to select whether information at the device pins should be treated as an address, and therefore to be decoded, or input or output data to be driven onto or read from the internal I/O lines.

Each subarray can access 32 bits per cycle, 16 bits from the left subarray and 16 from the right subarray. With 8 I/O lines per sense-amplifier column and accessing two subarrays at a time, the DRAM can provide 64 bits per cycle. This extra I/O bandwidth is not needed for reads (and is probably not used), but may be needed for writes. Availability of write bandwidth is a more difficult problem than read bandwidth because overwriting a value in a sense-amplifier may be a slow operation, depending on how the sense amplifier is connected to the bit line. The extra set of internal I/O lines provides some bandwidth margin for write operations.

Persons skilled in the art will recognize that many variations of the teachings of this invention can be practiced that still fall within the claims of this invention which follow.

```
C+*+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                        ADCLOS
C
C FUNCTIONAL DESCRIPTION:
C
C CALLED BY:                        OPENIN
C
C PROGRAMMER:                       DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*-*-*|*-*-*-*-

      SUBROUTINE adclos

      INTEGER   sunit,lunit,punit
      PARAMETER (punit = 67)
      PARAMETER (lunit = 68)
      PARAMETER (sunit = 69)

      CLOSE(sunit,IOSTAT=ierr)
      CLOSE(lunit,IOSTAT=ierr)
      CLOSE(punit,IOSTAT=ierr)

      RETURN
      END
```

```
C+++++++++++++++++++++++++++++++++++++++++++++++++++++++++++++++++++++++|+++++++
C UNIT NAME:                    ADDTRK
C
C FUNCTIONAL DESCRIPTION:       .
C
C CALLED BY:                    DATPOL
C
C PROGRAMMER:                   DATE OF LAST CHANGE    REASON FOR CHANGE
C
C-*-*-*-*-*-*-*-*-*-*-*-*-*-*-*-*-*-*-*-*-*-*-*-*-*-*-*-*-*-*-*-*-*-*-*-*|*-*-*-*-

      subroutine addtrk (datrec)

c this routine adds a data record to the on-line array of data records
c programmer: avw

      integer           arrpos
      integer           bgnpos
      integer           endpos
      integer           holdsg
      integer           lctrak
      integer           ltypov (16)
      integer           newloc
      integer           numrcs
      integer           segnam
      integer           srchdx
      integer           tfaddx
      integer           tfadtm
      integer           tkoset
      integer           tnewst
      integer           toldst
      integer           trkndx (1000)

      character*5       alert
      character*2       pddg
      character*2       repnum
      character*2       series
      character*9       newdtg
      character*9       tfddtg
      character*9       tnewtm
      character*9       toldtm

      character*160     datrec
      character*160     trkrec (1000)

      logical  trackn
      logical  alflag
      logical           ltonov (16)
      logical           rankt (26, 16)
      logical           segact (1000)
      logical           spprsd (1000)
      logical           timflg
      logical           visibl

      common /trkdbc/   trackn
      common /maptoo/   ltypov, ltonov, rankt
      common /numrcs/   numrcs
      common /segact/   segact
      common /spprsd/   spprsd
      common /tarbou/   tnewst, toldst
      common /tfadez/   tfaddx, tfadtm
      common /tfddtg/   tfddtg
      common /timpos/   bgnpos, endpos
      common /tkoset/   tkoset
      common /trcbou/   tnewtm, toldtm
      common /trkndx/   trkndx
      common /trkrec/   trkrec

      data lctrak       /3/

      if (trackn) then
         print *, 'enter addtrk:'
         print *, '   tfaddx = ', tfaddx
      end if
```

```
        newdtg = datrec(bgnpos:endpos)

c check that new data record is not older than oldest on-line record

        call cmptim (newdtg, toldtm, timflg)

        if (timflg) then

c increment index number

           tnewst = mod (tnewst, numrcs) + 1
c if segment currently exists, delete segment
c otherwise, take next number in sequence and add offset

           if (trkndx(tnewst) .ne. 0) then
              segnam = trkndx(tnewst) + tkoset
              if (segact(trkndx(tnewst))) then
                 call jpurge (segnam)
                 segact(trkndx(tnewst)) = .false.
              end if
           else
              segnam = tnewst + tkoset
              trkndx(tnewst) = tnewst
           end if

c add data to data record array

           trkrec(trkndx(tnewst)) = datrec

c search backwards from newest data to place record by time

           srchdx = tnewst - 1
           if (srchdx .eq. 0) then
              srchdx = numrcs
           end if
   10      continue
           if (trkndx(srchdx) .eq. 0) then
              timflg = .true.
           else
              call cmptim (newdtg,
     +              trkrec(trkndx(srchdx))(bgnpos:endpos), timflg)
           end if
           if (timflg) then
              newloc = mod (srchdx, numrcs) + 1
              if (newloc .ne. tnewst) then
                 holdsg = trkndx(tnewst)
                 arrpos = tnewst
   20            continue
                 arrpos = arrpos - 1
                 if (arrpos .eq. 0) then
                    arrpos = numrcs
                 end if
                 trkndx(mod(arrpos,numrcs)+1) = trkndx(arrpos)
                 if (arrpos .ne. newloc) then
                    go to 20
                 else
                    trkndx(arrpos) = holdsg
                 end if
              end if
           else
              srchdx = srchdx - 1
              if (srchdx .eq. 0) then
                 srchdx = numrcs
              end if
              go to 10
           end if
c
c          compare time in new record with fade time to see if
c          this plot should be plotted
c
           call cmptim (newdtg, tfddtg, visibl)
c
c          if so, and if tracking is turned on, create a new retained
c          segment for this plot and display it on current map.
```

```
c
          if (visibl) then
             if (ltonov(lctrak)) then
c
c***              plot the data on the screen
c
                  call seghnd (segnam, datrec)
c
c                check for alert field being active, if so, display warning
c                window on screen
c
                 read (datrec, 50, err=200) alert,pddg,series,repnum
   50            format (30x, a5, a2,a2,a2)

                 alflag = .false.
                 do 60 i = 1,5
                    if (alert(i:i) .ne. ' ') then
                       alflag = .true.
                    endif
  60             continue
c
c                   freeze tracking without warning messages.
c
cas                 if (alflag) then
cas                     call warning(alert, pddg, series, repnum)
cas                 endif

                 segact(trkndx(newloc)) = .true.

              else
c
c                if tracking not on, then mark this entry in the
c                segact (segment active) array as false.
c
                 segact(trkndx(newloc)) = .false.

              end if

              if (tfaddx .eq. 0) then
                 tfaddx = newloc
              else if ((newloc .eq. tfaddx-1) .or. (newloc .eq. numrcs
     +              .and. tfaddx .eq. 1)) then
                 tfaddx = newloc
              end if

           else
              segact(trkndx(newloc)) = .false.
              if (newloc .eq. tnewst) then
                 tfaddx = 0
              else
     +           if (tfaddx .ne. 0) then
                   tfaddx = mod (tfaddx, numrcs) + 1
              end if

           end if

           spprsd(trkndx(newloc)) = .false.

        end if

c set new values for tnewtm, toldtm

        tnewtm = trkrec(trkndx(tnewst))(bgnpos:endpos)

        if (trkndx(mod(tnewst,numrcs)+1) .ne. 0) then
           toldtm = trkrec(trkndx(mod(tnewst,numrcs)+1))(bgnpos:endpos)
           toldst = mod (tnewst, numrcs) + 1
        else
           toldst = 1
        end if

        if (trackn) then
           print *, 'exit addtrk:'
           print *, '   tfaddx = ', tfaddx
        end if
```

```
      goto 300

200   print*,'error in reading tracking data from input buffer'
300   continue
      return
      end


C+*+*+*+*+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:    ampvpt
c
c  Functional Description:
c       this subroutines sets the amplification area viewport
c
c  Input Files/Parameters:
c       xllavp,yllavp                 The lower left X,Y point
c       xuravp,yuravp                 The upper right X,Y point
c
c  Output Files/Parameters:
c
c  Subroutines/Functions Called:
c       Note: Subroutines preceded by a "j" are explained in the DI-3000 manual.
c
c  Called By:                 DRWAMP, MAKAMP
c
c  Local Variables:           N/A
c
c  Restrictions:              N/A
c
c  Abnormal Return Conditions: N/A
c
c  Location:
c
c  Programmer        Date of Last Change       Reason for Change
C  L. McCleary       Jan 1988              separate amp & sys - ampvpt
c
C-*-*-*-*-*-*-*-*-*-*-*-*-*-*-*-*-*-*-*-*-*-*-*-*-*-*-*-*-*-*-*-*-*-*-*-*-*-*-*|*-*-*-*-
c
      subroutine ampvpt
c
c     this subroutines sets the amplification area viewport
c
      common /comavp/ xllavp,yllavp,xuravp,yuravp
c
      call jvport (xllavp,xuravp,yllavp,yuravp)
c
      return
      end


C+*+*+*+*+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:  ampwin
c
c  Functional Description:
c       this subroutines sets the amplification area window
c
c  Input Files/Parameters:
C       qaxmn,qaymn                The amplification min x,y point
c       qaxmx,qaymx                The amplification max x,y point
c
c  Output Files/Parameters:
c
c  Subroutines/Functions Called:
c       Note: Subroutines preceded by a "j" are explained in the DI-3000 manual.
c
c  Called By:                 DRWAMP
c
c  Local Variables:           N/A
c
c  Restrictions:              N/A
c
c  Abnormal Return Conditions: N/A
c
c  Location:
```

```
c
c  Programmer          Date of Last Change         Reason for Change
C  L. McCleary         Jan 1988               separate amp & sys - ampwin
c
C-*-*-*-*-*-*-*-*-*-*-*-*-*-*-*-*-*-*-*-*-*-*-*-*-*-*-*-*-*-*-*-*-*-*-*-*-*|*-*-*-*-
c
        subroutine ampwin
c
c       this subroutines sets the amplification area window
c
        common/ampwdo/qaxmn,qaymn,qaxmx,qaymx
        real qaxmn,qaymn,qaxmx,qaymx
c
        call jwindo (qaxmn,qaxmx,qaymn,qaymx)
c
        return
        end


C+++++++++++++++++++++++++++++++++++++++++++++++++++++++++++++++++++++++|+++++++
C UNIT NAME:                          ANNOTA
C
C FUNCTIONAL DESCRIPTION:             .
C
C CALLED BY:                          FANNOT
C
C PROGRAMMER:                         DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*|*-*-*-*-

        subroutine annota (string,len)

c       this subroutine does the annotate function

        INTEGER QFB(26),QMB(4)
        COMMON /BUTONS/ QFB,QMB
        LOGICAL VALID,ERROR,RFLAG
        COMMON /B1/ QCANCL,QEXT2M,QRETRN,QSTMNU,QNEXTM
        INTEGER QNEXTM
        LOGICAL QCANCL,QEXT2M,QRETRN,QSTMNU
        INTEGER QCRMNU
        COMMON /B6/ QCRMNU
        integer button
        logical outonce, outwice
        integer segno
        character*(*) string
        common /comgvp/ xllgvp,yllgvp,xurgvp,yurgvp
        common /comgra/ xllgra,yllgra,xurgra,yurgra,ibcgra,iocgra
        common /ctext/ igrtxt,isytxt,iantxt
        data cursax,cursay / 0.,0. /

        ERROR = .FALSE.
        RFLAG = .FALSE.
        MYSEGN = QCRMNU
c       --flags for annotation output
        outonce = .false.
        outwice = .false.
        call gravpt
        call geowin
        call getseg(segno)

 100    call jconwv (cursax,cursay,0.,vx,vy)
        call jpecho (1,2,1,vx,vy)
        call locgeo(button,x,y,valid)
        cursax = x
        cursay = y

        IF (BUTTON.NE.QMB(1)) THEN
            CALL CHECK(BUTTON,MYSEGN,ERROR,RFLAG)
            IF (ERROR) THEN
                CALL MESG(2)
                CALL PAWS
            ENDIF
        ENDIF
        if (button.eq.qmb(1) .or. button.eq.qmb(3)) THEN
```

```
            if (outonce) then
               call jpurge(segno)
               outwice = .true.
            endif
            outonce = .true.
            call jropen(segno)
            CALL XCOLOR (iantxt)
            call jsize (7.,7.)
            call jjust (2,1)
            CALL JFONT(1)
            CALL JGAP(0.)
            CALL JPATH(1)
            CALL JBASE(1.,0.,0.)
            CALL JPLANE(0.,1.,0.)
            call jmove (x,y)
            CALL jhstrg (string(1:len))
            call jrclos
         ENDIF
         if (button .eq. qmb(1)) goto 100

c        -- refresh screen if "ghosts" present due to repositioning string
         if (outwice) call redraw
c           1.7 call to store the text in hldf
         call stotxt( segno,x,y,iantxt,string )

         return
         end


C+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                       APARCS
C
C FUNCTIONAL DESCRIPTION:          .
C
C CALLED BY:                       DRWICN
C
C PROGRAMMER:                      DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*|*-*-*-*-

        subroutine aparcs(iarray,writef)

c       This routine redraws arcs or writes the changed points to
c         the .conv file.  The routine getarc is called to restore
c         the arc arrays.  Chgpts applies the previously set
c         scalefactor and offsets to the points.  If the write flag
c       . is false, the three points along the arc are loaded into
c         arrays and calarc is called to calculate the parameters
c         needed to draw the arc.  Putarc is then called to draw
c         the arc. This drawing is done in the redraw for the Icon
c         Editor and the drawing of icons by the prototype (geticn
c         and drwicn routines).
c         If the write flag is set, the routine is being called by the
c         conversion routines of the Icon Editor and the changed
c         points are writted to the .conv file for use by the Icon
c         Editor.
c     VARIABLES:
c         writef- flag set when .conv file being written to
c         common block ifls- logical unit numbers for files being accessed
c         iarray- array passed from calling routine
c         numarc- number of arcs to be drawn
c         xsaveX/ysaveX- arrays to hold points for redrawing arcs
c   CALLS:      getarc chgpts calarc putarc savarc
c   PROGRAMMER:  Nancy Detrich, A215, March, 1984
C------  MODIFIED BY A692 FOR COMPLETION


        logical writef
        common/ifls/newifl,oldifl
        integer newifl,oldifl
        integer iarray(*),numarc
        real xsave1(12),ysave1(12),xsave2(12),ysave2(12)
        real xsave3(12),ysave3(12)
        real xsave(3),ysave(3)
```

```
      common /chgit/mirflg,xscale,yscale,xoffst,yoffst,rotang
      real xscale,yscale,rotang
      integer xoffst,yoffst,mirflg

c     this routine calls getarc to have the arrays restored and then
c     redraws the arcs that were stored in the savefile

      call getarc(iarray,xsave1,ysave1,xsave2,ysave2,xsave3,ysave3,
     +      numarc)
c     apply scalefactor/offsets to points of arrays
c       call chgpts(xsave1,numarc,0)
c       call chgpts(ysave1,numarc,1)
c       call chgpts(xsave2,numarc,0)
c       call chgpts(ysave2,numarc,1)
c       call chgpts(xsave3,numarc,0)
c       call chgpts(ysave3,numarc,1)

      if (.not.writef) then
        do 100 i = 1,numarc
c         load the xsave and ysave arrays to use calarc rtn
c           to calculate arc parameters and then draw the arcs
          xsave(1) = xsave1(i)
          ysave(1) = ysave1(i)
          xsave(2) = xsave2(i)
          ysave(2) = ysave2(i)
          xsave(3) = xsave3(i)
          ysave(3) = ysave3(i)
          call rotpts(xsave,ysave,3)
          call calarc(xsave,ysave,a0,a1,a2,centrx,centry,rad)
c --- changed by Dirk
c --- find center first, change center and outer points, and
c     find angles
          call chgpts(centrx,1,0)
          call chgpts(centry,1,1)
          call chgpts(xsave,1,0)
          call chgpts(ysave,1,1)
          if (mirflg .eq. 0) then
               a0 = - a0 + sign(180.0,a0)
               a1 = - a1 + sign(180.0,a1)
               a2 = - a2 + sign(180.0,a2)
          else if (mirflg .eq. 1) then
               a0 = -a0
               a1 = -a1
               a2 = -a2
          endif

          rad=sqrt((xsave(1)-centrx)**2+(ysave(1)-centry)**2)
          call putarc(a0,a1,a2,centrx,centry,rad)
100     continue

      else
c       call routine to write changed arc points to new file
c ----- changed by Dirk Butson
c ----- changing points before calling calarc was
c     creating problems
        call rotpts(xsave1,ysave1,numarc)
        call chgpts(xsave1,numarc,0)
        call chgpts(ysave1,numarc,1)
        call rotpts(xsave2,ysave2,numarc)
        call chgpts(xsave2,numarc,0)
        call chgpts(ysave2,numarc,1)
        call rotpts(xsave3,ysave3,numarc)
        call chgpts(xsave3,numarc,0)
        call chgpts(ysave3,numarc,1)
        call savarc(xsave1,ysave1,xsave2,ysave2,
     +      xsave3,ysave3,numarc,newifl)
      endif
      return
      end


C+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                     APCIRC
C
```

```
C FUNCTIONAL DESCRIPTION:
C
C CALLED BY:                          DRWICN
C
C PROGRAMMER:                         DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*-*-*-*|*-*-*-*-

        subroutine apcirc(iarray,writef)
c       This routine either redraws the circles that have been
c         saved in a file or writes out the changed coordinates
c         to a new file (Icon Editor conversion routines).
c         Getcir is called to load the center points and the
c         radius of the circles into the respective arrays.
c         Chgpts is then called to change the points using the
c         scalefactors and offsets set by a previous routine.
c         If the write flag is not set, the circles are drawn.
c         If the write flag is set, the savcir routine is called
c         to write the points to the .conv file (newifl).
c     VARIABLES:
c        writef- flag to control writing to the .conv file
c        iarray- holds first line read in by calling routine
c        numcir- number of circles to be drawn
c        radius/xcentr/ycentr- arrays to hold radius and center points
c        common block ifls- logical unit numbers for files being accessed
c   CALLS:     getcir chgpts savcir
c   PROGRAMMER:  Nancy Detrich, A215, March, 1984


        logical writef
        integer iarray(*),numcir
        real radius(24),xcentr(24),ycentr(24)
        common/ifls/newifl,oldifl
        integer newifl,oldifl

c       this routine calls getcir to have the arrays restored and then
c       redraws the circles that were stored in the savefile
        numcir = iarray(2)

        call getcir(iarray,radius,xcentr,ycentr)
        call rotpts(xcentr,ycentr,1)
        call chgpts(xcentr,numcir,0)
        call chgpts(ycentr,numcir,1)
c       scale the radius--no offsets
        call chgpts(radius,numcir,2)
        if (.not.writef) then
          do 100 i = 1,numcir
            call jpintr(0)
c           draw circle--(x center,y center,z center,radius,nsegs(0=default))
            call jcircl(xcentr(i),ycentr(i),0.,radius(i),0)
 100      continue
        else
c         write the changed points to the .conv file
          call savcir(2,numcir,radius,xcentr,ycentr,newifl)
        endif
        return
        end


C+*+*+*+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                         APFILL
C
C FUNCTIONAL DESCRIPTION:
C
C CALLED BY:                         DRWICN
C
C PROGRAMMER:                        DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*-*-*-*|*-*-*-*-

        subroutine apfill(iarray,writef,protcl)

c       This routine calls jfills to do a seed fill at the points
c        loaded into the x and y arrays.
```

```
c        Getpts is called to load the x and y arrays with the
c        points to be used.  The chgpts routine is called to
c        apply the scalefactors and offsets to the points as
c        necessary based on the values previously set in the
c        chgit common area.
c        This routine may be called from multiple places in the
c        Icon Editor and the prototype.
c        If the write flag is false, it may be a call from either
c        the fill routine for the Icon Editor or the icon fill
c        for the prototype.  A value of 0 is passed in the prototype
c        color parameter if the Icon Editor is calling this routine
c        and the index in the icncol array is passed to the jfills
c        routine.  If there is a non-zero value in the protcl
c        parameter, that value is passed as the color index value
c        for jfills.  If the write flag is true, the routine is
c        being called by the conversion routines of the Icon Editor
c        and the changed points are to be written to the savefile
c        with an op-code of 4 or 10, based on the value read in
c        array position 1.
c        If the op-code is a 4, it is a regular fill point.
c        If the op-code is 10, it is an icon fill point being
c        assigned via the getfil routine or to be drawn
c        during the drawing of an icon.
c    VARIABLES:
c        protcl- index value to be used for prototype color
c        saveop- the op-code read in and saved if writing is required
c        writef- write flag to control writing to the .conv file
c        iarray- array passed from calling routine (first record)
c        xarray,yarray- arrays holding x and y values of fill points
c        common block ifls- logical unit numbers for files being accessed
c        common block icccol- holds current color
c        common block inccol- array of colors
c   CALLS:     chgpts save getpts jfills
c   PROGRAMMER:  Nancy Detrich, A215, March, 1984


      integer protcl,saveop
      logical writef
      integer iarray(*)
      real xarray(34),yarray(34)
      common/ifls/newifl,oldifl
      integer newifl,oldifl
      dimension icncol (10)
      common /icncol/icncol
      common /icccol/icccol
c     save off the 'op code' in the first position to be used
c       if it needs to be written out -- op code will be 4
c       if it is a regular fill point, and 10 if it is an
c       icon fill point
      saveop = iarray(1)

c     call to routine to return number of points and the restored
c       x and y arrays with the coordinates
      call getpts(iarray,numpts,xarray,yarray)
      call rotpts(xarray,yarray,numpts)
      call chgpts(xarray,numpts,0)
      call chgpts(yarray,numpts,1)

      if (.not.writef) then
c      check that the icon is allowed to be filled
c        (even though user may have requested it)
       if (numpts .ne. 0) then
c       fill the areas around the seed point
        do 100 i = 1,numpts
          if (protcl .eq. 0) then
c           being called from icon editor routines, use current
c               color
            call jfills (icncol(icccol),xarray(i),yarray(i),
     +      .true.)
          else
c           being filled by prototype routine, use color
c              requested by prototype
            call jfills (protcl,xarray(i),yarray(i),.true.)
          endif
```

```
 100       continue
          endif
         else
c          call routine to write changed points to new file
           call save(saveop,numpts,xarray,yarray,newifl)
         endif

         return
         end


C+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                       APLINE
C
C FUNCTIONAL DESCRIPTION:          .
C
C CALLED BY:                       DRWICN
C
C PROGRAMMER:                      DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*-*|*-*-*-*-

        subroutine apline(iarray,writef)

c       This routine is used by the Icon Editor redraw and convert
c        routines and the prototype. This routine draws a connected
c        line which has been saved in a file.
c        Getpts is called to load the points in the x and y arrays.
c        The arrays are passed to the chgpts routine to change the
c        points by the scalefactors and offsets previously set.
c        The redraw line routine is then called to draw the line if
c        a redraw is to occur for the Icon Editor or the prototype,
c        or the changed points are written to another file (.conv)
c        if the writef has been set by an Icon Editor conversion
c        routine.
c    VARIABLES:
c        writef- flag set if the changed points are to be written
c            to a file
c        iarray- array passed from calling routine-- holds number
c            of points in the line and the first 12 coordinates
c        npts- number of points in the connected line
c        xarray/yarray- hold x and y coordinates for all the points
c            of the line
c        common block ifls- logical unit numbers for files being accessed
c   CALLS:     getpts chgpts redrln save
c   PROGRAMMER:  Nancy Detrich, A215, March, 1984


        logical writef
        integer iarray(*)
        integer npts
        real xarray(38),yarray(38)
        common/ifls/newifl,oldifl
        integer newifl,oldifl

c       fill the x and y arrays with the coordinates in
c         a REAL format (for DI-3000)
        call getpts(iarray,npts,xarray,yarray)

c       call routine to change the values in the array by
c          the correct offset value indicated by the last
c          parameter
        call rotpts(xarray,yarray,npts)
        call chgpts(xarray,npts,0)
        call chgpts(yarray,npts,1)
        if (.not.writef) then
          call redrln(xarray,yarray,npts)
        else
c         write out the arrays of points to the new file
          call save(1,npts,xarray,yarray,newifl)
        endif

        return
        end
```

```
C+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    APMARK
C
C FUNCTIONAL DESCRIPTION:       .
C
C CALLED BY:                    DRWICN
C
C PROGRAMMER:                   DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*|*-*-*-*-

        subroutine apmark(iarray,writef)

c       This routine draws markers at the points loaded in the
c        x and y arrays by the getpts routine.  The marker type
c        is in the last position of the x array.
c        The chgpts routine is called to apply the scalefactor
c        and offset, if necessary to the points in the x and
c        y arrays before the markers are drawn by the redrmk routine.
c        If the write flag is set, the routine is being called
c        by the conversion routines of the Icon Editor and
c        the changed points are written to the .conv file for
c        use by the prototype.
c     VARIABLES:
c        iarray- array passed from calling routine
c        xarray/yarray- coordinates for markers
c        ccunt- number of points loaded in the x and y arrays
c           (xarray(count) has the marker type in it, and yarray(count)
c           is meaningless)
c        writef- flag set if .conv file is to be written to
c        common block ifls- logical unit numbers for files being accessed
c   CALLS:     getpts chgpts redrmk save
c   PROGRAMMER:  Nancy Detrich, A215, March, 1984


        logical writef
        integer iarray(*),count
        real xarray(38),yarray(38)
        common/ifls/newifl,oldifl
        integer newifl,oldifl

        call getpts(iarray,count,xarray,yarray)
        call rotpts(xarray,yarray,count-1)
        call chgpts(xarray,count-1,0)
        call chgpts(yarray,count-1,1)

        if(.not.writef) then
c         marker type is stored in the last position of the x array
          mkrtyp = xarray(count)
c         draws specified marker at array of points given
          call redrmk(mkrtyp,count-1,xarray,yarray)
        else
c         call routine to write changed points to .conv file
          call save(5,count,xarray,yarray,newifl)

        endif
        return
        end

C+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    APRECT
C
C FUNCTIONAL DESCRIPTION:       .
C
C CALLED BY:                    DRWICN
C
C PROGRAMMER:                   DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*|*-*-*-*-

        subroutine aprect(iarray,writef)

c       This routine redraws a rectangle that was stored in a file.
```

```
c        The getpts routine loads the x and yarrays and the
c        chgpts routine is called to change the points using
c        the scalefactors and offsets previously set.
c        If the write flag has not been set, the rectangle is drawn.
c        If it has been set, the changed points are written
c        to the .conv file.
c     VARIABLES:
c        writef- set to have changed points written to a file (.conv)
c        iarray- holds points of record previously read in
c        numpts- number of points to be loaded
c        xarray/yarray- points to be used for drawing rectangle
c        common block ifls- logical unit numbers for files being accessed
c        start- point number to start at when redrawing (not implemented)
c   CALLS:     getpts chgpts redrct save
c   PROGRAMMER:  Nancy Detrich, A215, March, 1984


        common/ifls/newifl,oldifl
        integer newifl,oldifl
        logical writef
        integer iarray(*),numpts,i,start
        real xarray(4),yarray(4)

        numpts = iarray(2)
        call getpts(iarray,numpts,xarray,yarray)
        call rotpts(xarray,yarray,numpts)
        call chgpts(xarray,numpts,0)
        call chgpts(yarray,numpts,1)
        if (.not.writef) then
          start=1
          do 100 i = 1,numpts/4
            call redrct(xarray,yarray,start)
            start = start + 4
 100      continue
        else
c         call routine to write the changed points to a file
          call save(3,4,xarray,yarray,newifl)
        endif

        return
        end


C+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                     APSMOO
C
C FUNCTIONAL DESCRIPTION:        .
C
C CALLED BY:                     DRWICN
C
C PROGRAMMER:                    DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*|*-*-*-*-

        subroutine apsmoo(iarray,writef)

c       This routine redraws the smoothed lines stored in the
c         savefile or converts the points and writes the converted
c         points to a .conv file, as indicated by the write flag.
c         Getpts is called to load the x and y arrays with the
c         points to be used to recreate the smoothed line.  Chgpts
c         is then called to apply the scalefactor and offset
c         previously set.
c         If the write flag is false, the icbez routine is called
c         to convert the points into coordinates for the curve.
c         The redraw line routine is the called to draw the curve.
c         If the write flag is set, the changed points are written
c         to the .conv file for use by the prototype.
c     VARIABLES:
c         iarray- array passed from calling routine
c         xc/yc- calculated points returned from icbez
c         npts- number of points returned from icbez
c         xp/yp- input points gotten from the savefile
c         npol- number of points on the line given by the user
```

```
c         writef- flag set to have the points written to the .conv file
c         common block ifls- logical unit numbers for files being accessed
c    CALLS:     getpts chgpts icbez redrln save
c    PROGRAMMER:  Nancy Detrich, A215, March, 1984


       logical writef
       common/ifls/newifl,oldifl
       integer newifl,oldifl
       integer iarray(*)
       integer npts,npol
       real xp(34),yp(34),xc(34),yc(34)

       call getpts(iarray,npol,xp,yp)
       call rotpts(xp,yp,npol)
       call chgpts(xp,npol,0)
       call chgpts(yp,npol,1)

       if(.not.writef) then
c        calculate the points for the curve and draw it
         call icbez(npol,xp,yp,xc,yc,npts)
         call redrln(xc,yc,npts)
       else
c        write out the changed points to the <filename>.conv file
         call save(6,npol,xp,yp,newifl)
       endif
       return
       end


C+*+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                      APTEXT
C
C FUNCTIONAL DESCRIPTION:         .
C
C CALLED BY:                      DRWICN
C
C PROGRAMMER:                     DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*-*|*-*-*-*-

       subroutine aptext(iarray,writef,retstr,nchars)

c      this routine is used to read in the necessary parameters
c         and either display the text when called by the
c         icon editor (drawic) or write out records to the
c         converted file if the file is being converted
c         (also called by drawic).  This routine is also
c         called by drwicn in the prototype routines to
c         draw the text when symbols are being created.
c    VARIABLES:
c        iarray- array passed from calling routine
c        writef- flag set when .conv file being written to
c        common block ifls- logical unit numbers for files being accessed
c        x/y- coordinate for text placement--will be sent to chgtxt
c        height- height of text--will be scaled by chgtxt
c        size- size selection made by user (icsize)
c        style- font selection made by user (icfont)
c        retstr- text string to be displayed
c        nchars- number of characters in retstr
c   CALLS:     chgtxt readch dwtext savtxt
c   PROGRAMMER:  Nancy Detrich, A215, March, 1984


       common/ifls/newifl,oldifl
       integer newifl,oldifl
       logical writef
       integer iarray(*)
       integer x,y ,height,size,style,nchars
       character*(*) retstr

c      get text parameters
       size = iarray(2)
       height = (iarray(3))
```

```
        style = iarray(4)
        nchars = iarray(5)
        x = (iarray(6))
        y = (iarray(7))

c        print*,'size,height,style,nchars,x,y,retstr'
c        print*,size,height,style,nchars,x,y,retstr(1:nchars)

c       apply scalefactor to height and scale and offsets to x and y
        call chgtxt(height,x,y)

c        print*,'after chgtxt',height,x,y,writef

        if (.not.writef) then
c         display the text
          call jjust(2,1)
          call jmove(REAL(x),REAL(y))
          call jsize(REAL(height)/2.0,REAL(height))
          call dwtext(style,nchars,retstr)
        else
c         write parameters out to '.conv' file (newifl)
          call savtxt(size,height,style,nchars,retstr,
     +          x,y,newifl)
        endif
        return
        end


C+*+*+*+*+*+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:                       arc
c
c  Functional Description:
c       this subroutines draws an arc
c
c  Input Files/Parameters:
c
c  Output Files/Parameters: N/A
c
c  Subroutines/Functions Called:
c      Note: Subroutines preceded by a "j" are explained in the DI-3000 manual.
c
c  Called By:
c
c  Local Variables: N/A
c
c  Restrictions: N/A
c
c  Abnormal Return Conditions:  N/A
c
c  Location:       /a21/dave
c
c  Programmer         Date of Last Change       Reason for Change
c
C-*-*-*-*-*-*-*-*-*-*-*-*-*-*-*-*-*-*-*-*-*-*-*-*-*-*-*-*-*-*-*-*-*-*-*-*-*-*-*-*-*¦*-*-*-*-
c
        subroutine arc (x0,y0,radius,nseg,a0,a1)
c
c       draw arc
c
        data pi/3.1415927/
c       arb is an arbitrary factor limiting the size of default vectors
c       llimit is the lower limit of nnseg
c       max is the upper limit of nnseg
        data llimit,max /10,1000/
        data arb /100./
c
c       print*,'arc -- enter',x0,y0,radius,nseg
        dtor = pi/180.
        curang = a0
        nnseg = nseg

c       if # segments is < 2 then set to default.
        if (nnseg .lt. 2) then
            nnseg = ( a1 - a0 ) * radius / arb
```

```
            if (nnseg .lt. llimit) nnseg = llimit
            if (nnseg .gt. max) nnseg = max
        endif

c       size of angle increment is inscribed angle divided by # segments.
        rincr = ( a1 - a0 ) / float( nnseg )

c       radius used is absolute value of radius passed.
        rad = abs( radius )

c       move to the first point.
        call jmove( x0 + rad * cos( a0*dtor ),
     +              y0 + rad * sin( a0*dtor ))
c
        do 100 i = 1, nnseg-1
            curang = curang + rincr
            x = x0 + rad * cos( curang*dtor )
            y = y0 + rad * sin( curang*dtor )
            call jdraw( x, y )
  100   continue
        call jdraw( x0 + rad * cos( a1*dtor ),
     +              y0 + rad * sin( a1*dtor ))

c       print*,'arc -- exit ',x,y,radius,curang,nnseg

        return
        end

C++++++++++++++++++++++++++++++++++++++++++++++++++++++++++++++++++-++++++++++|+++++++
C UNIT NAME: areafl
C
C FUNCTIONAL DESCRIPTION:  fill areas on a map with different colors
C
C INPUT FILES/PARAMETERS:
C
C GLOBAL VARIABLES :
C
C OUTPUT FILES/PARAMETERS:  NONE.
C
C SUBROUTINES/FUNCTIONS CALLED : NONE.
C
C CALLED BY:                     DMAPII
C
C LOCAL VARIABLES:
C
C RESTRICTIONS: NONE.
C
C ABNORMAL RETURN CONDITIONS:   NONE.
C
C LOCATION:
C
C PROGRAMMER:                    DATE OF LAST CHANGE     REASON FOR CHANGE
C
C     JERRY FENERTY                                      DOCUMENT AND MODIFY
C                                                        FOR A21 PROTOTYPE.
C      MODIFIED BY JERRY FENERTY 8/13/85 -- FINAL COMPLETION
C
C-*-*-*-*-*-*-*-*-*-*-*-*-*-*-*-*-*-*-*-*-*-*-*-*-*-*-*-*-*-*-*-*-*-*-*-*-*-*-*|*-*-*-*-

        subroutine.areafl

c       fill areas on a map with different colors

        logical renew

        INTEGER QNMPTS,QSHADE(60)
        REAL QLATT(60),QLONN(60)
        COMMON /FILLS/ QNMPTS,QLATT,QLONN,QSHADE

        INTEGER SEGNO,FIRSEG
        COMMON /SEGNO/ SEGNO,FIRSEG

        LOGICAL INTERR
```

```
      COMMON /INTERR/INTERR

      LOGICAL map
      common /mapdbc/ map

      IF (map) PRINT*,'IN DMAPII QNMPTS IS ',QNMPTS

clj --- renew keeps track of whether or not the screen
clj --- must be saved before doing the next fill
      renew = .true.

      DO 230 I=1,QNMPTS

         CALL GETSEG(ISEG)
         SEGNO = ISEG
         CALL GLTYPE(QSHADE(I),0)
         INTERR = .FALSE.
         CALL FILLPT(QSHADE(I),QLATT(I),QLONN(I),renew)

  230 CONTINUE

      return
      end

C+*+*+*+*+*+*+*+*+*+*+*+*+*+*+*+*+*+*+*+*+*+*+*+*+*+*+*+*+*+*+*+*+*-*+*|*+*+*+*+
C UNIT NAME:                    AREANF
C
C FUNCTIONAL DESCRIPTION:       .
C
C CALLED BY:                    STATEC
C
C PROGRAMMER:                   DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*|*-*-*-*-

      subroutine areanf
c
c     this subroutine is the area not found state interpreter (20)
c
      common /states/ nextst
      logical eol,eoc
      common /comnds/ lenl,indxw,lenw,eol,eoc
      character * 80 comlin
      common /comlin/ comlin
      character * 105 errlin
c
      errlin = 'Area name not found : ' //
     +  comlin(indxw:indxw + lenw - 1)
      lenlin = 22 + lenw
      call cerror(lenlin,errlin)
      nextst = 1
c
      return
      end

C+*+*+*+*+*+*+*+*+*+*+*+*+*+*+*+*+*+*+*+*+*+*+*+*+*+*+*+*+*+*+*+*+*+*+*+*|*+*+*-*+
C UNIT NAME:                  . ARRW
C
C FUNCTIONAL DESCRIPTION:       .
C
C CALLED BY:                    SETCOL
C
c Author: Ellen Jenkins, R531, September 30, 1982
C
C PROGRAMMER:                   DATE OF LAST CHANGE     REASON FOR CHANGE
c L McCleary    Jan 1988             fix value annotate - arrw
C
C-*-*-*-*-*-*-*-*-*-*-*-*-*-*-*-*-*-*-*-*-*-*-*-*-*-*-*-*-*-*-*-*-*-*-*-*|*-*-*-*-

      subroutine arrw (xcor,ycor,intcol,xsrang,yrange,value)
c
```

```
c Purpose: draw small arrows indicating where on scale current choice is
c          located, and print integer value of current choice under arrow
c
c Access: call arrw
c
c Algorithm: draw arrow at x,y coordinates returned by positioning cursor
c            and convert integer value to ascii character(s) and print value
c            under arrow,with characters centered under arrow
c
c Calls: dbitoa
c
      character *3 xname
      tval = value + 0.5
      ivalue = tval
      inum = ivalue
      call jopen
      call xcolor (intcol)
      call jmove(xcor-.01*xsrang,ycor-.035*yrange)
      call jdraw(xcor,ycor-.015*yrange)
      call jdraw(xcor+.01*xsrang,ycor-.035*yrange)
      call jjust (2,1)
      if (xcor.ge.xsrang) call jjust (3,1)
      call jmove (xcor,ycor-.055*yrange)
c      read (inum,1500,err=190) xname
      write (xname,1500,err=190) inum
 1500 format(i3)
      call jsize (5.0,2.5)
      if (ivalue.lt.10) then
c         call jlstrg (xname(1:1))
         call jlstrg (xname(3:3))
      else
         if (ivalue.lt.100) then
c            call jlstrg (xname(1:2))
            call jlstrg (xname(2:3))
         else
            call jlstrg (xname(1:3))
         endif
      endif
  190 continue
      call jclose
      return
      end


C+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:                        ascint
c
c  Functional Description:
c       this subroutine converts an ascii string to integer (+ or -)
c
c  Input Files/Parameters:
c
c  Output Files/Parameters: N/A
c
c  Subroutines/Functions Called:
c      Note: Subroutines preceded by a "j" are explained in the DI-3000 manual.
c
c  Called By:                        CREATM, FCHSCA, REPLAY
c
c  Local Variables: N/A
c
c  Restrictions: N/A
c
c  Abnormal Return Conditions:  N/A
c
c  Location:      /a21/dave
c
c  Programmer        Date of Last Change       Reason for Change
C  L. MCCLEARY       JUL 1988               NEGATIVE INTS - ASCINT
c
C-*-*-*-*-*-*-*-*-*-*-*-*-*-*-*-*-*-*-*-*-*-*-*-*-*-*-*-*-*-*-*-*-*-*-*|*-*-*-*-
c
      subroutine ascint (ch,int,len,ierror)
c
```

```
        character*(*) ch
C       character c
c
c       print*,'ASCINT -- enter ch,len = ',ch,len
        ierror = 0
C       c = ch(1:1)
C       if (c.ne.'1'.and.c.ne.'2'.and.c.ne.'3'.and.c.ne.'4'.and.
C    +      c.ne.'5'.and.c.ne.'6'.and.c.ne.'7'.and.c.ne.'8'.and.c.ne.'9'
C    +      .and.c.ne.'0') then
C           ierror = 3
C       endif
C       read(ch(1:len),10100,err=181,end=182) int
C10100  format(i80)
        M=INDEX(CH(1:LEN),'-')
        I=1
        DO 100 J=M+1,LEN
                IF(INDEX('0123456789',CH(J:J)).EQ.0) I=0
 100    CONTINUE
        IF(M.EQ.LEN) I=0
        IF(I.EQ.0) THEN
                IERROR=3
C               PRINT *,'NON-NUMERIC VALUE ENTERED'
        ELSE
                READ(CH(M+1:LEN),10100,ERR=181,END=182) INT
10100           FORMAT(I80)
                IF(M.GT.0) INT=-INT
        ENDIF
        go to 190
  181       continue
c            print*,'Error in conversion to integer'
            ierror = 1
            go to 190
  182       continue
c            print*,'End of file on conversion to integer'
            ierror = 2
  190   continue
c       print*,'ASCINT -- exit int,ierror = ',int,ierror
c
        return
        end


C+*+*+*+*+*+*+*+*+*+*+*+*+*+*+*+*+*+*+*+*+*+*+*+*+*+*+*+*+*+*+*+*+*+*+*+*+*+|*+*+*+*+
c  UNIT NAME:                       asclog
c
c  Functional Description:
c       convert t's and f's in a character string to a logical array
c
c  Input Files/Parameters:
c
c  Output Files/Parameters: N/A
c
c  Subroutines/Functions Called:
c      Note: Subroutines preceded by a "j" are explained in the DI-3000 manual.
c
c  Called By:                       RBOUND, RPARAM
c
c  Local Variables: N/A
c
c  Restrictions: N/A
c
c  Abnormal Return Conditions:  N/A
c
c  Location:      /a21/dave
c
c  Programmer         Date of Last Change       Reason for Change
c
C-*-*-*-*-*-*-*-*-*-*-*-*-*-*-*-*-*-*-*-*-*-*-*-*-*-*-*-*-*-*-*-*-*-*-*-*-*-|*-*-*-*-
c
        subroutine asclog (logarr,len,chastr)

c       convert t's and f's in a character string to a logical array
c
        logical logarr(*)
        character*(*) chastr
```

```
c
        do 110 i=1,len
            if (chastr(i:i).eq.'t') then
                logarr(i) = .true.
            else
                logarr(i) = .false.
            endif
  110   continue
c
        return
        end


C+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                       BOXCLR
C
C FUNCTIONAL DESCRIPTION:          .
C
C CALLED BY:                       INIPIC, RESCON
C
C PROGRAMMER:                      DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*|*-*-*-*-

        subroutine boxclr

c       draw a filled rectangle to erase the bitmap

        common/scratr/qbox,qbkgrd
        integer qbox,qbkgrd
        data xlow,xhigh,ylow,yhigh/0.,1.,0.,1./

        call jwindo (xlow,xhigh,ylow,yhigh)
        call jopen
        call xcolor (qbox)
        call xpidex (qbkgrd,0)
        call jpintr (1)
        call jrect (xlow,ylow,xhigh,yhigh)
        call jclose

        return
        end

C+*+*+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:                      BOXVPT
c
c  Functional Description:
c       this subroutines sets the construction box area viewport
c
c  Input Files/Parameters:
C       xllbvp
C         lbvp
C       xurbvp
C       yurbvp
c
c  Output Files/Parameters: N/A
c
c  Subroutines/Functions Called:
c     Note: Subroutines preceded by a "j" are explained in the DI-3000 manual.
c
c  Called By:    MAKBOX
c
c  Local Variables: N/A
c
c  Restrictions: N/A
c
c  Abnormal Return Conditions:  N/A
c
c  Location:      Apollo       /a21/dave
c
c  Programmer          Date of Last Change       Reason for Change
c
C-*-*-*-*-*-*-*-*-*-*-*-*-*-*-*-*-*-*-*-*-*-*-*-*-*-*-*-*-*-*-*-*-*-*-*-*-*|*-*-*-*-
```

```
c
        subroutine boxvpt
c
c       this subroutines sets the construction box area viewport
c
        common /combvp/ xllbvp,yllbvp,xurbvp,yurbvp
c
        call jvport (xllbvp,xurbvp,yllbvp,yurbvp)
c       print*,'boxvpt -- ',xllbvp,yllbvp,xurbvp,yurbvp
c
        return
        end
C+*+*+*+*+*+*+*+*+*+*+*+*+*+*+*+*+*+*+*+*+*+*+*+*+*+*+*+*+*+*+*+*+*+*|*+*+*+*+
C UNIT NAME:                      BSTMAP
C
C FUNCTIONAL DESCRIPTION:          .
C
C CALLED BY:                       READML
C
C PROGRAMMER:                      DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*|*-*-*-*-

      subroutine bstmap(flatlon,blatlon,numb,mapcho,mflen)
c
c  this subroutine checks each saved map to determine which is the best fit
c  for the given fixlat/fixlon to be displayed closest to the center point.
c
      logical sys
      common /sysdbc/ sys
      character*16 flatlon,blatlon(30)
      character*(*) mapcho
      integer mflen
      integer*2 i,numb,sitmax,notsit
      integer*2 idummy
      character*50 filenm
      character*60 desfile
      integer*4 ierror
      integer*4 len
      real rarray(4)
      integer iarray(7)
      real rlat,rlon,blat,blon
      real x,y,bx,by
      real smalrad
      logical onmap,siton
      logical novali
      integer savecnt
      character*1 choice
      character*1 lowcase(10)
      character*50 defpth
      common /defpth/ defpth
      common /lendef/ lendef
c     map parameters
      logical lton(16),dotem
      integer ipgrid(4),ltyptb(16)
      common /map/ XRNM,XC,YC,LEVEL,CLAT,CLON,XRAD,YRAD,ITPROJ,
     +       IRES,LTYPTB,LUNDAT,LUNIND,LUNLIN,LTON,IPGRID,DOTEM,
     +       ORHALT

       data ifl /9/
       data irdwr /1/
       data filenm /' '/
       data lowcase/'a','b','c','d','e','f','g','h','i','j'/

       savecnt = 0
       choice = '0'
      mapcho = ' '
      if (sys) then
          print*,'bstmap -- enter-lat/lon ',flatlon
      endif
      filenm(1:lendef+4) = defpth(1:lendef) // 'save'
      filenm(lendef+6:lendef+9) = '.prm'
c
c-----convert lat/lon to radians
```

```
c
      len = 16
      call lltord(flatlon,len,rlat,rlon,ierror)
      if (sys) then
          print*,'bstmap -- rlat/rlon ',rlat,rlon
      endif
      novali = .true.

c-----read in the # of files saved on this system

      desfile = defpth(1:lendef) // 'default.des'
      len = lendef + 11
      call openit(desfile,len,ifl,irdwr,ierror)
      if(ierror .eq. 0) then
          read(ifl,30) savecnt
 30       format(i3)
          call closit(ifl)
      endif
c
c-----loop to find which center pt is min distance from fixlat/fixlon in radians
c
      do 100 i= 1,savecnt
          if(i .lt. 10) then
              filenm(lendef+5:lendef+5) = char(i+48)
          else
              filenm(lendef+5:lendef+5) = lowcase(i-9)
          endif
          len = lendef + 9
c
c   open .prm file for the saved map and read in map info
c
          call openit(filenm,len,ifl,irdwr,ierror)
          if(ierror .eq. 0) then
              read(ifl,*) idummy
              len = 4
              call readre(ifl, rarray, len, ierror)
              XC = rarray(1)
              YC = rarray(2)
              XRAD = rarray(3)
              YRAD = rarray(4)
              call readre(ifl, rarray, len, ierror)
              XRNM = rarray(1)
              CLAT = rarray(2)
              CLON = rarray(3)

         ORHALT = rarray(4)
              len = 7
              call readin(ifl,iarray,len,ierror)
              ITPROJ = iarray(6)
              IRES = iarray(7)
c
c  initialize this saved map for lltoxy calculations
c
              call initia(XC,YC,CLAT,CLON,XRAD,YRAD,ITPROJ,IRES,XRNM,
     +                ORHALT)
              if (sys) then
                   print*,'bstmap -- before lltoxy rlat/rlon ',rlat,rlon
              endif
              call lltoxy(rlat,rlon,x,y)
              if (sys) then
                   print*,'bstmap -- x,y before clipxy ',x,y
              endif
              call clipxy(x,y,onmap)
              if (sys) then
                   print*,'bstmap -- x= ',x,' y= ',y,' VALID= ',onmap
              endif
              if(onmap)then
                if(numb .gt.0)then
                  siton = .true.
                  sitmax = numb * .25
                  notsit = 0
                  do 50 j=1,numb
                        len = 16
                        call lltord(blatlon(j),len,blat,blon,ierror)
```

```
                    call lltoxy(blat,blon,bx,by)
                    call clipxy(bx,by,siton)
                    if(.not. siton)then
                           notsit = notsit + 1
                           if(notsit .gt. sitmax)goto 60
                    else
c                           print*,'bstmap -- site on map'
                    endif
 50               continue
                endif
                if(novali) then
                     smalrad = xrnm
                     choice = filenm(lendef+5:lendef+5)
                else
                  .  if(xrnm .lt. smalrad)then
                         smalrad=xrnm
                         choice = filenm(lendef+5:lendef-5)
                     endif
                endif
                if (sys) then
                    print*,'bstmap -- in onmap loop choice ',choice
                endif
                novali = .false.
              endif
 60           continue
              call closit(ifl)
          endif
 100  continue
c
c  if no map had this fixlat/fixlon on its display area, default to world map
c
      if(novali) then
          print*,'bstmap -- in not valid'
          mflen = 7
          mapcho(1:mflen) = 'default'
      else
c          print*,'bstmap -- in valid'
          mflen = 5
          mapcho(1:mflen) = filenm(lendef+1:lendef+4) // choice
      endif
c      print*,'bstmap is ',mapcho
c      print*,'bstmap -- exit'
      return
      end


C+*+*+*+*+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:                    buttn
c
c  Functional Description:       Subroutine to get button input
c
c  Input Files/Parameters:
c      General Gobals
c        qdsdev        device       integer   DI-3000 variable
c        qpydev        device       integer   DI-3000 variable
c        qecho         device       integer   DI-3000 variable
c
c  Output Files/Parameters:      N/A
c
c  Subroutines/Functions Called:
c      Note: Subroutines preceded by a "j" are explained in the DI-3000 manual.
c
c  Called By:                    DISP5, HELP, PAWS, TKINFO
c
c  Local Variables:
c
c  Restrictions:
c
c  Abnormal Return Conditions:   N/A
c
c  Location:       /a21/dave
c
c  Programmer         Date of Last Change        Reason for Change
c     bam              October 27, 1983
```

```
c
c  Work still to be done:
c
C-*-*-*-*-*-*-*-*-*-*-*-*-*-*-*-*-*-*-*-*-*-*-*-*-*-*-*-*-*-*-*-*-*-*-*-*-*-*-*|*-*-*-*-

        subroutine buttn(button)

c       calls jbuttn function

        integer qdsdev,qpydev,qecho,qlecho
        common /device/ qdsdev,qpydev,qecho,qlecho
        integer button
        logical sys,rdkey,savkey
        common /sysdbc/ sys
        common /rkdbc/ rdkey
        common /svkdbc/ savkey
        logical eofkey
        integer keylun,newlun
        common /keylun/ keylun,newlun,eofkey
        character*6 commnd
        logical timout
        integer*2 time
        common /timout/ timout,time

        if (sys) print*,'buttn -- enter'

c       call enall
  100   continue
        if ((rdkey).and.(.not.eofkey)) then
            call kpause (eofkey)
            read (keylun,*,end=192,err=191) commnd,button
            if (commnd(1:6).ne.'jbuttn') then
                print*,'buttn -- incompatible commnd in ',
     +          'read_keys file  ',commnd,button
c               *** exit on error
                go to 199
            endif
        else

  125      continue

c       check for new data coming in or a click (1 min) occuring
c       since last poll.
c
           call datpol
c
c          check for keyboard interrupt
c
           call jbuttn(qdsdev,qpydev,qecho,button)
           if (timout) then
              go to 125
           end if
        endif

        go to 199
  191   continue
            print*,'buttn -- error on read of save key file',
     +      '  ',keylun,button
            go to 199
  192   continue
            print*,'buttn -- premature end of read key file.'
            eofkey = .true.
            go to 100
c           **** go back and get the function interactively on end of file
  199   continue
        if (savkey) then
            write (newlun,*,err=135) '''jbuttn''',button
        endif
        go to 140
  135   continue
            print*,'buttn -- error on write to save key file';
     +      '  ',newlun,button
  140   continue
c       call soverl
```

```
        if (sys) print*,'buttn -- exit',button

        return
        end

C+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                        CALARC
C
C FUNCTIONAL DESCRIPTION:           .
C
C CALLED BY:                        APARCS
C
C PROGRAMMER:                       DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*|*-*-*-*-

        subroutine calarc(xsave,ysave,a0,a1,a2,centrx,centry,rad)

c       This routine calculates the parameters needed for
c         drawing an arc based on three points along the arc.
c     VARIABLES:
c       xsave/ysave- points on the arcs
c       a0,a1,a2- angles used in drawing arcs
c       centrx,centry- center points of arc
c       rad- radius of arc
c   PROGRAMMER:  Nancy Detrich, A215, March, 1984
C------  MODIFIED BY A692 FOR COMPLETION


        real xsave(*),ysave(*)
        real a1,a0,a2,centrx,centry,slope1,slope2
        real xend1,yend1,xmid,ymid,xend2,yend2
        real mid2x,mid2y,num2,rad
        real mid1x,mid1y,num1



c       setting passed parameters to the names used in previously
c        written code
        xend1 = xsave(1)
        yend1 = ysave(1)
        xmid  = xsave(2)
        ymid  = ysave(2)
        xend2 = xsave(3)
        yend2 = ysave(3)

c       COMPUTATIONS
c       slope of line perpendicular to line between first end point and
c       intermediate point

        i = 0
        n = 0
        m = 0

        if(ymid .ne. yend1) then
          slope1 = (xend1-xmid)/(ymid-yend1)
          mid1x = (xend1+xmid)/2.
          mid1y = (yend1+ymid)/2.
          num1 = mid1y-(mid1x*slope1)
          m = 1
        else
          centrx = (xend1+xmid)/2.
        endif

c       slope of line perpendicular to line between second end point and
c       intermediate point

        if (ymid .ne. yend2) then
          slope2 = (xend2-xmid)/(ymid-yend2)
          mid2x = (xend2+xmid)/2.
          mid2y = (yend2+ymid)/2.
          num2 = mid2y-(mid2x*slope2)
          n = 1
```

```
        else
          centrx = (xend2+xmid)/2.
        endif

c       have constructed two perpendicular bisectors which intersect at
c       the center of the circle on whose circumference lie the three
c       selected points

c       find center of circle
        if (n .eq. m) then
          if (slope1 .ne. slope2) then
            centrx = (num2-num1)/(slope1-slope2)
            centry = slope2*centrx+num2
          else
            i = 1
          endif
        else
          if (n .eq. 1) then
            centry = slope2 * centrx + num2
          else
            centry = slope1 * centrx + num1
          endif
        endif

        if (i .eq. 1) goto 60

c       compute radius
        rad = sqrt((xend1-centrx)**2+(yend1-centry)**2)

c       compute the angles
        a0 = (180./3.1415927)*atan2(yend1-centry,xend1-centrx)
        a1 = (180./3.1415927)*atan2(yend2-centry,xend2-centrx)
        a2 = (180./3.1415927)*atan2(ymid-centry,xmid-centrx)

 60     continue
        return
        end

C+*+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:                   calavp
c
c  Functional Description:
c       calculate amplification area viewport parameters
c
c  Input Files/Parameters:
c
c  Output Files/Parameters: N/A
c
c  Subroutines/Functions Called:
c
c  Called By:                   FMAIN
c
c  Local Variables: N/A
c
c  Restrictions: N/A
c
c  Abnormal Return Conditions:  N/A
c
c  Location:
c
c  Programmer         Date of Last Change        Reason for Change
C  L. McCleary        Jan.1988               separate amp & sys - calavp
c
C-*-*-*-*-*-*-*-*-*-*-*-*-*-*-*-*-*-*-*-*-*-*-*-*-*-*-*-*-*-*-*-*-*-*-*-*-*|*-*-*-*-
c
        subroutine calavp
c
c       calculate amplification area viewport parameters
c
        common /comscr/ xllscr,yllscr,xurscr,yurscr
        common /comamp/xllamp,yllamp,xuramp,yuramp,ibcamp,iocamp,incamp
        common /comavp/ xllavp,yllavp,xuravp,yuravp
        common /aspect/ xaspec,yaspec,xvlow,xvhigh,yvlow,yvhigh
```

```
c
        xllavp = xvlow+(xvhigh-xvlow)*(xllamp-xllscr)/(xurscr-xllscr)
        xuravp = xvlow+(xvhigh-xvlow)*(xuramp-xllscr)/(xurscr-xllscr)
        yllavp = yvlow+(yvhigh-yvlow)*(yllamp-yllscr)/(yurscr-yllscr)
        yuravp = yvlow+(yvhigh-yvlow)*(yuramp-yllscr)/(yurscr-yllscr)
c        print*,'Amplification viewport',xllavp,xuravp,yllavp,yuravp
c         print*,'XLLAMP,XURAMP,..',xllAMP,xurAMP,yllAMP,yurAMP
c         print*,'XLLAVP,XURAVP,..',xllavp,xuravp,yllavp,yuravp
c
        return
        end
C+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:                    calbvp
c
c  Functional Description:
c       calculate construction box area viewport parameters
c
c  Input Files/Parameters:
c
c  Output Files/Parameters: N/A
c
c  Subroutines/Functions Called:
c
c  Called By:                    FMAIN
c
c  Local Variables: N/A
c
c  Restrictions: N/A
c
c  Abnormal Return Conditions:  N/A
c
c  Location:      Apollo      /a21/dave
c
c  Programmer        Date of Last Change       Reason for Change
c
C-*-*-*-*-*-*-*-*-*-*-*-*-*-*-*-*-*-*-*-*-*-*-*-*-*-*-*-*-*-*-*-*-*-*-*|*-*-*-*-
c
       subroutine calbvp
c
c      calculate construction box area viewport parameters
c
       common /comscr/ xllscr,yllscr,xurscr,yurscr
       common /combox/xllbox,yllbox,xurbox,yurbox,ibcbox,iocbox,incbox
       common /combvp/ xllbvp,yllbvp,xurbvp,yurbvp
       common /aspect/ xaspec,yaspec,xvlow,xvhigh,yvlow,yvhigh
c
c      print*,' comgra,comscr : ',xllscr,yllscr,xurscr,yurscr
       xllbvp = xvlow+(xvhigh-xvlow)*(xllbox-xllscr)/(xurscr-xllscr)
       xurbvp = xvlow+(xvhigh-xvlow)*(xurbox-xllscr)/(xurscr-xllscr)
       yllbvp = yvlow+(yvhigh-yvlow)*(yllbox-yllscr)/(yurscr-yllscr)
       yurbvp = yvlow+(yvhigh-yvlow)*(yurbox-yllscr)/(yurscr-yllscr)
c      print*,'Box viewport',xllbvp,xurbvp,yllbvp,yurbvp
c      print*,'   ',xllbox,xurbox,yllbox,yurbox
c
       return
       end


C+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                     CALCPR
C
C FUNCTIONAL DESCRIPTION:        .
C
C CALLED BY:                     STATEC
C
C PROGRAMMER:                    DATE OF LAST CHANGE     REASON FOR CHANGE
C  S. LAMB                       FEB 88                  COMMAND FIX - CALCPR
C
C-*-*-*-*-*-*-*-*-*-*-*-*-*-*-*-*-*-*-*-*-*-*-*-*-*-*-*-*-*-*-*-*-*-*-*|*-*-*-*-

      subroutine calcpr
c
c     this subroutine is the calculate area parameters state interpreter (11)
c
```

```
        common /states/ nextst
        logical isarea
        logical wordis,iseoc
        real sparms(4)
        real mparms(4)
        common /mparms/ mparms
c
        do 90 i=1,4
            sparms(i) = mparms(i)
   90   continue
        initls = nextst
c       do until nextst not = initial state
  100   continue
            call getwrd
            if (wordis('AND')) then
c * ** *** **** ***** ****** ******* not understood
                nextst = 15
            else if (iseoc()) then
                nextst = 3
            else if (isarea()) then
                if (mparms(1).lt.sparms(1)) sparms(1) = mparms(1)
                if (mparms(2).gt.sparms(2)) sparms(2) = mparms(2)
                if (mparms(3).lt.sparms(3)) sparms(3) = mparms(3)
                if (mparms(4).gt.sparms(4)) sparms(4) = mparms(4)
            else
                call putwrd
                nextst = 3
            endif
        if (nextst.eq.initls) go to 100
c       *** this assumes the next state is 3 or you want to change map params.
        call calmap (sparms)
c
        return
        end


C+*+*+*+*+*+*+*+*+*+*+*+*+*+*+*+*+*+*+*+*+*+*+*+*+*+*+*+*+*+*+*+*+*+*+*+*+*|*+*+*+*-
c  UNIT NAME:                         calcvp
c
c  Functional Description:
c       calculate system message area viewport parameters
c
c  Input Files/Parameters:
c
c  Output Files/Parameters: N/A
c
c  Subroutines/Functions Called:
c
c  Called By:                         FMAIN
c
c  Local Variables: N/A
c
c  Restrictions: N/A
c
c  Abnormal Return Conditions:  N/A
c
c  Location:      Apollo      /a21/dave
c
c  Programmer        Date of Last Change       Reason for Change
c
C-*-*-*-*-*-*-*-*-*-*-*-*-*-*-*-*-*-*-*-*-*-*-*-*-*-*-*-*-*-*-*-*-*-*-*-*-*|*-*-*-*-
c
        subroutine calcvp
c
c       calculate system message area viewport parameters
c
        common /comscr/ xllscr,yllscr,xurscr,yurscr
        common /comsys/xllsys,yllsys,xursys,yursys,ibcsys,iocsys,incsys
        common /comcvp/ xllcvp,yllcvp,xurcvp,yurcvp
        common /aspect/ xaspec,yaspec,xvlow,xvhigh,yvlow,yvhigh
c
        xllcvp = xvlow+(xvhigh-xvlow)*(xllsys-xllscr)/(xurscr-xllscr)
        xurcvp = xvlow+(xvhigh-xvlow)*(xursys-xllscr)/(xurscr-xllscr)
        yllcvp = yvlow+(yvhigh-yvlow)*(yllsys-yllscr)/(yurscr-yllscr)
```

```
      yurcvp = yvlow+(yvhigh-yvlow)*(yursys-yllscr)/(yurscr-yllscr)
c      print*,'System viewport',xllcvp,xurcvp,yllcvp,yurcvp
c
      return
      end

C+*+*+*+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:                    calgvp
c
c  Functional Description:
c       calculate graphics viewport parameters
c
c  Input Files/Parameters:
c
c  Output Files/Parameters: N/A
c
c  Subroutines/Functions Called:
c
c  Called By:                    FMAIN, RBOUND
c
c  Local Variables: N/A
c
c  Restrictions: N/A
c
c  Abnormal Return Conditions:  N/A
c
c  Location:      Apollo      /a21/dave
c
c  Programmer        Date of Last Change       Reason for Change
c
C-*-*-*-*-*-*-*-*-*-*-*-*-*-*-*-*-*-*-*-*-*-*-*-*-*-*-*-*-*-*-*-*-*-*-*-*-*-*|*-*-*-*-
c
      subroutine calgvp
c
c     calculate graphics viewport parameters
c
      common /comscr/ xllscr,yllscr,xurscr,yurscr
      common /comgra/xllgra,yllgra,xurgra,yurgra,ibcgra,iocgra
      common /comgvp/ xllgvp,yllgvp,xurgvp,yurgvp
      common /gphwdo/xllgeo,yllgeo,xurgeo,yurgeo
      common /aspect/ xaspec,yaspec,xvlow,xvhigh,yvlow,yvhigh
      logical lton(16),dotem
      integer ipgrid(4),ltyptb(16)
      common /map/ XRNM,XC,YC,LEVEL,CLAT,CLON,XRAD,YRAD,ITPROJ,
     +    IRES,LTYPTB,LUNDAT,LUNIND,LUNLIN,LTON,IPGRID,DOTEM,
     +    ORHALT
c
c     print*,' comgra,comscr : ',xllscr,yllscr,xurscr,yurscr,
c    + xllgra,yllgra,xurgra,yurgra
c     print*,'Graphics viewport',xllgvp,xurgvp,yllgvp,yurgvp
      xllgvp = xvlow+(xvhigh-xvlow)*(xllgra-xllscr)/(xurscr-xllscr)
      xurgvp = xvlow+(xvhigh-xvlow)*(xurgra-xllscr)/(xurscr-xllscr)
      yllgvp = yvlow+(yvhigh-yvlow)*(yllgra-yllscr)/(yurscr-yllscr)
      yurgvp = yvlow+(yvhigh-yvlow)*(yurgra-yllscr)/(yurscr-yllscr)
c     print*,'Graphics viewport',xllgvp,xurgvp,yllgvp,yurgvp
      yrad = xrad * (yurgvp - yllgvp) / (xurgvp - xllgvp)
      yc = yrad
      xllgeo = -xrad
      xurgeo = xrad
      yllgeo = -yrad
      yurgeo = yrad
c     print*,'Calgvp -- New yrad = ',yrad,xllgvp,xurgvp,yllgvp,yurgvp
c
      return
      end

C+*+*+*+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:                    calkvp
c
c  Functional Description:
c       calculate key area viewport parameters
c
```

```
c  Input Files/Parameters:
c
c  Output Files/Parameters: N/A
c
c  Subroutines/Functions Called:
c
c  Called By:                    FMAIN
c
c  Local Variables: N/A
c
c  Restrictions: N/A
c
c  Abnormal Return Conditions:  N/A
c
c  Location:       Apollo       /a21/dave
c
c  Programmer        Date of Last Change       Reason for Change
c
C-*-*-*-*-*-*-*-*-*-*-*-*-*-*-*-*-*-*-*-*-*-*-*-*-*-*-*-*-*-*-*-*-*-*-*-*-*-*-*|*-*-*-*-
c
       subroutine calkvp
c
c      calculate key area viewport parameters
c
       common /comscr/ xllscr,yllscr,xurscr,yurscr
       common /comkey/xllkey,yllkey,xurkey,yurkey,ibckey,iockey,inckey
       common /comkvp/ xllkvp,yllkvp,xurkvp,yurkvp
       common /aspect/ xaspec,yaspec,xvlow,xvhigh,yvlow,yvhigh
c
       xllkvp = xvlow+(xvhigh-xvlow)*(xllkey-xllscr)/(xurscr-xllscr)
       xurkvp = xvlow+(xvhigh-xvlow)*(xurkey-xllscr)/(xurscr-xllscr)
       yllkvp = yvlow+(yvhigh-yvlow)*(yllkey-yllscr)/(yurscr-yllscr)
       yurkvp = yvlow+(yvhigh-yvlow)*(yurkey-yllscr)/(yurscr-yllscr)
c      print*,'key viewport',xllkvp,xurkvp,yllkvp,yurkvp
c
       return
       end


C+*+*+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME: CALMAP
C
C FUNCTIONAL DESCRIPTION:  CALCULATES MAP PARAMETERS
C
C INPUT FILES/PARAMETERS:
C
C        MPARMS             REAL(4)     MIN LAT,MAX LAT,MIN LON, MAX LON.
C
C GLOBAL VARIABLES :
C
C        QITPRO             INTEGER     CURRENT PROJECTION.
C        QCLAT              REAL        LATITUDE AT CENTER OF MAP.
C        QCLON              REAL        LONGITUDE AT CENTER OF MAP.
C
C OUTPUT FILES/PARAMETERS:  NONE.
C
C SUBROUTINES/FUNCTIONS CALLED : NONE.
C
C CALLED BY:                 CALCPR, FSHOWA, FDFPRO
C
C LOCAL VARIABLES:
C
C        RMINLA             REAL        MINIMUM LATITUDE.
C        RMAXLA             REAL        MAXIMUM LATITUDE.
C        RMINLO             REAL        MINIMUM LONGITUDE.
C        RMAXLO             REAL        MAXIMUM LONGITUDE.
C        CM2RAD             REAL        CONVERTS MINUTES TO RADIANS.
C        RADLAT             REAL        LATITUDE DIFFERENCE.
C        RADLON             REAL        LONGITUDE DIFFERENCE.
C        R1                 REAL        COSINE MINLAT.
C        R2                 REAL        COSINE MINLON.
C        RRAD               REAL        RADIUS OF MAP.
C
C RESTRICTIONS: NONE.
```

```
C
C ABNORMAL RETURN CONDITIONS:   NONE.
C
C LOCATION:                     /a21/gjf/MAPADD.FTN
C
C PROGRAMMER:                   DATE OF LAST CHANGE     REASON FOR CHANGE
C
C     DAVE NATION                                       ORIGINAL CODE.
C     JERRY FENERTY                                     DOCUMENT AND MODIFY
C                                                       FOR A21 PROTOTYPE.
C
C-*-*-*-*-*-*-*-*-*-*-*-*-*-*-*-*-*-*-*-*-*-*-*-*-*-*-*-*-*-*-*-*-*-*-*-*-*|*-*-*-*-

      SUBROUTINE CALMAP (MPARMS)

C     CALCULATES A MAP CENTER POINT AND SCALE FROM GEOGRAPHIC LIMITS

      REAL MPARMS(4)

      COMMON /PIE/ PIE,TPIE,PIO2,PIO4
      LOGICAL QLTON(16),QDOTEM
      INTEGER QPGRID(4),QTYPTB(16)
      INTEGER QLEVEL,QITPRO,QIRES,QLUNDA,QLUNIN,QLUNLI
      COMMON /MAP/ QXRNM,QXC,QYC,QLEVEL,QCLAT,QCLON,QXRAD,QYRAD,
     +    QITPRO,
     +    QIRES,QTYPTB,QLUNDA,QLUNIN,QLUNLI,QLTON,QPGRID,QDOTEM,
     +    QORHAL

      logical olhldf
      common /ohfdbc/ olhldf

C     CONVERT MINUTES TO RADIANS BY MULTIPLYING BY CM2RAD

      DATA CM2RAD/2.908882087E-4/

      RMINLA = MPARMS(1)
      RMAXLA = MPARMS(2)
      RMINLO = MPARMS(3)
      RMAXLO = MPARMS(4)

      RADLON = (RMAXLO-RMINLO)/2.
      RADLAT = (RMAXLA-RMINLA)/2.

      QCLAT = RMINLA + RADLAT
      QCLON = RMINLO + RADLON


C     COMPENSATE FOR SHORTER DISTANCES BETWEEN MERIDIANS AT HIGHER LATS

      RADLON = RADLON * COS (QCLAT)
C         COMPENSATE FOR MERCATOR STRETCHING IN Y DIRECTION
c         PRINT*,'RADLAT,RADLON : ',RADLAT,RADLON

      IF (olhldf) THEN
          R1 = COS(RMAXLA)
          R2 = COS(RMINLA)
          IF(R2.LT.R1) R1 = R2
          IF (R1.LT..3) R1 = .3
          R2 = RADLAT / R1
          RADLAT = RADLAT + (R2 - RADLAT)/2
          PRINT*,'RADLAT,R2,R1 = ',RADLAT,R2,R1
      endif

c         corrects for windows wrapped around the date line
          if (rminlo.gt.rmaxlo) then
            if (qclon.ge.0.) then
              qclon = qclon - pie
            else
              qclon = qclon + pie
            endif
          endif


      RRAD = RADLON
```

```
      IF (RADLAT.GT.RADLON) RRAD = RADLAT

      XRNMNW = (RRAD*1.25)/CM2RAD

      CALL CHSCAL (XRNMNW)

      RETURN
      END

C+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:                     calmvp
c
c  Functional Description:
c       calculate menu area viewport parameters
c
c  Input Files/Parameters:
c
c  Output Files/Parameters: N/A
c
c  Subroutines/Functions Called:
c
c  Called By:                     FMAIN
c
c  Local Variables: N/A
c
c  Restrictions: N/A
c
c  Abnormal Return Conditions:  N/A
c
c  Location:      Apollo      /a21/dave
c
c  Programmer      .  Date of Last Change       Reason for Change
c
C-*-*-*-*-*-*-*-*-*-*-*-*-*-*-*-*-*-*-*-*-*-*-*-*-*-*-*-*-*-*-*-*-*-*-*-*|*-*-*-*-
c
      subroutine calmvp
c
c     calculate menu area viewport parameters
c
      common /comscr/ xllscr,yllscr,xurscr,yurscr
      common /commen/xllmen,yllmen,xurmen,yurmen,ibcmen,iocmen,incmen
      common /commvp/ xllmvp,yllmvp,xurmvp,yurmvp
      common /aspect/ xaspec,yaspec,xvlow,xvhigh,yvlow,yvhigh
c
      xllmvp = xvlow+(xvhigh-xvlow)*(xllmen-xllscr)/(xurscr-xllscr)
      xurmvp = xvlow+(xvhigh-xvlow)*(xurmen-xllscr)/(xurscr-xllscr)
      yllmvp = yvlow+(yvhigh-yvlow)*(yllmen-yllscr)/(yurscr-yllscr)
      yurmvp = yvlow+(yvhigh-yvlow)*(yurmen-yllscr)/(yurscr-yllscr)
c     print*,'Menu viewport',xllmvp,xurmvp,yllmvp,yurmvp
c
      return
      end

C+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                      CERROR
C
C FUNCTIONAL DESCRIPTION:         .
C
C CALLED BY:                      AREANF, DISCEN, DISPRO, DISSCA, NOTUND
C
C PROGRAMMER:                     DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*|*-*-*-*-

      subroutine cerror (len,msg)
c
c     this subroutine puts an error message to the system area for commands
c
      call drwamp (msg,1)
c
      return
      end
```

```
C++++++++++++++++++++++++++++++++++++++++++++++++++++++++++++++++++++++|*+++++++
C UNIT NAME: CHAWDB
C
C FUNCTIONAL DESCRIPTION:  CHANGES WORLD DATA BANK.
C
C INPUT FILES/PARAMETERS:
C
C        LENWDB                INTEGER     LENGTH OF WDB STRING.
C        WDB                   CHAR*(*)    NEW WDBII.
C
C GLOBAL VARIABLES :
C
C        QLUNDA                INTEGER     LOGICAL UNIT NUMBER FOR WDBII DATA
C                                          FILE.
C        QLUNIN                INTEGER     LOGICAL UNIT NUMBER FOR WDBII
C                                          INDEX FILE.
C        QLUNLI                INTEGER     LOGICAL UNIT NUMBER FOR WDBII LINE
C                                          INDEX FILE.
C        LENMAP                INTEGER     LENGTH OF MAP PATHNAME.
C        MAPATH                CHAR*50     WDBII FILE PATHNAMES.
C        IERWDB                INTEGER     WDBIIx OPEN ERROR FLAG
C
C OUTPUT FILES/PARAMETERS:  NONE.
C
C SUBROUTINES/FUNCTIONS CALLED :
C
C        OPENIN                OPENS WDBII FILES.
C        CLOSEI                CLOSES WDBII FILES.
C
C CALLED BY:                    CHSCAL, DECDET, INCDET, RPARAM, RSLCON
C
C LOCAL VARIABLES:
C
C        FIRSTM                LOGICAL     INDICATES FIRST TIME FILES ARE OPENED.
C        WDBFUL                CHAR*50     WDBII FILE FULL PATHNAME.
C        IERROR                INTEGER     ERROR CONDITION.
C
C RESTRICTIONS: NONE.
C
C ABNORMAL RETURN CONDITIONS:   NONE.
C
C LOCATION:                     /a21/gjf/MAPSRC.FTN
C
C PROGRAMMER:                   DATE OF LAST CHANGE     REASON FOR CHANGE
C
C     DAVE NATION                                       ORIGINAL CODE.
C     JERRY FENERTY                                     DOCUMENT AND MODIFY
C                                                       FOR A21 PROTOTYPE.
C
C-*-*-*-*-*-*-*-*-*-*-*-*-*-*-*-*-*-*-*-*-*-*-*-*-*-*-*-*-*-*-*-*-*-*-*-*-*|*-*-*-*-

        SUBROUTINE CHAWDB (LENWDB,WDB)

C       THIS SUBROUTINE CHANGES THE VERSION OF THE WDBII FILE

        character*50 mapath
        common /mapath/ mapath
        common /lenmap/ lenmap
        LOGICAL FIRSTM
        CHARACTER*(*) WDB
        CHARACTER*100 WDBFUL
        COMMON /CERWDB/ IERWDB
        LOGICAL map
        common /mapdbc/ map
        LOGICAL QLTON(16),QDOTEM
        INTEGER QPGRID(4),QTYPTB(16)
        INTEGER QLEVEL,QITPRO,QIRES,QLUNDA,QLUNIN,QLUNLI


        COMMON /MAP/ QXRNM,QXC,QYC,QLEVEL,QCLAT,QCLON,QXRAD,QYRAD,
     +      QITPRO,
     +      QIRES,QTYPTB,QLUNDA,QLUNIN,QLUNLI,QLTON,QPGRID,QDOTEM,
     +      QORHAL
```

```
      DATA FIRSTM/.TRUE./

      IF (FIRSTM) THEN
          FIRSTM = .FALSE.
      ELSE
          CALL CLOSEI (QLUNDA,QLUNIN,QLUNLI)
      ENDIF

      IF (LENMAP.GT.0) THEN
          WDBFUL = MAPATH(1:LENMAP) // WDB(1:LENWDB)
          LENFUL = LENWDB + LENMAP
      else
          wdbful = wdb(1:lenwdb)
          lenful = lenwdb
      ENDIF
      IF (map) then
          print*,'mapath = ',mapath(1:lenmap),lenmap
          print*,'CHAWDB OPENING ',wdbful(1:lenful),lenful
      endif
      CALL OPENIN (QLUNDA,QLUNIN,QLUNLI,LENFUL,WDBFUL,IERROR)

      IERWDB = IERROR

      RETURN
      END

C+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                       CHDATE
C
C FUNCTIONAL DESCRIPTION:          .
C
C CALLED BY:                       DIFTIM, FADCHG, FADTIM
C
C PROGRAMMER:                      DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*|*-*-*-*-

      subroutine chdate(year,day,hour,min,dtg)

c
c  this subroutine takes a julian dtg in integer and converts
c  it to a character*9 string in format yydddhhmm
c
      integer year
      integer day
      integer hour
      integer min
      character*9 dtg

      dtg(1:1) = char (mod ((year/10), 10) + 48)
      dtg(2:2) = char ((year - (year/10) * 10) + 48)
      dtg(3:3) = char ((day / 100) + 48)
      dtg(4:4) = char (mod ((day/10), 10) + 48)
      dtg(5:5) = char ((day - (day/10) * 10) + 48)
      dtg(6:6) = char (mod ((hour/10), 10) + 48)
      dtg(7:7) = char ((hour - (hour/10) * 10) + 48)
      dtg(8:8) = char (mod ((min/10), 10) + 48)
      dtg(9:9) = char ((min - (min/10)*10)+48)
c     print*,'in chdate: ',dtg
      return
      end

C+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                       check
C
C FUNCTIONAL DESCRIPTION:          check which function button has been hit
C
C INPUT FILES/PARAMETERS:
C     Menu control globals
C       qcancl        bl        logical  cancel flag
C       qext2m        bl        logical  exit to main menu flag
C       qretrn        bl        logical  return to previous action/menu
```

```
C
C     General globals
C       qfb           butons    integer  array of values for function buttons
C       qmb           butons    integer  array of values for the mouse buttons
C
C
C
C OUTPUT FILES/PARAMETERS:
C
C     error                     logical  true if an error is detected by
C                                        check
C     rflag                     logical  true if exiting the calling menu
C
C SUBROUTINES/FUNCTIONS CALLED
C
C     helper                    display the appropriate help file
C     llshow                    display the lat/long of a point on the screen
C     printr                    prints current screen image
C     prompt                    displays a message on the screen and
C                               gets input from the user
C     redraw                    clear the screen and redraw it from segment
C                               storage
C     scrdia                    display the diameter of the current map
C     tmpstr                    temporary store the graphic
C
C
C CALLED BY:                      BOXARE, COLBAK, DETCON, LLSHOW, MMCON,
C                                 OFFST,  PROCON, PRTMEN, RECDIS,
C                                 RESCON, RSLCON, SAVDIS, TRKCON, TXWRIT,
C                                 CLASS,  FTRCON, GEOCON, OVRCON
C
C LOCAL VARIABLES:
C
C     button                    integer  button passed to check
C     cmenu                     integer  menu id of routine calling check
C
C RESTRICTIONS:
C
C
C ABNORMAL RETURN CONDITIONS:     n/a
C
C LOCATION:                       /u2/say/TEXT/source/check.f
C
C PROGRAMMER:                     DATE OF LAST CHANGE     REASON FOR CHANGE
C
C     SAYates                     10/27/83         initial entry
C     RPSmith                     11/20/87         add dist/az arc to mrkseg
C     L. McCleary                 Jan 1988         sep amp & sys - check
C
C-*-*-*-*-*-*-*-*-*-*-*-*-*-*-*-*-*-*-*-*-*-*-*-*-*-*-*-*-*-*-*-*-*-*-*-*-*|*-*-*-*-

      subroutine check(button,cmenu,error,rflag)
c
c*****routine to determine which function button was used
c
c*****definition and declaration of common blocks
c
      common/b1/qcancl,qext2m,qretrn,qstmnu,qnextm
      integer      qnextm
      logical      qcancl,qext2m,qretrn,qstmnu
c
      common/butons/qfb,qmb
      integer      qfb(26),qmb(4)

        common /msgold/ msgold,msgonm

        common/ampprm/ampseg,ampsgb
        integer ampseg,ampsgb
c -----  updated 7/31/87 CSL
        common /amfrst/ amfrst
        logical amfrst

        integer dstsg1,dstsg2,dstsg3
        logical dstfst
```

```
        common/mrkseg/dstsg1,dstsg2,dstsg3,dstfst

        common/llseg/llsgmt,llfrst
        integer llsgmt
        logical llfrst

      common/picks/qsegid,qpick,qmodfl
      integer     qsegid,qpick
      logical     qmodfl
      logical sys
      common /sysdbc/ sys
c
c*****declaration of local variables

      integer     cmenu,button
      logical     rflag,error
      logical     found

      if (sys) print*,'check -- enter ',button,cmenu

      qretrn = .false.
      rflag = .false.
      error = .false.

         call subchk (button,cmenu,error,rflag)
         if (error) then
             error = .false.
c*****       help
c             if(button .eq. qfb(23) .or. button .eq. qmb(3)) then
             if(button .eq. qfb(23) .or. button .eq. qmb(2)) then
                call helper (cmenu)
c*****       print
             else if(button .eq. qfb(24)) then
                 call prtmen
c*****       display latitude and longitude
             else if(button .eq. qfb(17)) then
                 call llshow
c*****       display diameter of map
             else if(button .eq. qfb(18)) then
                 call scrdia
c*****       Command Mode
             else if(button .eq. 85) then
                 call commnd
c*****       Draw Current Map
             else if(button .eq. 86) then
                 call drwmap
c*****       Delete the amplification segment
             else if(button.eq.ampseg.and.button.ne.0) then
                 call jpurge(ampseg)
                 call jvisbl(ampsgb,0)
                 call jvisbl(ampsgb,1)
                 amfrst = .true.
                 if(.not. llfrst) then
                    call jpurge(llsgmt)
c ----- updated 7/31/87 CSL
                    llfrst = .true.
                 endif
                 if(.not. dstfst)then
                    call jpurge(dstsg1)
                    call jpurge(dstsg2)
                    call jpurge(dstsg3)
c ----- updated 7/31/87 CSL
                    dstfst = .true.
                 end if
             else
c*****          tracking data plot interrogation
                call findtk(button,found)
                if (.not. found) then
                    error = .true.
                endif
             endif
             call mesg(1)
             if (qcancl.or.qext2m) rflag = .true.
             if (sys) print*,'check -- exit ', error, rflag
```

```
          endif

      return
      end

C+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME: checka
C
C FUNCTIONAL DESCRIPTION:  CHECKS A RECTANGULAR GEOGRAPHIC AREA FOR
C      INTERSECTION WITH VIEWPORT DISPLAY AREA
C
C INPUT FILES/PARAMETERS:
C
C GLOBAL VARIABLES : NONE.
C
C OUTPUT FILES/PARAMETERS:  NONE.
C
C SUBROUTINES/FUNCTIONS CALLED :
C
C CALLED BY:                    NO LONGER USED BY CARICATURE
C
C LOCAL VARIABLES: NONE.
C
C RESTRICTIONS: NONE.
C
C ABNORMAL RETURN CONDITIONS:   NONE.
C
C LOCATION:
C
C PROGRAMMER:                   DATE OF LAST CHANGE     REASON FOR CHANGE
C
C     DAVE NATION                                       ORIGINAL CODE.
C     JERRY FENERTY                                     DOCUMENT AND MODIFY
C                                                       FOR A21 PROTOTYPE.
C
C-*-*-*-*-*-*-*-*-*-*-*-*-*-*-*-*-*-*-*-*-*-*-*-*-*-*-*-*-*-*-*-*-*-*-*-*-*|*-*-*-*-

        SUBROUTINE CHECKA (CHINV,ALLINV,SOMEON,ALIMIT)

C CHECKS A RECTANGULAR GEOGRAPHIC AREA FOR
C      INTERSECTION WITH VIEWPORT DISPLAY AREA

        LOGICAL CHINV,ALLINV,SOMEON,ISON,ISINV
        DIMENSION ALIMIT(4),RLA(4),RLO(4),X(4)
        COMMON /VIEWP/ XRAD,YRAD,IXNP,IYNP,XC,YC
        RLA(1)=ALIMIT(1)
        RLA(2)=ALIMIT(2)
        RLA(3)=ALIMIT(1)
        RLA(4)=ALIMIT(2)
        RLO(1)=ALIMIT(3)
        RLO(2)=ALIMIT(3)
        RLO(3)=ALIMIT(4)
        RLO(4)=ALIMIT(4)

        IXT=0
        IYT=0
        VCNT=0
        SOMEON=.FALSE.

        DO 620 K=1,4

            ISINV=.FALSE.

            IF (CHINV) THEN
                CALL INVTES (RLA(K),RLO(K),ISINV)
            ENDIF

            IF (.NOT.ISINV) THEN
                VCNT=VCNT+1
                CALL LLTOXY(RLA(K),RLO(K),X(K),Y)
                CALL CLIPXY(X(K),Y,ISON)
c       ******************
c       the following statement is necessary to get this subroutine
c       to work on the apollo for some reason (any dummy statement
```

```
c       would do)
C        i = i                              Apollo fix - checka
c       ******************
                IF(ISON) THEN
                    SOMEON=.TRUE.
                ELSE
                    IXT=IXT+IXNP
                    IYT=IYT+IYNP
                ENDIF
            ENDIF
  620   CONTINUE

C       THIS STATEMENT NECESSARY FOR RECTANGULAR PROJECTIONS AT BREAK POINT
C       IF(X(1).GT.X(3)) SOMEON=.FALSE.
C                               THIS STATEMENT CAN BE TAKEN OUT FOR INSURANCE
C                               THAT INVISIBILITY IS CHECKED ALL THE TIME

        IF(VCNT.EQ.4) CHINV=.FALSE.
        IF(VCNT.EQ.0) THEN
            ALLINV=.TRUE.
        ELSE
            IF (.NOT.SOMEON.and.x(1).le.(x(3)+xrad*2)) THEN
                IF (ABS(IXT).LT.VCNT.AND.ABS(IYT).LT.VCNT)
     +          THEN
                    SOMEON=.TRUE.
                ENDIF
            ENDIF
        ENDIF
  690   CONTINUE

        RETURN
        END

C+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                         CHECKB
C
C FUNCTIONAL DESCRIPTION:
c -    Description: Checks whether any portion of a segment lies within the
c -                 viewport for a LAMBERT Conformal map projection.
C
C CALLED BY:                         NO LONGER USED BY CARICATURE
C
C PROGRAMMER:                        DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*|*-*-*-*-

        SUBROUTINE checkb(someon,alimit)

        LOGICAL   someon,ison
        DIMENSION alimit(4),rla(4),rlo(4)

        rla(1) = alimit(1)
        rla(2) = alimit(2)
        rla(3) = alimit(1)
        rla(4) = alimit(2)
        rlo(1) = alimit(3)
        rlo(2) = alimit(3)
        rlo(3) = alimit(4)
        rlo(4) = alimit(4)

        someon=.FALSE.
        DO 620 k=1,4
           CALL lltoxy(rla(k),rlo(k),x,y)
           CALL clipxy(x,y,ison)
           IF (ison) someon = .TRUE.
  620   CONTINUE

        RETURN
        END

C+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                         CHECKM
```

```
C
C FUNCTIONAL DESCRIPTION:        .
C -             CHECKS RECTANGULAR AREA FOR INTERSECTION
C -             WITH VIEWPORT (MERCATOR & EQUIRECTANGULAR).
C
C CALLED BY:                    NO LONGER USED BY CARICATURE
C
C PROGRAMMER:                   DATE OF LAST CHANGE     REASON FOR CHANGE
c -    L MCCLEARY                                        ORIGINAL CODE
C
C-*-*-*-*-*-*-*-*-*-*-*-*-*-*-*-*-*-*-*-*-*-*-*-*-*-*-*-*-*-*-*-*-*-*-*-*-*-*-*-*|*-*-*-*-

      SUBROUTINE CHECKM(PRLAT,PRLON,RLAT,RLON,ISGOOD,isinv)
      LOGICAL ISGOOD
      LOGICAL INVALI
      LOGICAL ISINV
      REAL PRLAT,PRLON,RLAT,RLON
      COMMON/INVALI/INVALI
      COMMON/PIE/PIE,TPIE,PIO2,PIO4
C
      IF (ABS(PRLON).GT.PIE) PRLON = PRLON - SIGN(TPIE,PRLON)
      CALL INVTES(PRLAT,PRLON,ISINV)
      CALL LLTOXY(PRLAT,PRLON,PX,PY)
      IF (ABS(RLON).GT.PIE)  RLON = RLON - SIGN(TPIE,RLON)
      CALL INVTES(RLAT,RLON,ISINV)
      CALL LLTOXY(RLAT,RLON,X,Y)
C
      ISGOOD=.FALSE.
      IF(.NOT.INVALI.AND..NOT.ISINV) ISGOOD=.TRUE.
      CALL INVTS2(RLAT,RLON,X,Y,PRLON,PX,ISGOOD)
C
      RETURN
      END


C+*+*+*+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    CHGIND
C
C FUNCTIONAL DESCRIPTION:        .
C
C CALLED BY:                    SETFAD
C
C PROGRAMMER:                   DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*-*-*-*|*-*-*-*-

      subroutine chgind(faddtg,longer,indx)
c
c     this subroutine will add or delete tracks from the
c     current display list and the screen based upon the
c     new fade time input by the user in faddtg.
c
      logical done
      logical longer

      character*9 faddtg
      character*9 olddtg

      integer chkind
      integer indx
      integer lctrak

      integer tnewst
      integer toldst
      common /tarbou/ tnewst, toldst
      integer bgnpos
      integer endpos
      common /timpos/ bgnpos,endpos
      character*160  trkrec (1000)
      common /trkrec/ trkrec
      integer trkndx (1000)
      common /trkndx/ trkndx
      integer tfaddx
      integer tfadtm
```

```
      common /tfadez/ tfaddx, tfadtm
      integer numrcs
      common /numrcs/ numrcs
      integer ltypov(16)
      logical ltonov(16),rankt(26,16)
      common /maptoo/ ltypov,ltonov,rankt
      integer tkoset
      common /tkoset/ tkoset
      logical segact (1000)
      common /segact/ segact
      logical spprsd (1000)
      common /spprsd/ spprsd
      logical trackn
      common /trkdbc/ trackn

      data lctrak /3/
c
c     when longer is true then the fade time has been increased and therefore
c     the fade index (pointing to earliest displayed track) will decrease
c     to possibly include more tracks on the display

      if (trackn) then
         print *, 'enter chgind'
         print *, '   longer = ', longer
         print *, '   faddtg = ', faddtg
      end if

      done = .false.


      if (longer) then
c
c         Increasing the fade time...
c         when index is 0, nothing is visible;
c         start at tnewst (newest time on list)  and check up
c         the list for a track to become visible.
c
          if (trackn) then
             print *, '   indx = ', indx
          end if

          if ( indx .ne. 0) then
              chkind = indx
          else
              chkind = tnewst
          endif
c
c         check each time on list until end of list
c
 10       if (done) go to 20
c
c            get the dtg for this track
c
             olddtg(1:9) = trkrec(trkndx(chkind))(bgnpos:endpos)

c            compare it against the new faddtg
c
c            done is true if fade dtg is later than dtg of this record

             if (faddtg .ne. olddtg) then
                 call cmptim(faddtg, olddtg, done)
             endif
             if (.not. done) then
c
c                 if not yet done, then add this record to current display
c                 check to see if this record is suppressed
c
                  if (.not. spprsd(trkndx(chkind))) then
c
c                    if not suppressed, see if this segment
c                    is already active.  If so, make this
c                    segment(track) visible if tracking is on; else
c                    create a new segment.
c
```

```
               if (segact(trkndx(chkind))) then
                  if (ltonov(lctrak)) then
                     call jvisbl (trkndx(chkind)+tkoset, 1)
                  endif
               else
                  call seghnd (trkndx(chkind)+tkoset,
     +                  trkrec(trkndx(chkind)))
                  segact(trkndx(chkind)) = .true.
               end if
            end if
c
c           when we get to end of current active
c           tracks, we are done searching.c
c
            if(chkind .eq. toldst) then
               done = .true.
            endif
c
c           go to next oldest track
c
            chkind = chkind - 1
            if (chkind .eq. 0) then
               if (trkndx(numrcs) .ne. 0) then
                  chkind = numrcs
               else
                  chkind = 1
                  done = .true.
               endif
            endif
         endif
      go to 10
 20   continue
      indx = chkind
c
c     decreasing the fade time...
c     see if there are any tracks to be deleted from list and display
c
      else
         if (indx .ne. 0) then
 30          if(done) go to 40

             olddtg(1:9) = trkrec(trkndx(indx))(bgnpos:endpos)

c            done is true if this tracks dtg is later than
c            current fade dtg.

             call cmptim(olddtg, faddtg, done)
c
c            if not yet done, and this track is an
c            active segment, make the segment invisible
c
             if (.not. done) then
                 if (segact(trkndx(indx))) then
                     if (trackn) then
                        print *, 'indx = ', indx
                        print *, 'segment = ', trkndx(indx)+tkoset
                     end if
                     call jvisbl (trkndx(indx)+tkoset, 0)
                 end if
c
c                if this is top of list, then we are done
c
                 if(indx .eq. tnewst) then
                     done = .true.
                     indx = 0
                 else
c
c                    else, get next position on list
c
                     indx = mod(indx,numrcs) + 1
                 endif
             endif
          go to 30
 40       continue
```

```
            endif
         endif

         if (trackn) then
            print *, 'exit chgind'
            print *, '   indx = ', indx
         end if

         return
         end
C+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    CHGPTS
C
C FUNCTIONAL DESCRIPTION:        .
C
C CALLED BY:                     APARCS, APCIRC, APFILL, APLINE, APMARK,
C                                APRECT, APSMOO
C
C PROGRAMMER:                    DATE OF LAST CHANGE    REASON FOR CHANGE
C
C-*-*-*-*-*-*-*-*-*-*-*-*-*-*-*-*-*-*-*-*-*-*-*-*-*-*-*-*-*-*-*-*-*-*-*|*-*-*-*-

        subroutine chgpts(array,npts,type)

c       this routine changes the array of points passed to
c          it by multiplying the point by a scalefactor
c          which has been set by a previous routine and
c          subtracting an offset value which has also
c          been preset and is set based on the 'type'
c          of array which has been passed-- 0 = x array,
c          1 = yarray, and 2 = neither, so an offset is
c          not applied to the passed array (ie, the radius of
c          a circle).
c          The points are "mirrored" about the 0-axis if the
c          mirror flag is set--0 = x points are to be mirrored,
c          1= y points are to be mirrored, 2 = points are not mirrored
c     VARIABLES:
c         array-points to be converted
c         npts- number of points in the array
c         type- type of array being passed-- 0=xarray, 1=yarray,
c             2= neither x or y
c         offset- the offset which will be set and applied to the
c             array
c         scale- the scale factor which will be set and applied
c             to the array
c         mirflg- integer flag to control the mirroring
c         xscale- the scalefactor to be applied to an x array
c         yscale- the scalefactor to be applied to a y array
c         xoffst- the offset to be applied to an x array
c         yoffst- the offset to be applied to a y array
c   CALLS:      mirrit mrcntr
c   PROGRAMMER:  Nancy Detrich, A215, March, 1984
C------  MODIFIED BY A692 FOR COMPLETION
c   Modified by David W. Swim, T3333, 5 AUG 1986


      real offset,scale,array(*)
      integer npts,type
      common /icon/ qicnum,qicseg,qiconx,qicony,qicszx,
     + qicszy,qicrot,qicmir,qictyp,qconnx,qconny,qiconn
      integer qicnum(6),qicseg,qicmir,qictyp,qiconn
      real qiconx,qicony,qicszx,qicszy,qicrot
      real qconnx,qconny
      common /chgit/ mirflg,xscale,yscale,xoffst,yoffst,rotang
      real xscale,yscale,rotang
      integer xoffst,yoffst,mirflg

c     IF TYPE = 0, PASSED ARRAY IS X ARRAY; IF 1, THEN Y ARRAY;
c      IF 2, THEN NEITHER (OFFSET SET TO ZERO)

      if(type .eq. 0)then
          scale = xscale
          offset = real(xoffst) - 1.2
      else if(type .eq. 1) then
```

```
            scale = yscale
            offset = real(yoffst) - 1.3
        else if (type.eq.2) then
            scale = xscale
            offset = 0.0
        endif

c       MULTIPLY ARRAY POINTS BY SCALE FACTOR & ADD OFFSET

        do 10 i=1,npts
            array(i) = array(i) * (scale) - offset
10      continue

c       ROTATE AN ICON
        if ((mirflg.eq.0).and.(type.eq.0)) then
c           mirror the X ARRAY
            if(qicnum(1).eq.22) goto 250
            if(qicnum(1).eq.143) goto 250
            if(qicnum(1).eq.144) goto 250
            if((qicnum(1).ge.152).and.(qicnum(1).le.195)) goto 250
            if((qicnum(1).ge.260).and.(qicnum(1).le.270)) goto 250
            call mirrit(array,npts,scale)
            goto 270
250         continue

c     Mrcntr is called when the icon is not a military symbol.
c     Military symbols are positioned by lower left while
c     other icons are positioned by center point.

            call mrcntr(array,npts,scale)

270         continue
        else if ((mirflg.eq.1).and.(type.eq.1)) then
c           mirror the Y ARRAY
            if(qicnum(1).eq.22) goto 260
            if(qicnum(1).eq.143) goto 260
            if(qicnum(1).eq.144) goto 260
            if((qicnum(1).ge.152).and.(qicnum(1).le.195)) goto 260
            if((qicnum(1).ge.260).and.(qicnum(1).le.270)) goto 260
            call mirrit(array,npts,scale)
            goto 280
260         continue
            call mrcntr(array,npts,scale)
280         continue
        endif
          return
          end
C+*+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                      CHGTXT
C
C FUNCTIONAL DESCRIPTION:          .
C
C CALLED BY:                       APTEXT
C
C PROGRAMMER:                      DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*-*|*-*-*-*-

         subroutine chgtxt(height,x,y)

c          this routine is similar to the chgpts routine used
c            by all the other 'ap' routines, but is used for
c            the special case of text.  The points are converted
c            by the offset and scalefactor, and the height
c            is adjusted proportional to the scalefactor.
c            The common block variables were  set by the
c            routine calling either drawic or drwicn which
c            call this routine for redrawing all text.
c       VARIABLES:
c          height- height of the text to be displayed
c          x/y- coordinate for placement of the text--is processed
c            the same way chgpts handles all other coordinates
c          common block chgit- parameters set for changing points
c              in a file (mirror,scalefactors and offsets)
```

```
c     ***only one scale factor is needed for this routine, and
c            it is passed in the xscale
c   CALLS:     none
c   PROGRAMMER:  Nancy Detrich, A215, March, 1984


        integer height,x,y
        common /chgit/mirflg,xscale,yscale,xoffst,yoffst,rotang
        real xscale,yscale,rotang
        integer xoffst,yoffst,mirflg

c       multiply the height by the scalefactor
        height = height * xscale
C ***   INSERTED BY GJF, CAN'T IMAGE WHY A HEIGHT OF ZERO WOULD EVER
C ***                BE DESIRED -- FOR ECHELON MENU.
        if (height.lt.1) height = 1
c       change the coordinates the same way coordinates are
c          changed in chgpts
        x = (REAL(x)) * xscale - xoffst
        y = (REAL(y)) * xscale - yoffst
c
        if (mirflg.eq.0) then
           x=INT((REAL(-x))+(190./(2.6/xscale))+.05)
        else if (mirflg.eq.1) then
           y=INT((REAL(-y))+(190./(2.6/xscale))+.05)
        endif
c
        return
        end

C+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                      CHKCLK
C
C FUNCTIONAL DESCRIPTION:         .
C
C CALLED BY:                      TIMCHK  ,
C
C PROGRAMMER:                     DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*|*-*-*-*-

      subroutine chkclk(click,curdtg)
c
c determine if a minute or more has gone by on the system clock
c
      logical click
      character*9 curdtg
c
c
      integer*2 oldtim(6)
      integer*2 newtim(6)
      common /ctimes/ oldtim, newtim
      data oldtim(1) /0/
      data oldtim(2) /0/
      data oldtim(3) /0/
      data oldtim(4) /0/
      data oldtim(5) /0/
      data oldtim(6) /0/

c     check click and get current time in yydddhhmm format

      call diftim(click, curdtg)

      return
      end

C+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                      CHKSIZ
C
C FUNCTIONAL DESCRIPTION:         .
C
C CALLED BY:
```

```
C
C PROGRAMMER:                   DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*|*-*-*-*-

        subroutine chksiz

c       check the size of the current retained segment and create a
c       new one if necessary
        COMMON /COUNTS/ ICNTGP,ICNTDV,icntpl
        COMMON /LTYPE/ LTYPE

        logical vax,map
        common /vaxdbc/ vax
        common /mapdbc/ map

        logical bitmod
        common /bitmod/ bitmod

        if (.not.bitmod) then
c           *** Apollo core has problems if icntdv gets in the range of 5700
            if (vax) then
                maxicn = 50000
            else
                maxicn = 5000
            endif
            if (icntdv.gt.maxicn) then
                icntdv = 0
                CALL FLUSHB
                CALL JRCLOS
ccc             CALL MESG(268)
                CALL GEOWIN
                CALL GRAVPT
                call getseg(newseg)
                IF (map) PRINT*,'IN chksiz OPENING SEGMENT # ',newseg
                CALL JROPEN(newseg)
                CALL XCOLOR (LTYPE)
            endif
        endif

        return
        end


C+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    CHLEVL
C
C FUNCTIONAL DESCRIPTION:
C
C CALLED BY:                    CHSCAL, DETCON, RPARAM
C
C PROGRAMMER:                   DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*|*-*-*-*-

        subroutine chlevl (lev)
c
c       change level of detail variable and rank table
c
c       map parameters
        logical lton(16),dotem
        integer ipgrid(4),ltyptb(16)
        common /map/ XRNM,XC,YC,LEVEL,CLAT,CLON,XRAD,YRAD,ITPROJ,
     +      IRES,LTYPTB,LUNDAT,LUNIND,LUNLIN,LTON,IPGRID,DOTEM,
     +      ORHALT
        dimension ltypov(16)
        logical ltonov(16),rankt(26,16)
        common /maptoo/ ltypov,ltonov,rankt
c
        if (lev.eq.0) lev = 1
        level = lev
        do 305 j=1,16
            do 303 i=1,26
```

```
c               set sub-rank values for railroads and roads
                if ((j.eq.5.or.j.eq.6).and.i.gt.10) then
                    rankt(i,j) = rankt(i-10,j)
                else
                    if (level.ge.i) then
                        rankt(i,j) = .true.
                    else
                        rankt(i,j) = .false.
                    endif
                endif
  303       continue
c
c           when setlev is true then that
  305   continue
c       make sure standard guage railroads are turned on
        rankt(12,5) = .true.
c       turn on double line rivers
        rankt(5,4) = .true.
c       turn on lines of separation on land
        rankt(3,2) = .true.
c       turn on indefinite political boundaries
        rankt(2,2) = .true.
c
        return
        end


C+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME: CHRLEN
C
C FUNCTIONAL DESCRIPTION:  NAMLIM OPENS NAME LIMITS FILE AND CALLS PLTNAM.
C
C INPUT FILES/PARAMETERS:
C
C       STRING                 CHAR*(*)    CHARACTER STRING.
C
C GLOBAL VARIABLES : NONE.
C
C OUTPUT FILES/PARAMETERS:
C
C       CHRLEN                 INTEGER     NON-BLANK LENGTH OF STRING.
C
C SUBROUTINES/FUNCTIONS CALLED :
C
C       LEN                    RETURNS DECLARED LENGTH OF STRING.
C
C CALLED BY: PLTNAM.
C
C LOCAL VARIABLES:
C
C       LN                     INTEGER     DECLARED LENGTH OF STRING.
C       IL                     INTEGER     NON-BLANK LENGTH OF STRING.
C
C RESTRICTIONS: NONE.
C
C ABNORMAL RETURN CONDITIONS:  NONE.
C
C LOCATION:                    /a21/gjf/MAPSRC.FTN
C
C PROGRAMMER:                  DATE OF LAST CHANGE     REASON FOR CHANGE
C
C    DAVE NATION                                       ORIGINAL CODE.
C    JERRY FENERTY                                     DOCUMENT AND MODIFY
C                                                      FOR A21 PROTOTYPE.
C
C-*-*-*-*-*-*-*-*-*-*-*-*-*-*-*-*-*-*-*-*-*-*-*-*-*-*-*-*-*-*-*-*-*-*-*-*|*-*-*-*-

      FUNCTION CHRLEN (STRING)

C     THIS FUNCTION FINDS THE NON-BLANK LENGTH OF STRING

      INTEGER CHRLEN
      CHARACTER*(*) STRING
```

```
      LN=LEN(STRING)
      IL=0

      DO 110 I=1,LN

         IF(STRING(I:I).NE.' ') IL=I

110   CONTINUE

      CHRLEN=IL

      RETURN
      END


C+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME: CHSCAL
C
C FUNCTIONAL DESCRIPTION:  CHANGES MAP SCALE.
C
C INPUT FILES/PARAMETERS:
C
C        XRNMNW                REAL         NAUTICAL MILE RADIUS.
C
C GLOBAL VARIABLES :
C
C        QFNTAB                INTEGER(17)  INDEX TO WHICH WDBII TO BE USED.
C        QCURWD                CHAR*6       CURRENT WDBII.
C        QLEVL                 INTEGER(16)  MAP FEATURE LEVELS.
C        QXRNM                 REAL         NAUTICAL MILE RADIUS.
C        QLEVEL                INTEGER      OVERALL LEVEL OF FEATURES.
C        QPGRID                INTEGER(4)   DISTANCE BETWEEN GRID LINES AND
C                                           RESOLUTION OF GRID LINES.
C        QLTON                 LOGICAL(16)  INDICATES WHETHER FEATURE IS
C                                           TURNED ON.
C
C OUTPUT FILES/PARAMETERS:  NONE.
C
C SUBROUTINES/FUNCTIONS CALLED :
C
C        CHAWDB                CHANGES WDBII VERSION.
C
C CALLED BY:                     BOXARE, CALMAP, DECSCA, FCHSCA, INCSCA
C
C LOCAL VARIABLES:
C
C        FNLTR                 INTEGER(9)   WDBII DATA BASES.
C        SCALE                 INTEGER(17)  MAP SCALE LEVEL TABLE.
C        LEVTAB                INTEGER(17)  DETAIL LEVELS TABLE.
C        ISTPTB                INTEGER(17)  DISTANCE BETWEEN LAT/LONG VALUES.
C        INCTAB                INTEGER(17)  RESOLUTION OF LINES.
C        MAXSCT                INTEGER      LENGTH OF SCALE VALUE TABLE.
C        NAML                  INTEGER      LENGTH OF WDBII NAME.
C        SCPNTR                INTEGER      INDEX INTO SCALE TABLE.
C        INDDB                 INTEGER      INDEX INTO WDBII LETTER TABLE.
C
C RESTRICTIONS: NONE.
C
C ABNORMAL RETURN CONDITIONS:   NONE.
C
C LOCATION:                      /a21/gjf/MAPADD.FTN
C
C PROGRAMMER:                    DATE OF LAST CHANGE      REASON FOR CHANGE
C
C     DAVE NATION                                          ORIGINAL CODE.
C     JERRY FENERTY                                        DOCUMENT AND MODIFY
C                                                          FOR A21 PROTOTYPE.
C     David Nation               86-12-4                   Move tables to
C                                                          common and init in
C                                                          inicom
C
C-*-*-*-*-*-*-*-*-*-*-*-*-*-*-*-*-*-*-*-*-*-*-*-*-*-*-*-*-*-*-*-*-*-*-*-*-*|*-*-*-*-

      SUBROUTINE CHSCAL (XRNMNW)
```

```
C       THIS SUBROUTINE ALLOWS THE CHANGING OF MAP SCALE

        CHARACTER FNLTR(9),B
        COMMON /chscle/ scale,levtab,istptb,inctab
        DIMENSION SCALE(17)
        INTEGER LEVTAB(17),ISTPTB(17),INCTAB(17)
        INTEGER QFNTAB(17),SCPNTR
        COMMON /FNTAB/ QFNTAB
        CHARACTER*6 QCURWD
        COMMON /CURWDB/ QCURWD
C       MAP PARAMETERS

        logical map
        common /mapdbc/ map

        logical quickd
        common /quickd/ quickd
        INTEGER QLEVL(16)
        COMMON /LEVLS/ QLEVL
        dimension ltypov(16)
        logical ltonov(16),rankt(26,16)
        common /maptoo/ ltypov,ltonov,rankt

        LOGICAL QLTON(16),QDOTEM
        INTEGER QPGRID(4),QTYPTB(16)
        INTEGER QLEVEL,QITPRO,QIRES,QLUNDA,QLUNIN,QLUNLI
        COMMON /MAP/ QXRNM,QXC,QYC,QLEVEL,QCLAT,QCLON,QXRAD,QYRAD,
     +     QITPRO,
     +     QIRES,QTYPTB,QLUNDA,QLUNIN,QLUNLI,QLTON,QPGRID,QDOTEM,
     +     QORHAL

        DATA FNLTR/'a','b','c','d','e','f','g','h','x'/
        DATA MAXSCT/17/
        DATA NAML/6/

        IF (map) then
            print*,'chscal -- enter ',xrnmnw,qlevl,qpgrid,'  ',
     +      qcurwd,'  ',qlton
        endif
        QXRNM = XRNMNW
        J=0

C       LOOP

  525       J=J+1

            IF (J.GE.MAXSCT.OR.QXRNM.LE.SCALE(J)) GO TO 527

            GO TO 525

C       ENDLOOP

  527   SCPNTR=J

C       SCALE CHANGE PARAMETER PROCESSING
C         TO REDUCE CLUTTER

  300   CONTINUE

        QLEVEL=LEVTAB(SCPNTR)
        IF (map) print*,'in chscal setting level to',qlevel
             DO 110 I=1,16

                IF (QLTON(I)) THEN
                    QLEVL(I) = QLEVEL

                ELSE

                    QLEVL(I) = 0

                ENDIF

 110         CONTINUE
```

```
c
c       set the new ranks for each feature
c
        call chlevl(LEVTAB(SCPNTR))

        QPGRID(1)=ISTPTB(SCPNTR)
        QPGRID(2)=ISTPTB(SCPNTR)
        QPGRID(3)=INCTAB(SCPNTR)
        QPGRID(4)=INCTAB(SCPNTR)

        INDDB=QFNTAB(SCPNTR)

        IF (quickd) THEN
           INDDB = INDDB + 2
           IF (INDDB .GT. 6) INDDB = 6
        ENDIF

C       THIS SUBROUTINE SETS THE WDBII LEVEL

        B=FNLTR(INDDB)

        IF (B.NE.QCURWD(6:6)) THEN
           IF (map) PRINT*,'CHANGING WDB FROM ',QCURWD,'TO ',B
           QCURWD(6:6) = B
           CALL CHAWDB (NAML,QCURWD)
        ENDIF

        IF (QXRNM.GE.2900) THEN
             DO 312 I=2,6
                QLTON(I)=.FALSE.
  312   CONTINUE

        QLTON(11) = .FALSE.
        QLTON(12) = .FALSE.

        ENDIF

        IF (map) then
            print*,'chscal -- exit ',xrnmnw,qlevl,qpgrid,'  ',
     +      qcurwd,'  ',qlton
        endif

        RETURN
        END
C++*+*+*+*+*+*+*+*+*+*+*+*+*+*+*+*+*+*+*+*+*+*+*+*+*+*+*+*+*+*+*+*+*+*+*|*+*+*+*+
c  UNIT NAME:                      circle
c
c  Functional Description:
c       this subroutines draws a circle
c
c  Input Files/Parameters:
c
c  Output Files/Parameters: N/A
c
c  Subroutines/Functions Called:
c      Note: Subroutines preceded by a "j" are explained in the DI-3000 manual.
c
c  Called By:
c
c  Local Variables: N/A
c
c  Restrictions: N/A
c
c  Abnormal Return Conditions:  N/A
c
c  Location:      /a21/dave
c
c  Programmer         Date of Last Change       Reason for Change
c
C-*-*-*-*-*-*-*-*-*-*-*-*-*-*-*-*-*-*-*-*-*-*-*-*-*-*-*-*-*-*-*-*-*-*-*|*-*-*-*-
c
        subroutine circle (x0,y0,radius,nseg)
c
c       draw circle
```

```
c
        real cxarra (101), cyarra(101),angle,delta

        logical map
        common /mapdbc/ map

        data pi/3.1415927/
c       arb is an arbitrary factor limiting the size of default vectors
c       llimit is the lower limit of nnseg
c       max is the upper limit of nnseg
        data llimit,max /10,100/
        data arb /100./
c
        if (map) print*,'circle -- enter',x0,y0,radius,nseg
        numseg = nseg
        IF (numseg .LT. 3) THEN
            numseg = 360. * radius / arb
        ENDIF
        if (numseg .lt. llimit) numseg = llimit
        if (numseg .gt. max) numseg = max
C
c    define increment of angle
c
        delta = 2. * 3.141596 / float(numseg)
c    determine points around the circle using formula
c    x = xc + r*cos(angle)
c    y = yc + r*sin(angle)
c
        do 10 i = 1,numseg
            angle = FLOAT(i-1)*delta
            cxarra(i) = x0 + radius * cos( angle )
            cyarra(i) = y0 + radius * sin( angle )
   10   continue
c
c       make sure polygon is closed on Apollo
        cxarra(numseg+1) = cxarra(1)
        cyarra(numseg+1) = cyarra(1)
C
        call jmove (cxarra(1),cyarra(1))
        call jpolgn (cxarra,cyarra,numseg+1)
        call jpoly (cxarra,cyarra,numseg+1)

        if (map)
     +      print*,'circle -- exit ',i,temp,x,y,aseg,curang,
     +      radius,numseg
        RETURN
        END

C+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:                    clenup
c
c  Functional Description:
c       this subroutine cleans up any system dependent things
c
c  Input Files/Parameters:
c
c  Output Files/Parameters: N/A
c
c  Subroutines/Functions Called:
c      Note: Subroutines preceded by a "j" are explained in the DI-3000 manual.
c
c  Called By:                    FMAIN
c
c  Local Variables: N/A
c
c  Restrictions: N/A
c
c  Abnormal Return Conditions:  N/A
c
c  Location:      /a21/dave
c
c  Programmer         Date of Last Change       Reason for Change
c
C-*-*-*-*-*-*-*-*-*-*-*-*-*-*-*-*-*-*-*-*-*-*-*-*-*-*-*-*-*-*-*-*-*-*-*|*-*-*-*-
```

```
c
        subroutine clenup

c       this subroutine cleans up any system dependent things

        integer qdsdev,qpydev,qecho,qlecho
        common /device/ qdsdev,qpydev,qecho,qlecho
        logical rdkey,savkey
        common /rkdbc/ rdkey
        common /svkdbc/ savkey
        logical eofkey
        integer keylun,newlun
        common /keylun/ keylun,newlun,eofkey
        character*6 commnd

        CALL JDEVOF (qdsdev)
        CALL JDEND  (qdsdev)
        CALL JEND
        if (rdkey) then
            if (.not.eofkey) then
                call kpause (eofkey)
                read (keylun,*,end=192,err=191) commnd
                if (commnd(1:4).ne.'jend') then
                    print*,'clenup -- incompatible command in',
     +              ' read_keys file  ',commnd
                endif
            endif
            close (keylun)
        endif
        go to 199
  191   continue
            print*,'clenup -- error on read of save key file',
     +      '  ',keylun
            go to 199
  192   continue
            print*,'clenup -- premature end of read key file.'
            eofkey = .true.
  199   continue
        if (savkey) then
            write (newlun,*,err=135) '''jend'''
            close (newlun)
        endif
        go to 140
  135   continue
            print*,'clenup -- error on write to save key file',
     +      '  ',newlun
  140   continue

        return
        end


C++++++++++++++++++++++++++++++++++++++++++++++++++++++++++++++++++++++++++
C UNIT NAME: CLOSEI
C
C FUNCTIONAL DESCRIPTION:  CLOSEES CURRENT WDBII FILES.
C
C INPUT FILES/PARAMETERS:
C
C       LUNDAT              INTEGER     LOGICAL UNIT NUMBER FOR WDBII DATA
C                                       FILE.
C       LUNIND              INTEGER     LOGICAL UNIT NUMBER FOR WDBII INDE
C                                       FILE.
C       LUNLIN              INTEGER     LOGICAL UNIT NUMBER FOR WDBII LINE
C                                       INDEX FILE.
C
C GLOBAL VARIABLES : NONE.
C
C OUTPUT FILES/PARAMETERS:  NONE.
C
C SUBROUTINES/FUNCTIONS CALLED : NONE.
C
C CALLED BY: CHAWDB.
C
```

```
C LOCAL VARIABLES: NONE.
C
C RESTRICTIONS: NONE.
C
C ABNORMAL RETURN CONDITIONS:   NONE.
C
C LOCATION:                     /a21/gjf/L3REA.FTN
C
C PROGRAMMER:                   DATE OF LAST CHANGE     REASON FOR CHANGE
C
C     DAVE NATION                                       ORIGINAL CODE.
C     JERRY FENERTY                                     DOCUMENTATION AND MO
C                                                       FOR A21 PROTOTYPE.
C     DANIEL BERKICH (SAIC) NOSC                        Read both forms of
C                                                       Data base.
C
C-*-*-*-*-*-*-*-*-*-*-*-*-*-*-*-*-*-*-*-*-*-*-*-*-*-*-*-*-*-*-*-*-*-*-*|*-*-*-*-

      SUBROUTINE closei(lundat,lunind,lunlin)

      CLOSE (UNIT=lundat)
      CLOSE (UNIT=lunind)
      CLOSE (UNIT=lunlin)

      RETURN
      END


C+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    CLOSES
C
C FUNCTIONAL DESCRIPTION:       .
C
C CALLED BY:                    STATEC
C
C PROGRAMMER:                   DATE OF LAST CHANGE     REASON FOR CHANGE
c  S. Lamb                    Feb 1988                 command fix - closes
C
C-*-*-*-*-*-*-*-*-*-*-*-*-*-*-*-*-*-*-*-*-*-*-*-*-*-*-*-*-*-*-*-*-*-*-*|*-*-*-*-
c
        subroutine closes
c
c       this subroutine is the close state interpreter (29)
c
        common /states/ nextst
c
c * ** *** **** ***** ****** ******* not understood for now; to exit,
c * ** *** **** ***** ****** ******* set nextst to 0 and qexitg to true.
c        print*,'closes -- enter'
        nextst = 15
c
        return
        end


C+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:                   closit

c  Functional Description:
c       this subroutine closes a file
c
c  Input Files/Parameters:

c  Output Files/Parameters: N/A

c  Subroutines/Functions Called:

c  Called By:                   BSTMAP, CRMESG, HELPSG, LOADIC, MESGJF,
C                               RCOLOR, RCONFG, RPARAM, RPATHS,
C                               RSAVPR, SPARAM, WSAVPR, PROCDF, WRITER

c  Local Variables: N/A

c  Restrictions: N/A
```

```
c  Abnormal Return Conditions:  N/A

c  Location:       /a21/dave

c  Programmer          Date of Last Change        Reason for Change

C-*-*-*-*-*-*-*-*-*-*-*-*-*-*-*-*-*-*-*-*-*-*-*-*-*-*-*-*-*-*-*-*-*-*-*-*-*-*-*-*|*-*-*-*-

        subroutine closit (ifl)

c       this subroutine closes a file

        close (ifl)

        return
        end


C++*+*+*+*+*+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:   CLRBVP
c
c  Functional Description:
c       this subroutine can be used to initialize the constr. box.
c       The veiwport is assumed to have been set previously
c
c  Input Files/Parameters:
c       xllbvp,yllbvp,xurbvp,yurbvp
c       nsg,ioc,ibc
c
c  Output Files/Parameters:
c
c  Subroutines/Functions Called:
c       Note: Subroutines preceded by a "j" are explained in the DI-3000 manual.
c       enall
c
c  Called By:                     MAKBOX
c
c  Local Variables:
c
c  Restrictions:     n/a
c
c  Abnormal Return Conditions: n/a
c
c  Location:    /a21/dave
c
c  Programmer          Date of Last Change        Reason for Change
c
C-*-*-*-*-*-*-*-*-*-*-*-*-*-*-*-*-*-*-*-*-*-*-*-*-*-*-*-*-*-*-*-*-*-*-*-*-*-*-*-*|*-*-*-*-
c
        subroutine clrbvp (nsg,ioc,ibc)
c
c       this subroutine can be used to initialize the constr. box.
c       The viewport is assumed to have been set previously
c
        logical aed
        common /aeddbc/ aed
c
        common /combvp/ xllbvp,yllbvp,xurbvp,yurbvp
c
        xinc = xurbvp - xllbvp
        yinc = yurbvp - yllbvp
        if (xinc.ge.yinc) then
            xur = xllbvp + yinc
            yur = yurbvp
        else
            xur = xurbvp
            yur = yllbvp + xinc
        endif
c        print*,'clrbvp -- ',xllbvp,xurbvp,yllbvp,yurbvp,xur,yur
c        print*,'clrbvp -- ',ioc
        call enall
        call jwindo (xllbvp,xurbvp,yllbvp,yurbvp)
        call jdvisb (0)
```

```
        call jropen (nsg)
        call xcolor (ioc)
        call xpidex (ibc,0)
c       added by gre to take into account an AED 512
        if (aed) then
             call jpintr (1)
        else
             call jpintr (0)
        endif
        call jrect (xllbvp,yllbvp,xurbvp,yurbvp)
        call jmove (xllbvp,yur)
        call jdraw (xur,yur)
        call jdraw (xur,yllbvp)

        call jrclos
        call jdetec(nsg,0)
        call jsgpri(nsg,1)
        call jdvisb (1)
c        call soverl
c
        return
        end


C+++++++++++++++++++++++++++++++++++++++++++++++++++++++++++++++++++|+++++++
c  UNIT NAME:   CLRCOM
c
c  Functional Description:
c       this subroutine clears the communications area
c
c  Input Files/Parameters:
C       nsgsys                        communications area segment number
c
c  Output Files/Parameters:
c
c  Subroutines/Functions Called:
c       Note: Subroutines preceded by a "j" are explained in the DI-3000 manual.
c       enall
c       comwin
c       comvpt
c       soverl
c
c  Called By:                  CRMESG, DISP5, DISTAN, HELP,
C                              MESG, MESSAG, SCRDIA, GMCLOS
c
c  Local Variables:       n/a
c
c  Restrictions:               n/a
c
c  Abnormal Return Conditions: n/a
c
c  Location:    /a21/dave
c
c  Programmer        Date of Last Change       Reason for Change
c
C-*-*-*-*-*-*-*-*-*-*-*-*-*-*-*-*-*-*-*-*-*-*-*-*-*-*-*-*-*-*-*-*-*-*|*-*-*-*-
c
        subroutine clrcom
c
c       this subroutine clears the communications area
c
        common /arsegs/ nsgmen,nsggra,nsgsys,nsgmsg,nsgmap,nsgful
c
        call enall
        call jvisbl (nsgsys,0)
        call jvisbl (nsgsys,1)
        call soverl
        call comvpt
        call comwin
c
        return
        end
```

```
C+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:   CLRFUL
c
c  Functional Description:
c
c  Input Files/Parameters:
C       nsgful                                full screen segment number
c       xllscr,yllscr                         lower left x,y point
c       xurscr,yurscr                         upper right x,y point
c       xvlow,yvlow                           veiwport lower x,y point
c       xvhigh,yvhigh                         veiwport upper x,y point
c
c  Output Files/Parameters:
c
c  Subroutines/Functions Called:
c       Note: Subroutines preceded by a "j" are explained in the DI-3000 manual.
c       enall
c       soverl
c
c  Called By:                    INTSCN
c
c  Local Variables:                n/a
c
c  Restrictions:                n/a
c
c  Abnormal Return Conditions: n/a
c
c  Location:    /a21/dave
c
c  Programmer        Date of Last Change       Reason for Change
c
C-*-*-*-*-*-*-*-*-*-*-*-*-*-*-*-*-*-*-*-*-*-*-*-*-*-*-*-*-*-*-*-*-*-*-*|*-*-*-*-
c
      subroutine clrful
c
c     this subroutine clears the full screen area and puts it in a
c     retained segment
c
      common /aspect/ xaspec,yaspec,xvlow,xvhigh,yvlow,yvhigh
      common /comscr/ xllscr,yllscr,xurscr,yurscr
      common /arsegs/ nsgmen,nsggra,nsgsys,nsgmsg,nsgmap,nsgful
c
      call enall
c                                {added by dabutson}
      call jvisbl (nsgful,0)
      call jvisbl (nsgful,1)
c     call jvisbl (nsgful,0)
      call soverl
      call jvport (xvlow,xvhigh,yvlow,yvhigh)
      call jwindo (xllscr,xurscr,yllscr,yurscr)
c
      return
      end

C+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:  CLRGRA
c
c  Functional Description:
c  this subroutine clears the graphics area and puts it in a retained segment
c
c  Input Files/Parameters:
C       nsggra
c
c  Output Files/Parameters:
c
c  Subroutines/Functions Called:
c       Note: Subroutines preceded by a "j" are explained in the DI-3000 manual.
c       enall
c       soverl
c       gravpt
c       geowin
c
c  Called By:                    DRAWIT, INIPIC
```

```
c
c  Local Variables:     n/a
c
c  Restrictions:               n/a
c
c  Abnormal Return Conditions: n/a
c
c  Location:    /a21/dave
c
c  Programmer          Date of Last Change       Reason for Change
c  L. McCleary         Jan 1988              sep amp & sys - clrgra
c
C-*-*-*-*-*-*-*-*-*-*-*-*-*-*-*-*-*-*-*-*-*-*-*-*-*-*-*-*-*-*-*-*-*-*-*-*|*-*-*-*-
c
       subroutine clrgra
c
c      this subroutine clears the graphics area and puts it in a retained segme
c
       logical batch
       common /batdbc/ batch
       common /arsegs/ nsgmen,nsggra,nsgsys,nsgmsg,nsgmap,nsgful
       common /logseg/ nsglog
c
       call enall
c       if (batch) then
c                                    {added by dabutson}
           call jvisbl (nsggra,0)
           call jvisbl (nsggra,1)
c          call jvisbl (nsggra,0)
c                                    {added by dabutson}
c          call jvisbl (nsglog,0)
c          call jvisbl (nsglog,1)
c       end if
       call soverl
       call gravpt
       call geowin
c
       return
       end

C+*+*+*+*+*+*+*+*+*+*+*+*+*+*+*+*+*+*+*+*+*+*+*+*+*+*+*+*+*+*+*+*+*+*+*+*+|*+*+*+*+
c  UNIT NAME:                  Clrhil
c
c  Functional Description:     Clears all hilites
c                              from menu
c
c  Input Files/Parameters:
c
c  Output Files/Parameters:
c
c
c  Subroutines/Functions Called:
c
c        jxxxxx  - di3000 subroutines
c
c  Called By:
c        drawm   - draws new menus
c
c  Local Variables:
c
c    seg   - integer       - possible segment numbers for hilited menu items
c    array - integer(19)   - array return from jisgmt.  first element,
c                            0 - no segment by given name
c                            1 - a segment exist with given name
c
c  Restrictions:               N/A
c
c  Abnormal Return Conditions:  N/A
c
c  Location:
c
c  Programmer          Date of Last Change       Reason for Change
c
```

```
c    Dirk Butson          1/7/85
c
C-*-*-*-*-*-*-*-*-*-*-*-*-*-*-*-*-*-*-*-*-*-*-*-*-*-*-*-*-*-*-*-*-*-*-*-*-*-*-*-*|*-*-*-*-

      subroutine clrhil

c     clears all hilights from menu area

      integer seg,array(19)
      logical sys
      common /sysdbc/ sys
      if (sys)  print*,' In Clrhil '

c --- purge all segments which are on
      do 10 i = 1,43
         seg = i + 1019
         call jisgmt(seg,array)
         if(array(1) .eq. 1) call jpurge(seg)
         seg = i + 31100
         call jisgmt(seg,array)
         if(array(1) .eq. 1) call jpurge(seg)
   10 continue
      if (sys) print*,' Leaving Clrhil '
      return
      end


C+*+*+*+*+*+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:   CLRMEN
c
c  Functional Description:
c       this subroutine clears the menu area
c
c  Input Files/Parameters:
C       nsgbox,nsgsho,nsgcrm
C       nsgmen,nsggra,nsgsys,nsgmsg,nsgmap,nsgful,nsgkey
c       nsgcrm -- segment number of current menu background box
c       inewmn -- new menu backgound box : 0 -- use full menu box
c                                          1 -- use short menu box
c
c  Output Files/Parameters:
c
c  Subroutines/Functions Called:
c       Note: Subroutines preceded by a "j" are explained in the DI-3000 manual.
c       enall
c       soverl
c       menvpt
c       menwin
c
c  Called By:                   DRAWM
c
c  Local Variables:
c       nsg
c
c  Restrictions:               n/a
c
c  Abnormal Return Conditions:    n/a
c
c  Location:    /a21/dave
c
c  Programmer         Date of Last Change        Reason for Change
c  L. McCleary        Jan 1988                sep amp & sys - clrmen
c
C-*-*-*-*-*-*-*-*-*-*-*-*-*-*-*-*-*-*-*-*-*-*-*-*-*-*-*-*-*-*-*-*-*-*-*-*-*-*-*-*|*-*-*-*-
c
        subroutine clrmen
c
c       this subroutine clears the menu area
c

        logical batch
        common /batdbc/ batch

        common /arsegs/ nsgmen,nsggra,nsgsys,nsgmsg,nsgmap,nsgful
        common /boxseg/ nsgbox,nsgsho,nsgcrm
```

```
      common /inewmn/ inewmn
c
c     nsgcrm -- segment number of current menu background box
c     inewmn -- new menu backgound box : 0 -- use full menu box
c                                        1 -- use short menu box
c
      if (inewmn.eq.0) then
          nsg = nsgmen
      else
          nsg = nsgsho
      endif
c      call enall
c      if (batch) then
c                                 {added by dabutson}
          call jvisbl (nsg,0)
          call jvisbl (nsg,1)
c         call jvisbl (nsg,0)
c      end if
c      call soverl
      nsgcrm = nsg
      call menvpt
      call menwin
c
      return
      end

C+*+*+*+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:                    clrmsg
c
c  Functional Description:
c       clear message area (make current message invisible)
c
c  Input Files/Parameters:
c
c  Output Files/Parameters: N/A
c
c  Subroutines/Functions Called:
c       Note: Subroutines preceded by a "j" are explained in the DI-3000 manual.
c
c  Called By:                    HELP, MESSAG, TKINFO, TXWRIT
c
c  Local Variables: N/A
c
c  Restrictions: N/A
c
c  Abnormal Return Conditions:  N/A
c
c  Location:      Apollo       /a21/dave
c
c  Programmer        Date of Last Change       Reason for Change
c
C-*-*-*-*-*-*-*-*-*-*-*-*-*-*-*-*-*-*-*-*-*-*-*-*-*-*-*-*-*-*-*-*-*-*-*-*-*-*|*-*-*-*-
c
      subroutine clrmsg
c
c     clear message area (make current message invisible)
c
      logical sys
      common /sysdbc/ sys
      common /msgold/ msgold,msgonm
      common /msgoff/ msgoff
c
      if (sys) print*,'clrmsg -- enter ',msgno,msgold
      if (msgonm .gt. 0) then
         call jvisbl(msgonm + msgoff,0)
      else if (msgonm .eq. 0) then
         call jpurge (msgoff)
      endif
      msgold = -1
      msgonm = -1
c
      return
      end
```

```
C+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    CLRSTR
C
C FUNCTIONAL DESCRIPTION:       MODULE TO CLEAR THE TEXT ARRAY
C
C INPUT FILES/PARAMETERS:       NONE
C
C OUTPUT FILES/PARAMETERS:
C
C                      COMMON
C      VARIABLE        BLOCK      TYPE        DESCRIPTION
C
C       QSTRNG        TXTSTR     CHAR       CHARACTER ARRAY, 4 LONG
C       QACTUL        MAXCHR     INTEGER    LENGTH OF CORRESPONDING QSTRNG
C       QTXPOS        TXTPOS     REAL       THE WORLD X POSITION OF TEXT STRING
C       QTYPOS        TXTPOS     REAL       THE WORLD Y POSITION OF TEXT STRING
C       QHLAT         HLDPRM     REAL       THE LATITUDE POSITION OF TEXT STRING
C       QHLONG        HLDPRM     REAL       THE LONGITUDE POSITION OF TEXT STRING
C       QXPOS         CHRATR     INTEGER    THE VIRTUAL X POSITION OF TEXT STRING
C       QYPOS         CHRATR     INTEGER    THE VIRTUAL Y POSITION OF TEXT STRING
C
C SUBROUTINES/FUNCTIONS CALLED  NONE
C
C CALLED BY:                    INIPIC
C
C LOCAL VARIABLES:
C
C       I       INTEGER          INDEX OF QSTRNG (FROM 1 TO 4)
C
C RESTRICTIONS:                 NONE
C
C
C ABNORMAL RETURN CONDITIONS:   N/A
C
C LOCATION:                     /U2/SAY/TEXT/SOURCE/CLRSTR.F
C
C PROGRAMMER:                   DATE OF LAST CHANGE     REASON FOR CHANGE
C
C     SAYATES                          1/17/84          INITIAL ENTRY
C
C-*-*-*-*-*-*-*-*-*-*-*-*-*-*-*-*-*-*-*-*-*-*-*-*-*-*-*-*-*-*-*-*-*-*-*-*-*|*-*-*-*-
C
      SUBROUTINE CLRSTR
C
C  CLEARS OUT A TEXT STRING AND ALL VALUES ASSOCIATED WITH IT (ie POSITIONS)
C
C*****ROUTINE TO CLEAR THE TEXT ARRAY
C
C*****DEFINITION AND DECLARATION OF COMMON BLOCKS
C
      COMMON/CHRATR/QVERT,QXBASE,QYBASE,QXPLAN,QYPLAN,
     +              QHJUST,QVJUST,QCRPTH,QXSIZE,QYSIZE,
     +              QXPOS,QYPOS,QFNUM,QSDIAM
      INTEGER      QVERT,QHJUST,QVJUST,QCRPTH,
     +             QFNUM,QXPOS(4),QYPOS(4)
      REAL         QXBASE,QYBASE,QXPLAN,QYPLAN,
     +             QXSIZE,QYSIZE,QSDIAM
C
      COMMON/HLDPRM/QHXSIZ,QHYSIZ,QHLAT,QHLONG
      INTEGER        QHXSIZ,QHYSIZ
      REAL           QHLAT(4),QHLONG(4)
C
      COMMON/TXTPOS/QTXPOS,QTYPOS
      REAL       QTXPOS(4),QTYPOS(4)
C
      COMMON/TXTSTR/QSTRNG
      CHARACTER*50 QSTRNG(4)
C
      COMMON/MAXCHR/QMXCHR,QACTUL
      INTEGER      QMXCHR,QACTUL(4)
C
      logical sys
      common /sysdbc/ sys
C
```

```
C*****DECLARATION OF LOCAL VARIABLES
      INTEGER I
C
C****BLANK OUT QSTRNG AND SET THEIR LENGTHS TO 0
C
      if (sys) print*,'enter clrstr'

      DO 100 I = 1,4
         QSTRNG(I) = ' '
         QACTUL(I) = 0
         QTXPOS(I) = -99.
         QTYPOS(I) = -99.
         QHLAT(I) = -99.
         QHLONG(I) = -99.
         QXPOS(I) = -99
         QYPOS(I) = -99
 100  CONTINUE

      if (sys) print*,'leave clrstr'
C
      RETURN
      END


C++++++++++++++++++++++++++++++++++++++++++++++++++++++++++++++++++++++|+++++++
c  UNIT NAME:   clrvpt
c
c  Functional Description:
c       this subroutine can be used to initialize an area to a certain
c       color.  The veiwport is assumed to have been set previously
c
c  Input Files/Parameters:
c       nsg,ioc,ibc
c
c  Output Files/Parameters:
c
c  Subroutines/Functions Called:
c       Note: Subroutines preceded by a "j" are explained in the DI-3000 manual.
c       enall
c       dvisb
c
c  Called By: makful,makcom,makgra,makkey,makmen,maksho
c
c  Local Variables:
c       xlow,xhigh,ylow,yhigh
c
c  Restrictions:              N/A
c
c  Abnormal Return Conditions: N/A
c
c  Location:    /a21/dave
c
c  Programmer        Date of Last Change       Reason for Change
c  L McCleary        Jan 1988                sep amp & sys - clrvpt
c
C-*-*-*-*-*-*-*-*-*-*-*-*-*-*-*-*-*-*-*-*-*-*-*-*-*-*-*-*-*-*-*-*-*-*-*|*-*-*-*-
c
        subroutine clrvpt (nsg,ioc,ibc)
c
c       this subroutine can be used to initialize an area to a certain color.
c       The veiwport is assumed to have been set previously
c
        logical aed
        common /aeddbc/ aed
c
        data xlow,xhigh,ylow,yhigh/0.,1.,0.,1./
c
c       print*,'clrvpt -- ',nsg,ioc,ibc
        call enall
        call jwindo (xlow,xhigh,ylow,yhigh)
        call jdvisb (0)
        call jropen (nsg)
        call xcolor (ioc)
        call xpidex (ibc,0)
```

```
c       added by gre to take into account an AED 512
        if (aed) then
             call jpintr (1)
        else
c             call jpintr (0)
             call jpintr (1)
        endif
        call jrect (xlow,ylow,xhigh,yhigh)
        call jrclos
        call jdetec (nsg,0)
c        call jsgpri(nsg,1)
        call jsgpri(nsg,0)
        call jdvisb (1)
        call soverl
c
        return
        end


C+*+*+*+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                     CMDMAI
C
C FUNCTIONAL DESCRIPTION:        .
C
C CALLED BY:                     STATEC
C
C PROGRAMMER:                    DATE OF LAST CHANGE     REASON FOR CHANGE
c  S. Lamb                     Feb 1988                  command fix - cmdmai
C
C-*-*-*-*-*-*-*-*-*-*-*-*-*-*-*-*-*-*-*-*-*-*-*-*-*-*-*-*-*-*-*-*-*-*-*-*-*-*-*-*-*|*-*-*-*-
c
        subroutine cmdmai
c
c       this subroutine is the initial command mode interpreter (1)
c
        common /states/ nextst
        logical sketch,majorf,minorf
        common /statel/ sketch,majorf,minorf
        logical firstm
        logical wordis,iseoc
        logical isfeat,isproj,isincr,isdecr,iscoor
        logical isblan
c
c       print*,'cmdmai -- enter'
        firstm = .true.
        sketch = .false.
        majorf = .false.
        minorf = .false.
        initls = nextst
c       do until nextst not = initial state
  100   continue
            call getwrd
            if (iseoc()) then
                if (isblan()) then
                    nextst = 0
                else
                    call getcmd
                endif
            else if (wordis('DRAW').or.wordis('DISPLAY')
     +          .or.wordis('SHOW')) then
                nextst = 2
            else if (wordis('SET').or.wordis('POINT').or.
     +          wordis('AND').or.wordis('THEN').or.wordis('CHANGE'))
     +          then
c * ** *** **** ***** ****** not understood / implem.
                nextst = 15
            else if (wordis('SKETCH')) then
                sketch = .true.
                nextst = 2
            else if (wordis('MAJOR').or.wordis('LARGE')) then
                majorf = .true.
                nextst = 9
            else if (wordis('MINOR').or.wordis('SMALL')) then
                minorf = .true.
```

```
              nextst = 10
          else if (wordis('WHAT').or.wordis('CURRENT')) then
              nextst = 4
          else if (wordis('PROJECTION')) then
              nextst = 12
          else if (wordis('SCALE')) then
              nextst = 16
          else if (wordis('CENTER')) then
              nextst = 18
          else if (wordis('MORE')) then
              nextst = 21
          else if (wordis('LESS')) then
              nextst = 22
          else if (wordis('ERASE').or.wordis('CLEAR')) then
              nextst = 25
          else if (wordis('TURN')) then
              nextst = 26
          else if (wordis('EXIT').or.wordis('QUIT').or.
     +        wordis('RETURN').or.wordis('X')) then
              nextst = 0
          else if (wordis('EXECUTE').or.wordis('INTERPRET').or.
     +        wordis('COMMAND').or.wordis('FILE')) then
              nextst = 27
          else if (wordis('SAVE').or.wordis('STORE')) then
              nextst = 28
          else if (wordis('CLOSE').or.wordis('STOP').or.
     +        wordis('END')) then
              nextst = 29
          else if (wordis('REMOVE')) then
              nextst = 30
          else if (iscoor()) then
              nextst = 19
          else if (isproj()) then
              nextst = 13
          else if (isfeat()) then
              nextst = 8
          else if (isincr()) then
              nextst = 23
          else if (isdecr()) then
              nextst = 24
          else
              nextst = 15
          endif
          firstm = .false.
      if (nextst.eq.initls) go to 100
c     print*,'cmdmai -- exit'
c
      return
      end


C+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                   CMPTIM
C
C FUNCTIONAL DESCRIPTION:      .
C
C CALLED BY:                   ADDTRK, CHGIND, TIMCHK
C
C PROGRAMMER:                  DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*|*-*-*-*-

      subroutine cmptim (dtg1, dtg2, flag)

c this routine checks whether the first dtg is subsequent in time to or
c the same time as the second dtg
c    if so, return true
c    otherwise, return false
c programmer: avw

      integer          day1
      integer          day2
      integer          hr1
      integer          hr2
```

```
      integer          mn1
      integer          mn2
      integer          yr1
      integer          yr2

      character*9      dtg1
      character*9      dtg2

      logical          flag

      flag = .false.

      read (dtg1, 10, err=900) yr1, day1, hr1, mn1
      read (dtg2, 10, err=900) yr2, day2, hr2, mn2
 10   format (i2, i3, i2, i2)

      if ((yr1 .gt. yr2) .or. ((yr1 .lt. yr2) .and.
     +      (yr2-yr1 .ge. 99))) then
         flag = .true.
      else
     + if (yr1 .eq. yr2) then
         if (day1 .gt. day2) then
            flag = .true.
         else
     +   if (day1 .eq. day2) then
            if (hr1 .gt. hr2) then
               flag = .true.
            else
     +      if (hr1 .eq. hr2) then
               if (mn1 .ge. mn2) then
                  flag = .true.
               end if
            end if
         end if
      end if

      go to 1000

 900  continue
c error reading data - exit routine after setting flag
      flag = .false.

1000  continue

      return
      end

C+++++++++++++++++++++++++++++++++++++++++++++++++++++++++++++++++++|+++++++
C UNIT NAME:                        CNSTNT
C
C FUNCTIONAL DESCRIPTION:           .
C
C CALLED BY:                        NO LONGER USED BY CARICATURE
C
C PROGRAMMER:                       DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*|*-*-*-*-

      subroutine cnstnt(azi,lat,lon)
c
c     This subroutine calculates constants for regular bearings.
c
      real LAT,LON,L0,LNP,LNM

      common/constx/sazi,slat,cosazi,scazi,coslat,sinazi,cosi,
     1             sini,cosl0,cosf0,L0,lnp,lnm,f,f0

C --- Calculate constants for regular bearing

      SAZI = SIGN(1.0,AZI)
      SLAT = SIGN(1.0,LAT)
      COSAZI = COS(AZI)
      SCAZI = SIGN(1.0,COSAZI)
```

```
      COSLAT = COS(LAT)
      SINAZI = SQRT(1-COSAZI**2)
C --- I is inclination of great circle to equator
      COSI = SINAZI*COSLAT
      SINI = SQRT(1-COSI**2)
C --- L0 is difference in longitude from intersection of great circle
C --- with equator to DF station
      IF (ABS(SINI).LT.0.001) THEN
C ------- If track along equator, say intersection occurs at station
          COSL0 = 1.0
      ELSE
          COSL0 = COSAZI/SINI
      END IF
C --- F0 is distance in radians from intersection of great circle
C --- with equator to DF station
      COSF0 = COSL0*COSLAT
      L0 = SAZI*ACOS(COSL0)
C --- Longitude of intersection of great circle with equator (depending
C --- on direction of bearing)
      LNP = LON + L0
      LNM = LON - L0
      F0 = SLAT*ACOS(COSF0)
C --- Initialize distance along great circle from equator to next point
C --- in bearing
      F = F0


      return
      end


C+*+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:                   CNVTVW
c
c  Functional Description:      CNVTVW converts virtual coordinates to world
c                               coordinates without checking that points are
c                               in the current viewport set.
c
c  Input Files/Parameters:
c    numpts   integer    number of points in arrays virtx and virty.
c    virtx    real       array of virtual x points.
c    virty    real       array of virtual y points.
c
c  Output Files/Parameters:
c    wrldx    real       array of world x points.
c    wrldy    real       array of world y points.
c
c  Local Variables:
c   cntr       integer    loop counter.
c   vxpt1      real       virtual x point inside viewport.
c   vxpt2      real       virtual x point displaced 0.01 x units
c                         from vxpt1.
c   vypt1      real       virtual y point inside viewport.
c   vypt2      real       virtual y point displaced 0.01 y units
c                         from vypt1.
c   wxdist     real       x distance between wxpt1 and wxpt2.
c   wydist     real       y distance between wypt1 and wypt2.
c   wxpt1      real       world coordinate equivalent of virtual
c                         point vx1pt.
c   wxpt2      real       world coordinate equivalent of virtual
c                         point vx2pt.
c   wypt1      real       world coordinate equivalent of virtual
c                         point vy1pt.
c   wypt2      real       world coordinate equivalent of virtual
c                         point vy2pt.
c   zeroz      real       unused world z coordinate.
c
c  Subroutines/Functions Called:
c       All subroutine names preceeded by a "j" are DI3000 subroutines.
c       For more information see the DI3000 Users Guide.
c
C CALLED BY:                    NO LONGER USED BY CARICATURE
c
c  Restrictions: The current viewport must contain the point (1.0, 1.0, 1.0)
```

```
c               and a world coordinate point (0.1, 0.1) virtual units
c               larger than the original world point.
c
c  Abnormal Return Conditions:  N/A
c
c  Location:  //dsp80/a21/bap/linlib.ftn
c
c  Programmer: Brian A. Pelletier
c
C-*-*-*-*-*-*-*-*-*-*-*-*-*-*-*-*-*-*-*-*-*-*-*-*-*-*-*-*-*-*-*-*-*-*-*-*-*|*-*-*-*-

      SUBROUTINE CNVTVW(virtx, virty, wrldx, wrldy, numpts)

        real virtx(*), wrldx(*), virty(*), wrldy(*)
        real vxpt1, vypt1, vxpt2, vypt2, zeroz
        real wxpt1, wypt1, wxpt2, wypt2, wxdist, wydist
        integer numpts, cntr

c       print *, 'enter cnvtvw'

        zeroz = 1.0
c
c Assuming the viewport contains the point (1.0, 1.0, 1.0)
c convert this world point to a virtual point.  Adding a small
c virtual amount to this point and converting back to world
c coordinates gives a conversion factor in both the x and y
c directions to work with.
c
        call jconwv(1.0, 1.0, 1.0, vxpt1, vypt1)
        vxpt2 = vxpt1 + 0.01
        vypt2 = vypt1 + 0.01
        call jconvw(vxpt1, vypt1, wxpt1, wypt1, zeroz)
        call jconvw(vxpt2, vypt2, wxpt2, wypt2, zeroz)
c
c The ratio of one virtual unit to one world unit is compute by
c taking the difference of the two world coordinates divided
c by th difference of the virtual coordinates.'
c
        wxdist = (wxpt2 - wxpt1) / (vxpt2 - vxpt1)
        wydist = (wypt2 - wypt1) / (vypt2 - vypt1)
c
c In computing a world coordinte given a virtual subtract the
c original virtual coordinate from the point, multiply by the
c world conversion fatcor and add the original world coordinate.
c
        do 10 cntr = 1,numpts
          wrldx(cntr) = (virtx(cntr) - vxpt1) * wxdist + wxpt1
          wrldy(cntr) = (virty(cntr) - vypt1) * wydist + wypt1
c           print *, 'wrldx, wrldy, virtx, virty [', cntr, ' ]'
c           print *, wrldx(cntr), wrldy(cntr), virtx(cntr), virty(cntr)
10      continue

c       print *, 'exit cnvtvw'

      return
      end


C+*+*+*+*+*+*+*+*+*+*+*+*+*+*+*+*+*+*+*+*+*+*+*+*+*+*+*+*+*+*+*+*+*+*+*+*+*|*+*+*+*-
c  UNIT NAME:              colbak
c
c  FUNCTIONAL DESCRIPTION:   This subroutine provides a means of
c                            selecting the background color for
c                            the display area.  There are 8
c                            background colors from which to
c                            choose, all of which fit nicely in
c                            one menu area.
c
c  INPUT FILES/PARAMETERS:
c
c      Menu Control Globals
c
c      qcrmnu         b6          integer   value of the current menu
c      xllmvp         commvp      real      menu viewport parameter
```

```
c       yllmvp          commvp      real       menu viewport parameter
c       xurmvp          commvp      real       menu viewport parameter
c       yurmvp          commvp      real       menu viewport parameter
c
c
c   OUTPUT FILES/PARAMETERS:
c
c       Screen Attributes Globals
c
c       qbkgrd          scratr      integer    value for background color
c
c
c   SUBROUTINES/FUNCTIONS CALLED:
c
c       check                       checks the value of the button re-
c                                   turned from a pick or locate
c       hilite                      highlights menu choices by drawing
c                                   a box around them
c       mesg                        displays messages in the communica-
c                                   tions area
c       mpick                       routine to pick from the menu
c
c       Note: Any subroutines preceded by a "j" are explained in the DI-3000
c             manual.
c
c
c   CALLED BY:                      FCFILL
c
c       Any routine needing to change the background color.
c
c   LOCAL VARIABLES:
c
c       ibuttn      integer   value of button pressed
c       ichoic      integer   pickid of menu item selected
c       error       logical   indicates error during menu selection
c       rflag       logical   set if 'cancel', 'exit' or 'return' picked
c       table       integer   table of positions of menu items in the menu
c       mysegn      integer   my menu segment number
c       pos         integer   relative position in the menu of the color
c                             box to be highlighted
c       index       integer   8 long array to hold color indexes
c       found       logical   used in searching for color indexes to
c                             indicate when found
c
c
c   RESTRICTIONS:
c
c       Depending upon the code which surrounds the call to this routine,
c       it can be used to change the background color immediately (as the
c       color is selected) or to change the background color only upon
c       returning from this routine.
c
c   LOCATION:       YODA        /u1/a21/clj/colbak.f
c
c   PROGRAMMER   DATE OF LAST CHANGE       REASON FOR CHANGE
c      CLJ           11/21/83                initial entry
c      CLJ           12/12/83                real colors chosen
c      CLJ            1/23/84                change to common "scratr"
c      CLJ            2/03/84                automatic/delayed modes
c   David W. Swim    07/14/86                Fuss with prgm...
c   L McCleary       Jan 1988            bkgrd investigation - colbak
c
C-*-*-*-*-*-*-*-*-*-*-*-*-*-*-*-*-*-*-*-*-*-*-*-*-*-*-*-*-*-*-*-*-*-*-*-*-*|*-*-*-*-

      subroutine colbak

c     select a background color

      integer mysegn,ibuttn,ichoic
      integer pos,table(37),index(8)
      logical error,rflag,found
      common /b6/ qcrmnu
      integer qcrmnu
      common /commvp/ xllmvp,yllmvp,xurmvp,yurmvp
```

```
      common /scratr/ qbox,qbkgrd
      integer qbox,qbkgrd
      data table /0,0,0,0,0,0,1,1,1,0,2,2,2,0,3,3,3,0,4,4,4,0,
     +            5,5,5,0,6,6,6,0,7,7,7,0,8,8,8/
      data index /0,1,2,3,4,5,6,7/

      rflag = .false.

c --- "mysegn" is my menu segment number.  We will always be at
c --- the background  color menu (i.e. "qcrmnu = 29")

      mysegn = qcrmnu
      call jvport (xllmvp,xurmvp,yllmvp,yurmvp)
      call jwindo (0.,17.,1.,43.)

c --- Put up a message saying "Select color box.".
      call mesg (70)

c --- "qbkgrd" is the background color
c --- Highlight the current background color (i.e. draw a yellow box
c --- around the color).
c --- "pos" is the relative position in the menu of the current
c --- background color.  That is, if the color to be highlighted is
c --- the third one in the color index array, then "pos" is set to 3.
c --- NOTE: The 8 background color indexes are in the array "index".

      found = .false.
      pos = 0
   50 continue
      if (pos.lt.8) then
       if (found) go to 80
        pos = pos + 1
        if (qbkgrd.eq.index(pos)) then
          found = .true.
        endif
        go to 50
      endif
   80  continue

c --- The first parameter to the hilite routine is a toggle
c --- (.true. = highlight & .false. = remove highlight).
c --- The third parameter to the hilite routine is the box width.
c --- For the width parameter, 1 = whole, 2 = left quarter,
c --- 3 = right quarter, 4 = left half, & 5 = right half.
c --- The color boxes are given in the "left quarter" column.
c --- The fourth parameter is the length of the highlight table
c --- and the fifth parameter is the table itself.
      call hilite (.true.,pos,2,37,table)

  100 continue
         call mpick (ichoic,mysegn,ibuttn)
         call jvport (xllmvp,xurmvp,yllmvp,yurmvp)
         call jwindo (0.,17.,1.,43.)
c ------ The pickid of the color box selected is stored in "ichoic".
c ------ The pickids of the 8 color boxes range from 101 to 108.
         if (ichoic.gt.100) then
c --------- The relative "position" of the color box to be
c --------- blacked out is "pos" (i.e. we want
c --------- to remove the highlighting from the
c --------- former current color box)
            call hilite (.false.,pos,2,37,table)
c --------- The new "qbkgrd" must now be taken from the array of
c --------- background color indexes.  Subtracting 100 from "ichoic"
c --------- gives the position in the "index" array where the new
c --------- "qbkgrd" can be found.
            pos = ichoic - 100
c            qbkgrd = index(pos)
            if (found) qbkgrd = index(pos)
c --------- Hilite new backgrd color & set rflag for ret to call.
            call hilite (.true.,pos,2,37,table)
            rflag = .true.
         else
c --------- Check for function buttons.
            call check (ibuttn,mysegn,error,rflag)
```

```
          if(error) then
              call mesg(2)
              call paws
          endif
       endif
      if (.not.(rflag)) go to 100
      return
      end

C++++++++++++++++++++++++++++++++++++++++++++++++++++++++++++++++++++|+++++++
C UNIT NAME:                   COMMND
C
C FUNCTIONAL DESCRIPTION:       .
C
C CALLED BY:                   CHECK
C
C PROGRAMMER:                  DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*|*-*-*-*-

        subroutine commnd
c
c       this subroutine initiates the command function
c       called from menust
c
        call statec
c
        return
        end

C++++++++++++++++++++++++++++++++++++++++++++++++++++++++++++++++++++|+++++++
c  UNIT NAME:    COMVPT
c
c  Functional Description:
c       this subroutines sets the communications area viewport
c
c  Input Files/Parameters:
c       xllcvp,yllcvp                    The lower left X,Y point
c       xurcvp,yurcvp                    The upper right X,Y point
c
c  Output Files/Parameters:
c
c  Subroutines/Functions Called:
c       Note: Subroutines preceded by a "j" are explained in the DI-3000 manual.
c
c  Called By:                    CLRCOM, DRWAMP, MAKCOM, MESGJF
C                                PROMPT, SETFAD, TKINFO
c
c  Local Variables:             N/A
c
c  Restrictions:                N/A
c
c  Abnormal Return Conditions: N/A
c
c  Location:    /a21/dave
c
c  Programmer        Date of Last Change       Reason for Change
c
C-*-*-*-*-*-*-*-*-*-*-*-*-*-*-*-*-*-*-*-*-*-*-*-*-*-*-*-*-*-*-*-*-*-*|*-*-*-*-
c
        subroutine comvpt
c
c       this subroutines sets the communications area viewport
c
        common /comcvp/ xllcvp,yllcvp,xurcvp,yurcvp
c
        call jvport (xllcvp,xurcvp,yllcvp,yurcvp)
c
        return
        end

C++++++++++++++++++++++++++++++++++++++++++++++++++++++++++++++++++++|+++++++
```

```
c  UNIT NAME:  COMWIN
c
c  Functional Description:
c       this subroutines sets the communications area window
c
c  Input Files/Parameters:
C       qcxmn,qcymn                The communications min x,y point
c       qcxmx,qcymx                The communications max x,y point
c
c  Output Files/Parameters:
c
c  Subroutines/Functions Called:
c       Note: Subroutines preceded by a "j" are explained in the DI-3000 manual.
c
c  Called By:                 CLRCOM, DRWAMP, PROMPT, SETFAD, TKINFO
c
c  Local Variables:           N/A
c
c  Restrictions:              N/A
c
c  Abnormal Return Conditions: N/A
c
c  Location:   /a21/dave
c
c  Programmer      Date of Last Change       Reason for Change
c
C-*-*-*-*-*-*-*-*-*-*-*-*-*-*-*-*-*-*-*-*-*-*-*-*-*-*-*-*-*-*-*-*-*-*-*-*-*|*-*-*-*-
c
       subroutine comwin
c
c      this subroutines sets the communications area window
c
       common/comwdo/qcxmn,qcymn,qcxmx,qcymx
       real qcxmn,qcymn,qcxmx,qcymx
c
       call jwindo (qcxmn,qcxmx,qcymn,qcymx)
c
       return
       end


C+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                  CONVFAD
C
C FUNCTIONAL DESCRIPTION:
C
C CALLED BY:                  SETFAD
C
C PROGRAMMER:                 DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*|*-*-*-*-

      subroutine convfad(newfad,temptm,ilen,error)

      integer*4 colndx
      integer*4 error
      integer*4 hours
      integer*4 ilen
      integer*4 minute
      integer*4 MAXHRS
      integer*4 MAXMIN
      integer*4 temptm

      character   colon
      character*5 newfad
c
c
c     if a new fade time is input, reset fade dtg and fade index (tfaddx)
c
      if(ilen .gt. 0) then
c
c         read the new fade time.  If an error occurs, it is due to either
c         bad user input or a time out return from jkeybs.  In either case
c         we want to exit routine and pop back to menu controller.
```

```
c
          hours = 0
          minute = 0
          if (ilen .lt. 5) then
               colndx = index(newfad,':')
c
c***           pick up the what is hoped to be the correct meaning of the fade
c***
c***           if a colon is found, all to left of colon is hours, right is min.
c
               if (colndx .gt. 0) then
                    if (colndx-1 .ge. 1) then
                        read(newfad(1:colndx-1),10,err=100,end=35) hours
 10                     format(i2)
                    endif
                    read(newfad(colndx+1:ilen),10,err=100,end=35) minute
c
c***           if no colon, if len is 3, 1 slot for hours, 2 for minutes
c***                        if len is 2, 0 slots for hours, 2 for minutes
c***                        if len is 1, 0 slots for hours, 1 for minutes
c
               else if (ilen .eq. 3) then
                     read(newfad(1:1),10,err=100) hours
                     read(newfad(2:3),10,err=100) minute
               else if (ilen .eq. 2) then
                     hours = 0
                     read(newfad(1:2),10,err=100) minute
               else
                     hours = 0
                     read(newfad(1:1),10,err=100) minute
               endif
          else
               read(newfad,30,err=100,end=35) hours,colon,minute
 30            format(i2,a1,i2)
               if (colon .ne. ':') then
                   read(newfad,40,err=100) minute
 40                format(2x,i2)
               endif
          endif

 35       continue
c
c         if the 3rd character in the user input fade time is not a color
c         then assume that he forgot to put the colon between the hours
c         and minutes
c
c
c         check for maximum inputs exceeded, and adjust if necessary
c
          if (hours .gt. MAXHRS) then
                hours = MAXHRS
          endif
          if (minute .gt. MAXMIN) then
                minute = MAXMIN
          endif
          temptm = hours * 60 + minute
          goto 200
100       error = 1
          call mesg(1242)
          call paws
      else
          error = 1
          call mesg(1242)
          call paws
      endif
200   return
      end

C+*+*+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:                    CONVHW
c
c  Functional Description:        Utility subroutine to convert integer points
c                                 in hldf to real (x,y) points in the previous
c                                 window defined.
```

```
c
c  Input Files/Parameters:
c    intx       integer         array of x points
c    inty       integer         array of y points
c    num        integer         number of points in x and y array
c
c  Output Files/Parameters:
c    posx       real            array of x points
c    posy       real            array of y points
c
C CALLED BY:                    NO LONGER USED BY CARICATURE
c
c  Local Variables:
c
c  Restrictions: Previous window and viewport set should be the graphics
c                display area.
c
c  Subroutine/Functions Called: N/A
c
c  Abnormal Return Conditions: N/A
c
c Programmer: Brian A. Pelletier   (old algorithm version 12)
c             Dirk Butson
c
c This subroutine takes integer points (from hldf) and converts
c them to world coordinates relative to the window
c
c Should map position on screen to 00000-65535
c
C-*-*-*-*-*-*-*-*-*-*-*-*-*-*-*-*-*-*-*-*-*-*-*-*-*-*-*-*-*-*-*-*-*-*-*-*-*|*-*-*-*-

      subroutine convhw(intx,inty,posx,posy,num)

c ------ convert virtual integers to real position
      common/gphwdo/qgxmin,qgymin,qgxmax,qgymax
      real         qgxmin,qgymin,qgxmax,qgymax
c
      integer num
      integer intx(num),inty(num)
      real posx(num),posy(num)

c ----- map 00000-65535  ==> dimension of window

        do 10 i = 1,num
         posx(i) = qgxmin + intx(i)*(qgxmax-qgxmin)/65535
         posy(i) = qgymin + inty(i)*(qgymax-qgymin)/65535
 10     continue

      return
      end

C+*+*+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:                   CONVWH
c
c  Functional Description:      Utility subroutine to convert (x,y) points in
c                               the display area to hldf integer points in
c                               the range of 65535 X 65535.
c
c  Input Files/Parameters:
c    posx       real            array of x points
c    posy       real            array of y points
c    num        integer         number of points in x and y array
c
c  Output Files/Parameters:
c    intx       integer         array of x points
c    inty       integer         array of y points
c
c  Called By:                   INIONE, STORCL
c
c  Local Variables:
c
c  Restrictions: All points must be in graphics display area and will be
c                converted to last window coordinates and viewport set.
```

```
c
c  Subroutine/Functions Called: N/A
c
c  Abnormal Return Conditions: N/A
c
c Programmer: Brian A. Pelletier   (old algorithm version 12)
c             Dirk Butson
c
c This subroutine converts world x and y coordinates to integer
c virtuals 65535 X 65535.
c
C-*-*-*-*-*-*-*-*-*-*-*-*-*-*-*-*-*-*-*-*-*-*-*-*-*-*-*-*-*-*-*-*-*-*-*-*-*|*-*-*-*-

      subroutine convwh(posx,posy,intx,inty,num)

c ------ convert virtual integers to real position
      common/gphwdo/qgxmin,qgymin,qgxmax,qgymax
      real      qgxmin,qgymin,qgxmax,qgymax
c
      integer num
      integer intx(num),inty(num)
      real posx(num),posy(num)

c -----  map world coordinates ===> 00000-65535

        do 10 i = 1,num
         intx(i) = 65535 * (posx(i)-qgxmin) / (qgxmax-qgxmin)
         inty(i) = 65535 * (posy(i)-qgymin) / (qgymax-qgymin)
 10    continue

      return
      end

C+*+*+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:                           copyfl
c
c  Functional Description:  Copies contents of one file to another.
c
c  Input Files/Parameters:
c     Parameters:
c       Name    Type    Description
c       ----    ----    -----------
c       old     ch*50   Name of file to be copied from.
c       new     ch*50   Name of file to be copied to.
c       oldsta  ch*6    Indicates what to do with file copied from.
c
c  Output Files/Parameters:     N/A
c
c  Subroutines/Functions Called:
c       Name    Description
c       ----    -----------
c       mesg    Outputs message to commmunications area of the screen.
c       paws    Halts program to allow message to be viewed.
c
c  Called By:
c       Name    Description
c       ----    -----------
c       rename  Renames a file.
c
c
c  Local Variables:
c       Name    Type    Description
c       ----    ----    -----------
c       lunhld  integer Logical unit # to assign to file to be copied from.
c       lunbck  integer Logical unit # to assign to file to copy to.
c       dskerr  logical Flag to indicate that disk error has occured.
c       field1  ch*50   String var. for name field of current line of file.
c       field2  ch*60   String var. for description field of current file line.
c
c  Restrictions:                N/A
c
c  Abnormal Return Conditions:  N/A
c
```

```
c  Location:
c
c       Programmer      Date of Last Change     Reason for Change
c       ----------      -------------------     -----------------
c       sfw             8-Nov-1984              Restructuring and documentation.
c      L. McCleary      Jan 1988          fix VAX compile diag - copyfl
c                                         not used by Caricature-copyfl
c
C-*-*-*-*-*-*-*-*-*-*-*-*-*-*-*-*-*-*-*-*-*-*-*-*-*-*-*-*-*-*-*-*-*-*-*-*-*|*-*-*-*-

        subroutine copyfl(old, new, oldsta, ierr )

        integer ierr
        character *50 old, new, field1
        character *60 field2
        character *6 oldsta

        logical dskerr

        data lunhld,lunbck/18,16/

c       Set disk error flag to false.
        dskerr = .false.
        ierr = 0

c       Open old and new files. Jump to error handling section on disk
c       access error

        open (lunhld,file=old,status='old',err=200)
        rewind(lunhld)

        open (lunbck,file=new,status='new',err=300)
        rewind(lunbck)

c       Jump to read/write section.
        goto 10

c       Error on attempt to open existing file.
200     continue

c       "System error on attempt to open existing file.  Consult system
c        administrator.  Press any key to continue."
c         Write out error message and exit routine.
          call mesg(44)
          call paws
          dskerr = .true.

c         Output error message to program monitor window for system
c         adminsitrator to analyze.
          print*,'Disk access error in routine COPYIT.'
          print*,'Trying to open file ',old,' .'
          print*,'Logical unit number was ',lunhld,' .'
          print*,'IERROR number returned was ',ierror,' .'
          ierr =  1
          goto 100

c       Error on attempt to open new file.
300     continue

c       "System error on attempt to open new file.  Consult system
c        administrator.  Press any key to continue."
c         Write out error message and exit routine.
          call mesg(45)
          call paws
          dskerr = .true.

c         Output error message to program monitor window for system
c         adminsitrator to analyze.
          print*,'Disk access error in routine COPYIT.'
          print*,'Trying to open file ',new,' .'
          print*,'Logical unit number was ',lunbck,' .'
          print*,'IERROR number returned was ',ierror,' .'
          ierr = 1

          goto 100
```

```
c       Read/write section. Jump to routine exit if End Of File.
10      continue

           read(lunhld,50,end=100) field1, field2
           write(lunbck,50) field1, field2
50         format(A50, A60)

c       Reiterate if not End Of File.
        goto 10

100     continue

c       Close new file.
        close (lunbck)

c       Close old file. If parameter 'oldsta' = 'delete' then copy was a rename
c       so we delete the old file.
        if ( oldsta.eq.'delete'.and.(.not.( dskerr ))) then
           close( lunhld,status='DELETE' )
        else
           close( lunhld )
        endif


        return
        end


C+*+*+*+*+*+*+*+*+*+*+*+*+*+*+*+*+*+*+*+*+*+*+*+*+*+*+*+*+*+*+*+*+*+*+*+*|*+*+*-*+
c  UNIT NAME:                     creatm
c
c  Functional Description:
c       this subroutine displays a menu from a data file
c
c  Input Files/Parameters:
c
c  Output Files/Parameters: N/A
c
c  Subroutines/Functions Called:
c       Note: Subroutines preceded by a "j" are explained in the DI-3000 manual.
c
c  Called By:                     DRAWM, KEYS
c
c  Local Variables: N/A
c
c  Restrictions: N/A
c
c  Abnormal Return Conditions:  N/A
c
c  Location:      Apollo      /a21/dave
c
c  Programmer          Date of Last Change       Reason for Change
c  avw                 30 May 1985               Handle linestyle menu as
c                                                special case
c  L McCleary          Jan 1988                  sep amp & sys - creatm
c  S. Lamb             Feb 1988                  detec chg - creatm
c
C-*-*-*-*-*-*-*-*-*-*-*-*-*-*-*-*-*-*-*-*-*-*-*-*-*-*-*-*-*-*-*-*-*-*-*-*|*-*-*-*-
c
        subroutine creatm (menun,ierror)
c
c       this subroutine displays a menu from a data file
c
        common /commen/xllmen,yllmen,xurmen,yurmen,ibcmen,iocmen,incmen
        character*40 textst
        character*50 filenm
        character*30 fname
        character*50 menpth
        common /menpth/ menpth
        common /lenmen/ lenmen
        logical opensg
        character cchar
        character*80 msg
        character*26 flettr
```

```
        data flettr /'abcdefghijklmnopqrstuvwxyz'/
c       numinc is range of menu numbers in each file
c       maxnum is number of menu files
        data numinc,maxnum /25,15/
        data lunmen/9/
        data fname/'file'/,lname/4/

        call seticn(xconv,yconv)
c       print*,'creatm -- enter ',menun
        opensg = .false.
        ierror = 0
        indlet = menun / numinc + 1
        if (indlet.lt.1) indlet = 1
        if (indlet.gt.maxnum) indlet = maxnum
        filenm = menpth(1:lenmen) // fname(1:lname) //
     +  flettr(indlet:indlet) // '.men'
        lennam = lenmen + lname + 5
c       print*,'  before open ',filenm(1:lennam)
        call openit(filenm,lennam,lunmen,0,ierror)
        if (ierror.ne.0) go to 191
        call jdvisb (1)
        call jropen (menun)
        call xcolor (iocmen)
        call xpidex (ibcmen,0)
        call jpintr (1)
c        call jrect (xllmen,yllmen,xurmen,yurmen)
        opensg = .true.
        call jjust (1,1)
C        call xsize (1.1,1.1)
Cc        call xsize (.75,1.)
        call xsize (.75,1.)
c       loop until the correct menu records are located
  100   continue
            read (lunmen,10110,end=193,err=192) cchar,msg
10110       format (a1,a80)
c           print*,'line read - cchar: ',cchar,msg
c           *** skip comment lines
            if (cchar.eq.'C'.or.cchar.eq.'c') go to 100
            if (cchar.eq.'M'.or.cchar.eq.'m') then
                read (msg,1150,end=193,err=192) msgnum
 1150           format (i5)
                if (msgnum.eq.menun) go to 115
            endif
        go to 100
  115   continue
c       print*,'menu found ',menun
        i=0
c       loop until no more data lines (blank first char)
  120   continue
            read (lunmen,10110,end=130,err=192) cchar,msg
c           *** skip comment lines
            if (cchar.eq.'C'.or.cchar.eq.'c')
     +      go to 120
            if (cchar.eq.' ') then
                read (msg,10120,err=192) idpick,icolor,
     +          icol2,itype,row,col,scalef,len,textst
10120           format (4i4,3f7.0,i4,2x,a40)
c               print*,'creatm -- ',idpick,icolor,icol2,itype,row,
c    +          col,scalef,len,textst(1:14),yrow
                call fudgex (col)
                call jpkid (idpick)
                yrow = yurmen - row
                if (itype.eq.1) then
                    call xcolor (icolor)
                    call jmove (col,yrow)
                    call mytext (len,textst)
c ------------- for color menus (21-29), call specialized routine
c ------------- 'dricon' to draw color boxes
                elseif ((menun .gt. 20) .and. (menun .lt. 30)) then
                    call xcolor (icolor)

                    call jmove (col,yrow)
                    call dricon (len,textst,icol2,scalef)
c ------------- for linestyle menu (186), call specialized routine
c ------------- 'drlnmn' to draw actual linestyles
```

```
                else
     +          if (menun .eq. 186) then
                    call xcolor (icolor)
                    call jmove (col, yrow)
                    call drlnmn (icol2)
                elseif (itype.eq.2) then
                    scalex=(scalef * xconv)
                    scaley=(scalef * yconv)
                    call ascint(textst(1:len),icon,len,ierror)
c        print*,'before geticn scalex =',scalex,'scaley=',scaley
                    call geticn(icolor,icol2,scalex,scaley,col,yrow,
     +                          icon,2,0.0)
c        print*,'after geticn textst(1:len)=',textst(1:len)

                else
                    print*,'Creatm -- Unknown menu item type',itype
                endif
            else
                go to 130
            endif
        go to 120
  130   continue
        go to 200
  190       continue
            print*,' Menu number conversion error ',menun
            ierror = 211
            go to 200
  191       continue
            print*,' Couldn''t open file ',filenm
            ierror = 212
            go to 200
  192       continue
            print*,' Error in menu file read ',filenm
            ierror = 213
            go to 200
  193       continue
            print*,' Premature end of menu file ',filenm,menun
            ierror = 214
            go to 200
  200   continue
c        if (opensg) call jrclos
        if (opensg)  then
           call jrclos
           call jdetec(menun, 1)
        endif
        call closit (lunmen)
c
c       print*,'MENU -- exit'
c
        return
        end
C+*+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:                    crmesg
c
c  Functional Description:
c       create message retained segment from message file
c
c  Input Files/Parameters:
c
c  Output Files/Parameters: N/A
c
c  Subroutines/Functions Called:
c       Note: Subroutines preceded by a "j" are explained in the DI-3000 manual.
c
c  Called By:                    MESG
c
c  Local Variables: N/A
c
c  Restrictions: N/A
c
c  Abnormal Return Conditions:  N/A
c
c  Location:      Apollo       /a21/dave
c
```

```
c  Programmer         Date of Last Change       Reason for Change
c  L. McCleary        Jan 1988                  sep amp & sys - crmesg
c
C-*-*-*-*-*-*-*-*-*-*-*-*-*-*-*-*-*-*-*-*-*-*-*-*-*-*-*-*-*-*-*-*-*-*-*-*-*-*-*|*-*-*-*-

        subroutine crmesg(msgno)
c
c       create message retained segment from message file
c
        logical needmv

        character*50 menpth
        common /menpth/ menpth
        common /lenmen/ lenmen
        common/comwdo/qcxmn,qcymn,qcxmx,qcymx
        real qcxmn,qcymn,qcxmx,qcymx
        common /arsegs/ nsgmen,nsggra,nsgsys,nsgmsg,nsgmap,nsgful
        common /comsys/xllsys,yllsys,xursys,yursys,ibcsys,iocsys,incsys
        character cchar
        common /msgoff/ msgoff
        logical aed
        common /aeddbc/ aed
        character *80 msg
        integer msgno,lenmsg
        character*80 filenm
        character*30 fname
        character*26 flettr
        data flettr /'abcdefghijklmnopqrstuvwxyz'/
c       numinc is range of message numbers in each file
c       maxnum is number of message files
        data numinc,maxnum /50,26/
        data fname/'file'/,lname/4/
        data icolcm/16/
        data ifl/9/
c
C        PRINT *,'CRMESG ---ENTER',MSGNO
clj ------- "needmv" (need move) is set to true if a
clj ------- message really is being displayed.
            needmv = .false.

c           set file name default depending on system

            filenm = ' '

            call jdvisb (1)
            call clrcom
            call jwindo(qcxmn,qcxmx,qcymn,qcymx)
            call jropen (msgno + msgoff)
            call xcolor (iocsys)
            call xpidex (ibcsys,0)
            call jpintr (1)
            call jrect (qcxmn,qcymn,qcxmx,qcymx)
            call jjust (1,1)
            call xsize (1.,1.)
            call xcolor (icolcm)
c
            indlet = msgno / numinc + 1
            if (indlet.lt.1) indlet = 1
            if (indlet.gt.maxnum) indlet = maxnum
            filenm = menpth(1:lenmen) // fname(1:lname) //
     +      flettr(indlet:indlet) // '.msg'
            lennam = lenmen + lname + 5
            call openit(filenm,lennam,ifl,0,ierror)
            if (ierror.ne.0) go to 181
c           Loop though message file looking for message
  100       continue
                read (ifl,1100,end=183,err=182) cchar,msg
 1100           format (a1,a80)
c               print*,'line read - cchar: ',cchar,msg
c               *** skip comment lines
                if (cchar.eq.'C'.or.cchar.eq.'c') go to 100
                if (cchar.eq.'M'.or.cchar.eq.'m') then
                    read (msg,1150,end=183,err=182) msgnum
 1150               format (i5)
```

```
                  if (msgnum.eq.msgno) then
                      i=0
c                     loop until no more data lines (blank first char)
  120                 continue
                          read (ifl,1100,end=183,err=182) cchar,msg
c                         *** skip comment lines
                          if (cchar.eq.'C'.or.cchar.eq.'c')
     +                    go to 120
                          if (cchar.eq.'m'.or.cchar.eq.'M') go to 130
                          call length (msg,80,lenmsg)
                          i = i + 1
                          if (lenmsg.gt.0) then
                              call displ(msg, lenmsg, i)
clj ---------------------------- "needmv" (need move) means that we
clj ---------------------------- must move to the lower right corner
clj ---------------------------- of the communications area.
                              needmv = .true.
                          endif
                      go to 120
  130                 continue

clj -------------------- The following if-then was added so that the whole
clj -------------------- communication area is cleared out after displaying
clj -------------------- a message.  This was needed to eliminate typed-in
clj -------------------- text which used to hang around too long.
                      if (needmv) then
                         call jmove(qcxmx - 1.,qcymn + 1.)
                         call j1strg(' ')
                         needmv = .false.
                      endif

c                     position after last line for prompt subroutine
c                      ypos = qcymx - i - 1.3
                      ypos = qcymx - i - 1.0
                      if (ypos.lt.qcymn) ypos = qcymn
                      call jconwv(qcxmn+1.,ypos,z,vx,vy)
c                     added by gre to take into account problems with AED's
                      if (aed) call jmove(qcxmn+1,ypos)
                      call jpecho(1,4,1,vx,vy)
c                     exit after message found
                      go to 180
                  endif
              endif
          go to 100
  180     continue
          go to 190
  181     continue
              print*,'open error on message file ',msgno,ierror
              call jmove(qcxmn+1.,qcymx-1.)
              call j1strg('open error on message file - '//
     +                    'press any key to continue')
              go to 190
  182     continue
              print*,'read error on message file ',msgno
              go to 190
  183     continue
              print*,'end of file - message not found :',msgno
              call jmove(qcxmn+1.,qcymx-1.)
              call j1strg('message not found - '//
     +                    'press any key to continue')
  190     continue
          call jrclos
          call closit (ifl)
c
      return
      end


C+*+*+*+*+*+*+*+*+*+*+*+*+*+*+*+*+*+*+*+*+*+*+*+*+*+*+*+*+*+*+*+*+*+*+*+*+|*+*+*+*+
C UNIT NAME:                  CURBOX
C
C FUNCTIONAL DESCRIPTION:
C
C CALLED BY:                  PLTDAT
```

```
C
C PROGRAMMER:                    DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*-*-*|*-*-*-*-

        subroutine curbox(lat,lon,posit,exist,timbuf)

c this routine draws a box aroud the most recent position
c for a given track.  (programmer: jit)

        logical exist
        character ewi
        character nsi
        character*7 lat
        character*8 lon
        character*9 timbuf
        integer posit
        integer segnum
        integer*4 exlat
        integer*4 exlon
        integer trkcol
        real dx
        real dy
        real plat
        real plon
        real x
        real y

c posit- element position of track in actmrk table
c trklst- list of all current track numbers in the system
c mrkcnt- count of number of tracks in the system currently.
c actmrk- list of markers that are currently active on the system.
c exist- logical value is true if track previously existed,
c        and false if it is a new track.

        character*2 actmrk(260)
        integer mrkcnt
        integer trklst(260)
        integer curseg(260)
        character*9 boxdtg(260)
        logical boxvis(260)
        common /actmrk/ trklst,mrkcnt,actmrk,curseg,
     +                  boxdtg,boxvis

        data trkcol /224/

c         seperate lat/lon from nsi/ewi indicators

          read(lat,10) exlat,nsi
 10       format(i6,a1)
          read(lon,20) exlon,ewi
 20       format(i7,a1)
          call lltor(exlat,exlon,nsi,ewi,plat,plon)

c***        if dtg from this plot is greater than plot that
c***        is currently plotted for that track, erase
c***        current box and draw new box.

c jit          print *, 'timbuf is ', timbuf
c jit          print *, 'boxdtg(posit) is ', boxdtg(posit)

          if (timbuf .ge. boxdtg(posit)) then

             if (.not.exist) then
               boxvis(posit) = .true.
               call getseg(segnum)
               curseg(posit) = segnum
             else
               segnum = curseg(posit)
               call jpurge(segnum)
               boxvis(posit) = .true.
             endif
c
c   only draw the box if that segment is visible at
```

```
c   the current time.
c
         if (boxvis(posit)) then
            call jropen(segnum)
            call lltoxy(plat,plon,x,y)
            call jmove(x,y)
            call jrmove(-4.,-3.)
            dx = 8.
            dy = 9.
            call jpintr(0)
            call xcolor(trkcol)
            call jrrect(dx,dy)
            call jrclos
         endif

      endif


      return
      end


C+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                      CVITOC
C
C FUNCTIONAL DESCRIPTION:         .
C
C CALLED BY:                      SETFAD
C
C PROGRAMMER:                     DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*|*-*-*-*-
      subroutine cvitoc(ival,cstr)

c       convert integer value to character string
c       char_str must be sufficiently long to hold the integer value

        character*(*) cstr

        integer digits
        integer i
        integer itmp1
        integer itmp2
        integer ival
        integer lngth

        lngth = len(cstr)
        cstr = '00000'
        itmp1 = ival

        digits = 1
        if (ival .gt. 9) digits = 2
        if (ival .gt. 99) digits = 3
        if (ival .gt. 999) digits = 4
        if (ival .gt. 9999) digits = 5

        if (digits .eq. 1) then
           cstr(lngth:lngth) = char(ival+48)
           return
        else
           if (lngth .lt. digits) then
              digits = lngth
           end if
           itmp2 = itmp1
           do 100 i = 1, digits
              itmp2 = itmp1 / 10
              cstr(lngth-i+1:lngth-i+1) = char(itmp1 - itmp2 * 10
     +              + 48)
              itmp1 = itmp2
100        continue
        end if

        return
        end
```

```
C++++++++++++++++++++++++++++++++++++++++++++++++++++++++++++++++++|+++++++
C UNIT NAME:                    ADDOPN
C
C FUNCTIONAL DESCRIPTION:       .
c -   Description: open up the change file
C
C CALLED BY:                    OPENIN
C
C PROGRAMMER:                   DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*|*-*-*-*-
c
      SUBROUTINE addopn(cnamel,cname,ios)

      INTEGER    sunit,lunit,punit
      PARAMETER (punit = 67)
      PARAMETER (lunit = 68)
      PARAMETER (sunit = 69)

      LOGICAL          filply,opnply
      COMMON /polycb/ filply,opnply

      INTEGER   cnamel
      CHARACTER*(*) cname
      CHARACTER*100 datafi,indexf,lindex

      INTEGER    ios

      INTEGER nlinde,lenlin
      COMMON /LWDBII/ NLINDE,LENLIN,icntli
      INTEGER nindex,lenind
      COMMON /IWDBII/ NINDEX,LENIND
      INTEGER ndatar,lendat
      COMMON /DWDBII/ NDATAR,LENDAT
      integer lenmap
      common /lenmap/lenmap


      IF (lenmap.GT.0) THEN
         datafi = cname(1:cnamel - 1) // 'p.da3'
         indexf = cname(1:cnamel - 1) // 'p.in3'
         lindex = cname(1:cnamel - 1) // 'p.li3'
      ENDIF
C
C       VAX OPEN STATEMENTS
c
c      OPEN(UNIT=punit,FILE=datafi,FORM='unformatted',STATUS='old',
c     +     RECORDTYPE='fixed',RECL=lendat*ndatar,
c     +     ORGANIZATION='sequential',ACCESS='direct',
c     +     ERR=190,IOSTAT=ios,READONLY)
c      OPEN(UNIT=lunit,FILE=indexf,FORM='unformatted',STATUS='old',
c     +     RECORDTYPE='fixed',RECL=lenind*nindex/2,
c     +     ORGANIZATION='sequential',ACCESS='direct',
c     +     ERR=190,IOSTAT=ios,READONLY)
c      OPEN(UNIT=sunit,FILE=lindex,FORM='unformatted',STATUS='old',
c     +     RECORDTYPE='fixed',RECL=lenlin*nlinde/2,
c     +    ORGANIZATION='sequential',ACCESS='direct',
c     +     ERR=190,IOSTAT=ios,READONLY)

c
c         Apollo open statements
c
      OPEN(UNIT=punit,FILE=datafi,FORM='UNFORMATTED',
     +     STATUS='OLD',RECL=lendat*ndatar*4,
     +     ACCESS='DIRECT',
     +     ERR=190,IOSTAT=ios)
      OPEN(UNIT=lunit,FILE=indexf,FORM='UNFORMATTED',
     +     STATUS='OLD',RECL=lenind*nindex*2,
     +     ACCESS='DIRECT',
     +     ERR=190,IOSTAT=ios)
      OPEN(UNIT=sunit,FILE=lindex,FORM='UNFORMATTED',
     +     STATUS='OLD',RECL=lenlin*nlinde*2,
     +     ACCESS='DIRECT',
     +     ERR=190,IOSTAT=ios)
```

```
      opnply = .TRUE.
      RETURN
  190 CONTINUE
      opnply = .FALSE.
C      if (index(idebug,'polygon').ne.0)
C     +  PRINT *,'Polygon Fill not available for resolution ... ',
C     +           cname(cnamel:cnamel),ios


      RETURN
      END


C+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                     CHEKML
C
C FUNCTIONAL DESCRIPTION:        .
C
C CALLED BY:                     INMAIL, OPMAIL
C
C PROGRAMMER:                    DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*|*-*-*-*-

      subroutine chekml(respon)
c
c this subroutine gets a record from the mailbox and copies it into a ch. string
c

      return
      end


C+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:                    chint
c
c  Functional Description:
c       this subroutine checks whether a key has been pressed on the keyboard
c       If it has, an interrupt flag is set and the
c       key is returned
c
c  Input Files/Parameters:
c
c  Output Files/Parameters: N/A
c
c  Subroutines/Functions Called:
c      Note: Subroutines preceded by a "j" are explained in the DI-3000 manual.
c
c  Called By:                    DMAPII, FILLIT, LLGRID, PLTCIT,
C                                PLTNAM, PROCOV
c
c  Local Variables: N/A
c
c  Restrictions: N/A
c
c  Abnormal Return Conditions:  N/A
c
c  Location:     /gl
c
c  Programmer        Date of Last Change      Reason for Change
c
c  Ed Swing              05/20/1987           fix for OS 9.5
c
C-*-*-*-*-*-*-*-*-*-*-*-*-*-*-*-*-*-*-*-*-*-*-*-*-*-*-*-*-*-*-*-*-*-*-*|*-*-*-*-
c
        subroutine chint (interr,key)
c
c       this subroutine checks whether a key has been pressed on the keyboard
c       If it has, an interrupt flag is set and the
c       key is returned
c
c       this is an Apollo specific subroutine, a similiar subroutine must
c       be written for other systems
c
```

```
c       Apollo Operating System 9.5 required we use a gpr call instead
c       of a smd call.
c
        logical interr
        character*1 key
        integer qdsdev,qpydev,qecho,qlecho
        common /device/ qdsdev,qpydev,qecho,qlecho
c
        call jchint(qpydev,interr)

        return
        end


C+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                       CHKDAT
C
C FUNCTIONAL DESCRIPTION:          .
C
C CALLED BY:                       DATPOL
C
C PROGRAMMER:                      DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*|*-*-*-*-

      subroutine chkdat(datain, newdat)
c
c  check for data on the line to be read by mapgrf for traking
c

      character*160 datain
      logical newdat

           newdat = .false.

           return
           end


C+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                       EXECOM
C
C FUNCTIONAL DESCRIPTION:          EXECUTES A DM COMMND
C
C INPUT FILES/PARAMETERS:
C
C    VARIABLE            TYPE         DESCRIPTION
C
C     COMMND           CHAR*(*)     DISPLAY MANAGER COMMND TO EXECUTE
C     ERRFIL            CHAR*(*)     FILE TO DISPLAY ERROR MESSAGES
C     STDFIL            CHAR*(*)     FILE TO DISPLAY STANDARD MESSAGES
C     FILE              CHAR*(*)     FILE TO PUT COMMND IN TO BE EXECUTED
C     STREAM_$STDIN     INTEGER      STANDARD INPUT STREAM ID
C
C OUTPUT FILES/PARAMETERS:         NONE
C
C SUBROUTINES/FUNCTIONS CALLED
C
C     PAD_$XX             APOLLO SUBROUTINE
C     ERROR_SUB           PRINTS ERROR STATUS
C
C CALLED BY:                     PRINTR
C
C LOCAL VARIABLES:
C
C    VARIABLE              TYPE       DESCRIPTION
C
C    BUFFER              CHAR*128     HOLDS THE PRINT COMMND
C    CMDNAM              CHAR*128     HOLDS THE DM COMMND
C    FORM                CHAR*3       CHARACTER REPRESENTATION OF LENGTH
C                                     OF BUFFER COMMND
C    FULFRM              CHAR*6       FORMAT USED TO WRITE COMMND TO
C                                     FILE
C    MAXCOM              INTEGER      MAX LENGTH OF COMMND LINE
C    LENBUF              INTEGER      ACTUAL LENGTH OF BUFFER LINE
```

```
C    LENCMD              INTEGER      LENGTH OF DM COMMND
C    LUNAME              INTEGER      LOGICAL UNIT NUMBER
C    STATUS              INTEGER*4    RETURNS STATUS CODE OF GMF CALL
C
C RESTRICTIONS:          APOLLO  DEPENDENT SUBROUTINE
C
C
C ABNORMAL RETURN CONDITIONS:   N/A
C
C
C PROGRAMMER:                   DATE OF LAST CHANGE     REASON FOR CHANGE
C
C     DIRK BUTSON
C
C-*-*-*-*-*-*-*-*-*-*-*-*-*-*-*-*-*-*-*-*-*-*-*-*-*-*-*-*-*-*-*-*-*-*-*-*-*-*-*|*-*-*-*-
C
      SUBROUTINE EXECOM(COMMND,FILNAM,OPTIONS
     +                 ,ERRFIL,STDFIL,FILNM)
C
C EXECUTES A DM COMMND (EX. PRFC, PRF, OR DATE)
C

      CHARACTER*(*) COMMND
      CHARACTER*(*) FILNAM
      CHARACTER*(*) OPTIONS
      CHARACTER*(*) ERRFIL
      CHARACTER*(*) STDFIL
      CHARACTER*(*) FILNM
      INTEGER*2 MAXCOM, LUNAME

      DATA MAXCOM /256/
      DATA MAXBUF /256/
      DATA LUNAME /20/


200   CONTINUE
      RETURN
      END


C+*+*+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    GETARG
C
C FUNCTIONAL DESCRIPTION:       .
C
C CALLED BY:                    GETFNM
C
C PROGRAMMER:                   DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*-*-*|*-*-*-*-

        subroutine getarg (lenarg,argume)

c       get a file name from the command line (or default) for read_keys

        character*80 argume,argument
        data argument/'                                                    '/

        lenarg = 0

        return
        end


C+*+*+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    GETTIM
C
C FUNCTIONAL DESCRIPTION:       .
C
C CALLED BY:                    DIFTIM, FADCHG
C
C PROGRAMMER:                   DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*-*-*|*-*-*-*-
```

```
      subroutine gettim(newtim)

c     this subroutine gets local time and puts it in a yyddmmhhmmss format

      integer*2  newtim(6)


      return
      end

C+*+*+*+*+*+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                       GMCIRC
C
C FUNCTIONAL DESCRIPTION:          .
C
C CALLED BY:
C
C PROGRAMMER:                      DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*-*-*-*-*-*|*-*-*-*-

        subroutine gmcirc (x,y,radius)

c       write graphics metafile circle

        logical gmactv
        common /gmactv/ gmactv
        logical fill
        data fill/.false./


        return
        end

C+*+*+*+*+*+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                       GMCLOS
C
C FUNCTIONAL DESCRIPTION:          .
C
C CALLED BY:
C
C PROGRAMMER:                      DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*-*-*-*-*-*|*-*-*-*-

        subroutine gmclos

c       close graphics metafile

        integer*4 npoly,maxpnt,nptot
        common /gmstat/ npoly,maxpnt,nptot
        character*72 line
        data line/'Metafile number of output lines is      '/

        return
        end

C+*+*+*+*+*+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                       GMOPEN
C
C FUNCTIONAL DESCRIPTION:          .
C
C CALLED BY:
C
C PROGRAMMER:                      DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*-*-*-*-*-*|*-*-*-*-

        subroutine gmopen (filen,len,ierror)

c       Open Graphics Metafile Resource metafile
```

```
        return
        end

C+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    GMPOLY
C
C FUNCTIONAL DESCRIPTION:       .
C
C CALLED BY:
C
C PROGRAMMER:                   DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*|*-*-*-*-

        subroutine gmpoly (x,y,n)

c       write graphics metafile polyline
        common /gmpos/ gmxpos,gmypos
        return
        end

C+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    INIGM
C
C FUNCTIONAL DESCRIPTION:       .
C
C CALLED BY:                    FMAIN
C
C PROGRAMMER:                   DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*|*-*-*-*-

        subroutine inigm

c       initializat graphics metafile resource

        return
        end

C+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    INITBW
C
C FUNCTIONAL DESCRIPTION:       INITIALIZES THE LINE PRINTER
C                               FOR HARDCOPY PRINT OF B/W SCREEN
C
C INPUT FILES/PARAMETERS:
C                       SIZEX,SIZEY,NOPLNE,FILE)
C  SIZEX             INTEGER*2   SIZE OF SCREEN IN X-DIRECTION (PIXELS)
C  SIZEY             INTEGER*2   SIZE OF SCREEN IN Y-DIRECTION (PIXELS)
C  FILNM              CHAR*(*)

C OUTPUT FILES/PARAMETERS:      NONE
C
C SUBROUTINES/FUNCTIONS CALLED
C
C     GMF_$XX           APOLLO GRAPHIC METAFILE SUBROUTINES
C     ERROR_SUB         PRINTS ERROR STATUS
C
C CALLED BY:                  PRINTR
C
C LOCAL VARIABLES:
C
C    VARIABLE              TYPE      DESCRIPTION
C
C    LNWID              INTEGER      OFFSET BETWEEN ROWS OF BITMAP
C    MSTRID             INTEGER      NAME OF BITMAP PICTURE IS BEING COPIED TO
C    MAPDSC             INTEGER*4    NAME OF BITMAP CONTAINING PICTURE
C    SIZE               INTEGER(2)   SIZE OF SCREEN IN PIXELS
C    STATUS             INTEGER*4    RETURNS STATUS CODE OF GMF CALL
C    STRPTR             INTEGER*4    BEGINNING LOCATION OF PICTURE
```

```
C
C RESTRICTIONS:          APOLLO  DEPENDENT SUBROUTINE
C
C
C ABNORMAL RETURN CONDITIONS:   N/A
C
C
C PROGRAMMER:                     DATE OF LAST CHANGE     REASON FOR CHANGE
C
C     DANATION                                             NSAGRF
C     DABUTSON                         12/12/84            IMPLEMENTED IN
C                                                          A21PROTOTYPE
C
C-*-*-*-*-*-*-*-*-*-*-*-*-*-*-*-*-*-*-*-*-*-*-*-*-*-*-*-*-*-*-*-*-*-*-*-*-*-*|*-*-*-*-
C
      SUBROUTINE INITBW(SIZEX,SIZEY,FILNM)
C
C THIS SUBROUTINE INITIALIZES THE LINE PRINTER FOR HARDCOPY PRINT OF SCREEN
C
      RETURN
      END


C++++++++++++++++++++++++++++++++++++++++++++++++++++++++++++++++++++++++|+++++++
C UNIT NAME:                     INTCOL
C
C FUNCTIONAL DESCRIPTION:        COPIES N PLANES OF SCREEN
C                                INTO A SUPPLIED FILE
C
C INPUT FILES/PARAMETERS:
C
C  SIZEX        LENGTH OF PICTURE IN PIXELS
C  SIZEY        HEIGHT OF PICTURE IN PIXELS
C  NOPLNE       NUMBER OF PLANES TO STORE IN BITMAP FILE
C  FILNM         PATHNAME OF BITMAP FILE TO BE STORED
C
C OUTPUT FILES/PARAMETERS:       NONE
C
C SUBROUTINES/FUNCTIONS CALLED
C
C    GPR_$XXXX      APOLLO GRAPHIC PRIMITIVE SUBROUTINES
C    ERROR_$XX      APOLLO ERROR SUBROUTINES
C
C CALLED BY:
C
C    APOLLO         DETERMINES TYPE OF APOLLO DISPLAY
C
C LOCAL VARIABLES:
C
C    STATUS    INT4        STATUS OF LAST APOLLO SUBROUTINE CALL
C    MAPDSC    INT4        DISPLAY BITMAP
C    SIZE      INT2(2)     DIMENSIONS OF DISPLAY BITMAP IN PIXELS
C    VRSION    INT2(2)     NEEDED ARRAY FOR APOLLO CALL
C    WINDOW    INT2(2)     DESIRED WINDOW SIZE OF DISPLAY BITMAP TO STORE
C    SCREEN    INT2(2,2)   DESIRED WINDOW COORDINATES
C    START     INT2(2)     UPPER RIGHT CORNER OF WINDOW
C    HDRS      INT4(4)     NEEDED VARIABLE FOR APOLLO CALL
C    ATRIBS    INT4        ATTRIBUTES OF CURRENT BITMAP
C    FILEBM    INT4        BITMAP FILE INDENTIFIER
C    CREATD    LOGICAL     FLAG TO FILE WAS OPENED O'KAY
C
C RESTRICTIONS:          APOLLO  DEPENDENT SUBROUTINE
C
C
C ABNORMAL RETURN CONDITIONS:   N/A
C
C
C PROGRAMMER:                     DATE OF LAST CHANGE     REASON FOR CHANGE
C
C    DABUTSON                          12/12/84             IMPLEMENTED IN
C                                                           A21PROTOTYPE
C
C    G. N. LEO                         24 JUN '85           TO UNLOCK BITMAP
C                                                           SO THAT IT WILL
```

```
C                                                                  PRINT WITHOUT
C                                                                  HAVING TO EXIT
C                                                                  CELEBRATION.
C
C-*-*-*-*-*-*-*-*-*-*-*-*-*-*-*-*-*-*-*-*-*-*-*-*-*-*-*-*-*-*-*-*-*-*-*-*-*-*-*|*-*-*-*-
C
      SUBROUTINE INTCOL(SIZEX,SIZEY,NOPLNE,FILNM)
C
C INITIALIZES THE LINE PRINTER FOR HARDCOPY PRINT OF COLOR NODE
C
      RETURN
      END


C++++++++++++++++++++++++++++++++++++++++++++++++++++++++++++++++++++++++++|+++++++
C UNIT NAME:                     KPAUSE
C
C FUNCTIONAL DESCRIPTION:        .
C
C CALLED BY:                     BUTTN, CLENUP, INIGRA, KEYBD, KEYBS
C                                LOCAT, PICK
C
C PROGRAMMER:        .           DATE OF LAST CHANGE    REASON FOR CHANGE
C
C-*-*-*-*-*-*-*-*-*-*-*-*-*-*-*-*-*-*-*-*-*-*-*-*-*-*-*-*-*-*-*-*-*-*-*-*-*-*-*|*-*-*-*-

        subroutine kpause (eofkey)

c       pause during save_keys file playback and potentially read a key
c       this routine is very Apollo dependent, a user on another
c       hardware type may have to rework this logic
c       however, it should compile the way that it is
c
c       Change to gpr call for keyboard input due to 9.5 Operating system


        return
        end
C++++++++++++++++++++++++++++++++++++++++++++++++++++++++++++++++++++++++++|+++++++
C UNIT NAME: OPENIN
C
C FUNCTIONAL DESCRIPTION:  OPENS WDBII DATA FILES.
C
C INPUT FILES/PARAMETERS:
C
C        LUNDAT              INTEGER     LOGICAL UNIT NUMBER FOR WDBII DATA
C                                        FILE.
C        LUNIND              INTEGER     LOGICAL UNIT NUMBER FOR WDBII INDE
C                                        FILE.
C        LUNLIN              INTEGER     LOGICAL UNIT NUMBER FOR WDBII LINE
C                                        INDEX FILE.
C        NAML                INTEGER     LENGTH OF WDBII DEFAULT FILE.
C        INB                 CHAR*6      WDBII DEFAULT FILE.
C
C GLOBAL VARIABLES :
C
C        ISECS               INTEGER*4   SECONDS IN 180 MINUTES.
C        IMINS               INTEGER     MINUTES IN 180 DEGREES.
C        C                   REAL        CONVERTS MINUTES TO RADIANS.
C        CS                  REAL        CONVERTS SECONDS TO RADIANS.
C        ICNTLI              INTEGER     CURRENT LINE INDEX RECORD.
C
C OUTPUT FILES/PARAMETERS:  NONE.
C
C SUBROUTINES/FUNCTIONS CALLED : NONE.
C
C CALLED BY: CHAWDB.
C
C LOCAL VARIABLES:
C
C        DATAFI              CHAR*30     WDBII DAT FILE NAME.
C        INDEXF              CHAR*30     WDBII INDEX FILE NAME.
C        LINDEX              CHAR*30     WDBII LINE INDEX FILE NAME.
C
```

```
C RESTRICTIONS: NONE.
C
C ABNORMAL RETURN CONDITIONS:   NONE.
C
C LOCATION:                     /a21/gjf/L3REA.FTN
C
C PROGRAMMER:                   DATE OF LAST CHANGE     REASON FOR CHANGE
C
C     DAVE NATION
C     JERRY FENERTY                                     ORIGINAL CODE.
C                                                       DOCUMENTATION AND MO
C     DANIEL BERKICH (SAIC) NOSC                        FOR A21 PROTOTYPE.
C                                                       Read both forms of
C                                                       Data base.
C-*-*-*-*-*-*-*-*-*-*-*-*-*-*-*-*-*-*-*-*-*-*-*-*-*-*-*-*-*-*-*-*-*-*-*|*-*-*-*-

      SUBROUTINE openin(lundat,lunind,lunlin,naml,inb,ios)
      INTEGER   nlinde,lenlin,icntli
      COMMON    /lwdbii/ nlinde,lenlin,icntli
      INTEGER   nindex,lenind
      COMMON    /iwdbii/ nindex,lenind
      INTEGER   ndatar,lendat
      COMMON    /dwdbii/ ndatar,lendat
      INTEGER   isecs,imins
      REAL      c,cs
      COMMON    /c/ c,isecs,cs,imins
      INTEGER   lundat,lunind,lunlin,naml,ios
      CHARACTER inb*(*)
      INTEGER   csblk,clblk,cpblk
      LOGICAL   va
      common /inopen/ csblk,clblk,cpblk,va
      INTEGER*2 i2(2)
      INTEGER   i4
      EQUIVALENCE (i2,i4)
      INTEGER    two8
      PARAMETER (two8 = 2**8)

      LOGICAL   filply,opnply
      COMMON    /polycb/ filply,opnply
      logical   forma
      common /fmadbc/ forma

      CHARACTER*100 pfile,lfile,sfile
      CHARACTER ptyp*4,ltyp*4,styp*4
      PARAMETER (ptyp='.da3')
      PARAMETER (ltyp='.in3')
      PARAMETER (styp='.li3')

      DATA      filply /.TRUE./
      DATA nlinde/32/,lenlin/8/
      DATA nindex/32/,lenind/8/,icurlb/-1/
      DATA lendat/2/,ndatar/64/,icurpb/-1/

      cs = c/60.
      ICNTLI=0
      csblk = 0
      clblk = 0
      cpblk = 0
      pfile = inb(1:naml) // ptyp
      lfile = inb(1:naml) // ltyp
      sfile = inb(1:naml) // styp

      va = .FALSE.
      CALL adclos
      CALL addopn(naml,inb,ios)
      if ((inb(naml:naml).eq.'a').and. (forma)) then
        va = .true.
        opnply = .false.
      endif

c         OPEN(UNIT=lundat,FILE=pfile
c     +      ,FORM='UNFORMATTED',STATUS='OLD'
c     +      ,ACCESS='DIRECT',IOSTAT=ios,ERR=181
```

```
c     +     ,RECORDTYPE='fixed',RECL=lendat*ndatar,READONLY)
c         OPEN(UNIT=lunind,FILE=lfile
c     +     ,FORM='UNFORMATTED',STATUS='OLD'
c     +     ,ACCESS='DIRECT',IOSTAT=ios,ERR=182
c     +     ,RECORDTYPE='fixed',RECL=lenind*nindex/2,READONLY)
c         OPEN(UNIT=lunlin,FILE=sfile
c     +     ,FORM='UNFORMATTED',STATUS='OLD'
c     +     ,ACCESS='direct',IOSTAT=ios,ERR=183
c     +     ,RECORDTYPE='fixed',RECL=lenlin*nlinde/2,READONLY)

        OPEN(UNIT=lundat,FILE=pfile
     +     ,FORM='UNFORMATTED',STATUS='OLD'
     +     ,ACCESS='DIRECT',IOSTAT=ios,ERR=181
     +     ,RECL=lendat*ndatar*4)
        OPEN(UNIT=lunind,FILE=lfile
     +     ,FORM='UNFORMATTED',STATUS='OLD'
     +     ,ACCESS='DIRECT',IOSTAT=ios,ERR=182
     +     ,RECL=lenind*nindex*2)
        OPEN(UNIT=lunlin,FILE=sfile
     +     ,FORM='UNFORMATTED',STATUS='OLD'
     +     ,ACCESS='direct',IOSTAT=ios,ERR=183
     +     ,RECL=lenlin*nlinde*2)

      RETURN
  900 FORMAT(x,'Open Error ',i3,' on - ',/,x,a)
  181 CONTINUE
      PRINT 900,ios,pfile
      RETURN
  182 CONTINUE
      PRINT 900,ios,lfile
      RETURN
  183 CONTINUE
      PRINT 900,ios,sfile
      RETURN
      END


C+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    OPMAIL
C
C FUNCTIONAL DESCRIPTION:        .
C
C CALLED BY:                     INMAIL
C
C PROGRAMMER:                    DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*|*-*-*-*-

      subroutine opmail(respon)
c
c this subroutine opens a mailbox as a client for ten channels
c
      return
      end
C+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    PLOTGC
C
C FUNCTIONAL DESCRIPTION:        .
C
C CALLED BY:
C
C PROGRAMMER:                    DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*|*-*-*-*-

        subroutine plotgc
        return
        end


C+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    PRINT
C
C FUNCTIONAL DESCRIPTION:        DETERMINES TYPE OF APOLLO DISPLAY
```

```
C                                    AND WHICH PRINTER TO PRINT TO
C
C INPUT FILES/PARAMETERS:
C
C       GPR_$                    APOLLO VARIABLES CAN BE FOUND IN THE
C                                /SYS/INS/GPR.INS.FTN FILE
C
C OUTPUT FILES/PARAMETERS:         NONE
C
C SUBROUTINES/FUNCTIONS CALLED
C       GPR_$INQ_CONFIG          APOLLO SUPPLIED ROUTINE TO DETERMINE
C                                CONFIGURATION OF DISPLAY
C       INT2                     DOMAIN FORTRAN FUNCTION TO CONVERT NUMBER
C                                TO INTEGER*2 FORMAT
C       INTCOL                   COPIES THREE PLANES OF A COLOR
C                                NODE INTO A BITMAP FILE
C       INITBW                   COPIES ONE PLANE INTO A GMF FILE
C       MAPPTR                   EXECUTES THE COMMAND TO PRINT
C                                THE FILE CREATED BY EITHER OF THE TWO
C                                INITIALIZATION ROUTINES
C
C CALLED BY:                       PRINTR
C
C LOCAL VARIABLES:
C
C        CONFIG                  RETURNED FROM GPR ROUTINE INDICATING TYPE
C                                OF NODE
C        STATUS                  RETURNED FROM GPR ROUTINE TO INDICATE ERROR
C                                IN CALL
C
C RESTRICTIONS:              APOLLO  DEPENDENT SUBROUTINE
C
C     WRITTEN FOR THE CURRENT DEVICE DRIVER OF THE ACT II PRINTER
C     IF CHANGES TO DEVICE DRIVER WILL NEED TO CHANGE SOME PARAMETERS
C     BEING PASSED TO INTCOL AND/OR EXECOM
C
C ABNORMAL RETURN CONDITIONS:    N/A
C
C
C PROGRAMMER:                      DATE OF LAST CHANGE     REASON FOR CHANGE
C
C     DABUTSON                          12/12/84            INITIAL ENTRY
C     RKDISBR                           14/04/87            adapted for print menu
C
C-*-*-*-*-*-*-*-*-*-*-*-*-*-*-*-*-*-*-*-*-*-*-*-*-*-*-*-*-*-*-*-*-*-*-*-*-*|*-*-*-*-
C
      SUBROUTINE PRINT
      END


C+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                         PRINTR
C
C FUNCTIONAL DESCRIPTION:            PRINTS THE CONTENTS OF THE SCREEN
C                                    ON THE GRAPHIC DEVICE OR ALLOWS USER
C                                    TO TAKE A PICTURE OF FULL SCREEN
C                                    WITH MATRIX CAMERA
C
C INPUT FILES/PARAMETERS:
C
C      QCHANG          CHANGE         LOGICAL  FLAG TO INIDICATE A CHANGE HAS
C                                              BEEN MADE TO THE PICTURE
C      QNAME           FLNAME         CHAR*50  NAME OF CURRENT PICTURE
C
C OUTPUT FILES/PARAMETERS:           NONE
C
C
C SUBROUTINES/FUNCTIONS CALLED
C
C     INIPIC          INITIALIZE VARIABLES FOR DRAWING NEW PICTURE
C     INTCOL          INITIALIZES B/W PRINTER
C     INTSCN          INITIALIZES SCREEN
C     HLDF            RETRIEVES FILE FOR DISPLAY (CURRENT PICTURE)
C     MAPCOL          PRINTS SCREEN IMAGE OF COLOR NODE
```

```
C     MESG          DISPLAYS MESG
C     RPLSCN        REPLACES SCREEN TO ORIGINAL SIZE
c     CALCMP        REDRAWS MAP WHILE CREATING CALCOMP PLOTTER FILE
C
C CALLED BY:        FMAIN, PRTMEN
C
C LOCAL VARIABLES:
C
C     VARIABLE               TYPE        DESCRIPTION
C
C      OCHANG               LOGICAL      SAVE QCHANG
C      SVNAM               CHAR*50      SAVE CURRENT FILE NAME
C
C RESTRICTIONS:
C
C
C ABNORMAL RETURN CONDITIONS:   N/A
C
C
C PROGRAMMER:                   DATE OF LAST CHANGE     REASON FOR CHANGE
C
C     DABUTSON                     11/13/84              INITIAL ENTRY
C     RKDISBR                      14/04/87              adapted for print menu
C                                                        and calcomp plots
C
C-*-*-*-*-*-*-*-*-*-*-*-*-*-*-*-*-*-*-*-*-*-*-*-*-*-*-*-*-*-*-*-*-*-*-*-*-*|*-*-*-*-
C
       SUBROUTINE PRINTR

       return
       end


C+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    RECDAT
C
C FUNCTIONAL DESCRIPTION:       .
C
C CALLED BY:                    FMAIN, RECDIS, RESCON
C
C PROGRAMMER:                   DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*|*-*-*-*-

       subroutine recdat (savnam,lennam)

c      this subroutine restores the named screen
       return
       end


C+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    REPLAY
C
C FUNCTIONAL DESCRIPTION:       .
C
C CALLED BY:                    TRKCON
C
C PROGRAMMER:                   DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*|*-*-*-*-

       subroutine replay (delay)

c this routine blanks out the currently visible tracks and 'replays'
c them in time sequence
c programmer: avw
       return
       end


C+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    SAVDAT
C
```

```
C FUNCTIONAL DESCRIPTION:          .
C
C CALLED BY:                       RESCON, SAVDIS
C
C PROGRAMMER:                      DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*-*-*|*-*-*-*-

        subroutine savdat (savnam,lennam)

c       this subroutine saves the current screen in save_name.image
        character*100 savnam
        return
        end


C+*+*+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                       SNDMAIL
C
C FUNCTIONAL DESCRIPTION:          .
C
C CALLED BY:
C
C PROGRAMMER:                      DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*-*-*|*-*-*-*-

        subroutine sndmail
c
      return
      END


C+*+*+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                       TERMGM
C
C FUNCTIONAL DESCRIPTION:          .
C
C CALLED BY:                       FMAIN
C
C PROGRAMMER:                      DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*-*-*|*-*-*-*-

        subroutine termgm

c       terminate graphics metafile system
      return
      END


C+*+*+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                       TRKINI
C
C FUNCTIONAL DESCRIPTION:          .
C
C CALLED BY:                       CHKDAT
C
C PROGRAMMER:                      DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*-*-*|*-*-*-*-

      subroutine trkini
c
c this subroutine opens the apollo mailbox for 10 channels fore
c incoming tracking data from a line.
c
      return
      end
C+*+*+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME: darcos
C
C FUNCTIONAL DESCRIPTION:  Substitute for dacos function
C
```

```
C INPUT FILES/PARAMETERS:
C
C GLOBAL VARIABLES : NONE.
C
C OUTPUT FILES/PARAMETERS:  NONE.
C
C SUBROUTINES/FUNCTIONS CALLED :
C
C CALLED BY:
C
C LOCAL VARIABLES: NONE.
C
C RESTRICTIONS: NONE.
C
C ABNORMAL RETURN CONDITIONS:   NONE.
C
C LOCATION:
C
C PROGRAMMER:                  DATE OF LAST CHANGE     REASON FOR CHANGE
C
C     DAVE NATION                                      ORIGINAL CODE.
C     JERRY FENERTY                                    DOCUMENT AND MODIFY
C                                                      FOR A21 PROTOTYPE.
C
C-*-*-*-*-*-*-*-*-*-*-*-*-*-*-*-*-*-*-*-*-*-*-*-*-*-*-*-*-*-*-*-*-*-*-*-*|*-*-*-*-

        REAL*8 FUNCTION DARCOS(X)

c       Substitute for dacos function

        COMMON /PIE/ PIE,TPIE,PIO2,PIO4
        REAL*8 X,Y,q,a,b
        IF(DABS(X) .GT. 1.0D+0) then
            X=DSIGN(1.0D+0,X)
        endif
        a = 1.0D+0
        b = x*x
        q = a - b
        Y=DSQRT(DABS(q))
        DARCOS=DATAN2(Y,X)
        IF (DARCOS .LT. 0.) DARCOS = DARCOS + PIE
        RETURN
        END

C+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME: darsin
C
C FUNCTIONAL DESCRIPTION:  perform the double prec. arcsin w/ this routine
C
C INPUT FILES/PARAMETERS:
C
C GLOBAL VARIABLES : NONE.
C
C OUTPUT FILES/PARAMETERS:  NONE.
C
C SUBROUTINES/FUNCTIONS CALLED :
C
C CALLED BY:
C
C LOCAL VARIABLES: NONE.
C
C RESTRICTIONS: NONE.
C
C ABNORMAL RETURN CONDITIONS:   NONE.
C
C LOCATION:
C
C PROGRAMMER:                  DATE OF LAST CHANGE     REASON FOR CHANGE
C
C     DAVE NATION                                      ORIGINAL CODE.
C     JERRY FENERTY                                    DOCUMENT AND MODIFY
C                                                      FOR A21 PROTOTYPE.
C
C-*-*-*-*-*-*-*-*-*-*-*-*-*-*-*-*-*-*-*-*-*-*-*-*-*-*-*-*-*-*-*-*-*-*-*-*|*-*-*-*-
```

```
      REAL*8 FUNCTION DARSIN (X)

c --- perform the double prec. arcsin w/ this routine
c --- the system routine doesn't work on the dn300.

      real*8 x,y,z,x2

      IF(DABS(X) .GT. 1.0D+0) then
         X=DSIGN(1.0D+0,X)
      endif

      x2 = x * x
      y = DABS(1.0D+0 - x2)
      z = DSQRT(y)
      DARSIN = DATAN2(x,z)
      return
      end

C+*+*+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME: datoll
C
C FUNCTIONAL DESCRIPTION:  CONVERTS DISTANCE/AZIMUTH FROM THE CENTER OF
C       PROJECTION TO LAT/LON
C
C INPUT FILES/PARAMETERS:
C
C GLOBAL VARIABLES : NONE.
C
C OUTPUT FILES/PARAMETERS:  NONE.
C
C SUBROUTINES/FUNCTIONS CALLED :
C
C CALLED BY:                    NO LONGER USED BY CARICATURE
C
C LOCAL VARIABLES: NONE.
C
C RESTRICTIONS: NONE.
C
C ABNORMAL RETURN CONDITIONS:   NONE.
C
C LOCATION:
C
C PROGRAMMER:                   DATE OF LAST CHANGE     REASON FOR CHANGE
C
C     DAVE NATION                                       ORIGINAL CODE.
C     JERRY FENERTY                                     DOCUMENT AND MODIFY
C                                                       FOR A21 PROTOTYPE.
C
C-*-*-*-*-*-*-*-*-*-*-*-*-*-*-*-*-*-*-*-*-*-*-*-*-*-*-*-*-*-*-*-*-*-*-*-*-*-*-*|*-*-*-*-

      SUBROUTINE DATOLL(CLAT,CLON,ER,AZ,PLAT,PLON)

C     CONVERTS DISTANCE/AZIMUTH FROM THE CENTER OF PROJECTION TO LAT/LON

      COMMON /PIE/ PIE,TPIE,PIO2,PIO4
      COMMON /CONST/ MAXVAL,RMPV,C,R,ERNM

C       SET CONSTANTS

        SIN1 = SIN(CLAT)
        COS1 = COS(CLAT)

C       DETERMINE SIN OF PLAT

        SIN2 = COS(AZ)*COS1*SIN(ER)+SIN1*COS(ER)

C       COMPUTE PLAT

        PLAT = ASIN(SIN2)
C
        COS2 = COS(PLAT)

C       COMPUTE DELTA LON
```

```
          IF(ABS(COS1) .LT. RMPV) THEN
                 DLON = PIE - AZ
                 GO TO 100
          ENDIF

          IF(ABS(COS2) .LT. RMPV) THEN
                 DLON = 0.
                 GO TO 100
          ENDIF
          COSDLO = (COS(ER)-SIN1*SIN2)/(COS1*COS2)
          IF(ABS(COSDLO) .GT. 1.0) THEN
                 DLON = 0.
          ELSE
                 DLON = ACOS(COSDLO)*SIGN(1.0,AZ)
          ENDIF

C         COMPUTE PLON

100       CONTINUE
          PLON = DLON+CLON
          IF(ABS(PLON) .GT. PIE) PLON = PLON - SIGN(TPIE,PLON)

          RETURN
          END


C+*+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                        DATPOL
C
C FUNCTIONAL DESCRIPTION:           .
C
C CALLED BY:                        BUTTN, KEYBD, KEYBS, LOCAT, PICK
C
C PROGRAMMER:                       DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*-*|*-*-*-*-

      subroutine datpol
c
c
c     this subroutine 1st checks the comm line for
c     new data coming in.  If data is present in the
c     queue, ADDTRK adds this new track to the display
c     list and displays it.
c     2nd, the system clock is checked to see if 1 min.
c     has gone by since last check.  If so, a fade
c     routine is called to delete any tracks that are
c     no longer within the fade time.
c
        logical newdat
        character*160 datain
        integer latbeg
        integer latend
        integer lonbeg
        integer lonend
        character*7 lablnk
        character*8 loblnk
        data latbeg,latend /3,9/
        data lonbeg,lonend /10,17/
        data lablnk /'       '/
        data loblnk /'        '/


c
c          check for data line interrupt
c
  125      continue
           newdat = .false.
           call CHKDAT(datain,newdat)
           if(newdat) then
c
c              don't call ADDTRK if lat or lon are blank
c
               if (datain(latbeg:latend) .ne. lablnk .and.
```

```
+              datain(lonbeg:lonend) .ne. loblnk) then
               call ADDTRK(datain)
            endif
            goto 125
         endif
c
c        check for time clock interrupt and turn off visibility
c        on any tracks that are pass fade time
c        (click true on each minute elapsed)
c
         call TIMCHK
c
         return
         end

C+++++++++++++++++++++++++++++++++++++++++++++++++++++++++++++++|+++++++
c  UNIT NAME:                       ddcval
c
c  Functional Description:
c       this function converts produces a single rgb value from hls
c
c  Input Files/Parameters:
c
c  Output Files/Parameters: N/A
c
c  Subroutines/Functions Called:
c     Note: Subroutines preceded by a "j" are explained in the DI-3000 manual.
c
c  Called By:     hlsrgb
c
c  Local Variables: N/A
c
c  Restrictions: N/A
c
c  Abnormal Return Conditions:  N/A
c
c  Location:      /a21/dave
c
c  Programmer          Date of Last Change        Reason for Change
c
C-*-*-*-*-*-*-*-*-*-*-*-*-*-*-*-*-*-*-*-*-*-*-*-*-*-*-*-*-*-*-*-*-*-*|*-*-*-*-
c
       real function ddcval (val1, val2, rhue)
c
c      this function converts produces a single rgb value from hls
c
       hue = rhue
       if (hue .lt. 0.0) hue = hue + 360.
       if (hue .lt. 60.) then
           ddcval = val1 + (val2 - val1) * hue / 60.
       else if (hue .lt. 180.) then
           ddcval = val2
       else if (hue .lt. 240.) then
           ddcval = val1 + (val2 - val1) * (240. - hue) / 60.
       else
           ddcval = val1
       endif
c
       return
       end

C+++++++++++++++++++++++++++++++++++++++++++++++++++++++++++++++|+++++++
C UNIT NAME:                        DECDET
C
C FUNCTIONAL DESCRIPTION:
C
C CALLED BY:                        STATEC
C
C PROGRAMMER:                       DATE OF LAST CHANGE     REASON FOR CHANGE
c  S. Lamb                    Feb 1988                  command fix - decdet
C
C-*-*-*-*-*-*-*-*-*-*-*-*-*-*-*-*-*-*-*-*-*-*-*-*-*-*-*-*-*-*-*-*-*-*|*-*-*-*-
```

```
c                                   .
        subroutine decdet
c
c       this subroutine is the decrease detail state interpreter (22)
c
        common /states/ nextst
        character*6 curwdb
        common /curwdb/ curwdb
        integer detail(6)
        common /detail/detail
        character postfix(6)
        integer current
        integer i
        integer next
        logical wordis,iseoc

        data postfix/'a','b','c','d','e','f'/
c
        initls = nextst
c       do until nextst not = initial state
  100   continue
            call getwrd
c * ** *** **** ***** ****** ******* change check order, etc.
           if (wordis('SCALE')) then
               nextst = 24
           else if (wordis('DETAIL').or.wordis('MAP') .or.
    +               iseoc()) then
c   ***        decrease detail
               do 110 i=1,6
                   if(curwdb(6:6).eq.postfix(i)) then
                       current = i
                   endif
  110          continue
               next = current + 1
  120          continue
               if(next .lt. 7 .and. detail(next) .ne. 1) then
                       next = next + 1
                       goto 120
               else
                       continue
               endif
               if(next.lt.7) then
                       curwdb(6:6) = postfix(next)
                       call chawdb(6,curwdb)
                       nextst = 3
               else
c                       call drwamp(' ',1)                  - decdet
c ----- updated 7/31/87 CSL                                 - decdet
                       call drwamp('Least detail already in use ',1)
                       nextst = 1
               endif
           else
c   ***        decrease detail
               do 130 i=1,6
                   if(curwdb(6:6).eq.postfix(i)) then
                       current = i
                   endif
  130          continue
               next = current + 1
  140          continue
               if(next .lt. 7 .and. detail(next) .ne. 1) then
                       next = next + 1
                       goto 140
               else
                       continue
               endif
               if(next.lt.7) then
                       curwdb(6:6) = postfix(next)
                       call chawdb(6,curwdb)
                       nextst = 3
               else
c                       call drwamp(' ',1)                  - decdet
c ----- updated 7/31/87 CSL                                 - decdet
                       call drwamp('Least detail already in use ',1)
```

```
                  nextst = 1
              endif
              call putwrd
           endif
        if (nextst.eq.initls) go to 100
c
        return
        end


C+*+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                      DECSCA
C
C FUNCTIONAL DESCRIPTION:
C
C CALLED BY:                      STATEC
C
C PROGRAMMER:                     DATE OF LAST CHANGE     REASON FOR CHANGE
c  S. Lamb                  Feb 1988                    command fix - decsca
C
C-*-*-*-*-*-*-*-*-*-*-*-*-*-*-*-*-*-*-*-*-*-*-*-*-*-*-*-*-*-*-*-*-*-*-*-*-*-*|*-*-*-*-
c
        subroutine decsca
c
c       this subroutine is the decrease scale state interpreter (24)
c
        common /states/ nextst
        logical wordis,iseoc
c       map parameters
        logical lton(16),dotem
        integer ipgrid(4),ltyptb(16)
        common /map/ XRNM,XC,YC,LEVEL,CLAT,CLON,XRAD,YRAD,ITPROJ,
     +      IRES,LTYPTB,LUNDAT,LUNIND,LUNLIN,LTON,IPGRID,DOTEM,
     +      ORHALT
c
        initls = nextst
c       do until nextst not = initial state
  100   continue
            call getwrd
c * ** *** **** ***** ****** ******* change check order, etc.
            if (wordis('DETAIL')) then
                nextst = 22
            else if (wordis('SCALE').or.wordis('MAP')
     +               .or. iseoc()) then
c               decrease scale
                xrnmn = xrnm * 2. / 3.
                call chscal (xrnmn)
                nextst = 3
            else
c               decrease scale
                xrnmn = xrnm * 2. / 3.
                call chscal (xrnmn)
                call putwrd
                nextst = 3
            endif
        if (nextst.eq.initls) go to 100
c
        return
        end


C+*+*+*+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:                     defkeys
c
c  Functional Description:
c       define default keys
c
c  Input Files/Parameters:
c
c  Output Files/Parameters: N/A
c
c  Subroutines/Functions Called:
c
c  Called By:                     FMAIN
c
```

```
c  Local Variables: N/A
c
c  Restrictions: N/A
c
c  Abnormal Return Conditions:  N/A
c
c  Location:
c
c  Programmer       Date of Last Change      Reason for Change
C  L. McCleary      Jan 1988                 vax keys fix - defkeys
c
C-*-*-*-*-*-*-*-*-*-*-*-*-*-*-*-*-*-*-*-*-*-*-*-*-*-*-*-*-*-*-*-*-*-*-*-*-*|*-*-*-*-
c
      subroutine defkeys

      logical vax
      common /vaxdbc/ vax
      integer qfb(26),qmb(4),vaxqfb(26),vaxqmb(4),apqfb(26),apqmb(4)
      common /butons/ qfb,qmb
c*******VAX function key definitions
c       data vaxqfb/2,7,51,52,5,6,55,56,57,65,66,67,68,69,70,71,
c     +  76,83,4,75,81,77,3,80,84,8/
      data vaxqfb/2,7,51,52,5,6,55,56,57,65,66,67,68,69,70,71,
     +  76,83,4,75,81,77,2,80,84,8/
C     PICK,LEAVE(R),HELP,___
c       data vaxqmb/32,82,72,90/
C     PICK,HELP,LEAVE(R)___
      data vaxqmb/32,72,82,90/
c*******
c*******Apollo function key definitions
c       data apqfb/2,7,51,52,5,6,55,56,57,65,66,67,68,69,70,71,
c     +  76,83,4,75,81,77,3,80,84,8/
      data apqfb/1,7,51,52,5,6,55,56,57,65,66,67,68,69,70,71,
     +  76,83,4,75,81,77,2,80,84,8/
      data apqmb/1,2,3,4/
c*******


      if(vax) then
        do 20 i = 1,26
          qfb(i) = vaxqfb(i)
20      continue
        do 30 i = 1,4
          qmb(i) = vaxqmb(i)
30      continue
      else
        do 40 i = 1,26
          qfb(i)= apqfb(i)
40      continue
        do 50 i = 1,4
          qmb(i) = apqmb(i)
50      continue
      endif

      return
      end


C+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                        DGRID
C
C FUNCTIONAL DESCRIPTION:           .
C
C CALLED BY:                        DMAPII
C
C PROGRAMMER:                       DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*|*-*-*-*-

      subroutine dgrid (ipgrid,vmaxla,vminla,vmaxlo,vminlo,dotem,
     +  itproj)

c     call CARICATURE grid display subroutine
```

```
        call llgrid (ipgrid,vmaxla,vminla,vmaxlo,vminlo,dotem,itproj)

        return
        end

C+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                       DIFTIM
C
C FUNCTIONAL DESCRIPTION:          .
C
C CALLED BY:                       CHKCLK
C
C PROGRAMMER:                      DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*|*-*-*-*-
.
      subroutine diftim(click,curdtg)
c
c this subroutines determines if a minute has gone off
c of the system clock since last call to getime.
c%include '/sys/ins/time.ins.ftn'

      logical click
c
c     curdtg is in yydddhhmm format- w/ ddd being julian date
c
      character*9 curdtg
      integer arsize
      integer yr
      integer mon
      integer day
      integer hour
      integer min
      integer juldat
      integer*2 oldtim(6)
      integer*2 newtim(6)
      common /ctimes/ oldtim,newtim
      integer yrsub
      integer monsub
      integer daysub
      integer hrsub
      integer minsub
      logical trackn
      common /trkdbc/ trackn

      data arsize /6/
      data yrsub  /1/
      data monsub /2/
      data daysub /3/
      data hrsub  /4/
      data minsub /5/

c
c get local time, then convert to yymmddhhmmss format
c dcode(5) is the minute slot.  check for a minute gone by
c if so, put new dcoded time into current decoded time.
c
c     print*,'diftim enter'

c     get current local time

      call gettim(newtim)

      click = .false.

      if (trackn) then
         print*,'oldtim/newtim= ',oldtim,newtim
      end if
      if ((newtim(yrsub) .gt. oldtim(yrsub)) .or.
     +         ((newtim(yrsub) .lt. oldtim(yrsub)) .and.
     +         (newtim(yrsub)-oldtim(yrsub) .ge. 99))) then
         click = .true.
         do 10 i=1,arsize
```

```
              oldtim(i) = newtim(i)
 10         continue
      else if (newtim(yrsub) .eq. newtim(yrsub)) then
            if (newtim(monsub) .gt. oldtim(monsub)) then
               click = .true.
               do 20 i=1,arsize
                    oldtim(i) = newtim(i)
 20            continue
            else if (newtim(monsub) .eq. oldtim(monsub)) then
               if (newtim(daysub) .gt. oldtim(daysub)) then
                  click = .true.
                  do 30 i=1,arsize
                       oldtim(i) = newtim(i)
 30               continue
               else if (newtim(daysub) .eq. oldtim(daysub)) then
                  if (newtim(hrsub) .gt. oldtim(hrsub)) then
                     click = .true.
                     do 40 i=1,arsize
                          oldtim(i) = newtim(i)
 40                  continue
                  else if (newtim(hrsub) .eq. oldtim(hrsub)) then
                     if (newtim(minsub) .gt. oldtim(minsub)) then
                        click = .true.
                        do 50 i=1,arsize
                             oldtim(i) = newtim(i)
 50                     continue
                     endif
                  endif
               endif
            endif
      endif
c
c     get julian date in integer format from yr/mon/day
c

      yr =   oldtim(yrsub)
      mon =  oldtim(monsub)
      day =  oldtim(daysub)
      hour = oldtim(hrsub)
      min  = oldtim(minsub)
      call julian(yr,mon,day,juldat)
c
c     express curdtg in character format as yydddhhmm
c
      call chdate (yr,juldat,hour,min,curdtg)
      if (trackn) then
         print*,'curdtg= ',curdtg
      end if

      return
      end


C+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                       DISCEN
C
C FUNCTIONAL DESCRIPTION:          .
C
C CALLED BY:                       STATEC
C
C PROGRAMMER:                      DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*|*-*-*-*-

        subroutine discen
c
c       this subroutine is the display center point state interpreter (7)
c
        common /states/ nextst
c       map parameters
        logical lton(16),dotem
        integer ipgrid(4),ltyptb(16)
        common /map/ XRNM,XC,YC,LEVEL,CLAT,CLON,XRAD,YRAD,ITPROJ,
     +      IRES,LTYPTB,LUNDAT,LUNIND,LUNLIN,LTON,IPGRID,DOTEM,
```

```
     +      ORHALT
        character * 105 errlin
        character*20 geostr
c
c       print*,'discen -- display current center point ',clat,clon
        call fmtgeo (clat,clon,geostr)
        errlin = 'Current center point is : ' // geostr
        call cerror(46,errlin)
        nextst = 1
c
        return
        end

C+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                      DISP1
C
C FUNCTIONAL DESCRIPTION:          .
C
C CALLED BY:
C
C PROGRAMMER:                     DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*|*-*-*-*-

        subroutine displ(msg, lenmsg, lineno)
c
c       display a single line in the communications area
c
        integer lenmsg, lineno
        character*(*) msg
        real qcxmn,qcymn,qcxmx,qcymx
        common/comwdo/qcxmn,qcymn,qcxmx,qcymx
        logical vax
        common /vaxdbc/ vax

        if (lenmsg .gt. 0) then
          if (vax) then
             call jmove(qcxmn+1,(qcymx-lineno+.1))
          else
             call jmove(qcxmn+1,(qcymx-lineno+.4))
          endif
          call j1strg (msg(1:lenmsg))
        endif
        return
        end

C+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:                     disp5
c
c  Functional Description:
c       display maxlin lines in sys area
c
c  Input Files/Parameters:
c
c  Output Files/Parameters: N/A
c
c  Subroutines/Functions Called:
c
c  Called By: help
c
c  Local Variables: N/A
c
c  Restrictions: N/A
c
c  Abnormal Return Conditions:  N/A
c
c  Location:
c
c  Programmer       Date of Last Change      Reason for Change
C  L. McCleary      Jan 1988                 separate amp & sys - disp5
c
C-*-*-*-*-*-*-*-*-*-*-*-*-*-*-*-*-*-*-*-*-*-*-*-*-*-*-*-*-*-*-*-*-*-*-*-*|*-*-*-*-
c
```

```
        subroutine disp5(ifl,eof,eom)
c
c       subroutine to display requested maxlin lines of help msg
c
        logical frame
        common /frmdbc/ frame
        common /comwdo/ qcxmn,qcymn,qcxmx,qcymx
        logical eof,eom
        real qcxmn,qcymn,qcxmx,qcymx
        character cchar
        character*80 msg
        integer lenmsg
        integer qfb(26),qmb(4)
        common /butons/ qfb,qmb
        common /cmxlin/maxlin
c        data max/5/
        data icolcm/16/

c       set window and retained segment
c       print*,'in disp5'
c       if end of file, give error message
        if (eof) then
c           no msg for given #
            eom=.true.
            call mesg (195)
            call BUTTN(IBUT)
C   THE CALL TO PAWS WAS COMMENTED OUT DUE TO THE FACT THAT
C   A USER HITTING THE HELP KEY IN RESPONSE TO PAWS WOULD
C   CAUSE RECURSION SINCE PAWS WILL CALL HELP AGAIN.  -- GJF
c            call paws
            if (ibut.eq.qfb(23)) then
                call clrcom
                call mesg(47)
                call BUTTN(IBUT)
            endif
        else
            i=0
            call clrcom
            if (frame) then
c*******         temporarily do a jframe to make sure the area is clear
                call jframe
            endif
            call jwindo(qcxmn,qcxmx,qcymn,qcymx)
            call jopen
            call xsize(1.,1.)
            call xcolor(icolcm)
c           display up to maxlin lines of msg
100         continue
                read(ifl,1000,end=125,err=120)cchar,msg
1000            format(a1,a80)
                if (cchar.eq.'C'.or.cchar.eq.'c') go to 100
                if (cchar.eq.'M'.or.cchar.eq.'m') then
                    eom = .true.
                    go to 110
                endif
                i=i+1
c               print*,'disp=',msg
                call length(msg,80,lenmsg)
                call disp1(msg, lenmsg, i)
c            if (i.ne.max) go to 100
            if (i.ne.maxlin) go to 100
110         continue
            go to 130
120         continue
                print*,'read error on message file'
                go to 130
125         continue
                eof=.true.
130         continue
            call jclose
        endif
c       print*,'end disp5'
        return
        end
```

```
C+++++++++++++++++++++++++++++++++++++++++++++++++++++++++++++++++++++++++|+++++++
C UNIT NAME:                      DISPRO
C
C FUNCTIONAL DESCRIPTION:         .
C
C CALLED BY:                      STATEC
C
C PROGRAMMER:                     DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*|*-*-*-*-

        subroutine dispro
c
c       this subroutine is the display projection state interpreter (5)
c
        common /states/ nextst
c       map parameters
        logical lton(16),dotem
        integer ipgrid(4),ltyptb(16)
        common /map/ XRNM,XC,YC,LEVEL,CLAT,CLON,XRAD,YRAD,ITPROJ,
     +      IRES,LTYPTB,LUNDAT,LUNIND,LUNLIN,LTON,IPGRID,DOTEM,
     +      ORHALT
        character * 105 errlin
        character*23 proj(7)
        integer lenpro(7)
        data lenpro/8,23,18,12,11,15,8/
        data proj/'Gnomonic',
     +            'Orthographic Equatorial',
     +            'Orthographic Polar',
     +            'Orthographic',
     +            'Perspective',
     +            'Equirectangular',
     +            'Mercator'/
c
c       print*,'dispro -- display current projection ',itproj
        errlin = 'Current projection is : ' // proj(itproj)
        lenlin = 24 + lenpro(itproj)
        call cerror(lenlin,errlin)
        nextst = 1
c
        return
        end

C+++++++++++++++++++++++++++++++++++++++++++++++++++++++++++++++++++++++++|+++++++
C UNIT NAME:                      DISSCA
C
C FUNCTIONAL DESCRIPTION:         .
C
C CALLED BY:                      STATEC
C
C PROGRAMMER:                     DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*|*-*-*-*-

        subroutine dissca
c
c       this subroutine is the display scale state interpreter (6)
c
        common /states/ nextst
c       map parameters
        logical lton(16),dotem
        integer ipgrid(4),ltyptb(16)
        common /map/ XRNM,XC,YC,LEVEL,CLAT,CLON,XRAD,YRAD,ITPROJ,
     +      IRES,LTYPTB,LUNDAT,LUNIND,LUNLIN,LTON,IPGRID,DOTEM,
     +      ORHALT
        character * 105 errlin
        character * 7 chasca
c
c       print*,'dissca -- display current scale ',xrnm
        write (chasca,1100,err=190) xrnm
 1100   format (f7.0)
            errlin = 'Current scale is : ' // chasca
            lenlin = 26
```

```
          if (itproj.eq.6.or.itproj.eq.7) then
              errlin = errlin(1:lenlin) // ' minutes.'
              lenlin = lenlin + 9
          else if (itproj.eq.5) then
              errlin = errlin(1:lenlin) //
     +            ' nautical miles altitude.'
              lenlin = lenlin + 25
          else
              errlin = errlin(1:lenlin) //
     +            ' nautical miles at center.'
              lenlin = lenlin + 26
          endif
          call cerror(lenlin,errlin)
  190   continue
        nextst = 1
c
        return
        end

C+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                        DISTXT
C
C FUNCTIONAL DESCRIPTION:           .
C
C CALLED BY:                        TXWRIT
C
C PROGRAMMER:                       DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*|*-*-*-*-

        subroutine distxt(txtseg,txline,page,lpp,lcnt)
c
c       this subroutine displays the textual data
c       for one page of data in the txline array
c
        integer txtseg
        integer lpp
        integer lcnt
        integer page
        character*80 blanks
        character*80 txline(*),line
        real y
        integer frstln
        integer lstlin
        integer*4 nchars

        blanks = ' '
        nchars = 80

c       First line # is set equal to first line in current page.
        frstln = (page - 1) * lpp + 1

c       Last line # is set to frstln + lpp - 1 or qlast, whichever is less.

        if(( frstln + lpp - 1).lt.lcnt ) then
             lstlin = frstln + lpp - 1
        else
             lstlin = lcnt
        endif

        y = 160.
        call jropen(txtseg)
        call jsize(5.,5.)
c
c       this is gold text on a color node
c
        call xcolor(16)
        do 100 i= frstln, lstlin
             line = txline(i)
             call jmove(-180.,y)
             call jlstrg(line(1:nchars))
             y = y - 10.
 100    continue
```

```
      call jrclos
      return
      end

C+*+*+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:                         doverl
c
c  Functional Description:
c       draw overlay features on map background
c
c  Input Files/Parameters:
c
c  Output Files/Parameters: N/A
c
c  Subroutines/Functions Called:
c
c  Called By: mapper
c
c  Local Variables: N/A
c
c  Restrictions: N/A
c
c  Abnormal Return Conditions:  N/A
c
c  Location:
c
c  Programmer       Date of Last Change     Reason for Change
C  L. McCleary      Jan 1988             separate amp & sys - doverl
c
C-*-*-*-*-*-*-*-*-*-*-*-*-*-*-*-*-*-*-*-*-*-*-*-*-*-*-*-*-*-*-*-*-*-*-*-*-*|*-*-*-*-
c
      subroutine doverl (ltypov,ltonov)
c     draw overlay features on map background
c
c     ltypov  This is a table of 16 variables containing an integer
c             value representing line type for overlay features.
c             The categories are as follows:
c                  1    Overlay data feature
c                  2    Direction finding feature
c                  3    Tracking data feature
c                  4    Gazeteer
c                  5
c                  6
c     ltonov  Table of 16 logical values.  Determines whether the
c             line types referenced by ltypov are to be displayed
c
      integer secnds
      logical ltonov(16)
      dimension ltypov(16)
      character*80 ovfnam
      common /ovfnam/ ovfnam
      common /lenovf/ lenovf

c**  seg numbers for overlay and df
      integer ovseg, dfseg
      common /OVSEGS/ ovseg, dfseg
      logical BEGTRK
      integer trakfd
      common /TRACK/ trakfd,BEGTRK
      INTEGER SEGNO,FIRSEG
      COMMON /SEGNO/ SEGNO,FIRSEG
      common /gphwdo/xllgeo,yllgeo,xurgeo,yurgeo
c     map parameters
      logical lton(16),dotem
      integer ipgrid(4),ltyptb(16)
      common /map/ XRNM,XC,YC,LEVEL,CLAT,CLON,XRAD,YRAD,ITPROJ,
     +    IRES,LTYPTB,LUNDAT,LUNIND,LUNLIN,LTON,IPGRID,DOTEM,
     +    ORHALT
      common /vmaxmn/ VMAXLA,VMINLA,VMAXLO,VMINLO


      data lcover/1/,lcdf/2/,lctrak/3/,lcgaz/4/
      DATA LSCALE/15/
```

```
      data secnds /0/

      IF (LTON(LSCALE)) THEN
          LTYPE=LTYPTB(LSCALE)
          call mesg(265)
          call gravpt
          call geowin
          call xcolor(ltype)
          CALL SCLRET
      ENDIF
      if (ltonov(lcover)) then
          ltype=ltypov(lcover)
          call mesg(250)
          call gravpt
          call geowin
          call getseg(ovseg)
          call jropen(ovseg)
          call xcolor(ltype)
          call pltovp(xrnm,ovfnam,lenovf)
          call jrclos
      endif
      if (ltonov(lcdf)) then
          ltype=ltypov(lcdf)
          call mesg(1210)
          call gravpt
          call geowin
          call getseg(dfseg)
          call jropen(dfseg)
          call xcolor(ltype)
          call pltovp (xrnm,'df.dat',6)
c          call jrclos
      endif

c     print*,'doverl -- ',xllgeo,yllgeo,xurgeo,yurgeo

      if (ltonov(lctrak)) then
          call jrclos
          call gravpt
          call geowin
          call replay (secnds)
      endif
c     if (ltonov(lcgaz)) then
c         LTYPE=ltypov(lcgaz)
c         call gltype(ltype,lcgaz)
c         call pltgaz (xrnm,.true.,.false.)
c     endif
      return
      end

C+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME: drawel
C
C FUNCTIONAL DESCRIPTION:  THIS SUBROUTINE DRAWS THE ELLIPSE OF 95% CONFIDENCE.
C
C INPUT FILES/PARAMETERS:
C
C GLOBAL VARIABLES :              noelpl  - draw ellipse plus flag
C
C OUTPUT FILES/PARAMETERS:  NONE.
C
C SUBROUTINES/FUNCTIONS CALLED :
C
C CALLED BY:                      PLOTOV
C
C LOCAL VARIABLES: NONE.
C
C RESTRICTIONS: NONE.
C
C ABNORMAL RETURN CONDITIONS:   NONE.
C
C LOCATION:
C
C PROGRAMMER:                    DATE OF LAST CHANGE     REASON FOR CHANGE
```

```
C
C     DAVE NATION                                                  ORIGINAL CODE.
C     JERRY FENERTY                                                DOCUMENT AND MODIFY
C                                                                  FOR A21 PROTOTYPE.
C
C-*-*-*-*-*-*-*-*-*-*-*-*-*-*-*-*-*-*-*-*-*-*-*-*-*-*-*-*-*-*-*-*-*-*|*-*-*-*-

      SUBROUTINE DRAWEL(BPELAT,BPELON,SMA,SMI,AZIMTH)

C ----- THIS SUBROUTINE DRAWS THE ELLIPSE OF 95% CONFIDENCE.

      LOGICAL INVAL,INVIS,NEWONS,NEWSEQ

      REAL MAXANG

      logical noelpl
      common /noelpl/ noelpl

      DATA DTR/.01745329/
      DATA EARTHR/3443.922/
      DATA PI/3.14159/

      MAXANG = MIN(PI/6.,PI/6.*25.*SMI/SMA)

      AZ = AZIMTH*DTR

      NEWSEQ = .TRUE.

      SINLAT = SIN(BPELAT)
      COSLAT = COS(BPELAT)
      AB = SMA*SMI
      A2 = SMA*SMA
      B2 = SMI*SMI

      DELTA = AB*2.0*PI/60

      O = 0.0
   10 CONTINUE

      SINO = SIN(O)
      COSO = COS(O)

      RNM = AB / SQRT(A2*SINO*SINO + B2*COSO*COSO)
      R = RNM / EARTHR

      SINR = SIN(R)
      COSR = COS(R)

      V = ASIN(COSR*SINLAT + SINR*COSLAT*COS(AZ+O))
      U = BPELON + ASIN(SIN(AZ+O)*SINR/COS(V))

      INVAL = .FALSE.
      CALL LLINXY (V,U,X,Y,INVAL,INVIS,NEWONS)
      IF (INVIS) THEN
         NEWSEQ = .TRUE.
      ELSE
         IF (NEWSEQ) THEN
            CALL JMOVE (X,Y)
         ELSE
            CALL JDRAW (X,Y)
         ENDIF
         NEWSEQ = .FALSE.
      ENDIF

      IF (O.LT.2.0*PI) THEN
         DELO = DELTA / RNM / RNM
         DELO = MIN(MAXANG,DELO)
         O = O + DELO
         GO TO 10
      ENDIF

      INVAL = .FALSE.
      CALL LLINXY (BPELAT,BPELON,X,Y,INVAL,INVIS,NEWONS)
c      IF (.NOT.(INVIS)) THEN
      if ((.not.invis) .and. (.not.noelpl)) then
```

```
            XX = X - 3.0
            YY = Y
            CALL JMOVE (XX,YY)
            XX = X + 3.0
            CALL JDRAW (XX,YY)
            XX = X
            YY = Y + 3.0
            CALL JMOVE (XX,YY)
            YY = Y - 3.0
            CALL JDRAW (XX,YY)
         ENDIF

         CALL FLUSHB

         RETURN
         END


C+*+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                         DRAWF
C
C FUNCTIONAL DESCRIPTION:            .
C
C CALLED BY:                         DRWFTR, FDFPRO, FTRCON, OVRCON
C
C PROGRAMMER:                        DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*-*|*-*-*-*-

         SUBROUTINE DRAWF(IFTR)

C        DRAWS A SPECIFIC MAP FEATURE
         LOGICAL QLTON(16),QDOTEM
         INTEGER QPGRID(4),QTYPTB(16)
         INTEGER QLEVEL,QITPRO,QIRES,QLUNDA,QLUNIN,QLUNLI
         REAL QXRNM,QXC,QYC,QCLAT,QCLON,QXRAD,QYRAD,QORHAL
         COMMON /MAP/ QXRNM,QXC,QYC,QLEVEL,QCLAT,QCLON,QXRAD,QYRAD,
     +       QITPRO,
     +       QIRES,QTYPTB,QLUNDA,QLUNIN,QLUNLI,QLTON,QPGRID,QDOTEM,
     +       QORHAL

         INTEGER QNMPTS,QSHADE(60)
         REAL QLATT(60),QLONN(60)
         COMMON /FILLS/ QNMPTS,QLATT,QLONN,QSHADE
         LOGICAL LTON(16)
         logical ltovsv(16)
         dimension ltypov(16)
         logical ltonov(16),rankt(26,16)
         logical pflag
         COMMON /maptoo/ ltypov,ltonov,rankt
         logical map
         common /mapdbc/ map

         logical issegm
         INTEGER SEGNO,FIRSEG
         COMMON /SEGNO/ SEGNO,FIRSEG
         INTEGER CNAME,PBOUND
         INTEGER FPTS

c** featrs is common to pltnam routine for drwing
c** area names without redrawing any boundries.

         logical featrs(16), indrwf
         COMMON /pltftr/ featrs, indrwf
         logical filply,opnply
         common /polycb/ filply,opnply

         DATA CNAME/10/,PBOUND/2/
         DATA INDRWF /.TRUE./

             if (issegm(iftr+firseg)) then
                IF (map)
     +            PRINT*,'IN DRAWF PURGING',FIRSEG+IFTR
                CALL JPURGE(FIRSEG+IFTR)
         ENDIF
```

```
      DO 50 I=1,16

         LTON(I) = QLTON(I)
         featrs(i) = QLTON(I)
         ltovsv(i) = ltonov(i)
         QLTON(I) = .FALSE.
         ltonov(i) = .false.

50    CONTINUE

c**   temporarily turn off poly flag
      pflag = filply
      filply = .false.

      IF (IFTR .LE. 16) THEN
           QLTON(IFTR) = .TRUE.
      ELSE
           LTONOV(IFTR - 20) = .TRUE.
      ENDIF

C**   IF POLITICAL BOUNDARIES ARE BEING TURNED ON AND
C**   COUNTRY NAMES ARE ON, COUNTRY NAMES WILL BE
C**   DRAWN INSTEAD OF CONTINENT NAMES.

c      IF ((IFTR.EQ.PBOUND).AND.(LTON(CNAME))) THEN
c         IF (.NOT.(LTON(PBOUND))) THEN
c          CALL JPURGE(FIRSEG + CNAME)
c          QLTON(CNAME) = .TRUE.
c         ENDIF
c      ENDIF

C**   COUNTRY NAMES WILL ONLY BE DRAWN IF POLITICAL
C**   BOUNDARIES ARE TURNED ON.  IF POLITICAL BOUNDARIES
C**   ARE NOT ON, JUST CONTINENT NAMES WILL BE DRAWN.

c      IF ((IFTR.EQ.CNAME).AND.(LTON(PBOUND))) THEN
c          CALL JPURGE(FIRSEG + PBOUND)
c          QLTON(PBOUND) = .TRUE.
c      ENDIF

      FPTS = QNMPTS
      QNMPTS = 0
      if (issegm(firseg)) then
         call jpurge(firseg)
      endif

      CALL MAPPER (.true.)

      DO 20 I=1,16

         QLTON(I) = LTON(I)
         ltonov(i) = ltovsv(i)

20    CONTINUE

c**   turn poly flag back on

      filply = pflag

      QNMPTS = FPTS
      IF (IFTR .LE. 16) THEN
           QLTON(IFTR) = .TRUE.
      ELSE
           LTONOV(IFTR - 20) = .TRUE.
      ENDIF
      RETURN
      END
C++++++++++++++++++++++++++++++++++++++++++++++++++++++++++++++++++++|+++++++
C UNIT NAME:                    DRAWFT
C
C FUNCTIONAL DESCRIPTION:       .
C
C CALLED BY:                    STATEC
```

```
C
C PROGRAMMER:                    DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*-*-*|*-*-*-*-

        subroutine drawft
c
c       this subroutine is the draw feature state interpreter (8)
c
        common /states/ nextst
        common /indpar/ indpro,indftr
c
        call drwftr (indftr)
        nextst = 1
c
        return
        end

C+*+*+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                     DRAWIT
C
C FUNCTIONAL DESCRIPTION:        .
C
C CALLED BY:                     DRWMAP
C
C PROGRAMMER:                    DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*-*-*|*-*-*-*-

        SUBROUTINE DRAWIT

C       THIS SUBROUTINE ERASES THE MAP AREA AND CALLS MAPPER

        CALL CLRGRA
        CALL MAPPER (.true.)
        CALL MAPOVR

        RETURN
        END

C+*+*+*+*+*+*+*+*+*+*+*+*+*+*+*+*+*+*+*+*+*+*+*+*+*+*+*+*+*+*+*+*+*+*+*+*+*+*+*|*+*+*+*+
C* UNIT NAME:                    drawm
C*
C* FUNCTIONAL DESCRIPTION:
C*
C*        This subroutine creates a menu segment from a segment file
C*      and/or displays that/a segment in the menu area.
C*
C*
C* INPUT FILES/PARAMETERS:
C*
C*      Global Variables
C*        qcrmnu             integer; contains the current menu number
C*        qdarry     logical array; contains flags which show if a
C*                                  particular menu segment has been
C*                                  created
C*        qmxary             integer; contains the size of the qdarry array
C*        qmnum              integer; contains the number of the current
C*                                  menu on the screen when the drawm
C*                                  subroutine is called
C*        qoldm              integer; contains the number of the previous
C*                                  menu displayed
C*
C* OUTPUT FILES/PARAMETERS:
C*
C*        values in the global variables described above
C*
C*      Screen change
C*
C*        menus will be displayed and erased by this routine
C*
C* RESTRICTIONS:
```

```
C*
C*      The value in the variable qcrmnu must be within the range of
C*    the array qdarry.
C*
C* SUBROUTINES CALLED:
C*
C*      .creatm          subroutine; creates menu segments
C*
C*      mesg             subroutine; places an appropriate message
C*                                in the communications area
C*
C* CALLED BY:                     FCFILL, PRTMEN, RESCON, RPLSCN, SUBCAL
C                                 INIPIC
C*
C* LOCAL VARIABLES:
C*
C*      no local variables
C*
C* ABNORMAL RETURN CONDITIONS:
C*
C*      A system error will occur if the value in the variable qcrmnu
C*      is not within the range of the array qdarry.
C*
C* LOCATION:
C*
C*      /u2/vcn/a21proto/drawm
C*
C* PROGRAMMER:               DATE OF LAST CHANGE:    REASON FOR CHANGE:
C*
C*  VCNewton                   15 August 1983        initial entry
C*  L. McCleary              Jan 1988          sep amp & seg - drawm
C*
C-*-*-*-*-*-*-*-*-*-*-*-*-*-*-*-*-*-*-*-*-*-*-*-*-*-*-*-*-*-*-*-*-*-*-*-*-*|*-*-*-*-

      Subroutine DRAWM (menun,ierror)

C     This subroutine creates a menu segment or makes it visible

         Integer qcrmnu,qmxary,qmnum,qoldm
         Integer qdarry(500)
         Common /b3/ qdarry,qmnum,qoldm
         Common /b6/ qcrmnu
         Common /b8/ qmxary

         ierror = 0
C        (**Ensure qcrmnu value falls within the range of the array**)
C        (**qdarry                                                **)
c         print*,'DRAWM -- enter  menun,qcrmnu,qmxary = ',menun,qcrmnu,
c     +   qmxary
         mensav = qcrmnu
         If(menun .eq. 0)menun = 1
         If ((menun .gt. 0) .and. (menun .le. qmxary)) then
C        .  (**Ensure a menu is displayed before turning**)
C           (**visibility off                           **)
            If (qcrmnu .gt. 0) Call JVISBL(qcrmnu,0)
c           print*,'after visible',qcrmnu

c           (**Erase menu area**)
C           call clrmen

C****** ERASE ALL HIGHLIGHTS FROM LAST MENU
C****** SINCE HIGHLIGHTS ARE NOW RETAINED SEGMENTS

            CALL CLRHIL

c           (**Erase menu area**)
            call clrmen

            If (qdarry(menun) .eq. 0) then
C              (**Create menu segment from file**)
               Call CREATM(menun,ierror)
               if (ierror.eq.0) then
C                 (**Set qdarry location to true to show a segment for**)
C                 (**that menu has been created                      **)
```

```
                    qdarry(menun)=1
                 else
C                   (**If a problem was found with the new menu file,**)
C                   (**retain the old menu                             **)
                    call JVISBL(qcrmnu,1)
                 endif
              Else
C                (**Display new menu if new menu's segment was already**)
C                (**created                                             **)
                 Call JVISBL(menun,1)
              Endif
           Else
              ierror = 215
              print*,'Menu number',menun,' is outside range of array : ',
     +        qmxary
C             (**Execute system error process**)
              call mesg(ierror)
              call paws
           Endif
           if (ierror.eq.0) qcrmnu = menun
c           print*,'DRAWM -- exit ierror = ',ierror
        End


C+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                       DRAWST
C
C FUNCTIONAL DESCRIPTION:          .
C
C CALLED BY:                       STATEC
C
C PROGRAMMER:                      DATE OF LAST CHANGE     REASON FOR CHANGE
c  S. Lamb                       Feb 1988                 command fix - drawst
C
C-*-*-*-*-*-*-*-*-*-*-*-*-*-*-*-*-*-*-*-*-*-*-*-*-*-*-*-*-*-*-*-*-*-*-*-*-*|*-*-*-*-
c
        subroutine drawst
c
c       this subroutine is the draw state interpreter (2)
c
        common /states/ nextst
        logical sketch,majorf,minorf
        common /statel/ sketch,majorf,minorf
        logical wordis,iseoc
        logical isfeat,isincr,isdecr,isarea,iscoor
c
        initls = nextst
c       do until nextst not = initial state
 100    continue
            call getwrd
            if (iseoc()) then
                nextst = 3
            else if (wordis('CURRENT').or.wordis('THE').or.
     +          wordis('ME').or.wordis('MAP')) then
c * ** *** **** ***** ****** ******* draw current map
                nextst = 3
            else if (wordis('MAJOR').or.wordis('LARGE')) then
                majorf = .true.
                nextst = 9
            else if (wordis('MINOR').or.wordis('SMALL')) then
                minorf = .true.
                nextst = 10
            else if (wordis('WHAT').or.wordis('CURRENT')) then
                nextst = 4
            else if (wordis('PROJECTION')) then
                nextst = 5
            else if (wordis('SCALE')) then
                nextst = 6
            else if (wordis('CENTER')) then
                nextst = 7
            else if (iscoor()) then
                nextst = 19
            else if (isfeat()) then
                nextst = 8
```

```
            else if (wordis('MORE')) then
                nextst = 21
            else if (wordis('LESS')) then
                nextst = 22
            else if (isincr()) then
                nextst = 23
            else if (isdecr()) then
                nextst = 24
            else if (isarea()) then
                nextst = 11
            else
                nextst = 20
            endif
        if (nextst.eq.initls) go to 100
c
        return
        end


C+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                       DRCMAP
C
C FUNCTIONAL DESCRIPTION:          .
C
C CALLED BY:                       STATEC
C
C PROGRAMMER:                      DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*|*-*-*-*-

        subroutine drcmap
c
c       this subroutine is the draw current map state interpreter (3)
c
        common /states/ nextst
        logical sketch,majorf,minorf
        common /statel/ sketch,majorf,minorf
c
        call drwmap
        nextst = 1
c
        return
        end


C+*+*+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:                      dricon
c
c  Functional Description:
c       this subroutine draws the icon named in the text string textst
c       with the scale in scalef (1.0 is normal).
c       This subroutine has been temporarily coded for drawing
c       only filled RECTANGLES.
c
c  Input Files/Parameters:
c       icol2 is the interior color index number
c       len is the length of textst
c
c  Output Files/Parameters: N/A
c
c  Subroutines/Functions Called:
c     Note: Subroutines preceded by a "j" are explained in the DI-3000 manual.
c
c  Called By:                      CREATM
c
c  Local Variables: N/A
c
c  Restrictions: N/A
c
c  Abnormal Return Conditions:  N/A
c
c  Location:       /a21/dave
c
c  Programmer         Date of Last Change       Reason for Change
```

```
c
C-*-*-*-*-*-*-*-*-*-*-*-*-*-*-*-*-*-*-*-*-*-*-*-*-*-*-*-*-*-*-*-*-*-*-*-*-*-*-*-*-*|*-*-*-*-

      subroutine dricon (len,textst,icol2,scalef)

c     this subroutine draws the icon named in the text string textst

      character*(*) textst

c     print*,'dricon -- enter ',len,textst(1:len),'  ',icol2,scalef

      call jpintr (1)
      call xpidex (icol2,0)
      call jrrect (3.,3.)

      return
      end

C+*+*+*+*+*+*+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:                   drlnmn
c
c  Functional Description:
c       This subroutine draws the line indicated by the device-dependent
c       linestyle in the linestyle menu.
c       This routine is a special case.
c
c  Input Files/Parameters:
c       icol2 is the device-dependent linestyle
c
c  Output Files/Parameters: N/A
c
c  Subroutines/Functions Called:
c     Note: Subroutines preceded by a "j" are explained in the DI-3000 manual.
c
c  Called By: creatm
c
c  Local Variables: N/A
c
c  Restrictions: N/A
c
c  Abnormal Return Conditions:  N/A
c
c  Location:
c
c  Programmer         Date of Last Change       Reason for Change
c
c    avw              30 May 1985               Initial entry
c
C-*-*-*-*-*-*-*-*-*-*-*-*-*-*-*-*-*-*-*-*-*-*-*-*-*-*-*-*-*-*-*-*-*-*-*-*-*-*-*-*-*|*-*-*-*-

      subroutine drlnmn (lstyl)

c     this subroutine draws the line indicated by lstyl

      integer         lstyl

c     print *, 'drlnmn -- enter - lstyl = ', lstyl

      call jlstyl (lstyl - 1)
      call jrdraw (7.5, 0.)
      call jlstyl (0)

      return
      end

C+*+*+*+*+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME: droutl
C
C FUNCTIONAL DESCRIPTION:  THIS SUBROUTINE DRAWS THE EARTH OUTLINE FOR
C                          ORTHOGRAPHIC PROJECTIONS
C
```

```
C INPUT FILES/PARAMETERS:
C
C GLOBAL VARIABLES : NONE.
C
C OUTPUT FILES/PARAMETERS:  NONE.
C
C SUBROUTINES/FUNCTIONS CALLED :
C
C CALLED BY:                        NO LONGER USED BY CARICATURE
C
C LOCAL VARIABLES: NONE.
C
C RESTRICTIONS: NONE.
C
C ABNORMAL RETURN CONDITIONS:   NONE.
C
C LOCATION:
C
C PROGRAMMER:                       DATE OF LAST CHANGE     REASON FOR CHANGE
C
C     DAVE NATION                                           ORIGINAL CODE.
C     JERRY FENERTY                                         DOCUMENT AND MODIFY
C                                                           FOR A21 PROTOTYPE.
C
C-*-*-*-*-*-*-*-*-*-*-*-*-*-*-*-*-*-*-*-*-*-*-*-*-*-*-*-*-*-*-*-*-*-*-*-*-*-*-*|*-*-*-*-

        SUBROUTINE DROUTL(ITPRO,LONINC,LATINC,CLO,CLA)

C       THIS SUBROUTINE DRAWS THE EARTH OUTLINE FOR ORTHOGRAPHIC PROJECTIONS

        COMMON /PROJT/ IGNOMN,IORTEQ,IORTPO,IORTHO,IPERSP
        COMMON /PROJT2/ IEQREC,IMERCA,ILAMCN
        COMMON /VIEWP/ XRAD,YRAD,IXNP,IYNP,XC,YC
        COMMON /CONST/ MAXVAL,RMPV,C,R,ERNM
        COMMON /PIE/ PIE,TPIE,PIO2,PIO4
        common /comgra/xllgra,yllgra,xurgra,yurgra,ibcgra,iocgra,incgra

C ----- POLYGON INTERIOR STYLE = FILLED
        CALL JPINTR (1)

C ----- POLYGON EDGE STYLE = SAME AS INTERIOR
        CALL JPEDGE (1)

        IF (ITPRO.EQ.IGNOMN) THEN
            CX1 = -XRAD
            CY1 = -YRAD
            CX2 = XRAD
            CY2 = YRAD
            GO TO 785
        ENDIF
        IF (ITPRO.EQ.IORTPO) THEN
            if (cla .ge. 0.0) then
              CALL LLTOXY(PIO2,0.,CX,CY)
            else
              CALL LLTOXY(-PIO2,0.,CX,CY)
            endif
            CALL LLTOXY(0.,0.,RX,RY)
            GO TO 760
        ENDIF
        IF (ITPRO.EQ.IORTEQ) THEN
            CALL LLTOXY(0.,CLO,CX,CY)
            CALL LLTOXY(PIO2,0.,RX,RY)
            GO TO 760
        ENDIF
        IF (ITPRO.EQ.IORTHO) THEN
            CX = 0.
            CY = 0.
            IF (CLA.GT.0) THEN
                RCLA = CLA - PIO2
            ELSE
                RCLA = CLA + PIO2
            ENDIF
            CALL LLTOXY(RCLA,CLO,RX,RY)
            GO TO 760
```

```
      ENDIF
      IF (ITPRO.EQ.IPERSP) THEN
          CX = 0.
          CY = 0.
          RX = XRAD
          RY = 0.
          GO TO 760
      ENDIF
      IF (ITPRO.EQ.IEQREC) THEN
          APXPI = PIE - .01
          CALL LLTOXY(89.*60.*C,CLO-APXPI,CX1,CY1)
          CALL LLTOXY(-89.*60.*C,CLO+APXPI,CX2,CY2)
          GO TO 785
      ENDIF
      IF (ITPRO.EQ.IMERCA) THEN
          APXPI = PIE - .01
          CALL LLTOXY(89.*60.*C,CLO-APXPI,CX1,CY1)
          CALL LLTOXY(-89.*60.*C,CLO+APXPI,CX2,CY2)
          GO TO 785
      ENDIF
      if (itpro.eq.ilamcn) then
          apxpi = pie - .001
          call lltoxy(pio2,clo+apxpi,cx1,cy1)
          call lltoxy(-pio2,clo+apxpi,cx2,cy2)
          call lltoxy(-pio2,clo-apxpi,cx3,cy3)
          call lltoxy(pio2,clo-apxpi,cx4,cy4)
          go to 788
      endif
      GO TO 790

cccccccccccccccccccccccccccccccccccccccccccccccccccccccccccccccccccccc
C              EXIT HERE TO DRAW A CIRCLE
  760       CONTINUE
               RAD=SQRT((CX-RX)**2+(CY-RY)**2)
               RCX=CX
               RCY=CY
c              add fudge factor, the circle needs to be a little larger
               RAD = RAD + 0.5
               CALL JCIRCL(RCX,RCY,0.,RAD,0)
cccccccccccccccccccccccccccccccccccccccccccccccccccccccccccccccccccccc

      GO TO 790
  785 CONTINUE
C                        DRAW RECTANGLE
      CALL JRECT (CX1, CY1, CX2, CY2)
      go to 790

  788 continue
c       draw wedge
      call jrect (-xrad, -yrad, xrad, yrad)
      call xcolor(iocgra)
      call jmove(cx1,cy1)
      call jdraw(cx2,cy2)
      call jdraw(cx3,cy3)
      call jdraw(cx4,cy4)

  790 CONTINUE
c     draw box around graphics area in case circle has erased it
      call xcolor (iocgra)
      call jmove (xrad,yrad)
      call jdraw (xrad,-yrad)
      call jdraw (-xrad,-yrad)
      call jdraw (-xrad,yrad)
      call jdraw (xrad,yrad)

      RETURN
      END

C+++++++++++++++++++++++++++++++++++++++++++++++++++++++++++++++|+++++++
c  UNIT NAME:                    drwamp
c
c  Functional Description:
c       draw amplification area
```

```
c
c  Input Files/Parameters:
c
c  Output Files/Parameters: N/A
c
c  Subroutines/Functions Called:
c
c  Called By:                    CERROR, DECDET, DISTAN, INCDET,
C                                MESSAG, PLTOVP, SCRDIA, GMCLOS
c
c  Local Variables: N/A
c
c  Restrictions: N/A
c
c  Abnormal Return Conditions:  N/A
c
c  Location:
c
c  Programmer       Date of Last Change     Reason for Change
C  L. McCleary      Jan 1988              separate amp & sys - drwamp
c  S. Lamb          Feb 1988              detec chg - drwamp
c
C-*-*-*-*-*-*-*-*-*-*-*-*-*-*-*-*-*-*-*-*-*-*-*-*-*-*-*-*-*-*-*-*-*-*-*-*-*|*-*-*-*-
c
      subroutine drwamp(amptxt,ampcnt)
c
c*** This routine draws the amplification area for messages
c*** to be displayed
        integer ampcnt
        character*72 amptxt(4),line

c         common/comwdo/qcxmn,qcymn,qcxmx,qcymx
c         real qcxmn,qcymn,qcxmx,qcymx
        common/ampwdo/qaxmn,qaymn,qaxmx,qaymx
        real qaxmn,qaymn,qaxmx,qaymx

        common /comcvp/ xllcvp,yllcvp,xurcvp,yurcvp
        common /compic/xllpic,yllpic,xurpic,yurpic
        common /comamp/xllamp,yllamp,xuramp,yuramp,ibcamp,iocamp,incamp
        common /amfrst/ amfrst
        logical amfrst
        real xpos,ypos
        common/ampprm/ampseg,ampsgb
        integer ampseg,ampsgb
        integer dstsg1,dstsg2,dstsg3
        logical dstfst
        common/mrkseg/dstsg1,dstsg2,dstsg3,dstfst
        logical square
        common /sqrdbc/ square
        common/oneflg/oneflg
        logical oneflg

c         print*,'drwamp ---enter',amptxt(1)

C       call comvpt
C       call comwin
        call ampvpt
        call ampwin

c         xllpic=qcxmn+13.
c         yllpic=qcymn+.5
c         xurpic=qcxmx-13.
c         yurpic=qcymx-3.
        xllpic=qaxmn
        yllpic=qaymn
        xurpic=qaxmx
        yurpic=qaymx
c
c         print*,'xllpic ---',xllpic
c         print*,'yllpic ---',yllpic
c         print*,'xurpic ---',xurpic
c         print*,'yurpic ---',yurpic

        if (.not. amfrst)call jpurge(ampseg)
```

```
      if(amfrst)then
c          print*,'drwamp --- amfrst being set to false'
         amfrst = .false.
         call getseg(ampseg)
         call getseg(ampsgb)
c
         call jropen(ampsgb)
         call jpkid(0)
         call jpintr (1)
         call xpidex(ibcamp,0)
c
c      print*,'drwamp ampseg-- ',ampseg
c
         if(oneflg)then
                 call enall
                 call xcolor(3)
         else
c                 call xcolor(24)
                 call xcolor(iocamp)
         endif
c
         call jrect(xllpic,yllpic,xurpic,yurpic)
         call jrclos
      else
         call jvisbl(ampsgb,0)
         call jvisbl(ampsgb,1)
      endif
c
      call jropen(ampseg)
      call jpkid(1)
      if (ampcnt.eq.0) go to 100
      if(oneflg)then
              call enall
              call xcolor(3)
      else
c              call xcolor(24)
              call xcolor(iocamp)
      endif
      call jfont(1)
      IF (.not. square) call jsize(2.,2.)
      CALL XSIZE(1.0,1.0)
      call jbase(1.0,0.0,0.0)
      call jplane(0.0,1.0,0.0)
      call jpath(1)
      call jjust(1,1)
c
      xpos = xllpic + 1.
c      ypos = yurpic - (yurpic - yllpic)/(ampcnt+1.)
      ypos = yurpic - 1.0

c      print*,'xpos ---',xpos
c      print*,'ypos ---',ypos

      call lngth(amptxt(1),72,length)
c      print*,'length of amptxt1 ',length
      call jmove(xpos,ypos)
c
      line = amptxt(1)
      call j1strg(line(1:length))
c
      if(ampcnt .gt. 1) call putamp(amptxt,ampcnt)
      if(.not.(oneflg))call soverl
c
c      print*,'drwamp --- exit'

  100 continue
      call jrclos
      call jdetec(ampseg, 1)
      return
      end
C+*+*+*+*+*+*+*+*+*+*+*+*+*+*+*+*+*+*+*+*+*+*+*+*+*+*+*+*+*+*+*+*+*+*|*+*+*+*+
C UNIT NAME:                      DRWFTR
C
C FUNCTIONAL DESCRIPTION:
```

```
C
C CALLED BY:                    DRAWFT, ERASES, REMOVF
C
C PROGRAMMER:                   DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*|*-*-*-*-

        subroutine drwftr (if)
        call drawf (if)
        return
        end

C+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    DRWICN
C
C FUNCTIONAL DESCRIPTION:       .
C
C CALLED BY:                    GETICN
C
C PROGRAMMER:                   DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*|*-*-*-*-

        subroutine drwicn(filcol,outcol)

c       This routine is the same as the drawic routine used by the
c         Icon Editor, except for option 10 which is the fill
c         option for the entire icon.  Each line of the opened
c         file is read and the appropriate routine is called based
c         on the contents of the first position.  The array read
c         in is passed to the routine and that routine will read
c         any other lines which are needed for that line, etc.
c         to be drawn, so that this routine will always read the
c         first line of the next item to be drawn.
c       VARIABLES:
c        iarray- array to hold the points read in from the file
c        filcol - index of color to be used for fill
c        outcol- index of outline color--used for regular fills
c    CALLS:     apline apcirc aprect apfill apmark apsmoo aptext aparcs
c    PROGRAMMER:  Nancy Detrich, A215, March, 1984

      integer iarray(26,100)
      character*40 ictarr(100)
      common /iconda/ lenica,iarray,ictarr
      integer filcol,outcol
      logical sys,fill
      common /sysdbc/ sys
      common /fildbc/ fill
      if (sys) then
         print*,'DRWICN -- enter ',lenica
      endif

      if (lenica.gt.0) then
       do 120 i=1,lenica

c        iarray(i,1) holds the code indicating how the coordinates
c          are to be interpreted--call appropriate routine and
c          pass iarray and a flag to indicate if a line is to be
c          written out to the '.conv' file

         if       (iarray(1,i).eq.1) then
           call apline  (iarray(1,i),.false.)
         else if (iarray(1,i).eq.2) then
           call apcirc  (iarray(1,i),.false.)
         else if (iarray(1,i).eq.3) then
           call aprect  (iarray(1,i),.false.)
         else if (iarray(1,i).eq.4) then
           if (fill) then
               call apfill  (iarray(1,i),.false.,outcol)
           endif
         else if (iarray(1,i).eq.5) then
           call apmark  (iarray(1,i),.false.)
         else if (iarray(1,i).eq.6) then
           call apsmoo  (iarray(1,i),.false.)
```

```
          else if (iarray(1,i).eq.7) then
            call aptext  (iarray(1,i),.false.,ictarr(i),nchars)
          else if (iarray(1,i).eq.8) then
            call aparcs  (iarray(1,i),.false.)
          else if (iarray(1,i).eq.9) then
            call xcolor(iarray(2,i))
          else if (iarray(1,i).eq.10) then
c          check that a fill is to be performed
           if (filcol .ne. 0) then
c            for the prototype, call xcolor
             if (fill) then
                 call apfill(iarray(1,i),.false.,filcol)
             endif
           endif
          else
c            ignore unidentified lines
          endif
  120   continue
       endif
       if (sys) then
          print*,'DRWICN -- exit '
       endif

       return
       end


C+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    DRWLOB
C
C FUNCTIONAL DESCRIPTION:
C
C CALLED BY:                    PLOTOV
C
C PROGRAMMER:                   DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*|*-*-*-*-

        subroutine drwlob (blat,blon,bazi,digrph,xrnm,itproj,iacept)
c
c       this subroutine draws a line of bearing on the current map
c
        character*2 digrph
        integer iacept

c ----- rlenth = length of 90 degrees in radians
        data rlenth/1.5708/

c ----- ernm = radius of earth in nautical miles
        data ernm/3440.34/

c ----- steps = no. of increments of bearing to put in half
c ----- a screen width
        data steps/20/

c ----- xrnm = radius of map in nautical miles

c       print*,'drwlob -- enter ',xrnm,blat,blon,bazi
c
        if (iacept.eq.1) then
            steps = 20.
        else
            steps = 60.
        endif

c ----- calculate length of increments in radians
        rinc = xrnm / (ernm*steps)

        call plotit(blat,blon,digrph,bazi,rlenth,rinc,xrnm,
     +              itproj,iacept)

c       print*,'drwlob -- Exit'
c
        return
        end
```

```
C+++++++++++++++++++++++++++++++++++++++++++++++++++++++++++++++++++++|+++++++
C UNIT NAME:                    DRWMAP
C
C FUNCTIONAL DESCRIPTION:       .
C
C CALLED BY:                    CHECK, DRCMAP, FCHSCA, FMAIN, FSHOWA,
C                               HLDF,  PROCON, RECDIS, RESCON,FDFPRO, GEOCON
C
C PROGRAMMER:                   DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*|*-*-*-*-

        subroutine drwmap

c       this subroutine draws the current map

        logical qmapup
        common /mapup/qmapup

        logical sys
        common /sysdbc/ sys

        call eramap
        qmapup = .true.
        call segmap
        if (sys)  print*,'drwmap ',iseg
        call drawit

        return
        end


C+++++++++++++++++++++++++++++++++++++++++++++++++++++++++++++++++++++|+++++++
C UNIT NAME:                    DSPFLN
C
C FUNCTIONAL DESCRIPTION:       .
C
C CALLED BY:
C
C PROGRAMMER:                   DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*|*-*-*-*-

        subroutine dspfln( name )

clj --- The real version of this file is used in CELEBRATION.  It displays,
clj --- in the communications area, the name of the picture which is currently
clj --- being viewed.

        character *50 name

        return
        end


C+++++++++++++++++++++++++++++++++++++++++++++++++++++++++++++++++++++|+++++++
C UNIT NAME:                    DWTEXT
C
C FUNCTIONAL DESCRIPTION:       .
C
C CALLED BY:                    APTEXT
C
C PROGRAMMER:                   DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*|*-*-*-*-
        subroutine dwtext(style,nchars,retstr)

c       this routine sets the font and calls the DI-3000 routine to
c         draw the text in the quality desired based on the
c         style passed by the calling routine.
c    VARIABLES:
c       retstr- text string to be displayed
c       nchars- number of characters in the text string
c       style- indicates the font selected by the user
```

```
c   PROGRAMMER:  Nancy Detrich, A215, March, 1984

        character*80 retstr
        integer style,nchars

        if (style .eq. 1) then
          call jfont(1)
          call j3strg(retstr(1:nchars))
        elseif (style .eq. 2) then
          call jfont(2)
          call j3strg(retstr(1:nchars))
        elseif (style .eq. 3) then
          call jfont(5)
          call jhstrg(retstr(1:nchars))
        elseif (style .eq. 4) then
          call jfont(6)
          call jhstrg(retstr(1:nchars))
        elseif (style .eq. 5) then
          call jfont(7)
          call jhstrg(retstr(1:nchars))
        endif

        return
        end

C+*+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:                    echps
c
c  Functional Description:
c       set keyboard echo position
c
c  Input Files/Parameters:
c
c  Output Files/Parameters: N/A
c
c  Subroutines/Functions Called:
c      Note: Subroutines preceded by a "j" are explained in the DI-3000 manual.
c
c  Called By:                    MESGJF
c
c  Local Variables: N/A
c
c  Restrictions: N/A
c
c  Abnormal Return Conditions:  N/A
c
c  Location:      /a21/dave
c
c  Programmer        Date of Last Change       Reason for Change
c
C-*-*-*-*-*-*-*-*-*-*-*-*-*-*-*-*-*-*-*-*-*-*-*-*-*-*-*-*-*-*-*-*-*-*-*-*|*-*-*-*-
c
       subroutine echps (xpos,ypos)
c
c      set keyboard echo position
c
       call jconwv(xpos,ypos,z,vx,vy)
       call jpecho(1,4,1,vx,vy)
c
       return
       end

C+*+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:                    ENALL
c
c  Functional Description:       Utility to set write mask to the viewing
c                                planes.  Sets mask for all planes.
c
c  Input Files/Parameters:       N/A
c
c  Output Files/Parameters:      N/A
c
```

```
c  Called By:                   CLRBVP, CLRCOM, CLRFUL, CLRGRA, CLRVPT,
C                               DRWAMP, FCFILL, GLTYPE, INIPIC
C                               MAPPER, RECDIS, RESCON
c
c  Local Variables:
c    code       integer         escape code number
c    ilist      integer         array of integer parameters
c    ninteg     integer         number of integer parameters
c    nreal      integer         number of real paramenters
c    rlist      real            array of real parameters
c
c  Restrictions:                N/A
c
c  Subroutines/Functions Called:        N/A
c
c  Abnormal Return Conditions:          N/A
c
c  Location:                            /u1/a21/bap/sbakovr.f
c
c  Programmer: Brian A. Pelletier
c
C-*-*-*-*-*-*-*-*-*-*-*-*-*-*-*-*-*-*-*-*-*-*-*-*-*-*-*-*-*-*-*-*-*-*-*-*-*|*-*-*-*-

      SUBROUTINE ENALL

c     set write mask to the viewing planes.  Sets mask for all planes.

        integer code, ninteg, nreal, ilist(1)
        real rlist(1)
        data code, ninteg, nreal/5127, 1, 0/
        data ilist(1)/255/
        call jescap(code, ninteg, nreal, ilist, rlist)
      return
      end


C+*+*+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:                   eramap
c
c  Functional Description:
c       clear amplification area
c
c  Input Files/Parameters:
c
c  Output Files/Parameters: N/A
c
c  Subroutines/Functions Called:
c
c  Called By:                   DRWAMP, ERASEM, RECDIS, RESCON, RPLSCN,
C                               GEOCON
c
c  Local Variables: N/A
c
c  Restrictions: N/A
c
c  Abnormal Return Conditions:  N/A
c
c  Location:
c
c  Programmer      Date of Last Change     Reason for Change
C  L. McCleary     Jan 1988             separate amp & sys - eramap
c
C-*-*-*-*-*-*-*-*-*-*-*-*-*-*-*-*-*-*-*-*-*-*-*-*-*-*-*-*-*-*-*-*-*-*-*-*-*|*-*-*-*-
c
        subroutine eramap

c       erase map

        logical lton(16),dotem,savprt
        integer ipgrid(4),ltyptb(16)
        common /map/ XRNM,XC,YC,LEVEL,CLAT,CLON,XRAD,YRAD,ITPROJ,
     +      IRES,LTYPTB,LUNDAT,LUNIND,LUNLIN,LTON,IPGRID,DOTEM,
     +      ORHALT
        common /qprint/ qprint
```

```
      logical qprint
      logical savgrd
      data lcgrid /16/

c     since inipic turns grids off for celebration purposes,
c     mapgraph wants to save the current state of grids.

      savgrd = lton(lcgrid)
      savprt = qprint
      call inipic
      lton(lcgrid) = savgrd
      qprint = savprt
      call eratrk
      call drwamp(' ',0)

      return
      end

C+*+*+*+*+*+*+*+*+*+*+*+*+*+*+*+*+*+*+*+*+*+*+*+*+*+*+*+*+*+*+*+*+*+*|*+*+*+*+
C UNIT NAME:                    ERASEM
C
C FUNCTIONAL DESCRIPTION:       .
C
C CALLED BY:                    STATEC
C
C PROGRAMMER:                   DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*|*-*-*-*-

      subroutine erasem
c
c     this subroutine is the erase map state interpreter (14)
c
      common /states/ nextst
c
      call eramap
      call legend (.true.)
      nextst = 1
c
      return
      end

C+*+*+*+*+*+*+*+*+*+*+*+*+*+*+*+*+*+*+*+*+*+*+*+*+*+*+*+*+*+*+*+*+*+*|*+*+*+*+
C UNIT NAME:                    ERASES
C
C FUNCTIONAL DESCRIPTION:       .
C
C CALLED BY:                    STATEC
C
C PROGRAMMER:                   DATE OF LAST CHANGE     REASON FOR CHANGE
c  S. Lamb                    Feb 1988                 command fix - erases
C
C-*-*-*-*-*-*-*-*-*-*-*-*-*-*-*-*-*-*-*-*-*-*-*-*-*-*-*-*-*-*-*-*-*-*-*|*-*-*-*-
c
      subroutine erases
c
c     this subroutine is the erase state interpreter (25)
c
      common /states/ nextst
      logical wordis,iseoc
      common /indpar/ indpro,indftr
      logical isfeat
c
      initls = nextst
c     do until nextst not = initial state
 100  continue
          call getwrd
          if (wordis('MAP').or.wordis('THE').or.wordis('CURRENT')
     +        .or.wordis('EVERYTHING') .or. iseoc()) then
c * ** *** **** ***** ****** ******* erase map
              nextst = 14
          else if (isfeat()) then
```

```
c               change feature's color to background color
                call drwftr (indftr)
c               change color back
                nextst = 1
            else
                call putwrd
                nextst = 14
            endif
        if (nextst.eq.initls) go to 100
c
        return
        end

C+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    ERATRK
C
C FUNCTIONAL DESCRIPTION:       .
C
C CALLED BY:                    ERAMAP
C
C PROGRAMMER:                   DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*|*-*-*-*-

        subroutine eratrk

c this routine purges the tracking segments currently active
c programmer: avw

        integer*4     i
        integer*4     numrcs
        integer*4     tkoset
        integer*4     trkndx (1000)

        logical       trackn
        logical       segact (1000)

        common /trkdbc/   trackn
        common /numrcs/   numrcs
        common /segact/   segact
        common /tkoset/   tkoset
        common /trkndx/   trkndx

        if (trackn)  print *, 'enter eratrk'

        do 10 i = 1, numrcs
           if (segact(i)) then
              call jpurge (trkndx(i)+tkoset)
              segact(i) = .false.
           end if
   10   continue
c
        if (trackn) print *, 'exit eratrk'

        return
        end

C+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    EXECUT
C
C FUNCTIONAL DESCRIPTION:       .
C
C CALLED BY:                    STATEC
C
C PROGRAMMER:                   DATE OF LAST CHANGE     REASON FOR CHANGE
c  S. Lamb                    Feb 1988                  command fix - execut
C
C-*-*-*-*-*-*-*-*-*-*-*-*-*-*-*-*-*-*-*-*-*-*-*-*-*-*-*-*-*-*-*-*-*-*-*-*|*-*-*-*-
c
        subroutine execut
c
c       this subroutine is the execute state interpreter (27)
```

```
c
        common /states/ nextst
        logical eol,eoc
        common /comnds/ lenl,indxw,lenw,eol,eoc
        logical wordis,iseoc
c
        initls = nextst
c       do until nextst not = initial state
  100   continue
            call getwrd
            if (wordis('COMMAND').or.wordis('FILE').or.wordis(':'))
     +          then
c * ** *** **** ***** ****** ******* not understood / implem
                nextst = 15
            else if (iseoc()) then
c               prompt for filename
                nextst = 1
            else
c               put word into filename
                nextst = 1
            endif
        if (nextst.eq.initls) go to 100
        if (lenfn.gt.0) then
c           open file using default path
c           if error, putwrd, msg
c           else cmdfil = .true.
        endif
c
        return
        end
C+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:                      FACT
c
c  Functional Description:         Function to return the factorial of an
c                                  integer.
c
c  Input Files/Parameters:
c        n                                 integer   number to be calculated
c
c  Output Files/Parameters:        N/A
c        fact                              real      factorial
c
c  Subroutines/Functions Called: N/A
c
c  Called By:  ICBEZ
c
c  Local Variables:
c        n                                 integer   number to be calculated
c
c  Restrictions:                   N/A
c
c  Abnormal Return Conditions:  N/A
c
c  Location:      stepc03       /w3/ssb/prototype/arrows/fact.f
c
c  Programmer         Date of Last Change       Reason for Change
c     ssb                  10/31/83               initial entry
c     ssb                   3/06/84               completion
c
C-*-*-*-*-*-*-*-*-*-*-*-*-*-*-*-*-*-*-*-*-*-*-*-*-*-*-*-*-*-*-*-*-*-*-*|*-*-*-*-

       real function fact(n)

c      Function to return the factorial of an integer.

c     ************************************************************
c     * this function uses real numbers rather than integers in
c     * order to avoid overflow for larger values -- limit is 33!
c     ************************************************************
      if (n.lt.0) then
c        print *,'ERROR--input to factorial is negative--n=',n
        fact=1.
      else
        if (n.eq.0) then
```

```
          fact=1.
        else
          fact=1.
          do 5 i=1,n
            fact=fact*i
5         continue
        endif
      endif
      return
      end
C+*+*+*+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    FADBOX
C
C FUNCTIONAL DESCRIPTION:       .
C
C CALLED BY:                    SETFAD, TIMCHK
C
C PROGRAMMER:                   DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*-*-*-*-*|*-*-*-*-

        subroutine fadbox(dtg)

c     this routine controls visibility of the boxes when the fade time
c     is changed (jit).

      character*9 dtg
      integer segnum

      integer trkndx(1000)
      character*160  trkrec(1000)
      logical spprsd(1000)
      integer lctrak

      character*2 actmrk(260)
      integer mrkcnt
      integer trklst(260)
      integer curseg(260)
      character*9 boxdtg(260)
      logical boxvis(260)

      integer ltypov(16)
      logical ltonov(16), rankt(26,16)

      common /actmrk/ trklst,mrkcnt,actmrk,curseg,
     +                boxdtg,boxvis
      common /trkndx/ trkndx
      common /trkrec/ trkrec
      common /spprsd/ spprsd
      common /maptoo/ ltypov, ltonov, rankt

      data lctrak /3/

      do 10 i = 1, mrkcnt
         segnum = curseg(i)
c
c        if box in position i of the array is older than the dtg for
c        the oldest possible non-faded box, then make that box invisible.
c
         if (boxdtg(i) .lt. dtg) then
           if (boxvis(i)) then
                call jvisbl(segnum,0)
              boxvis(i) = .false.
           endif
         else
c
c          if the box at this position has a more recent dtg than the dtg
c          for the oldest possible non-faded box then make that box visible
c          as long as the plot with that box is not suppressed.
c
           if (.not. boxvis(i)) then
              j = 1
100           if (trkrec(trkndx(j))(22:30) .eq. boxdtg(i)) goto 110
              j = j + 1
```

```
               goto 100
  110          continue
               if (.not. spprsd(trkndx(j))) then
                  if (ltonov(lctrak)) then
                     call jvisbl(segnum,1)
                  endif
                  boxvis(i) = .true.
               endif
            endif

         endif

   10  continue

       return

       end

C+*+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                        FADCHG
C
C FUNCTIONAL DESCRIPTION:           .
C
C CALLED BY:                        SETFAD, TRKINI
C
C PROGRAMMER:                       DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*-*|*-*-*-*-

      subroutine fadchg (dtg)

c
c     this subroutine sets the fade dtg and the fade index based
c     upon the fade time given
c

      character*9 dtg
      character*9 curdtg
      integer*2 newtim(6)
      integer yrsub
      integer monsub
      integer daysub
      integer hrsub
      integer minsub
      integer juldat
      integer yr, mon, day
      integer hour, min

      data yrsub  /1/
      data monsub /2/
      data daysub /3/
      data hrsub  /4/
      data minsub /5/

c
c***  newtim is returned in int(6) format where
c***  year =  newtim(1)
c***  month = newtim(2)
c***  day   = newtim(3)
c***  hour  = newtim(4)
c***  minute= newtim(5)
c***  newtim(6) = seconds (not used)
c
      call gettim(newtim)
      yr =   newtim(yrsub)
      mon =  newtim(monsub)
      day =  newtim(daysub)
      hour = newtim(hrsub)
      min  = newtim(minsub)
c
c***  convert yr/mon/day to julian date
c
      call julian(yr,mon,day,juldat)
```

```
c
c***  express curdtg in character format as yydddhhmm
c
      call chdate (yr,juldat,hour,min,curdtg)
c
c***  reset fade dtg global based upon new fade time in minutes -tfadtm
c
      call fadtim(curdtg,dtg)

      return
      end


C+++++++++++++++++++++++++++++++++++++++++++++++++++++++++++++++++++++|+++++++
C UNIT NAME:                      FADTIM
C
C FUNCTIONAL DESCRIPTION:         .
C
C CALLED BY:                      FADCHG, TIMCHK
C
C PROGRAMMER:                     DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*|*-*-*-*-
c
      subroutine fadtim(curdtg, lasdtg)
c
c  calculate the oldest dtg that a track can have and still be displayed
c  dtg is in yydddhhmm format
c  this is done by subtracting the current fade time (tfadtm) from the
c  current clock time (curdtg).
c  RESTRICTION:  fade time is expressed in hh:mm and cannot exceed 36:00
c
      character*9 curdtg
      character*9 lasdtg
      integer curyr, curday, curhr, curmin
      integer lasyr, lasday, lashr, lasmin
      integer cnthr
      integer cntday
      integer tfaddx
      integer tfadtm
      common /tfadez/ tfaddx, tfadtm

      read(curdtg,10,err=100) curyr, curday, curhr, curmin
 10   format(i2,i3,i2,i2)

c     initialize all date variables to current date/time
      lasyr = curyr
      lasday = curday
      lashr = curhr
      lasmin = curmin

c     find last minute for display list

      lasmin = curmin - tfadtm
      if (lasmin .lt. 0 .or. tfadtm .ge. 60) then
          if (mod(abs(lasmin),60) .eq. 0) then
               lasmin = 0
          else
               lasmin = 60 - mod(abs(lasmin),60)
          endif

c         next, find last hour for display list if diff

          cnthr = tfadtm / 60
cc          if (mod(tfadtm,60) .ne. 0) then
cc               cnthr = cnthr + 1
cc          endif
          if (lasmin .gt. curmin) then
                 cnthr = cnthr + 1
          endif
          lashr = lashr - cnthr
          if (lashr .lt. 0) then
               if(mod(abs(lashr),24) .eq. 0) then
                  lashr = 0
```

```
            else
               lashr = 24 - mod(abs(lashr),24)
            endif

c           third find the julian day of the year if diff

            cntday = tfadtm / 1440
            if (mod(tfadtm,1440) .ne. 0) then
               cntday = cntday + 1
            endif
            lasday = curday - cntday
            if (lasday .lt. 1) then

c              fourth, set the year if different

               lasyr = curyr - 1
               if ((mod(lasyr,4) .eq. 0) .and.
     +            ((mod(lasyr,100) .ne. 0) .or.
     +             (mod(lasyr,400) .eq. 0))) then
                   lasday = 366
               else
                   lasday = 365
               endif
            endif
         endif
      endif

c     express lasdtg in character format

      call chdate(lasyr,lasday,lashr,lasmin,lasdtg)
      goto 200
 100  print*,'error in fadtim read'
 200  continue

      return
      end

C+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                     FANNOT
C
C FUNCTIONAL DESCRIPTION:        .
C
C CALLED BY:                     GEOCON
C
C PROGRAMMER:                    DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*|*-*-*-*-

        subroutine fannot

c       annotote function
        character * 80 retstr

        irchar = 80
        retstr = '                                        '
        CALL PROMPT(1206,retstr,80,irchar)
        if (irchar.gt.0) then
           call mesg(1207)
           call annota (retstr,irchar)
        endif

        return
        end
C+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:                    FCFILL
c
c  Functional Description:
c       Color area fill function
c
c  Input Files/Parameters:
c
c  Output Files/Parameters:
c
```

```
c  Subroutines/Functions Called:
c      mesg                        displays messages in the communica-
c                                   tions area
C
C  CALLED BY:                      GEOCON
c
c  Programmer          Date of Last Change        Reason for Change
c  L McCleary          Jan 1988            check for CANCEL - fcfill
c  L McCleary          Jan 1988          bkgrd investigation - fcfill
c
C-*-*-*-*-*-*-*-*-*-*-*-*-*-*-*-*-*-*-*-*-*-*-*-*-*-*-*-*-*-*-*-*-*-*-*-*-*|*-*-*-*-

        subroutine fcfill

c       Color area fill function

        common /b1/ qcancl,qext2m,qretrn,qstmnu,qnextm
        integer qnextm,hltab(34),ihllen
        logical qcancl,qext2m,qretrn,qstmnu
        common /b5/ qexitg
        logical qexitg
        logical bxclr
        common /bxcdbc/ bxclr
        common /defpth/ defpth
        character*50 defpth
        common /lendef/ lendef
        logical renew
        common /scratr/ qbox,qbkgrd
        integer qbox,qbkgrd
        integer button,icol

        integer qfb(26),qmb(4)
        common /butons/ qfb,qmb
        logical qlton(16),qdotem
        integer qpgrid(4),qtyptb(16)
        integer qlevel,qitpro,qires,qlunda,qlunin,qlunli
        real qxrnm,qxc,qyc,qclat,qclon,qxrad,qyrad,qorhal
        common /map/ qxrnm,qxc,qyc,qlevel,qclat,QCLON,QXRAD,QYRAD,
     +     qitpro,qires,qtyptb,qlunda,qlunin,qlunli,qlton,qpgrid,
     +     qdotem,qorhal

        data ihllen /34/

                if (bxclr) call enall
                qretrn = .false.
                qext2m = .false.
                qcancl = .false.
c                qbkgrd = qtyptb(8)
                call drawm(29,ierror)
                if (bxclr) call soverl
20              continue
                    call colbak
                if (.not.(qcancl.or.qext2m.or.qretrn)) goto 20
                qretrn = .false.
                if (bxclr) call enall
                call drawm(2,ierror)
                if (bxclr) call soverl
                call hilite(.true.,ichoic,1,ihllen,hltab)
                call mesg (1232)
                renew = .true.
                icol = qbkgrd
30              continue
                    call locat(button,vx,vy)
c                    if (button.eq.8) goto 40
                    if (button.eq.8.or.button.eq.qmb(3)) goto 40
                    call enall
                    call jfillv(5126,icol,vx,vy,renew)
                    call soverl
                    if (renew) renew = .false.
                goto 30
40              continue

        return
        end
```

```
C+*+*+*+*+*+*+*+*+*+*+*+*+*+*+*+*+*+*+*+*+*+*+*+*+*+*+*+*+*+*+*+*+*+*+*|*+*+*+*+
C UNIT NAME: fdrawv
C
C FUNCTIONAL DESCRIPTION:  DRAWS A VECTOR FROM THE CURRENT GRAPHICS CURSOR
C                                LOCATION TO (X, Y)
C
C INPUT FILES/PARAMETERS:
C
C GLOBAL VARIABLES : NONE.
C
C OUTPUT FILES/PARAMETERS:  NONE.
C
C SUBROUTINES/FUNCTIONS CALLED :
C
C CALLED BY:                     FLUSHB, FPOSIT, PLOTIT, PROCPO
C
C LOCAL VARIABLES: NONE.
C
C RESTRICTIONS: NONE.
C
C ABNORMAL RETURN CONDITIONS:    NONE.
C
C LOCATION:
C
C PROGRAMMER:                    DATE OF LAST CHANGE     REASON FOR CHANGE
C
C     DAVE NATION                                       ORIGINAL CODE.
C     JERRY FENERTY                                     DOCUMENT AND MODIFY
C                                                       FOR A21 PROTOTYPE.
C     Edward Swing              10--86                  Fixed wrap-around lines
C
C-*-*-*-*-*-*-*-*-*-*-*-*-*-*-*-*-*-*-*-*-*-*-*-*-*-*-*-*-*-*-*-*-*-*-*-*|*-*-*-*-

        SUBROUTINE FDRAWV (X,Y)

C       DRAWS A VECTOR FROM THE CURRENT GRAPHICS CURSOR LOCATION TO (X,Y)

        COMMON /PIE/ PIE,TPIE,PIO2,PIO4
        common /gmpos/ gmxpos,gmypos
        LOGICAL PSLAST
        COMMON /PSLAST/ PSLAST,XPOS,YPOS
        LOGICAL SAVEXY,xgto,xpgto
        COMMON /STMSGS/ XPREV,YPREV,IRESSQ,XSAV,YSAV,SAVEXY
        COMMON /VIEWP/ XRAD,YRAD,IXNP,IYNP,XC,YC
c       map parameters
        logical lton(16),dotem
        integer ipgrid(4),ltyptb(16)
        common /map/ XRNM,XCA,YCA,LEVEL,CLAT,CLON,XRADA,YRADA,ITPROJ,
     +      IRES,LTYPTB,LUNDAT,LUNIND,LUNLIN,LTON,IPGRID,DOTEM,
     +      ORHALT
c       the next declarations added for polyline processing
        real xpoly(500),ypoly(500)
        real tmplat,tmplon, dellat,dellon
        common /poly/ xpoly,ypoly
        common /inpoly/inpoly
        COMMON /PROJT/ IGNOMN,IORTEQ,IORTPO,IORTHO,IPERSP
        COMMON /PROJT2/ IEQREC,IMERCA,ILAMCN
        COMMON /COUNTS/ ICNTGP,ICNTDV,icntpl
        real epsilon,circum
        real dxr,dpxr, tmpx,tmpprvx
        data epsilon /0.001/
        data mxpoly/500/

        SAVEXY=.FALSE.
        XVEC=X-XPREV
        YVEC=Y-YPREV
C       THIS CODE IS NECESSARY TO RESOLVE THE LONG VECTOR PROBLEM WITH
C       RECTANGULAR PROJECTIONS

        call sgn(x,xgto)
        call sgn(xprev,xpgto)
        IF (xgto.neqv.xpgto) then
          if ((itproj.eq.ieqrec).or.(itproj.eq.imerca)
     +                         .or.(xvec.gt.xrad)) then
```

```
      call xytoll(x,y,trlat,trlon)
      call xytoll(xprev,yprev,prvlat,prvlon)
      dxr=abs(trlon-clon)
      dpxr=abs(prvlon-clon)
      if (dxr.gt.pie) then
          dxr = tpie - dxr
      endif
      if (dpxr.gt.pie) then
          dpxr = tpie - dpxr
      endif
c    This code checks if the line is larger than halfway around the globe
c    If so, this section draws the opposite line segment - the shorter one
      if (dxr+dpxr.gt.pie) then
          call lltoxy(0.,0.,tmplat,tmplon)
          call lltoxy(.1,.1,dellat,dellon)
          dellon = abs(dellon - tmplon)
          circum = dellon*tpie/.1
          if (x.gt.0.) then
            tmpx = x - circum
            tmpprvx = xprev + circum
          else
            tmpx = x + circum
            tmpprvx = xprev - circum
          endif
          if (pslast) then
            pslast = .false.
          else
            icntdv = icntdv + 1
            inpoly = inpoly + 1
            xpoly (inpoly) = tmpx
            ypoly (inpoly) = y
          endif
          call flpoly
          call jmove(x,y)
          icntgp = icntgp + 1
          gmxpos = xpos
          gmypos = ypos
      endif
    elseif ((yvec.gt.yrad).or.(xvec.gt.xrad)) then
      call fposit(x,y)
    endif
  endif
  IF (PSLAST) THEN
      PSLAST = .FALSE.
c     move to new location before continuing to draw
c     flush the polyline buffer and place new starting
c     coordinates into the arrays
      call flpoly
      CALL JMOVE (XPOS,YPOS)
      icntgp = icntgp + 1
      gmxpos = xpos
      gmypos = ypos
  endif
  IF(XVEC*XVEC+YVEC*YVEC.LE.IRESSQ) THEN
      XSAV=X
      YSAV=Y
      SAVEXY=.TRUE.
  ELSE
      icntdv = icntdv + 1
c     place values into polyline buffers
      inpoly = inpoly + 1
      xpoly (inpoly) = x
      ypoly (inpoly) = y
      if ( inpoly .eq. mxpoly ) then
          call flpoly
          gmxpos = x
          gmypos = y
      endif
      XPREV=X
      YPREV=Y
  ENDIF

  RETURN
  END
```

```
C+*+*+*+*+*+*+*+*+*+*+*+*+*+*+*+*+*+*+*+*+*+*+*+*+*+*+*+*+*+*+*+*+*|*+*+*+*+
C UNIT NAME: FILLIT
C
C FUNCTIONAL DESCRIPTION:  FILLS BODIES OF WATER ON THE CURRENT MAP.
C
C INPUT FILES/PARAMETERS:
C
C        ICOL                    INTEGER     COLOR.
C        XRNM                    REAL        NAUTICAL MILE RADIUS.
C        LEVEL                   INTEGER     LEVEL OF DETAIL OF WATER
C                                            FEATURES.
C
C GLOBAL VARIABLES :
C
C        LENMAP                  INTEGER     LENGTH OF FILL PATHNAME.
C        MAPATH                  CHAR*50     MAP DATA PATHNAME.
C
C OUTPUT FILES/PARAMETERS:  NONE.
C
C SUBROUTINES/FUNCTIONS CALLED :
C
C        INVTES                  TESTS LAT/LONG PAIR FOR INVISIBILITY.
C        FILLPT                  COLORS POINT X,Y.
C
C CALLED BY: DMAPII.
C
C LOCAL VARIABLES:
C
C        ISINV                   LOGICAL     INDICATES INVISIBILITY.
C        IFL                     INTEGER     LOGICAL UNIT NUMBER FOR
C                                            FILL FILE.
C        CHATMP                  CHAR*50     FULL PATHNAME.
C        XRV                     REAL        XRNM*.8
C        RLAT                    REAL        LATITUDE OF FILL POINT.
C        RLON                    REAL        LONGITUDE OF FILL POINT.
C        XRN                     REAL        DIAMETER OF BODY OF WATER.
C        ITYP                    INTEGER     TYPE OF BODY OF WATER.
C        LEVL                    INTEGER     LEVEL OF DETAIL.
C        renew                   logical     indicates whether this is the first
C                                            point in a series
C
C RESTRICTIONS: NONE.
C
C ABNORMAL RETURN CONDITIONS:   NONE.
C
C LOCATION:                     /a21/gjf/MAPSRC.FTN
C
C PROGRAMMER:                   DATE OF LAST CHANGE     REASON FOR CHANGE
C
C     DAVE NATION                                       ORIGINAL CODE.
C     JERRY FENERTY                                     DOCUMENT AND MODIFY
C                                                       FOR A21 PROTOTYPE.
C     Dave Nation               5/6/85                  Change fill path name
C                                                       from defpth to mapath
C
C-*-*-*-*-*-*-*-*-*-*-*-*-*-*-*-*-*-*-*-*-*-*-*-*-*-*-*-*-*-*-*-*-*-*|*-*-*-*-

      SUBROUTINE FILLIT (ICOL,XRNM,LEVEL)

C     THIS SUBROUTINE READS THE FILL FILE AND FILLS BODIES OF WATER
C     ON THE CURRENT MAP

C     INPUT PARAMETERS:
C       ICOL - COLOR INDEX VALUE TO USE AS FILL COLOR
C       XRNM - 1/2 THE WIDTH OF THE CURRENTLY DISPLAYED MAP IN
C               NAUTICAL MILES (X RADIUS)
C       LEVEL - CURRENT LEVEL OF DETAIL FOR INCLUSION OF GEOGRAPHIC
C               FEATURES (1=LEAST DETAIL, 15=MOST DETAIL)

C     SUBROUTINES CALLED:
C       INVTES - TESTS A LAT/LON PAIR FOR INVISIBILITY (ON OPPOSITE
C                SIDE OF GLOBE) FOR CIRCULAR PROJECTIONS
C       FILLPT - FILLS USING A SELECTED LAT/LON PAIR WITH COLOR ICOL
```

```
        logical renew
        CHARACTER*50 CHATMP
        character*50 mapath
        common /mapath/ mapath
        common /lenmap/ lenmap
        LOGICAL ISINV
        logical interr
        common /interr/ interr
        character ch
        DATA IFL/15/

        if(lenmap .gt. 0) then
            chatmp = mapath(1:lenmap) // 'FILL.dat'
        else
            chatmp = 'FILL.dat'
        endif
C
        OPEN(UNIT=IFL,FILE=CHATMP(1:LENMAP+8),err=181,
     +                              STATUS='UNKNOWN')
C
        REWIND(IFL)
        XRV = XRNM*.8
        renew = .true.
  100   CONTINUE
             call chint (interr,ch)
             if (interr) go to 190
             READ (IFL,10100,END=190,ERR=180) RLAT,RLON,XRN,ITYP,LEVL
     +           ,ITPRO
10100        FORMAT(2F11.7,F10.0,3I5)
             CALL INVTES (RLAT,RLON,ISINV)
             IF (.NOT.ISINV) THEN
                 IF (LEVL.LE.LEVEL) THEN
                     IF (XRN.GE.XRV) THEN
                         CALL FILLPT (ICOL,RLAT,RLON,renew)
                     ENDIF
                 ENDIF
             ENDIF
             GO TO 100
  180   CONTINUE
c            PRINT*,'ERROR ON READ OF FILL FILE'
             go to 190
  181   continue
c             print*,'Open error on fill file ',chatmp
  190   CONTINUE
        CLOSE (IFL)

        RETURN
        END


C+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                      FILLPT
C
C FUNCTIONAL DESCRIPTION:         .
C
C CALLED BY:                      AREAFL, FILLIT
C
C PROGRAMMER:                     DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*|*-*-*-*-

        SUBROUTINE FILLPT (ICOL,RLAT,RLON,renew)

C       THIS SUBROUTINE CONVERTS A CANDIDATE LAT/LON TO X/Y AND CALLS THE
C           PRIMITIVE FILL FUNCTION IF THE POINT IS ON THE SCREEN

C       INPUT PARAMETERS:
C         ICOL - COLOR INDEX VALUE TO USE AS FILL COLOR
C         RLAT - LATITUDE OF POINT TO BE FILLED IN RADIANS
C         RLON - LONGITUDE OF POINT TO BE FILLED IN RADIANS

C       SUBROUTINES CALLED:
C         LLTOXY - CONVERT LAT/LON PAIR TO X/Y USING CURRENT PROJECTION
C         CLIPXY - FIND OUT WHETHER X/Y IS WITHIN THE CURRENT SCREEN BOUNDARY
```

```
C         JFILLM - PRIMITIVE HARDWARE FILL FUNCTION AT X/Y WITH COLOR ICOL
C                  (A STANDARD ESCAPE FUNCTION WITH THE AED512 DI-3000 DRIVER)

        logical renew
        LOGICAL NEWONS
        LOGICAL INVALI
        COMMON /INVALI/ INVALI
        logical map
        common /mapdbc/ map

        INVALI = .FALSE.
        CALL LLTOXY(RLAT,RLON,X,Y)
        if (map) print*,'fillpt -- ',rlat,rlon,x,y,invali,renew
        IF (.NOT.INVALI) THEN
            CALL CLIPXY (X,Y,NEWONS)
            IF (NEWONS) THEN
                 if (map) print*,'fillpt -- ',x,y
                 CALL JFILLM (ICOL,X,Y,renew)
                 if (renew) renew = .false.
            ENDIF
        ENDIF

        RETURN
        END

C+++++++++++++++++++++++++++++++++++++++++++++++++++++++++++++++++++++++++|+++++++
C UNIT NAME:                     FINDTK
C
C FUNCTIONAL DESCRIPTION:        .
C
C CALLED BY:                     CHECK
C
C PROGRAMMER:                    DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*|*-*-*-*-

      subroutine findtk(segnam,found)

c
c     this subroutine finds and displays a track that matches the segment
c     segnam.  This routine is called from CHECK which is used for interrogation
c     from any menu.  So if user PICKS on a track at any time other than while
c     in the interrogate menu option, this routine will be called.

      logical endlst
      logical found

      integer*4 chkndx
      integer*4 chkseg
      integer*4 lctrak
      integer*4 segnam

      integer*4 ltypov (16)
      logical ltonov (16)
      logical rankt (26, 16)
      common /maptoo/ ltypov, ltonov, rankt
      integer*4 tkoset
      common /tkoset/ tkoset
      integer*4 trkndx(1000)
      common /trkndx/ trkndx
      integer*4 tfaddx
      integer*4 tfadtm
      common /tfadez/ tfaddx, tfadtm
      integer*4 tnewst
      integer*4 toldst
      common /tarbou/ tnewst, toldst
      integer*4 numrcs
      common /numrcs/ numrcs

      data lctrak  /3/


      found = .false.
      if (ltonov(lctrak)) then
```

```
c          chkndx = mod(tfaddx,numrcs) - 1
c         prevent indexing trkndx by 0
          if (tfadddx .gt. 0) then
             chkndx = mod(tfaddx,numrcs) - 1
          else
             chkndx = 0
          endif
c
          found = .false.
          endlst = .false.
c
c         search list until a segment match is found
c         or the end of the list is reached
c
 100      if (found .or. endlst) goto 110
                chkndx = mod(chkndx,numrcs) + 1
                chkseg = trkndx(chkndx) + tkoset
                if (chkseg .eq. segnam) then
                       found = .true.
                else
                       if (chkndx .eq. tnewst) then
                              endlst = .true.
                       endif
                endif
           goto 100
 110       continue
c
c          if match is found, then print information related
c          to that particular track in the communications area
c
           if (found) then
                 call tkinfo(chkndx,chkseg)
           endif
       endif

       return
       end

C+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME: flpoly
C
C FUNCTIONAL DESCRIPTION:  this subroutine flushes the polyline buffer
C
C INPUT FILES/PARAMETERS:
C
C GLOBAL VARIABLES : NONE.
C
C OUTPUT FILES/PARAMETERS:  NONE.
C
C SUBROUTINES/FUNCTIONS CALLED :
C
C CALLED BY:                      FDRAWV, FLUSHB
C
C LOCAL VARIABLES: NONE.
C
C RESTRICTIONS: NONE.
C
C ABNORMAL RETURN CONDITIONS:   NONE.
C
C LOCATION:
C
C PROGRAMMER:                     DATE OF LAST CHANGE      REASON FOR CHANGE
C
C     DAVE NATION                                          ORIGINAL CODE.
C     JERRY FENERTY                                        DOCUMENT AND MODIFY
C                                                          FOR A21 PROTOTYPE.
C
C-*-*-*-*-*-*-*-*-*-*-*-*-*-*-*-*-*-*-*-*-*-*-*-*-*-*-*-*-*-*-*-*-*-*-*-*|*-*-*-*-

        subroutine flpoly

c       this subroutine flushes the polyline buffer
```

```
      real xpoly(500),ypoly(500)
      common /poly/ xpoly,ypoly
      common /inpoly/inpoly
      COMMON /COUNTS/ ICNTGP,ICNTDV,icntpl

      if ( inpoly .gt. 0 ) then
         call jpoly (xpoly,ypoly,inpoly)
         icntpl = icntpl + 1
         inpoly =  0
      end if

      return
      end


C+*+*+*+*+*+*+*+*+*+*+*+*+*+*+*+*+*+*+*+*+*+*+*+*+*+*+*+*+*+*+*+*+*|*+*+*+*+
C UNIT NAME: FLUSHB
C
C FUNCTIONAL DESCRIPTION:  FLUSHES GRAPHICS BUFFER.
C
C INPUT FILES/PARAMETERS:  NONE.
C
C GLOBAL VARIABLES :
C
C       XSAV                  REAL       SAVED X COORDINATE.
C       YSAV                  REAL       SAVED Y COORDINATE.
C       SAVEXY                LOGICAL    INDICATES IF POINT WAS SAVED.
C       IRESSQ                REAL       RESOLUTION OF LINES.
C
C OUTPUT FILES/PARAMETERS:  NONE.
C
C SUBROUTINES/FUNCTIONS CALLED : NONE.
C
C CALLED BY:                    CHKSIZ, DMAPII, DRAWEL, DROUTL, GLTYPE,
C                               GTEXT,  LLGRID, MAPPER, PLOTIT,
C                               PLTOVP
C
C LOCAL VARIABLES:
C
C       IRESSV                REAL       RESOLUTION OF LINES.
C
C RESTRICTIONS: NONE.
C
C ABNORMAL RETURN CONDITIONS:   NONE.
C
C LOCATION:                     /a21/gjf/MAPSRC.FTN
C
C PROGRAMMER:                   DATE OF LAST CHANGE    REASON FOR CHANGE
C
C     DAVE NATION                                      ORIGINAL CODE.
C     JERRY FENERTY                                    DOCUMENT AND MODIFY
C                                                      FOR A21 PROTOTYPE.
C
C-*-*-*-*-*-*-*-*-*-*-*-*-*-*-*-*-*-*-*-*-*-*-*-*-*-*-*-*-*-*-*-*-*-*|*-*-*-*-

      SUBROUTINE FLUSHB

C     THIS SUBROUTINE FLUSHES THE GRAPHICS BUFFER

      LOGICAL SAVEXY
      COMMON /STMSGS/ XPREV,YPREV,IRESSQ,XSAV,YSAV,SAVEXY

C ***** VERY SHORT VECTORS HAVE BEEN DISABLED COMPLETELY
C ***** THIS CAN CAUSE HOLES IN LINES AND ELIMINATE SMALL ISLANDS
C ***** TO REENABLE, PUT THE FOLLOWING IF BLOCK BACK IN

      IF (SAVEXY) THEN
          IRESSV=IRESSQ
          IRESSQ=0
          CALL FDRAWV(XSAV,YSAV)
          IRESSQ=IRESSV
      ENDIF

      call flpoly
```

```
      CALL JUPDAT

      RETURN
      END
C++++++++++++++++++++++++++++++++++++++++++++++++++++++++++++++++++++|+++++++
C UNIT NAME:                   FMTGEO
C
C FUNCTIONAL DESCRIPTION:      .
C
C CALLED BY:                   DISCEN
C
C PROGRAMMER:                  DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*|*-*-*-*-

        subroutine fmtgeo (flat,flon,geostr)
c
c       format geo coordinate for ascii display
c
        character nsi,ewi
        real*8 rdlat,rdlon
        integer*4 iilat,iilon
        real*8 rlat,rlon
        character*20 geostr
        real*8 dtor,stor
        common /dtor/ dtor,stor
c
        rlat = flat
        rlon = flon
        if (rlat.gt.1.58.or.rlat.lt.-1.58
     +  .or.rlon.gt.3.15.or.rlon.lt.-3.15) then
c           print*,'Invalid Geo value : ',rlon,rlat
            iegeo = 1
        else
            iegeo = 0
        endif
        geostr = ' '
        if (iegeo.gt.0) then
            write (geostr,1200) iegeo
 1200       format('GEO conv. error ',i2,2x)
        else
            rdlat = abs(rlat) / dtor
            rdlat = (rdlat * 3600. + .5) / 3600.
            idlat = rdlat
            imlat = (rdlat - idlat) * 60.
            islat = (rdlat - idlat - imlat / 60.) * 3600.
            iilat = islat + imlat * 100 + idlat * 10000
            nsi = 'N'
            if (rlat.lt.0) nsi = 'S'
            rdlon = abs(rlon) / dtor
            rdlon = (rdlon * 3600. + .5) / 3600.
            idlon = rdlon
            imlon = (rdlon - idlon) * 60.
            islon = (rdlon - idlon - imlon / 60.) * 3600.
            iilon = islon + imlon * 100 + idlon * 10000
            ewi = 'E'
            if (rlon.lt.0) ewi = 'W'
            write (geostr,1500) iilat,nsi,iilon,ewi
 1500       format(i6,a1,i7,a1)
        endif
c       print*,'fmtgeo -- exit ',rlat,rlon,'  ',geostr
c
        return
        end

C++++++++++++++++++++++++++++++++++++++++++++++++++++++++++++++++++++|+++++++
C UNIT NAME:                   FNDHLP
C
C FUNCTIONAL DESCRIPTION:      .
C
C CALLED BY:                   HELP
C
C PROGRAMMER:                  DATE OF LAST CHANGE     REASON FOR CHANGE
```

```
C
C-*-*-*-*-*-*-*-*-*-*-*-*-*-*-*-*-*-*-*-*-*-*-*-*-*-*-*-*-*-*-*-*-*-*-*-*-*-*-*-*-*|*-*-*-*-

        subroutine fndhlp(ifl,helpno,eof,eom)
c
c       subroutine to find the numbered help message
c
        logical eof,eom
        character cchar
        character*80 msg
        integer msgnum,helpno

c       print*,'in fndhlp'
        eof=.false.
        eom=.false.
300     continue
        read(ifl,1300,end=320,err=310)cchar,msg
1300    format(a1,a80)
        if (cchar.eq.'C'.or.cchar.eq.'c') go to 300
        if (cchar.eq.'M'.or.cchar.eq.'m') then
                read(msg,1350,end=320,err=310)msgnum
1350            format(i5)
                if (msgnum.eq.helpno) go to 330
        endif
        go to 300
310     continue
        print*,'read error on message file',msgnum
        go to 330
320     continue
        eof=.true.
c       print*,'end of file'
330     continue
c       print*,'end fndhlp'
        return
        end


C+*+*+*+*+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME: FORMT
C
C FUNCTIONAL DESCRIPTION:  FORMATS LAT/LONG (RADIANS) INTO A CHARACTER
C                          STRING OF TYPE DDMMSSN/DDDMMSSE.
C
C INPUT FILES/PARAMETERS:
C
C       RLAT                    REAL        LATITUDE.
C       RLON                    REAL        LONGITUDE.
C       IEGEO                   INTEGER     ERROR CONDITION.
C
C GLOBAL VARIABLES : NONE.
C
C OUTPUT FILES/PARAMETERS:
C
C       GEOSTR                  CHAR*20     STRING WHICH HOLDS DDMMSSN/DDDMMSS
C
C SUBROUTINES/FUNCTIONS CALLED : NONE.
C
C CALLED BY:                      LLSHOW, SCPDIA
C
C LOCAL VARIABLES:
C
C       NSI                     CHARACTER   NORTH/SOUTH INDICATOR.
C       EWI                     CHARACTER   EAST/WEST INDICATOR.
C       SLASH                   CHARACTER   /.
C       RDLAT                   REAL*8      DEGREES LATITUDE.
C       RDLON                   REAL*8      DEGRESS LONGITUDE
C       IILAT                   INTEGER     DDMMSS LATITUDE.
C       IDLAT                   INTEGER     DEGREES LATITUDE.
C       IMLAT                   INTEGER     MINUTES LATITUDE.
C       ISLAT                   INTEGER     SECONDS LATITUDE.
C       IILON                   INTEGER     DDDMMSS LONGITUDE.
C       IDLON                   INTEGER     DEGREES LONGITUDE.
C       IMLON                   INTEGER     MINUTES LONGITUDE.
C       ISLON                   INTEGER     SECOND LONGITUDE.
```

```
C        DTOR                  REAL        DEGREES TO RADIANS CONVERSION.
C
C RESTRICTIONS: NONE.
C
C ABNORMAL RETURN CONDITIONS:   NONE.
C
C LOCATION:                     /a21/gjf/A21GEO.FTN
C
C PROGRAMMER:                 . DATE OF LAST CHANGE     REASON FOR CHANGE
C
C     DAVE NATION                                       ORIGINAL CODE.
C     JERRY FENERTY                                     DOCUMENT AND MODIFY
C                                                       FOR A21 PROTOTYPE.
C
C-*-*-*-*-*-*-*-*-*-*-*-*-*-*-*-*-*-*-*-*-*-*-*-*-*-*-*-*-*-*-*-*-*-*-*-*-*-*-*|*-*-*-*-

        SUBROUTINE FORMT (RLAT,RLON,IEGEO,GEOSTR)

C       FORMAT GEO COORDINATE FOR ASCII DISPLAY

        CHARACTER NSI,EWI,SLASH
        REAL*8 RDLAT,RDLON
        INTEGER*4 IILAT,IILON
C  COMMENTED OUT BECAUSE LLSHOW CALLS FORMT WITH REAL.

C        REAL*8 RLAT,RLON

        CHARACTER*(*) GEOSTR

        GEOSTR = ' '
        DTOR = DATAN (1.0D0)
        DTOR = DTOR / 45.D0

        IF (IEGEO.GT.0) THEN

            WRITE (GEOSTR,1200) IEGEO
 1200       FORMAT('GEO CONV. ERROR ',I2,2X)

        ELSE

C  BREAK DOWN LAT/LONG INTO DEGREES, MINUTES AND SECONDS AND LOAD THEM
C  INTO STRING.

            RDLAT = ABS(RLAT) / DTOR
            RDLAT = (RDLAT * 3600. + .5) / 3600.
            IDLAT = RDLAT
            IMLAT = (RDLAT - IDLAT) * 60.
            ISLAT = (RDLAT - IDLAT - IMLAT / 60.) * 3600.
            IILAT = ISLAT + IMLAT * 100 + IDLAT * 10000
            NSI = 'N'

            IF (RLAT.LT.0) NSI = 'S'

            RDLON = ABS(RLON) / DTOR
            RDLON = (RDLON * 3600. + .5) / 3600.
            IDLON = RDLON
            IMLON = (RDLON - IDLON) * 60.
            ISLON = (RDLON - IDLON - IMLON / 60.) * 3600.
            IILON = ISLON + IMLON * 100 + IDLON * 10000
            EWI = 'E'

            IF (RLON.LT.0) EWI = 'W'

            SLASH = '/'
            WRITE (GEOSTR,1500) IILAT,NSI,SLASH,IILON,EWI
 1500       FORMAT(I6,A1,A1,I7,A1)

C  FOLLOWING CODE PUT IN TO ELIMINATE BLANKS.

            IZERO = 0
            DO 30 I=1,16
               IF (GEOSTR(I:I).EQ.' ') THEN
                   WRITE(GEOSTR(I:I),1300) IZERO
 1300              FORMAT(I1)
```

```
         ENDIF
30      CONTINUE

      ENDIF
        RETURN
        END

C+*+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:                    foverl
c
c  Functional Description:
c       display overlay data
c
c  Input Files/Parameters:
c
c  Output Files/Parameters: N/A
c
c  Subroutines/Functions Called:
c
c  Called By: geocon
c
c  Local Variables: N/A
c
c  Restrictions: N/A
c
c  Abnormal Return Conditions:  N/A
c
c  Location:
c
c  Programmer      Date of Last Change     Reason for Change
C  L. McCleary     Jan 1988               separate amp & sys - foverl
c
C-*-*-*-*-*-*-*-*-*-*-*-*-*-*-*-*-*-*-*-*-*-*-*-*-*-*-*-*-*-*-*-*-*-*-*-*|*-*-*-*-
c
        subroutine foverl
c
c       display overlay data function
c
        character*80 ovfnam
        common /ovfnam/ ovfnam
        integer lenovf
        common /lenovf/ lenovf
        integer ovseg, dfseg
        COMMON /OVSEGS/ ovseg, dfseg

c       map parameters
        logical lton(16),dotem
        integer ipgrid(4),ltyptb(16)
        common /map/ XRNM,XC,YC,LEVEL,CLAT,CLON,XRAD,YRAD,ITPROJ,
     +      IRES,LTYPTB,LUNDAT,LUNIND,LUNLIN,LTON,IPGRID,DOTEM,
     +      ORHALT
        dimension ltypov(16)
        logical ltonov(16),rankt(26,16)
        common /maptoo/ ltypov,ltonov,rankt

        data maxlen /40/
        data lcover/21/
c
c       display overlay data
c
c        print *,'foverl - enter'
         CALL PROMPT (1208,ovfnam,MAXLEN,lenovf)
         if (lenovf.gt.0) then
            call mesg(250)
            ltonov(lcover-20) = .true.
c            call jrclos
            call getseg(ovseg)
            call geowin
            call gravpt
            call jropen(ovseg)
            ltype = ltypov(lcover-20)
            call xcolor(ltype)
```

```
            call pltovp(xrnm,ovfnam,lenovf)
            call jrclos
        endif
        return
        end


C+*+*+*+*+*+*+*+*+*+*+*+*+*+*+*+*+*+*+*+*+*+*+*+*+*+*+*+*+*+*+*+*+*+*|*+*+*+*+
C UNIT NAME: FPOINT
C
C FUNCTIONAL DESCRIPTION:  DRAWS POINT AT X,Y.
C
C INPUT FILES/PARAMETERS:
C
C        X                       REAL       X COORDINATE.
C        Y                       REAL       Y COORDINATE.
C
C GLOBAL VARIABLES :
C
C        SEGNO                   INTEGER    CURRENT MAP SEGMENT NUMBER.
C        LTYPE                   INTEGER    CURRENT LINE TYPE.
C
C OUTPUT FILES/PARAMETERS:  NONE.
C
C SUBROUTINES/FUNCTIONS CALLED : NONE.
C
C CALLED BY:                       GRDLAT, GRDLON, PLOTIT
C
C LOCAL VARIABLES: NONE.
C
C RESTRICTIONS: NONE.
C
C ABNORMAL RETURN CONDITIONS:     NONE.
C
C LOCATION:                        /a21/gjf/MAPSRC.FTN
C
C PROGRAMMER:                      DATE OF LAST CHANGE     REASON FOR CHANGE
C
C     DAVE NATION                                          ORIGINAL CODE.
C     JERRY FENERTY                                        DOCUMENT AND MODIFY
C                                                          FOR A21 PROTOTYPE.
C
C-*-*-*-*-*-*-*-*-*-*-*-*-*-*-*-*-*-*-*-*-*-*-*-*-*-*-*-*-*-*-*-*-*-*|*-*-*-*-

        SUBROUTINE FPOINT(X,Y)

C       THIS SUBROUTINE DRAWS A POINT AT CURSOR POSITION X, Y

        CALL JMARK (X,Y)

        RETURN
        END


C+*+*+*+*+*+*+*+*+*+*+*+*+*+*+*+*+*+*+*+*+*+*+*+*+*+*+*+*+*+*+*+*+*+*|*+*+*+*+
C UNIT NAME: FPOSIT
C
C FUNCTIONAL DESCRIPTION:  POSITIONS POINT AT X,Y.
C
C INPUT FILES/PARAMETERS:
C
C        X                       REAL       X COORDINATE.
C        Y                       REAL       Y COORDINATE.
C
C GLOBAL VARIABLES :
C
C        XSAV                    REAL       SAVED X COORDINATE.
C        YSAV                    REAL       SAVED Y COORDINATE.
C        SAVEXY                  LOGICAL    INDICATES IF POINT WAS SAVED.
C        IRESSQ                  REAL       RESOLUTION OF LINES.
C        XPREV                   REAL       PREVIOUS X COORDINATE.
C        YPREV                   REAL       PREVIOUS Y COORDINATE.
C        XPOS                    REAL       CURRENT X COORDINATE.
C        YPOS                    REAL       CURRENT Y COORDINATE.
C        PSLAST                  LOGICAL    INDICATES WHETHER XPOS,YPOS WAS LAST
```

```
C                                          POINT POSITIONED.
C
C
C OUTPUT FILES/PARAMETERS:  NONE.
C
C SUBROUTINES/FUNCTIONS CALLED : NONE.
C
C CALLED BY:                      FDRAWV, PLOTIT, PROCPO
C
C LOCAL VARIABLES:
C
C       IRESSV                  REAL        RESOLUTION OF LINES.
C
C RESTRICTIONS: NONE.
C
C ABNORMAL RETURN CONDITIONS:   NONE.
C
C LOCATION:                       /a21/gjf/MAPSRC.FTN
C
C PROGRAMMER:                     DATE OF LAST CHANGE     REASON FOR CHANGE
C
C     DAVE NATION                                         ORIGINAL CODE.
C     JERRY FENERTY                                       DOCUMENT AND MODIFY
C                                                         FOR A21 PROTOTYPE.
C
C-*-*-*-*-*-*-*-*-*-*-*-*-*-*-*-*-*-*-*-*-*-*-*-*-*-*-*-*-*-*-*-*-*-*-*-*-*|*-*-*-*-

        SUBROUTINE FPOSIT (X,Y)

C       THIS SUBROUTINE POSITIONS THE GRAPHICS CURSOR AT X/Y POSITION X,Y

        LOGICAL PSLAST
        COMMON /PSLAST/ PSLAST,XPOS,YPOS
        LOGICAL SAVEXY
        COMMON /STMSGS/ XPREV,YPREV,IRESSQ,XSAV,YSAV,SAVEXY

C ***** VERY SHORT VECTORS HAVE BEEN DISABLED COMPLETELY
C ***** THIS CAN CAUSE HOLES IN LINES AND ELIMINATE SMALL ISLANDS
C ***** TO REENABLE, PUT THE FOLLOWING IF BLOCK BACK IN

        IF (SAVEXY) THEN
            IRESSV=IRESSQ
            IRESSQ=0
            CALL FDRAWV(XSAV,YSAV)
            IRESSQ=IRESSV

        ENDIF

        XPREV = X
        YPREV = Y

        XPOS = X
        YPOS = Y
        PSLAST = .TRUE.

        RETURN
        END

C+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                      FSHOWA
C
C FUNCTIONAL DESCRIPTION:         .
C
C CALLED BY:                      GEOCON
C
C PROGRAMMER:                     DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*|*-*-*-*-

        subroutine fshowa

c       show area menu function
```

```
      logical found
      character * 25 retstr, tmpstr
      common /mapdat/ mdraw,ovdraw
      logical mdraw,ovdraw
      logical map
      common /mapdbc/ map
      INTEGER QNMPTS,QSHADE(60)
      REAL QLATT(60),QLONN(60)
      COMMON /FILLS/ QNMPTS,QLATT,QLONN,QSHADE

      CHARACTER*3 QLABEL
      COMMON /LABEL/ QLABEL
      CHARACTER TYPEC
      common /bounds/ parms
      real parms(4)
c     map parameters
      logical lton(16),dotem
      integer ipgrid(4),ltyptb(16)
      common /map/ XRNM,XC,YC,LEVEL,CLAT,CLON,XRAD,YRAD,ITPROJ,
     +    IRES,LTYPTB,LUNDAT,LUNIND,LUNLIN,LTON,IPGRID,DOTEM,
     +    ORHALT
c
c           show area by name
            QNMPTS = 0
 170        continue
            irchar = 25
            retstr = '                         '
            CALL PROMPT(270,retstr,25,irchar)
            IF (map) print*,'name -- ',retstr(1:irchar),irchar
            tmpstr = retstr
            if (irchar.gt.0) then
                call mesg (271)
                call shownm (retstr,irchar,parms,found,TYPEC)
                IF (map) print*,'name2 -- ',retstr(1:irchar),irchar
                if (found) then
c
c                   typec values :
c                       ' ' - country
c                       'S' - state
c                       'C' - Continent
c                       'W' - body of water
c
c                   lton values :
c                        (2) - political bound.
c                        (3) - internal bound.
c
                    if (typec.eq.' ') then
                        lton(2) = .true.
                        lton(3) = .false.
                    else if (typec.eq. 'S' .or. typec.eq. 's') then
                        lton(2) = .true.
                        lton(3) = .true.
                    else if (typec.eq. 'C' .or. typec.eq. 'c') then
                        lton(3) = .false.
                    endif
                    call calmap (parms)
                    qlabel = 'GEO'
                    call drwmap
                else
                    call mesg (273)
c***                go after another name if not found
                    go to 170
                endif
            endif
c
      return
      end

C+*+*+*+*+*+*+*+*+*+*+*+*+*+*+*+*+*+*+*+*+*+*+*+*+*+*+*+*+*+*+*+*+*+*+*+|*+*+*+*+
C UNIT NAME:                   FUDGEX
C
C FUNCTIONAL DESCRIPTION:
C
```

```
C CALLED BY:                    CREATM
C
C PROGRAMMER:                   DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*|*-*-*-*-

        subroutine fudgex (xval)

c       fudge the x coordinate in menu files to fit with the square
c       coordinate system

        common /commen/xllmen,yllmen,xurmen,yurmen,ibcmen,iocmen,incmen
        logical sys
        common /sysdbc/ sys

c       fudge factor indicates chosen x coordinate system logical width
        data fudgef/20./

        xnval = xval * (xurmen - xllmen) / fudgef

        if (sys) print*,'fudgex -- ',xval,xnval,fudgef,xurmen,xllmen

        xval = xnval

        return
        end

C+*+*+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:   GEOWIN
c
c  Functional Description:
c       this subroutines sets the geographics area window
c
c  Input Files/Parameters:
C       xllgeo,yllgeo              The lower left X,Y point
C       xurgeo,yurgeo              The upper right X,Y point
c
c  Output Files/Parameters:
c
c  Subroutines/Functions Called:
c       Note: Subroutines preceded by a "j" are explained in the DI-3000 manual.
c
c  Called By:                    ANNOTA, BOXARE, CHKSIZ, CLRGRA, DOVERL,
C                                FOVERL, GLTYPE, LLSHOW, MAPPER
C                                OFFST,  SEGHND, TKINFO, TXWRIT,
C                                DSPCLS, STORCL
c
c  Local Variables:             N/A
c
c  Restrictions:                N/A
c
c  Abnormal Return Conditions: N/A
c
c  Location:   /a21/dave
c
C  Programmer        Date of Last Change       Reason for Change
c
C-*-*-*-*-*-*-*-*-*-*-*-*-*-*-*-*-*-*-*-*-*-*-*-*-*-*-*-*-*-*-*-*-*-*-*-*-*|*-*-*-*-
c
        subroutine geowin
c
c       this subroutines sets the geographics area window
c
        common /gphwdo/xllgeo,yllgeo,xurgeo,yurgeo
c
        call jwindo (xllgeo,xurgeo,yllgeo,yurgeo)
c
        return
        end
```

```
C+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    GETARC
C
C FUNCTIONAL DESCRIPTION:       .
C
C CALLED BY:                    APARCS
C
C PROGRAMMER:                   DATE OF LAST CHANGE    REASON FOR CHANGE
C
C-*-*-*-*-*-*-*-*-*-*-*-*-*-*-*-*-*-*-*-*-*-*-*-*-*-*-*-*-*-*-*-*-*-*-*-*-*|*-*-*-*-

        subroutine getarc(iarray,xsave1,ysave1,xsave2,ysave2,xsave3,
     +       ysave3,numarc)

c       This routine loads the points from iarray into the appropriate
c         arrays so the same routines used to create the arcs
c         may be used for redrawing.  The points for the first
c         4 arcs are in iarray previously read.  If more than three
c         arcs are to be drawn, the next record in the file is read
c         in.  Arcs 5 to 8 are in the second "record."  The points
c         of the last 4 arcs are in the last "record" which may
c         be read in.
c       VARIABLES:
c         xsaveX/ysaveX- arrays to be loaded with points of the arcs.
c         iarray- array passed from calling routine
c         common block ifls- logical unit numbers for files being accessed
c         numarc- number of arcs to get points for (stored in iarray(2))
c   CALLS:       readem
c   PROGRAMMER:  Nancy Detrich, A215, March, 1984
C------  MODIFIED BY A692 FOR COMPLETION


        real xsave1(*),ysave1(*),xsave2(*),ysave2(*)
        real xsave3(*),ysave3(*)
        integer iarray(*),numarc
        common/ifls/newifl,oldifl
        integer newifl, oldifl

        numarc = iarray(2)

        j = 3
        do 100 i = 1, numarc
          xsave1(i) = REAL(iarray(j))
          ysave1(i) = REAL(iarray(j+1))
          xsave2(i) = REAL(iarray(j+2))
          ysave2(i) = REAL(iarray(j+3))
          xsave3(i) = REAL(iarray(j+4))
          ysave3(i) = REAL(iarray(j+5))
c         increment counter beyond the 5 just read in iarray
          j = j + 6

          if ((i.eq.4 .or. i.eq.8).and.i.ne.numpts) then
c           must read next record before able to continue loading arrays
            call readem (oldifl,iarray,26,ierror)
            j = 1
          endif
  100   continue
        return
        end

C+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    GETCIR
C
C FUNCTIONAL DESCRIPTION:       .
C
C CALLED BY:                    APCIRC
C
C PROGRAMMER:                   DATE OF LAST CHANGE    REASON FOR CHANGE
C
C-*-*-*-*-*-*-*-*-*-*-*-*-*-*-*-*-*-*-*-*-*-*-*-*-*-*-*-*-*-*-*-*-*-*-*-*-*|*-*-*-*-

        subroutine getcir(iarray,radius,xcentr,ycentr)
```

```
c       this routine loads the radius and x and y coordinate arrays
c       of the circles written to the savefile.  If necessary, multiple
c       records are read in to restore the arrays (limited to dimensions
c       set in apcirc for the arrays being restored).
c    VARIABLES:
c       iarray- record already read in by drwicn or drawic routine
c       radius,xcentr,ycentr- arrays to be loaded and passed back
c         to the calling routine
c       numcir- number of circles saved in file
c       maxlen- maximum number of "points" stored in one record
c       common block ifls- logical unit numbers for files being accessed
c   CALLS:     readem
c   PROGRAMMER:  Nancy Detrich, A215, March, 1984


        integer iarray(*)
        real radius(*),xcentr(*),ycentr(*)
        integer numcir,maxlen
        common/ifls/newifl,oldifl
        integer newifl,oldifl
        data maxlen/26/

        numcir = iarray(2)
        j = 3
        do 100 i= 1,numcir
          radius(i) = FLOAT(iarray(j))
          xcentr(i) = FLOAT(iarray(j+1))
          ycentr(i) = FLOAT(iarray(j+2))
          j = j+3
c         eight circles are stored in each record-- read the next one
          if(MOD(i,8) .eq. 0) then
            call readem(oldifl,iarray,maxlen,ierror)
            j = 1
          endif
 100    continue
        return
        end

C+*+*+*+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:                    getcmd
c
c  Functional Description:
c       get next command
c
c  Input Files/Parameters:
c
c  Output Files/Parameters: N/A
c
c  Subroutines/Functions Called:
c
c  Called By:                    CMDMAI, STATEC
c
c  Local Variables: N/A
c
c  Restrictions: N/A
c
c  Abnormal Return Conditions:  N/A
c
c  Location:
c
c  Programmer      Date of Last Change     Reason for Change
C  L. McCleary     Jan 1988              delete call xcolor - getcmd
c
C-*-*-*-*-*-*-*-*-*-*-*-*-*-*-*-*-*-*-*-*-*-*-*-*-*-*-*-*-*-*-*-*-*-*-*-*-*-*-*|*-*-*-*-
c
        subroutine getcmd
c
c       this subroutine gets a command line
c
        logical eol,eoc
        common /comnds/ lenl,indxw,lenw,eol,eoc
        character * 80 comlin
        common /comlin/ comlin
```

```
      common /oldwrd/ indxwo,lenwo
      common /colorm/ nonsel,iselec
c
c     lenl -- length of command line
c     indxw -- index in command line of current word
c     lenw -- length of current word
c     indxwo -- index in command line of previous word in line
c     lenwo -- length of previous word in line
c     eol -- indicates end of command line (no more words)
c     eoc -- indicates end of current command (a delimiter)
c     comlin -- command line that is input
c
c     print*,'getcmd -- enter'
c      call xcolor (nonsel)
      call prompt(1246,comlin,80,irchar)
      lenl = irchar
      if (irchar.gt.0) then
          call tocaps (comlin,lenl)
          eol = .false.
          eoc = .false.
          indxw = 1
          lenw = 0
          indxwo = 0
          lenwo = 0
      else
c ----- updated 7/31/87 CSL
          eol = .true.
          eoc = .true.
          indxw = 0
      endif
c     print*,'getcmd -- exit ',lenl,'  ',comlin(1:lenl)
c
      return
      end


C+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:                  getfnm
c
c  Functional Description:
c       get a file name from the command line (or default) for read_keys
c
c  Input Files/Parameters:
c
c  Output Files/Parameters: N/A
c
c  Subroutines/Functions Called:
c      Note: Subroutines preceded by a "j" are explained in the DI-3000 manual.
c
c  Called By:                  INIGRA
c
c  Local Variables: N/A
c
c  Restrictions: N/A
c
c  Abnormal Return Conditions:  N/A
c
c  Location:      /a21/dave
c
c  Programmer         Date of Last Change       Reason for Change
c
C-*-*-*-*-*-*-*-*-*-*-*-*-*-*-*-*-*-*-*-*-*-*-*-*-*-*-*-*-*-*-*-*-*-*-*|*-*-*-*-

      subroutine getfnm (lennam,filnam)

c     get a file name from the command line (or default) for read_keys

      character*80 filnam
      character*80 argume

      call getarg (lenarg,argume)
c     print*,'getfnm -- ',lenarg,'  ',argume(1:lenarg)
      if (lenarg.gt.0) then
          lennam = lenarg
```

```
            if (lennam.gt.80) lennam = 80
            filnam(1:lennam) = argume(1:lennam)
        else
            lennam = 9
            filnam(1:lennam) = 'read_keys'
        endif

        return
        end


C+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                       GETICN
C
C FUNCTIONAL DESCRIPTION:          .
C
C CALLED BY:                       CREATM, PLOTOV
C
C PROGRAMMER:                      DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*|*-*-*-*-

      subroutine geticn(outcol,filcol,scalex,scaley,x,y,icnnam,
     +           miror,rot)

c      this routine is called by the prototype whenever
c       an icon is to be drawn.  The viewport and window must
c       be set prior to the call, and this routine uses the
c       x and y values to place the icon and the scale to
c       to size the icon--the points are changed by the
c       chgpts routine before the draws in the 'ap' routines.
c       A segment must also be open for the icon to be put in.
c       The icon is drawn in the color outcol and filled
c       with the color filcol (it is not filled if filcol = 0).
c       This routine calls drwicn which reads the requested
c       icon file and calls other routines (apline,apcirc,etc.)
c       which actually have the moves and draws for the icons.
c       A scalefactor of 1 will give an icon with points in
c       the range from 0 to 100 in world coordinates.
c     VARIABLES:
c       outcol- index of outline color
c       filcol- index of fill color
c       miror -integer flag to indicate if the points are to be mirrored
c            0= mirror the x array, 1= mirror the y array,
c            2= do not mirror the points
c       scalex- scalefactor to be used on the x coordinates
c       scaley- scalefactor to be used on the y coordinates
c       x/y- the coordinates to be used to position the icon
c          (will be place in the chgit common area as offsets
c       icnnam- name of the icon to be drawn
c       common block device- selected display device for pausing
c       common block chgit- parameters set for changing points
c            in a file (mirror,scalefactors and offsets)
c   CALLS:    loadic drwicn
c   PROGRAMMER:  Nancy Detrich, A215, March, 1984
C------  MODIFIED BY A692 FOR COMPLETION
c   Modified by M. Bloom, T333 June 1987 to position icons by
c        center point rather than lower left corner.

       integer outcol,filcol,miror
       real scalex,scaley,x,y
       integer qdsdev,qpydev,qecho,qlecho
       common /device/ qdsdev,qpydev,qecho,qlecho
       common /chgit/ mirflg,xscale,yscale,xoffst,yoffst,rotang
       real xscale,yscale,rotang
       integer xoffst,yoffst,mirflg
       integer icnnam
       logical sys
       common /sysdbc/ sys
       common /icold/ icold
       real rot

c ---- initialize rotation angle
       data icold /-1/
```

```
      if (sys) print*,'GETICN -- enter',icnnam,icold
      if (icnnam.ne.icold) then
          icold = icnnam
c         load current icon into tables
          call loadic (icnnam)
      endif
c     set parameters in common area to be used by chgpts
c       routine for drawing the icon in the right place
c       and scaled appropriately
      mirflg = miror
      rotang = rot

      xscale = scalex
      yscale = scaley

c     must negate points here to accommodate the chgpts routine
clj      xoffst = -(INT(x + 0.5))
clj      yoffst = -(INT(y + 0.5))

c  THE FOLLOWING MAKES AN X AND Y OFFSET FOR THE ICON.
c  THE -100 WAS ADDED FOR POSITIONING THE ICONS BY THE
c  CENTER POINT RATHER THAN THE LOWER LEFT.

      if (miror.eq.2) then
         xoffst = -(INT(x + 0.5))
         yoffst = -(INT(y + 0.5))
      elseif (miror.eq.1) then
         xoffst = -(INT(x + 0.5))
         yoffst = (INT(y + 0.5)) - 100
      else
         xoffst = (INT(x + 0.5)) - 100
         yoffst = -(INT(y + 0.5))
      endif


c     set scale factor to 1 if 0 was sent so an icon may be seen
      if (scafac .eq. 0.) scafac = 1.

c     set the color for the prototype
      call xcolor(outcol)

c     draw the icon and fill it with the appropriate color
      call drwicn(filcol,outcol)

      if (sys) print*,'GETICN -- exit'

      return
      end


C+*+*+*+*+*+*+*+*+*+*+*+*+*+*+*+*+*+*+*+*+*+*+*+*+*+*+*+*+*+*+*+*+*+*+*|*+*+*+*+
C UNIT NAME: GETLL
C
C FUNCTIONAL DESCRIPTION:  EXTRACTS NUMERICAL PORTION OF DDMMSSN/E STRING,
C                          DETERMINES SIGN AND CALLS FOR CONVERSION TO RADIANS.
C
C INPUT FILES/PARAMETERS:
C
C        STRNG                   CHAR*(*)     LAT/LONG STRING.
C        LEN                     INTEGER      LENGTH OF STRING.
C        NST                     CHAR(4)      TABLE OF EITHER N,S OR E,W.
C
C GLOBAL VARIABLES : NONE.
C
C OUTPUT FILES/PARAMETERS:
C
C        LAT                     REAL*8       LATITUDE OR LONGITUDE.
C        INDX                    INTEGER      INDICATES WHERE DIRECTION INDICATOR
C                                             (N,S,E,W) WAS FOUND IN STRING.
C        IERROR                  INTEGER      ERROR CONDITION.
C
C SUBROUTINES/FUNCTIONS CALLED :
C
C        LLCONV                  CONVERTS DDMMSS TO A LAT OR LONG VALUE.
```

```
C
C CALLED BY: LLTORD.
C
C LOCAL VARIABLES:
C
C        CLAT                    REAL*8      LATITUDE OR LONGITUDE (DDMMSS).
C
C RESTRICTIONS: NONE.
C
C ABNORMAL RETURN CONDITIONS:   NONE.
C
C LOCATION:                       /a21/gjf/A21GEO.FTN
C
C PROGRAMMER:                     DATE OF LAST CHANGE     REASON FOR CHANGE
C
C     DAVE NATION                                         ORIGINAL CODE.
C     JERRY FENERTY                                       DOCUMENT AND MODIFY
C                                                         FOR A21 PROTOTYPE.
C
C-*-*-*-*-*-*-*-*-*-*-*-*-*-*-*-*-*-*-*-*-*-*-*-*-*-*-*-*-*-*-*-*-*-*-*-*-*|*-*-*-*-

        SUBROUTINE GETLL (STRNG,NST,LAT,INDX,LEN,IERROR)

C       GET A LAT OR LON VALUE FROM A PARAMETER STRING

        CHARACTER*(*) STRNG
C        REAL*8 LAT,CLAT
        REAL LAT,CLAT
C        REAL*8 LLCONV
        REAL LLCONV
        CHARACTER NST(4)

C  SEARCH FOR DIRECTION INDICATOR

        DO 110 I=1,4

            INDX = INDEX (STRNG(1:LEN),NST(I))
            IF (INDX.GT.0) GO TO 115

  110   CONTINUE

        IERROR = 1
        GO TO 190

  115   CONTINUE

        IF (I.GT.2) THEN


             ISIGN = -1

         ELSE

             ISIGN = 1

         ENDIF

         READ (STRNG(1:INDX-1),1115,ERR=182) CLAT
 1115    FORMAT(F10.0)

         CLAT = CLAT + .5
         LAT = LLCONV (CLAT,ISIGN)
         GO TO 190

  182        CONTINUE
             IERROR = 2

  190    CONTINUE

         RETURN
         END
```

```
C+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    GETMARK
C
C FUNCTIONAL DESCRIPTION:       .
C
C CALLED BY:                    PLTDAT
C
C PROGRAMMER:               .   DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*-*|*-*-*-*-

        subroutine getmark(track,marker,posit,exist,timbuf)

        logical exist

        character*1 ucalpha(26)
        character*1 lcalpha(26)
        character*1 nums(9)
        character*2 marker
        character*9 timbuf

        integer*4 tmpmk1
        integer*4 tmpmk2
        integer*4 maxalp
        integer*4 maxlst
        integer*4 posit
        integer*4 track

c       posit- element of track in the table
c       exist- logical is true if track already exists , false if
c              is a new track (output parameter).
c       actmrk - list of markers that are currently active on the system
c       mrkcnt - count of number of these markers (and, by correlation,
c                the count of # of tracks in the system currently.
c                Initialized to 0 in fmain.
c       trklst - list of all currentl track numbers in the system
c
c       marker assignment scheme is as follows:
c
c       A-Z, a1-z1, a2-z2, a3-z3,...,a9-z9, <recycle>
c
c       Total number of unique markers = 260
c
c

        integer*4 trklst(260)
        integer*4 curseg(260)
        integer*4 mrkcnt
        character*2 actmrk(260)
        character*9 boxdtg(260)
        logical  boxvis(260)
        common /actmrk/ trklst,mrkcnt,actmrk,curseg,
     +                  boxdtg,boxvis

        data maxalp /26/
        data maxlst /260/
        data nums    /'1','2','3','4','5','6','7','8','9'/
        data ucalpha /'A','B','C','D','E','F','G','H','I','J','K','L',
     +               'M','N','O','P','Q','R','S','T','U','V','W','X',
     +               'Y','Z'/
        data lcalpha /'a','b','c','d','e','f','g','h','i','j','k','l',
     +               'm','n','o','p','q','r','s','t','u','v','w','x',
     +               'y','z'/

        i = 0
c
c       search for the track number found in the active track number list
c       (mrkcnt initialized to 0 in fmain)
c
 100  i = i + 1
      if (i .le. mrkcnt .and. track .ne. trklst(i)) goto 100

        posit = i
c
c       if this track number is already on current list,
```

```
c       use the same marker that was previously used for this track number
c       and set exist to true
c       change current date time group of most recent plot for that track.

        if (track .eq. trklst(i)) then
            marker = actmrk(i)
            exist = .true.
c
c       only switch box value if it is newer than the one
c       already there.
c
            if (timbuf .gt. boxdtg(i)) then
               boxdtg(i) = timbuf

            endif

        else
c
c           if this track number is not currently on list, generate a new
c           marker and put both the track number on the trklist and the
c           new marker on the actmrk list, set exist to false
c           and set most recent date time group for that track.
c
            exist = .false.
            mrkcnt = mrkcnt + 1
            if (mrkcnt .eq. maxlst) then
                mrkcnt = 1
            endif
            posit = mrkcnt
            if (mrkcnt .le. maxalp) then
                 marker = ucalpha(mrkcnt) // ' '
            else
                 tmpmk1 = mod(mrkcnt,maxalp)
                 tmpmk2 = mrkcnt / maxalp
                 marker = lcalpha(tmpmk1) // nums(tmpmk2)
            endif
            actmrk(mrkcnt) = marker
            trklst(mrkcnt) = track
            boxdtg(mrkcnt) = timbuf
       endif
       return
       end

C+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    GETPTS
C
C FUNCTIONAL DESCRIPTION:       .
C
C CALLED BY:                    APFILL. APLINE, APMARK, APRECT, APSMOO
C
C PROGRAMMER:                   DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*|*-*-*-*-

        subroutine getpts(iarray,numpts,xarray,yarray)

c       iarray is passed from the read in the drawic (passed through either
c         apsmoo or apline) and the number of points and the first 12
c         points are loaded from that record.  If necessary, up to 2 more
c         records are read in and the points loaded into the appropriate
c         x and y arrays to be used in the redrawing of the curve or line.
c      VARIABLES:
c         xarray/yarray- arrays to be loaded with coordinates from file
c         iarray- holds coordinates read from file
c         numpts- number of points to be read from the file
c         ierror- integer flag set if error occurs during read
c         ifl- logical unit number of the file to be accessed
c   CALLS:       readem
c   PROGRAMMER:  Nancy Detrich, A215, March, 1984

          real xarray(*),yarray(*)
          integer iarray(*),numpts,i,j,ifl,ierror

          numpts = iarray(2)
```

```
c       start loading arrays from third position of iarray
        j = 3
        do 100 i = 1, numpts
          xarray(i) = REAL(iarray(j))
          yarray(i) = REAL(iarray(j+1))

          if ((i.eq.12 .or. i.eq.25).and.i.ne.numpts) then
c           must read next record before able to continue loading arrays
            ifl = 10
            call readem (ifl,iarray,26,ierror)
c           reset to -1 so it will be 1 at the beginning of the loop
            j = -1
          endif
c         increment counter for iarray past saved points
          j = j + 2
  100   continue
        return
        end


C+*+*+*+*+*+*+*+*+*+*+*+*+*+*+*+*+*+*+*+*+*+*+*+*+*+*+*+*+*+*+*+*+*+*+*|*+*+*+*+
c* UNIT NAME:  getseg
c*
c* FUNCTIONAL DESCRIPTION:  a subroutine to generate a one-up segment name
c*
c*
c* INPUT FILES/PARAMETERS:
c*
c*
c* OUTPUT FILES/PARAMETERS:      qsegnm       generated segment number
c*
c* SUBROUTINES/FUNCTIONS CALLED:
c*
c* CALLED BY:                    ANNOTA, AREAFL, CHKSIZ, CURBOX, DISTAN
C                                DOVERL, DRWAMP, FOVERL, INIPIC
C                                LLSHOW, MAPOVR, MESGJF,RECDIS, SAVDIS,
C                                SEGMAP, SETFAD, TKINFO, TXWRIT, DSPCLS
c*
c* LOCAL VARIABLES:
c*
c* RESTRICTIONS:  qsegnm must be within the range 1100 < qsegnm < 32767
c*
c*
c* ABNORMAL RETURN CONDITIONS:  n/a
c*
c*
c* PROGRAMMER:  Sue Ferris       DATE OF LAST CHANGE     REASON FOR CHANGE
c*              Dave             11/1/84     put limits of segment numbers in *
c*                                           common area /getseg/
c*
C-*-*-*-*-*-*-*-*-*-*-*-*-*-*-*-*-*-*-*-*-*-*-*-*-*-*-*-*-*-*-*-*-*-*-*-*|*-*-*-*-

      Subroutine getseg(segno)

c     a subroutine to generate a one-up segment name

      common/segnum/qsegnm
      integer qsegnm

      integer segno

c       getseg segment number range
        common /gtseg/qstart,qsgend
        integer qstart,qsgend

        logical sys
        common /sysdbc/ sys

      if (sys) print*,'getseg -- enter',qsegnm
      segno = qsegnm
   10 if ((segno .ge. qstart) .and. (segno .le. qsgend)) then
          segno = segno + 1
          if (segno .eq. qsgend - 50) then
             call mesg(450)
             call paws
```

```
c "WARNING: Picture storage space is getting low..... Hit any button
c          to continue.

           end if
       else if (segno .lt. qstart) then
           call mesg(451)
           call paws

c  System is trying to access a reserved segment number.  Inform system
c  administrator.

       else
           segno = -999
           call mesg(452)
           call paws

c Picture storage space is FULL!  You cannot add anything more to your
c picture....  Hit any button to continue.

       end if
       qsegnm = segno
       if (sys) print*,'getseg -- exit',qsegnm
       return
       end


C+*+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    GETWRD
C
C FUNCTIONAL DESCRIPTION:       .
C
C CALLED BY:                    CALCPR, CMDMAI, DECDET, DECSCA, DRAWST,
C                               ERASES, EXECUT, INCDET, INCSCA,
C                               INQSTA, MAJORS, MINORS, REMOVF, SAVEST,
C                               SCENTE, SETSCA, SPROJE, SSCALE, TURNST
C
C PROGRAMMER:                   DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*-*|*-*-*-*-

        subroutine getwrd
c
c       this subroutine gets the next command word
c
        logical eol,eoc
        common /comnds/ lenl,indxw,lenw,eol,eoc
        character * 80 comlin
        common /comlin/ comlin
        common /oldwrd/ indxwo,lenwo
c
c       print*,'getwrd -- enter',indxw,lenw
        indxwo = indxw
        lenwo = lenw
        indxw = indxw + lenw
c       look for the first non-blank char or end of line
  100   continue
c ----- updated 7/31/87 CSL                        - getwrd
            if (indxw.gt.lenl) go to 170
            if (lenl.eq.0) go to 170
            if (comlin(indxw:indxw).ne.' ') go to 110
c            if (indxw+1.gt.lenl) go to 170
            indxw = indxw + 1
            go to 100
  110   continue
c       look for end of word, command or line
        lenw = 1
  120   continue
            if (indxw + lenw.gt.lenl.or.
     +      comlin(indxw + lenw:indxw + lenw).eq.' ') go to 190
            lenw = lenw + 1
            go to 120
  170   continue
            indxw = lenl
            eoc = .true.
```

```
         eol = .true.
  190   continue
c       print*,'getwrd -- exit',indxw,lenw,eoc,eol
c
        return
        end


C+*+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                       GLTYPE
C
C FUNCTIONAL DESCRIPTION:          .
C
C CALLED BY:                       AREAFL, DMAPII
C
C PROGRAMMER:                      DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*-*-*|*-*-*-*-

        SUBROUTINE GLTYPE (LTYP,ltonvl)

C       THIS SUBROUTINE SETS A NEW LINE TYPE VALUE IF NECESSARY

        INTEGER OFFSET,SEG

        INTEGER SEGNO,FIRSEG
        COMMON /SEGNO/ SEGNO,FIRSEG

        COMMON /LTYPS/ LTYPS
        COMMON /LTYPE/ LTYPE

        logical map
        common /mapdbc/ map
        logical bitmod
        common /bitmod/ bitmod
        logical oneflg
        common /oneflg/ oneflg
        integer prtchoi(2)
        common /prtchoi/ prtchoi


C       DATA LTYPS/-1/
        DATA OFFSET/250/

        if (ltonvl.gt.0) then
            segno = firseg + ltonvl
        endif
        CALL FLUSHB
        if (bitmod) then
            call jclose
        else
            CALL JRCLOS
        endif
        SEG = ltonvl
        call soverl
        if (.not.(oneflg.and.(prtchoi(1).eq.2))) then
          IF (SEG.GT.16) THEN
              CALL MESG(267)
          ELSE
              CALL MESG(SEG+OFFSET)
          ENDIF
        endif
        call enall
        CALL GEOWIN
        CALL GRAVPT
        IF (map)
     +      PRINT*,'IN GLTYPE OPENING SEGMENT # ',SEGNO

      if (bitmod) then
          call jopen
      else
          CALL JROPEN(SEGNO)
      endif
      LTYPE = LTYP
```

```
C***     COLOR MUST BE SET EACH TIME YOU OPEN NEW
C***     SEGMENT WITH DI-3000 -- GJF
C         IF (LTYPE.NE.LTYPS) THEN
             CALL XCOLOR (LTYPE)
             LTYPS=LTYPE
C         ENDIF

         RETURN
         END

C+*+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:    GRAVPT
c
c  Functional Description:
c       this subroutines sets the graphics area viewport
c
c  Input Files/Parameters:
C       xllgvp,yllgvp,xurgvp,yurgvp
c
c  Output Files/Parameters:
c
c  Subroutines/Functions Called:
c       Note: Subroutines preceded by a "j" are explained in the DI-3000 manual.
c
c  Called By:                   ANNOTA, BOXARE, CHKSIZ, CLRGRA, DOVERL,
C                               FOVERL, GLTYPE, INIPIC, LLSHOW,
C                               LOGO,   MAKGRA, MAPPER, OFFST,  SEGHND,
C                               TKINFO, TXWRIT, DSPCLS, STORCL
c
c  Local Variables:        N/A
c
c  Restrictions:                N/A
c
c  Abnormal Return Conditions: N/A
c
c  Location:   /a21/dave
c
c  Programmer        Date of Last Change       Reason for Change
c
C-*-*-*-*-*-*-*-*-*-*-*-*-*-*-*-*-*-*-*-*-*-*-*-*-*-*-*-*-*-*-*-*-*-*-*-*-*|*-*-*-*-
c
        subroutine gravpt
c
c       this subroutines sets the graphics area viewport
c
        common /comgvp/ xllgvp,yllgvp,xurgvp,yurgvp
c
        call jvport (xllgvp,xurgvp,yllgvp,yurgvp)
c
        return
        end

C+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                   GRDLAT
C
C FUNCTIONAL DESCRIPTION:      .
C
C CALLED BY:                   LLGRID
C
C PROGRAMMER:                  DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*|*-*-*-*-

        subroutine grdlat (lon,lonst2,loninc,lonstp,plat,frstpo,
     +      ylatof,dotem,latval)

c       draw one latitude grid line

        COMMON /CONST/ MAXVAL,RMPV,C,R,ERNM

        LOGICAL NEWONS,NEWSEQ
        LOGICAL ISINV
        LOGICAL DOTEM,FRSTPO
```

```
      COMMON /LABSON/ LABSON
      LOGICAL LABSON
      LOGICAL INVALI
      COMMON /INVALI/ INVALI
      CHARACTER*15 LABELS
      logical map
      common /mapdbc/ map
      DATA ITYPE/1/,LLEN/9/

      if (map) then
          print*,'  ',lon,lonst2,loninc,lonstp,plat,frstpo,
     +    ylatof,dotem
      endif

              NEWSEQ=.TRUE.

              DO 870 LONVAL=LON,LON+LONST2,LONINC

                  PLON=LONVAL*C
                  CALL INVTES (PLAT,PLON,ISINV)

                  IF (.NOT.ISINV) THEN

                      CALL LLTOXY (PLAT,PLON,X,Y)

                      IF (.NOT.INVALI) THEN

                          CALL CLIPXY (X,Y,NEWONS)

                          IF (LABSON.AND.FRSTPO.AND.NEWONS) THEN
                             FRSTPO=.FALSE.
                             IDEG=ABS(LATVAL)/60
                             MIN=MOD(ABS(LATVAL),60)

                             if (map) then
                                 print*,'ideg,min',ideg,min,latval
                             endif

                             IF (MIN.GT.0) THEN
                                 WRITE (LABELS,1825) IDEG,MIN
 1825                            FORMAT(I3,1X,I2,'''')
                                 LEN=LLEN
                             ELSE
                                     IF(IDEG.LT.10) THEN
                                               WRITE(LABELS,1821)IDEG
                                               LEN=2
                                     ELSE
                                               WRITE(LABELS,1822)IDEG
                                               LEN=3
                                     ENDIF
  1821                               FORMAT(I1)
  1822                               FORMAT(I2)
                             ENDIF

                             IF (LATVAL.LT.0) THEN
                                 LABELS(LEN:LEN)='S'
                             ELSE
                                 LABELS(LEN:LEN)='N'
                             ENDIF

                             call gtext (x,y+ylatof,itype,len,labels)

                        ENDIF

                        IF (DOTEM) THEN

                          IF (NEWONS) THEN
                             CALL FPOINT(X,Y)
                             IF (NEWSEQ) NEWSEQ=.FALSE.
                          ENDIF

                        ELSE
                             CALL PROCPO (NEWSEQ,NEWONS,X,Y)
```

```
                ENDIF

              ENDIF
            ENDIF
870       CONTINUE

      return
      end

C+*+*+*+*+*+*+*+*+*+*+*+*+*+*+*+*+*+*+*+*+*+*+*+*+*+*+*+*+*+*+*+*-*+*|*+*+*+*+
C UNIT NAME:                  GRDLON
C
C FUNCTIONAL DESCRIPTION:     .
C
C CALLED BY:                  LLGRID
C
C PROGRAMMER:                 DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*|*-*-*-*-

      subroutine grdlon (lat,latst2,latinc,latstp,plon,frstpo,
     +    ylonof,dotem,lonval)

c     draw one longitude grid line

      COMMON /CONST/ MAXVAL,RMPV,C,R,ERNM

      LOGICAL NEWONS,NEWSEQ
      LOGICAL ISINV
      LOGICAL DOTEM,FRSTPO
      COMMON /LABSON/ LABSON
      LOGICAL LABSON
      LOGICAL INVALI
      COMMON /INVALI/ INVALI
      CHARACTER*15 LABELS
      logical map
      common /mapdbc/ map

      DATA ITYPE/1/,LLEN/9/

      if (map) then
          print*,'  ',lat,latst2,latinc,latstp,plon,frstpo,
     +    ylonof,dotem
      endif
              NEWSEQ=.TRUE.

              DO 840 LATVAL=LAT-LATST2,LAT,LATINC

                  PLAT=LATVAL*C
                  CALL INVTES (PLAT,PLON,ISINV)

                  IF (.NOT.ISINV) THEN

                      CALL LLTOXY (PLAT,PLON,X,Y)

                      IF (.NOT.INVALI) THEN

                          CALL CLIPXY (X,Y,NEWONS)
                          IF (LABSON.AND.FRSTPO.AND.NEWONS) THEN

                            FRSTPO=.FALSE.
                            IDEG=ABS(LONVAL)/60
                            MIN=MOD(ABS(LONVAL),60)

                            if (map) then
                                print*,'ideg,min',ideg,min,lonval
                            endif

                           IF (MIN.GT.0) THEN
                               WRITE(LABELS,1825) IDEG,MIN
1825                           FORMAT(I3,1X,I2,'''')
                               LEN=LLEN
                           ELSE
```

```
                                    IF(IDEG.LT.10) THEN
                                            WRITE(LABELS,1821)IDEG
                                            LEN=2
                                    ELSEIF (IDEG.LT.100)THEN
                                            WRITE(LABELS,1822)IDEG
                                            LEN=3
                                    ELSE
                                            WRITE(LABELS,1823)IDEG
                                            LEN=4
                                    ENDIF
1821                                FORMAT(I1)
1822                                FORMAT(I2)
1823                                FORMAT(I3)
                            ENDIF

                            IF (LONVAL.LT.0) THEN
                                LABELS(LEN:LEN)='W'
                            ELSE
                                LABELS(LEN:LEN)='E'
                            ENDIF

                            call gtext (x,y+ylonof,itype,len,labels)

 660                    ENDIF

                        IF (DOTEM) THEN

                          IF (NEWONS) THEN
                            CALL FPOINT(X,Y)
                            IF (NEWSEQ) NEWSEQ=.FALSE.
                          ENDIF

                        ELSE
                            CALL PROCPO (NEWSEQ,NEWONS,X,Y)

                        ENDIF

                      ENDIF
                  ENDIF

 840          CONTINUE

        return
        end

C+*+*+*+*+*+*+*+*+*+*+*+*+*+*+*+*+*+*+*+*+*+*+*+*+*+*+*+*+*+*+*+*+*+*+*+*+|*+*+*+*+
C UNIT NAME: GTEXT
C
C FUNCTIONAL DESCRIPTION:  OUTPUTS CHARACTER STRING AT CURRENT POSITION.
C
C INPUT FILES/PARAMETERS:
C
C       X                     REAL        X COORDINATE.
C       Y                     REAL        Y COORDINATE.
C       ITYPE                 INTEGER     SIZE PARAMETER.
C       NCHARS                INTEGER     LENGTH OF STRING.
C       BBUF                  INTEGER(66) STRING.
C
C GLOBAL VARIABLES : NONE.
C
C OUTPUT FILES/PARAMETERS:  NONE.
C
C SUBROUTINES/FUNCTIONS CALLED : NONE.
C
C CALLED BY:                    GRDLAT, GRDLON
C
C LOCAL VARIABLES: NONE.
C
C RESTRICTIONS: NONE.
C
C ABNORMAL RETURN CONDITIONS:   NONE.
C
C LOCATION:                     /a21/gjf/MAPSRC.FTN
```

```
C
C PROGRAMMER:                  DATE OF LAST CHANGE     REASON FOR CHANGE
C
C     DAVE NATION                                     ORIGINAL CODE.
C     JERRY FENERTY                                   DOCUMENT AND MODIFY
C                                                     FOR A21 PROTOTYPE.
C
C-*-*-*-*-*-*-*-*-*-*-*-*-*-*-*-*-*-*-*-*-*-*-*-*-*-*-*-*-*-*-*-*-*-*-*-*-*|*-*-*-*-

      SUBROUTINE GTEXT (X,Y,ITYPE,NCHAR,BBUF)

C     THIS SUBROUTINE OUTPUTS A CHARACTER ARRAY TO THE
C     CURRENT POSITION OF THE GRAPHIC CURSOR OF TYPE ITYPE.

      CHARACTER*(*) BBUF

      logical sys
      common /sysdbc/ sys

      if (sys) print *,'in gtext'
      call flushb
      CALL JMOVE (X,Y)
      CALL J1STRG (BBUF(1:NCHAR))

      RETURN
      END
C+*+*+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:                 fmain
c
c  Functional Description:
C       CARICATURE and CELEBRATION main FORTRAN program.
c
c  Input Files/Parameters: N/A
c
c  Output Files/Parameters: N/A
c
c  Subroutines/Functions Called:
c      Note: Subroutines preceded by a "j" are explained in the DI-3000 manual
c
c  Called By: N/A
c
c  Local Variables: N/A
c
c  Restrictions: N/A
c
c  Abnormal Return Conditions:  N/A
c
c  Location:      /gl
c
c  Programmer       Date of Last Change      Reason for Change
c  L McCleary       Jan 1988              sep amp & sys - fmain
c  C.S. Lamb        Jan 1988              jclear logic - fmain
c
C-*-*-*-*-*-*-*-*-*-*-*-*-*-*-*-*-*-*-*-*-*-*-*-*-*-*-*-*-*-*-*-*-*-*-*-*-*|*-*-*-*-
C
      program fmain

C     main process for CARICATURE and CELEBRATION

      logical sys,txtsiz,metafl,nolabl,nologo,nobitm,malbox,batch
      logical vax,clr
      common /sysdbc/ sys
      common /txsdbc/ txtsiz
      common /metdbc/ metafl
      common /nlbdbc/ nolabl
      common /nlgdbc/ nologo
      common /nbtdbc/ nobitm
      common /mlbdbc/ malbox
      common /batdbc/ batch
      common /vaxdbc/ vax
      common /clrdbc/ clr
c     added by gre needed for calls to xsize
      common /txtsz/ txtsz
      real*8 dtor,stor
```

```
      common /dtor/ dtor,stor
      logical gmactv
      common /gmactv/ gmactv
      integer qdsdev,qpydev,qecho,qlecho
      common /device/ qdsdev,qpydev,qecho,qlecho
c     aspect ratio and virtual coordinate limits of viewspace
      common /aspect/ xaspec,yaspec,xvlow,xvhigh,yvlow,yvhigh
      character*50 defpth
      common /defpth/ defpth
      common /lendef/ lendef
      character*50 chatmp
      integer prtchoi(2)
      common /prtchoi/ prtchoi
      character*12 mapcho
      integer mfln
      common /mapcho/mapcho,mfln
      common /tablet/ inpdev
c     legend world coordinates, colors
      common /commen/xllmen,yllmen,xurmen,yurmen,ibcmen,iocmen,incmen
      common /commvp/ xllmvp,yllmvp,xurmvp,yurmvp
      logical bitmod
      common /bitmod/ bitmod
      logical qmapup
      common /mapup/qmapup
      logical ampflg,graflg,keyflg,legflg,menflg,popflg,
     +    sysflg,worflg,af(8)
      common /areaon/ ampflg,graflg,keyflg,legflg,menflg,popflg,
     +    sysflg,worflg,af
      logical exitfl
      integer trkndx (1000)
      common /trkndx/ trkndx
      character*160 trkrec (1000)
      common /trkrec/ trkrec
      logical segact (1000)
      common /segact/ segact
      logical LABSON
      common /LABSON/ LABSON
      logical logoon
      common /logoon/logoon
      logical mailfl(6)
      common/mlflag/mailfl
      dimension ltypov(16)
      logical ltonov(16),rankt(26,16)
      common /maptoo/ ltypov,ltonov,rankt
      logical overfl
      common/oneflg/oneflg
      logical oneflg
      Integer qmnum,qoldm
      Integer qdarry(500)
      Common /b3/ qdarry,qmnum,qoldm
      logical mesgon(1299)
      common /mesgon/ mesgon
c     segopen is only used with carjs.ftn on apollo
      common /segopen/  segopen
      logical segopen
      common /msgold/ msgold,msgonm
      logical lton(16),dotem
      integer ipgrid(4),ltyptb(16)
      common /map/ XRNM,XC,YC,LEVEL,CLAT,CLON,XRAD,YRAD,ITPROJ,
     +    IRES,LTYPTB,LUNDAT,LUNIND,LUNLIN,LTON,IPGRID,DOTEM,
     +    ORHALT
     logical mbxflg
     common /mbxflg/ mbxflg
     logical MBXACT
     common /MBXACT/ MBXACT, fstmsg

      mbxflg = .false.
 1    continue
c     initialize common variables with data statements or block data
       call inicom

c     initialize ctrl y testing on VAX only
c       call sictrly
```

```
        mapcho = 'default'
        mfln = 7
        ierror = 0
c       read file containing path names for default files & map
c       data along with idebug string
        call rpaths (8,'path.dat',ierror)
c       examine idebug and set up logicals
        call setdbg

        if (sys)
     +  print*,'default path : ',defpth(1:lendef),lendef,idebug

c       define function keys
         call defkeys

C       ASSIGN THE REQUESTED GRAPHICS TERMINAL

c       print*,'Enter display device number if other than 1'
c       print*,'   Current AED512 assignments:'
c       print*,'          1 - ttyhc'
c       print*,'          2 - tty05'
c       read(*,1100) idev
c1100   format(i5)
c       if (idev.gt.1) qdsdev = idev

C       INITIALIZE_GRAPHICS
        if (txtsiz) then
                txtsz = 0.8
        else
                txtsz = 2.0
        end if
        if (sys) print*,'fmain - calling INIGRA'
        dtor = DATAN (1.0D0)
        dtor = dtor / 45.D0
        stor = dtor / 3600.0D0
        call inigra(ierr)
        call jdpint(1)
        if (metafl) then
           call inigm
           gmactv = .true.
        else
           gmactv = .false.
        endif
        if (nolabl) then
          labson = .false.
        else
          labson = .true.
        endif
        CALL JASPEK (qdsdev, RATIO)
        if (ratio.lt.1.) then
            xaspec = 1.
            yaspec = ratio
        else
            xaspec = ratio
            yaspec = 1.
        endif
        xvlow = -1.
        xvhigh = -1.+2.*xaspec
        yvlow = -1.
        yvhigh = -1.+2.*yaspec
        call jvspac (xvlow,xvhigh,yvlow,yvhigh)
        call saveco
C        call adjust
        chatmp = defpth(1:lendef) // 'default'
        lentmp = lendef + 7
        if (sys)  print*,'default path : ',chatmp(1:lentmp)
        call rbound (lentmp,chatmp)
c**     next two stmts were uncommented out 16aug - cas **
        call rconfg (lentmp,chatmp)
        call rcolor (lentmp,chatmp)
        call rsavpr (lentmp,chatmp)
        if (sys) print*,'Fmain -- calc vps'
        chatmp = defpth(1:lendef) // mapcho
        lentmp = lendef + mfln
        call rparam (lentmp,chatmp,.true.,ierror)
```

```
c       calculate viewport parameters
        call calgvp
        call calcvp
        call calavp
        call calbvp
        call calmvp
        call calkvp
        if (vax)         CALL JESCAP(9801,1,0,1,0)
        if (batch)       CALL JBGBAT(0)
        if (sys) print*,'Fmain -- make segm'
c**** CSL erase 10/87
c*** following calls recommended in inipic for Sun version *******
c ++++++++++++++++++++++++++++++++++++++++++++++++++++++++++++
        if (.not. clr) then
c       clear areas and make retained segments
            call makful
            call makgra
            call makmen
            call makcom
            call makamp
            call makkey
            call makbox
            call maksho
        endif
c ++++++++++++++++++++++++++++++++++++++++++++++++++++++++++++
        if (sys) print*,'Fmain -- enable dev'
        call jienab (qdsdev,1,qpydev)
        call jienab (qdsdev,2,inpdev)
        call jienab (qdsdev,4,qpydev)
        call jienab (qdsdev,5,inpdev)
        if (nologo) then
         logoon = .false.
        else
         if (sys) print*,'Fmain -- call logo'
         logoon = .true.
c**** CSL erase 10/87
c*** following call recommended in inipic for Sun version *******
         if (.not. clr) call logo
        endif
        xllmen = 0.
        xurmen = 17.
        yllmen = 1.
        yurmen = 43.
c       set aspect ratio of menu world coordinates so the units are square
        xurmen = xllmen +
     +  (xurmvp - xllmvp) * (yurmen - yllmen) / (yurmvp - yllmvp)
        if (sys)
     +  print*,'fmain -- Menu World C.',xllmen,xurmen,yllmen,yurmen
        call init
        if (sys) print*,'after init'
        do 155 i=1,6
              if(mailfl(i))then
                    ltonov(i)=.true.
                    overfl =.true.
              end if
 155    continue
        if (.not. nobitm) then
                if (bitmod) then
                    call recdat (chatmp,lentmp)
                    call mapper (.false.)
                    CALL MAPOVR
                    qmapup = .true.
                endif
        else if(malbox .and. mbxflg) then
                call drwmap
                qmapup = .true.

        endif
c**** CSL erase 10/87
c*** following call recommended in inipic for Sun version *******
        if (.not. clr)  call keys
        if (batch)       CALL JENBAT
        if (popflg) then
            call pmainmn (exitfl)
```

```
        else
          if (batch) CALL JBGBAT(0)
c          if(overfl)then
c                call doverl(ltypov,ltonov)
c                print*,'doverl in fmain'
c          endif
          if(mailfl(5))then
               prtchoi(1) = 2
               prtchoi(2) = 4
                call printr
           endif
           call mhand
           if (batch) CALL JENBAT
         endif
         call jidisa (qdsdev,5,inpdev)
         call jidisa (qdsdev,4,qpydev)
         call jidisa (qdsdev,2,inpdev)
         call jidisa (qdsdev,1,qpydev)

C        SAVE_PARAMETER_FILE

c        call sparam (6,'noname',.true.,ierror)
         call wsavpr (lentmp,chatmp)

         if (metafl) call termgm
         CALL CLENUP
         if (sys) print*,'After clenup call'

         do 998 i = 1, numrcs
            if (trkndx(i) .eq. 0) then
               go to 999
            else
               print *, i,' ',segact(trkndx(i)),' ',trkrec(trkndx(i))
            end if
  998    continue
  999    continue
         if ((malbox) .and. mbxflg)then
              do 1000 i=1,500
                 qdarry(i) = 0
 1000         continue
              do 1001 i=1,1299
                 mesgon(i) = .false.
 1001         continue
              do 1002 i=1,16
                 ltonov(i)=.false.
                 lton(i) =.false.
                 mailfl(i)=.false.
 1002           continue
              segopen = .false.
              msgold = -1
              msgonm = -1
              qmapup = .false.
              overfl=.false.
              goto 1
        endif

C   END_MAIN_PROCEDURE

        END
C+*+*+*+*+*+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:                    help
c
c  Functional Description:
c       display help msg
c
c  Input Files/Parameters:
c
c  Output Files/Parameters: N/A
c
c  Subroutines/Functions Called:
c
c  Called By: helper
c
```

```
c  Local Variables: N/A
c
c  Restrictions: N/A
c
c  Abnormal Return Conditions:  N/A
c
c  Location:
c
c  Programmer      Date of Last Change     Reason for Change
C  L. McCleary     Jan 1988                separate amp & sys - help
c
C-*-*-*-*-*-*-*-*-*-*-*-*-*-*-*-*-*-*-*-*-*-*-*-*-*-*-*-*-*-*-*-*-*-*-*-*-*-*-*|*-*-*-*-
c
      subroutine help(msgno,menun)
c
c     subroutine to display help msgs
c
      Logical qcancl,qext2m,qretrn,qstmnu
      Common /b1/ qcancl,qext2m,qretrn,qstmnu,qnextm
      character cchar
      character*50 menpth
      common /menpth/ menpth
      common /lenmen/ lenmen
      common /msgold/ msgold,msgonm
      integer mysegn,helpno
      character*26 flettr
      character*80 filenm
      character*4 fname
      logical rflag,eof,eom,ERROR
      integer qfb(26),qmb(4)
      common /butons/ qfb,qmb
      logical sys,frame
      common /sysdbc/ sys
      common /frmdbc/ frame
      common /cmxlin/maxlin

      data msginc,meninc,maxnum /50,25,26/

      data mysegn/303/
      data flettr/'abcdefghijklmnopqrstuvwxyz'/
      data fname/'help'/
      data lname/4/
      if (sys) print*,'help -- enter ',msgno,menun
      call clrmsg
      rflag=.false.
      ifl=17
      if (msgno.eq.1.or.msgno.eq.121) then
c             menu help
              if (sys) print*,'  menu help', menun
              indlet=menun/meninc+1
              if (indlet.lt.1) indlet=1
              if (indlet.gt.maxnum) indlet=maxnum
              filenm=menpth(1:lenmen)//fname(1:lname)//
     x              flettr(indlet:indlet)//'.men'
              lennam=lenmen+lname+5
              helpno=menun
      else
c             msg help
              if (sys) print*,'  msg help', msgno
              indlet=msgno/msginc+1
              if (indlet.lt.1) indlet=1
              if (indlet.gt.maxnum) indlet=maxnum
              filenm=menpth(1:lenmen)//fname(1:lname)//
     x                flettr(indlet:indlet)//'.msg'
              lennam=lenmen+lname+5
              helpno=msgno
      endif
c     print*,'file selected is ',filenm
      call openit(filenm,lennam,ifl,0,ierror)
      if (ierror.ne.0) go to 40
c     display 1st page of help msg
      if (sys) print*, '  display first page '
      rewind ifl
      call fndhlp(ifl,helpno,eof,eom)
```

```
        call disp5(ifl,eof,eom)
        lineno=1
        if (.not.eof) then
10          continue
c               input user option
                call mpick(ichoice,mysegn,ibuttn)
15              continue
                if (sys) print*,'  after mpick',
     +              ichoice,mysegn,ibuttn,qfb(15),qfb(16)
                if (ibuttn.eq.qfb(15)) then
c                       display the next page of help msg
c                       print*,'display next page'
                        if (.not.eom.and..not.eof) then
                                call disp5(ifl,eof,eom)
                                lineno=lineno+maxlin
                        endif
                else if(ibuttn.eq.qfb(16)) then
c                       display the previous page of help msg
c                       print*,'display previous page'
                        IF (LINENO.GT.1)  THEN
                            lineno=lineno-maxlin
                            rewind ifl
                            call fndhlp(ifl,helpno,eof,eom)
                            if (.not.eof) then
                                do 20 i=1,lineno-1
                                        read(ifl,1000,err=30)cchar,msg
20                              continue
1000                            format(a1,a80)
                            endif
                            call disp5(ifl,eof,eom)
                        ENDIF
                else if (ibuttn.eq.qfb(23)) then
                        call clrcom
                        call mesg(47)
                        call BUTTN(IBUT)
                        call clrmsg
                        rewind ifl
                        call fndhlp(ifl,helpno,eof,eom)
                        if (.not.eof) then
                                do 60 i=1,lineno-1
                                        read(ifl,1000,err=30)cchar,msg
60                              continue
                        endif
                        call disp5(ifl,eof,eom)
                else
                    if (frame) then
c*******                temporarily do a jframe before processing unknown button
                        call jframe
                    endif
                    call subchk (ibuttn,mysegn,error,rflag)
                endif
            if (.not.rflag) go to 10
            qretrn = .false.
            if (frame) then
c*******         temporarily do a jframe at end of help to clear screen
                call jframe
            endif
        endif
c       if RETURN, leave help routine and redisplay previous menu and msg
        go to 50
30      continue
                print*,'read error on msg file'
                go to 50
40      continue
                print*,'open error on message file',helpno,ierror
50      continue
        call closit(ifl)
        call clrcom
        call mesg(msgno)
        if (sys) print*,'help -- exit '
        return
        end
```

```
C+*+*+*+*+*+*+*+*+*+*+*+*+*+*+*+*+*+*+*+*+*+*+*+*+*+*+*+*+*+*+*+*+*+*|*+*+*+*+
c  UNIT NAME:                   helper
c
c  Functional Description:
c       performs help function by calling help with the current message
c       and  menu numbers
c
c  Input Files/Parameters:
c
c  Output Files/Parameters: N/A
c
c  Subroutines/Functions Called:
c
c  Called By:                   CHECK, PAWS
c
c  Local Variables: N/A
c
c  Restrictions: N/A
c
c  Abnormal Return Conditions:  N/A
c
c  Location:      Apollo       /a21/dave
c
c  Programmer        Date of Last Change       Reason for Change
c
C-*-*-*-*-*-*-*-*-*-*-*-*-*-*-*-*-*-*-*-*-*-*-*-*-*-*-*-*-*-*-*-*-*-*-*|*-*-*-*-
c
        subroutine helper (menu)
c
c       performs help function by calling help with the current message and
c       menu numbers
c
        common /msgold/ msgold,msgonm
c
        msgno = msgonm
        call help (msgno,menu)
c
        return
        end

C+*+*+*+*+*+*+*+*+*+*+*+*+*+*+*+*+*+*+*+*+*+*+*+*+*+*+*+*+*+*+*+*+*+*|*+*+*+*+
c  UNIT NAME:                   hilite
c
c  Functional Description:
c
c  Input Files/Parameters:
c
c  Output Files/Parameters: N/A
c
c  Subroutines/Functions Called:
c      Note: Subroutines preceded by a "j" are explained in the DI-3000 manual.
c
c  Called By:                   COLBAK, DETCON, FCFILL, PROCON, PRTMEN,
C                               RESCON, RSLCON, TRKCON, CLASSN
C                               FTRCON, GEOCON, OVRCON
c
c  Local Variables: N/A
c
c  Restrictions: N/A
c
c  Abnormal Return Conditions:  N/A
c
c  Location:      /a21/dave
c
c  Programmer        Date of Last Change       Reason for Change
c  L McCleary        Jan 1988              sep amp & sys - hilite
c
C-*-*-*-*-*-*-*-*-*-*-*-*-*-*-*-*-*-*-*-*-*-*-*-*-*-*-*-*-*-*-*-*-*-*-*|*-*-*-*-

      subroutine hilite (onflag,ichoic,width,len,table)

c     Highlight menu items
```

```
      integer ichoic,width,len,table(*),seg
      integer start,xend,array(19)
      real x1,x2,y1,y2,yhigh
      logical onflag,found
      common /commvp/ xllmvp,yllmvp,xurmvp,yurmvp
      common /commen/ xllmen,yllmen,xurmen,yurmen,ibcmen,iocmen,incmen
      logical sys,batch
      common /sysdbc/ sys
      common /batdbc/ batch

      IF (sys) then
            print*,' In Hilite '
            PRINT*,'ONFLAG = ',ONFLAG
            PRINT*,'ICHOIC = ',ICHOIC
            PRINT*,'WIDTH  = ',WIDTH
            PRINT*,'LEN    = ',LEN
      ENDIF
      IF (LEN .GT. 43) THEN
          PRINT*,' ERROR  IN PASSING PARAMETERS TO HILITE'
      ENDIF
c --- x1,y1,x2,y2 are calculated so as to draw a box around a menu
c --- item that is to be highlighted.-------------- <--- x=17.
c                                    |          |M |      y=43.
c                                    |GRAPHICS  |EA|
c                ------------x2,y2   |AREA      |NR|
c                |  Hilite  |        |          |UE|
c                |  Box     |        |          | A|
c          x1,y1------------         -  x=0.-->----
c                                    |  y=1.       |
c                                    --------------
c
c --- The menu area goes from (0.,1.) to (17.,43.) (see diagram).
c --- The "y" values therefore range from 43. down to 1.  That means
c --- that 42 lines of text can fit in the menu area.  It has been
c --- estimated that 4 lines should be allowed for titles (at the top
c --- of the menu area) and 8 lines should be allowed for the con-
c --- struction box (the last 8 lines of the menu area).  That leaves
c --- 30 lines which are always available for menu items (15 double-
c --- spaced menu items).  Adjacent menu items are always supposed
c --- to be separated by a blank line to allow the highlight box to
c --- be drawn around the item.

c --- The following do loop searches each position of "table"
c --- looking for a match on "ichoic".  Since ichoic may be found
c --- in more than one position of table (i.e. the item may
c --- occupy more than one line in the menu), the starting position
c --- and ending position are saved in the appropriately named
c --- variables. (Note: the ending positioning is spelled "xend"
c --- because "end" is a reserved word in FORTRAN.)

      START = 1
      found = .false.
      do 50 i=1,len
         if (ichoic.eq.table(i)) then
            if (found) then
               xend = i
            else
               found = .true.
               start = i
               xend = i
            endif
         endif
   50 continue

c --- "yhigh" is the upper limit for the menu window in the
c --- y direction.
      yhigh = 43.

c --- If "ichoic" was found in "table", then calculate the lower
c --- left and upper right corners of the highlight box.
      if (found) then
         y2 = yhigh - (start - 1)
         y1 = yhigh - xend
c ------ The following adjustments are made so that the highlight
```

```
c ------ boxes of adjacent menu items do not touch (an adjustment
c ------ of 30% is made to the top and 40% to the bottom of each
c ------ box).
         y2 = y2 + .3
         y1 = y1 - .4
      endif


      if (width.eq.1) then
c ------ A "width" of 1 indicates that the menu item uses the
c ------ entire width of the menu area.
         x1 = .5
         x2 = 16.5
      elseif (width.eq.2) then
c ------ A "width" of 2 indicates that the menu item uses the
c ------ left quarter of the menu area (for color menus).
         x1 = .5
clj      x2 = 4.5
         x2 = 5.25
      elseif (width.eq.3) then
c ------ A "width" of 3 indicates that the menu item uses the
c ------ right quarter of the menu area (for color menus).
clj      x1 = 12.5
clj      x2 = 16.5
         x1 = 10.75
         x2 = 15.5
      elseif (width.eq.4) then
c ------ A "width" of 4 indicates that the menu item uses the
c ------ left half of the menu area.
         x1 = .5
         x2 = 8.
      elseif (width.eq.5) then
c ------ A "width" of 5 indicates that the menu item uses the
c ------ right half of the menu area.
         x1 = 9.
         x2 = 16.5
      endif

c --- Now draw the highlight box in the appropriate color (i.e. yellow
c --- to highlight and black to remove highlighting).

      call jvport (xllmvp,xurmvp,yllmvp,yurmvp)
      call jwindo (0.,17.,1.,43.)
c --- if requesting to turn segment on
      if (onflag) then
c ------ set segment number to a reserved hilite number
         if (width.eq.3) then
            seg = start + 31100
         else
            seg = START + 1019
         endif
c ------ if not already on  draw a rectangle as a hilite
         call jisgmt(seg,array)
         if (array(1) .eq. 0) then
            call jropen(seg)
            call jpintr (0)
            call xcolor (24)
            call jrect (x1,y1,x2,y2)
            call jrclos
            CALL JDETEC(seg,0)
         else
c ------ segment already on, do nothing
            if (sys) then
               print*,'TRYING TO HILITE ICHOIC ',ICHOIC,
     *         ',HOWEVER, CHOICE IS ALREADY ON '
            ENDIF
         endif

      else
c ------ requesting to turn segment off
         if (width.eq.3) then
            seg = start + 31100
         else
            seg = START + 1019
         endif
```

```
c ------ if it exists, purge it
        call jisgmt(seg,array)
        if(array(1) .eq. 1) then
         call jpurge(seg)
c         if (batch) then
            call jopen
            call jpintr (0)
c            call xcolor (8)
            call xcolor (ibcmen)
            call jrect (x1,y1,x2,y2)
            call jclose
c         endif
         if (sys) print*,'purging ',seg
        endif
      endif

      if (sys) print*,' Leaving Hilite ',START + 1019
      return
      end

C+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    HILPLT
C
C FUNCTIONAL DESCRIPTION:       .
C
C CALLED BY:                    TKINFO
C
C PROGRAMMER:                   DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*-*|*-*-*-*-

      subroutine hilplt(lat,lon)
c
c
c     this subroutine hilites the plot at the input lat/lon to let the user
c     know which plot has been chosen for interrogation.  The hilite is a
c     diamond.
c

      character ewi
      character nsi
      character*7 lat
      character*8 lon
      integer*4 exlat
      integer*4 exlon
      real dx
      real dy
      real plat
      real plon
      real box
      real x
      real y
      logical isinv

c
c***  seperate the lat/long numbers from the nsi/ewi indicators
c
      read(lat,10) exlat,nsi
 10   format(i6,a1)
      read(lon,20) exlon,ewi
 20   format(i7,a1)
      call lltor (exlat,exlon,nsi,ewi,plat,plon)
      call invtes (plat,plon,isinv)
      if (.not.isinv) then
c
c***        draw the diamond with the center around the plot
c
            call lltoxy (plat,plon,x,y)
            box = 6.
            dx = x
            dy = y - box
            call jmove (dx,dy)
            dx = x + box
```

```
          dy = y
          call jdraw (dx,dy)
          dx = x
          dy = y + box
          call jdraw (dx,dy)
          dx = x - box
          dy = y
          call jdraw (dx,dy)
          dx = x
          dy = y - box
          call jdraw (dx,dy)
      endif
      return
      end


C+*+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    HLDF
C
c FUNCTIONAL DESCRIPTION:       In CELEBRATION, HLDF is the
c                               interface to high level display
c                               files. This version is to give
c                               CARICATURE similar capability
c                               from the same calls to HLDF so
c                               that different versions of many
c                               modules don't have to be created
c                               for each of the software packages
C
C CALLED BY:                    INIPIC, INTSCN, RPLSCN, CLASSN, STORCL
C
C PROGRAMMER:                   DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*-*|*-*-*-*-

      subroutine hldf(choice,action,segid,pickid,flag)
      integer   choice,action,segid,pickid
      logical   flag
      integer   iseg
      common/contrl/qclass
      logical       qclass
      common/gphwdo/qgxmin,qgymin,qgxmax,qgymax
      real          qgxmin,qgymin,qgxmax,qgymax
      common /comgvp/ xllgvp,yllgvp,xurgvp,yurgvp
        if(choice .eq. 1)then
c-----------     in CELEBRATION this retrieves next opcode
        else if(choice .eq. 2)then
c-----------     in CELEBRATION this builds opcode & puts it in table
c-----------     in CARICATURE just needs to redraw map
                 flag=qclass
                 call drwmap
                 qclass=flag
                 if(flag)call dspcls(iseg)
        else if(choice .eq. 3)then
c-----------     in CELEBRATION this puts locator in table
        else if(choice .eq. 4)then
c-----------     in CELEBRATION deletes something by segid
        else if(choice .eq. 5)then
c-----------     in CELEBRATION modifies something by segid
        else if(choice .eq. 6)then
c-----------     in CELEBRATION searches by opcode
        else if(choice .eq. 7)then
c-----------     in CELEBRATION deletes allitems of opcode
        else if(choice .eq. 8)then
c-----------     in CELEBRATION creates external HLDF file
        else if(choice .eq. 9)then
c-----------     in CELEBRATION clears HLDF tables
        else if(choice .eq. 10)then
c-----------     in CELEBRATION compacts storage
        else
                 print*,'ERROR IN CHOICE TO HLDF'
        endif

        return
        end
```

```
C+*+*+*+*+*+*+*+*+*+*+*+*+*+*+*+*+*+*+*+*+*+*+*+*+*+*+*+*+*+*+*+*+*|*+*+*+*+
c  UNIT NAME:                     hlsrgb
c
c  Functional Description:
c       converts hue/saturation/lightness color specifications to r/g/b
c
c  Input Files/Parameters:
c
c  Output Files/Parameters: N/A
c
c  Subroutines/Functions Called:
c      Note: Subroutines preceded by a "j" are explained in the DI-3000 manual.
c
c  Called By:
c
c  Local Variables: N/A
c
c  Restrictions: N/A
c
c  Abnormal Return Conditions:  N/A
c
c  Location:      /a21/dave
c
c  Programmer         Date of Last Change       Reason for Change
c
C-*-*-*-*-*-*-*-*-*-*-*-*-*-*-*-*-*-*-*-*-*-*-*-*-*-*-*-*-*-*-*-*-*|*-*-*-*-
c
        subroutine hlsrgb (icnt,ihue,isat,ilight,r,g,b)
c
c       converts hue/saturation/lightness color specifications to r/g/b
c
        integer ihue(1),isat(1),ilight(1)
        real r(1),g(1),b(1)
c
c       print*,'hlsrgb -- enter ',icnt,ihue(1),isat(1),ilight(1)
        do 110 i=1,icnt
            rhue = ihue(i)
            rt = isat(i)
            rsat = rt / 32768.
            rt = ilight(i)
            rlight = rt / 32768.
            if (rlight.gt.0.5) fact1 = rlight + rsat - (rlight *
     +      rsat)
            if (rlight.le.0.5) fact1 = rlight * (1.0 + rsat)
            fact2 = 2.0 * rlight - fact1
            r(i) = ddcval (fact2, fact1, rhue)
            g(i) = ddcval (fact2, fact1, rhue - 120.)
            b(i) = ddcval (fact2, fact1, rhue - 240.)
c           print*,ihue(i),isat(i),ilight(i),r(i),g(i),b(i)
  110   continue
c       print*,'hlsrgb -- exit ',r(10),g(10),b(10),ihue(10),
c    +  isat(10),ilight(10),icnt
c
        return
        end
C+*+*+*+*+*+*+*+*+*+*+*+*+*+*+*+*+*+*+*+*+*+*+*+*+*+*+*+*+*+*+*+*+*|*+*+*+*+
c  UNIT NAME:                     hlssav

c  Functional Description:
c       this subroutine saves color values in a table
c
c  Input Files/Parameters:

c  Output Files/Parameters: N/A

c  Subroutines/Functions Called:

c  Called By:                     RCOLOR

c  Local Variables: N/A

c  Restrictions: N/A

c  Abnormal Return Conditions:  N/A
```

```
c  Location:      /a21/dave

c  Programmer        Date of Last Change       Reason for Change

C-*-*-*-*-*-*-*-*-*-*-*-*-*-*-*-*-*-*-*-*-*-*-*-*-*-*-*-*-*-*-*-*-*-*-*-*|*-*-*-*-

        subroutine hlssav (indx,hue,rlight,satur)

c       this subroutine saves color values in a table

        real hlscol(3,0:255)
        common /hlscol/ hlscol

        if (indx .ge. 0 .and. indx .le. 255) then
            hlscol(1,indx) = hue
            hlscol(2,indx) = rlight
            hlscol(3,indx) = satur
        endif

        return
        end

C+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    ICBEZ
C
C FUNCTIONAL DESCRIPTION:       .
C
C CALLED BY:                    APSMOO
C
C PROGRAMMER:                   DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*|*-*-*-*-

        subroutine icbez (npol,xp,yp,xc,yc,npts)

c       this subroutine calculates the coordinates (xc,yc) for npts on
c       a bezier curve.  the input data are the npol points of the bezier
c       polygon given in (xp,yp).  the float function is used to convert
c       the integers to real values for calculations.
c    VARIABLES:
c       xc/yc- arrays loaded with the calculated points from this routine
c       xp/yp- arrays with the points from the savefile (user's points)
c       nbez/nlim/t/deltat- used in calculations
c       fact- factorial function--returns a real variable
c   PROGRAMMER:  Nancy Detrich, A215, March, 1984

        real xc(*),yc(*),xp(*),yp(*)
        integer nbez,nlim
        real t,deltat,fact

c       set the number of points to be calculated (fewer input points,
c           calculate more points to get a smooth curve)
c       CAUTION-- length of xc array is set to 34, so npts cannot be set
c           larger than that!!
        if (npol .le. 5) then
          npts = 4 * npol
        else
          if (npol .le. 15) then
            npts = 2 * npol
          else
            npts = npol
          endif
        endif

c       the parametric iteration interval
        deltat = 1.0/float(npts-1)

c       first point of smooth line remains same as first point of polygon
        xc(1) = xp(1)
        yc(1) = yp(1)

c       the parameter nbez is one less than the number of points on the
c          polygon
        nbez = npol-1
        nlim = npts-1
```

```
c       calculate each point of the smooth line except first/last points
        do 2000 intep = 2,nlim
          t = (intep-1)*deltat
          xc(intep) = 0
          yc(intep) = 0

c         loop for each input point
          do 1000 j = 1,npol
            i = j-1
            bezbin = (fact(nbez))/(fact(i)*fact(nbez-i))
            bezwt = bezbin*(t**(i))*((1.0-t)**(nbez-i))

            xc(intep) = xc(intep)+xp(j)*bezwt
            yc(intep) = yc(intep)+yp(j)*bezwt
 1000     continue
 2000   continue

c       last point of smoothed line remains same as last point of polygon
        xc(npts) = xp(npol)
        yc(npts) = yp(npol)

        return
        end


C+*+*+*+*+*+*+*+*+*+*+*+*+*+*+*+*+*+*+*+*+*+*+*+*+*+*+*+*+*+*+*+*+*+*+*+*|*+*+*+*+
c    UNIT NAME:                         ICINIT
c
c    Functional Description:            Subroutine to initialize certain symbol
c                                       variables
c
c    Input Files/Parameters:
c
c       General Globals
c           qicolr       colors     integer   current interior color
c           qocolr       colors     integer   current outline color
c
c       Icon Globals
c           qicseg       icon       integer   segment number for icon appear-
c                                             ing the construction box
c           qiconx       icon       real      x position of icon
c           qicony       icon       real      y position of icon
c           qicmir       icon       integer   denotes direction in which icon
c                                             is mirrored (0=x; 1=y; 2=none)
c           qicszx       icon       real      scaling factor for x points of
c                                             icon
c           qicszy       icon       real      scaling factor for y points of
c                                             icon
c
c    Output Files/Parameters:  N/A
c
c    Subroutines Called:    N/A
c
c    Called By:                   INIPIC
c
c    Local Variables:   N/A
c
c    Restrictions:    N/A
c
c    Abnormal Return Conditions:   N/A
c
c    Location:        stepc03      /w3/ssb/prototype/icons/icinit.f
c
c    Programmer         Date of Last Change       Reason for Change
c       ssb                  3/08/84                initial entry
c
C-*-*-*-*-*-*-*-*-*-*-*-*-*-*-*-*-*-*-*-*-*-*-*-*-*-*-*-*-*-*-*-*-*-*-*-*|*-*-*-*-

      subroutine icinit
c
      common/colors/qccolr,qicolr,qocolr
      integer qccolr,qicolr,qocolr
      common/icon/qicnum,qicseg,qiconx,qicony,qicszx,
     +            qicszy,qicrot,qicmir,qictyp,qconnx,qconny,
     +            qiconn
```

```
      integer qicnum(6),qicseg,qicmir,qictyp,qiconn
      real qiconx,qicony,qicszx,qicszy,qicrot
      real qconnx,qconny
      common/ictext/qictxt
      character*15 qictxt(8)

      qicseg=0

c   these have to be reset for symbols for release II,
c   otherwise the symbols use the color last set.

      qicolr = 104
      qocolr = 104

c    Set qiconx,qicony to 50,50 which is the center point
c    of the construction box.


      qiconx = 50.
      qicony = 50.
      qicszx = 1.
      qicszy = 1.
      qicrot = 0.
      qicmir = 2
      qiconn = 0
      qconnx = 0.
      qconny = 0.
      do 5 i = 1,8
         qictxt(i) = ' '
5     continue
      do 10 i = 1,6
         qicnum(i) = 0
10    continue
      return
      end


C+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                      INCDET
C
C FUNCTIONAL DESCRIPTION:         .
C
C CALLED BY:                      STATEC
C
C PROGRAMMER:                     DATE OF LAST CHANGE     REASON FOR CHANGE
c  S. Lamb                      Feb 1988              command fix - incdet
C
C-*-*-*-*-*-*-*-*-*-*-*-*-*-*-*-*-*-*-*-*-*-*-*-*-*-*-*-*-*-*-*-*-*-*-*-*|*-*-*-*-
c
        subroutine incdet
c
c       this subroutine is the increase detail state interpreter (21)
c
        common /states/ nextst
        logical wordis,iseoc
        character*6 curwdb
        common /curwdb/ curwdb
        integer detail(6)
        common /detail/ detail
        character postfix(6)
        integer current
        integer i
        integer next
        data postfix/'a','b','c','d','e','f'/
c
c
        initls = nextst
c       do until nextst not = initial state
  100   continue
            call getwrd
c * ** *** **** ***** ****** ******* change check order, etc.
           if (wordis('SCALE')) then
               nextst = 23
```

```
            else if (wordis('DETAIL').or.wordis('MAP')
     +              .or. iseoc()) then
c   ***             increase detail
                    do 110 i=1,6
                         if(curwdb(6:6).eq.postfix(i)) then
                            current = i
                         endif
  110               continue
c                   print*,'current state is ',postfix(current)
                    next = current - 1
  120               continue
                    if(next .gt. 0 .and. detail(next) .ne. 1) then
                         next = next - 1
                         goto 120
                    else
                         continue
                    endif
c                   print*,'next level is ',postfix(next)
                    if(next.gt.0) then
                         curwdb(6:6) = postfix(next)
                         call chawdb(6,curwdb)
                         nextst = 3
                    else
c                         call drwamp(' ',1)                    - incdet
c ----- updated 7/31/87 CSL                                     - incdet
                         call drwamp('Most detail already in use ',1)
                         nextst = 1
                    endif
            else
c   ***             increase detail
                    do 130 i=1,6
                         if(curwdb(6:6).eq.postfix(i)) then
                            current = i
                         endif
  130               continue
                    next = current - 1
  140               continue
                    if(next .gt. 0 .and. detail(next) .ne. 1) then
                         next = next - 1
                         goto 140
                    else
                         continue
                    endif
                    if(next.gt.0) then
                         curwdb(6:6) = postfix(next)
                         call chawdb(6,curwdb)
                         nextst = 3
                    else
c                         call drwamp(' ',1)                    - incdet
c ----- updated 7/31/87 CSL                                     - incdet
                         call drwamp('Most detail already in use ',1)
                         nextst = 1
                    endif
                    call putwrd
            endif
        if (nextst.eq.initls) go to 100
c
        return
        end


C+*+*+*+*+*+*+*+*+*+*+*+*+*+*+*+*+*+*+*+*+*+*+*+*+*+*+*+*+*+*+*+*+*|*+*+*+*+
C UNIT NAME:                    INCSCA
C
C FUNCTIONAL DESCRIPTION:       .
C
C CALLED BY:                    STATEC
C
C PROGRAMMER:                   DATE OF LAST CHANGE     REASON FOR CHANGE
c  S. Lamb                    Feb 1988               command fix - incsca
C
C-*-*-*-*-*-*-*-*-*-*-*-*-*-*-*-*-*-*-*-*-*-*-*-*-*-*-*-*-*-*-*-*-*-*|*-*-*-*-
c
        subroutine incsca
```

```
c
c       this subroutine is the increase scale state interpreter (23)
c
        common /states/ nextst
        logical wordis,iseoc
c       map parameters
        logical lton(16),dotem
        integer ipgrid(4),ltyptb(16)
        common /map/ XRNM,XC,YC,LEVEL,CLAT,CLON,XRAD,YRAD,ITPROJ,
     +      IRES,LTYPTB,LUNDAT,LUNIND,LUNLIN,LTON,IPGRID,DOTEM,
     +      ORHALT
c
        initls = nextst
c       do until nextst not = initial state
 100    continue
            call getwrd
c * ** *** **** ***** ****** ******* change check order, etc.
            if (wordis('DETAIL')) then
                nextst = 21
            else if (wordis('SCALE').or.wordis('MAP')
     +               .or. iseoc()) then
c               increase scale
                xrnmn = xrnm * 1.5
                call chscal (xrnmn)
                nextst = 3
            else
c               increase scale
                xrnmn = xrnm * 1.5
                call chscal (xrnmn)
                call putwrd
                nextst = 3
            endif
        if (nextst.eq.initls) go to 100
c
        return
        end
C+*+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:                    inicom
c
c  Functional Description:
c       initialize common variables with data statements
c
c  Input Files/Parameters:
c
c  Output Files/Parameters: N/A
c
c  Subroutines/Functions Called:
c
c  Called By: fmain
c
c  Local Variables: N/A
c
c  Restrictions: N/A
c
c  Abnormal Return Conditions:  N/A
c
c  Location:
c
c  Programmer      Date of Last Change     Reason for Change
C  L. McCleary     Jan 1988                separate amp & sys - inicom
c
C-*-*-*-*-*-*-*-*-*-*-*-*-*-*-*-*-*-*-*-*-*-*-*-*-*-*-*-*-*-*-*-*-*-*-*-*|*-*-*-*-
c
        subroutine inicom

c       initialize common variables with data statements or use a block data

c     screen world coordinates
       common /comscr/ xllscr,yllscr,xurscr,yurscr
c     construction box world coordinates, colors
       common /combox/xllbox,yllbox,xurbox,yurbox,ibcbox,iocbox,incbox
c     menu world coordinates, colors
       common /commen/xllmen,yllmen,xurmen,yurmen,ibcmen,iocmen,incmen
c     legend world coordinates, colors
```

```
      common /comleg/xllleg,yllleg,xurleg,yurleg,ibcleg,iocleg,incleg
c     system area world coordinates, colors
      common /comsys/xllsys,yllsys,xursys,yursys,ibcsys,iocsys,incsys
c     graphics area world coordinates, colors
      common /comgra/xllgra,yllgra,xurgra,yurgra,ibcgra,iocgra
c     standard key area world coordinates, colors
      common /comkey/xllkey,yllkey,xurkey,yurkey,ibckey,iockey,inckey
c     amplification area world coordinates, colors
      common /comamp/xllamp,yllamp,xuramp,yuramp,ibcamp,iocamp,incamp
c     Pic amplification area world coordinates, colors
      common /compic/xllpic,yllpic,xurpic,yurpic,ibcpic,iocpic,incpic
c     graphics area virtual coordinates
      common /comgvp/ xllgvp,yllgvp,xurgvp,yurgvp
c     aspect ratio and virtual coordinate limits of viewspace
      common /aspect/ xaspec,yaspec,xvlow,xvhigh,yvlow,yvhigh
c     initialize common variables in states.ftn
      logical sketch,majorf,minorf
      common /statel/ sketch,majorf,minorf
      logical eofkey
      common /keylun/ keylun,newlun,eofkey
      logical quickd
      common /quickd/ quickd

c       common /cmenu/ imhigh,imoff,imstan,imnons
      common /ctext/ igrtxt,isytxt,iantxt
      common /tablet/ inpdev
      character*50 defpth
      common /defpth/ defpth
      common /lendef/ lendef
      character*50 mapath
      common /mapath/ mapath
      common /lenmap/ lenmap
      common /arsegs/ nsgmen,nsggra,nsgsys,nsgmsg,nsgmap,nsgful
      common /msgoff/ msgoff
      common /inewmn/ inewmn
      common /logseg/ nsglog
      common /nsgkey/ nsgkey,nsgktx
      common /csgamp/ nsgamp
      integer qfb(26),qmb(4)
      common /butons/ qfb,qmb
      integer qdsdev,qpydev,qecho,qlecho
      common /device/ qdsdev,qpydev,qecho,qlecho
      common /commvp/ xllmvp,yllmvp,xurmvp,yurmvp
      common/comwdo/qcxmn,qcymn,qcxmx,qcymx
      real qcxmn,qcymn,qcxmx,qcymx
      common/ampwdo/qaxmn,qaymn,qaxmx,qaymx
      real qaxmn,qaymn,qaxmx,qaymx
      common /cmxlin/maxlin
      common/scratr/qbox,qbkgrd,qmcolr
      integer qbox,qbkgrd,qmcolr
      common/segnum/qsegnm
      integer qsegnm
c     added by gre needed for calls to xsize
      common /txtsz/ txtsiz
      logical ampflg,graflg,keyflg,legflg,menflg,popflg,
     +     sysflg,worflg,af(8)
      common /areaon/ ampflg,graflg,keyflg,legflg,menflg,popflg,
     +     sysflg,worflg,af
      real*8 dtor,stor
      common /dtor/ dtor,stor
      integer ovseg, dfseg
      common /OVSEGS/ ovseg, dfseg
      COMMON /GRDSEG/ LLSEG,UTMSEG,GAUSEG
      INTEGER LLSEG,UTMSEG,GAUSEG
      common/ampprm/ampseg
      integer ampseg
      INTEGER   isecs,imins
      REAL      cc,cs
      COMMON    /c/ cc,isecs,cs,imins

      common /amfrst/ amfrst
      logical amfrst
      common /MBXACT/ MBXACT, fstmsg
      logical MBXACT, fstmsg
```

```
      integer bgnpos
      integer endpos
      integer numrcs
      integer tfaddx
      integer tfadtm
      integer tkoset
      integer tnewst
      integer toldst
      integer trkndx (1000)

      character*9 tfddtg
      character*9 tnewtm
      character*9 toldtm


      character*160 trkrec (1000)

      logical opnflg
      logical segact (1000)
      logical spprsd (1000)
      logical trkoff

      integer trklst(260)
      integer curseg(260)
      integer mrkcnt
      character*2 actmrk(260)
      character*9 boxdtg(260)
      logical boxvis(260)
      logical boxon
      integer boxcur

      common /colorm/ nonsel,iselec
      logical bitmod
      common /bitmod/ bitmod
      logical qmapup
      common /mapup/qmapup

      common /numrcs/ numrcs
      common /openfl/ opnflg
      common /segact/ segact
      common /spprsd/ spprsd
      common /tarbou/ tnewst, toldst
      common /tfadez/ tfaddx, tfadtm
      common /tfddtg/ tfddtg
      common /timpos/ bgnpos, endpos
      common /tkoset/ tkoset
      common /trcbou/ tnewtm, toldtm
      common /trkndx/ trkndx
      common /trkoff/ trkoff
      common /trkrec/ trkrec
      common /actmrk/ trklst,mrkcnt,actmrk,curseg,boxdtg,boxvis
      common /boxcur/ boxon,boxcur
c     aspect ratio and virtual coordinate limits of viewspace
      common /boxseg/ nsgbox,nsgsho,nsgcrm

      common /supflg/ supflg

c     initialize common areas for iosubs.ftn

      character*6 curwdb
      common /curwdb/ curwdb
      common /lenwdb/ lenwdb
      logical lton(16),dotem
      integer ipgrid(4),ltyptb(16)
      common /map/ XRNM,XC,YC,LEVEL,CLAT,CLON,XRAD,YRAD,ITPROJ,
     +     IRES,LTYPTB,LUNDAT,LUNIND,LUNLIN,LTON,IPGRID,DOTEM,
     +     ORHALT
      dimension ltypov(16)
      logical ltonov(16),rankt(26,16)
      common /maptoo/ ltypov,ltonov,rankt
      character*50 classi
      common /classi/ classi
      common /lencla/ lencla
      common /overly/ overtb
```

```
      logical overtb(16)
      character*80 savdes(20)
      common /savdes/ savdes
      common /maxsav/ maxsav,limsav
      real hlscol(3,0:255)
      common /hlscol/ hlscol

c     initialize common areas in mapsrc.ftn

      COMMON /CONST/ MAXVAL,RMPV,C,R,ERNM
      COMMON /PIE/ PIE,TPIE,PIO2,PIO4
      COMMON /ECCEN/ ECCEN,EC2
      COMMON /PROJT/ IGNOMN,IORTEQ,IORTPO,IORTHO,IPERSP
      COMMON /PROJT2/ IEQREC,IMERCA,ILAMCN
      COMMON /RADE/ RADE
      common /ltyps/ ltyps
      common /nmlim/ lunnam,areamn,areamx
      LOGICAL SAVEXY
      COMMON /STMSGS/ XPREV,YPREV,IRESSQ,XSAV,YSAV,SAVEXY
      logical gmactv
      common /gmactv/ gmactv

      COMMON /chscle/ scale,levtab,istptb,inctab
      DIMENSION SCALE(17)
      INTEGER LEVTAB(17),ISTPTB(17),INCTAB(17)
      COMMON /LABSON/ LABSON
      LOGICAL LABSON
c
c      initialize common for plotit
       logical nolobx
       common /nolobx/ nolobx
c      initialize common for drawel
       logical noelpl
       common /noelpl/ noelpl
       data ampflg/.true./,graflg/.true./,keyflg/.false./,
     +  legflg/.true./,menflg/.true./,popflg/.false./,
     +  sysflg/.true./,worflg/.false./,af/8*.false./
       data fstmsg/.true./
       data curwdb /'wdbiif'/,lenwdb/6/
       data classi/'UNCLASSIFIED'/,lencla/12/
       data keylun/28/,newlun/29/,eofkey/.false./
       data overtb/8*.true.,8*.false./
       data dotem/.true./
       DATA LUNDAT,LUNIND,LUNLIN/11,12,13/
       DATA ITPROJ/7/,ires/1/
       DATA LEVEL/1/,xrnm/4000/,orhalt/0./
       DATA LTON/.TRUE.,15*.false./
       data ltonov/16*.false./
       data rankt/.true.,415*.false./
       data ipgrid/1800,1800,180,180/
       DATA LTYPTB/34,35,36,37,38,39,48,41,69,43,44,44,45,44,46,47/
       data ltypov/16*152/
       data xc,yc,xrad,yrad/200,200,200,200/
       data maxsav/0/,limsav/20/
       data savdes/20*' '/
       data hlscol/768*0./
       DATA C/2.908882087E-4/
       DATA isecs/648000/
       DATA imins/10800/
       DATA cc/2.908882087e-4/

       DATA ERNM/3440.34/
       DATA RADE/57.2957795/
       DATA PIE/3.1415927/,TPIE/6.2831853/
       DATA PIO2/1.5707963/,PIO4/0.7853982/
       DATA IGNOMN/1/,IORTEQ/2/,IORTPO/3/,IORTHO/4/,IPERSP/5/
       DATA IEQREC/6/,IMERCA/7/,ILAMCN/8/
c     eccentricity of earth
       data eccen/0.016718/
       data ltyps/-1/
       data lunnam/16/,areamn,areamx/100.,25000./
       data savexy /.false./
       data ovseg,dfseg,llseg /0,0,0/
       data defpth/'/map/default/'/,lendef/13/
```

```
      data mapath/'/map/data/'/,lenmap/10/
      data qsegnm/1101/
      data nonsel,iselec /16,24/
c      data qbox,qbkgrd,qmcolr/32,0,7/
      data qbox,qbkgrd,qmcolr/32,8,7/
      data qcxmn,qcymn,qcxmx,qcymx/0.;0.,70.,4./
      data qaxmn,qaymn,qaxmx,qaymx/0.,0.,70.,4./
      data maxlin/4/
      data qdsdev,qpydev,qecho,qlecho/1,1,1,1/
c****** states.ftn data stmts
      data sketch,majorf,minorf/3*.false./
c     offset for start of message retained segment numbers
      data msgoff/30000/
      data nsgmen,nsggra,nsgsys,nsgmsg,nsgmap,nsgful
     + /310,311,312,313,314,315/
      data nsgbox /316/,nsgsho/317/,nsgcrm/318/,inewmn/0/
      data nsglog /319/
      data nsgkey /320/,nsgktx/321/
      data nsgamp /322/
      data inpdev/1/
c      data imhigh,imoff,imstan,imnons/20,21,22,19/
      data igrtxt,isytxt,iantxt/96,96,96/
      data
     + xllscr,yllscr,xurscr,yurscr/1.,1.,65.,41./
     + xllbox,yllbox,xurbox,yurbox,ibcbox,iocbox/49.,8.,65.,15.,56,16/
     + xllmen,yllmen,xurmen,yurmen,ibcmen,iocmen/49.,8.,65.,41.,56,16/
     + xllleg,yllleg,xurleg,yurleg,ibcleg,iocleg/32.,1.,65.,8.,56,16/
     + xllsys,yllsys,xursys,yursys,ibcsys,iocsys/1.,1.,49.,8.,56,16/
     + xllgra,yllgra,xurgra,yurgra,ibcgra,iocgra/1.,8.,49.,41.,25,16/
     + xllkey,yllkey,xurkey,yurkey,ibckey,iockey/49.,1.,65.,8.,56,16/
     + xllpic,yllpic,xurpic,yurpic,ibcpic,iocpic/1.,1.,65.,7.,25,16/
     + xllamp,yllamp,xuramp,yuramp,ibcamp,iocamp/1.,1.,54.,4.,56,16/


      data bgnpos /22/
      data boxon  /.false./
      data endpos /30/
      data numrcs /1000/
      data opnflg /.false./
      data segact /1000*.false./
      data spprsd /1000*.false./
      data tfaddx /0/
      data tfadtm /1440/
      data tfddtg /'000000000'/
      data tkoset /20000/
      data tnewst /0/
      data tnewtm /'000000000'/
      data toldst /0/
      data toldtm /'000000000'/
      data trkndx /1000*0/
      data trkoff /.false./
      data mrkcnt /0/
      data trklst /260*0/
      data trkrec /1000*' '/

c      DATA SCALE/50.,100.,200.,350.,450.,600.,750.,1000.,1500.,1750.,
c     +     2500.,3000.,4000.,6000.,8000.,10000.,11000./
c      DATA LEVTAB/99,3,2,1,1,1,1,1,1,1,1,1,1,1,1,1,1/
c      DATA ISTPTB/1,5,5,10,30,60,60,120,300,600,600,900,900,1800,
c     +     1800,1800,1800/
c      DATA INCTAB/1,1,2,5,5,10,10,30,60,60,90,90,180,180,180,180,
c     +     180/
      DATA SCALE /60.,350., 450.,600.,750., 1000.,1500.,1750.,
     +            2500.,3000.,4000., 6000.,8000.,10000.,
     +            11000.,12000.,13000./
      DATA LEVTAB/26,26,4,4,4,2,2,2,1,1,1,1,1,1,1,1,1/
      DATA ISTPTB/20,60, 300,300,300, 600,600,600,
     +            900,900,900, 1800,1800,1800,
     +            1800,1800,1800/
      DATA INCTAB/10,10, 60,60,60, 60,60,60,
     +            300,300,300, 300,300,300,
     +            300,300,300/
      DATA LABSON/.TRUE./
```

```
      DATA quickd/.TRUE./
       data nolobx /.false./
       data noelpl /.false./

       return
       end


C+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:                    inigra
c
c  Functional Description:
C       THIS SUBROUTINE INITIALIZES THE GRAPHIC DISPLAY
c
c  Input Files/Parameters:
c
c  Output Files/Parameters: N/A
c
c  Subroutines/Functions Called:
c      Note: Subroutines preceded by a "j" are explained in the DI-3000 manual.
c
c  Called By:                    FMAIN
c
c  Local Variables: N/A
c
c  Restrictions: N/A
c
c  Abnormal Return Conditions:  N/A
c
c  Location:      /a21/dave
c
c  Programmer         Date of Last Change       Reason for Change
c  S. Lamb            Feb 1988                  detec chg - inigra
c
C-*-*-*-*-*-*-*-*-*-*-*-*-*-*-*-*-*-*-*-*-*-*-*-*-*-*-*-*-*-*-*-*-*-*-*|*-*-*-*-
C
        SUBROUTINE INIGRA (IERR)

C       THIS SUBROUTINE INITIALIZES THE GRAPHIC DISPLAY

        integer qdsdev,qpydev,qecho,qlecho
        common /device/ qdsdev,qpydev,qecho,qlecho
        integer mbxres
        common /mbxres/ mbxres
        character*80 filnam
        integer keylun,newlun
        logical eofkey
        common /keylun/ keylun,newlun,eofkey
        logical mailfl(4)
        common/mlflag/mailfl
        character*6 command
c       *** This variable must be set to the number of planes
c           in the graphics frame buffer somehow in order to
c           use the bitmod flag to modify map display
        common /nplane/ nplane
        logical bit,rdkey,savkey,malbox
        common /bitdbc/ bit
        common /rkdbc/ rdkey
        common /svkdbc/ savkey
        common /mlbdbc/ malbox
        logical bitmod
        common /bitmod/ bitmod
        data irdwr/0/

c       print*,'OMSGS - INIGRA'
        if (rdkey) then
            call getfnm (lennam,filnam)
c           print*,'inigra -- ',lennam,'  ',filnam(1:lennam)
            call openit (filnam(1:lennam),lennam,keylun,irdwr,ierror)
            if (ierror.ne.0) then
                print*,'inigra -- error on open of read key file ',
     +          keylun,irdwr,ierror,'  ',filnam(1:lennam),lennam
                eofkey = .true.
            else
```

```
                eofkey = .false.
                call kpause (eofkey)
                read (keylun,*,end=192,err=191) command
                if (command(1:6).ne.'jbegin') then
                    print*,'inigra -- incompatible command in save',
     +              ' file  ',command
c                   *** exit on error
                    go to 199
                endif
            endif
        endif
        go to 199
  191   continue
            print*,'inigra -- error on read of save key file',
     +      '  ',keylun
            go to 199
  192   continue
            print*,'Read key file is empty.'
            eofkey = .true.
  199   continue
        if (savkey) then
            call openit ('save_keys',9,newlun,irdwr,ierror)
            if (ierror.ne.0) then
                print*,'inigra -- error on open of save_keys',
     +          newlun,irdwr,ierror
            else
                write (newlun,*,err=135) '''jbegin'''
            endif
        endif
        go to 140
  135   continue
            print*,'inigra -- error on write to save key file',
     +      '  ',newlun
  140   continue
        CALL JBEGIN
        call jseter (7)
c  ***  Apollo specific subroutine loop for receiving mailbox
        if (malbox) then
            call inmail
            if (mbxres .eq. 1) then
                call sndmail
            end if
         endif
c  ***
         CALL JDINIT (qdsdev)
         CALL JDEVON (qdsdev)
         call jddete (0)
         if ((bit) .and.nplane.ge.4) then
             bitmod = .true.
         else
             bitmod = .false.
         endif

         RETURN
         END

C++++++++++++++++++++++++++++++++++++++++++++++++++++++++++++++++++++|+++++++
c  UNIT NAME:                        inione
c
c  Functional Description:
c       initialize common variables
c
c  Input Files/Parameters:
c
c  Output Files/Parameters: N/A
c
c  Subroutines/Functions Called:
c
c  Called By: init
c
c  Local Variables: N/A
c
c  Restrictions: N/A
```

```
c
c  Abnormal Return Conditions:  N/A
c
c  Location:
c
c  Programmer      Date of Last Change      Reason for Change
C  L. McCleary     Jan 1988                 separate amp & sys - inione
c
C-*-*-*-*-*-*-*-*-*-*-*-*-*-*-*-*-*-*-*-*-*-*-*-*-*-*-*-*-*-*-*-*-*-*-*-*-*-*-*|*-*-*-*-
c
        subroutine inione
c
c       this subroutine can be used to initialize common blocks for
c       using the menu controllers and hldf
c
c
      common/dasegs/qdaseg
      integer        qdaseg

      common /label/ qlabel
      character *3   qlabel

      common/contrl/qclass
      logical qclass

      common/scratr/qbox,qbkgrd,qmback
      integer qbox,qbkgrd,qmback

      common/clsstr/qmajst,qcdwst,qcavst,qcurmj,qcurcw,qcurcv
      character *50 qmajst,qcdwst,qcavst(20),qcurmj,qcurcw,qcurcv(20)

      common/clindx/qmjidx,qarray
      integer qmjidx
      logical qarray(6)

      common/maxchr/qmxchr,qactul
      integer     qmxchr,qactul(4)

      common /nmbtxt/qtxtct
      integer qtxtct

      common/picks/qsegid,qpick,qmodfl
      integer     qsegid,qpick
      logical     qmodfl

      common/grfdef/qlclr,qlst1,qlst2,qlwid,qxsiz,qysiz,
     +      qcclr,qcfont,qtpath,qhjst,qvjst
      integer       qlclr,qlst1,qlst2,qlwid,qxsiz,qysiz,
     +      qcclr,qcfont,qtpath,qhjst,qvjst

      common/boxwdo/qbxmin,qbymin,qbxmax,qbymax
      real qbxmin,qbymin,qbxmax,qbymax

      common/mnuatr/qmcolr
      integer qmcolr

      common/milseg/qmilsg
      integer qmilsg(7)

c       getseg segment number range
        common /gtseg/qstart,qsgend
        integer qstart,qsgend

C SCALE COMMON BLOCKS
         Common /scale/qscclr,qscxy,qsctmp,qscseg,qsfacx
            Integer qscclr(3),qscseg(3)
            Real qscxy(3,2),qsctmp(3),qsfacx(3)
         Common /scltxt/qsctmv,qscid
            Character*5 qsctmv(3,3)
            character*2 qscid(3)
         Common /sclflg/qscflg
            Logical qscflg(3)

        common  /qprint/ qprint
        logical qprint
```

```
        common/flname/ qname, qdscrp
        character *50 qname
        character *60 qdscrp

        common /hitabl/ hitabl
        integer hitabl(43)

        qstart = 1100
        qsgend = 20000

        qprint = .false.

c*******set global variables which DO NOT change during execution

        qdaseg = 1100
        qmxchr = 50

c*****initialize screen attribute colors
c*****note: qbox and qbkgrd are now loaded from default.cfg by rconfg
c*****      since they have already been used by makgra etc.
c      qbox = 32
cC      qbkgrd = 0
c      qbkgrd = 8
      qmback = 5

c****** Classification variables

        qclass = .false.
c       qarray(1) = .true.
c       qarray(2) = .false.
c       qarray(3) = .false.
c       qarray(4) = .false.
c       qarray(5) = .false.
c       qarray(6) = .false.

c**** count of text blocks
        qtxtct = 0
        qmodfl = .false.

        qlclr = 104
        qlst1 = 1
        qlst2 = 1
        qlwid  = 32535
        call convwh(10.0,10.0,qxsiz,qysiz,1)
        qcclr = 104
        qcfont = 3
        qtpath = 1
        qhjst = 1
        qvjst = 1

c*****initialize construction box parameters
      qbxmin=-10.
      qbymin=-10.
      qbxmax=200.
      qbymax=200.

c*****initialize menu color
      qmcolr=28

c*****initialize military reserved segment numbers
      do 10 i=1,7
         qmilsg(i)=31000+i
 10   continue
c**** initialize hitabl to 0
      do 20 i = 1,43
         hitabl(i) = 0
 20   continue

c*****read files from INDEX into array
      call intind
c
c SCALE COMMON VARIABLES
        qsfacx(1) = 1.0
        qsfacx(2) = 1.0
        qsfacx(3) = 1.0
```

```
        qscflg(1) = .false.
        qscflg(2) = .false.
        qscflg(3) = .false.

c*******Set default file name and file description to all blanks
        qname( 1:50 ) = ' '
        qdscrp( 1:60 ) = ' '

        return
        end


C+*+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:                    inipic
c
c  Functional Description:
c       initialize variables for new picture
c
c  Input Files/Parameters:
c
c  Output Files/Parameters: N/A
c
c  Subroutines/Functions Called:
c
c  Called By: eramap, init, intscn
c
c  Local Variables: N/A
c
c  Restrictions: N/A
c
c  Abnormal Return Conditions:  N/A
c
c  Location:
c
c  Programmer      Date of Last Change     Reason for Change
C  L. McCleary     Jan 1988             separate amp & sys - inipic
C  C.S. Lamb       Jan 1988               jclear logic - inipic
c
C-*-*-*-*-*-*-*-*-*-*-*-*-*-*-*-*-*-*-*-*-*-*-*-*-*-*-*-*-*-*-*-*-*-*-*-*|*-*-*-*-
c
        subroutine inipic
c
c   -   this subroutine can be used to initialize common blocks
c       when beginning a new picture either from create or edit
c
c
      integer         segnum
c
      common /linatr/ qthick,qcolor,qstyle,qlsty2,qrohed
      integer         qthick,qcolor,qstyle,qlsty2,qrohed

      common /modlin/ qsgnum, qpikid, qcurln, qhiseg, qmdflg
      integer         qsgnum, qpikid, qcurln, qhiseg
      logical                                         qmdflg

      common /scgrid/ qlndot, qgrdsz, qgrdsg
      integer         qlndot, qgrdsz, qgrdsg

      common/colors/ qccolr,qicolr,qocolr
      integer qccolr,qicolr,qocolr

      common/segnum/qsegnm
      integer    qsegnm

      common/ampprm/ampseg
      integer ampseg

      common/mrkseg/dstsg1,dstsg2,dstsg3,dstfst
      integer dstsg1,dstsg2,dstsg3
      logical dstfst

      common/llseg/llsgmt,llfrst
      integer llsgmt
      logical llfrst
```

```
      common /amfrst/ amfrst
      logical amfrst

      common/contrl/qclass
      logical       qclass

      common/clindx/qmjidx,qarray
      integer qmjidx
      logical qarray(6)

      common/label/qlabel
      character*3  qlabel

      common/textfl/qftnot,qttlfl,qttl,qftn,qaxn
      logical     qftnot,qttlfl,qttl,qftn
      integer     qaxn

      common /txszay/ size
      real size(9)

      common/picks/qsegid,qpick,qmodfl
      integer     qsegid,qpick
      logical     qmodfl

      common /nmbtxt/qtxtct
      integer qtxtct

      common /comflg/qcmpfl
      logical qcmpfl

      common/arrow/qaline,qmaxln,qmaxpt,qheads,qmaxhd,qaflpt,qafill,
     +            qarcol,qaname,qmodln,qres,qmxres
      real qaline(10,21),qheads(5,9),qaflpt(2)
      integer qmaxln,qmaxpt(10),qmaxhd,qarcol,qaname,qmodln,
     +        qres(50),qmxres
      logical qafill

        common /qprint/ qprint
        logical qprint

       common/grfdef/qlclr,qlst1,qlst2,qlwith,qxsiz,qysiz,
     +              qcclr,qcfont,qtpath,qhjst,qvjst
        integer       qlclr,qlst1,qlst2,qlwith,qxsiz,qysiz,
     +              qcclr,qcfont,qtpath,qhjst,qvjst

c ----- legend common blocks
        common /legatr/ qlegfl,qcolin,qcolou,qlgfnt,qmodlg
        integer qcolin,qcolou,qlgfnt
        logical qlegfl,qmodlg

        common/legnos/qboxno,qsymno,qtxtno,qprtno
        integer qboxno,qsymno,qtxtno,qprtno

        common/legdim/qentry,qbordr,qinity,qtype,qtxtln,qtext,qydist,
     +             qytext,qlwide,qlclor,qinclr,qoclor,qmtype,
     +             qxscal,qyscal,qtclor,qahead
        integer qentry,qtype(10,6),qtxtln(10,2),qlwide(10),qahead(10)
        integer qlclor(10),qinclr(10),qoclor(10),qmtype(10),qtclor
        character*20 qtext(10,2)
        real qbordr,qinity,qydist,qytext,qxscal,qyscal
c -----

c scale common blocks
         common /scale/qscclr,qscxy,qsctmp,qscseg,qsfacx
            integer qscclr(3),qscseg(3)
            real qscxy(3,2),qsctmp(3),qsfacx(3)
         COMMON /SCLTXT/QSCTMV,QSCID
            CHARACTER*5 QSCTMV(3,3)
            CHARACTER*2 QSCID(3)
         common /sclflg/qscflg
            logical qscflg(3)
         common /scfrst/ qlstsc
            logical qlstsc
```

```
      common/change/qchang
      logical       qchang

      common /mapup/ qmapup
      logical qmapup

c grid common blocks

      common /grids/ qsw,qgtype,qgcolr,qxinc,qyinc
      real     qxinc(3),qyinc(3)
      logical   qsw(3)
      integer   qgcolr(3),qgtype(3)

      common/newgrd/newgrd,first
      logical newgrd,first

      integer qnmpts,qshade(60)
      real qlatt(60),qlonn(60)
      common /fills/ qnmpts,qlatt,qlonn,qshade

      integer qinpnm,qmax
      common /inpfil/ qinpnm,qmax


c       getseg segment number range
      common /gtseg/qstart,qsgend
      integer qstart,qsgend


      integer qlen
      character*80 qfilnm
      common /ovfnam/ qfilnm
      common /lenovf/ qlen

      common/filinp/qnum,qmknum,qxpos,qypos,qscal,qtyp,qintcl,qextcl
      integer   qnum,qmknum(100),qtyp(100),qintcl,qextcl
      real      qxpos(100),qypos(100),qscal(100)

      integer filseg
      common /dspseg/ filseg

      common/clsseg/qclssg
      integer qclssg

     common/chratr/qvert,qxbase,qybase,qxplan,qyplan,
    +              qhjust,qvjust,qcrpth,qxsize,qysize,
    +              qxxpos,qyypos,qfnum,qsdiam
     integer       qvert,qhjust,qvjust,qcrpth,
    +              qfnum,qxxpos(4),qyypos(4)
     real          qxbase,qybase,qxplan,qyplan,
    +              qxsize,qysize,qsdiam

      logical qlton(16),qdotem
      integer qpgrid(4),qtyptb(16)
      integer qlevel,qitpro,qires,qlunda,qlunin,qlunli
      real qxrnm,qxc,qyc,qclat,qclon,qxrad,qyrad,qorhal
      common /map/ qxrnm,qxc,qyc,qlevel,qclat,qclon,qxrad,qyrad,
    +     qitpro,
    +     qires,qtyptb,qlunda,qlunin,qlunli,qlton,qpgrid,qdotem,
    +     qorhal

      INTEGER QSYM
      COMMON /SYMUP/ QSYM

c       declare local variables
      integer array(19)
      logical hflag

c  serial number common bloc

     common/sernum/qserno,qserfl
     integer       qserno
     logical       qserfl
```

```
        character*50 defpth
        common /defpth/ defpth
        common /lendef/ lendef
        integer arrcnt
        common /arrcnt/arrcnt

c  free drawing

      common/fdrbgd/qseg,qpck,qbkgd
      integer     qseg,qpck
       logical      qbkgd

c  interrogation box

      logical boxon
      integer boxcur
      common /boxcur/ boxon,boxcur


c  common block to reinitialize track boxes (jit)

        character*2 actmrk(260)
        integer mrkcnt
        integer trklst(260)
        integer curseg(260)
        character*9 boxdtg(260)
        logical sys,vax,clr
        common /sysdbc/ sys
        common /vaxdbc/ vax
        common /clrdbc/ clr
        logical  boxvis(260)
        common /actmrk/ trklst,mrkcnt,actmrk,curseg,
     +                 boxdtg,boxvis

        logical bitmod
        common /bitmod/ bitmod
c**** CSL erase 10/87
c**** following recommended in Sun version *******
c +++++++++++++++++++++++++++++++++++++++++++++++
        common /mesgon/ mesgon
        logical mesgon(1299)
        common /msgold/ msgold,msgonm
        integer msgold,msgonm
        common /logoon/ logoon
        logical logoon
        common /logseg/ nsglog
        integer nsglog
        Common /b6/ qcrmnu
        Integer qcrmnu
        Common /b3/ qdarry,qmnum,qoldm
        Integer qdarry(500),qmnum,qoldm
        integer j
        logical jerr
c +++++++++++++++++++++++++++++++++++++++++++++++
c       set data areas
        data size /05.,7.,10.,12.,15.,17.,20.,22.,25./

        QSYM = 0

        qmdflg = .false.
        qlndot = 12
        qgrdsz = 13

        if (sys) print*,'inipic -- enter',qchang,qsegnm

        qmapup = .false.
        qnmpts = 0

        qinpnm = 0
        qintcl = 72
        qextcl = 80
        qmax = 10

c       delete retained segments
```

```
        if (sys) print*,'  purging old picture',qsegnm

c**** CSL erase 10/87 clear all segments at once => redraw boxes etc.
c**** following calls recommended in Sun version *******
c ++++++++++++++++++++++++++++++++++++++++++++++++++++
      if (clr) then
        call jclear
        call makful
        call makgra
        call makmen
        msgold = 0
        call makcom
        call makamp
        call makkey
        call makbox
        call maksho
        do 101 j = 1, 500
  101   qdarry(j) = 0
        do 102 j = 1, 1299
  102   mesgon(j) = .false.
        j = qcrmnu
        if (j .eq. 0) then
           j=1
           call logo
           call jvisbl (nsglog,1)
        endif
        call keys
        qcrmnu = 0
        msgonm = -1
        if (logoon) then
           logoon = .false.
        else
          call drawm(j, jerr)
        endif
      endif
c ++++++++++++++++++++++++++++++++++++++++++++++++++++
c       purge classification segment
        call jisgmt(qclssg,array)
        if (array(1).eq.1) call jpurge(qclssg)
        do 100 i = qstart,qsegnm
            call jisgmt(i,array)
            if(array(1) .eq. 1)  call jpurge(i)
 100    continue
c ----- updated 7/31/87 CSL
c        if ((.not. amfrst).and.(ampseg.ne.0)) call jpurge(ampseg)
        qchang = .false.
        qsegnm = qstart
c*******set flags to begin a new picture


        qprint = .false.

c*******text flags
        qftnot = .false.
        qttlfl = .false.
        qttl = .false.
        qftn = .false.
        qmodfl = .false.
        qtxtct = 0
        qfnum  = 1
        qxbase = 1.0
        qybase = 0.0
        qxplan = 0.0
        qyplan = 1.0
        qcrpth = 1
        qvert  = 1
        qysize = 10.0
        qxsize = 10.0
        qvjust = 1
        qhjust = 1
c******classification flags
       qclass = .false.
       qclssg = 0
```

```
c     qarray(1) = .true.
c     qarray(2) = .false.
c     qarray(3) = .false.
c     qarray(4) = .false.
c     qarray(5) = .false.
c     qarray(6) = .false.

c******compass flag
      qcmpfl = .false.

c****** free drawing
      qbkgd = .false.

c******serial number flags
      qserno = 0
      qserfl = .false.

c*****call other initialization routines
      call clrstr
c      call hldfin

c*****initialize reserved retained segments for arrows
      qmxres=0
c      qres(1)=31000
      do 5 i=1,50
c        qres(i)=31000+i
        call getseg(qres(i))
 5    continue
      qccolr=104
      arrcnt = 0

c*****initialize screen attribute colors
c     qbox = 37
c     qbkgrd = 3
c     qmback = 5

c scale common variables
        qsfacx(1) = 1.0
        qsfacx(2) = 1.0
        qsfacx(3) = 1.0
        qscflg(1) = .false.
        qscflg(2) = .false.
        qscflg(3) = .false.
        qlstsc = .true.
c grid common variables
C       if (.not. vax) qlton(16) = .false.
        do 26 i = 1,3
          qsw(i) = .false.
          qgcolr(i) = 224
 26     continue
        qsw(1) = .true.
        first = .true.
        newgrd = .false.
c
c       clear graphics area
c        call clrgra

c**** CSL erase 10/87 clear all segments at once => redraw boxes etc.
c**** following call recommended in Sun version *******
c +++++++++++++++++++++++++++++++++++++++++++++++++
      if (.not. clr) call clrgra
c +++++++++++++++++++++++++++++++++++++++++++++++++

        qthick = 16383
        qcolor = 16
        qstyle = 1
        qlsty2 = 1
        qrohed = 11

        call getseg (qcurln)
        call getseg (qgrdsg)
        call getseg (qhiseg)
c
```

```
c ----- no legend is in existence.
        qlegfl = .false.
c ----- this is not a modification.
        qmodlg = .false.
c ----- there are no legend entries.
        qentry = 0
c ----- use the simplest and fastest font initially.
        qlgfnt = 1
c ----- set text color to black initially.
        qtclor = 248
c ----- there is no amplification area, first is true
        amfrst = .true.
c ----- there is are no markers, first for these are true
        dstfst = .true.
        llfrst  = .true.
c ----- get the segment numbers for the legend box, the legend
c ----- symbols area, the legend text area, and the legend
c ----- box user prompts
C THESE HAVE BEEN MOVED TO LEGBOX TO PREVENT THE LEGEND FROM BEING OVERWRITEN
C BY OTHER SYMBOLS
c        call getseg(qboxno)
c        call getseg(qsymno)
c        call getseg(qtxtno)
c        call getseg(qprtno)


c ----- initialize symbol (icon) variables.
        call icinit

c ----- initialize the current interior and outline
c ----- colors to red
        qicolr = 104
        qocolr = 104

c       get the segment number for the text shown in
c       the message area
        call getseg(filseg)

c       initialize timeline common blocks

        call initim

c       initialize hldf common blocks using dummy variables
c       these are set in fmain so no need to re init here - cas

        call hldf(9,iact,iseg,ipick,hflag)

c    jit: reinitialize the track boxes to new values.
c         these new segment numbers retain the
c         visibility flag of the old segment for that box.
c         This is to preserve the attributes of fade or
c         suppression.  Also, set boxon to false for interrogation.

        boxon = .false.


        do 10 i = 1,mrkcnt
           call getseg(segnum)
           curseg(i) = segnum
   10   continue

        if (bitmod) then
            call enall
            call gravpt
            call boxclr
            call soverl
        endif

        return

        end
```

```
C+*+*+*+*+*+*+*+*+*+*+*+*+*+*+*+*+*+*+*+*+*+*+*+*+*+*+*+*+*+*+*+*+*+*+*+*+*|*+*+*+*+
C* UNIT NAME:                    init
C*
C* FUNCTIONAL DESCRIPTION:
C*
C*   This subroutine initializes variables
C*
C*
C* INPUT FILES/PARAMETERS:
C*
C*       user input
C*
C* OUTPUT FILES/PARAMETERS:
C*
C*     Global Variables
C*       qcancl            logical; cancel flag
C*       qcr               integer; contains the asci value for the
C*                                  carriage return
C*       qcrmnu            integer; contains the current menu number
C*       qdarry            logical; array of flags which shows if a
C*                                  menu segment has been created for a
C*                                  particular menu
C*       qext2m            logical; exit to main menu flag
C*       qexitg            logical; flag to exit graphics system
C*       qfb         integer array; contains the asci values for the
C*                                  function buttons, the button number
C*                                  corresponds to the array location
C*       qmb         integer array; contains the asci values for the
C*                                  mouse buttons
C*       qmloc             integer; contains the current location in the
C*                                  qstack array
C*       qmnum             integer; contains the menu number of the menu
C*                                  being displayed when the DRAWM
C*                                  routine is called
C*       qmodfl            logical; modify flag for the HLDF
C*       qmxary            integer; contains the size of the qdarry array
C*       qmxst             integer; contains the size of the qstack array
C*       qnextm            integer; contains the number of the next menu
C*                                  to be displayed
C*       qoldm             integer; contains  the number of the previous
C*                                  menu displayed
C*       qpick             integer; contains a pick id being passed back
C*                                  from DI3000
C*       qretrn            logical; return to previous menu flag
C*       qsegid            integer; contains a segment id being passed
C*                                  back from DI3000
C*       qsegnm            integer; contains the current segment id
C*       qstack            integer; array which contains the menu numbers
C*                                  of previous menu displayed
C*       qstmnu            logical; flag to put current menu on the stack
C*
C*
C* RESTRICTIONS:
C*
C*       The user must enter mouse or joystick when prompted for
C*       device choice.
C*
C* SUBROUTINES CALLED:
C*
C*       mhand             subroutine; drives the menu interface of the
C*                                     A21PROTOTYPE
C*       setvar  block data routine; initializes control variables
C*
C*       mesg              subroutine; places appropriate message in
C*                                     communications area
C*
C* CALLED BY:                      FMAIN, INIGM
C*
C* LOCAL VARIABLES:
C*
C*       no local variables
C*
C* ABNORMAL RETURN CONDITIONS:
C*
```

```
C*       A user error occurs if the user enters a device name other
C*       then mouse or joystick for device choice.
C*
C* LOCATION:
C*
C*       /u2/vcn/a21proto/maind
C*
C* PROGRAMMER:                DATE OF LAST CHANGE:    REASON FOR CHANGE:
C*
C*  VCNewton                   15 August 1983          initial entry
C*
C-*-*-*-*-*-*-*-*-*-*-*-*-*-*-*-*-*-*-*-*-*-*-*-*-*-*-*-*-*-*-*-*-*-*-*-*-*-*-*|*-*-*-*-

      Subroutine INIT

C     This subroutine initializes menu handler variables

C        (**Declare common blocks and common block variables**)
         Integer qcrmnu,qmxary,qmxst,qmloc,qmnum,
     +           qnextm,qoldm,qpick,qsegid,qsegnm,qstack(10)
         Logical qcancl,qext2m,qexitg,qmodfl,qretrn,qstmnu
         Integer qdarry(500)
         Common /b1/ qcancl,qext2m,qretrn,qstmnu,qnextm
         Common /b2/ qstack
         Common /b3/ qdarry,qmnum,qoldm
         Common /b4/ qmloc
         Common /b5/ qexitg
         Common /b6/ qcrmnu
         Common /b7/ qmxst
         Common /b8/ qmxary
         common/picks/qsegid,qpick,qmodfl
         Common /segnm/ segnm
         data qstack,qdarry/10*0,500*0/

C        (**Initialize variables needed for menu controllers**)
         Call inione
C        (**Initialize control variables**)
         Call SETVAR
C        (**Initialize other variables declared**)
         qcrmnu=0
         qexitg=.false.
         qmxary=500
         qmxst=10
         qmnum=0
C        qmodfl=.false.
         qoldm=0
         qpick=0
         qsegid=0
         qsegnm=1000
C        (**Initialize menu controller variables**)
         call inipic
c
c        (**Initialize variables for test of individual menus**)
c
         call tstini

      End


C++++++++++++++++++++++++++++++++++++++++++++++++++++++++++++++++++++++++++++++|+++++++++
C UNIT NAME:                         INITIM

C
C FUNCTIONAL DESCRIPTION:            .
C
C CALLED BY:                         INIPIC
C
C PROGRAMMER:                        DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*-*-*|*-*-*-*-

        subroutine initim
        return
        end
```

```
C+*+*+*+*+*+*+*+*+*+*+*+*+*+*+*+*+*+*+*+*+*+*+*+*+*+*+*+*+*+*+*+*+*|*+*+*+*+
C UNIT NAME:                    INMAIL
C
C FUNCTIONAL DESCRIPTION:       .
C
C CALLED BY:                    INIGRA
C
C PROGRAMMER:                   DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*|*-*-*-*-

        subroutine inmail
c
c       initialize mail function for Apollo version
c
        integer mbxres
        common /mbxres/ mbxres
        logical MBXACT, fstmsg
        common /MBXACT/ MBXACT, fstmsg
c
c        print*,'in inmail'
        mbxres = 0
        if(fstmsg) then
c            print*,'in inmail,first message,call openmail'
            call opmail(mbxres)
            fstmsg = .false.
        else
c            print*,'in inmail, call checkmail'
            call chekml(mbxres)
        endif
c
c  mbxres = 0   no channel to be opend, assume normal nsagrf
c  mbxres = 1   successful in opening mailbox channel
c
c       print*,'inmail -- exit'
        return
        end


C+*+*+*+*+*+*+*+*+*+*+*+*+*+*+*+*+*+*+*+*+*+*+*+*+*+*+*+*+*+*+*+*+*|*+*+*+*+
C UNIT NAME:                    INQSTA
C
C FUNCTIONAL DESCRIPTION:       .
C
C CALLED BY:                    STATEC
C
C PROGRAMMER:                   DATE OF LAST CHANGE     REASON FOR CHANGE
c  S. Lamb                    Feb 1988                command fix - inqsta
C
C-*-*-*-*-*-*-*-*-*-*-*-*-*-*-*-*-*-*-*-*-*-*-*-*-*-*-*-*-*-*-*-*-*-*|*-*-*-*-
c
        subroutine inqsta
c
c       this subroutine is the inquire state interpreter (4)
c
        common /states/ nextst
        logical wordis
c
        initls = nextst
c       do until nextst not = initial state
  100   continue
            call getwrd
            if (wordis('IS').or.wordis('THE').or.wordis('CURRENT'))
     +          then
c * ** *** **** ***** ****** ******* not understood / implem.
                nextst = 15
            else if (wordis('PROJECTION')) then
                nextst = 5
            else if (wordis('SCALE')) then
                nextst = 6
            else if (wordis('CENTER')) then
                nextst = 7
            else
                call putwrd
```

```
            nextst = 15
         endif
      if (nextst.eq.initls) go to 100
c
      return
      end


C+*+*+*+*+*+*+*+*+*+*+*+*+*+*+*+*+*+*+*+*+*+*+*+*+*+*+*+*+*+*+*+*+*+*|*+*+*+*+
C UNIT NAME:                    INTIND
C
C FUNCTIONAL DESCRIPTION:       .
C
C CALLED BY:                    INIONE
C
C PROGRAMMER:                   DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*|*-*-*-*-

      subroutine intind
      return
      end
C+*+*+*+*+*+*+*+*+*+*+*+*+*+*+*+*+*+*+*+*+*+*+*+*+*+*+*+*+*+*+*+*+*+*|*+*+*+*+
C UNIT NAME:                    INTSCN
C
C FUNCTIONAL DESCRIPTION:       ENLARGES PICTURE TO FULL SCREEN
C                                AND CONVERTS SCREEN FOR BW PRINTOUT
C
C INPUT FILES/PARAMETERS:
C
C                    COMMON
C    VARIABLE        BLOCK         TYPE        DESCRIPTION
C
C     XLLGVP         COMGVP        REAL     LOWER LEFT X OF ORIGINAL VIEWPORT
C     YLLGVP         COMGVP        REAL     LOWER LEFT Y OF ORIGINAL VIEWPORT
C     XURGVP         COMGVP        REAL     UPPER RIGHT X OF ORIGINAL VIEWPORT
C     YURGVP         COMGVP        REAL     UPPER RIGHT Y OF ORIGINAL VIEWPORT
C     QCRMNU         B6            INTEGER  CURRENT MENU NUMBER
C     XVLOW          ASPECT        REAL     LOWER LEFT X-CORNER OF SCREEN
C     YVLOW          ASPECT        REAL     LOWER LEFT Y-CORNER OF SCREEN
C     XVHIGH         ASPECT        REAL     UPPER RIGHT X-CORNER OF SCREEN
C     YVHIGH         ASPECT        REAL     UPPER RIGHT Y-CORNER OF SCREEN
C
C OUTPUT FILES/PARAMETERS:      NONE
C
C                    COMMON
C    VARIABLE        BLOCK         TYPE        DESCRIPTION
C
C     SXLLGP         SAVGVP        REAL     LOWER LEFT X OF ORIGINAL VIEWPORT
C     SYLLGP         SAVGVP        REAL     LOWER LEFT Y OF ORIGINAL VIEWPORT
C     SXURGP         SAVGVP        REAL     UPPER RIGHT X OF ORIGINAL VIEWPORT
C     SYURGP         SAVGVP        REAL     UPPER RIGHT Y OF ORIGINAL VIEWPORT
C     SAVMNU         SAVMNU        INTEGER  MENU NUMBER OF CURRENT MESSAGE
C                                           BEFORE SCREEN WAS ENLARGED
C
C SUBROUTINES/FUNCTIONS CALLED
C
C    INIPIC        INITIALIZE VARIABLES FOR DRAWING NEW PICTURE
C    HLDF          RETRIEVES FILE FOR DISPLAY (CURRENT PICTURE)
C    STORE         STORES THE PICTURE IN AN HLDF FILE
C    JVSALL        MAKE ALL SEGMENTS INVISIBLE
C    CLRFUL        CLEAR FULL SCREEN
C
C CALLED BY:                  PRINTR
C
C LOCAL VARIABLES:
C
C    VARIABLE               TYPE        DESCRIPTION
C
C     LOG                  LOGICAL     FLAG SET BY HLDF (NOT NEEDED)
C     OCHANG               LOGICAL     SAVE QCHANG
C
C RESTRICTIONS:
C
C ABNORMAL RETURN CONDITIONS:   N/A
C
C
```

```
C PROGRAMMER:                    DATE OF LAST CHANGE     REASON FOR CHANGE
C
C     DABUTSON                      11/13/84               INITIAL ENTRY
C
C-*-*-*-*-*-*-*-*-*-*-*-*-*-*-*-*-*-*-*-*-*-*-*-*-*-*-*-*-*-*-*-*-*-*-*-*-*|*-*-*-*-

      SUBROUTINE INTSCN
C
C ENLARGES THE DISPLAY AREA TO FULL SCREEN AND SAVES HLDF FILE
C
      common/oneflg/oneflg
      logical oneflg
      common /coltab/ coltab
      integer coltab(256)
      common/contrl/qclass
      logical       qclass
      common /coltobw/ coltobw
      logical       coltobw

      COMMON /COMGVP/ XLLGVP,YLLGVP,XURGVP,YURGVP
      COMMON /SAVGVP/ SXLLGP,SYLLGP,SXURGP,SYURGP
      COMMON /ASPECT/ XASPEC,YASPEC,XVLOW,XVHIGH,YVLOW,YVHIGH
      COMMON /ARSEGS/ NSGMEN,NSGGRA,NSGSYS,NSGMSG,NSGMAP,NSGFUL

      COMMON /QPRINT/QPRINT
      LOGICAL QPRINT

      COMMON/CHANGE/QCHANG
      LOGICAL       QCHANG

      COMMON/FLNAME/QNAME,qdscrp
      CHARACTER *50 QNAME
      character*60 qdscrp

        LOGICAL QLTON(16),QDOTEM
        INTEGER QPGRID(4),QTYPTB(16)
        INTEGER QLEVEL,QITPRO,QIRES,QLUNDA,QLUNIN,QLUNLI
        COMMON /MAP/ QXRNM,QXC,QYC,QLEVEL,QCLAT,QCLON,QXRAD,QYRAD,
     +      QITPRO,
     +      QIRES,QTYPTB,QLUNDA,QLUNIN,QLUNLI,QLTON,QPGRID,QDOTEM,
     +      QORHAL

      INTEGER QCRMNU
      COMMON /B6/ QCRMNU

      INTEGER QBOX,QBKGRD,QMBACK
      COMMON /SCRATR/ QBOX,QBKGRD,QMBACK

      COMMON /SAVMNU/ SAVMNU
      INTEGER SAVMNU
      integer prtchoi(2),featbk,featw,int,ierror
      common /prtchoi/ prtchoi

      CHARACTER*50 SVNAM
      LOGICAL LOG,OCHANG,tmpcls,savgrid
      common/label/qlabel
      character*3  qlabel

      common /msgold/ msgold,msgonm
      common /commvp/ xllmvp,yllmvp,xurmvp,yurmvp
      common /comkvp/ xllkvp,yllkvp,xurkvp,yurkvp
      common /comcvp/ xllcvp,yllcvp,xurcvp,yurcvp
      common /commen/xllmen,yllmen,xurmen,yurmen,ibcmen,iocmen,incmen
      common /nsgkey/ nsgkey,nsgktx
      common /pmenu/ pmenu,pmsg
      integer pmenu,pmsg
      logical qmapup
      common /mapup/ qmapup

      ierror = 0

C
C --- SAVE MAP VIEWPORT AND CURRENT MENU
C
```

```
      SXLLGP = XLLGVP
      SYLLGP = YLLGVP
      SXURGP = XURGVP
      SYURGP = YURGVP
      SAVMNU = QCRMNU

C
C --- STORE THE PICTURE
C
      OCHANG = QCHANG
      QCHANG = .TRUE.
      CALL STORE

C
C ---- CHANGE MAP VIEWPORT
C
      if(prtchoi(1).eq.2) then
         XLLGVP = XVLOW
         YLLGVP = YVLOW
         XURGVP = XVHIGH
         YURGVP = YVHIGH
      endif
C
C ---- CLEAR SCREEN AND INITIAL ALL NEEDED VARIABLES FOR A PICTURE
C
      if(.not.coltobw .or. (coltobw.and.qlabel.ne.'GEO')) then
         tmpcls=qclass
         savgrid = qlton(16)
         CALL INIPIC
         qclass=tmpcls
         qlton(16) = savgrid
      endif
      QCHANG = OCHANG
      QPRINT = .TRUE.
      if(prtchoi(1).eq.2) then
         CALL JVSALL(0)
         CALL CLRFUL
      else
c          call mesg(614)
      endif


      if (coltobw) then
        oneflg = .true.
        featbk = QTYPTB(8)
        featw  = QTYPTB(9)
        iboxtp = qbox
        qbox = 0
        QTYPTB(8) = 0
        QTYPTB(9) = 0
      endif


      if(coltobw) then

        if(qlabel .eq. 'GEO') then
           call UPDTMP
        else
           call HLDF (2,18,1,1,LOG)
clj ------ If not printing in full screen mode, then rewrite
clj ------ the filename so that it appears on the hardcopy.
           if(prtchoi(1).eq.1) call dspfln ( qname )
        endif

c        if(prtchoi(1).eq.1) then
c ---      REDRAW MENU,KEY,AND COMM. AREAS
c
c            call tmpcma (qname,pmsg)
c
c            call jvport (xllmvp,xurmvp,yllmvp,yurmvp)
c            call jwindo (xllmen,xurmen,yllmen,yurmen)
c            call jopen
c            call jrect (xllmen,yllmen,xurmen,yurmen)
c            Call tmpmen(pmenu,ierror)
c            call jclose
c
```

```
c           tmp = yurmen
c           yurmen = 8.
c           call keyvpt
c           call menwin
c           call jopen
c           call jrect (xllmen,yllmen,xurmen,yurmen)
c           call tmpmen (nsgktx,ierror)
c           yurmen = tmp
c           call jclose
c
c        endif

      else

        CALL HLDF(2,18,1,1,LOG)
      endif


      if (coltobw) then

        qbox = iboxtp
        QTYPTB(8) = featbk
        QTYPTB(9) = featw
        oneflg = .false.
      endif

      QPRINT = .FALSE.

C
C ---- COPY HLDF FILE TO SYSTEM ADMINSTRATOR'S DIRECTORY
C
      SVNAM = QNAME
      CALL SYSNAM(SVNAM,QNAME)
      CALL HLDF(8,INT,INT,INT,LOG)
      QNAME = SVNAM
      RETURN
      END


C+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                        INVTS2
C
C FUNCTIONAL DESCRIPTION:          .
C -              CHECKS MERCATOR AND EQUIRECTANGULAR FOR LINES
C -              TO BE CLIPPED AT LEFT AND RIGHT OF SCREEN.
C
C CALLED BY:                        NO LONGER USED BY CARICATURE
C
C PROGRAMMER:                       DATE OF LAST CHANGE     REASON FOR CHANGE
c -    L MCCLEARY                                        ORIGINAL CODE
C
C-*-*-*-*-*-*-*-*-*-*-*-*-*-*-*-*-*-*-*-*-*-*-*-*-*-*-*-*-*-*-*-*-*-*-*|*-*-*-*-

      SUBROUTINE INVTS2(TRLAT,TRLON,X,Y,PRVLON,PRVX,ISGOOD)

        LOGICAL ISGOOD
        LOGICAL INVALI
        COMMON/INVALI/INVALI
        logical lton(16),dotem
        integer ipgrid(4),ltyptb(16)
        common /map/ XRNM,XC,YC,LEVEL,CLAT,CLON,XRAD,YRAD,ITPROJ,
     +     IRES,LTYPTB,LUNDAT,LUNIND,LUNLIN,LTON,IPGRID,DOTEM,
     +     ORHALT
        COMMON /PROJT/ IGNOMN,IORTEQ,IORTPO,IORTHO,IPERSP
        COMMON /PROJT2/ IEQREC,IMERCA,ILAMCN
        COMMON/PIE/PIE,TPIE,PIO2,PIO4

        C =2.908882087E-4

C      SPECIAL LOGIC FOR MERCATOR AND EQUIRECTANGULAR TO PREVENT THE
C      CONNECTION OF TWO POINTS WHICH SHOULD ONLY BE JOINED BY CLIPPING
```

```
C       TO THE LEFT AND RIGHT OF THE SCREEN
        IF(ITPROJ.EQ.IEQREC.OR.ITPROJ.EQ.IMERCA) THEN
             ISGOOD=.TRUE.
             PRVLN=0.
             TRLN=0.
C       CHECK FOR SAME SIGN OF X,PRVX
             IF(ABS(PRVX+X).EQ.ABS(PRVX)+ABS(X)) GO TO 14
C       IF ABS(LON) .GE. 90 DEG , ADD OR SUB 360 DEPENDING ON CLON SIGN
             IF(ABS(TRLON).LT.PIO2) THEN
                 TCON=0.
             ELSE
                 TCON=TPIE
             ENDIF
             IF(CLON.GE.0) THEN
                 IF(TRLON.GE.0) THEN
                   TRLN=TRLON
                 ELSE
                   TRLN=TRLON+TCON
                 ENDIF
                 IF(PRVLON.GE.0) THEN
                   PRVLN=PRVLON
                 ELSE
                   PRVLN=PRVLON+TCON
                 ENDIF
             ELSE
                 IF(TRLON.LT.0) THEN
                   TRLN=TRLON
                 ELSE
                   TRLN=TRLON-TCON
                 ENDIF
                 IF(PRVLON.LT.0) THEN
                   PRVLN=PRVLON
                 ELSE
                   PRVLN=PRVLON-TCON
                 ENDIF
             ENDIF
C       REJECT IF LONS MORE THAN 180 DEG APART
             IF(ABS(TRLN-PRVLN).GE.PIE) THEN
                 ISGOOD=.FALSE.
                 GO TO 14
             ENDIF
C       REJECT IF LONS DO NOT STRADDLE CLON
             TDIFF=TRLN-CLON
             PDIFF=PRVLN-CLON
             IF(TDIFF.GE.0..AND.PDIFF.LE.0.) GO TO 14
             IF(PDIFF.GE.0..AND.TDIFF.LE.0.) GO TO 14
             ISGOOD=.FALSE.
      ENDIF

   14       CONTINUE

      RETURN
      END


C+*+*+*+*+*+*+*+*+*+*+*+*+*+*+*+*+*+*+*+*+*+*+*+*+*+*+*+*+*+*+*+*+*+*+*|*+*+*+*-
C UNIT NAME:                      ISAREA
C
C FUNCTIONAL DESCRIPTION:         .
C
C CALLED BY:                      CALCPR, DRAWST
C
C PROGRAMMER:                     DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*|*-*-*-*-

        logical function isarea ()
c
c       this function determines whether the current word is an area name
c
        logical found
c ----- updated 7/31/87 CSL                              - isarea
        character typec
        real mparms(4)
        common /mparms/ mparms
```

```
      logical eol,eoc
      common /comnds/ lenl,indxw,lenw,eol,eoc
      character * 80 comlin
      common /comlin/ comlin
c
      call mesg(271)
c ----- updated 7/31/87 CSL                          - isarea
      call shownm (comlin(indxw:indxw+lenw-1),lenw,mparms,found,typec)
      isarea = found
c
      return
      end

C+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    ISBLAN
C
C FUNCTIONAL DESCRIPTION:       .
C
C CALLED BY:                    CMDMAI
C
C PROGRAMMER:                   DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*|*-*-*-*-

      logical function isblan ()
c
c     this function determines whether the current command is blank
c
      logical eol,eoc
      common /comnds/ lenl,indxw,lenw,eol,eoc
c
      if (eoc.and.lenl.le.0) then
          isblan = .true.
      else
          isblan = .false.
      endif
c     print*,'isblan -- exit ',isblan
c
      return
      end

C+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    ISCOOR
C
C FUNCTIONAL DESCRIPTION:       .
C
C CALLED BY:                    CMDMAI, DRAWST, SCENTE
C
C PROGRAMMER:                   DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*|*-*-*-*-

      logical function iscoor ()
c
c     this function determines whether the current word is a geographic
c     coordinate
c
c
c ****
      iscoor = .false.
c
      return
      end

C+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    ISDECR
C
C FUNCTIONAL DESCRIPTION:       .
C
C CALLED BY:                    CMDMAI, DRAWST
C
```

```
C PROGRAMMER:                       DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*-*-*|*-*-*-*-

        logical function isdecr ()
c
c       this function determines whether the current word is an 'increase' word
c
        logical wordis
c
        if (wordis('LOWER').or.wordis('DOWN').or.wordis('DECREASE'))
     +  then
            isdecr = .true.
        else
            isdecr = .false.
        endif
c
        return
        end
C++++++++++++++++++++++++++++++++++++++++++++++++++++++++++++++++++++++++++++++|+++++++
C UNIT NAME:                        ISEOC
C
C FUNCTIONAL DESCRIPTION:           .
C
C CALLED BY:                        CALCPR, CMDMAI, DECDET, DECSCA, DRAWST,
C                                   INCDET, INCSCA, MAJORS, MINORS
C                                   SCENTE, SETSCA, SPROJE, SSCALE
C
C PROGRAMMER:                       DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*-*-*|*-*-*-*-

        logical function iseoc ()
c
c       this function determines whether you are currently at an end of command
c
        logical eol,eoc
        common /comnds/ lenl,indxw,lenw,eol,eoc
c
        iseoc = eoc
c       print*,'iseoc -- exit ',iseoc
c
        return
        end


C++++++++++++++++++++++++++++++++++++++++++++++++++++++++++++++++++++++++++++++|+++++++
C UNIT NAME:                        ISFEAT
C
C FUNCTIONAL DESCRIPTION:           .
C
C CALLED BY:                        CMDMAI, DRAWST, ERASES, MAJORS, MINORS,
C                                   REMOVF
C
C PROGRAMMER:                       DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*-*-*|*-*-*-*-

        logical function isfeat ()
c
c       this function determines whether the current word is a map feature
c
        common /indpar/ indpro,indftr
        logical wordis
c
        isfeat = .true.
        if (wordis('COASTLINES')) then
            indftr = 1
        else if (wordis('COUNTRIES')) then
            indftr = 2
        else if (wordis('STATES')) then
            indftr = 3
        else if (wordis('RIVERS')) then
```

```
            indftr = 4
        else if (wordis('RAILROADS')) then
            indftr = 5
        else if (wordis('ROADS')) then
            indftr = 6
        else if (wordis('GRIDS')) then
            indftr = 7
        else if (wordis('NAMES')) then
            indftr = 10
        else if (wordis('CITIES')) then
            indftr = 16
        else if (wordis('OVERLAY')) then
            indftr = 11
        else if (wordis('GAZETTEER')) then
            indftr = 15
        else
            isfeat = .false.
        endif
c
        return
        end

C++*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    ISINCR
C
C FUNCTIONAL DESCRIPTION:        .
C
C CALLED BY:                     CMDMAI, DRAWST
C
C PROGRAMMER:                    DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*|*-*-*-*-

        logical function isincr ()
c
c       this function determines whether the current word is an 'increase' word
c
        logical wordis
c
        if (wordis('HIGHER').or.wordis('UP').or.wordis('RAISE')
     +  .or.wordis('INCREASE')) then
            isincr = .true.
        else
            isincr = .false.
        endif
c
        return
        end

C++*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    ISKILO
C
C FUNCTIONAL DESCRIPTION:        .
C
C CALLED BY:                     SETSCA
C
C PROGRAMMER:                    DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*|*-*-*-*-

        logical function iskilo ()
c
c       this function determines whether the current word is kilometers
c
c
c ****
        iskilo = .false.
c
        return
        end
```

```
C+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    ISMILE
C
C FUNCTIONAL DESCRIPTION:       .
C
C CALLED BY:                    SETSCA
C
C PROGRAMMER:                   DATE OF LAST CHANGE    REASON FOR CHANGE
C
C-*-*-*-*-*-*-*-*-*-*-*-*-*-*-*-*-*-*-*-*-*-*-*-*-*-*-*-*-*-*-*-*-*-*-*-*|*-*-*-*-

      logical function ismile ()
c
c     this function determines whether the current word is miles
c
c
c ****
      ismile = .false.
c
      return
      end

C+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    ISNM
C
C FUNCTIONAL DESCRIPTION:       .
C
C CALLED BY:                    SETSCA
C
C PROGRAMMER:                   DATE OF LAST CHANGE    REASON FOR CHANGE
C
C-*-*-*-*-*-*-*-*-*-*-*-*-*-*-*-*-*-*-*-*-*-*-*-*-*-*-*-*-*-*-*-*-*-*-*-*|*-*-*-*-

      logical function isnm ()
c
c     this function determines whether the current word is nautical miles
c
c
c ****
      isnm = .false.
c
      return
      end

C+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    ISNUMB
C
C FUNCTIONAL DESCRIPTION:       .
C
C CALLED BY:                    SSCALE
C
C PROGRAMMER:                   DATE OF LAST CHANGE    REASON FOR CHANGE
C
C-*-*-*-*-*-*-*-*-*-*-*-*-*-*-*-*-*-*-*-*-*-*-*-*-*-*-*-*-*-*-*-*-*-*-*-*|*-*-*-*-

      logical function isnumb ()
c
c     this function determines whether the current word is a number
c
c
c ****
      isnumb = .false.
c
      return
      end

C+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    ISPROJ
C
C FUNCTIONAL DESCRIPTION:       .
C
```

```
C CALLED BY:                          CMDMAI, SPROJE
C
C PROGRAMMER:                         DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*-*-*|*-*-*-*-

        logical function isproj ()
c
c       this function determines whether the current word is a map projection
c
        common /indpar/ indpro,indftr
        logical wordis
c
        isproj = .true.
        if (wordis('GNOMONIC')) then
            indpro = 1
        else if (wordis('EQUATORIAL')) then
            indpro = 2
        else if (wordis('POLAR')) then
            indpro = 3
        else if (wordis('ORTHOGRAPHIC')) then
            indpro = 4
        else if (wordis('PERSPECTIVE')) then
            indpro = 5
        else if (wordis('EQUIRECTANGULAR')) then
            indpro = 6
        else if (wordis('MERCATOR')) then
            indpro = 7
        else
            isproj = .false.
        endif
c
        return
        end

C+*+*+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                          ISSEGM
C
C FUNCTIONAL DESCRIPTION:              .
C
C CALLED BY:                          DRAWF, FTRCON
C
C PROGRAMMER:                         DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*-*-*|*-*-*-*-

        logical function issegm (nsegm)

c       does nsegm currently exist as a segment

        integer ARAY(19)

        ARAY(1) = 0
        CALL JISGMT(nsegm,ARAY)
        if (ARAY(1).EQ.1) then
            issegm = .true.
        else
            issegm = .false.
        endif

        return
        end

C+*+*+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                          JFILLM
C
C FUNCTIONAL DESCRIPTION:              .
C
C CALLED BY:                          FILLPT
C
C PROGRAMMER:                         DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*-*-*|*-*-*-*-
```

```
        subroutine jfillm (icol,x,y,renew)
c
c       this subroutine does a hardware fill usually of a map using color
c       icol at x/y
c
        logical renew
        logical sys
        common /sysdbc/ sys

        call jconwv (x,y,z,vx,vy)
        if (sys) then
            print*,'jfillm -- ',x,y,vx,vy,renew,icol
            call jcmark (5)
            call jmark (x,y)
        else
            call jfillv (5126,icol,vx,vy,renew)
        endif
c
        return
        end

C+*+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:                      jfills
c
c  Functional Description:
c       this subroutine does a hardware fill using color icol at x/y
c
c  Input Files/Parameters:
c
c  Output Files/Parameters: N/A
c
c  Subroutines/Functions Called:
c      Note: Subroutines preceded by a "j" are explained in the DI-3000 manual.
c
c  Called By:                      APFILL
c
c  Local Variables: N/A
c
c  Restrictions: N/A
c
c  Abnormal Return Conditions:  N/A
c
c  Location:       /a21/dave
c
c  Programmer        Date of Last Change       Reason for Change
c
C-*-*-*-*-*-*-*-*-*-*-*-*-*-*-*-*-*-*-*-*-*-*-*-*-*-*-*-*-*-*-*-*-*-*-*-*-*|*-*-*-*-
c
        subroutine jfills (icol,x,y,renew)
c
c       this subroutine does a hardware fill usually of a symbol using
c       color icol at x/y
c
        logical renew
        call jconwv (x,y,z,vx,vy)
        call jfillv (5125,icol,vx,vy,renew)
c
        return
        end

C+*+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:                      jfillv
c
c  Functional Description:
c       this subroutine does a hardware fill using color icol at x/y using
c       escape code icode
c
c  Input Files/Parameters:
c
c  Output Files/Parameters: N/A
c
c  Subroutines/Functions Called:
c      Note: Subroutines preceded by a "j" are explained in the DI-3000 manual.
c
```

```
c  Called By:                        FCFILL, JFILLM, JFILLS
c
c  Local Variables: N/A
c
c  Restrictions: N/A
c
c  Abnormal Return Conditions:  N/A
c
c  Location:      /a21/dave
c
c  Programmer         Date of Last Change       Reason for Change
c
C-*-*-*-*-*-*-*-*-*-*-*-*-*-*-*-*-*-*-*-*-*-*-*-*-*-*-*-*-*-*-*-*-*-*-*-*-*-*|*-*-*-*-
c
        subroutine jfillv (icode,icol,vx,vy,renew)
c
c       this subroutine does a hardware fill using color icol at x/y
c
        logical renew
        real reapar(2)
        integer intpar(2)
        integer coltab(256)
        common /coltab/ coltab
        common /aspect/ xaspec,yaspec,xvlow,xvhigh,yvlow,yvhigh

        icol = coltab(icol+1)
c ***   fudge values because of Apollo seedfill problem
        avx = (vx + 1.) / 2.
        avx = avx / xaspec
        vx = avx * 2. - 1.
        avy = (vy + 1.) / 2.
        avy = avy / yaspec
        vy = avy * 2. - 1.

        reapar(1) = vx
        reapar(2) = vy
        intpar(1) = icol
        if (renew) then
            intpar(2) = 1
        else
            intpar(2) = 0
        endif
        call jescap (icode,2,2,intpar,reapar)

        return
        end


C+*+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                        JULIAN
C
C FUNCTIONAL DESCRIPTION:           .
C
C CALLED BY:                        DIFTIM, FADCHG
C
C PROGRAMMER:                       DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*-*|*-*-*-*-

      subroutine julian (julyr, julmon, julday, juldat)

c     this subroutine converts  yr, mon, day, values
c     into a corresponding julian date.

      integer i
      integer julyr
      integer julmon
      integer julday
      integer juldat
      integer*2 months(12)

      data months /31,28,31,30,31,30,31,31,30,31,30,31/

c       julyr = year
c       julmon = month
```

```
c       julday = day

        months(2) = 28

        if ((mod(julyr,4) .eq. 0) .and.
     +        ((mod(julyr,100) .ne. 0) .or.
     +        (mod(julyr,400) .eq. 0))) then
           months(2) = 29
        end if

        juldat = 0
        if (julmon .eq. 1) then
           juldat = julday
        else
           do 100 i=1,julmon-1
              juldat = juldat + months(i)
100        continue
           juldat = juldat + julday
        end if
        return
        end

C+*+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:                    keybd
c
c  Functional Description:       Subroutine to get keyboard input
c
c  Input Files/Parameters:
c      General Gobals
c        qdsdev        device       integer   DI-3000 variable
c        qpydev        device       integer   DI-3000 variable
c        qecho         device       integer   DI-3000 variable
c
c  Output Files/Parameters:      N/A
c
c  Subroutines/Functions Called:
c       Note: Subroutines preceded by a "j" are explained in the DI-3000 man
c
c  Called By:                    CLASS, OTHCLS
c
c  Local Variables:
c      maxchr                  integer   maximum length of input wanted
c                                          (80 or less characters)
c      length                  integer   actual length of input recieved
c      input                   character string of character input
c                                         from a menu
c
c  Restrictions: Input cannot be longer than 254 characters
c
c  Abnormal Return Conditions:  N/A
c
c  Location:    /a21/dave
c
c  Programmer        Date of Last Change       Reason for Change
c     bam             October 27, 1983
c
c  Work still to be done:
c
C-*-*-*-*-*-*-*-*-*-*-*-*-*-*-*-*-*-*-*-*-*-*-*-*-*-*-*-*-*-*-*-*-*-*-*-*-*|*-*-*-*-

        subroutine keybd(maxchr,input,length)

c       calls jkeybd function

        integer qdsdev,qpydev,qecho,qlecho
        common /device/ qdsdev,qpydev,qecho,qlecho

        integer maxchr,length
        character *(*) input
        logical sys,rdkey,savkey
        common /sysdbc/ sys
```

```
      common /rkdbc/ rdkey
      common /svkdbc/ savkey
      logical eofkey
      integer keylun,newlun
      common /keylun/ keylun,newlun,eofkey
      character*6 command
      logical timout
      integer*2 time
      common /timout/ timout,time
c      data keylun/28/,newlun/29/,eofkey/.false./    - keybd

      if (sys) print*,'keybd -- enter',maxchr
c     call enall
 100  continue
      if ( (rdkey).and..not.eofkey) then
          call kpause (eofkey)
          read (keylun,*,end=192,err=191) command,length,input
          if (command(1:5).ne.'jkeyb') then
              print*,'keybd -- incompatible command in ',
     +        'read_keys file  ',command,length
c             *** exit on error
              go to 199
          endif
      else

 125     continue

c        polling loop to check for incoming data or clock interrupt

         call datpol

c        check for keyboard interrupt

         call jkeybs(qdsdev,qpydev,qecho,maxchr,input,length)
         if (timout) then
            go to 125
         end if
      end if

      go to 199
 191  continue
          print*,'keybd -- error on read of save key file',
     +    '  ',keylun,length,'  ',input(1:length)
          go to 199
 192  continue
          print*,'keybd -- premature end of read key file.'
          eofkey = .true.
          go to 100
c         **** go back and get the function interactively on end of file
 199  continue
      if (savkey) then
          write (newlun,*,err=135) '''jkeybd''',length,' ''',
     +    input(1:length),''''
      endif
      go to 140
 135  continue

          print*,'keybd -- error on write to save key file',
     +    '  ',newlun,length,'  ',input(1:length)
 140  continue
      if (length.gt.maxchr) then
c         print*,'keybd -- length > maxchr : ',length,maxchr
          length = maxchr
      endif
c     call soverl
      if (sys) print*,'keybd -- exit ',length,'  ',input(1:length)

      return
      end

C+*+*+*+*+*+*+*+*+*+*+*+*+*+*+*+*+*+*+*+*+*+*+*+*+*+*+*+*+*+*+*+*+*|*+*+*+*+
c  UNIT NAME:                    keybs
c
c  Functional Description:
```

```
c       calls jkeybs function
c
c  Input Files/Parameters:
c
c  Output Files/Parameters: N/A
c
c  Subroutines/Functions Called:
c       Note: Subroutines preceded by a "j" are explained in the DI-3000 man
c
c  Called By:                    PROMPT
c
c  Local Variables: N/A
c
c  Restrictions: N/A
c
c  Abnormal Return Conditions:  N/A
c
c  Location:      Apollo       /gl
c
c  Programmer        Date of Last Change       Reason for Change
c
C-*-*-*-*-*-*-*-*-*-*-*-*-*-*-*-*-*-*-*-*-*-*-*-*-*-*-*-*-*-*-*-*-*-*-*|*-*-*-*-

        subroutine keybs (maxchr,input,length)

c       calls jkeybs function

        integer qdsdev,qpydev,qecho,qlecho
        common /device/ qdsdev,qpydev,qecho,qlecho

        integer maxchr,length
        character *(*) input
        logical sys,rdkey,savkey
        common /sysdbc/ sys
        common /rkdbc/ rdkey
        common /svkdbc/ savkey
        logical eofkey
        integer keylun,newlun
        common /keylun/ keylun,newlun,eofkey
        character*6 command
        integer*2 time
        logical timout
        common /timout/ timout, time

        if (sys) print*,'keybs -- enter',maxchr
c       call enall
  100   continue
        if ((rdkey).and..not.eofkey) then
            call kpause (eofkey)
            read (keylun,*,end=192,err=191) command,length,input
            if (command(1:5).ne.'jkeyb') then
                print*,'keybs -- incompatible command in ',
     +          'read_keys file  ',command,length
c               *** exit on error
                go to 199
            endif
        else

  125      continue
c
c          polling loop to check for incoming data or clock interrupt
c
           call datpol
c
c          check for keyboard interrupt
c
           call jkeybs (qdsdev,qpydev,qecho,maxchr,input,length)
           if (timout) then
              go to 125
           end if
        endif

c*******    remove <return> from length of input string *******************
c           length = length - 1
c**********************************************************************
```

```
      go to 199
 191  continue
         print*,'keybs -- error on read of save key file',
    +    '  ',keylun,length,'  ',input(1:length)
         go to 199
 192  continue
         print*,'keybs -- premature end of read key file.'
         eofkey = .true.
         go to 100
c        **** go back and get the function interactively on end of file
 199  continue
      if (savkey) then
         write (newlun,*,err=135) '''jkeybs''',length,' ''',
    +    input(1:length),''''
      endif
      go to 140
 135  continue
         print*,'keybs -- error on write to save key file',
    +    '  ',newlun,length,'  ',input(1:length)
 140  continue
      if (length.gt.maxchr) then
c        print*,'keybs -- length > maxchr : ',length,maxchr
         length = maxchr
      endif
c     call soverl
      if (sys) print*,'keybs -- exit ',length,'  ',input(1:length)

      return
      end
C+*+*+*+*+*+*+*+*+*+*+*+*+*+*+*+*+*+*+*+*+*+*+*+*+*+*+*+*+*+*+*+*+*|*+*+*+*+
c  UNIT NAME:                    keys
c
c  Functional Description:
c       puts standard function key items in key area
c
c  Input Files/Parameters:
c
c  Output Files/Parameters: N/A
c
c  Subroutines/Functions Called:
c
c  Called By:                    FMAIN
c
c  Local Variables: N/A
c
c  Restrictions: N/A
c
c  Abnormal Return Conditions:  N/A
c
c  Location:       /a21/dave
c
c  Programmer        Date of Last Change       Reason for Change
c
C-*-*-*-*-*-*-*-*-*-*-*-*-*-*-*-*-*-*-*-*-*-*-*-*-*-*-*-*-*-*-*-*-*|*-*-*-*-
c
      subroutine keys
c
c     puts standard function key items in key area
c
      common /commen/xllmen,yllmen,xurmen,yurmen,ibcmen,iocmen,incmen
      common /nsgkey/ nsgkey,nsgktx
      data icolcm/16/
c
c     print*,'keys -- enter',nsgkey,nsgktx
      tmp = yurmen
      yurmen = 8.
      call keyvpt
      call menwin
      call creatm (nsgktx,ierror)
      yurmen = tmp
c     print*,'keys -- exit',ierror
c
      return
      end
```

```
C+*+*+*+*+*+*+*+*+*+*+*+*+*+*+*+*+*+*+*+*+*+*+*+*+*+*+*+*+*+*+*+*+*+*+|*+*+*+*+
c  UNIT NAME:                     keyvpt
c
c  Functional Description:
c       this subroutines sets the key area viewport
c
c  Input Files/Parameters:
c
c  Output Files/Parameters: N/A
c
c  Subroutines/Functions Called:
c       Note: Subroutines preceded by a "j" are explained in the DI-3000 manual.
c
c  Called By:                     KEYS, MAKKEY
c
c  Local Variables: N/A
c
c  Restrictions: N/A
c
c  Abnormal Return Conditions:  N/A
c
c  Location:      Apollo       /a21/dave
c
c  Programmer        Date of Last Change      Reason for Change
c
C-*-*-*-*-*-*-*-*-*-*-*-*-*-*-*-*-*-*-*-*-*-*-*-*-*-*-*-*-*-*-*-*-*-*-*|*-*-*-*-
c
        subroutine keyvpt
c
c       this subroutines sets the key area viewport
c
        common /comkvp/ xllkvp,yllkvp,xurkvp,yurkvp
c
        call jvport (xllkvp,xurkvp,yllkvp,yurkvp)
c
        return
        end
C+*+*+*+*+*+*+*+*+*+*+*+*+*+*+*+*+*+*+*+*+*+*+*+*+*+*+*+*+*+*+*+*+*+*+|*+*+*+*+
C UNIT NAME:                      LEGEND
C
C FUNCTIONAL DESCRIPTION:         .
C
C CALLED BY:                      ERASEM
C
C PROGRAMMER:                     DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*|*-*-*-*-
       subroutine legend
       return
       end
C+*+*+*+*+*+*+*+*+*+*+*+*+*+*+*+*+*+*+*+*+*+*+*+*+*+*+*+*+*+*+*+*+*+*+|*+*+*+*+
c  UNIT NAME:                     length
c
c  Functional Description:
c       this subroutine finds the length of a string
c
c  Input Files/Parameters:
c
c  Output Files/Parameters: N/A
c
c  Subroutines/Functions Called:
c      Note: Subroutines preceded by a "j" are explained in the DI-3000 manual.
c
c  Called By:                     CRMESG, DISP5,  MESGJF, PLTCIT,
C                                 READCH, GETARG, DSPCLS
c
c  Local Variables: N/A
c
c  Restrictions: N/A
c
c  Abnormal Return Conditions:  N/A
c
c  Location:      /a21/dave
c
```

```
c  Programmer          Date of Last Change        Reason for Change
c
C-*-*-*-*-*-*-*-*-*-*-*-*-*-*-*-*-*-*-*-*-*-*-*-*-*-*-*-*-*-*-*-*-*-*-*-*-*-*-*|*-*-*-*-
c
        subroutine length (buf,maxlen,lenbuf)
c
c       this subroutine finds the length of a string
c
        character*(*) buf
c
        call lngth (buf,maxlen,lenbuf)
c
        return
        end

c       subroutine length (buf,maxlen,lenbuf)
c
c       this subroutine finds the length of a string
c
c       character*(*) buf
c
c       do 110 i=maxlen,1,-1
c           if (buf(i:i).ne.' ') go to 120
c 110   continue
c       i=0
c 120   continue
c       lenbuf = i
c
c       return
c       end

C++++++++++++++++++++++++++++++++++++++++++++++++++++++++++++++++++++++++++++++|+++++++
C UNIT NAME: limits
C
C FUNCTIONAL DESCRIPTION:  CALCULATE GEOGRAPHIC LIMITS OF VIEWPORT
C
C INPUT FILES/PARAMETERS:
C
C GLOBAL VARIABLES : NONE.
C
C OUTPUT FILES/PARAMETERS:  NONE.
C
C SUBROUTINES/FUNCTIONS CALLED :
C
C CALLED BY:                     NO LONGER USED BY CARICATURE
C
C LOCAL VARIABLES: NONE.
C
C RESTRICTIONS: NONE.
C
C ABNORMAL RETURN CONDITIONS:    NONE.
C
C LOCATION:
C
C PROGRAMMER:                    DATE OF LAST CHANGE     REASON FOR CHANGE
C
C     DAVE NATION                                        ORIGINAL CODE.
C     JERRY FENERTY                                      DOCUMENT AND MODIFY
C                                                        FOR A21 PROTOTYPE.
C     David Nation               12/10/86                Correct Equirect code
C                                                        & impl Mercator code
C
C-*-*-*-*-*-*-*-*-*-*-*-*-*-*-*-*-*-*-*-*-*-*-*-*-*-*-*-*-*-*-*-*-*-*-*-*-*-*-*|*-*-*-*-
        SUBROUTINE LIMITS(ITPRO,XRA,YRA,CLA,CLO,VMAXLA,VMINLA,
     +  VMAXLO,VMINLO)

C       CALCULATE GEOGRAPHIC LIMITS OF VIEWPORT

        LOGICAL NEWONS
        LOGICAL ISINV
        LOGICAL NPONSC,SPONSC

        COMMON /PROJT/ IGNOMN,IORTEQ,IORTPO,IORTHO,IPERSP
        COMMON /PROJT2/ IEQREC,IMERCA,ILAMCN
        COMMON /PIE/ PIE,TPIE,PIO2,PIO4
        COMMON /CONST/ MAXVAL,RMPV,C,R,ERNM
```

```
      LOGICAL INVALI
      COMMON /INVALI/ INVALI
      logical sys
      common /sysdbc/ sys

      if (sys) then
          print*,'limits -- enter ',ITPRO,XRA,YRA,CLA,CLO,VMAXLA,
     +        VMINLA,VMAXLO,VMINLO
      endif
      VMAXLA=90.*60.*C
      VMINLA=-90.*60.*C
      VMAXLO=180.*60.*C
      VMINLO=-180.*60.*C

C     TEST FOR POLES (DOES NOT WORK AS EXPECTED FOR OE PROJ)

      PLAT=90.*60.*C
      PLON=0.
      CALL INVTES (PLAT,PLON,ISINV)
      NPONSC=.FALSE.
      IF (.NOT.ISINV) THEN
          CALL LLTOXY (PLAT,PLON,X,Y)
          CALL CLIPXY (X,Y,NPONSC)
      ENDIF
      PLAT=-PLAT
      CALL INVTES (PLAT,PLON,ISINV)
      SPONSC=.FALSE.
      IF (.NOT.ISINV) THEN
          CALL LLTOXY (PLAT,PLON,X,Y)
          CALL CLIPXY (X,Y,SPONSC)
      ENDIF
C     GO TO (910,920,930,940,950,960,960,980),ITPRO     - limits
      GO TO (910,920,930,990,990,960,960,990),ITPRO
C                                   GNOMONIC        1
  910 CONTINUE
      IF (NPONSC) THEN
          CALL XYTOLL(0.,-YRA,PLAT,PLON)
          VMINLA=PLAT
          CALL XYTOLL(XRA,-YRA,PLAT,PLON)
          IF (PLAT.LT.VMINLA) VMINLA=PLAT
          GO TO 918
      ENDIF
      IF (SPONSC) THEN
          CALL XYTOLL (0.,YRA,PLAT,PLON)
          VMAXLA=PLAT
          CALL XYTOLL(XRA,YRA,PLAT,PLON)
          IF (PLAT.GT.VMAXLA) VMAXLA=PLAT
          GO TO 918
      ENDIF
          CALL XYTOLL (0.,YRA,PLAT,PLON)
          VMAXLA=PLAT
          CALL XYTOLL(XRA,YRA,PLAT,PLON)
          IF (PLAT.GT.VMAXLA) VMAXLA=PLAT
          CALL XYTOLL(0.,-YRA,PLAT,PLON)
          VMINLA=PLAT
          CALL XYTOLL(XRA,-YRA,PLAT,PLON)
          IF (PLAT.LT.VMINLA) VMINLA=PLAT
          CALL XYTOLL (-XRA,YRA,PLAT,PLON)
          VMIN=PLON
          CALL XYTOLL (-XRA,-YRA,PLAT,PLON)
          IF (PLON.LT.VMIN) VMIN=PLON
          CALL XYTOLL (XRA,YRA,PLAT,PLON)
          VMAX=PLON
          CALL XYTOLL (XRA,-YRA,PLAT,PLON)
          IF (PLON.GT.VMAX) VMAX=PLON
          IF (VMAX.GT.VMIN) THEN
              VMAXLO=VMAX
              VMINLO=VMIN
          ENDIF
  918 CONTINUE
      GO TO 990

C     ORTHOGRAPHIC EQUATORIAL     2

  920 CONTINUE
      CALL XYTOLL (0.,-YRA,PLAT,PLON)
      IF (.NOT.INVALI) THEN
```

```
            VMINLA=PLAT
         ENDIF
         CALL XYTOLL (0.,YRA,PLAT,PLON)
         IF (.NOT.INVALI) THEN
            VMAXLA=PLAT
         ENDIF
         PLAT=0.
         PLON=180.*60.*C
         CALL INVTES (PLAT,PLON,ISINV)
         NEWONS=.FALSE.
         IF (.NOT.ISINV) THEN
            CALL LLTOXY (PLAT,PLON,X,Y)
            CALL CLIPXY (X,Y,NEWONS)
         ENDIF
         IF (.NOT.NEWONS) THEN
            VMAXLO=CLO+PIO2
            VMINLO=CLO-PIO2
            CALL XYTOLL (-XRA,YRA,PLAT,PLON)
            IF (INVALI) GO TO 928
            VMIN=PLON
            CALL XYTOLL (-XRA,-YRA,PLAT,PLON)
            IF (INVALI) GO TO 928
            IF (PLON.LT.VMIN) VMIN=PLON
            VMINLO=VMIN
            CALL XYTOLL (XRA,YRA,PLAT,PLON)
            IF (INVALI) GO TO 928
            VMAX=PLON
            CALL XYTOLL (XRA,-YRA,PLAT,PLON)
            IF (INVALI) GO TO 928
            IF (PLON.GT.VMAX) VMAX=PLON
            VMAXLO=VMAX
         ENDIF
         GO TO 929
  928    CONTINUE
C        PRINT*,'LIMITS -- ERROR  INVALI,PLAT,PLON=',INVALI,PLAT,PLON
  929    CONTINUE
         GO TO 990

C        ORTHOGRAPHIC POLAR       3

  930    CONTINUE
         IF (CLA.GE.0.) THEN
            VMINLA=0.
            if (.not.nponsc) then
              call xytoll(xra,yra,plat,plon)
              vmaxlo = plon
              call xytoll(-xra,yra,plat,plon)
              vminlo = plon
              call xytoll(0.0,yra,plat,plon)
              vmaxla = plat
            else
              vmaxlo =  PIE
              vminlo = -PIE
              vmaxla =  PIO2
            endif
         ELSE
            VMAXLA=0.
            if (.not.sponsc) then
              call xytoll(xra,-yra,plat,plon)
              vmaxlo = plon
              call xytoll(-xra,-yra,plat,plon)
              vminlo = plon
              call xytoll(0.0,-yra,plat,plon)
              vmaxla = plat
            else
              vmaxlo =  PIE
              vminlo = -PIE
              vminla = -PIO2
            endif
         ENDIF
         if (vmaxlo.lt.vminlo) then
            vmaxlo =  PIE
            vminlo = -PIE
         endif
         GO TO 990

C        ORTHOGRAPHIC             4
```

```
 940    CONTINUE
        if (clat.gt.0) then
            call xytoll(-xra,-yra,plat,plon)
            vminla = plat
            if (.not.nponsc) then
              call xytoll(xra,yra,plat,plon)
              vmaxlo = plon
              call xytoll(-xra,yra,plat,plon)
              vminlo = plon
              call xytoll(0.0,yra,plat,plon)
              vmaxla = plat
            else
              vmaxlo =  PIE
              vminlo = -PIE
              vmaxla =  PIO2
            endif
        else
            call xytoll(xra,yra,plat,plon)
            vmaxla = plat
            if (.not.sponsc) then
              call xytoll(xra,-yra,plat,plon)
              vmaxlo = plon
              call xytoll(-xra,-yra,plat,plon)
              vminlo = plon
              call xytoll(0.0,-yra,plat,plon)
              vminla = plat
            else
              vmaxlo =  PIE
              vminlo = -PIE
              vminla =  PIO2
            endif
        endif
        if (vmaxlo.lt.vminlo) then
            vmaxlo =  PIE
            vminlo = -PIE
        endif

        GO TO 990

C       PERSPECTIVE             5

 950    CONTINUE
        xedge = sqrt(xra**2 - yra**2) -1
        if (clat.gt.0.) then
            call xytoll(xedge,-yra,plat,plon)
            vminla = plat
            if (.not.nponsc) then
              call xytoll(0.,yra,plat,plon)
              vmaxla = plat
              PLAT=CLA
              PLON=180.*60.*C
              NEWONS=.FALSE.
              call xytoll(xedge,yra,plat,plon)
              vmaxlo = plon
              call xytoll(-xedge,yra,plat,plon)
              vminlo = plon
              if (vmaxlo.lt.vminlo) then
                vmaxlo =  PIE
                vminlo = -PIE
              endif
            endif
        else
            call xytoll(xedge,yra,plat,plon)
            vmaxla = plat
            if (.not.sponsc) then
              call xytoll(0.,-yra,plat,plon)
              vmaxla = plat
              PLAT=CLA
              PLON=180.*60.*C
              NEWONS=.FALSE.
              call xytoll(xedge,-yra,plat,plon)
              vmaxlo = plon
              call xytoll(-xedge,-yra,plat,plon)
              vminlo = plon
              if (vmaxlo.lt.vminlo) then
                vmaxlo =  PIE
```

```
          vminlo = -PIE
        endif
      endif
    endif

    GO TO 990

C   EQUIRECTANGULAR  AND MERCATOR

960 CONTINUE
    CALL XYTOLL (0.,YRA,PLAT,PLON)
    IF (.not.INVALI) THEN
        VMAXLA=PLAT
    ENDIF
    CALL XYTOLL (0.,-YRA,PLAT,PLON)
    IF (.not.INVALI) THEN
        VMINLA=PLAT
    ENDIF
    PLAT=CLA
    PLON=180.*60.*C
    NEWONS=.FALSE.
    CALL LLTOXY (PLAT,PLON,X,Y)
    CALL CLIPXY (X,Y,NEWONS)
    IF (.NOT.NEWONS) THEN
        CALL XYTOLL (-XRA,0.,PLAT,PLON)
        VMINLO=PLON
        CALL XYTOLL (XRA,0.,PLAT,PLON)
        VMAXLO=PLON
    ENDIF
    GO TO 990

C   LAMBERT
980 CONTINUE
    if (clat.gt.0.) then
        call xytoll(-xra,-yra,plat,plon)
        vminla = plat
        if (.not.nponsc) then
          call xytoll(0.,yra,plat,plon)
          vmaxla = plat
          call xytoll(xra,yra,plat,plon)
          vmaxlo = plon
          call xytoll(-xra,yra,plat,plon)
          if (plon.lt.vmaxlo) then
            vminlo = plon
          else
            vmaxlo = -vminlo
          endif
        endif
    else
        call xytoll(xra,yra,plat,plon)
        vmaxla = plat
        if (.not.sponsc) then
          call xytoll(0.,-yra,plat,plon)
          vmaxla = plat
          call xytoll(xra,-yra,plat,plon)
          vmaxlo = plon
          call xytoll(-xedge,-yra,plat,plon)
          if (plon.lt.vmaxlo) then
            vminlo = plon
          else
            vmaxlo = -vminlo
          endif
        endif
    endif

    GO TO 990

990 CONTINUE
    if (sys) then
        print*,'limits -- exit ',ITPRO,XRA,YRA,CLA,CLO,VMAXLA,
   +        VMINLA,VMAXLO,VMINLO
    endif
    RETURN
    END

C+**************************************************************|*******
C UNIT NAME: LLCONV
```

```
C
C FUNCTIONAL DESCRIPTION:  CONVERTS DDMMSS,SIGN INTO LAT OR LONG.
C
C INPUT FILES/PARAMETERS:
C
C        CLAT                   REAL*8      LAT OR LONG VALUE (DDMMSS).
C        SIGN                   INTEGER     INDICATES DIRECTION
C
C GLOBAL VARIABLES : NONE.
C
C OUTPUT FILES/PARAMETERS:

C        LLCONV                 REAL*8      LAT OR LONG VALUE (RADIANS)
C
C SUBROUTINES/FUNCTIONS CALLED : NONE.
C
C CALLED BY: GETLL, PLTCIT, PLTDAT
C
C LOCAL VARIABLES:

C        IDEG                   INTEGER     DEGRESS.
C        IMIN                   INTEGER     MINUTES.
C        ISEC                   INTEGER     SECONDS.
C        DTORAD                 REAL*8      DEGREES TO RADIANS CONVERSION.

C RESTRICTIONS: NONE.
C
C ABNORMAL RETURN CONDITIONS:   NONE.
C
C LOCATION:                     /a21/gjf/A21GEO.FTN
C
C PROGRAMMER:                   DATE OF LAST CHANGE     REASON FOR CHANGE
C
C     DAVE NATION                                       ORIGINAL CODE.
C     JERRY FENERTY                                     DOCUMENT AND MODIFY
C                                                       FOR A21 PROTOTYPE.
C
C-*-*-*-*-*-*-*-*-*-*-*-*-*-*-*-*-*-*-*-*-*-*-*-*-*-*-*-*-*-*-*-*-*-*-*|*-*-*-*-

C        REAL*8 FUNCTION LLCONV (CLAT,ISIGN)
        REAL FUNCTION LLCONV (CLAT,ISIGN)

C       CONVERT DDMMSS INTEGER TO SECONDS ISIGN IS 1 OR -1 FOR THE SIGN

C        REAL*8 CLAT
        REAL CLAT

        DATA C /2.908882087E-4/
        DTORAD = C * 60
        IDEG = CLAT / 10000
        IMIN = (CLAT - IDEG * 10000) / 100
        ISEC = CLAT - IDEG * 10000 - IMIN * 100
        ZMIN = IMIN
        ZSEC = ISEC
        LLCONV = (IDEG + ZMIN/60 + ZSEC/3600) * ISIGN

        IF (LLCONV.GT.180) LLCONV = LLCONV - 360.

        LLCONV = LLCONV * DTORAD

        RETURN
        END

C+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    LLGRID
C
C FUNCTIONAL DESCRIPTION:       .
C
C CALLED BY:                    DGRID
C
C PROGRAMMER:                   DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*|*-*-*-*-
        SUBROUTINE LLGRID (IPGRID,VMAXLA,VMINLA,VMAXLO,VMINLO,DOTEM,
     +  ITPRO)
C               LATITUDE/LONGITUDE GRID DISPLAY SUBROUTINE
```

```
c
Ctfw    Replaced checka calls with ck4any calls to draw lines
Ctfw    through graticle concavities  - Tom Wescott 11/87
c
        COMMON /CONST/ MAXVAL,RMPV,C,R,ERNM

        LOGICAL CHINV,SETINV,SOMEON
        LOGICAL DOTEM,FRSTPO
        logical sys
        common /sysdbc/ sys

        DIMENSION ALIMIT(4)
        INTEGER IPGRID(4)
        LOGICAL INTERR
        COMMON /INTERR/ INTERR

        EQUIVALENCE (RMINLA,ALIMIT(1)),(RMAXLA,ALIMIT(2))
        EQUIVALENCE (RMINLO,ALIMIT(3)),(RMAXLO,ALIMIT(4))

        DATA LONST2/1800/,LATST2/1800/
        data ylatof/-6/, ylonof/2/

        if (sys) then
            print*,'llgrid -- enter ',ipgrid,vmaxla,vminla,vmaxlo,
     +      vminlo,dotem,itpro
        endif

        LATSTP=IPGRID(1)
        LONSTP=IPGRID(2)
        LATINC=IPGRID(3)
        LONINC=IPGRID(4)
        IF (LATSTP.LT.1.OR.LATSTP.GT.LATST2) LATSTP=600
        IF (LONSTP.LT.1.OR.LONSTP.GT.LONST2) LONSTP=600
        IF (LATINC.LT.1.OR.LATINC.GT.LATSTP) LATINC=60
        IF (LONINC.LT.1.OR.LONINC.GT.LONSTP) LONINC=60

        MAXLON=180*60
        MAXLAT=90*60

        CALL JSIZE(4.,5.)

        DO 850 LONVAL=-MAXLON+LONSTP,MAXLON,LONSTP

            PLON=LONVAL*C

            IF (PLON.LT.VMINLO) GO TO 850
            IF (PLON.GT.VMAXLO) GO TO 851

            RMAXLO=PLON
            RMINLO=PLON
            CHINV=SETINV
            FRSTPO=.TRUE.

            DO 845 LAT=latst2,MAXLAT,LATST2

                CALL CHINT (INTERR,CH)
                IF (INTERR) GO TO 851

                RMAXLA=LAT*C
                if (rmaxla.ge.pio2) rmaxla = rmaxla-.001
                RMINLA=(LAT-LATST2)*C

                IF (RMAXLA.LT.VMINLA) GO TO 845
                IF (RMINLA.GT.VMAXLA) GO TO 845

                call ck4any(someon,alimit)

                IF (SOMEON) THEN
                    call grdlon (lat,latst2,latinc,latstp,plon,frstpo,
     +                  ylonof,dotem,lonval)

                ENDIF

 845        CONTINUE

            DO 847 LAT=0,-MAXLAT+LATST2,-LATST2
```

```
            CALL CHINT (INTERR,CH)
            IF (INTERR) GO TO 851

            RMAXLA=LAT*C
            RMINLA=(LAT-LATST2)*C

            IF (RMAXLA.LT.VMINLA) GO TO 847
            IF (RMINLA.GT.VMAXLA) GO TO 847

            call ck4any(someon,alimit)

            IF (SOMEON) THEN

                call grdlon (lat-latst2,-latst2,-latinc,latstp,
     +                       plon,frstpo,ylonof,dotem,lonval)

            ENDIF
 847        CONTINUE
 850    CONTINUE
 851    CONTINUE

        DO 880 LATVAL=MAXLAT-LATSTP,-MAXLAT+LATSTP,-LATSTP

            CALL CHINT (INTERR,CH)
            IF (INTERR) GO TO 881
            PLAT=LATVAL*C

            IF (PLAT.GT.VMAXLA) GO TO 880
            IF (PLAT.LT.VMINLA) GO TO 881

            RMAXLA=PLAT
            RMINLA=PLAT
            CHINV=SETINV
            FRSTPO=.TRUE.

            DO 875 LON=-MAXLON,MAXLON-LONST2,LONST2

                RMAXLO=(LON+LONST2)*C
                RMINLO=LON*C

                IF (RMAXLO.LT.VMINLO) GO TO 875
                IF (RMINLO.GT.VMAXLO) GO TO 875

                call ck4any(someon,alimit)

                IF (SOMEON) THEN

                    call grdlat (lon,lonst2,loninc,lonstp,plat,frstpo,
     +                  ylatof,dotem,latval)

                ENDIF
 875          CONTINUE
 880        CONTINUE
 881        CONTINUE
C---- flush the graphics buffer of any remaining lat/long lines
        call flushb
        if (sys) print*,'llgrid -- exit '
        RETURN
        END

C+++++++++++++++++++++++++++++++++++++++++++++++++++++++++++++++++++++++++++++|+++++++
C UNIT NAME: llinxy
C
C FUNCTIONAL DESCRIPTION:  CONVERTS LAT/LON TO X/Y, ALSO CHECKS FOR INVALID
C       CONVERSIONS, INVISIBLE POINTS, AND CLIPS
C
C INPUT FILES/PARAMETERS:
C
C GLOBAL VARIABLES : NONE.
C
C OUTPUT FILES/PARAMETERS:  NONE.
C
C SUBROUTINES/FUNCTIONS CALLED :
C
C CALLED BY:                    DRAWEL, PLOTIT
C
C LOCAL VARIABLES: NONE.
C
```

```
C RESTRICTIONS: NONE.
C
C ABNORMAL RETURN CONDITIONS:   NONE.
C
C LOCATION:
C
C PROGRAMMER:                   DATE OF LAST CHANGE     REASON FOR CHANGE
C
C     DAVE NATION                                       ORIGINAL CODE.
C     JERRY FENERTY                                     DOCUMENT AND MODIFY
C                                                       FOR A21 PROTOTYPE.
C
C-*-*-*-*-*-*-*-*-*-*-*-*-*-*-*-*-*-*-*-*-*-*-*-*-*-*-*-*-*-*-*-*-*-*-*-*-*|*-*-*-*-
      SUBROUTINE LLINXY (PLAT,PLON,X,Y,INVAL,ISINV,NEWONS)

C     CONVERTS LAT/LON TO X/Y, ALSO CHECKS FOR INVALID CONVERSIONS,
C     INVISIBLE POINTS, AND CLIPS
C     TO SCREEN WITH NEWONS

      LOGICAL ISINV,NEWONS,INVAL
      LOGICAL INVALI
      COMMON /INVALI/ INVALI

      INVAL = .TRUE.
      ISINV = .TRUE.
      NEWONS = .FALSE.
      CALL INVTES (PLAT,PLON,ISINV)
      CALL LLTOXY (PLAT,PLON,X,Y)
      IF (.NOT.INVALI) THEN
          INVAL = .FALSE.
          CALL CLIPXY (X,Y,NEWONS)
      ENDIF

      RETURN
      END

C+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    LLSEC
C
C FUNCTIONAL DESCRIPTION:       .
C
C CALLED BY:                    LLTOR
C
C PROGRAMMER:                   DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*|*-*-*-*-

      integer*4 function llsec (lat)
c
c     convert dms format of lat/lon to seconds
c
      integer*4 lat,ideg,imin,isec
c
c     print*,'llsec -- enter ',lat
      ideg = lat / 10000
      imin = (lat - ideg * 10000) / 100
      isec = lat - ideg * 10000 - imin * 100
      llsec = ideg * 3600 + imin * 60 + isec
c     print*,'llsec -- exit ',llsec
c
      return
      end

C+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    LLTOR
C
C FUNCTIONAL DESCRIPTION:       .
C
C CALLED BY:                    CURBOX, HILPLT, PLOTOV, PROCOV
C
C PROGRAMMER:                   DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*|*-*-*-*-

      subroutine lltor (lat,lon,nsi,ewi,plat,plon)
```

```
c
c       convert lat/lon in integer seconds to real lat/lon in radians
c
        real*8 dtor,stor
        common /dtor/ dtor,stor
        character nsi,ewi
        integer*4 lat,lon,lats,lons
        integer*4 llsec
c
            rlat = llsec (lat)
            if (nsi.eq.'S'.or.nsi.eq.'s') rlat = -rlat
            rlon = llsec (lon)
            if (ewi.eq.'W'.or.ewi.eq.'w') rlon = -rlon
            lats = rlat
            lons = rlon
            plat = rlat * stor
            plon = rlon * stor
c
        return
        end

C+*+*+*+*+*+*+*+*+*+*+*+*+*+*+*+*+*+*+*+*+*+*+*+*+*+*+*+*+*+*+*+*+*+*|*+*+*+*+
C UNIT NAME: LLTORD
C
C FUNCTIONAL DESCRIPTION:  INTERPRETS A LAT/LONG STRING (DDMMSSN/DDDMMSSE)
C                          AND RETURNS LAT/LONG IN RADIANS.
C
C INPUT FILES/PARAMETERS:
C
C       STRNG                 CHAR*(*)    LAT/LONG STRING.
C       LEN                   INTEGER     LENGTH OF STRING.
C
C
C GLOBAL VARIABLES : NONE.
C
C OUTPUT FILES/PARAMETERS:
C
C       LAT                   REAL*8      LATITUDE.
C       LON                   REAL*8      LONGITUDE.
C       IERROR                INTEGER     ERROR CONDITION.
C
C SUBROUTINES/FUNCTIONS CALLED :
C
C       GETLL                 CONVERTS DDMMSS TO A LAT OR LONG VALUE.
C
C CALLED BY:                   BSTMAP, LLCENT
C
C LOCAL VARIABLES:
C
C       NST                   CHAR(4)     'N','n','S','s'.
C       EWT                   CHAR(4)     'E','e','W','e'.
C
C RESTRICTIONS: STRING MUST BE IN FORMAT DDMMSS(N OR S)/DDDMMSS(E OR W).
C
C ABNORMAL RETURN CONDITIONS:   NONE.
C
C LOCATION:                    /a21/gjf/A21GEO.FTN
C
C PROGRAMMER:                  DATE OF LAST CHANGE     REASON FOR CHANGE
C
C     DAVE NATION                                      ORIGINAL CODE.
C     JERRY FENERTY                                    DOCUMENT AND MODIFY
C                                                      FOR A21 PROTOTYPE.
C     L. MCCLEARY              AUG 1988                LAT LIMITS CHECK
C
C-*-*-*-*-*-*-*-*-*-*-*-*-*-*-*-*-*-*-*-*-*-*-*-*-*-*-*-*-*-*-*-*-*-*|*-*-*-*-
        SUBROUTINE LLTORD (STRNG,LEN,LAT,LON,IERROR)
C       INTERPRET LATITUDE LONGITUDE COORDINATE STRING
        CHARACTER*(*) STRNG
        REAL LAT,LON
        CHARACTER NST(4),EWT(4)
        DATA NST/'N','n','S','s'/,EWT/'E','e','W','w'/
        DATA PIO2/1.5707963/

        IERROR = 0
```

```
C  CALL GETLL WITH LATITUDE AND LONGITUDE PORTIONS OF STRING.

        CALL GETLL (STRNG(1:LEN),NST,LAT,INDX,LEN,IERROR)
        IF (IERROR.EQ.0) THEN
            IF (LAT.GT.PIO2) LAT = PIO2
            IF (LAT.LT.-PIO2) LAT = -PIO2
            INDX = INDX + 1
            IF (INDX.GT.LEN) THEN
                IERROR = 1
                RETURN
            ENDIF
 25         CONTINUE
            IF (STRNG(INDX:INDX).EQ.' '.OR.
     +          STRNG(INDX:INDX).EQ.'/') THEN
                INDX = INDX + 1
                IF (INDX.LT.LEN+1) GOTO 25
                IERROR = 1
            ENDIF
            IF (IERROR.EQ.0) THEN
                CALL GETLL (STRNG(INDX:LEN),EWT,LON,INDX2,
     +                      LEN-INDX+1,IERROR)
            ENDIF
        ENDIF
        RETURN
        END

C+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                       LNGTH
C
C FUNCTIONAL DESCRIPTION:          FINDS THE LENGTH OF A TEXT STRING BY SEARCH-
C                                  ING BACKWARDS FOR THE FIRST OCCURENCES OF A
C                                  PRINTABLE CHARACTER
C
C INPUT FILES/PARAMETERS:
C
C     VARIABLE                   TYPE               DESCRIPTION
C
C       BUF                    CHAR*(*)   A CHARACTER STRING OF UNKNOWN LENGTH
C       MAXLEN                 INTEGER    THE MAXIMUM LENGTH BUF CAN BE
C
C OUTPUT FILES/PARAMETERS:
C
C     VARIABLE                   TYPE               DESCRIPTION
C
C       LENBUF                 INTEGER    THE LENGTH OF THE TEXT STRING
C
C SUBROUTINES/FUNCTIONS CALLED
C
C       JXXXX           DI-3000 SUBROUTINES
C
C CALLED BY:                       DRWAMP, LENGTH, PLOTOV, PUTAMP
C
C LOCAL VARIABLES:        NONE
C
C RESTRICTIONS:           NONE
C
C ABNORMAL RETURN CONDITIONS: N/A
C
C PROGRAMMER:                      DATE OF LAST CHANGE     REASON FOR CHANGE
C
C  DABUTSON                                4/30/84            INITIAL ENTRY
c  L McCleary                  1987              empty string - lngth
C
C-*-*-*-*-*-*-*-*-*-*-*-*-*-*-*-*-*-*-*-*-*-*-*-*-*-*-*-*-*-*-*-*-*-*-*-*-*|*-*-*-*-
C
        SUBROUTINE LNGTH (BUF,MAXLEN,LENBUF)
C
C       THIS SUBROUTINE FINDS THE LENGTH OF A STRING
C
        CHARACTER*(*) BUF
C
C*** FROM THE MAXIMUM LENGTH UNTIL A PRINTABLE CHARACTER IS FOUND
        DO 110 I=MAXLEN,1,-1
            IF (BUF(I:I) .GE. '!' .AND. BUF(I:I) .LE. '~') GOTO 120
  110   CONTINUE
        I=0
```

```
  120   CONTINUE
C*** LENGTH IS SET TO I
        LENBUF = I
        IF (LENBUF.EQ.0.AND.BUF(1:1).EQ.' ') LENBUF = 1
C
        RETURN
        END

C+++++++++++++++++++++++++++++++++++++++++++++++++++++++++++++++|+++++++
C UNIT NAME:                    LOADIC
C
C FUNCTIONAL DESCRIPTION:       .
C
C CALLED BY:                    GETICN
C
C PROGRAMMER:                   DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*|*-*-*-*-
      subroutine loadic (icnnam)

c      this routine is called by the geticn to load the current
c       icon into a table.
c     VARIABLES:
c       icnnam- name of the icon to be drawn
c       filnam - name of the file to be accessed
c       common block device- selected display device for pausing
c       iunit- logical unit number  assigned to the file
c   CALLED BY: geticn
c   CALLS:    openit  closit
c   PROGRAMMER:  Nancy Detrich, A215, March, 1984

        character*50 filenm
        character*30 fname
        character*50 menpth
        common /menpth/ menpth
        common /lenmen/ lenmen
        integer icnnam
        logical sys
        common /sysdbc/ sys
        integer iarray(26,100)
        character*40 ictarr(100)
        common /iconda/ lenica,iarray,ictarr
        character cchar
        character*80 msg
        character*26 flettr
        data maxica,maxtxt /100,40/
c  !!!!! hard-coded unit number !!!!
        data iunit/10/
        data flettr /'abcdefghijklmnopqrstuvwxyz'/
c       numinc is range of menu numbers in each file
c       maxnum is number of menu files
        data numinc,maxnum /25,15/
        data fname/'file'/,lname/4/

        if (sys) print*,'LOADIC -- icnnam = ',icnnam
        ierror = 0
        indlet = icnnam / numinc + 1
        if (indlet.lt.1) indlet = 1
        if (indlet.gt.maxnum) indlet = maxnum
        filenm = menpth(1:lenmen) // fname(1:lname) //
     +  flettr(indlet:indlet) // '.icon'
        lennam = lenmen + lname + 6
c       print*,'  before open ',filenm(1:lennam)
        call openit(filenm,lennam,iunit,0,ierror)
        if (ierror.ne.0) go to 20

        REWIND iunit

        lenica = 0
c       loop until the correct icon records are located
  100   continue
            read (iunit,10110,end=193,err=192) cchar,msg
10110       format (a1,a80)
c           *** skip comment lines
            if (cchar.eq.'C'.or.cchar.eq.'c') go to 100
            if (cchar.eq.'I'.or.cchar.eq.'i') then
```

```
            read (msg,1150,end=193,err=192) msgnum
 1150       format (i5)
            if (msgnum.eq.icnnam) go to 115
         endif
      go to 100
  115 continue
C      print*,'ICON found ',ICNNAM
      i=0
c     loop until no more data lines (blank first char)
  120 continue
         read (iunit,10110,end=20,err=192) cchar,msg
c        *** skip comment lines
         if (cchar.eq.'C'.or.cchar.eq.'c')
     +   go to 120
         if (cchar.eq.' ') then
c              read in record and load iarray with integers
c              from the file
               read(msg,11,end=20,err=192)
     +         (iarray(i,lenica+1),i = 1,26)
  11           format(26i3)
               lenica = lenica + 1
C               if (iarray(lenica,1).eq.7) then
               if (iarray(1,lenica).eq.7) then
c                  read in the text string to be displayed
                   nchars = maxtxt
                   call readch(iunit,ictarr(lenica),nchars,ierror)
                   if (ierror.ne.0) go to 20
               endif
               if (lenica.ge.maxica) go to 20
         else
            go to 20
         endif
         go to 120

 20   continue
      go to 200
 190     continue
         print*,' Menu number conversion error ',icnnam
         ierror = 211
         go to 200
 191     continue
         print*,' Couldn''t open file ',filenm
         ierror = 212
         go to 200
 192     continue
         print*,' Error in icon file read ',filenm(1:LENNAM),icnnam
         ierror = 213
         go to 200
 193     continue
      print*,' Premature end of icon file ',filenm(1:LENNAM),icnnam
         ierror = 214
         go to 200
 200  continue

      call closit(iunit)
      if (sys) print*,'LOADIC -- exit',lenica
      return
      end

C+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:   LOCAT
c
c  Functional Description:
c
c  Input Files/Parameters:
C       qdsdev,qpydev,qecho           INTEGER
C       BUTTON                        INTEGER
C       VX,VY                         REAL
c
c  Output Files/Parameters:
c
c  Subroutines/Functions Called:
c       Note: Subroutines preceded by a "j" are explained in the DI-3000 manual.
C       ENALL
```

```
c       SOVERL
c
c  Called By:                    FCFILL, LOCGEO
c
c  Local Variables:   N/A
c
c  Restrictions:                 N/A
c
c  Abnormal Return Conditions: N/A
c
c  Location:   /a21/dave
c
c  Programmer        Date of Last Change       Reason for Change
c
C-*-*-*-*-*-*-*-*-*-*-*-*-*-*-*-*-*-*-*-*-*-*-*-*-*-*-*-*-*-*-*-*-*-*-*-*-*-*-*|*-*-*-*-

        subroutine locat (button,vx,vy)

c       calls jlocat function

        integer button
        real vx,vy
        integer qdsdev,qpydev,qecho,qlecho
        common /device/ qdsdev,qpydev,qecho,qlecho
        logical sys,rdkey,savkey
        common /sysdbc/ sys
        common /rkdbc/ rdkey
        common /svkdbc/ savkey
        logical eofkey
        integer keylun,newlun
        common /keylun/ keylun,newlun,eofkey
        character*6 command
        logical timout
        integer*2 time
        common /timout/ timout, time

        if (sys) print*,'locat -- enter'
c       call enall
  100   continue
        if ((rdkey).and..not.eofkey) then
            call kpause (eofkey)
            read (keylun,*,end=192,err=191) command,button,vx,vy
            if (command(1:6).ne.'jlocat') then
                print*,'locat -- incompatible command in ',
     +          'read_keys file  ',command,button,vx,vy
c               *** exit on error
                go to 199
            endif
        else

  125       continue
c
c           polling loop to check for incoming data or clock interrupt
c
            call datpol
c
c           check for keyboard interrupt
c
            call jlocat (qdsdev,qpydev,qlecho,button,vx,vy)
            if (timout) then
               go to 125
            end if
        endif
        go to 199
  191   continue
            print*,'locat -- error on read of save key file',
     +      '  ',keylun,button,vx,vy
            go to 199
  192   continue
            print*,'locat -- premature end of read key file.'
            eofkey = .true.
            go to 100
c           **** go back and get the function interactively on end of file
```

```
199   continue
      if (savkey) then
         write (newlun,*,err=135) '''jlocat''',button,vx,vy
      endif
      go to 140
135   continue
         print*,'locat -- error on write to save key file',
   +     '  ',newlun,button,vx,vy
140   continue
c        call soverl
         if (sys) print*,'locat -- exit',button,vx,vy

         return
         end


C+++++++++++++++++++++++++++++++++++++++++++++++++++++++++++++++++++++|+++++++
c  UNIT NAME:                         LOCGEO
c
c  Functional Description:      Subroutine to position something in the
c                               display area, convert the point to world
c                               coordinates, and to check that point is in
c                               the display area (only for geography)
c
c  Input Files/Parameters:
c
c       General Gobals
c         qmb          butons       integer    contains mouse button values
c         xllgvp       comgvp       real       minimum window boundary in x
c                                              direction (for display area)
c         xurgvp       comgvp       real       maximum window boundary in x
c                                              direction (for display area)
c         yllgvp       comgvp       real       minimum window boundary in y
c                                              direction (for display area)
c         yurgvp       comgvp       real       maximum window boundary in y
c                                              direction (for display area)
c  Output Files/Parameters:
c
c         button                    integer    value of button pressed
c         worldx                    real       world coordinate value x of
c                                              point picked
c         worldy                    real       world coordinate value y of
c                                              point picked
c         valid                     logical    true if point is in display area
c
c  Subroutines/Functions Called:
c
c         geowin              set the graphics viewport window coordinates
c         gravpt              sets the graphics viewport
c         locat               returns x,y position in virtual coordinates
c
c  Called By:                 ANNOTA, BOXARE, DISTAN, LLSHOW, OFFST
c
c  Local Variables:
c
c         button                    integer    value of button pressed
c         virtx                     real       x virtual coordinate of
c                                              point picked
c         virty                     real       y virtual coordinate of
c                                              point picked
c         worldx                    real       world coordinate value x of
c                                              point picked
c         worldy                    real       world coordinate value y of
c                                              point picked
c         valid                     logical    true if point is in display area
c  Restrictions:                 N/A
c
c  Abnormal Return Conditions:   N/A
c
c  Location:       stepc03       /w3/ssb/prototype/arrows/locgeo.f
c
c  Programmer         Date of Last Change       Reason for Change
c     ssb                 11/09/83               initial entry
```

```
c     ssb                 3/06/84               completion
c     bap                11/06/84               Debug to work on Apollo
c
C-*-*-*-*-*-*-*-*-*-*-*-*-*-*-*-*-*-*-*-*-*-*-*-*-*-*-*-*-*-*-*-*-*-*-*-*-*-*-*-*-*|*-*-*-*-

      subroutine locgeo(button,worldx,worldy,valid)

c     do locate in the display area, convert the point to world coordinates

      common/butons/qfb,qmb
      integer qfb(26),qmb(4)
      common /comgvp/ xllgvp,yllgvp,xurgvp,yurgvp
      real            xllgvp,yllgvp,xurgvp,yurgvp
      real virtx, virty, worldx, worldy, worldz
      integer button
      logical valid
c
c
      valid=.false.
      call locat(button, virtx, virty)
c     ************************************************************
c     * insure that pick is within the display area world coordinates
c     * and that the 'Pick' button (qmb(1)) was used
c     ************************************************************'
c
c Temporarily comment out requirement that button be qmb(1) until
c DI3000 is installed.
c
c      if ((virtx.lt.xurgvp).and.(virtx.gt.xllgvp).and.(virty.gt.yllgvp)
c     +.and.(virty.lt.yurgvp).and.(button.eq.qmb(1))) then
      if ((virtx.lt.xurgvp).and.(virtx.gt.xllgvp).and.(virty.gt.yllgvp)
     +.and.(virty.lt.yurgvp)) then
        call jconvw (virtx, virty, worldx, worldy, worldz)
        valid=.true.
      endif
      return
      end


C+*+*+*+*+*+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:                     logasc
c
c  Functional Description:
c       convert a logical array to t's and f's in a character string
c
c  Input Files/Parameters:
c
c  Output Files/Parameters: N/A
c
c  Subroutines/Functions Called:
c      Note: Subroutines preceded by a "j" are explained in the DI-3000 manual.
c
c  Called By:                     SPARAM
c
c  Local Variables: N/A
c
c  Restrictions: N/A
c
c  Abnormal Return Conditions:  N/A
c
c  Location:      /a21/dave
c
c  Programmer         Date of Last Change       Reason for Change
c
C-*-*-*-*-*-*-*-*-*-*-*-*-*-*-*-*-*-*-*-*-*-*-*-*-*-*-*-*-*-*-*-*-*-*-*-*-*-*-*-*-*|*-*-*-*-
c
        subroutine logasc (logarr,len,chastr)
c
c       convert a logical array to t's and f's in a character string
c
        logical logarr(*)
        character*(*) chastr
c
        do 110 i=1,len
```

```
            if (logarr(i)) then
                chastr(i:i) = 't'
            else
                chastr(i:i) = 'f'
            endif
  110   continue
c
        return
        end


C++*+*+*+*+*+*+*+*+*+*+*+*+*+*+*+*+*+*+*+*+*+*+*+*+*+*+*+*+*+*+*+*+*+*+*+*+*+|*+*+*+*+
c  UNIT NAME:                          logo
c
c  Functional Description:
c       displays logo information when first starting program in graphics ar
c
c  Input Files/Parameters:
c
c  Output Files/Parameters: N/A
c
c  Subroutines/Functions Called:
c      Note: Subroutines preceded by a "j" are explained in the DI-3000 manu
c
c  Called By:                          FMAIN
c
c  Local Variables: N/A
c
c  Restrictions: N/A
c
c  Abnormal Return Conditions:  N/A
c
c  Location:       /a21/dave
c
c  Programmer          Date of Last Change        Reason for Change
c  L McCleary           1987                      update      - logo
c
C-*-*-*-*-*-*-*-*-*-*-*-*-*-*-*-*-*-*-*-*-*-*-*-*-*-*-*-*-*-*-*-*-*-*-*-*-*-*|*-*-*-*-

        subroutine logo

c       displays logo information when first starting program in graphics ar

        common /comgra/xllgra,yllgra,xurgra,yurgra,ibcgra,iocgra
        common /mapdat/ mdraw,ovdraw
        logical mdraw,ovdraw
        common /logseg/ nsglog
        logical sys,plain
        common /sysdbc/ sys
        common /plndbc/ plain
        character*40 versn

        data lenver/40/
        data versn/'       Version 3.1      June, 1989'/
        data icolcm/16/

        call jdvisb (0)
        call gravpt
        call jwindo (xllgra,xurgra,yllgra,yurgra)
        call jropen (nsglog)
        diffx = xurgra - xllgra
        diffy = yurgra - yllgra
        xsize = .06 * diffx
        ysize = .09 * diffy
        call jsize (xsize,ysize)
        call jfont (3)
        call xcolor (icolcm)
        call jjust (2,1)
        rmidx = xllgra + diffx / 2
        posy = yllgra + diffy * .58
        if (sys) print*,'logo -- ',xllgra,
     +  xurgra,yllgra,yurgra,rmidx,posy,diffx,diffy,xsize,ysize
        call jmove (rmidx,posy)
        if (plain) then
```

```
            CALL J1STRG('Caricature')
        else
            CALL JHSTRG('Caricature')
        endif
        call jfont (1)
        xsize = .02 * diffx
        ysize = .03 * diffy
        call jsize (xsize,ysize)
        posy = yllgra + diffy * .25
        call jmove (rmidx,posy)
        if (plain) then

          CALL J1STRG ('National Security Agency')
          posy = yllgra + diffy * .20
          call jmove (rmidx,posy)
          CALL J1STRG ('Naval Ocean Systems Center')
      else
          CALL JHSTRG ('National Security Agency')
          posy = yllgra + diffy * .20
          call jmove (rmidx,posy)
          CALL JHSTRG ('Naval Ocean Systems Center')
      endif
      posy = yllgra + diffy * .09
      call jmove (rmidx,posy)
      if (plain) then
         call jlstrg (versn(1:lenver))
      else
         call jhstrg (versn(1:lenver))
      endif
      call jrclos
      ovdraw = .true.
      call jdvisb (1)
      call jvisbl (nsglog,0)

      return
      end
C+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                        MAJORS
C
C FUNCTIONAL DESCRIPTION:
C
C CALLED BY:                        STATEC
C
C PROGRAMMER:                       DATE OF LAST CHANGE     REASON FOR CHANGE
c  S. Lamb                    Feb 1988                  command fix - majors
C
C-*-*-*-*-*-*-*-*-*-*-*-*-*-*-*-*-*-*-*-*-*-*-*-*-*-*-*-*-*-*-*-*-*-*-*-*-*|*-*-*-*-
c
        subroutine majors
c
c       this subroutine is the major feature state interpreter (9)
c
        common /states/ nextst
        logical wordis,iseoc
        logical isfeat
        logical sketch,majorf,minorf
        common /statel/ sketch,majorf,minorf
c       map parameters
        logical lton(16),dotem
        integer ipgrid(4),ltyptb(16)
        common /map/ XRNM,XC,YC,LEVEL,CLAT,CLON,XRAD,YRAD,ITPROJ,
     +      IRES,LTYPTB,LUNDAT,LUNIND,LUNLIN,LTON,IPGRID,DOTEM,
     +      ORHALT
c
        initls = nextst
c       do until nextst not = initial state
  100   continue
            call getwrd
            if (wordis('DETAIL')) then
                nextst = 21
            else if (wordis('SCALE')) then
                nextst = 23
            else if (isfeat()) then
                if (majorf) then
```

```
                    level = 0
                    nextst = 8
                else
                    level = level - 1
c                   *** could expand on this -- error message ***
                    if (level.lt.0) then
                        level = 0
                        nextst = 1
                    else
                        nextst = 8
                    endif
                endif
            else if (wordis('LEVEL').or.wordis('OF')) then
c * ** *** **** ***** ****** ******* not understood / implem.
                nextst = 15
            else if (iseoc()) then
                if (majorf) then
                    level = 0
                else
                    level = level - 0
c                   *** could expand on this -- error message ***
                    if (level.lt.0) level = 0
                endif
                nextst = 1
            else
                call putwrd
                nextst = 15
            endif
        if (nextst.eq.initls) go to 100
c
        return
        end

C+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:  makamp
c
c  Functional Description:
c       this subroutine clears the amplification area
c       and puts it in a retained segment
c
c  Input Files/Parameters:
C       qbox,qbkgrd
C       nsgamp
c
c  Output Files/Parameters:
c
c  Subroutines/Functions Called:
c       Note: Subroutines preceded by a "j" are explained in the DI-3000 manual.
C       AMPVPT
C       CLRVPT
c
c  Called By:                   FMAIN, INIPIC
c
c  Local Variables:             N/A
c
c  Restrictions:                N/A
c
c  Abnormal Return Conditions:  N/A
c
c  Location:
c
c  Programmer        Date of Last Change        Reason for Change
C  L. McCleary       Jan 1988                 separate amp & sys - makamp
c
C-*-*-*-*-*-*-*-*-*-*-*-*-*-*-*-*-*-*-*-*-*-*-*-*-*-*-*-*-*-*-*-*-*-*-*-*|*-*-*-*-
c
       subroutine makamp
c
c      this subroutine clears the amplification area and puts it in a retained
c
       common /csgamp/ nsgamp
       common/scratr/qbox,qbkgrd
       integer qbox,qbkgrd
```

```
        call ampvpt
        call clrvpt (nsgamp,qbox,qbkgrd)
        call jvisbl (nsgamp,1)
c
        return
        end


C+*+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:     MAKBOX
c
c  Functional Description:
c  this subroutine clears the construction box area
c  and puts it in a retaind segment
c
c  Input Files/Parameters:
C       qbox,qbkgrd,qmcolr
C       nsgbox,nsgsho,nsgcrm
c
c  Output Files/Parameters:
c
c  Subroutines/Functions Called:
C       BOXVPT
C       CLRBVP
c
c  Called By:                    FMAIN, INIPIC
c
c  Local Variables:              N/A
c
c  Restrictions:                 N/A
c
c  Abnormal Return Conditions: N/A
c
c  Location:    /a21/dave
c
c  Programmer         Date of Last Change       Reason for Change
c
C-*-*-*-*-*-*-*-*-*-*-*-*-*-*-*-*-*-*-*-*-*-*-*-*-*-*-*-*-*-*-*-*-*-*-*-*-*|*-*-*-*-
c
        subroutine makbox
c
c       this subroutine clears the construction box area and puts it in a
c       retained segment
c
        common /boxseg/ nsgbox,nsgsho,nsgcrm
        common/scratr/qbox,qbkgrd
        integer     qbox,qbkgrd

c ---- define box window
        common /boxdim/ qbxwmn,qbxwmx,qbywmn,qbywmx
        real            qbxwmn,qbxwmx,qbywmn,qbywmx

c ---- define default window for box area
        qbxwmn = -50.
        qbxwmx = 160.
        qbywmn = -50.
        qbywmx = 160.

c        common/scratr/qbox,qbkgrd,qmcolr
c        integer qbox,qbkgrd,qmcolr
c
c       print*,'makbox -- enter ',nsgbox
        call boxvpt
c        call clrbvp (nsgbox,qbox,qmcolr)
        call clrbvp (nsgbox,qbox,qbkgrd)
c
        return
        end


C+*+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:  MAKCOM
c
```

```
c  Functional Description:
c       this subroutine clears the communications area
c       and puts it in a retaind segment
c
c  Input Files/Parameters:
C       qbox,qbkgrd,qmcolr
C       nsgmen,nsggra,nsgsys,nsgmsg,nsgmap,nsgful,nsgkey
c
c  Output Files/Parameters:
c
c  Subroutines/Functions Called:
c       Note: Subroutines preceded by a "j" are explained in the DI-3000 manual.
C       COMVPT
C       CLRVPT
c
c  Called By:                    FMAIN, INIPIC
c
c  Local Variables:              N/A
c
c  Restrictions:                 N/A
c
c  Abnormal Return Conditions: N/A
c
c  Location:    /a21/dave
c
c  Programmer        Date of Last Change        Reason for Change
c
C-*-*-*-*-*-*-*-*-*-*-*-*-*-*-*-*-*-*-*-*-*-*-*-*-*-*-*-*-*-*-*-*-*-*-*-*|*-*-*-*-
c
      subroutine makcom
c
c     this subroutine clears the communications area and puts it in
c     a retained segment
c
      common /arsegs/ nsgmen,nsggra,nsgsys,nsgmsg,nsgmap,nsgful
      common/scratr/qbox,qbkgrd
      integer qbox,qbkgrd
c
      call comvpt
      call clrvpt (nsgsys,qbox,qbkgrd)
      call jvisbl (nsgsys,1)
c
      return
      end

C+*+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:    MAKFUL
c
c  Functional Description:
c       this subroutine clears the full screen area and
c       puts it in a retained egment
c
c  Input Files/Parameters:
C       qbox,qbkgrd,qmcolr
C       nsgmen,nsggra,nsgsys,nsgmsg,nsgmap,nsgful,nsgkey
C       xaspec,yaspec,xvlow,xvhigh,yvlow,yvhigh
c
c  Output Files/Parameters:
c
c  Subroutines/Functions Called:
c       Note: Subroutines preceded by a "j" are explained in the DI-3000 manual.
C       JVISBL
C       CLRVPT
c
c  Called By:                    FMAIN, INIPIC
c
c  Local Variables:          N/A
c
c  Restrictions:                N/A
c
c  Abnormal Return Conditions: N/A
c
c  Location:    /a21/dave
c
```

```
c  Programmer          Date of Last Change        Reason for Change
c  L McCleary          Jan 1988                  sep amp & sys - makful
c
C-*-*-*-*-*-*-*-*-*-*-*-*-*-*-*-*-*-*-*-*-*-*-*-*-*-*-*-*-*-*-*-*-*-*-*-*-*-*-*-*|*-*-*-*-
c
       subroutine makful
c
c      this subroutine clears the full screen area and puts it in a
c      retained segment
c
       common /aspect/ xaspec,yaspec,xvlow,xvhigh,yvlow,yvhigh
       common /arsegs/ nsgmen,nsggra,nsgsys,nsgmsg,nsgmap,nsgful
       common/scratr/qbox,qbkgrd
       integer qbox,qbkgrd
c
       call jvport (xvlow,xvhigh,yvlow,yvhigh)

       call clrvpt (nsgful,qbox,qbkgrd)
c       call jvisbl (nsgful,0)
       call jvisbl (nsgful,1)
c
       return
       end

C++++++++++++++++++++++++++++++++++++++++++++++++++++++++++++++++++++++++++++++++|+++++++
c  UNIT NAME:   MAKGRA
c
c  Functional Description:
c       this subroutine clears the graphics area
c       and puts it in a retained segent
c
c  Input Files/Parameters:
C       qbox,qbkgrd,qmcolr
C       nsgmen,nsggra,nsgsys,nsgmsg,nsgmap,nsgful,nsgkey
c
c  Output Files/Parameters:
c
c  Subroutines/Functions Called:
c       Note: Subroutines preceded by a "j" are explained in the DI-3000 manual.
C       GRAVPT
C       CLRVPT
c
c  Called By:                    FMAIN, INIPIC
c
c  Local Variables:              N/A
c
c  Restrictions:                 N/A
c
c  Abnormal Return Conditions:   N/A
c
c  Location:    /a21/dave
c
c  Programmer          Date of Last Change        Reason for Change
c
C-*-*-*-*-*-*-*-*-*-*-*-*-*-*-*-*-*-*-*-*-*-*-*-*-*-*-*-*-*-*-*-*-*-*-*-*-*-*-*-*|*-*-*-*-
c
       subroutine makgra
c
c      this subroutine clears the graphics area and puts it in a
c      retained segment
c
       common /arsegs/ nsgmen,nsggra,nsgsys,nsgmsg,nsgmap,nsgful
       common/scratr/qbox,qbkgrd
       integer qbox,qbkgrd
c
       call gravpt
       call clrvpt (nsggra,qbox,qbkgrd)
       call jvisbl (nsggra,1)
c
       return
       end
```

```
C+++++++++++++++++++++++++++++++++++++++++++++++++++++++++++++++++++|+++++++
C UNIT NAME:                    MAKINV
C
C FUNCTIONAL DESCRIPTION:       .
C
C CALLED BY:                    TIMCHK
C
C PROGRAMMER:                   DATE OF LAST CHANGE    REASON FOR CHANGE
C
C-*-*-*-*-*-*-*-*-*-*-*-*-*-*-*-*-*-*-*-*-*-*-*-*-*-*-*-*-*-*-*-*-*-*|*-*-*-*-

      subroutine makinv(fadndx)
c
c     this subroutine invisibles the track
c     indicated by fadndx
c
      integer*4 fadndx
      integer*4 segnum
      integer*4 aray(19)

      integer tkoset
      common /tkoset/ tkoset
      integer trkndx(1000)
      common /trkndx/ trkndx

      segnum = trkndx(fadndx) + tkoset
c
c***  check to see if this plot has been suppressed
c***  if not, then make it invisible
c
      call jisgmt(segnum,aray)
      if (aray(1) .eq. 1) then
          call jvisbl(segnum,0)
      endif

      return
      end


C+++++++++++++++++++++++++++++++++++++++++++++++++++++++++++++++++++|+++++++
c  UNIT NAME:   MAKKEY
c
c  Functional Description:
c       this subroutine clears the key area and
c       puts it in a retained segment
c
c  Input Files/Parameters:
C       qbox,qbkgrd,qmcolr
C       nsgmen,nsggra,nsgsys,nsgmsg,nsgmap,nsgful,nsgkey
c
c  Output Files/Parameters:
c
c  Subroutines/Functions Called:
c       Note: Subroutines preceded by a "j" are explained in the DI-3000 manual.
C       KEYVPT
C       CLRVPT
c
c  Called By:                   FMAIN, INIPIC
c
c  Local Variables:                       N/A
c
c  Restrictions:                N/A
c
c  Abnormal Return Conditions: N/A
c
c  Location:   /a21/dave
c
c  Programmer        Date of Last Change       Reason for Change
c
C-*-*-*-*-*-*-*-*-*-*-*-*-*-*-*-*-*-*-*-*-*-*-*-*-*-*-*-*-*-*-*-*-*-*|*-*-*-*-
c
       subroutine makkey
c
c      this subroutine clears the key area and puts it in a retaind segment
c
```

```
      common /nsgkey/ nsgkey,nsgktx
      common/scratr/qbox,qbkgrd
      integer qbox,qbkgrd
c
      call keyvpt
      call clrvpt (nsgkey,qbox,qbkgrd)
      call jvisbl (nsgkey,1)
c
      return
      end

C+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:   MAKMEN
c
c  Functional Description:
c       this subroutine clears the menu area and
c       puts it in a retained segment
c
c  Input Files/Parameters:
C       qbox,qbkgrd,qmcolr
C       nsgmen,nsggra,nsgsys,nsgmsg,nsgmap,nsgful,nsgkey
c
c  Output Files/Parameters:
c
c  Subroutines/Functions Called:
c       Note: Subroutines preceded by a "j" are explained in the DI-3000 manual.
C       MENVPT
C       CLRVPT
c
c  Called By:                    FMAIN, INIPIC
c
c  Local Variables:     N/A
c
c  Restrictions:                 N/A
c
c  Abnormal Return Conditions: N/A
c
c  Location:   /a21/dave
c
c  Programmer        Date of Last Change       Reason for Change
c
C-*-*-*-*-*-*-*-*-*-*-*-*-*-*-*-*-*-*-*-*-*-*-*-*-*-*-*-*-*-*-*-*-*-*-*|*-*-*-*-
c
      subroutine makmen
c
c     this subroutine clears the menu area and puts it in a retained segment
c
      common /arsegs/ nsgmen,nsggra,nsgsys,nsgmsg,nsgmap,nsgful
      common/scratr/qbox,qbkgrd
      integer qbox,qbkgrd
c
      call menvpt
      call clrvpt (nsgmen,qbox,qbkgrd)
      call jvisbl (nsgmen,1)
c
      return
      end

C+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:   MAKSHO
c
c  Functional Description:
c       this subroutine clears the short menu area and
c       puts it in a retained segment
c
c  Input Files/Parameters:
C       nsgbox,nsgsho,nsgcrm
C       qbox,qbkgrd,qmcolr
c
c  Output Files/Parameters:
c
c  Subroutines/Functions Called:
C       CLRVPT
```

```
C       SHOVPT
c
c  Called By:                  FMAIN, INIPIC
c
c  Local Variables:       N/A
c
c  Restrictions:               N/A
c
c  Abnormal Return Conditions: N/A
c
c  Location:   /a21/dave
c
c  Programmer        Date of Last Change       Reason for Change
c
C-*-*-*-*-*-*-*-*-*-*-*-*-*-*-*-*-*-*-*-*-*-*-*-*-*-*-*-*-*-*-*-*-*-*-*-*-*-*-*-*-*|*-*-*-*-
c
        subroutine maksho
c
c       this subroutine clears the short menu area and puts it in a
c       retained segment
c
        common /boxseg/ nsgbox,nsgsho,nsgcrm
        common/scratr/qbox,qbkgrd
        integer qbox,qbkgrd
c
        call shovpt
        call clrvpt (nsgsho,qbox,qbkgrd)
c
        return
        end


C+*+*+*+*+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                   MAPOVR
C
C FUNCTIONAL DESCRIPTION:      .
C
C CALLED BY:                   DRAWIT, FMAIN, RECDIS, OVRCON
C
C PROGRAMMER:                  DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*-*-*-*-*|*-*-*-*-

        subroutine mapovr

c       this subroutine overlays text data on the map

        common /aspect/ xaspec,yaspec,xvlow,xvhigh,yvlow,yvhigh
        common /comgra/ xllgra,yllgra,xurgra,yurgra,ibcgra,iocgra
        logical overly,sclflg,f3,clsflg,f5,f6,incrdf,f8,
     +     tablet,ff(7)
        common /overly/ overly,sclflg,f3,clsflg,f5,f6,incrdf,f8,
     +     tablet,ff
        common /comscr/ xllscr,yllscr,xurscr,yurscr
        common /mapdat/ mdraw,ovdraw
        logical mdraw,ovdraw
        common /ctext/ igrtxt,isytxt,iantxt
        common /classi/ classi
        common /lencla/ lencla
        character*50 classi
        integer unidtb(16)
        character*15 comnam(10),crynam(10)
        common /dbover/ comnam,crynam,unidtb,numcom,numcry
        common /envirn/ comsat,hf,los,ll,unkn
        logical comsat,hf,los,ll,unkn
        integer sclseg,clsseg
        common /lnseg/ sclseg,clsseg
        logical lton(16),dotem
        integer ipgrid(4),ltyptb(16)
        common /map/ XRNM,XC,YC,LEVEL,CLAT,CLON,XRAD,YRAD,ITPROJ,
     +     IRES,LTYPTB,LUNDAT,LUNIND,LUNLIN,LTON,IPGRID,DOTEM,
     +     ORHALT
        character*32 scabuf
        character *10 str,text
```

```
        data scabuf/'      N Miles at center       '/
        data text/'          '/,str/'        '/
        data xarrow,yarrow/1.5,.2/

        ovdraw = .true.
        call jvport (xvlow,xvhigh,yvlow,yvhigh)
        call jwindo (xllscr,xurscr,yllscr,yurscr)
        if (sclflg) then
            if(clsseg.ne.0) call jpurge(sclseg)
            call getseg(sclseg)
            call jropen(sclseg)
            call jsize (1.,1.)
            call xcolor (igrtxt)
            ixr=xrnm
            if(ixr.gt.100000) ixr=99999
            write(scabuf(1:6),10100) ixr
10100       format(i6)
c            if (itproj.eq.6.or.itproj.eq.7) then
c                scabuf(8:14) = 'Minutes'
c            else
                scabuf(8:14) = 'N Miles'
c            endif
c            if (itproj.eq.5) then
c                call jjust(1,1)
c                call jmove (xllgra,yllgra+1.)
c                scabuf(16:24) = 'altitude '
c            else
                call jmove (xllgra,yllgra+1.)
                call jdraw (xllgra+(xurgra-xllgra)/2.,yllgra+1.)
                call jrdraw (-xarrow,yarrow)
                call jrmove (0.,-2.*yarrow)
                call jrdraw (xarrow,yarrow)
                call jmove (xllgra,yllgra+1.)
                call jrdraw (xarrow,yarrow)
                call jrmove (0,-2.*yarrow)
                call jrdraw (-xarrow,yarrow)
                call jjust(2,1)
                xx = xllgra+(xurgra-xllgra)/4.
                call jmove (xx,yllgra+2.)
                scabuf(16:24) = 'at center'
c            endif.
            call mytext (24,scabuf)
            call jrclos
        endif
c        if (clsflg) then
c            if(clsseg .ne. 0) call jpurge(clsseg)
c            call getseg(clsseg)
c            call jropen(clsseg)
c            call jsize (1.,1.)
c            call xcolor (igrtxt)
c            call jjust(3,1)
c            call jmove (xurgra-1.,yllgra+1.)
c            call mytext (lencla,classi)
c            call jrclos
c        endif
        return
        end

C+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                        MAPPER
C
C FUNCTIONAL DESCRIPTION:
C
C CALLED BY:                        DRAWF, DRAWIT, FMAIN, RECDIS
C
C PROGRAMMER:                       DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*|*-*-*-*-

        SUBROUTINE MAPPER (drawon)

C       THIS SUBROUTINE CALLS THE DMAPII SUBROUTINE
```

```
      INTEGER SEGNO,FIRSEG
      COMMON /SEGNO/ SEGNO,FIRSEG

      INTEGER QLEVL(16)
      COMMON /LEVLS/ QLEVL

      logical metafl,map
      common /mapdbc/ map
      common /metdbc/ metafl

      logical drawon

      LOGICAL QMAPUP
      COMMON /MAPUP/ QMAPUP
      COMMON /PROJT/ IGNOMN,IORTEQ,IORTPO,IORTHO,IPERSP
      COMMON /PROJT2/ IEQREC,IMERCA,ILAMCN
      COMMON /PIE/ PIE,TPIE,PIO2,PIO4

      LOGICAL QLTON(16),QDOTEM
      INTEGER QPGRID(4),QTYPTB(16)
      INTEGER QLEVEL,QITPRO,QIRES,QLUNDA,QLUNIN,QLUNLI
      COMMON /MAP/ QXRNM,QXC,QYC,QLEVEL,QCLAT,QCLON,QXRAD,QYRAD,
     +     QITPRO,
     +     QIRES,QTYPTB,QLUNDA,QLUNIN,QLUNLI,QLTON,QPGRID,QDOTEM,
     +     QORHAL

      common/oneflg/oneflg
      logical oneflg
      dimension ltypov(16)
      logical ltonov(16),rankt(26,16)
      common /maptoo/ ltypov,ltonov,rankt
      logical bitmod
      common /bitmod/ bitmod
c
c
c---------------------------------------------------------------------|--+
c Itproj:  1  2  3  4  5  6  7  8  9 10 11 12 13 14 15 16 17 18 19 20 21  |
c------------------------------------------------------------------------+
c          g  o  o  o  p  e  m  l  a  a  a  k  m  o  p  p  u  s  s       |
c          n  r  r  r  e  q  e  a  l  z  z  a  i  b  o  o  t  i  t       |
c          o  e  p  t  r  r  r  m  b  e  e  v  l  l  s  l  m  n  e       |
c          m  q  o  h  s  e  c  c  r  a  d  r  l  m  t  y  z  u  r       |
c------------------------------------------------------------------------+
      goto(1,03,01,01,01,02,02,02,02,01,01,01,02,03,01,01,02,02,01
     +    )qitpro
c
c     Case #1  Poles are ok for map center.
 1       if (abs(qclat).gt.pio2)  qclat = sign(pio2,qclat)
         go to 900
c
c     Case #2  Some projections must be nudged slightly off poles.
 2       hilat = pio2-(.01745329/2.)
         if (abs(qclat).gt.hilat)  qclat = sign(hilat,qclat)
         go to 900
c
c     Case #3  Others need respectably safe distance.
 3       hilat = pio2-.01745329
         if (abs(qclat).gt.hilat)  qclat = sign(hilat,qclat)
         go to 900
c
c     End Cases
 900  continue

      CALL INITIA (QXC,QYC,QCLAT,QCLON,QXRAD,QYRAD,QITPRO,QIRES,
     + QXRNM,QORHAL)

c     screen width in amp area                         - mapper
      CALL SCRDIA
      CALL GRAVPT
      CALL GEOWIN
      CALL JWCLIP (.TRUE.)

      if (drawon) then
```

```
c           Enable all planes for display of map data
            call enall

            if (metafl) call gmopen ('metafile',8,ierror)
            if (bitmod) then
                call jopen
            else
                IF (map) print*,'opening',firseg
                CALL JROPEN(FIRSEG)
            endif

            CALL DMAPII(QXRNM,QXC,QYC,QLEVL,QCLAT,QCLON,QXRAD,QYRAD,
     +      QITPRO,
     +      QIRES,QTYPTB,QLUNDA,QLUNIN,QLUNLI,QLTON,QPGRID,QDOTEM,
     +      QORHAL,ltypov,ltonov,rankt)
c
            if (bitmod) then
                call jclose
            else
                CALL JRCLOS
            endif
            if (metafl) call gmclos
c
c           Display map parameters.
            call scrdia
c
        endif

c       Set to overlay planes to protect map from here on
c       but only if not drawing to one plane

        if (.not.(oneflg)) call soverl

c       draw all overlay features

        call doverl (ltypov,ltonov)
        CALL FLUSHB

        IF (map) PRINT*,'MAP CALL IS COMPLETE'

        RETURN
        END


C+*+*+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:                       menupr
c
c  Functional Description:
c       this subroutine puts a standard prompt for menu selection
c
c  Input Files/Parameters:
c
c  Output Files/Parameters: N/A
c
c  Subroutines/Functions Called:
c
c  Called By:                       DETCON, MMCON,  NOTAVA, PROCON, RESCON
C                                   RSLCON, SUBCHK, TRKCON, FTRCON
C                                   GEOCON, OVRCON
c
c  Local Variables: N/A
c
c  Restrictions: N/A
c
c  Abnormal Return Conditions:  N/A
c
c  Location:      /a21/dave
c
c  Programmer        Date of Last Change       Reason for Change
c
C-*-*-*-*-*-*-*-*-*-*-*-*-*-*-*-*-*-*-*-*-*-*-*-*-*-*-*-*-*-*-*-*-*-*-*-*-*|*-*-*-*-
c
        subroutine menupr
c
c       this subroutine puts a standard prompt for menu selection
c
```

```
c
c       call system (17,'Select menu item.')
        call mesg(1)
c
        return
        end

C+*+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:      MENVPT
c
c  Functional Description:
c       this subroutines sets the menu area viewport
c
c  Input Files/Parameters:
C       xllmvp,yllmvp,xurmvp,yurmvp
c
c  Output Files/Parameters:
c
c  Subroutines/Functions Called:
c       Note: Subroutines preceded by a "j" are explained in the DI-3000 manual.
c
c  Called By:                    CLRMEN, MAKMEN, RECDIS, SAVDIS, CLASS
c
c  Local Variables:     N/A
c
c  Restrictions:                N/A
c
c  Abnormal Return Conditions: N/A
c
c  Location:    /a21/dave
c
c  Programmer          Date of Last Change       Reason for Change
c
C-*-*-*-*-*-*-*-*-*-*-*-*-*-*-*-*-*-*-*-*-*-*-*-*-*-*-*-*-*-*-*-*-*-*-*-*-*|*-*-*-*-
c
        subroutine menvpt
c
c       this subroutines sets the menu area viewport
c
        common /commvp/ xllmvp,yllmvp,xurmvp,yurmvp
c
        call jvport (xllmvp,xurmvp,yllmvp,yurmvp)
c
        return
        end

C+*+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:     MENWIN
c
c  Functional Description:
c       this subroutines sets the menu area window
c
c  Input Files/Parameters:
C       xllmen
c       yllmen
c       xurmen
c       yurmen
c       ibcmen
c       iocmen
c       incmen
c
c  Output Files/Parameters:
c
c  Subroutines/Functions Called:
c       Note: Subroutines preceded by a "j" are explained in the DI-3000 manual.
c
c  Called By:                    CLRMEN, KEYS, RECDIS, SAVDIS, CLASS
c
c  Local Variables:    N/A
c
c  Restrictions:                N/A
c
c  Abnormal Return Conditions: N/A
c
```

```
c  Location:    /a21/dave
c
c  Programmer         Date of Last Change       Reason for Change
c
C-*-*-*-*-*-*-*-*-*-*-*-*-*-*-*-*-*-*-*-*-*-*-*-*-*-*-*-*-*-*-*-*-*-*-*-*-*|*-*-*-*-
c
      subroutine menwin
c
c     this subroutines sets the menu area window
c
      common /commen/xllmen,yllmen,xurmen,yurmen,ibcmen,iocmen,incmen
c
      call jwindo (xllmen,xurmen,yllmen,yurmen)
c
      return
      end

C++++++++++++++++++++++++++++++++++++++++++++++++++++++++++++++++++++++|+++++++
c  UNIT NAME:                     mesg
c
c  Functional Description:        Subroutine to display a message in the
c                                  communications area
c
c  Input Files/Parameters:
c      General Gobals
c        qdsdev        device       integer   DI-3000 variable
c        qpydev        device       integer   DI-3000 variable
c        qecho         device       integer   DI-3000 variable
c        qxllcv        comcvp       integer   lower left x value of the
c                                              communications viewport
c        qyllcv        comcvp       integer   lower left y value of the
c                                              communications viewport
c        qxurcv        comcvp       integer   upper right x value of the
c                                              communications viewport
c        qyurcv        comcvp       integer   upper right y value of the
c                                              communications viewport
c        qcxmin        comwdo       real      minimum x boundary for the
c                                              communications window
c        qcxmax        comdow       real      maximum x boundary for the
c                                              communications window
c        qcymin        comdow       real      minimum y boundary for the
c                                              communications window
c        qcymax        comdow       real      maximum y boundary for the
c                                              communications window
c
c  Output Files/Parameters:      N/A
c
c  Subroutines/Functions Called:
c       Note: Subroutines preceded by a "j" are explained in the DI-3000 manual.
c       clrboz                     clears the construction box area
c
c  Called By:  46 Routines
c
c  Local Variables:
c      msgno                  integer   number of message to be displayed
c                                        true if valid file name
c      msg                    character 80 by 5 character array to hold
c                                        message
c      lines                  integer   number of lines of message to be
c                                         displayed
c      length                 integer   actual length of input recieved
c
c  Restrictions: If communications area is only 6 lines high, then the
c   message to out putted must be one line less than 6, (5).  The com-
c   munications area is thought to have 80 character lines, therefore,
c   each line of an output message can be no longer than 80 characters.
c
c  Abnormal Return Conditions:  N/A
c
c  Location:    /a21/dave
c
c  Programmer         Date of Last Change       Reason for Change
c     bam              October 27, 1983
```

```
c  L McCleary          Jan 1988                 sep amp & sys - mesg
c
C-*-*-*-*-*-*-*-*-*-*-*-*-*-*-*-*-*-*-*-*-*-*-*-*-*-*-*-*-*-*-*-*-*-*-*-*-*-*-*-*-*|*-*-*-*-

      subroutine mesg(msgno)
c
c     put a message into the communications area
c
      logical mesgon(1299)
      logical sys
c      logical batch
      common /sysdbc/ sys
      common /msgold/ msgold,msgonm
      common /msgoff/ msgoff
      common /qprint/ qprint
      common /mesgon/ mesgon
      logical qprint
      data mesgon/1299*.false./
      data msgold/-1/,msgonm/-1/,maxmsg/1299/
c
c     If repeated input from the keyboard is needed without
c     changing the message, include the msgold common area in
c     your program and set it's value to 0 before calling mesg
c
      if (sys) print*,'mesg -- enter ',msgno,msgold
      if (msgno.ne.msgold .and. .not. qprint) then
c          if (batch) call clrcom
         if ((msgno .gt. 0) .and. (msgno .le. maxmsg)) then
             if (msgonm .gt. 0) then
                 call jvisbl(msgonm + msgoff,0)
             else if (msgonm .eq. 0) then
c                msgonm 0 has been reserved for temporary messages used
c                by dmapii and sysmsg, these are purged when replaced
                 call jpurge (msgoff)
             endif
             if (.not.mesgon(msgno)) then
                 call crmesg(msgno)
                 mesgon(msgno) = .true.
             else
                 call jvisbl(msgno + msgoff, 1)
             endif
             msgold = msgno
             msgonm = msgno
         else
             print*,'mesg -- message number ',msgno,' outside ',
     +       'range of message numbers (',maxmsg,')'
         endif
      endif
c
      return
      end


C+*+*+*+*+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    MESGJF
C
C FUNCTIONAL DESCRIPTION:
C
C CALLED BY:
C
C PROGRAMMER:                   DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*-*-*-*-*|*-*-*-*-

      subroutine mesgjf(msgno,il,iseg)

C  SUBROUTINE TO PLACE A MESSAGE IN THE COMMUNICATIONS AREA UNDER A
C  CURRENTLY DISPLAYED MESSAGE WITHOUT PURGING THE CURRENT MESSAGE IN
C  THE COMMUNICATIONS AREA.  THE MESSAGE IS DISPLAYED ON LINE
C  IL.  THE NEW MESSAGE IS PLACED IN A RETAINED SEGMENT AND THE
C  RETAINED SEGMENT NUMBER IS PASSED BACK TO THE CALLING ROUTINE,
C  (USUALLY PRMGJF)  WHERE THE SEGMENT CAN BE PURGED AFTER INPUT
C  IS RECIEVED.
```

```
      integer il
      character*50 menpth
      common /menpth/ menpth
      common /lenmen/ lenmen
      common/comwdo/qcxmn,qcymn,qcxmx,qcymx
      real qcxmn,qcymn,qcxmx,qcymx
c      common /arsegs/ nsgmen,nsggra,nsgsys,nsgmsg,nsgmap,nsgful
      character cchar
c      common /msgold/ msgold
c
      character *80 msg
      integer msgno,lenmsg
      character*80 filenm
      character*30 fname
      character*26  flettr
      data fname/'file'/,lname/4/
      data flettr /'abcdefghijklmnopqrstuvwxyz'/
      data icolcm/16/


          filenm = ' '

          call jwindo(qcxmn,qcxmx,qcymn,qcymx)
          CALL COMVPT
          CALL GETSEG(iseg)
          call jropen (iseg)
          call xsize (1.,1.)
          call xcolor (icolcm)
c
          ifl = 19
          indlet = msgno / 50 + 1
          if (indlet.lt.1) indlet = 1
          if (indlet.gt.26) indlet = 26
          filenm = menpth(1:lenmen) // fname(1:lname) //
     +    flettr(indlet:indlet) // '.msg'
          lennam = lenmen + lname + 5
          call openit(filenm,lennam,ifl,0,ierror)
          if (ierror.ne.0) go to 181
c         Loop though message file looking for message
  100     continue
              read (ifl,1100,end=183,err=182) cchar,msg
 1100         format (a1,a80)
c             print*,'line read - cchar: ',cchar,msg
c             *** skip comment lines
              if (cchar.eq.'C'.or.cchar.eq.'c') go to 100
              if (cchar.eq.'M'.or.cchar.eq.'m') then
                  read (msg,1150,end=183,err=182) msgnum
 1150             format (i5)
                  if (msgnum.eq.msgno) then
                      i=il-1
c                     loop until no more data lines (blank first char)
  120                 continue
                          read (ifl,1100,end=183,err=182) cchar,msg
c                         *** skip comment lines
                          if (cchar.eq.'C'.or.cchar.eq.'c')
     +                    go to 120
                          if (cchar.eq.'m'.or.cchar.eq.'M') go to 130
                          call length (msg,80,lenmsg)
                          i = i + 1
                          if (lenmsg.gt.0) then
                              call jmove(qcxmn + 1, (qcymx - i - .3))
                              call jlstrg (msg(1:lenmsg))
                          endif
                      go to 120
  130                 continue
c                     position after last line for prompt subroutine
                      call echps(qcxmn+1,(qcymx - i - 1 - .3))
c                     exit after message found
                      go to 180
                  endif
              endif
          go to 100
  180     continue
          go to 190
```

```
  181       continue
                print*,'open error on message file ',msgno,ierror
                go to 190
  182       continue
                print*,'read error on message file ',msgno
                go to 190
  183       continue
                print*,'end of file - message not found :',msgno
  190       continue
            call jrclos
            call closit (ifl)
c
        return
        end

C+*+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:                          messag
c
c  Functional Description:
c       calculate
c
c  Input Files/Parameters:
c
c  Output Files/Parameters: N/A
c
c  Subroutines/Functions Called:
c
c  Called By: llshow
c
c  Local Variables: N/A
c
c  Restrictions: N/A
c
c  Abnormal Return Conditions:  N/A
c
c  Location:
c
c  Programmer       Date of Last Change     Reason for Change
C  L. McCleary      Jan 1988               separate amp & sys - messag
c
C-*-*-*-*-*-*-*-*-*-*-*-*-*-*-*-*-*-*-*-*-*-*-*-*-*-*-*-*-*-*-*-*-*-*-*-*|*-*-*-*-
c
        SUBROUTINE MESSAG(DIAM,LEN,LINE)

C  SUBROUTINE TO PLACE A CHARACTER STRING IN THE MESSAGE
C  AREA FOLLOWED WITH A MESSAGE TO PRESS ANY KEY TO CONTINUE.
C  THE MESSAGE AREA IS CLEARED BEFORE THE MESSAGE IS PLACED
C  IN THE COMMUNICATIONS AREA. NSGMSG IS USED AS THE RETAINED
C  SEGMENT NUMBER.

        CHARACTER*80 DIAM
        INTEGER LEN,LINE

        COMMON /MSGOLD/ MSGOLD,MSGONM

c         ICOLCM = 16
c         LOFF = LINE + .3
c         call clrcom
c         call CLRMSG
c         MSGONM = 0
         call drwamp(diam,1)

c         MSGOLD = 0

        return
        end

C+*+*+*+*+*+*+*+*+*+*+*+*+*+*+*+*+*+*+*+*+*+*+*+*+*+*+*+*+*+*+*+*+*+*+*+*|*+*+*+*+
C* UNIT NAME:                          mhand
C*
C* FUNCTIONAL DESCRIPTION:
C*
```

```
C*   This subroutine drives the menu interface of the A21PROTOTYPE.
C*
C* INPUT FILES/PARAMETERS:
C*
C*     Global Variables
C*       qcancl          logical; cancel flag
C*       qcrmnu          integer; contains the current menu number
C*       qext2m          logical; exit to main menu flag
C*       qexitg          logical; flag to exit graphics system
C*       qnextm          integer; number of next menu to be displayed
C*       qretrn          logical; return to previous menu flag
C*       qstmnu          logical; flag to put current menu on the stack
C*
C* OUTPUT FILES/PARAMETERS:
C*
C*       values in global variables described above
C*
C* RESTRICTIONS:
C*
C*       not restricted
C*
C* SUBROUTINES CALLED:
C*
C*       popst           subroutine; simulates popping an item off a
C*                                   stack
C*       pushst          subroutine; simulates pushing an item on a
C*                                   stack
C*       setvar  block data routine; initializes control variables to
C*                                   point to the main menu
C*       store           subroutine; handles permanent stores
C*       subcal          subroutine; calls menu drawing routine and
C*                                   appropriate menu controller
C*
C* CALLED BY:                    FMAIN
C*
C* LOCAL VARIABLES:
C*
C*       no local variables
C*
C* ABNORMAL RETURN CONDITIONS:
C*
C*       no abnormal return conditions
C*
C* LOCATION:
C*
C*       /u2/vcn/a21proto/mhand
C*
C* PROGRAMMER:              DATE OF LAST CHANGE    REASON FOR CHANGE
C*
C*  VCNewton                  15 August 1983         initial entry
C*
C-*-*-*-*-*-*-*-*-*-*-*-*-*-*-*-*-*-*-*-*-*-*-*-*-*-*-*-*-*-*-*-*-*-*-*-*|*-*-*-*-

      Subroutine MHAND

C     This subroutine drives the menu interface of the A21PROTOTYPE.

C        (**Declare common blocks and common block variables**)
         Integer qcrmnu,qnextm
         Logical qcancl,qexitg,qext2m,qretrn,qstmnu
         Common /b1/ qcancl,qext2m,qretrn,qstmnu,qnextm
         Common /b5/ qexitg
         Common /b6/ qcrmnu
         logical stackd
         stackd = .false.
         call setvar
C        (**Loop:                         **)
C        (**Do-until exit graphics is chosen**)
   10    Continue
C           (**Execute menu process**)
            menun = qnextm
            Call SUBCAL (menun,ierror)
            if (ierror.ne.0) then
               qnextm = qcrmnu
               qstmnu = .false.
               if (stackd) call popst
```

```
            stackd = .false.
            print*,'mhand -- unable to interpret menu',menun,ierror
         else
C           (**Fall through loop if exit graphics is chosen**)
            If (.not.(qexitg)) then
               stackd = .false.
C              (**Check for exit to main menu or cancel**)
               if ((qext2m) .or. (qcancl)) then
                  if (.not.qcancl) then
                     Call STORE
                  endif
C                 (**Re-init control variables to point to the**)
C                 (**main menu                                  **)
                  Call SETVAR
C                 (**Initialize menu controller variables**)
                  Call reinip
C              (**Check for return to previous menu**)
               elseIf (qretrn) then
                  Call POPST
                  qretrn=.false.
C                 (**Reset qstmnu flag in case it was set when**)
C                 (**return was executed                      **)
                  qstmnu=.false.
C                 (**Perform store if multiple returns were made**)
C                 (**to return to the main menu                 **)
                  If (qnextm .eq. 1) then
C                    (**Before a store is made a check should be done**)
C                    (**to see if a picture exists                  **)
                     Call Store
C                    (**Initialize menu controller variables**)
                     Call reinip
                  Endif
C              (**Check for placing a menu on the stack**)
               Elseif (qstmnu) then
                  Call PUSHST
                  qstmnu=.false.
                  stackd = .true.
               Endif
C              (**Set the current menu number to the number     **)
C              (**corresponding to the next menu to be displayed**)
c              qcrmnu=qnextm
            Endif
         endif
         If (qnextm .eq. 1) then
C           (**Store the index**)
            Call strind
         Endif
C        (**Remain in loop if exit graphics is not chosen**)
         If (.not.(qexitg)) goto 10
      end


C+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    MINORS
C
C FUNCTIONAL DESCRIPTION:       .
C
C CALLED BY:                    STATEC
C
C PROGRAMMER:                   DATE OF LAST CHANGE     REASON FOR CHANGE
c  S. Lamb                Feb 1988                command fix - minors
C
C-*-*-*-*-*-*-*-*-*-*-*-*-*-*-*-*-*-*-*-*-*-*-*-*-*-*-*-*-*-*-*-*-*-*-*-*-*|*-*-*-*-
c
      subroutine minors
c
c     this subroutine is the minor feature state interpreter (10)
c
      common /states/ nextst
      logical wordis,iseoc
      logical isfeat
      logical sketch,majorf,minorf
      common /statel/ sketch,majorf,minorf
c     map parameters
```

```
        logical lton(16),dotem
        integer ipgrid(4),ltyptb(16)
        common /map/ XRNM,XC,YC,LEVEL,CLAT,CLON,XRAD,YRAD,ITPROJ,
     +     IRES,LTYPTB,LUNDAT,LUNIND,LUNLIN,LTON,IPGRID,DOTEM,
     +     ORHALT
c
        initls = nextst
c       do until nextst not = initial state
  100   continue
            call getwrd
            if (wordis('DETAIL')) then
                nextst = 22
            else if (wordis('SCALE')) then
                nextst = 24
            else if (isfeat()) then
                if (minorf) then
                    level = 15
                    nextst = 8
                else
                    level = level + 1
c                   *** could expand on this -- error message ***
                    if (level.gt.15) then
                        level = 15
                        nextst = 1
                    else
                        nextst = 8
                    endif
                endif
                nextst = 8
            else if (wordis('LEVEL').or.wordis('OF')) then
c * ** *** **** ***** ****** ******* not understood / implem.
                nextst = 15
            else if (iseoc()) then
                if (minorf) then
                    level = 15
                else
                    level = level + 1
c                   *** could expand on this -- error message ***
                    if (level.gt.15) level = 15
                endif
                nextst = 1
            else
                call putwrd
                nextst = 15
            endif
        if (nextst.eq.initls) go to 100
c
        return
        end


C+++++++++++++++++++++++++++++++++++++++++++++++++++++++++++++++++++++++++|+++++++
C UNIT NAME:                    MIRRIT
C
C FUNCTIONAL DESCRIPTION:       .
C
C CALLED BY:                    CHGPTS
C
C PROGRAMMER:                   DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*|*-*-*-*-

       subroutine mirrit(array,npts,scale)

c     This routine mirrors an array of points around the
c         0-point  by calculating the distance the point is
c         from 0 and subtracting two times that distance from
c         the point.
c    VARIABLES:
c        array- the points to be changed
c        npts- number of points in the array

      real array(*),scale
      integer npts
      real xv(4),yv(4),zv(4)
```

```
      call jiwind (xv,yv,zv)
      do 10 i=1,npts
         array(i) = -(array(i)) + (190./(2.6/scale))
10    continue
      return
      end


C++++++++++++++++++++++++++++++++++++++++++++++++++++++++++++++++++|+++++++
c  UNIT NAME:                      mpick
c
c  Functional Description:
c       this subroutine gets a selection from the menu
c
c  Input Files/Parameters:
c
c  Output Files/Parameters: N/A
c
c  Subroutines/Functions Called:
c      Note: Subroutines preceded by a "j" are explained in the DI-3000 manual.
c
c  Called By:                      COLBAK, DETCON, HELP, MMCON,  PROCON,
C                                  PRTMEN, RESCON, RSLCON, TRKCON
C                                  TXWRIT, CLASS,  FTRCON, GEOCON, OVRCON
c
c  Local Variables: N/A
c
c  Restrictions: N/A
c
c  Abnormal Return Conditions:  N/A
c
c  Location:      /a21/dave
c
c
C-*-*-*-*-*-*-*-*-*-*-*-*-*-*-*-*-*-*-*-*-*-*-*-*-*-*-*-*-*-*-*-*-*-*|*-*-*-*-
c
        subroutine mpick (ichoic,mysegn,ibuttn)
c
c       this subroutine gets a selection from the menu
c
c       *** this is a machine dependent subroutine and should be changed
c           if necessary when a new device driver is used that returns
c           different values for buttons ****
c           currently the value for the '0' key is 48
c
        logical sys,aed,vax
        common /sysdbc/ sys
        common /aeddbc/ aed
        common /vaxdbc/ vax
        integer segnam,pickid
        integer qfb(26),qmb(4)
        common /butons/ qfb,qmb
        character ch1
        equivalence (ch1(1:1),ikey)
c       on screen standard function key common
        common /nsgkey/ nsgkey,nsgktx

c
        if (sys) print*,'mpick -- enter  ',mysegn
        call pick (ibuttn,segnam,pickid)
        if (sys) print*,'mpick --  ',ibuttn,segnam,pickid,qmb(1)
        ichoic = 0
clj ------ The following 3 lines were changed so that a
clj ------ pick can only be triggered with function
clj ------ button 1.   (June 3,1985)
clj        if (mysegn.eq.segnam) then
clj            ichoic = pickid
clj            ibuttn = qmb(1)
       if (mysegn.eq.segnam.and.ibuttn.eq.qmb(1)) then
           ichoic = pickid
       else if (ibuttn .ne. qmb(3) .and. ibuttn .ne. qfb(26) .and.
     +          ibuttn .ne. qfb(15) .and. ibuttn .ne. qfb(16)) then
           if (segnam.eq.nsgktx) then
               ibuttn = pickid
```

```
            else if (aed) then
                ichoic = ibuttn - 48
            else
c
c***            otherwise, set ibuttn to the segment number,
c***            this will trigger the call to check to look for a
c***            segment associated with a tracking plot on the screen
c
                ibuttn = segnam
            endif
        endif

c       The following logic is for button menu input
c
c       if (vax) then
c        if(ibuttn.le.9)then
c                ichoic=ibuttn
c        elseif (ibuttn.eq.ichar('A'))then
c                ichoic=10
c        elseif (ibuttn.eq.ichar('B'))then
c                ichoic=11
c        elseif (ibuttn.eq.ichar('C'))then
c                ichoic=12
c        elseif (ibuttn.eq.ichar('D'))then
c                ichoic=13
c        endif
c       endif

        if (sys)
     +  print*,'mpick -- exit  ichoic = ',ichoic,mysegn,ibuttn
c
        return
        end


C+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                       MRCNTR
C
C FUNCTIONAL DESCRIPTION:
c -   Description: This routine mirrors an array of points around the
c                     50, 59 point.
c    VARIABLES:
c        array- the points to be changed
c        npts- number of points in the array
C
C CALLED BY:
C
C PROGRAMMER:                      DATE OF LAST CHANGE      REASON FOR CHANGE
c    MODIFIED BY M. Bloom, T333 June 1987 to allow icons to be
c      positioned by center point rather than lower left
c      corner
C
C-*-*-*-*-*-*-*-*-*-*-*-*-*-*-*-*-*-*-*-*-*-*-*-*-*-*-*-*-*-*-*-*-*-*-*-*-*|*-*-*-*-

      subroutine mrcntr(array,npts,scale)
      real array(*),scale
      integer npts

      real xv(4),yv(4),zv(4)
      call jiwind (xv,yv,zv)
      do 100 i=1,npts

c   Since the center of the construction box is 50,50 add 100
c   to the inverse of the point.  This mirrors the icon around
c   the center.

          array(i) = -(array(i)) + 100.
c         array(i) = -(array(i)) + (190./(2.6/scale))

100   continue
      return
      end
```

```
C+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    MVPDDG
C
C FUNCTIONAL DESCRIPTION:       .
C
C CALLED BY:                    MVTEXT
C
C PROGRAMMER:                   DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*|*-*-*-*-

      subroutine mvpddg(line1,line2)
c
c
c  this subroutine moves a pddg name from line1 into line2
c
      character * 120 line1
      character * 120 line2
      character*4 text

c     print*,'mvpddg -- enter'
      if(line1(37:38) .ne. '  ') then
           text(1:2) = line1(37:38)
           line1(37:38) = '  '
           line2(39:41) = '/' // text(1:2)
      endif
      return
      end


C+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    MVTEXT
C
C FUNCTIONAL DESCRIPTION:       .
C
C CALLED BY:                    READML, PROCDF
C
C PROGRAMMER:                   DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*|*-*-*-*-

      subroutine mvtext(fname,len)
c
c   this subroutine checks for co-located pddg names in an overlay file
c
c
      character*80 fname
      character*120 line(70)
      integer*2 lincnt
      character*15 latlo1
      character*15 latlo2
      data lunnam/19/

c      print*,'movtxt -- enter'
      open(unit=lunnam,file=fname(1:len),
     +     err = 200,status = 'old')
      i = 1
 100  continue
          read(lunnam,120,end=150) line(i)
 120      format(a120)
          i = i + 1
          goto 100
 150  continue
      lincnt = i-1
      do 170 j= 1,lincnt-1
c          print*,'line: ',line(j)
          if(line(j)(1:1) .ne. 'c') then
              latlo1 = line(j)(3:17)
              do 160 i=j+1,lincnt
                    latlo2 = line(i)(3:17)
                    if(latlo1 .eq. latlo2) then
                          call mvpddg(line(i),line(j))
                    endif
```

```
 160          continue
           endif
 170   continue
       REWIND lunnam
       do 180 j=1, lincnt
            write(lunnam,120) line(j)
 180   continue
       close(unit=lunnam)
       goto 300
 200   print*,'error in movtxt'
 300   continue
c       print*,'movtxt -- exit'
       return
       end

C+*+*+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:                   mytext
c
c  Functional Description:
c       this subroutine formats a text string for graphics output
c
c  Input Files/Parameters:
c
c  Output Files/Parameters: N/A
c
c  Subroutines/Functions Called:
c      Note: Subroutines preceded by a "j" are explained in the DI-3000 manual.
c
c  Called By:                   CREATM, MAPOVR, PLOTIT
c
c  Local Variables: N/A
c
c  Restrictions: N/A
c
c  Abnormal Return Conditions:  N/A
c
c  Location:      /a21/dave
c
c  Programmer        Date of Last Change       Reason for Change
c
C-*-*-*-*-*-*-*-*-*-*-*-*-*-*-*-*-*-*-*-*-*-*-*-*-*-*-*-*-*-*-*-*-*-*-*-*-*-*|*-*-*-*-
c
        subroutine mytext (nbytes,textst)
c
c       this subroutine formats a text string for graphics output
c
        character*(*) textst
c
        call jlstrg(textst(1:nbytes))
c
        return
        end

C+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME: NAMLIM
C
C FUNCTIONAL DESCRIPTION:  NAMLIM OPENS NAME LIMITS FILE AND CALLS PLTNAM.
C
C INPUT FILES/PARAMETERS:
C
C        NAMFIL                 CHAR*80     NAME OF NAME LIMITS FILE.
C        LENNMF                 INTEGER     LENGTH OF NAMFIL.
C        LTON                   LOGICAL(16) INDICATES WHICH FEATURES ARETURNED ON.
C        XRNM                   REAL        NAUTICAL MILE RADIUS OF MAP.
C
C GLOBAL VARIABLES :
C
C        LENMAP                 INTEGER     LENGTH OF MAP PATH.
C        MAPATH                 CHAR*50     MAP DATA PATH NAME.
C        LUNNAM                 INTEGER     LOGICAL UNIT NUMBER FOR NAME LIMITS
C                                           FILE.
C        AREAMN                 REAL        MINIMUM AREA SIZE.
C        AREAMX                 REAL        MAXIMUM AREA SIZE.
C
```

```
C OUTPUT FILES/PARAMETERS:  NONE.
C
C SUBROUTINES/FUNCTIONS CALLED :
C
C        PLTNAM              PLOTS NAMES FROM NAME LIMITS FILE.
C
C CALLED BY: DMAPII.
C
C LOCAL VARIABLES:
C
C        FILEN               CHAR*100   FULL PATHNAME.
C
C RESTRICTIONS: NONE.
C
C ABNORMAL RETURN CONDITIONS:   NONE.
C
C LOCATION:                   /a21/gjf/MAPSRC.FTN
C
C PROGRAMMER:                 DATE OF LAST CHANGE     REASON FOR CHANGE
C
C     DAVE NATION                                     ORIGINAL CODE.
C     JERRY FENERTY                                   DOCUMENT AND MODIFY
C                                                     FOR A21 PROTOTYPE.
C     Dave Nation             5/6/85                  Change fill path name
C                                                     from defpth to mapath
C
C-*-*-*-*-*-*-*-*-*-*-*-*-*-*-*-*-*-*-*-*-*-*-*-*-*-*-*-*-*-*-*-*-*-*-*|*-*-*-*-

        SUBROUTINE NAMLIM (NAMFIL,LENNMF,LTON,XRNM)

C       THIS SUBROUTINE OPENS THE NAME LIMITS FILE AND CALLS PLTNAM

        character*50 mapath
        common /mapath/ mapath
        common /lenmap/ lenmap
        COMMON /NMLIM/ LUNNAM,AREAMN,AREAMX
        LOGICAL LTON(16)
        CHARACTER*80 NAMFIL
        CHARACTER*100 FILEN

        LEN = LENNMF + LENMAP
        if(lenmap .gt. 0) then
             filen = mapath(1:lenmap) // namfil(1:lennmf)
        else
             filen = namfil(1:lennmf)
        endif
        OPEN(UNIT=LUNNAM,FILE=FILEN(1:LEN),STATUS='OLD',
     +  ERR=671)

            CALL PLTNAM (LTON,XRNM)
            GO TO 699
 671    CONTINUE
c            PRINT*,'PLOT -- ERROR ON OPEN OF NAME LIMITS FILE ',
c     +      filen(1:lennmf)
 699    CONTINUE
        CLOSE(LUNNAM)

        RETURN
        END


C+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                  NEXTPT
C
C FUNCTIONAL DESCRIPTION:     .
C
C CALLED BY:                  NO LONGER USED BY CARICATURE
C
C PROGRAMMER:                 DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*|*-*-*-*-

      subroutine nextpt (longfl,alat,alon,df,arc,itproj)
```

```
c
c     This subroutine gets the next point of the DF l.o.b.
c
      logical longfl,NEWSEQ
      real LNP,LNM,L0

      common/constx/sazi,slat,cosazi,scazi,coslat,sinazi,cosi,
     1              sini,cosl0,cosf0,L0,lnp,lnm,f,f0

      data PI/3.14159/
      data TWOPI/6.28318/
      data R90/1.5708/


      if (longfl) then
c ------- This is a longitudinal bearing.
C ------- Latitude of new point
          ALAT = ALAT + DF
C ------- New length of arc
          ARC = ARC + ABS(DF)
          ABSLAT = ABS(ALAT)
C ------- Special case for crossing a pole
          IF (ABSLAT.GT.R90) THEN
C ----------- Convert latitude to value between -pi/2 and +pi/2
              SALAT = SIGN(1.0,ALAT)
              ALAT = SALAT*(PI-ABSLAT)
C ----------- Reverse direction of bearing
              DF = -DF

C ----------- Calculate new longitude (opposite side of globe)
              ALON = ALON + PI
              IF (ALON.GT.PI) THEN
                  ALON = ALON - TWOPI
              END IF

C ----------- Special case for non-circular projection types
              IF (itproj.GE.6) THEN
C --------------- Start new line at opposite bound of projection
                  NEWSEQ = .TRUE.
             END IF
         END IF
      else
c        This is a regular bearing.
         IF (ABS(SINI).LT.0.001) THEN
C ----------- If track along equator, just increment longitude
             ALON = LNM + SAZI*F
         ELSE
             SINLAT = SINI*SIN(F)
C ----------- L is difference in longitude from intersection of great circle
C ----------- with equator to next point
             COSL = COS(F)/SQRT(1-SINLAT**2)
C ----------- The following lines are limits,not sure if
C ----------- if it should be done this way,
             COSL = AMAX1(-1.0000000,COSL)
             COSL = AMIN1( 1.0000000,COSL)
C ----------- Latitude of next point
             ALAT = ASIN(SINLAT)
             SALAT = SIGN(1.0,ALAT)
C ----------- Longitude of next point
             ALON = SALAT*SAZI*ACOS(COSL)
             IF (SLAT.GT.0.0) THEN
                 ALON = LNM + ALON
             ELSE
                 ALON = LNP + ALON
             END IF
         END IF
         IF (ABS(ALON).GT.PI) THEN
             ALON = ALON - SIGN(1.0,ALON)*TWOPI
         END IF
      endif

      return
      end
```

```
C+++++++++++++++++++++++++++++++++++++++++++++++++++++++++++++++++++++++|+++++++
c  UNIT NAME:                     notava
c
c  Functional Description:
c       puts out an error message indicating the function is not currently
c       available
c
c  Input Files/Parameters:
c
c  Output Files/Parameters: N/A
c
c  Subroutines/Functions Called:
c
c  Called By:                     PRINTR
c
c  Local Variables: N/A
c
c  Restrictions: N/A
c
c  Abnormal Return Conditions:  N/A
c
c  Location:       /a21/dave
c
c  Programmer         Date of Last Change       Reason for Change
c
C-*-*-*-*-*-*-*-*-*-*-*-*-*-*-*-*-*-*-*-*-*-*-*-*-*-*-*-*-*-*-*-*-*-*-*-*|*-*-*-*-
c
        subroutine notava
c
c       puts out an error message indicating the function is not currently
c       available
c
        call mesg (2)
        call paws
        call menupr
        return
        end


C+++++++++++++++++++++++++++++++++++++++++++++++++++++++++++++++++++++++|+++++++
C UNIT NAME:                      NOTUND
C
C FUNCTIONAL DESCRIPTION:         .
C
C CALLED BY:                      STATEC
C
C PROGRAMMER:                     DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*|*-*-*-*-

        subroutine notund
c
c       this subroutine is the not understood state interpreter (15)
c
        common /states/ nextst
        logical eol,eoc
        common /comnds/ lenl,indxw,lenw,eol,eoc
        character * 80 comlin
        common /comlin/ comlin
        character * 105 errlin
c
        errlin = 'Command not understood : ' //
     +  comlin(indxw:indxw + lenw - 1)
        lenlin = 25 + lenw
        call cerror(lenlin,errlin)
        nextst = 1
c
        return
        end

C+++++++++++++++++++++++++++++++++++++++++++++++++++++++++++++++++++++++|+++++++
C UNIT NAME:                      NPICK
C
C FUNCTIONAL DESCRIPTION:         .
```

```
C
C CALLED BY:                    RECDIS, SAVDIS
C
C PROGRAMMER:                   DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*|*-*-*-*-

        subroutine npick (ichoic,mysegn,ibuttn,isegn)
c
c       modified mpick to get a selection from the menu
c
c       *** this is a machine dependent subroutine and should be changed
c           if necessary when a new device driver is used that returns
c           different values for buttons ****
c           currently the value for the '0' key is 48
c
        logical sys,aed
        common /sysdbc/ sys
        common /aeddbc/ aed
        integer segnam,pickid
        integer qfb(26),qmb(4)
        common /butons/ qfb,qmb
        character ch1
        equivalence (ch1(1:1),ikey)
c       on screen standard function key common
        common /nsgkey/ nsgkey,nsgktx
c
        if (sys) print*,'npick -- enter  ',mysegn
        call pick (ibuttn,segnam,pickid)
        if (sys) print*,'npick --  ',ibuttn,segnam,pickid,qmb(1)
        ichoic = 0
        if ((mysegn.eq.segnam.or.isegn.eq.segnam)
     +  .and.ibuttn.eq.qmb(1)) then
            ichoic = pickid
        else
            if (segnam.eq.nsgktx) then
                ibuttn = pickid
            else
                if (aed) ichoic = ibuttn - 48
            endif
        endif
        if (sys)
     +  print*,'npick -- exit  ichoic = ',ichoic,mysegn,ibuttn
c
        return
        end

C+*+*+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:                   openit

c  Functional Description:
c       this subroutine opens a file
c
c  Input Files/Parameters:
c  Output Files/Parameters: N/A

c  Subroutines/Functions Called:

c  Called By:                   BSTMAP, CREATM, CRMESG, HELP,   INIGRA,
C                               LOADIC, MESGJF, RBOUND, RCOLOR
C                               RCONFG, RPARAM, RPATHS, RSAVPR, SPARAM
C                               WSAVPR, WRITER

c  Local Variables: N/A

c  Restrictions: N/A

c  Abnormal Return Conditions:  N/A

c  Location:       /a21/dave

c  Programmer          Date of Last Change        Reason for Change
c  C.S. Lamb           Jan 1988               stat='UNKNOWN' - openit
```

```
C-*-*-*-*-*-*-*-*-*-*-*-*-*-*-*-*-*-*-*-*-*-*-*-*-*-*-*-*-*-*-*-*-*-*-*-*-*-*-*-*-*|*-*-*-*-

        subroutine openit (filenm,len,ifl,irdwr,ierror)

c       this subroutine opens a file

        character*(*) filenm

c       print*,'Openit -- enter'
        ierror = 0
C        OPEN (file = filenm(1:len), UNIT=ifl, ERR=120, status='UNKNOWN')
        IF(IRDWR.EQ.0) THEN
            OPEN (file = filenm(1:len), UNIT = ifl, ERR = 120,
     1          STATUS='OLD')
        ELSE
            OPEN (file = filenm(1:len), UNIT = ifl, ERR = 100,
     1          STATUS='OLD')
            GOTO 110
  100       OPEN (file = filenm(1:len), UNIT = ifl, ERR = 120,
     1          STATUS='NEW')
        ENDIF
  110   rewind (ifl)
        go to 190
  120   continue
c       print*,'Openit -- open error'
        PRINT *,FILENM(1:LEN),' FILE OPEN PROBLEM, COULD BE SERIOUS!'
        ierror = 1
  190   continue

        return
        end

C+*+*+*+*+*+*+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:     PAWS
c
c  Functional Description:
c       jpause function
c
c  Input Files/Parameters:
c       qdsdev
c       qpydev
c       qecho
c       qfb
c       qmb
c
c  Output Files/Parameters:
c
c  Subroutines/Functions Called:
c       buttn
c       helper
c
c  Called By:                  24 routines
c
c  Local Variables:
c       button           INTEGER              integer value of button pressed
c
c  Restrictions:                N/A
c
c  Abnormal Return Conditions: N/A
c
c  Location:         /a21/dave
c
c  Programmer        Date of Last Change       Reason for Change
c
C-*-*-*-*-*-*-*-*-*-*-*-*-*-*-*-*-*-*-*-*-*-*-*-*-*-*-*-*-*-*-*-*-*-*-*-*-*-*-*-*-*|*-*-*-*-
c
        subroutine paws
c
c       pause function used after error messages (also calls help when
c       appropriate
c
        integer qfb(26),qmb(4)
        common /butons/ qfb,qmb
```

```
        integer button
        Common /b6/ qcrmnu
        integer qcrmnu
c
        call buttn (button)
        if (button.eq.qfb(23)) then
            call helper (qcrmnu)
        endif
c
        return
        end


C+*+*+*+*+*+*+*+*+*+*+*+*+*+*+*+*+*+*+*+*+*+*+*+*+*+*+*+*+*+*+*+*+*+*|*+*+*+*+
c  UNIT NAME:     PICK
c
c  Functional Description:
c       this subroutine does a jpick and supplies the first three variables
c
c  Input Files/Parameters:
c       qdsdev            INTEGER     device
c       qpydev            INTEGER     device
c       qecho             INTEGER     echo value for input
C       inpdev            INTEGER     input device
c       ichoic
c       segnam
c       pickid
c
c  Output Files/Parameters:
c
c  Subroutines/Functions Called:
c       Note: Subroutines preceded by a "j" are explained in the DI-3000 man
c
c  Called By:                   mpick, npick, pltsup, tquery
c
c  Local Variables:
c       segnam            INTEGER
c       pickid            INTEGER
c
c  Restrictions: N/A
c
c  Abnormal Return Conditions: N/A
c
c  Location:          /a21/dave
c
c  Programmer        Date of Last Change       Reason for Change
c
C-*-*-*-*-*-*-*-*-*-*-*-*-*-*-*-*-*-*-*-*-*-*-*-*-*-*-*-*-*-*-*-*-*-*-*|*-*-*-*-

        subroutine pick (ibuttn,segnam,pickid)

c       this subroutine does a jpick and supplies the first three variables

        common /tablet/ inpdev
        integer segnam,pickid
        integer qdsdev,qpydev,qecho,qlecho
        common /device/ qdsdev,qpydev,qecho,qlecho
        logical sys,rdkey,savkey
        common /sysdbc/ sys
        common /rkdbc/ rdkey
        common /svkdbc/ savkey
        logical eofkey
        integer keylun,newlun
        common /keylun/ keylun,newlun,eofkey
        character*6 command
        logical timout
        integer*2 time
        common /timout/ timout, time

        if (sys) print*,'pick -- enter'

c -- position cursor near middle of menu area

        CALL JPKAPR (QDSDEV,QPYDEV,.04,.04)
```

```
c       set pick echo position                              - pick
        CALL JPECHO(1,5,1,.69,.23)
  100   continue
        if ((rdkey).and..not.eofkey) then
            call kpause (eofkey)
            read (keylun,*,end=192,err=191) command,ibuttn,segnam,
     +      pickid
            if (command(1:5).ne.'jpick') then
                print*,'jpick -- incompatible command in ',
     +          'read_keys file  ',command,ibuttn,segnam,pickid
c               *** exit on error
                go to 199
            endif
        else

  125      continue
c
c          polling loop to check for incoming data or clock interrupt
c
           call datpol
c
c          check for keyboard interrupt
c
           call jpick (qdsdev,inpdev,qecho,ibuttn,segnam,pickid)
           if (timout) then
              go to 125
           end if
        endif

        go to 199
  191   continue
            print*,'pick -- error on read of save key file',
     +      '  ',keylun,ibuttn,segnam,pickid
            go to 199
  192   continue
            print*,'pick -- premature end of read key file.'
            eofkey = .true.
            go to 100
c           **** go back and get the function interactively on end of file
  199   continue
        if (savkey) then
            write (newlun,*,err=135)'''jpick'' ',ibuttn,segnam,
     +      pickid
        endif
        go to 140
  135   continue
            print*,'pick -- error on write to save key file',
     +      '  ',newlun,ibuttn,segnam,pickid
  140   continue
        if (sys) print*,'pick -- exit',ibuttn,segnam,pickid

        return
        end


C+*+*+*+*+*+*+*+*+*+*+*+*+*+*+*+*+*+*+*+*+*+*+*+*+*+*+*+*+*+*+*+*+*+*+*+*|*+*+*+*-
C UNIT NAME:                    PLOTIT
C
C FUNCTIONAL DESCRIPTION:       Marks DF station, and draws line of bearing.
C
C INPUT FILES/PARAMETERS:       rlo,rla - station coords.
C                               az,dst  - DF azimuth and arc length.
C                               xrnm    - map half width, nm
C
C GLOGBAL VARIABLES:            invali  - unplotable point flag.
C                               nolobx  - no label/box flag.
C
C SUBROUTINES CALLED:           llplxy,da2ll,ll2gc,blplin,mytext
C
C CALLED BY:                    drwlob
C
C LOCAL VARIABLES:              size    - annotation character size.
C                               box     - half width of marker box.
C
```

```
C PROGRAMMER:                       DATE OF LAST CHANGE     REASON FOR CHANGE
C       Tom Wescott (NOSC)          8/88                    add clip, simplify
C
C-*-*-*-*-*-*-*-*-*-*-*-*-*-*-*-*-*-*-*-*-*-*-*-*-*-*-*-*-*-*-*-*-*-*-*-*-*-*-*|*-*-*-*-
c
        subroutine plotit(rla,rlo,brgid,az,dst,rinc,xrnm,itproj,iacept)
c
c       Note:  arguments  rinc,itproj,iacept are no longer used.
        character*2 brgid
        real slat(2),slon(2),plat(361),plon(361)
        logical invali
        common /invali/invali
        common /pie/ pie,tpie,pio2,pio4
c
        logical nolobx
        common /nolobx/ nolobx
c
c
        if (abs(az).gt.pie)  az = az - sign(tpie,az)
        call llplxy(rlo,rla,1,x,y,nout)
c
c       Skip plotting of stations over the horizon or unlabeled.
        if ((.not.invali) .and. (.not.nolobx)) then
           if (xrnm .gt. 2000.) then
              size = 4.
              box = 2.
           else
              if (xrnm .gt. 1000.) then
                 size = 5.
                 box = 3.
              else
                 size = 6.
                 box = 5.
              endif
           endif
c
c          Draw box around location of DF station
           call jlstyl (0)
           call jmove (x-box,y-box)
           call jdraw (x+box,y-box)
           call jdraw (x+box,y+box)
           call jdraw (x-box,y+box)
           call jdraw (x-box,y-box)
c
c          Label the box with the bearing ID (station).
           if(abs(az).gt.1.57) then
              xx = x - box - 1.
              yy = y + box + 3.
           else
              xx = x - box - 2.
              yy = y - box - size - 3.
           endif
           call jmove (xx,yy)
           call jsize (size,size)
c           call jltext (2,brgid)
           call mytext (2,brgid)
        endif
c
c       Generate a great circle polyline along line of bearing.
        slat(1) = rla
        slon(1) = rlo
        call da2ll(slat(1),slon(1),dst,az,slat(2),slon(2))
        call ll2gc(slon,slat,2,361,plon,plat,npts)
c
c       Draw polyline with clipping.
        call blplin(plon,plat,npts)
c
        return
        end
```

```
C+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                      PLOTON
C
C FUNCTIONAL DESCRIPTION:         .
C
C CALLED BY:                      TRKCON
C
C PROGRAMMER:                     DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*|*-*-*-*-

        subroutine ploton

c this routine makes visible all the currently active segments within the
c fade time
c programmer: avw

        integer            curseg(260)
        integer            lctrak
        integer            loc
        integer            ltypov (16)
        integer            mrkcnt
        integer            numrcs
        integer            tfaddx
        integer            tfadtm
        integer            tkoset
        integer            tnewst
        integer            toldst
        integer            trklst(260)
        integer            trkndx (1000)

        logical            ltonov (16)
        logical            rankt (26, 16)
        logical            segact (1000)
        logical            spprsd (1000)
        logical            boxvis(260)
        logical            trackn

        character*2        actmrk(260)
        character*9        boxdtg(260)
        character*160       trkrec (1000)

        common /trkdbc/    trackn
        common /actmrk/    trklst, mrkcnt, actmrk, curseg,
     +                     boxdtg, boxvis
        common /maptoo/    ltypov, ltonov, rankt
        common /numrcs/    numrcs
        common /segact/    segact
        common /spprsd/    spprsd
        common /tarbou/    tnewst, toldst
        common /tfadez/    tfaddx, tfadtm
        common /tkoset/    tkoset
        common /trkndx/    trkndx
        common /trkrec/    trkrec

        data lctrak        /3/

        if (trackn) then
           print *, 'enter ploton:'
           print *, '   tfaddx = ', tfaddx
        end if

        ltonov(lctrak) = .true.

        if (tfaddx .ne. 0) then
           loc = tfaddx
   10      continue
           if (.not. spprsd(trkndx(loc))) then
              if (segact(trkndx(loc))) then
                 call jvisbl (trkndx(loc)+tkoset, 1)
              else
                 call seghnd (trkndx(loc)+tkoset, trkrec(trkndx(loc)))
                 segact(trkndx(loc)) = .true.
              end if
```

```
         end if
         if (loc .eq. tnewst) then
            go to 20
         else
            loc = mod (loc, numrcs) + 1
              go to 10
           end if
        end if

   20   continue

c       turn on the boxes around the most current point of
c       each track if it is within the fade time and it is
c       not suppressed. (jit)

        do 30 i = 1,mrkcnt
           if (boxvis(i)) then
              call jvisbl(curseg(i), 1)
           endif
   30   continue
c
        if (trackn) then
           print *, 'exit ploton:'
           print *, '   tfaddx = ', tfaddx
        end if

        return
        end


C+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                      PLOTOV
C
C FUNCTIONAL DESCRIPTION:         .
C
C CALLED BY:                      PLTDAT, PLTOVP
C
C RESTRICTIONS:                   This subroutine can omit overlays in azimuthal
C                                 projections with horizon.  Needs a proper clip.
C
C PROGRAMMER:                     DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*|*-*-*-*-
c
        subroutine plotov (lat,nsi,lon,ewi,marknm,
     +      rsize,placen,linsym)
c
c       plot an overlay point and name on the current map at lat/lon
c       lat/lon are in d/m/s format as an integer*4
c
        real x
        real y
        character linsym
        character nsi,ewi
        character*80 placen
        character*80 string
        character*80 tmpstr
        integer iacept
        integer*4 lat,lon
        integer*4 marknm
        integer mrkbeg
        integer mrkend
        logical draw
        logical isinv
        logical newons
        logical map
        common /mapdbc/ map

        real oldx, oldy
        logical oldons,oldinv
        common /oldxy/ oldx,oldy,ixop,iyop,oldons,oldinv
        real plo(2),pla(2),gcplo(1200),gcpla(1200)
        common /savpln/ plo,pla
```

```
      real*8 dtor,stor
      common /dtor/ dtor,stor
      logical invali
      common /invali/ invali
      dimension ltypov(16)
      logical ltonov(16),rankt(26,16)
      common /maptoo/ ltypov,ltonov,rankt
      logical lton(16),dotem
      integer ipgrid(4),ltyptb(16)
      common /map/ XRNM,XC,YC,LEVEL,CLAT,CLON,XRAD,YRAD,ITPROJ,
     +     IRES,LTYPTB,LUNDAT,LUNIND,LUNLIN,LTON,IPGRID,DOTEM,
     +     ORHALT

      data mrkbeg /10/
      data mrkend /11/
      data lcover /1/
c
      if (map) then
          print*,'plotov -- ',XRNM,XC,YC,LEVEL,CLAT,CLON,XRAD,
     +     YRAD,ITPROJ,IRES,LTYPTB,LUNDAT,LUNIND,LUNLIN,LTON,
     +     IPGRID,DOTEM,ORHALT
      endif
      draw = .false.
      if (xrnm .gt. 2000) then
          sizef = 8.
      else if (xrnm .le. 2000 .and. xrnm .gt. 1000) then
          sizef = 10.
      else
          sizef = 12.
      endif
          call lltor (lat,lon,nsi,ewi,plat,plon)
          call invtes (plat,plon,isinv)
c          print*,'plotov -- ',lat,nsi,lon,ewi,plat,plon,
c     +     isinv,'  ',placen
          if (isinv) then
             plo(1) = plon
             pla(1) = plat
          else
              call lltoxy (plat,plon,x,y)
              if (map) print*,'plat,plon,x,y=',plat,plon,x,y
              if (linsym.eq.'s'.or.linsym.eq.'S') then
                  draw = .true.
                  oldx = x
                  oldy = y
                  plo(1) = plon
                  pla(1) = plat
              else if (linsym.eq.'d'.or.linsym.eq.'D') then
                  draw = .true.
                  plo(2) = plon
                  pla(2) = plat
c                 Convert line segment into a great circle polyline.
                  call ll2gc(plo,pla,2,1200,gcplo,gcpla,nverts)
c                 Draw breakline clipped polyline to current point.
                  call blplin(gcplo,gcpla,nverts)
                  plo(1) = plo(2)
                  pla(1) = pla(2)
                  oldx = x
                  oldy = y
              else if (linsym.eq.'e'.or.linsym.eq.'E') then
                  read(placen, 10120) sma, smi, dazi,tmpstr
10120             format(3f8.0,a)
                  placen = ' '
                  placen = tmpstr
                  call drawel(plat,plon, sma, smi, dazi)
              else if (linsym.eq.'b'.or.linsym.eq.'B') then
                  linsym = 'b'
                  read (placen,10110,err=120) dazi,iacept,string
10110             format(f7.0,1x,i1,1x,a70)
                  razi = dazi * dtor
                  placen = string
                  call drwlob (plat,plon,razi,'  ',xrnm,
     +                         itproj,iacept)
                  go to 125
  120             continue
```

```
                  print*,'Error in conversion of bearing azimuth',
     +            placen
 125            continue
              endif
              call lltoxy (plat,plon,x,y)
              call clipxy (x,y,newons)
              if(newons.and..not.invali) then
                  if (rsize.lt..1) rsize = 1.
                  size = rsize * sizef
                  call jsize (size*.8,size)
c
c****             if tracking is being plotted, put up the 2 letter marker
c****             found in the placen string
c
                  if (linsym .eq. 't') then
                          size = rsize * 8.
                          call jsize(size,size)
                          call jmove(x-1.,y-1.2)
                          call jlstrg(placen(mrkbeg:mrkend))
                          placen = ' '
                  else if (.not.draw.or.marknm.ge.1) then
                      if (marknm.ge.1.and.marknm.le.15)
     +                then
                          marker = marknm
                          call jcmark (marker)
                          call jmark(x,y)
                      else
c
c if markernumber > 15, assume this is an icon file to be displayed
c
                          size = rsize * (sizef / 6.)
                          call geticn(ltypov(lcover),ltypov(lcover),
     +                                size,size,x,y,marknm,2,0.0)
                      endif
                  endif
                  call lngth (placen,80,len)
                  if (len.gt.0) then
                      if (linsym.eq.'b'.and.dazi.lt.180.) then
                          call jjust (3,2)
                          ioffs = -5
                      else
                          call jjust (1,2)
                          ioffs = 5
                      endif
                      call jmove (x + ioffs,y)
                      call jlstrg (placen(1:len))
                  endif
              endif
          endif
c
        return
        end


C+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    PLTCIT
C
C FUNCTIONAL DESCRIPTION:       .
C
C CALLED BY:                    DMAPII
C
C PROGRAMMER:                   DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*|*-*-*-*-

        subroutine pltcit (xrnm,citfil,lenctf)

c       this subroutine opens the cities file and plots it

        character*50 mapath
        common /mapath/ mapath
        common /lenmap/ lenmap
        character*80 citfil
        character*100 filen
```

```
      logical interr
      common /interr/ interr
      logical invali
      common /invali/ invali
      logical newons,isinv
      character nsi,ewi
      character*35 name
      character*35 string
      character*4 pnab
      integer*4 lat,lon
      logical pnatmp
      logical pnabon
      common /pnabon/ pnabon

      real llconv

      data pnabon/.true./
      data nxpc/80/
      data lunnam/16/
      DATA ICNAME/7/
c     factor is the value to divide xrnm by to limit the cities displayed
c     by population
      data factor/10./
c     ioffs is the offset from the marker to the pnab
      data ioffs/3/
c
      len = lenctf + lenmap
      if(lenmap .gt. 0) then
           filen = mapath(1:lenmap) // citfil(1:lenctf)
      else
           filen = citfil(1:lenctf)
      endif
c     print*,'pltcit -- ',len,'  ',filen(1:len)
      open(unit=lunnam,file=filen(1:len),status='old',
     +  err=185)
      rewind(lunnam)
      call jsize (7.,7.)
      call jjust (2,1)
      CALL JFONT(1)
      CALL JGAP(0.)
      CALL JPATH(1)
      CALL JBASE(1.,0.,0.)
      CALL JPLANE(0.,1.,0.)
  100 continue
          call chint (interr,ch)
          if (interr) go to 190
          read(lunnam,1110,err=181,end=190) pnab,lat,nsi,lon,ewi,
     +    ipop,marker,name
 1110     format (a4,1x,i6,a1,i7,a1,i5,1x,i1,1x,a35)
c         skip record if population is too small *****
          if (ipop.lt.xrnm/factor.and.marker.ne.4) go to 100
          call tocaps(nsi,1)
          isign = 1
          if (nsi.eq.'S') isign = -1
          plat = llconv(real(lat),isign)
          call tocaps(ewi,1)
          isign = 1
          if (ewi.eq.'W') isign = -1
          plon = llconv(real(lon),isign)
c          call lltord (lat,lon,nsi,ewi,plat,plon)
          call invtes (plat,plon,isinv)
          if (.not.isinv) then
              call lltoxy (plat,plon,x,y)
              call clipxy (x,y,newons)

          if(newons.and..not.invali) then
              if (pnabon.and.pnab.eq.'....') then
                  pnatmp = .false.
              else
                  pnatmp = pnabon
              endif
              if (pnatmp) then
                  string = pnab
                  lenstr = 4
```

```
                else
                    call length (name,35,lenstr)
                    string = name(1:lenstr)
                endif
                if (marker.gt.1.and.marker.le.15) then
                    mark = marker
                else
                    mark = 1
                endif
                call jcmark (mark)
                call jmark (x,y)
                if (lenstr.gt.0) then
                   CALL JMOVE(X+IOFFS,Y)
                   CALL JHSTRG(string(1:LENSTR))
                ENDIF
            endif
        endif
        go to 100
 181    continue
        print*,'read error on cities file'
        go to 190
 185    continue
        print*,'pltcit -- Error on open of cities file',len,
     +  '  ',filen(1:len)
 190    continue
        call jjust (1,1)
        close(lunnam)
c
        return
        end


C+*+*+*+*+*+*+*+*+*+*+*+*+*+*+*+*+*+*+*+*+*+*+*+*+*+*+*+*+*+*+*+*+*+*|*+*+*+*+
C UNIT NAME:                        PLTDAT
C
C FUNCTIONAL DESCRIPTION:           .
C
C CALLED BY:                        SEGHND
C
C PROGRAMMER:                       DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*|*-*-*-*-

        subroutine pltdat (trdata)

c  this subroutine sends a line of tracking data to be plotted on
c  the current map (originally called trakpt in /dsee/apollo)

        integer alat
        integer alon
        integer ipgrid(4)
        integer ires
        integer isign
        integer itproj
        integer latbeg, latend
        integer lonbeg, lonend
        integer level
        integer ltyptb(16)
        integer lundat
        integer lunind
        integer lunlin
        integer mrkrnr
        integer posit
        integer trkcol
        integer*4 track
        integer ltypov(16)
        integer lctrak

        real    clat
        real    clon
        real    dx
        real    dy
        real    orhalt
        real    rlat
        real    rlon
```

```
      real    rsize
      real    tmplat
      real    tmplon
      real    xc
      real    xllgvp
      real    xrad
      real    xrnm
      real    xurgvp
      real    yc
      real    yllgvp
      real    yrad
      real    yurgvp

      character*1       ewi
      character*1       linsym
      character*1       nsi
      character*7       lat
      character*8       lon
      character*160     trdata
      character*80      timbuf
      character*9       tmpdtg
      character*2       marker

      logical  lton(16)
      logical  dotem
      logical  isinv
      logical  exist
      logical  ltonov(16)
      logical  rankt(26,16)
      logical  trackn
c
c     llconv is a latlon conversion function

      real    llconv
c   exist is set in subroutine getmark depending on whether or not
c   the track already exists, or is newly created.
c   posit is the position of the track in the table.

      common /trkdbc/   trackn
      common /comgvp/   xllgvp, yllgvp, xurgvp, yurgvp
      common /map/      xrnm, xc, yc, level, clat, clon, xrad, yrad,
     +                  itproj, ires, ltyptb, lundat, lunind, lunlin,
     +                  lton, ipgrid, dotem, orhalt

      integer qdsdev,qpydev,qecho,qlecho
      common /device/ qdsdev,qpydev,qecho,qlecho
      common /maptoo/ ltypov, ltonov, rankt

      logical oneflg
      common /oneflg/ oneflg

      logical last
      common /lstplt/ last

      data trkcol /224/
      data lctrak /3/

      if (trackn) print *, 'enter pltdat,trdata=',trdata

      read (trdata, 45, err=200) linsym
   45 format (a1)

c ----- ignore comments and amplification lines in input text

      if (linsym .eq. ' ' ) then
c
c        reset linsym to signify tracking data
c
         linsym = 't'
c
c        new variables: track, alert, pddg, series, repnum
c
         read (trdata, 50, err=200)
     +           alat, nsi,alon, ewi,track,timbuf
```

```
   50       format (2x, i6, a1, i7, a1, i4, a9)
c
c           get the marker for this plot
c           JIT: add parameter timbuf to be used in fade time routines.
c
            call getmark(track, marker, posit, exist,timbuf(1:9))
            tmpdtg = timbuf(1:9)
c
c           put marker into timbuf after the date/time group
c           to be used in the plotting of this track
c
            timbuf(10:11) = marker
c
            rsize = 1.5
c
c           convert alat and alon to character, then convert to radians
c
            if (nsi .eq. 'N' .or. nsi .eq. 'n') then
                isign = 1
            else
                isign = -1
            endif
            tmplat = alat
            rlat = llconv(tmplat, isign)
            if (ewi .eq. 'E' .or. ewi .eq. 'e') then
                isign = 1
            else
                isign = -1
            endif
c
c           Check to see if this plot is visible on the current map.
c
            tmplon = alon
            rlon = llconv(tmplon, isign)
            call invtes(rlat,rlon,isinv)


            if ( .not. isinv .and. ltonov(lctrak)) then
c
c              this is true white on the color node
c
               call xcolor (trkcol)
c
c              set the pick aperture to a very small size for the plot
c
               dx = .0003
               dy = .0003
               call jpkapr(qdsdev,qpydev,dx,dy)
               call plotov (alat, nsi, alon, ewi, mrkrnr, rsize, timbuf,
     +              linsym)
c
c   split off the latitude and longitude values from the
c   tracking data line, and then pass these values to boxseg.
c
               latbeg = 3
               latend = 9
               lonbeg = 10
               lonend = 17
               lat = trdata(latbeg:latend)
               lon = trdata(lonbeg:lonend)

c
c              jrclos is used to close the segment which is opened in
c              the segment-handler routine.  this segment will redundantly be
c              closed when control returns to the segment-handler routine.
c
               call jrclos
c
               if (.not.(oneflg)) call curbox(lat, lon,
     +                                   posit,exist,tmpdtg)
          endif
      end if
      go to 250
```

```
200   print *, 'error in overlay read in pltdat routine'
      go to 250

210   print *, 'error in overlay write in pltdat routine'
250   continue

      if (trackn) print *, 'exit pltdat'

      return
      end


C+*+*+*+*+*+*+*+*+*+*+*+*+*+*+*+*+*+*+*+*+*+*+*+*+*+*+*+*+*+*+*+*+*|*+*+*+*+
C UNIT NAME: pltnam
C
C FUNCTIONAL DESCRIPTION:  THIS SUBROUTINE READS THE NAME LIMITS FILE AND PLOTS
C
C INPUT FILES/PARAMETERS:
C
C GLOBAL VARIABLES : NONE.
C
C OUTPUT FILES/PARAMETERS:  NONE.
C
C SUBROUTINES/FUNCTIONS CALLED :
C
C CALLED BY:                      NAMLIM
C
C LOCAL VARIABLES: NONE.
C
C RESTRICTIONS: NONE.
C
C ABNORMAL RETURN CONDITIONS:     NONE.
C
C LOCATION:
C
C PROGRAMMER:                     DATE OF LAST CHANGE    REASON FOR CHANGE
C
C     DAVE NATION                                        ORIGINAL CODE.
C     JERRY FENERTY                                      DOCUMENT AND MODIFY
C                                                        FOR A21 PROTOTYPE.
C
C-*-*-*-*-*-*-*-*-*-*-*-*-*-*-*-*-*-*-*-*-*-*-*-*-*-*-*-*-*-*-*-*-*-*|*-*-*-*-

        SUBROUTINE PLTNAM (LTON,XRNM)

C       THIS SUBROUTINE READS THE NAME LIMITS FILE AND PLOTS

        CHARACTER*1 CH
        LOGICAL INTERR
        COMMON /INTERR/ INTERR
        CHARACTER*20 NAME
        CHARACTER TYPEC
        LOGICAL LTON(16)
        INTEGER CHRLEN
        LOGICAL INVALI
        COMMON /INVALI/ INVALI
        LOGICAL IFRST,NEWONS,ISINV
        COMMON /NMLIM/ LUNNAM,AREAMN,AREAMX
        COMMON /CHSIZE/ XCHSIZ,YCHSIZ,XCHMIN,YCHMIN
c** featrs is common to drawf routine for drwing
c** area names without redrawing any boundries.
        logical featrs(16), indrwf
        COMMON /pltftr/ featrs, indrwf
        INTEGER   isecs,imins
        REAL      c,cs
        COMMON    /c/ c,isecs,cs,imins

        DATA NXPC/80/
        DTORAD=C*60.

        AREAMN = XRNM/250.

        IF (AREAMN.LT.5) AREAMN = 0.
```

```
      REWIND(LUNNAM)
      NNAMS=0
      IFRST=.TRUE.

      IF (XRNM .GT. 2000) THEN
          SIZE = 8.
      ELSE IF (XRNM .LE. 2000 .AND. XRNM .GT. 1000) THEN
          SIZE = 10.
      ELSE
          SIZE = 12.
      ENDIF

C      CALL JSIZE (SIZE*.8,SIZE)
C      CALL JJUST (2,1)

      call jsize (7.,7.)
      call jjust (2,1)
      CALL JFONT(1)
      CALL JGAP(0.)
      CALL JPATH(1)
      CALL JBASE(1.,0.,0.)
      CALL JPLANE(0.,1.,0.)

 100  CONTINUE

          CALL CHINT (INTERR,CH)

          IF (INTERR) GO TO 190

          READ(LUNNAM,1110,ERR=182,END=190) NAME(1:20),RLATL
     +    ,RLATH,RLONL,RLONH,
     +    CLAT,CLON,DLAT,DLON,TYPEC
 1110     FORMAT(A20,2(F5.1,1X),6(F6.1,1X),A1)

C         do not plot aliases

          if(typec.eq.'A') go to 100

C         NO STATE IF NOT ON

          if (indrwf) then
             if(TYPEC.EQ.'S'.AND..NOT.featrs(3)) GO TO 100
          else
             if(TYPEC.EQ.'S'.AND..NOT.LTON(3)) GO TO 100
          endif

C         no country if not on

          if (indrwf) then
             if(typec.eq.' '.and..not.featrs(2)) go to 100
          else
             if(typec.eq.' '.and..not.lton(2)) go to 100
          endif

c         no continents if countries or states on

          if (indrwf) then
             if(typec.eq.'C'.and.(featrs(2).or.featrs(3))) go to 100
          else
             if(typec.eq.'C'.and.(lton(2).or.lton(3))) go to 100
          endif

          IF(TYPEC.EQ.'M'.AND..NOT.LTON(12)) GO TO 100

          PLAT=CLAT*DTORAD
          PLON=CLON*DTORAD
          CALL INVTES (PLAT,PLON,ISINV)

          IF (.NOT.ISINV) THEN

              CALL LLTOXY (PLAT,PLON,X,Y)
              CALL CLIPXY (X,Y,NEWONS)

              IF(NEWONS.AND..NOT.INVALI) THEN
```

```
          LEN=CHRLEN(NAME)
          AREA=DLAT*DLON*COS(PLAT)
          IF(AREA.GE.AREAMN.AND.AREA.LE.AREAMX) THEN

             CALL JMOVE(X,Y)
             CALL JHSTRG(NAME(1:LEN))

          ENDIF

        ENDIF
        ENDIF

        GO TO 100

  182   CONTINUE

c           PRINT*,'ERROR ON NAME LIMITS FILE'

  190   CONTINUE
        call jjust (1,1)

        RETURN
        END

C+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                   PLTOFF
C
C FUNCTIONAL DESCRIPTION:      .
C
C CALLED BY:                   TRKCON
C
C PROGRAMMER:                  DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*|*-*-*-*-

      subroutine pltoff

c this routine turns off all currently visible plots
c programmer: avw

      integer            curpos
      integer            curseg(260)
      integer            lctrak
      integer            ltypov (16)
      integer            mrkcnt
      integer            numrcs
      integer            tfaddx
      integer            tfadtm
      integer            tkoset
      integer            tnewst
      integer            toldst
      integer            trklst(260)
      integer            trkndx (1000)

      character*2        actmrk(260)
      character*9        boxdtg(260)

      logical            ltonov (16)
      logical            rankt (26, 16)
      logical            segact (1000)
      logical            boxvis(260)
      logical            trackn

      common /trkdbc/    trackn
      common /actmrk/    trklst, mrkcnt, actmrk, curseg,
     +                   boxdtg, boxvis
      common /maptoo/    ltypov, ltonov, rankt
      common /numrcs/    numrcs
      common /segact/    segact
      common /tarbou/    tnewst, toldst
      common /tfadez/    tfaddx, tfadtm
      common /tkoset/    tkoset
      common /trkndx/    trkndx
```

```
      data lctrak /3/

      if (trackn) print *,'enter pltoff: tfaddx=',tfaddx

      ltonov(lctrak) = .false.

      if (tfaddx .ne. 0) then
         curpos = tnewst
 10      continue
         if (segact(trkndx(curpos))) then
            call jvisbl (trkndx(curpos)+tkoset, 0)
         end if
         if (curpos .eq. tfaddx) then
            go to 20
         else
            curpos = curpos - 1
            if (curpos .eq. 0) then
               curpos = numrcs
            end if
         end if
         go to 10
      end if

 20   continue

c     make invisible the segments which
c     display the boxes around the current points
c     for each track.    (jit)

      do 30 i = 1,mrkcnt
        call jvisbl(curseg(i),0)
 30   continue
c
      if (trackn) print *,'exit pltoff: tfaddx = ',tfaddx

      return
      end


C+*+*+*+*+*+*+*+*+*+*+*+*+*+*+*+*+*+*+*+*+*+*+*+*+*+*+*+*+*+*+*+*+*|*+*+*+*+
C UNIT NAME:                    PLTOVP
C
C FUNCTIONAL DESCRIPTION:       .
C
C CALLED BY:                    DOVERL, FOVERL
C
C PROGRAMMER:                   DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*|*-*-*-*-

      subroutine pltovp (xrnm,ovfnam,lenovf)

c     this subroutine plots overlay data on the current map

      character linsym
      logical interr
      common /interr/ interr
      character*80 placen
      integer*4 lat,lon
      integer*4 marknm
      character nsi,ewi
      character*(*) ovfnam
      character*105 string
      character*16 platlon
      character*72 amptxt(4)
      integer ampcnt
      logical eliflg
      common /inpoly/inpoly
      common/ampprm/ampseg
      data lunnam/9/

c      print *,'pltovp -- enter  ovfnam ',ovfnam(1:lenovf)
      eliflg = .false.
      ampcnt = 0
```

```
      open(unit=lunnam,file=ovfnam(1:lenovf),err = 186,
     +  status = 'old')

C ----- Make sure all commands are sent to device
        CALL FLUSHB

        rewind(lunnam)
  100   continue
            read(lunnam,10100,err = 182,end=190) linsym,string
10100       format(a1,a105)
c            PRINT 10101,LINSYM,STRING(1:70)
c10101       format(1x,a1,a70)
            if (linsym.eq.'c'.or.linsym.eq.'C') then
c               ignore comment lines
            else if(linsym .eq. 'a' .or. linsym .eq. 'A') then
                if(ampcnt .lt. 4) then
                    ampcnt  = ampcnt + 1
                    amptxt(ampcnt)(1:72) = string(2:73)
                endif
            else
                read(string,10110,err = 182,end=190)
     +          lat,nsi,lon,ewi,marknm,rsize,placen
10110           format(1x,i6,a1,i7,a1,i3,f5.0,1x,a80)

             call plotov (lat,nsi,lon,ewi,marknm,
     +          rsize,placen,linsym)
                if(linsym .eq. 'e' .or. linsym .eq. 'E') then
                        eliflg = .true.
                        call readel(string,platlon)
                        if(ampcnt .lt. 4) then
                            ampcnt = ampcnt + 1
                            amptxt(ampcnt)=
     +                          platlon(1:8)//' '//platlon(9:16)
                        endif
                endif
            endif
            go to 100
  181   continue
            print*,'read error on overlay name file'
            go to 200
  182   continue
            print*,'decode error on overlay file'
            go to 200
  186   continue
            print*,'open error on overlay file ',ovfnam(1:lenovf)
            go to 200
  190   continue
c
c**** the following loop was added dec '86 to put amplification data
c**** in a separate area...LMA
        if (ampcnt .ge. 1) then
            call jrclos
            call drwamp(amptxt,ampcnt)
        endif
200     continue
        close (unit=lunnam)
c        print*,'pltovp -- exit  ampcnt',ampcnt
        return
        end


C+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                       PLTSUP
C
C FUNCTIONAL DESCRIPTION:          .
C
C CALLED BY:                       TRKCON
C
C PROGRAMMER:                      DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*|*-*-*-*-

      subroutine pltsup
```

```
c
c     suppress plots on screen by purging the seg
c     associated with that track.
c

      logical abort
      logical endlst
      logical found

      integer chkndx
      integer chkseg
      integer ibuttn
      integer lctrak
      integer pickid
      integer segnam

      logical spprsd(1000)
      common /spprsd/ spprsd
      logical segact(1000)
      common /segact/ segact
      integer qfb(26)
      integer qmb(4)
      common /butons/ qfb,qmb
      integer ltypov (16)
      logical ltonov (16)
      logical rankt (26, 16)
      common /maptoo/ ltypov, ltonov, rankt
      integer tkoset
      common /tkoset/ tkoset
      integer trkndx(1000)
      common /trkndx/ trkndx
      integer tfaddx
      integer tfadtm
      common /tfadez/ tfaddx, tfadtm
      character*160  trkrec (1000)
      common /trkrec/ trkrec
      integer tnewst
      integer toldst
      common /tarbou/ tnewst, toldst
      integer numrcs
      common /numrcs/ numrcs

      data lctrak  /3/

      if (.not. ltonov(lctrak)) then
         go to 1000
      end if

c
c      ask user to pick a track for suppression
c
      abort = .false.
 100  if (abort) goto 200
         if (tnewst .ne. 0) then
              call mesg(1238)
              call pick(ibuttn, segnam, pickid)
              if (ibuttn .ne. 8 .and. ibuttn .ne. qfb(26)) then
                   chkndx = tfaddx - 1
                   if (tfaddx .eq. 0) then
                      tfaddx = numrcs
                   end if
                   found = .false.
                   endlst = .false.
c
c                  search list until a segment match is found
c                  or the end of the list is reached
c
 150               if (found .or. endlst) goto 175
                        chkndx = mod(chkndx,numrcs) + 1
                        chkseg = trkndx(chkndx) + tkoset
                        if (chkseg .eq. segnam) then
                             found = .true.
                        else
                             if (chkndx .eq. tnewst) then
                                   endlst = .true.
```

```
                    endif
                endif
            goto 150
175         continue
c
c           if match is found, then purge that track from the display
c
            if (found) then
                call supbox(trkrec(trkndx(chkndx)))
                call jpurge(chkseg)
c
c    turn invisible the box around that plot, and set the
c    boolean flag for this box in boxvis array. (jit)
c

c
c               show that track is suppressed so that
c               when tracking is turned from off to on,
c               this guy won't come back up.
c
                spprsd(trkndx(chkndx)) = .true.
                segact(trkndx(chkndx)) = .false.
            endif
        else
            abort = .true.
        endif
    else
        abort = .true.
    endif
  goto 100
200 continue

1000 continue

     return
     end


C+*+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                     PLTUNS
C
C FUNCTIONAL DESCRIPTION:        .
C
C CALLED BY:                     TRKCON
C
C PROGRAMMER:                    DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*-*-*|*-*-*-*-

      subroutine pltuns

c this routine displays all currently visible tracks (all tracks within
c current fade time)
c programmer: avw

      integer           curpos
      integer           lctrak
      integer           ltypov (16)
      integer           numrcs
      integer           segnam
      integer           tfaddx
      integer           tfadtm
      integer           tkoset
      integer           tnewst
      integer           toldst
      integer           trkndx (1000)

      character*9       tfddtg
      character*160     trkrec (1000)

      logical           ltonov (16)
      logical           rankt (26, 16)
      logical           segact (1000)
      logical           spprsd (1000)
      logical           trackn
```

```
      common /trkdbc/   trackn
      common /maptoo/   ltypov, ltonov, rankt
      common /numrcs/   numrcs
      common /segact/   segact
      common /spprsd/   spprsd
      common /tarbou/   tnewst, toldst
      common /tfadez/   tfaddx, tfadtm
      common /tfddtg/   tfddtg
      common /tkoset/   tkoset
      common /trkndx/   trkndx
      common /trkrec/   trkrec

      character*2 actmrk(260)
      integer*4 mrkcnt
      integer*4 trklst(260)
      integer*4 curseg(260)
      character*9 boxdtg(260)
      logical boxvis(260)
      common /actmrk/ trklst,mrkcnt,actmrk,curseg,
     +                boxdtg,boxvis

      data lctrak       /3/

      if (trackn) print *,'enter pltuns: tfaddx = ',tfaddx

      if (.not. ltonov(lctrak)) then
         go to 30
      end if

      ltonov(lctrak) = .true.
      if (tfaddx .eq. 0) then
         call mesg (1236)
         call paws
         return
      end if

      do 40 i = 1, mrkcnt
         if (boxdtg(i) .ge. tfddtg) then
c              print *, 'i / boxdtg(i) are', i, boxdtg(i)
c              print *, 'curseg(i) is ', curseg(i)
             boxvis(i) = .true.
         endif
   40 continue

      curpos = tfaddx
   10 continue
      if (segact(trkndx(curpos))) then
         call jvisbl (trkndx(curpos)+tkoset, 1)
      else
         segnam = trkndx(curpos) + tkoset
         call seghnd (segnam, trkrec(trkndx(curpos)))
         segact(trkndx(curpos)) = .true.
         spprsd(trkndx(curpos)) = .false.
      end if
      if (curpos .eq. tnewst) then
         go to 20
      else
         curpos = mod (curpos, numrcs) + 1
         go to 10
      end if

   20 continue
   30 continue
c
c   make all boxes visible again if they are within the
c   fade time.
c
c       print *, 'tfddtg is ', tfddtg

      if (trackn) print *,'exit pltuns: tfaddx = ',tfaddx

      return
      end
```

```
C+++++++++++++++++++++++++++++++++++++++++++++++++++++++++++++++++++|+++++++
C UNIT NAME:                    PMAINMN
C
C FUNCTIONAL DESCRIPTION:       .
C
C CALLED BY:                    FMAIN
C
C PROGRAMMER:                   DATE OF LAST CHANGE    REASON FOR CHANGE
C
C-*-*-*-*-*-*-*-*-*-*-*-*-*-*-*-*-*-*-*-*-*-*-*-*-*-*-*-*-*-*-*-*-*-*|*-*-*-*-

        subroutine pmainmn
        return
        end


C+++++++++++++++++++++++++++++++++++++++++++++++++++++++++++++++++++|+++++++
C* UNIT NAME:                    popst
C*
C* FUNCTIONAL DESCRIPTION:
C*
C*       This subroutine pops a menu number off a stack.
C*
C* INPUT FILES/PARAMETERS:
C*
C*     Global Variables
C*
C*       qmloc           integer; contains the current location in the
C*                                stack
C*       qnextm          integer; contains the number of the next menu
C*                                to be displayed
C*       qstack    integer array; contains menu numbers of previous
C*                                menus displayed
C*
C* OUTPUT FILES/PARAMETERS:
C*
C*       values in global variables above, in particular the new value
C*       placed in the variable qnextm
C*
C* RESTRICTIONS:
C*
C*      The value in the variable qmloc must not be less than the
C*      minimum array size of the array qstack.
C*
C* SUBROUTINES CALLED:
C*
C*       mesg            subroutine; places an appropriate message
C*                                   in the communications area
C*
C* CALLED BY:                    MHAND
C*
C* LOCAL VARIABLES:
C*
C*       no local variables
C*
C* ABNORMAL RETURN CONDITIONS:
C*
C*      A system error will occur if the value in the variable qmloc is
C*      below the minimum array size of the array qstack.
C*
C* LOCATION:
C*
C*       /u2/vcn/a21proto/popst
C*
C* PROGRAMMER:               DATE OF LAST CHANGE:    REASON FOR CHANGE:
C*
C* VCNewton                   15 August 1983          initial entry
C*
C-*-*-*-*-*-*-*-*-*-*-*-*-*-*-*-*-*-*-*-*-*-*-*-*-*-*-*-*-*-*-*-*-*-*|*-*-*-*-

      Subroutine POPST

C     This subroutine pops a menu number off a stack.
```

```
C        (**Declare common blocks and common block variables**)
         Integer qmloc,qnextm,qstack(10)
C        (**The next 2 lines are coded so the variable qnextm can be**)
C        (**used in this routine, all other variables in the next 2 **)
C        (**lines of code are not used                              **)
         Logical qcancl,qext2m,qretrn,qstmnu
         Common /b1/ qcancl,qext2m,qretrn,qstmnu,qnextm
         Common /b2/ qstack
         Common /b4/ qmloc
C        (**Pop the stack if qmloc is not below the minimum array size*)
c        print*,'POPST -- enter   qmloc = ',qmloc
         If (qmloc .ge. 1) Then
C           (**Set qnextm to the next menu to be displayed**)
            qnextm=qstack(qmloc)
C           (**Simulate popping an item off a stack**)
            qmloc=qmloc - 1
         Else
C           (**When qmloc is too low **)
C           (**Execute system error process**)
            Call MESG(210)
            call paws
C           Exit process storing variables and keeping the current
C           screen for later debugging
         ENDIF
      End


C++*+*+*+*+*+*+*+*+*+*+*+*+*+*+*+*+*+*+*+*+*+*+*+*+*+*+*+*+*+*+*+*+*+*|*+*+*+*+
C UNIT NAME:                        PROCOV
C
C FUNCTIONAL DESCRIPTION:           .
C
C CALLED BY:                        FDFPRO
C
C PROGRAMMER:                       DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*|*-*-*-*-

        subroutine procov (mparms,ierror,ovfnam,lenovf)
c
c       this subroutine calculates the geographic limits of the current
c       overlay data file
c
        character linsym
        character ch
        logical interr
        common /interr/ interr
        character*80 placen
        character*(*) ovfnam
        integer*4 lat,lon
        integer*4 marker
        character nsi,ewi
        real mparms(4)
        logical frstim
        character*105 string
        data lunnam/16/
c
        ierror = 0
        frstim = .true.
        open(unit=lunnam,file=ovfnam(1:lenovf),err = 186,
     +  status = 'old')
c
c       print*,'procov -- enter '
        rewind(lunnam)
  100   continue
            call chint (interr,ch)
            if (interr) go to 190
            read(lunnam,10100,err = 182,end=190) linsym,string
10100       format(a1,a105)
c           print*,'procov : ',linsym,string
c           *** ignore comment lines ***
            if (linsym.eq.'c'.or.linsym.eq.'C') go to 100
            read(string,10110,err = 182,end=190)
     +      lat,nsi,lon,ewi,marker,rsize,placen
10110       format(1x,i6,a1,i7,a1,i3,f5.0,1x,a80)
```

```
c           insure this is not a blank line
            if (nsi.ne.' ') then

                call lltor (lat,lon,nsi,ewi,plat,plon)

                if (frstim) then
                    frstim = .false.
                    ierror = 0
                    rminla = plat
                    rmaxla = plat
                    rminlo = plon
                    rmaxlo = plon
                else

                    if (plat.lt.rminla) then
                        rminla = plat
                    else if (plat.gt.rmaxla) then
                        rmaxla = plat
                    endif

                    if (plon.lt.rminlo) then
                        rminlo = plon
                    else if (plon.gt.rmaxlo) then
                        rmaxlo = plon
                    endif

                endif

            endif
            go to 100

 181    continue
            print*,'read error on overlay name file'
            ierror = 2
            go to 190

 182    continue
            print*,'decode error on overlay file'
            ierror = 3
            go to 190

 186    continue
            print*,'open error on overlay file ',ovfnam(1:lenovf)
            ierror = 4

 190    continue

        close (unit=lunnam)
        mparms(1) = rminla
        mparms(2) = rmaxla
        mparms(3) = rminlo
        mparms(4) = rmaxlo
c       print*,'pltovp -- exit',mparms,ierror
c
        return
        end

C+*+*+*+*+*+*+*+*+*+*+*+*+*+*+*+*+*+*+*+*+*+*+*+*+*+*+*+*+*+*+*+*+*+*+*+*+*|*+*-*+*+
C UNIT NAME: PROCPO
C
C FUNCTIONAL DESCRIPTION:  DISPLAYS THE NEXT POINT.
C
C INPUT FILES/PARAMETERS:
C
C       NEWSEQ              LOGICAL     INDICATES IF POINT IS PART OF NEW
C                                       SEQUENCE OF POINTS.
C
C       NEWONS              LOGICAL     INDICATES WHETHER POINT IS ON SCREEN.
C       X                   REAL        X COORDINATE.
C       Y                   REAL        Y COORDINATE.
C
C GLOBAL VARIABLES : NONE.
C
C OUTPUT FILES/PARAMETERS:  NONE.
C
```

```
C SUBROUTINES/FUNCTIONS CALLED :
C
C       FPOSIT               POSITIONS POINT X,Y.
C       FDRAWV               DRAWS VECTOR TO X,Y.
C
C CALLED BY:                 GRDLAT, GRDLON
C
C LOCAL VARIABLES: NONE.
C
C RESTRICTIONS: NONE.
C
C ABNORMAL RETURN CONDITIONS:  NONE.
C
C LOCATION:                  /a21/gjf/MAPSRC.FTN
C
C PROGRAMMER:                DATE OF LAST CHANGE     REASON FOR CHANGE
C
C     DAVE NATION                                    ORIGINAL CODE.
C     JERRY FENERTY                                  DOCUMENT AND MODIFY
C                                                    FOR A21 PROTOTYPE.
C
C-*-*-*-*-*-*-*-*-*-*-*-*-*-*-*-*-*-*-*-*-*-*-*-*-*-*-*-*-*-*-*-*-*-*-*|*-*-*-*-

       SUBROUTINE PROCPO (NEWSEQ,NEWONS,X,Y)

C      THIS SUBROUTINE DISPLAYS THE NEXT POINT

       LOGICAL NEWSEQ,NEWONS

       IF (NEWSEQ) THEN

           NEWSEQ=.FALSE.
           CALL FPOSIT(X,Y)

       ELSE

           CALL FDRAWV(X,Y)

       ENDIF

       RETURN
       END


C++++++++++++++++++++++++++++++++++++++++++++++++++++++++++++++++++++++|+++++++
c  UNIT NAME:                 prompt
c
c  Functional Description:    Subroutine to display a message and get
c                              user keyboard input.
c
c  Input Files/Parameters:    N/A
c
c  Output Files/Parameters:   N/A
c
c  Subroutines/Functions Called:
c      mesg                   displays messages in the communica-
c                              tions area
c      keybd                  gets user's keyboard input (max of 80 chars)
c
c
c  Called By:                 FANNOT, FCHSCA, FOVERL, FSHOWA, GETCMD
C                             LLCENT, RESCON, SAVDIS, SUBCHK
C                             WRITEX, FDFPRO
c
c  Local Variables:
c      maxlen               integer   maximum length of input wanted
c                                       (80 or less characters)
c      actlen               integer   actual length of input recieved
c      msgno                integer   number of message to be displayed
c      input                character string of user's keyboard input
c
c  Restrictions: Maximum of 80 characters for string input
c
c  Abnormal Return Conditions:  N/A
c
```

```
c  Location:   /a21/dave
c
c  Programmer        Date of Last Change      Reason for Change
c     bam             October 27, 1983
c     dab             September 20, 1984       Apollo modification
c  L McCleary         Jan 1988                sep amp & sys - prompt
c
c  Work still to be done:
c
C-*-*-*-*-*-*-*-*-*-*-*-*-*-*-*-*-*-*-*-*-*-*-*-*-*-*-*-*-*-*-*-*-*-*-*|*-*-*-*-
c
        subroutine prompt(msgno,input,maxlen,actlen)
c
c       prompt the user with a message and wait for a response from keyboard
c

        integer qdsdev,qpydev,qecho,qlecho
        common /device/ qdsdev,qpydev,qecho,qlecho

        common/comwdo/qcxmn,qcymn,qcxmx,qcymx
        real      qcxmn,qcymn,qcxmx,qcymx


        character *(*) input
        integer msgno,maxlen,actlen
        logical sys
        common /sysdbc/ sys
c
        if (sys) print*,'prompt -- enter ',msgno,maxlen
        call mesg(msgno)
c --- added by Steve Pierce to force input not to echo over
c     message as requested by Pam. 7/18/85
        call comwin
        call comvpt
c        call jconwv(qcxmn+1.,qcymx - 5.,0.,vx,vy)
        call jconwv(qcxmn+1., 1.5, 0., vx,vy)
        call jpecho (qdsdev,4,qpydev,vx,vy)
c ----
        call keybs(maxlen,input,actlen)
        if (sys) then
            if (actlen.gt.0) print*,'    ',input(1:actlen)
            print*,'prompt -- exit ',actlen
        endif
c
        return
        end

C+*+*+*+*+*+*+*+*+*+*+*+*+*+*+*+*+*+*+*+*+*+*+*+*+*+*+*+*+*+*+*+*+*+*+*|+*+*+*+
C UNIT NAME:                       PRTMEN
C
C FUNCTIONAL DESCRIPTION:          HANDLES MENU CHOICES FOR HARDCOPY PRINTOUT
C                                  OF FULL SCREEN OR PRESENT DISPLAYS
C
C INPUT FILES/PARAMETERS:
C
C
C OUTPUT FILES/PARAMETERS:         NONE
C
C SUBROUTINES/FUNCTIONS CALLED
C       HILITE             MENU CHOICE HILIGHTER
C       JVPORT             DRAWS NEW VIEWPORT
C       DRAWM              DRAWS MENU
C       JWINDO             CREATES NEW VIEWPORT PARAMETERS
C       MPICK              SUBROUTINE FOR PICKING MENU CHOICES
C       PRINTR             PRINTOUT CREATION/EXECUTION
C       MESG               MESSAGE DISPLAYER
C
C CALLED BY:                          CHECK
C
C VARIABLES:
C
C        PRTCHOI            TWO ELEMENT ARRAY, FIRST FOR SCREEN DISPLAY
C                                INDICATION, VALUES ARE:
C                               1 - FOR PRESENT DISPLAY
C                               2 - FOR FULL SCREEN
```

```
C                          SECOND FOR PRINTER TYPE, VALUES ARE:
C                             3 - FOR DOT MATRIX
C                             4 - FOR LASER
C                             5 - FOR INK JET
C                             6 TO 8 - FOR CALCOMP PLOTS
C
C RESTRICTIONS:        APOLLO  DEPENDENT SUBROUTINE
C
C     WRITTEN FOR THE CURRENT DEVICE DRIVER OF THE ACT II PRINTER
C     IF CHANGES TO DEVICE DRIVER WILL NEED TO CHANGE SOME PARAMETERS
C     BEING PASSED TO INTCOL AND/OR EXECOM
C
C ABNORMAL RETURN CONDITIONS:   N/A
C
C
C PROGRAMMER:                   DATE OF LAST CHANGE     REASON FOR CHANGE
C
C     RKDISBR                        14/04/87             INITIAL ENTRY
C
C-*-*-*-*-*-*-*-*-*-*-*-*-*-*-*-*-*-*-*-*-*-*-*-*-*-*-*-*-*-*-*-*-*-*-*-*-*-*|*-*-*-*-
C
      subroutine prtmen

c      print menu segment

      integer ibuttn,ichoic
      common /commvp/ xllmvp,yllmvp,xurmvp,yurmvp
      integer prtchoi(2),hilchoi(2)
      common /prtchoi/ prtchoi
      integer mtable(42),lentab

      common/b1/qcancl,qext2m,qretrn,qstmnu,qnextm
      integer qnextm
      logical qcancl,qext2m,qretrn,qstmnu,error,rflag
      common/b6/qcrmnu
      integer qcrmnu,pmenu,pmsg
      common /pmenu/ pmenu,pmsg
      common /isegn/ isegn
      common /msgold/ msgold,msgonm

      data mtable/0,0,0,0,1,1,0,2,0,0,0,0,3,0,4,0,5,0,0,0,6,0,7,0,8,
     +          0,0,0,9,0,0,0,0,0,0,0,0,0,0,0,0,0/

      data lentab/38/
      data hilchoi/1,3/
      data prtchoi/1,3/
      rflag = .false.

      if(qcrmnu.ne.324) then
         pmenu = qcrmnu
         pmsg = msgonm
      endif

c ---  check for previous menu being either the restore display or
c      save display.
c      if so, then the viewport most be cleared of the saved files text
      if (pmenu.eq.20 .or. pmenu.eq.21)
     +   call jvisbl(isegn,0)

      call drawm(324,ierror)

      call jvport (xllmvp,xurmvp,yllmvp,yurmvp)
      call jwindo (0.,17.,1.,43.)

      call hilite (.false.,9,1,lentab,mtable)
      call hilite (.true.,(hilchoi(1)),1,lentab,mtable)
      call hilite (.true.,(hilchoi(2)),1,lentab,mtable)

      ichoic = 1.

 5    if(ibuttn.eq.8.or.ichoic.eq.9.or.
     +    (ibuttn.eq.77.and.qext2m)) goto 6
         call mesg(613)
         call mpick (ichoic,324,ibuttn)
```

```
          if(ibuttn.eq.1) then

             if(ichoic.eq.1.or.ichoic.eq.2) then
                prtchoi(1) = ichoic
             endif
             if(ichoic.ge.3.and.ichoic.le.8) then
                prtchoi(2) = ichoic
             endif

          if(ichoic.eq.9) then
             call hilite (.true.,9,1,lentab,mtable)
             call printr
          endif


         if(prtchoi(2).eq.6.or.prtchoi(2).eq.7.or.prtchoi(2).eq.8)
     +       prtchoi(1) = 2

          if(prtchoi(1).ne.hilchoi(1)) then
             call hilite (.false.,(hilchoi(1)),1,lentab,mtable)
             call hilite (.true.,(prtchoi(1)),1,lentab,mtable)
             hilchoi(1) = prtchoi(1)
          endif
          if(prtchoi(2).ne.hilchoi(2)) then
             call hilite (.false.,(hilchoi(2)),1,lentab,mtable)
             call hilite (.true.,(prtchoi(2)),1,lentab,mtable)
             hilchoi(2) = prtchoi(2)
          endif

        else
c ---       CHECK FOR A RECURSIVE CHOICE OF 'PRINT' IN THE KEY AREA
          if(ibuttn.ne.80) then
             call check(ibuttn,qcrmnu,error,rflag)
          endif

        endif

      goto 5
    6 continue

c      print*,' choice - ',prtchoi(1),prtchoi(2),ibuttn

      if(ibuttn.eq.8.or.ichoic.eq.9) then
         call jvport (xllmvp,xurmvp,yllmvp,yurmvp)
         call jwindo (0.,17.,1.,43.)
         call drawm(pmenu,ierror)
      endif

      qretrn = .false.

      return
      end


C+*+*+*+*+*+*+*+*+*+*+*+*+*+*+*+*+*+*+*+*+*+*+*+*+*+*+*+*+*+*+*+*+*+*+*+*|*+*+*+*+
C* UNIT NAME:                    pushst
C*
C* FUNCTIONAL DESCRIPTION:
C*
C*     This subroutine places a menu number on a stack.
C*
C* INPUT FILES/PARAMETERS:
C*
C*     Global Variables
C*
C*       qcrmnu           integer; contains the current menu number
C*       qmxst            integer; contains the size of the qstack array
C*       qmloc            integer; contains the current location in the
C*                                 qstack array
C*       qstack     integer array; contains menu numbers of previous
C*                                 menus displayed
C*
C*
```

```
C* OUTPUT FILES/PARAMETERS:
C*
C*        values in the global variables described above, in particular
C*        the menu value placed on the stack
C*
C* RESTRICTIONS:
C*
C*       The value in the variable qmloc cannot exceed the maximum array
C*       size.
C*
C* SUBROUTINES CALLED:
C*
C*        mesg            subroutine; places an appropriate message
C*                                    in the communications area
C*
C* CALLED BY:                    MHAND
C*
C* LOCAL VARIABLES:
C*
C*        no local variables
C*
C* ABNORMAL RETURN CONDITIONS:
C*
C*       A system error will occur when the value in the variable qmloc
C*       is going to exceed the maximum size of the array qstack.
C*
C* LOCATION:
C*
C*        /u2/vcn/a21proto/pushst
C*
C* PROGRAMMER:               DATE OF LAST CHANGE:    REASON FOR CHANGE:
C*
C*  VCNewton                    15 August 1983          initial entry
C*
C-*-*-*-*-*-*-*-*-*-*-*-*-*-*-*-*-*-*-*-*-*-*-*-*-*-*-*-*-*-*-*-*-*-*-*-*-*-*-*|*-*-*-*-

      Subroutine PUSHST

C     This subroutine places a menu number on a stack.

C        (**Declare common blocks and common block variables**)
         Integer qcrmnu,qmxst,qmloc,qstack(10)
         Common /b2/ qstack
         Common /b4/ qmloc
         Common /b6/ qcrmnu
         Common /b7/ qmxst
C        (**Insure qmloc is not going to exceed max array size**)
         If (qmloc .lt. qmxst) then
C           (**Simulate pushing an item on a stack**)
            qmloc=qmloc + 1
            qstack(qmloc)=qcrmnu
         Else
C           (**Execute system error process**)
            Call MESG(209)
            call paws
C           EXIT PROCESS STORING VARIABLES AND KEEPING THE CURRENT
C           SCREEN FOR LATER DEBUGGING
         Endif
      End

C+*+*+*+*+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:                    putamp
c
c  Functional Description:
c       writes up to 4 lines of info into amp area
c
c  Input Files/Parameters:
c
c  Output Files/Parameters: N/A
c
c  Subroutines/Functions Called:
c
c  Called By:                    DRWAMP
```

```
c
c  Local Variables: N/A
c
c  Restrictions: N/A
c
c  Abnormal Return Conditions:  N/A
c
c  Location:
c
c  Programmer       Date of Last Change     Reason for Change
C  L. McCleary      Jan 1988                separate amp & sys - putamp
c
C-*-*-*-*-*-*-*-*-*-*-*-*-*-*-*-*-*-*-*-*-*-*-*-*-*-*-*-*-*-*-*-*-*-*-*-*-*|*-*-*-*-
c
      subroutine putamp(amptxt,ampcnt)
c
c  this subroutine writes up to 4 lines of data into amp area
c
      character*72 amptxt(4),line
      integer ampcnt,ampseg
      integer tmpcnt
c      character * 40 fixdat
      real x,y
      real yincr

      common /compic/xllpic,yllpic,xurpic,yurpic,ibcpic,iocpic
      common/ampprm/ampseg

c      print*,'putamp -- enter-amptxt',amptxt
c
c      fixdat = ' '
      x = xllpic + 1.
c      yincr = (yurpic - yllpic)/(ampcnt+1) + .05
      yincr = 1.
      y= yurpic - (2*yincr)
      do 110 tmpcnt = 2,ampcnt
           line = amptxt(tmpcnt)
           call lngth(line,72,length)
           CALL JMOVE(x,y)
           CALL J1STRG(line(1:length))
           y = y - yincr
           if (y.lt.0.01) y = 0.01
 110  continue
c      print*,'putamp - exit'
      return
      end


C+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                      PUTARC
C
C FUNCTIONAL DESCRIPTION:         .
C
C CALLED BY:                      APARCS
C
C PROGRAMMER:                     DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*|*-*-*-*-

        subroutine putarc(a0,a1,a2,centrx,centry,rad)

c       This routine uses the parameters passed to draw one
c         arc.
c    VARIABLES:
c       a0,a1,a2- angles of the arc
c       centrx,centry- center point of arc
c       rad- radius of arc
c   PROGRAMMER:  Nancy Detrich, A215, March, 1984
C------  MODIFIED BY A692 FOR COMPLETION


        real a0,a1,a2,centrx,centry,rad

        if (((a0.le.a2).and.(a2.le.a1)).or.((a1.le.a2).and.
```

```
+           (a2.le.a0))) then
          call jarc (centrx, centry,0.0, rad, 0, a1, a0)
        else
          if (a0.lt.a1)then
            call jarc(centrx,centry,0.0,rad,0,a1,a0+360)
          else
            call jarc(centrx,centry,0.0,rad,0,a1+360,a0)
          endif
        endif
        return
        end
C+*+*+*+*+*+*+*+*+*+*+*+*+*+*+*+*+*+*+*+*+*+*+*+*+*+*+*+*+*+*+*+*+*+*|*+*+*+*+
C UNIT NAME:                    PUTWRD
C
C FUNCTIONAL DESCRIPTION:       .
C
C CALLED BY:                    CALCPR, DECDET, DECSCA, ERASES, INCDET,
C                               INCSCA, INQSTA, MAJORS, MINORS,
C                               SCENTE, SETSCA, SPROJE, SSCALE
C
C PROGRAMMER:                   DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*|*-*-*-*-

        subroutine putwrd
c
c       this subroutine goes back to the previous command word
c       *** note - this can be used only once in its current form ***
c
        logical eol,eoc
        common /comnds/ lenl,indxw,lenw,eol,eoc
        common /oldwrd/ indxwo,lenwo
c
c       print*,'putwrd -- enter',indxw,lenw
        indxw = indxwo
        lenw = lenwo
c       print*,'putwrd -- exit',indxw,lenw
c
        return
        end

C+*+*+*+*+*+*+*+*+*+*+*+*+*+*+*+*+*+*+*+*+*+*+*+*+*+*+*+*+*+*+*+*+*+*|*+*+*+*+
c  UNIT NAME:                   rbound

c  Functional Description:
c       this subroutine reads screen boundary parameters
c
c  Input Files/Parameters:

c  Output Files/Parameters: N/A

c  Subroutines/Functions Called:

c  Called By:                   FMAIN, RESCON

c  Local Variables: N/A

c  Restrictions: N/A

c  Abnormal Return Conditions:  N/A

c  Location:      /a21/dave

c  Programmer        Date of Last Change       Reason for Change

        subroutine rbound (len,name)

c       this subroutine reads screen boundary parameters

        common /overly/ overtb
        logical overtb(16)
        character*16 chastr
        character*(*) name
        character*50 filenm
```

```
      common /comscr/btbscr(4)
      common /commen/btbmen(4),ibcmen,iocmen,incmen
      common /comleg/btbleg(4),ibcleg,iocleg
      common /combox/btbbox(4),ibcbox,iocbox
      common /comsys/btbsys(4),ibcsys,iocsys
      common /comgra/btbgra(4),ibcgra,iocgra
      common /comkey/btbkey(4),ibckey,iockey
      common /comamp/btbamp(4),ibcamp,iocamp
      common /comwor/btbwor(4),ibcwor,iocwor
      logical areaon(16)
      common /areaon/ areaon
      logical sys
      common /sysdbc/ sys
      data ifl/9/,irdwr/0/

      if (sys) print*,'Enter rbound ',len,name
      filenm = name(1:len) // '.bou'
      call openit (filenm,len+4,ifl,irdwr,ierror)
      if (ierror.ne.0) then
          call openit ('default.bou',11,ifl,irdwr,ierror)
      endif
      if (ierror.eq.0) then
          call readre (ifl,btbscr,4,ierror)
          call readre (ifl,btbmen,4,ierror)
          call readre (ifl,btbleg,4,ierror)
          call readre (ifl,btbsys,4,ierror)
          call readre (ifl,btbgra,4,ierror)
          call readre (ifl,btbkey,4,ierror)
          call readre (ifl,btbamp,4,ierror)
          call readre (ifl,btbwor,4,ierror)
          call readch (ifl,chastr,lench,ierror)
          call asclog(areaon,16,chastr)
          close (ifl)
          call calgvp
      else
          print*,'rbound -- Problem reading parameter file ',
     +    name(1:len),len
      endif
      do 110 i=1,4
          btbbox(i) = btbleg(i)
110   continue

      return
      end
C+*+*+*+*+*+*+*+*+*+*+*+*+*+*+*+*+*+*+*+*+*+*+*+*+*+*+*+*+*+*+*+*+*+*+*+*+*+|*+*+*+*+
C UNIT NAME:                       RCOLOR
C
C FUNCTIONAL DESCRIPTION:
C
C CALLED BY:                       FMAIN, RESCON
C
C PROGRAMMER:                      DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*-*|*-*-*-*-

        subroutine rcolor (len,name)

c       this subroutine reads color values and loads the color table

        character*(*) name
        character*50 filenm
        dimension iclval (6)
        integer coltab(256)
        integer qdsdev,qpydev,qecho,qlecho
        common /device/ qdsdev,qpydev,qecho,qlecho
        common /coltab/ coltab
        equivalence (index,iclval(1)),(istrt,iclval(2)),
     +  (ihue,iclval(3)),(isatur,iclval(4)),(light,iclval(5)),
     +  (icnsec,iclval(6))
        data ifl/9/,irdwr/0/

c       print*,'Enter rcolor ',len,name
        filenm = name(1:len) // '.col'
        ierror = 0
```

```
c       set up the default value
        do 10 i = 0,255
            coltab(i+1) = 3
 10     continue
        call openit (filenm,len+4,ifl,irdwr,ierror)
        if (ierror.ne.0) then
            call openit ('default.col',11,ifl,0,ierror)
        endif
        if (ierror.eq.0) then
            REWIND ifl
  160       continue
                call readin (ifl,iclval,6,ierror)
c  Map the proper values into the coltab array this array is
c  later used by xcolor to call jcolor with the proper color

                do 162 indx = 1,icnsec
                   coltab(istrt+indx) = index + indx - 1
 162            continue

c               print*,' rcolor -- ',iclval,ierror
                if (ierror.ne.0) go to 170
                hue = ihue
                satur = isatur
                rlight = light
                isatur = satur/100.*32767.
                light = rlight/100.*32767.
c               print*,'calling jcotbl :',istrt,ihue,isatur,light,
c    +                  index,qdsdev

c consec  consecutive locations are loaded
c into the color table
                do 165 indx=index,index + icnsec - 1
                   call jcotbl (qdsdev,1,indx,ihue,isatur,light)
                   call hlssav (indx,hue,rlight,satur)
 165            continue
                go to 160
  170       continue
            call closit (ifl)
        else
            print*,'Error on color file read'
c           call derror(30,'Problem reading color paramet.',.true.,5,ch)
        endif
        return
        end


C+*+*+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:                     rconfg

c  Functional Description:
c       this subroutine reads system configuration parameters
c
c  Input Files/Parameters:

c  Output Files/Parameters: N/A

c  Subroutines/Functions Called:

c  Called By: fmain

c  Local Variables: N/A

c  Restrictions: N/A

c  Abnormal Return Conditions:  N/A

c  Location:      /a21/dave

c  Programmer          Date of Last Change       Reason for Change
c  L McCleary          Jan 1988                sep amp & sys - rconfg
C
C-*-*-*-*-*-*-*-*-*-*-*-*-*-*-*-*-*-*-*-*-*-*-*-*-*-*-*-*-*-*-*-*-*-*-*-*-*|*-*-*-*-

       subroutine rconfg (len,name)
```

```
c       this subroutine reads system configuration parameters

        character*(*) name
        character*50 filenm
        integer fntab(17)
        common /fntab/ fntab
        logical lton(16),dotem
        integer ipgrid(4),ltyptb(16)
        common /map/ XRNM,XC,YC,LEVEL,CLAT,CLON,XRAD,YRAD,ITPROJ,
     +      IRES,LTYPTB,LUNDAT,LUNIND,LUNLIN,LTON,IPGRID,DOTEM,
     +      ORHALT
        integer detail(6)
        common /detail/ detail
        logical sys
        common /sysdbc/ sys
        common /scratr/qbox,qbkgrd
        integer qbox,qbkgrd
        common /combox/xllbox,yllbox,xurbox,yurbox,ibcbox,iocbox
        common /commen/xllmen,yllmen,xurmen,yurmen,ibcmen,iocmen,incmen
        common /comleg/xllleg,yllleg,xurleg,yurleg,ibcleg,iocleg
        common /comsys/xllsys,yllsys,xursys,yursys,ibcsys,iocsys
        common /comgra/xllgra,yllgra,xurgra,yurgra,ibcgra,iocgra
        common /comkey/xllkey,yllkey,xurkey,yurkey,ibckey,iockey
        common /compic/xllpic,yllpic,xurpic,yurpic,ibcpic,iocpic
        common /comamp/xllamp,yllamp,xuramp,yuramp,ibcamp,iocamp
        integer scrcol(2)
        data ifl/9/,irdwr/0/

        if (sys) print*,'Enter rconfg ',len,name
        filenm = name(1:len) // '.cfg'
        call openit (filenm,len+4,ifl,irdwr,ierror)
        if (ierror.ne.0) then
            call openit ('default.cfg',11,ifl,0,ierror)
        endif
        if (ierror.eq.0) then
            call readin (ifl,ltyptb,16,ierror)
            if (ierror.ne.0) print*,'Error reading line types',ltyptb
            call readin (ifl,fntab,17,ierror)
            if (ierror.ne.0) print*,'Error reading fntab',fntab
            do 100 i=1,6
               detail(i) = 0
100         continue
            do 110 i=1,17
                if(fntab(i).eq.1) then
                     detail(1) = 1
                else if(fntab(i).eq.2) then
                     detail(2) = 1
                else if(fntab(i).eq.3) then
                     detail(3) = 1
                else if(fntab(i).eq.4) then
                     detail(4) = 1
                else if(fntab(i).eq.5) then
                     detail(5) = 1
                else if(fntab(i).eq.6) then
                     detail(6) = 1
                endif
110         continue
            call readin(ifl,scrcol,2,ierror)
            if (ierror.ne.0) print *,'RCONFG error reading scrcol',scrcol
            qbox = scrcol(1)
            iocbox = scrcol(1)
            iocmen = scrcol(1)
            iocleg = scrcol(1)
            iocsys = scrcol(1)
            iocgra = scrcol(1)
            iockey = scrcol(1)
            iocpic = scrcol(1)
            iocamp = scrcol(1)
            qbkgrd = scrcol(2)
            ibcbox = scrcol(2)
            ibcmen = scrcol(2)
            ibcleg = scrcol(2)
            ibcsys = scrcol(2)
            ibcgra = scrcol(2)
```

```
            ibckey = scrcol(2)
            ibcpic = scrcol(2)
            ibcamp = scrcol(2)
            call closit (ifl)
        else
            print*,'Error in configuration file'
c           call derror(30,'Problem reading configur. file',.true.,5,ch)
        endif

        return
        end

C+*+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:                      readch

c  Functional Description:
c       this subroutine reads from ifl in character format
c
c  Input Files/Parameters:

c  Output Files/Parameters: N/A

c  Subroutines/Functions Called:

c  Called By:                      LOADIC, RBOUND, RPARAM, RPATHS, RSAVPR

c  Local Variables: N/A

c  Restrictions: N/A

c  Abnormal Return Conditions:  N/A

c  Location:      /a21/dave

c  Programmer        Date of Last Change       Reason for Change
C-*-*-*-*-*-*-*-*-*-*-*-*-*-*-*-*-*-*-*-*-*-*-*-*-*-*-*-*-*-*-*-*-*-*-*-*|*-*-*-*-

        subroutine readch (ifl,charar,lenr,ierror)

c       this subroutine reads from ifl in character format

        character*(*) charar
        ierror = 0
        maxlen = len(charar)
        if (maxlen.gt.100.or.maxlen.le.0) then
           print*,'readch -- invalid length of character string '
     +     ,maxlen,'  ',charar
           maxlen = 100
        endif
        read(ifl,*,end=199,err=199) charar (1:maxlen)
        call length (charar,maxlen,lenr)
        go to 200
 199       continue
           ierror = 2
c          call derror(30,'Problem reading parameter     ',.true.,5,ch)
 200    continue
c       print*,'Readch --  : ',lenr,ierror,charar(1:lenr),maxlen

        return
        end

C+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                      READEL
C
C FUNCTIONAL DESCRIPTION:
C
C CALLED BY:                      PLTOVP, READML
C
C PROGRAMMER:                     DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*|*-*-*-*-
```

```
      subroutine readel(string,flatlon)
c
c  this routine reads the overlay or df file for an ellipse line and returns
c  its associated values for printing
c
      character * 105 string
      character*16 flatlon

c      print*,'readel -- enter'
      read(string,120,err = 200)flatlon
120   format(a16)
      goto 225
200   print*,'error in reading ellipse line in readel'
225   continue
c      print*,'readel -- exit-lat/lon:',flatlon
      return
      end

C+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                       READEM
C
C FUNCTIONAL DESCRIPTION:
C
C CALLED BY:                       GETARC, GETCIR, GETPTS
C
C PROGRAMMER:                      DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*|*-*-*-*-

        subroutine readem(ifl,iarray,len,ierror)

c       this subroutine reads from ifl in integer format (I3)
c    VARIABLES:
c       ifl- logical unit number of the file to be accessed
c       iarray- array holding record just read in
c       len- number of positions to be read in
c       ierror- integer flag set if error during read
c   PROGRAMMER:  Nancy Detrich, A215, March, 1984


        integer iarray(*)

        ierror = 0
        read(ifl,1100,end=199,err=199) (iarray(i),i=1,len)
 1100   format(100i3)
        go to 200
  199       continue
            ierror = 2
  200   continue
        return
        end

C+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:                       readin

c  Functional Description:
c       this subroutine reads from ifl in integer format (I5)
c
c  Input Files/Parameters:

c  Output Files/Parameters: N/A

c  Subroutines/Functions Called:

c  Called By:                       BSTMAP, RCOLOR, RCONFG, RPARAM, RSAVPR

c  Local Variables: N/A

c  Restrictions: N/A

c  Abnormal Return Conditions:  N/A
```

```
c  Location:       /a21/dave

c  Programmer        Date of Last Change       Reason for Change

C-*-*-*-*-*-*-*-*-*-*-*-*-*-*-*-*-*-*-*-*-*-*-*-*-*-*-*-*-*-*-*-*-*-*-*-*-*-*-*|*-*-*-*-
        subroutine readin (ifl,iarray,len,ierror)

c       this subroutine reads from ifl in integer format (I5)

        integer iarray(*)

        ierror = 0
        read(ifl,*,end=198,err=199) (iarray(i),i=1,len)
c       read(ifl,1100,end=198,err=199) (iarray(i),i=1,len)
c1100   format(<len>i5)
        go to 200
  198       continue
            ierror = 1
            go to 200
  199       continue
            ierror = 2
c           call derror(30,'Problem reading parameter     ',.true.,5,ch)
  200   continue
c       print*,'Readin -- iarray,len,ierror : ',(iarray(i),i=1,len),len
c    +      ,ierror

        return
        end


C+*+*+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    READML
C
C FUNCTIONAL DESCRIPTION:       .
C
C CALLED BY:
C
C PROGRAMMER:                   DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*-*-*|*-*-*-*-

      subroutine readml(string, exit)

c  this routine interprets the string of characters read from check_mail or
c  check_mail_cond.  The interpretation of the string is based on the value
c  of the first field, "type".

      character * 1024 string
      logical exit
      character * 1  type
      character * 13 msgnum
      character * 5  source
      character * 5  dest
      character * 1  input
      character * 1  action
      character * 3  length
      character * 995 data
      character * 120 buffer
      logical eliflag
      integer ilen,dlen
      integer*2 numb
      character * 80 mbxfil
      character*16 flatlon,blatlon(30)
      character * 120 fixdat
      integer lctrak
      integer ierror
      character linsym
      character*6 filedf
      character*105 text
      integer lcover, lcdf
      integer*4 lenovf
      character*80 ovfnam
      common /ovfnam/ ovfnam
      common /lenovf/ lenovf
```

```
      character*12 mapcho
      integer mflen
      common /mapcho/mapcho,mflen
      logical mdraw,ovdraw
      common /mapdat/ mdraw,ovdraw
      integer trakfd
      logical BEGTRK
      common /TRACK/ trakfd,BEGTRK
      logical mailfl(6)
      integer prtchoi(2)
      common /prtchoi/ prtchoi
      common/mlflag/mailfl
      logical mrkll
      common/mrkll/mrkll
c     map parameters
      logical lton(16),dotem
      integer ipgrid(4),ltyptb(16)
      common /map/ XRNM,XC,YC,LEVEL,CLAT,CLON,XRAD,YRAD,ITPROJ,
     +      IRES,LTYPTB,LUNDAT,LUNIND,LUNLIN,LTON,IPGRID,DOTEM,
     +      ORHALT
      data lcover /1/
      data lctrak /3/
      data lcdf   /2/
      data lunnam /19/
      data lundef /30/
      data trakfd /90/
      data filedf /'df.dat'/
      data mailfl /6*.false./

      exit = .false.
      mdraw = .true.
      eliflag = .false.
      read(string,100,err=200) type
100   format(a1)
      if(type .eq. 'D') then
          read(string,110,err=200) msgnum,source,dest,
     +                 input,action,length,data
110       format(1x,a13,a5,a5,a1,a1,a3,a995)
          ilen = (ichar(length(1:1))-48) * 100
          ilen = ilen + (ichar(length(2:2))-48) * 10
          ilen = ilen + (ichar(length(3:3))-48)
c
c******------------------------------------------------------------------
c         actions are as follows:
c           A:  Plot df or overlay data
c           B:  Begin interactive NSAgraph session
c           C:  Plot and print df data
c           D:  Display best stored map for a given lat/lon and mark that pt.
c           E:  Process ffix and display df data
c           F:  Track overlay data from an input file on a fixed map
c******------------------------------------------------------------------

          if(action .eq. 'A' .or. action .eq. 'C' .or.
     +       action .eq. 'E') then
                if(input .eq. 'F') then
                    mbxfil = data
                    dlen = len(mbxfil)
                    if (dlen .gt. 0) then

c                        ----------------------------------
c                        open the file sent in MBX message
c                        ----------------------------------

c
c---------if raw df data, process the ffix using nsagraph ffix routine,
c---------then put up map
c
                        if(action .eq. 'E') then
                            call procdf (dlen,mbxfil,ierror)
c
c--------------procdf puts processed data into 'df.dat' for display
c--------------let mbxfil eq 'df.dat' inorder to extract the ellipse fix
c
                             ilen = 6
```

```
                    mbxfil(1:ilen) = 'df.dat'
                 endif
                 open(unit=lunnam,file=mbxfil,
     +           err = 200,status = 'old')

c                ------------------------------------
c                read each line of ov file to pull out fix pt.
c                ------------------------------------

                 numb=1
  120            continue
                    read(lunnam,121,end=122,err=200)
     +                 linsym,text
  121               format(a1,a105)

c-------------check for ellipse line -- if more than one ellipse is in file
c-------------then revert to world map by sending bstmap 0/0 for lat/lon.

                    if (linsym.eq.'e'.or.linsym.eq.'E')then
                       if(eliflag) then
                          flatlon = '0000000n0000000e'
                          goto 122
                       else
                          call readel(text,flatlon)
                       endif
                       eliflag = .true.
                   elseif
     +             (linsym.eq.'b'.or.linsym.eq.'B')then
                       call readel(text,blatlon(numb))
                       numb=numb+1
                   endif
                   goto 120
  122            continue
                 numb=numb-1
c                ----------------------------------------------------
c                calc and put up best stored map to display this FFIX
c                ----------------------------------------------------
c
c-------------if no ellipse is found, revert to world map.
c
                 if(.not. eliflag) then
                    flatlon = '0000000n0000000e'
                 endif
                 call bstmap(flatlon,blatlon,numb,mapcho,mflen)
c                 call recall(mflen,mapcho)

c------------if raw df data has been processed,(action E) procdf puts data
c------------into 'df.dat' file
c------------therfore, no transfer of data is necessary.  Otherwise...

                 if(action .ne. 'E') then
                    open(unit=lundef,file=filedf(1:6),
c     +                err = 200,status = 'overwrite')
     +                err = 200,status = 'old')

c     ----------------------------------------------------
c     read the df data from the sent input file and
c     write the df data into df.dat file
c     ----------------------------------------------------
                    REWIND lunnam
 125                continue
                       read(lunnam,130,end=140) buffer
 130                   format(a120)
                       write(lundef,130) buffer
                       goto 125
140                 continue
                    close(unit=lundef)
                    close(unit=lunnam)
c    -------------------------------------------------------
c    move any co-located sites so that txt is readable on map
c    -------------------------------------------------------
                    call mvtext(filedf,6)
                 endif
c           -------------------------------------------
```

```
c                 display df data on map and turn df ftr on
c                 -----------------------------------------
c                          call drwftr(lcdf)
                          if(action .eq. 'A') then
                               lton(lcover) = .true.
                               mailfl(2) = .true.
                          else if (action .eq. 'E') then
                               lton(lcdf) = .true.
                               mailfl(2) = .true.
                          else if(action .eq. 'C') then
                               lton(lcover) = .true.
                               mailfl(2) = .true.
                               mailfl(5) = .true.
c                               call mptxpr(mbxfil,ilen)
                               exit = .true.
                          endif
                     endif
                else
                     print*,'this input not avail ',input
                endif
          else if (action .eq. 'B' ) then
                print*,'interactive mode'
          else if (action .eq. 'D' .or. action .eq. 'F') then
                if(input .eq. 'M') then

c               ----------------------------------------------------------
c               display best saved map for requested pt and show pt w/ "*"
c               ----------------------------------------------------------

                     if(action .eq. 'D') then
                       read(string,150,err=200) flatlon
150                    format(29x,a16)
                       call bstmap(flatlon,blatlon,numb,mapcho,mflen)
                       fixdat = '* LAT/LON: '//flatlon
                       fixdat = ' '
                       mrkll = .true.
c                ----------------------------------------------------------
c                tracking data has been sent; plot this line of it on map
c                ----------------------------------------------------------
c        the tracking option has not been implemented because DFAC
c        has no requirement for this option any longer

                     else if (action .eq. 'F') then
c ---- begin tracking ----
c                           if(BEGTRK) then
c                               call recall(7,'default')
c                               open(unit=trakfd,file='track.1',
c     +                         err = 200,status = 'overwrite')
c                               lton(lctrak) = .true.
c                               BEGTRK = .false.
c                           endif
c                           read(string,160,err=200) fixdat
c160                        format(29x,a120)
c                           call trakpt(fixdat,lton(lctrak))
                     endif
                 else
                     print*,'this input not avail ',input
                 endif
          else
                print*,'this action not avail. ',action
          endif
      else
          print*,'this type not avail. ',type
      endif
      goto 210

200   print*,'error in opening mail string - in readml'

210   continue

      return
      end
```

```
C+*+*+*+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:                           readre

c  Functional Description:
c       this subroutine reads from ifl in real format
c
c  Input Files/Parameters:

c  Output Files/Parameters: N/A

c  Subroutines/Functions Called:

c  Called By:                           BSTMAP, RBOUND, RPARAM

c  Local Variables: N/A

c  Restrictions: N/A

c  Abnormal Return Conditions:  N/A

c  Location:      /a21/dave

c  Programmer          Date of Last Change       Reason for Change
C-*-*-*-*-*-*-*-*-*-*-*-*-*-*-*-*-*-*-*-*-*-*-*-*-*-*-*-*-*-*-*-*-*-*-*-*-*-*-*|*-*-*-*-

        subroutine readre (ifl,rarray,len,ierror)

c       this subroutine reads from ifl in real format

        real rarray(*)

c       print*,'Enter readre ',len
        ierror = 0
        read(ifl,*,end=199,err=199) (rarray(i),i=1,len)
c       read(ifl,1100,end=199,err=199) (rarray(i),i=1,len)
c1100   format(4f12.5)
        go to 200
  199       continue
            ierror = 2
           print*,'Error on Readre read',len,rarray(1)
c           call derror(30,'Problem reading parameter     ',.true.,5,ch)
  200   continue
c       print*,'Readre -- rarray,len,ierror : ',(rarray(i),i=1,4),len,ierror
        return
        end


C+*+*+*+*+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:                           redraw
c
c  Functional Description:
c     redraw all retained segments on screen (using jframe)
c
c  Input Files/Parameters:
c
c  Output Files/Parameters: N/A
c
c  Subroutines/Functions Called:
c      Note: Subroutines preceded by a "j" are explained in the DI-3000 manual.
c
c  Called By:                           RPLSCN, SUBCHK
c
c  Local Variables: N/A
c
c  Restrictions: N/A
c
c  Abnormal Return Conditions:  N/A
c
c  Location:      /a21/dave
c
c  Programmer          Date of Last Change       Reason for Change
c  L McCleary          Jan 1988                  'BATCH' fix - redraw
c
C-*-*-*-*-*-*-*-*-*-*-*-*-*-*-*-*-*-*-*-*-*-*-*-*-*-*-*-*-*-*-*-*-*-*-*-*-*-*-*|*-*-*-*-
```

```
      subroutine redraw

c     redraw all retained segments on screen (using jframe)

      logical sys,batch
      common /sysdbc/ sys
      common /batdbc/ batch

      if (sys) print*,'redraw -- enter '
      if (batch) then
         call jenbat
         call jbgbat (0)
      else
         call jframe
      endif
      return
      end

C+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                      REDRCT
C
C FUNCTIONAL DESCRIPTION:          .
C
C CALLED BY:                      APRECT
C
C PROGRAMMER:                     DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*|*-*-*-*-

        subroutine redrct(xarray,yarray,start)

c       redraws a rectangle, given the top left, top right, bottom left,
c         and bottom right points in that order
c       VARIABLES:
c       start- the starting position in the array for that rectangle
c           (not implemented)
c       xarray/yarray- holds points for rectangles
c   PROGRAMMER:  Nancy Detrich, A215, March, 1984


        integer start
        real xarray(*),yarray(*)

        call jmove(xarray(start),yarray(start))
        call jdraw(xarray(start+1),yarray(start+1))
        call jdraw(xarray(start+3),yarray(start+3))
        call jdraw(xarray(start+2),yarray(start+2))
        call jdraw(xarray(start),yarray(start))
        return
        end

C+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                      REDRLN
C
C FUNCTIONAL DESCRIPTION:          .
C
C CALLED BY:                      APLINE, APSMOO
C
C PROGRAMMER:                     DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*|*-*-*-*-

        subroutine redrln(xarray,yarray,numpts)

c       This routine draws a line connecting the points passed
c         in the arrays.
c       VARIABLES:
c         xarray/yarray- points to be used for line
c         numpts- number of points in the arrays
c   PROGRAMMER:  Nancy Detrich, A215, March, 1984
```

```
        real xarray(*),yarray(*)
        integer numpts

        call jmove (xarray(1),yarray(1))
        call jpoly (xarray(2),yarray(2),numpts-1)
c       do 100 i = 1,numpts-1
c         call jmove (xarray(i),yarray(i))
c         call jdraw (xarray(i+1),yarray(i+1))
c 100   continue
        return
        end

C+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                          REDRMK
C
C FUNCTIONAL DESCRIPTION:              .
C
C CALLED BY:                           APMARK
C
C PROGRAMMER:                          DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*|*-*-*-*-

        subroutine redrmk (mkrtyp,count,xarray,yarray)

c       This routine draws markers at the points in the x and
c        yarray.
c        The marker displayed is controlled by the mkrtyp passed
c        which is used for the DI-3000 call--the normal markers
c        of DI-3000 are used.
c      VARIABLES:
c        xarray/yarray- coordinates for placing markers
c        mkrtyp- the DI-3000 marker to be displayed
c        count- number of markers to be displayed
c   PROGRAMMER:  Nancy Detrich, A215, March, 1984


        real xarray(*),yarray(*)
        integer mkrtyp,count

        call jcmark(mkrtyp)
        call jpmark (xarray,yarray,count)
c       do 70 i = 1,count
c         call jmark(xarray(i),yarray(i))
c  70   continue
        return
        end

C+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                          REINIP
C
C FUNCTIONAL DESCRIPTION:              .
C
C CALLED BY:                           MHAND
C
C PROGRAMMER:                          DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*|*-*-*-*-

        subroutine reinip
c       reinitialize variables after returning to main menu if necessary
c       (If inipic is called, the map will be erased)

c       call inipic

        return
        end

C+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                          REMOVF
C
```

```
C FUNCTIONAL DESCRIPTION:          .
C
C CALLED BY:                       STATEC
C
C PROGRAMMER:                      DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*-*|*-*-*-*-

        subroutine removf
c
c       this subroutine removes a feature from current map
c

        common /states/ nextst
        logical isfeat
        common /indpar/ indpro,indftr
        logical lton(16),dotem
        integer ipgrid(4),ltyptb(16)
        common /map/ XRNM,XC,YC,LEVEL,CLAT,CLON,XRAD,YRAD,ITPROJ,
     +     . IRES,LTYPTB,LUNDAT,LUNIND,LUNLIN,LTON,IPGRID,DOTEM,
     +       ORHALT
        integer color

c        print*,'removf -- enter'
        call getwrd
        if (isfeat()) then
            if (LTON(indftr)) then
               color = LTYPTB(indftr)
               LTYPTB(indftr) = 24
               call drwftr(indftr)
               LTYPTB(indftr) = color
               LTON(indftr) = .false.
            endif
c           print*,'removf -- exit'
        endif
        nextst = 1
        return
        end


C+*+*+*+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:                                   rename
c
c  Functional Description:                     Move one file into another.
c
c  Input Files/Parameters:
c     Parameters
c       Name     Type    Description
c       ----     ----    -----------
c       oldnam   ch*50   File to be renamed.
c       newnam   ch*50   New name to give file.
c
c  Output Files/Parameters:     N/A
c
c  Subroutines/Functions Called:
c       Name     Description
c       ----     -----------
c       copyfl   Copy old file to new file.
c
c
c  Called By:
c
c  Local Variables:             N/A
c
c  Restrictions:                N/A
c
c  Abnormal Return Conditions:  N/A
c
c  Location:
c
c       Programmer      Date of Last Change     Reason for Change
c       ----------      -------------------     -----------------
c       sfw             8-Nov-1984              Restructuring and documentation.
c
```

```
c
c  Work still to be done:
c
C-*-*-*-*-*-*-*-*-*-*-*-*-*-*-*-*-*-*-*-*-*-*-*-*-*-*-*-*-*-*-*-*-*-*-*-*-*-*-*|*-*-*-*-

        subroutine rename( oldnam, newnam, ierr )

        integer ierr
        character *50 oldnam, newnam

c       Call copyit to make copy of original and delete then delete it.
        call copyfl( oldnam, newnam, 'delete', ierr )

        return
        end


C+*+*+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                         ROTPTS
C
C FUNCTIONAL DESCRIPTION:            .
C
C CALLED BY:                         APARCS, APCIRC, APFILL, APLINE,
C                                    APMARK, APRECT, APSMOO
C
C PROGRAMMER:                        DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*-*-*|*-*-*-*-

      subroutine rotpts(xarray,yarray,npts)
C------   PROGRAMMED BY DIRK BUTSON OF A692 FOR COMPLETION

      real xarray(*),yarray(*)
      integer npts
      common /chgit/ mirflg,xscale,yscale,xoffst,yoffst,rotang
        real xscale,yscale,rotang
        integer xoffst,yoffst,mirflg

      if (rotang .ne. 0) then
         do 100 i = 1,npts
            x = xarray(i) * cos (rotang) + yarray(i) * sin (rotang)
            y = - xarray(i) * sin (rotang) + yarray(i) * cos (rotang)

            xarray(i) = x
            yarray(i) = y

clj ------- The following values used to offset the x and y
clj ------- positions are being used to prevent the rotation
clj ------- from changing the position of the symbol.

c            if (rotang.gt.0 .and. rotang.le.0.7854) then
c               xarray(i) = x
c               yarray(i) = y
c            elseif (rotang.gt.0.7854 .and. rotang.le.2.3562) then
c               xarray(i) = x
c               yarray(i) = y
c            elseif (rotang.gt.2.3562 .and. rotang.le.3.927) then
c               xarray(i) = x
c               yarray(i) = y
c            elseif (rotang.gt.3.927 .and. rotang.le.5.4978) then
c               xarray(i) = x
c               yarray(i) = y
c            else
c               xarray(i) = x
c               yarray(i) = y
c            endif
cmbb                  xarray(i) = x - 45
cmbb                  yarray(i) = y - 45
100      continue
      endif
      return
      end


C+*+*+*+*+*+*+*+*+*+*+*+*+*+*+*+*+*+*+*+*+*+*+*+*+*+*+*+*+*+*+*+*+*+*+*+*+*+*+*|*+*+*+*+
```

```
c  UNIT NAME:                          rparam

c  Functional Description:
c       this subroutine reads map parameters
c
c  Input Files/Parameters:
c  Output Files/Parameters: N/A

c  Subroutines/Functions Called:

c  Called By:                          FMAIN, RECDIS, RESCON

c  Local Variables: N/A

c  Restrictions: N/A

c  Abnormal Return Conditions:  N/A

c  Location:       /a21/dave

c  Programmer           Date of Last Change        Reason for Change
C-*-*-*-*-*-*-*-*-*-*-*-*-*-*-*-*-*-*-*-*-*-*-*-*-*-*-*-*-*-*-*-*-*-*-*-*-*-*-*|*-*-*-*-

        subroutine rparam (lennam,name,dataon,ierror)

c       this subroutine reads map parameters

        character*6 curwdb
        common /curwdb/ curwdb
        common /lenwdb/ lenwdb
        common /tablet/ inpdev
        character*(*) name
        logical dataon
        character*50 filenm
        character*17 chastr
        logical lton(16),dotem
        integer ipgrid(4),ltyptb(16)
        common /map/ XRNM,XC,YC,LEVEL,CLAT,CLON,XRAD,YRAD,ITPROJ,
     +      IRES,LTYPTB,LUNDAT,LUNIND,LUNLIN,LTON,IPGRID,DOTEM,
     +      ORHALT
        common /conic/ spll1,spll2,tranl,trank,tranr,tscale,pole,tilt
        common /oblm/ polat,polon,az,azlat,gamma,xshift
        dimension ltypov(16)
        logical ltonov(16),rankt(26,16)
        common /maptoo/ ltypov,ltonov,rankt
        CHARACTER NSI,EWI
        real retabl(4)
        integer intabl(17)
        character*50 classi
        common /classi/ classi
        common /lencla/ lencla
        logical overtb(16)
        common /overly/ overtb
        character*80 ovfnam
        common /ovfnam/ ovfnam
        common /lenovf/ lenovf
        logical sys
        common /sysdbc/ sys
        logical filply,opnply
        common / polycb / filply,opnply
        data iversn/7/
        DATA IDLA,IMLA,IDLO,ISLO/65,0,85,0/NSI,EWI/'N','E'/
c       convert minutes to radians by multiplying by CM2RAD
        DATA CM2RAD/2.908882087E-4/
        data ifl/9/,irdwr/0/

        if (sys)
     +  print*,'Enter rparam ',lennam,name,xrad,yrad,xc,yc

c
c       set up all overlay colors
c
        do 100 i = 1,16
```

```
         ltypov(i) = 152
 100    continue
        CLAT=(IDLA*60+IMLA)*CM2RAD
        IF(NSI.EQ.'S') CLAT=-CLAT
        CLON=(IDLO*60+IMLO)*CM2RAD
        IF(EWI.EQ.'W') CLON=-CLON
        filenm = name(1:lennam) // '.prm'
        call openit (filenm,lennam+4,ifl,irdwr,ierror)
        if (ierror.ne.0) then
c           print*,'Error on open - using default'
            call openit ('default.prm',11,ifl,irdwr,ierror)
            if (ierror.ne.0) go to 150
        endif
        call readin (ifl,jversn,1,ierror)
        if (ierror.ne.0) then
c           print*,'rparam -- 1 ',jversn
            go to 150
        endif
        if(iversn.ne.jversn) then
c           print*,'using default ',iversn,jversn
            call openit ('default.prm',11,ifl,irdwr,ierror)
            if (ierror.ne.0) go to 150
            call readin (ifl,jversn,1,ierror)
            if (ierror.ne.0) go to 150
            if(jversn.ne.iversn) go to 150
        endif
        call readre (ifl,retabl,4,ierror)
        if (ierror.eq.0) then
            dxc = retabl(1)
            dyc = retabl(2)
            dxrad = retabl(3)
            dyrad = retabl(4)
        else
c           print*,'rparam -- 2 ',retabl
        endif
        call readre (ifl,retabl,4,ierror)
        if (ierror.eq.0) then
            xrnm = retabl(1)
            clat = retabl(2)
            clon = retabl(3)
            orhalt = retabl(4)
c           print*,'OMSGS - ',retabl,xrnm
        else
c           print*,'rparam -- 3 ',retabl
        endif
        call readin (ifl,intabl,7,ierror)
        if (ierror.eq.0) then
            do 120 i=1,4
                ipgrid(i) = intabl(i)
 120        continue
            level = intabl(5)
            itproj = intabl(6)
            ires = intabl(7)
        else
c           print*,'rparam -- 4 ',intabl
        endif
c       print*,'Rparam -- ready to read logicals'
        call readch (ifl,chastr,lenx,ierror)
c       if (ierror.ne.0) print*,'rparam ',ierror,chastr
        call asclog(lton,16,chastr(1:16))
        call asclog(dotem,1,chastr(17:17))
        call readch (ifl,curwdb,lenwdb,ierror)
c       if (ierror.ne.0) print*,'rparam ',ierror,chastr
        call readch (ifl,classi,lencla,ierror)
c       if (ierror.ne.0) print*,'rparam ',ierror,chastr
c       print*,'After read of text'
        call readch (ifl,chastr,lenx,ierror)
c       if (ierror.ne.0) print*,'rparam ',ierror,chastr
        call asclog(overtb,16,chastr)
        filply = overtb(5)
        call readch (ifl,ovfnam,lenovf,ierror)
c       if (ierror.ne.0) print*,'rparam ',ierror,chastr
        if (ierror.ne.0.or.lenovf.le.0) then
            lenovf = 11
            ovfnam(1:lenovf) = 'overlay.dat'
```

```
.       endif
c
c       Set default std parallel and tilt for old files and non conics.
        splll = clat
        spll2 = clat
        tilt = 0.0
        az = tilt
        azlat = 0.0
c
c       Read the record containing conic standard parallels and tilt.
        call readre (ifl,retabl,3,ierror)
        if (ierror.eq.0) then
c          Replace defaults for Lambert,Albers,Kavrasky,Oblique Mercator.
           if ((itproj.eq.8).or.(itproj.eq.9).or.(itproj.eq.12).or.
     +        (itproj.eq.14)) then
              splll = retabl(1)
              spll2 = retabl(2)
              tilt = retabl(3)
              az = tilt
           endif
c          Override EOF error we may have got from reading an old files.
           ierror = 0
        endif
c
        go to 155 .
  150       continue
            ierror = 2
            print*,'Error in parameter file'
c           call derror(30,'Problem reading parameter file',.true.,5,ch)
  155   continue
        call closit (ifl)
c       print*,'Ready to call chawdb',curwdb
        call chawdb (6,curwdb)
        if (overtb(9)) inpdev = 2
        CALL INITIA (XC,YC,CLAt,CLOn,XRAd,YRAd,ITPROj,IRES,XRNM,
     +  ORHALT)
        lev = level
        call chlevl (lev)
        if (sys)
     +  print*,'Rparam -- exit',lennam,name(1:lennam),xrad,yrad,xrnm
        return
        end

C+*+*+*+*+*+*+*+*+*+*+*+*+*+*+*+*+*+*+*+*+*+*+*+*+*+*+*+*+*+*+*+*+*+*|*+*+*+*+
c  UNIT NAME:                     rpaths

c  Functional Description:
c       read path names for parameter files and map data
c
c  Input Files/Parameters:

c  Output Files/Parameters: N/A

c  Subroutines/Functions Called:

c  Called By:                     FMAIN

c  Local Variables: N/A

c  Restrictions: N/A

c  Abnormal Return Conditions:  N/A

c  Location:       /a21/dave

c  Programmer         Date of Last Change        Reason for Change

C-*-*-*-*-*-*-*-*-*-*-*-*-*-*-*-*-*-*-*-*-*-*-*-*-*-*-*-*-*-*-*-*-*-*-*|*-*-*-*-

       subroutine rpaths (len,name,ierror)

c      read path names for parameter files and map data
```

```
      character*(*) name
      character*50 tmpstr
      character*50 defpth
      common /defpth/ defpth
      common /lendef/ lendef
      character*50 mapath
      common /mapath/ mapath
      common /lenmap/ lenmap
      character*50 menpth
      common /menpth/ menpth
      common /lenmen/ lenmen
      character*80 idebug
      common /idebug/ idebug
      data ifl/9/,irdwr/0/

      call openit (name,len,ifl,irdwr,ierror)
      call readch (ifl,tmpstr,lentmp,ierror)
      if (ierror.eq.0) then
          lendef = lentmp
          defpth = tmpstr
      else
          print*,'Default path not provided, using ',
     +    defpth(1:lendef),'.'
      endif
      call readch (ifl,tmpstr,lentmp,ierror)
      if (ierror.eq.0) then
          lenmap = lentmp
          mapath = tmpstr
      else
          print*,'Map data path not provided, using ',
     +    mapath(1:lenmap),'.'
      endif
      call readch (ifl,tmpstr,lentmp,ierror)
      if (ierror.eq.0) then
          idebug = tmpstr
      else
          idebug = ' '
      endif
      call readch (ifl,tmpstr,lentmp,ierror)
      if (ierror.eq.0) then
          lenmen = lentmp
          menpth = tmpstr
      else
          lenmen = lendef
          menpth = defpth
      endif
      call closit (ifl)
      if (index(idebug,'sys').ne.0)
     + print*,'rpaths -- ',lendef,'  ',defpth(1:lendef),lenmap,
     + '  ',mapath(1:lenmap)

      return
      end


C+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                      RPLSCN
C
C FUNCTIONAL DESCRIPTION:         RETURNS PICTURE BACK TO ORIGINAL
C                                 VIEWPORT
C
C INPUT FILES/PARAMETERS:         NONE
C
C                    COMMON
C     VARIABLE       BLOCK          TYPE        DESCRIPTION
C
C      SXLLGP        SAVGVP         REAL     LOWER LEFT X OF ORIGINAL VIEWPORT
C      SYLLGP        SAVGVP         REAL     LOWER LEFT Y OF ORIGINAL VIEWPORT
C      SXURGP        SAVGVP         REAL     UPPER RIGHT X OF ORIGINAL VIEWPORT
C      SYURGP        SAVGVP         REAL     UPPER RIGHT Y OF ORIGINAL VIEWPORT
C      SAVMNU        SAVMNU         INTEGER  MENU NUMBER OF CURRENT MESSAGE
C                                            BEFORE SCREEN WAS ENLARGED
C      NSGFUL        ARSEG          INTEGER  SEGMENT NUMBER OF FULL SCREEN
C                                            BORDER
```

```
C       NSGMEN         ARSEG          INTEGER   SEGMENT NUMBER OF MENU BLOCK
C       NSGGRA         ARSEG          INTEGER   SEGMENT NUMBER OF GRAPHICS BLOCK
C       NSGSYS         ARSEG          INTEGER   SEGMENT NUMBER OF COMMUNICATIONS
C                                               BORDER
C       NSGKEY         NSGKEY         INTEGER   SEGMENT NUMBER OF FUNCTION KEY
C                                               BOX
C       NSGKTX         NSGKEY         INTEGER   SEGMENT NUMBER OF FUNCTION KEY
C                                               DESCRIPTION
C
C OUTPUT FILES/PARAMETERS:      NONE
C
C                      COMMON
C     VARIABLE         BLOCK          TYPE        DESCRIPTION
C
C      XLLGVP          COMGVP         REAL      LOWER LEFT X OF ORIGINAL VIEWPORT
C      YLLGVP          COMGVP         REAL      LOWER LEFT Y OF ORIGINAL VIEWPORT
C      XURGVP          COMGVP         REAL      UPPER RIGHT X OF ORIGINAL VIEWPORT
C      YURGVP          COMGVP         REAL      UPPER RIGHT Y OF ORIGINAL VIEWPORT
C
C SUBROUTINES/FUNCTIONS CALLED
C
C     INIPIC         INITIALIZE VARIABLES FOR DRAWING NEW PICTURE
C     DRAWM          DRAWS THE CURRENT MENU
C     JVISBL         DI-3000 ROUTINE TO  MAKE A SEGMENT VISIBLE OR INVISIBLE
C     MESG           INFORMS USER WITH A MESSAGE IN COMMUNICATION AREA
C     HLDF           RETRIEVES FILE FOR EDITTING (CURRENT PICTURE)
C
C CALLED BY:                       PRINTR
C
C LOCAL VARIABLES:
C
C     VARIABLE                 TYPE         DESCRIPTION
C
C      LOG                   LOGICAL        FLAG SET BY HLDF (NOT NEEDED)
C      IERROR                INTEGER        STATUS SET BY DRAWM (NOT NEEDED)
C
C RESTRICTIONS:
C
C
C ABNORMAL RETURN CONDITIONS:   N/A
C
C
C PROGRAMMER:                      DATE OF LAST CHANGE     REASON FOR CHANGE
C
C     DABUTSON                       11/13/84                INITIAL ENTRY
C
C-*-*-*-*-*-*-*-*-*-*-*-*-*-*-*-*-*-*-*-*-*-*-*-*-*-*-*-*-*-*-*-*-*-*-*-*-*|*-*-*-*-
C
      SUBROUTINE RPLSCN
C
C REPLACE MAP BACK TO ORIGINAL SIZE
C
      COMMON /COMGVP/ XLLGVP,YLLGVP,XURGVP,YURGVP
      COMMON /SAVGVP/ SXLLGP,SYLLGP,SXURGP,SYURGP
      COMMON /ASPECT/ XASPEC,YASPEC,XVLOW,XVHIGH,YVLOW,YVHIGH
      COMMON /ARSEGS/ NSGMEN,NSGGRA,NSGSYS,NSGMSG,NSGMAP,NSGFUL

      COMMON/SEGNUM/QSEGNM
      INTEGER      QSEGNM

      COMMON /QPRINT/QPRINT
      LOGICAL QPRINT

      COMMON/CHANGE/QCHANG
      LOGICAL        QCHANG

      COMMON /SAVMNU/ SAVMNU
      INTEGER SAVMNU

      COMMON /NSGKEY/ NSGKEY,NSGKTX
      COMMON/FLNAME/QNAME,qdscrp
      CHARACTER *50 QNAME
      character*60 qdscrp
```

```
      INTEGER IERROR
      LOGICAL LOG
      LOGICAL QLTON(16),QDOTEM
      INTEGER QPGRID(4),QTYPTB(16)
      INTEGER QLEVEL,QITPRO,QIRES,QLUNDA,QLUNIN,QLUNLI
      COMMON /MAP/ QXRNM,QXC,QYC,QLEVEL,QCLAT,QCLON,QXRAD,QYRAD,
     +      QITPRO,
     +      QIRES,QTYPTB,QLUNDA,QLUNIN,QLUNLI,QLTON,QPGRID,QDOTEM,
     +      QORHAL

      common/typtmp/typtmp
      integer typtmp(16)
      common/oneflg/oneflg
      logical oneflg
      common/contrl/qclass
      logical       qclass
      logical       tmpcls

      tmpcls=qclass
      call eramap
      qclass=tmpcls
C
C ---- SET VIEWPORT BACK TO ORIGINAL VALUES
C
      XLLGVP = SXLLGP
      YLLGVP = SYLLGP
      XURGVP = SXURGP
      YURGVP = SYURGP
C
C ---- RESET ALL NEEDED VARIABLES FOR A PICTURE
C
      ONEFLG = .FALSE.
C
C ---- REDRAW ORIGINAL MENU TURN ON ALL BOXES SURROUNDING EACH
C      AREA
C
      CALL DRAWM(SAVMNU,IERROR)
      CALL JVISBL(NSGFUL,0)
clj - Charlie added the following line to erase
clj - any filled areas which did not disappear
clj - with the call to inipic.
      call redraw
      CALL JVISBL(NSGMEN,1)
      CALL JVISBL(NSGGRA,1)
      CALL JVISBL(NSGSYS,1)
      CALL JVISBL(NSGKEY,1)
      CALL JVISBL(NSGKTX,1)
      CALL MESG(574)
C
C ---- REDRAW HLDF
C
      CALL HLDF(2,18,1,1,LOG)
clj -------
      call dspfln ( qname )
clj -------
      RETURN
      END


C+*+*+*+*+*+*+*+*+*+*+*+*+*+*+*+*+*+*+*+*+*+*+*+*+*+*+*+*+*+*+*+*+*+*|*+*+*+*+
c  UNIT NAME:                    rsavpr
c
c  Functional Description:
c       read save file parameters
c
c  Input Files/Parameters:
c
c  Output Files/Parameters: N/A
c
c  Subroutines/Functions Called:
c
c  Called By:                    FMAIN
c
c  Local Variables: N/A
```

```
c
c  Restrictions: N/A
c
c  Abnormal Return Conditions:  N/A
c
c  Location:       /a21/dave
c
c  Programmer          Date of Last Change         Reason for Change
c
C-*-*-*-*-*-*-*-*-*-*-*-*-*-*-*-*-*-*-*-*-*-*-*-*-*-*-*-*-*-*-*-*-*-*-*|*-*-*-*-

      subroutine rsavpr (len,name)

c     read save file parameters

      character*(*) name
      character*80 savdes(20),filenm
      common /savdes/ savdes
      common /maxsav/ maxsav,limsav
      data ifl/9/,irdwr/0/

      filenm = name(1:len) // '.des'
      call openit (filenm,len+4,ifl,irdwr,ierror)
      if (ierror.ne.0) then
          print*,'Error on save descriptor open - trying default'
          call openit ('default.des',11,ifl,irdwr,ierror)
          if (ierror.ne.0) go to 150
      endif
      call readin (ifl,maxsav,1,ierror)
      if (ierror.ne.0) go to 150
      if (maxsav.gt.limsav) maxsav = limsav
      if (maxsav.lt.0) maxsav = 0
      if (maxsav.gt.0) then
          do 110 i=1,maxsav
              call readch (ifl,savdes(i),lenx,ierror)
              if (ierror.ne.0) go to 150
110       continue
      endif
150   continue
      call closit (ifl)

      return
      end
C+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                      ARCOS
C
C FUNCTIONAL DESCRIPTION:         .
C
C CALLED BY:                      BPE, CONFID
C
C PROGRAMMER:                     DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*|*-*-*-*-

      subroutine arcos (c)
c
c     Dan L. Pratt replaced the IBM arcos, arsin calls with these routines
c     on 16 May 1981 for use on UNIX systems without the functions.
c
      real c
      real*4 x
      real*4 pi
      x   = c
      pi  = 4.0 * atan(1.0)
      pi  = 3.14159
c
      if (c .eq. 0.0) x = pi/2.
      if (c .lt. 0.0) x = atan(sqrt(1.0 - x*x)/x) + pi
      if (c .gt. 0.0) x = atan(sqrt(1.0 - x*x)/x)
      c = x
      return
      end

C+*+*+*+*+*+*+*+*+*+*+*+*+*+*+*+*+*+*+*+*+*+*+*+*+*+*+*+*+*+*+*+*+*+*+*|*+*+*+*+
```

```
C UNIT NAME:                        ARSIN
C
C FUNCTIONAL DESCRIPTION:           .
C
C CALLED BY:                        CONFID
C
C PROGRAMMER:                       DATE OF LAST CHANGE    REASON FOR CHANGE
C
C-*-*-*-*-*-*-*-*-*-*-*-*-*-*-*-*-*-*-*-*-*-*-*-*-*-*-*-*-*-*-*-*-*-*-*-*-*-*|*-*-*-*-

      subroutine arsin (c)
c
      real c
      real*4 x, y, z
      real*4 neg
      real*4 pi
      x   = c
      pi  = 4.0 * atan(1.0)
      pi  = 3.14159
      neg = 1.0
c
      if (x .lt. 0.0) then
           x = -x
           neg = -1.0
      end if
c
      z = 1.0 - x*x
      if (z .eq. 0.0) return
      y = sqrt(1.0/z)
      x = neg * atan(x * y)
      if (x .eq. 1.0) then
           x = neg * pi/2.
      end if
      c = x
      return
      end


C+++++++++++++++++++++++++++++++++++++++++++++++++++++++++++++++++++++++++++|+++++++
C UNIT NAME:                        BPE
C
C FUNCTIONAL DESCRIPTION:           .
C
C CALLED BY:                        EXH, SEQ
C
C PROGRAMMER:                       DATE OF LAST CHANGE    REASON FOR CHANGE
C
C-*-*-*-*-*-*-*-*-*-*-*-*-*-*-*-*-*-*-*-*-*-*-*-*-*-*-*-*-*-*-*-*-*-*-*-*-*-*|*-*-*-*-

      subroutine bpe(iter)
c
      real nxsx(50),nxsy(50),nxsz(50)
      real invar(50)
      integer save(50)
      common nbr,k,ires,nst,wbrf,invar,cost(999),
     1 ista(50),sing(999),cosg(999),stax(999),stay(999),staz(999),
     2 brnx(50),brny(50),brnz(50),il(50),save,swt(50),
     3 nxsx,nxsy,nxsz,wt(50),c11,c22,c33,c13,c12,c23,
     4 tlat,tlon,sma,smi,orien,area,tx,ty,tz,e1,e2,e3,chisq(30),dtr
c
c
     do 100 kk=1,iter
         c11= 0.
         c22= 0.
         c33= 0.
         c12= 0.
         c13= 0.
         c23= 0.
         do 6 i = 1, k
              j = il(i)
              c11 = c11 + wt(j) * brnx(j)**2
              c22 = c22 + wt(j) * brny(j)**2
              c33 = c33 + wt(j) * brnz(j)**2
              c12 = c12 + wt(j) * brnx(j) * brny(j)
```

```
             c13 = c13 + wt(j) * brnx(j) * brnz(j)
             c23 = c23 + wt(j) * brny(j) * brnz(j)
    6     continue
c
ccccc
          call eigen(c11,c22,c33,c12,c13,c23,e1,e2,e3,tx,ty,tz)
c
c         need antipode?
c
          ict = 0
          do 10 i = 1, k
              j = il(i)
              if (0. .le. tx*nxsx(j)+ty*nxsy(j)+tz*nxsz(j)) ict = ict+1
   10     continue
          if (k .le. 2*ict) go to 11
          tx = -tx
          ty = -ty
          tz = -tz
   11     continue
c
c
          do 20 i= 1,k
              j = il(i)
              l = ista(j)
              tdots = tx*stax(l) + ty*stay(l) + tz*staz(l)
              if (tdots .gt.  .99999) tdots =  .99999
              if (tdots .lt. -.99999) tdots = -.99999
c
c             insert range weighting function here
c
              tdots1 = tdots
              call arcos(tdots1)
c
              rge   = 34.44 * tdots1
              if (rge .lt. 10.) go to 137
              rfn   = .285714 + rge * .0714256
              go to 138
  137         rfn   = 3. - rge * (.402 - rge * .0204)
  138         wt(j) = invar(j) / (rfn**2 * (1. - tdots**2))
   20     continue
c
c
  100 continue
      wbrf = e1
      if (k .eq. ict) return
      if (0 .eq. ict) return
      wbrf = 1000.
      return
      end


C+*+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                      CNVRT
C
C FUNCTIONAL DESCRIPTION:         .
C
C CALLED BY:                      DOFIX
C
C PROGRAMMER:                     DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*-*|*-*-*-*-
      subroutine cnvrt(degr, ideg, imin, isec, idir,
     1                 degr2, jdeg, jmin, jsec, jdir)
c
      character in,ie,iw,is,idir,jdir
      data in,ie,iw,is /'n','e','w','s'/
      deg  = abs(degr)
      ideg = deg
      imin = (deg - ideg) * 60.
      isec = (deg - ideg - float(imin)/60.)*3600.
      if (degr .lt. 0.) go to 1
      idir = in
      go to 2
    1 idir = is
```

```
      2 deg  = abs(degr2)
        jdeg = deg
        jmin = (deg -jdeg) * 60.
        jsec = (deg -jdeg - float(jmin)/60.) * 3600.
        if (degr2 .lt. 0) go to 4
        jdir = iw
        go to 3
      4 jdir = ie
      3 return
        end


C+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                        CONFID
C
C FUNCTIONAL DESCRIPTION:           .
C
C CALLED BY:                        EXH, SEQ
C
C PROGRAMMER:                       DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*|*-*-*-*-

      subroutine confid
c
      real nxsx(50),nxsy(50),nxsz(50)
      real invar(50)
      integer save(50)
      common nbr,k,ires,nst,wbrf,invar,cost(999),
     1 ista(50),sing(999),cosg(999),stax(999),stay(999),staz(999),
     2 brnx(50),brny(50),brnz(50),il(50),save,swt(50),
     3 nxsx,nxsy,nxsz,wt(50),c11,c22,c33,c13,c12,c23,
     4 tlat,tlon,sma,smi,orien,area,tx,ty,tz,e1,e2,e3,chisq(30),dtr
c
      real*4 pi
c     fact = earth radius * sqrt(-2 ln (1-p))
      pi  = 4.0 * atan(1.0)
      pi = 3.14159
      data fact /7384./
c
      tlat = tz
      call arsin(tlat)
      tlat = tlat/dtr
      if (abs(tx) .le. 1.e-6) go to 10
      tlon = atan (ty/tx)/dtr
      if (tx .le. 0.)      tlon = tlon + 180.
      if (tlon .gt. 180.) tlon = tlon - 360.
      go to 15
10    tlon = 90.
      if (ty .le. 0.) tlon = -90.
   15 continue
      c11 = 0.
      c22 = 0.
      c33 = 0.
      c12 = 0.
      c13 = 0.
      c23 = 0.
      do 30 i=1,k
ccccc     j = ista(il(i))
          itemp = il(i)
          j   = ista(itemp)
          bx  = stay(j) * tz - staz(j) * ty
          by  = staz(j) * tx - stax(j) * tz
          bz  = stax(j) * ty - stay(j) * tx
ccccc     cof = wt(il(i))/(bx**2 + by**2 + bz**2)
          cof = wt(itemp)/(bx**2 + by**2 + bz**2)
          c11 = c11 + cof * bx**2
          c22 = c22 + cof * by**2
          c33 = c33 + cof * bz**2
          c12 = c12 + cof * bx * by
          c13 = c13 + cof * bx * bz
          c23 = c23 + cof * by * bz
   30 continue
      b = (c11 + c22 + c33)/2.
```

```
      c = c11 * (c22 + c33) + c22 * c33 - (c12**2 + c13**2 + c23**2)
      d = sqrt(b**2 - c)
      e2 = b - d
      e3 = b + d
      sma = fact/sqrt(e2)
      smi = fact/sqrt(e3)
c
      call evect(e2,c11,c22,c33,c12,c13,c23,x,y,z)
c
      if ((x * ty - y * tx) .gt. 0.) z = -z
      temp = z/sqrt(1. - tz**2)
      if (1. .ge. abs(temp)) go to 20
      orien = 0.
      go to 22
   20 continue
      call arcos(temp)
      orien = temp/dtr
   22 continue
      area = pi * sma * smi
      return
      end


C+*+*+*+*+*+*+*+*+*+*+*+*+*+*+*+*+*+*+*+*+*+*+*+*+*+*+*+*+*+*+*+*+*+*|*+*+*+*+
C UNIT NAME:                        DERROR
C
C FUNCTIONAL DESCRIPTION:           .
C
C CALLED BY:                        GETBRG, WRITER
C
C PROGRAMMER:                       DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*|*-*-*-*-

        subroutine derror

        return
        end


C+*+*+*+*+*+*+*+*+*+*+*+*+*+*+*+*+*+*+*+*+*+*+*+*+*+*+*+*+*+*+*+*+*+*|*+*+*+*+
C UNIT NAME:                        DOFIX
C
C FUNCTIONAL DESCRIPTION:           .
C
C CALLED BY:                        PROCDF
C
C PROGRAMMER:                       DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*|*-*-*-*-

c        FFIX software
c
      subroutine dofix(stanam,slat,slong,sigx,inst,inbr,brgid,brg,used,
     1 bpelat,bpelon,smajor,sminor,azimth,fixed)
c
c        This version of the venerable FFIX algorithm is modified to
c        run under FORTRAN 77, and to operate from the terminal,
c        one set of bearings at a time.
c
c        Remodified by Charlie James,T3331 (May 1982)
c        8/8/83 added fixed parameter D. Nation, R531
c
      integer fixed
      real nxsx(50),nxsy(50),nxsz(50)
      real invar(50),slat(999),slong(999),sigx(999),brg(30)
      integer save(50)
      logical used(30)
      character*2 stname(30),stanam(999),brgid(30)
      common nbr,k,ires,nst,wbrf,invar,cost(999),
     1 ista(50),sing(999),cosg(999),stax(999),stay(999),staz(999),
     2 brnx(50),brny(50),brnz(50),il(50),save,swt(50),
     3 nxsx,nxsy,nxsz,wt(50),c11,c22,c33,c13,c12,c23,
     4 tlat,tlon,sma,smi,orien,area,tx,ty,tz,e1,e2,e3,chisq(30),dtr
```

```
c
c       nbr     number of bearings in a DF flash set
c               this modified routine limits nbr to 50 (or less?)
c       k       number of bearings used in a fix (of set "nbr")
c       ires
c       nst     total number of DF stations in existence
c       wrbf            ______________________
c       sname   DF station names (digraphs: see /u4/aea/appl/df/df.sites)
c       stname  DF station names (as read from the file "bearings")
c       invar   station location values?
c       cost    cos stn lat
c       ista    station nr from which df was taken
c       sing    sin stn lon
c       cosg    cos stn lon
c       stax    cost * cosg (cos stn lat * cos stn lon)
c       stay    cost * sing (cos stn lat * sin stn lon)
c       staz    sin stn lat
c       sigx    fudge factor (sigma?) assigned each DF station
c       brnx    cos brg * sin stn lon - sin brg * sin stn lat * cos stn lon
c       brny   -cos brg * cos stn lon - sin brg * sin stn lat * sin stn lon
c       brnz    sin brg * cos stn lat
c       il      ordinal nr of DF bearing in any series of bearings
c       save    (relates to save - those df bearings used?
c       swt
c       nxsx    brny * sin stn lat - brnz * cos stn lat * sin stn lon
c       nxsy    brnz * cos stn lat * cos stn lon - brnx * sin stn lat
c       nxsz    brnx * cos stn lat * sin stn lon - brny * cos stn lat *
c                                       cos stn lon
c       wt      weight assigned to each bearing
c       c11
c       c22
c       c33
c       c12
c       c13
c       c23
c       tlat    latitude from sub CONFID
c       tlon    longitude from sub CONFID
c       sma     semi-major axis (ellipse of confidence = eoc)
c       smi     semi-minor axis "eoc"
c       orien   orientation of "eoc"
c       area    area of "eoc"
c       tz
c       ty
c       tz
c       e1
c       e2
c       e3
c       chisq
c       dtr     .01745329 conversion factor degrees to radians
c
c
c
        real*4 pi
c       dimension sigx(50)
        dimension sint(50)
        dimension xhisq(30)
        equivalence (sint(1),staz(1))
        character unused, yesu, nofix, lat, lon
c       character*2 brgid
        data  unused/'u'/
        data    yesu/'y'/
        data   nofix/'n'/
c               Table of 20 % values
c
        data xhisq/1.642,3.219, 4.642, 5.989, 7.289, 8.558, 9.803,
     1    11.030,12.242,13.442,14.631,15.812,16.985,18.151,19.311,
     2    20.465,21.615,22.760,23.900,25.038,26.171,27.301,28.429,
     3    29.553,30.675,31.795,32.912,34.027,35.139,36.250/
c
      nst = inst
      nbr = inbr

      pi  = 4.0 * atan(1.0)
      pi = 3.14159
```

```
      dtr = .01745329
c
c       iflsh is the numerical set number of a single flash series.
c
      iflsh = 0
      do 101 ii = 1, 30
          chisq(ii) = xhisq(ii)
101   continue
c
c       first get the number of stations;
c       access the data and build values
c
c
      do 20 i = 1, nst
c
c             calculate inverse station variance here
c
          cosg(i) = cos(slong(i))
          sing(i) = sin(slong(i))
          cost(i) = cos(slat(i))
          staz(i) = sin(slat(i))
          stax(i) = cost(i) * cosg(i)
          stay(i) = cost(i) * sing(i)
   20 continue
c
      iflsh = iflsh + 1
c
c       This is now flash sequence number "iflsh", which has "nbr"
c       bearings in it.
c
      do 40 j = 1, nbr
          if (nbr .le. 0) go to 975
c
c         read the DF station ID, and the bearing from that station
c
          stname(j) = brgid(j)

          brg(j)  = brg(j) * dtr
c
          do 38 i = 1, nst
c             validate the site name (digraph)
              if (brgid(j) .eq. stanam(i)) go to 39
   38     continue
c
c
c       bearing nr. "j" taken from station "i"
c
39        continue
c
c        ... bearing number j came from station number i ...
          ista(j) = i
c
c       ... the invariance of bearing is a function of the station ...
          invar(j) =  1./(dtr * sigx(i))**2
c
          cbrg    = cos(brg(j))
          sbrg    = sin(brg(j))
c
c         bearing plane normal vector
c
c             cos brg * sin stn lon - sin brg * sin stn lat * cos stn lon
          brnx(j) = cbrg * sing(i) - sbrg * sint(i) * cosg(i)
c
c            -cos brg * cos stn lon - sin brg * sin stn lat * sin stn lon
          brny(j) =-cbrg * cosg(i) - sbrg * sint(i) * sing(i)
c
c             sin brg * cos stn lat
          brnz(j) = sbrg * cost(i)
c
c             brny * sin stn lat - brnz * cos stn lat * sin stn lon
          nxsx(j) = brny(j) * staz(i) - brnz(j) * stay(i)
c
c             brnz * cos stn lat * cos stn lon - brnx * sin stn lat
          nxsy(j) = brnz(j) * stax(i) - brnx(j) * staz(i)
```

```
c
c           brnx * cos stn lat * sin stn lon - brny * cos stn lat * cos stn
         nxsz(j) = brnx(j) * stay(i) - brny(j) * stax(i)
c
   40    continue
c
c     do an exhaustive test if few bearings
c
      if (nbr .le. 10) go to 50
      call seq
      go to 60
c
   50 k = nbr
      call exh

c
60    continue
      if (ires .ne. 1)  go to 800
      if (sma .gt. 999) go to 800
      nrej   = nbr - k
      tlon   = -tlon
      ratio  = smi/sma
      radius = sma * (.29294*(ratio**2)-.063163*ratio+.76996)
c
c     tlat, tlon, lat and lon are returned from subr CONFID
c     convert to integer and print ...
c
      call cnvrt(tlat,lado,lamo,laso,lat,tlon,lodo,lomo,loso,lon)
c
      bpelat = lado + (lamo + laso/60.)/60.
      bpelon = lodo + (lomo + loso/60.)/60.
      bpelat = bpelat * dtr
      bpelon = bpelon * dtr
      if(.not.(lat .eq. 's')) go to 62
         bpelat = -bpelat
   62 continue
      if(.not.(lon .eq. 'w')) go to 64
         bpelon = -bpelon
   64 continue
      smajor = sma
      sminor = smi
      azimth = orien

      j = 1
      do 81 i=1,nbr
c        if (i.ne.1) go to 80
c        write (3,341) iflsh
c 341    format (/,/,'NBR: ',i3),
c  80    continue
         if (i.eq.il(j)) go to 82
c        write (3,342) i,stname(i)
c 342    format (1x,'Did not use bearing ',i3,' from station ',a2)
         used(i) = .false.
         go to 81
   82    continue
c        write (3,343) i,stname(i)
c 343    format (1x,'Used bearing ',i3,' from station ',a2)
         used(i) = .true.
         j = j + 1
         if (j .gt. k) go to 84
   81 continue
      go to 975
   84 continue
      i = i + 1
      if (i .gt. nbr) go to 975
      do 85 j=i,nbr
c        write (3,342) j,stname(j)
         used(j) = .false.
   85 continue
      go to 975
c
  800 ires = 2
c     WILL SET THE NO-FIX FLAG HERE
c
```

```
975   continue

      fixed = ires

      return
      end


C+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                          EIGEN
C
C FUNCTIONAL DESCRIPTION:             .
C
C CALLED BY:                          BPE
C
C PROGRAMMER:                         DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*|*-*-*-*-

      subroutine eigen(d11,d22,d33,d12,d13,d23,e1,e2,e3,tx,ty,tz)
c
      c11 = d11
      c22 = d22
      c33 = d33
      c12 = d12
      c13 = d13
      c23 = d23
c
      b = c11 + c22 + c33
      c = c11 *(c22 + c33) + c22  * c33 - (c12**2 + c23**2 + c13**2)
      a = c12/c11
      d = c11 *(c22 - c12*a) * (c33 - c13*c13/c11 - ((c23 - c13*a)**2)
     1        /(c22 - c12*a))
      if (d .gt. 0.) go to 13
      e1 = 0.
      return
c
   13 continue
      x = 0.
c
c       What's going on here?  the first time, anyway??
c
      do 10 i = 1, 10
          fx = x**3 - b*x**2  + c*x - d
          fp = 3*x**2 - 2*b*x + c
          xn = x - fx/fp
          if (xn .eq. 0.) go to 12
          if (abs((xn-x)/xn) .lt. .0001) go to 12
          x = xn
   10 continue
c
c
   12 e1 = xn
      call evect(e1,d11,d22,d33,d12,d13,d23,tx,ty,tz)
      return
      end


C+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                          EVECT
C
C FUNCTIONAL DESCRIPTION:             .
C
C CALLED BY:                          CONFID, EIGEN
C
C PROGRAMMER:                         DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*|*-*-*-*-

      subroutine evect(e1,c11,c22,c33,c12,c13,c23,tx,ty,tz)
c
      d1 = (c11 - e1) * (c22 - e1) - c12**2
      if (abs(d1) .le. .0001) go to 10
      x = c13 * (e1 - c22) + c12 * c23
```

```
      y = (e1 - c11) * c23 + c13 * c12
      z = d1
      go to 50
   10 d2 = (c11 - e1) * (c33 - e1) - c13**2
      if (abs(d2) .le. .0001) go to 20
      x = (e1 - c33) * c12 + c13 * c23
      y = d2
      z = (e1 - c11) * c23 + c13 * c12
      go to 50
   20 x = (c22  - e1) * (c33 - e1) - c23**2
      y = (e1 - c33) * c12 + c23 * c13
      z = (e1 - c22) * c13 + c23 * c12
   50 temp = sqrt(x**2 + y**2 + z**2)
      tx = x/temp
      ty = y/temp
      tz = z/temp
      return
      end


C+++++++++++++++++++++++++++++++++++++++++++++++++++++++++++++++++++++++++|+++++++
C UNIT NAME:                      EXH
C
C FUNCTIONAL DESCRIPTION:         .
C
C CALLED BY:                      DOFIX
C
C PROGRAMMER:                     DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*|*-*-*-*-

      subroutine exh
c
c       SUBROUTINE EXH - EXHAUSTIVE
c
      real nxsx(50),nxsy(50),nxsz(50)
      real invar(50)
      integer save(50)
      common nbr,k,ires,nst,wbrf,invar,cost(999),
     1 ista(50),sing(999),cosg(999),stax(999),stay(999),staz(999),
     2 brnx(50),brny(50),brnz(50),il(50),save,swt(50),
     3 nxsx,nxsy,nxsz,wt(50),c11,c22,c33,c13,c12,c23,
     4 tlat,tlon,sma,smi,orien,area,tx,ty,tz,e1,e2,e3,chisq(30),dtr
c
      dimension klim(10)
      data klim/3, 3, 3, 3, 3, 3, 4, 4, 5, 5/
   10 continue
      do 15 i = 1, k
          il(i) = i
   15 continue
      rej = 1000.
c
c     is station unique?
c
20    continue
      itemp = il(1)
      is = ista(itemp)
ccccc is = ista(il(1))
c
      do 21 i = 2,k
ccccc      if(is .ne. ista(il(i))) go to 25
           itemp = il(i)
           if (is .ne. ista(itemp)) go to 25
   21 continue
      go to 40
c
c     set initial weights and call bpe
   25 continue
      do 26 i=1,k
           itemp = il(i)
           wt(itemp) = invar(itemp)
ccccc      wt(il(i)) = invar(il(i))
   26 continue
      call bpe(2)
```

```
cccc  is bearing set better than previous best?
  800 continue
      if (wbrf .ge. rej) go to 40
c     save this case
      do 30 i = 1, k
          itemp       = il(i)
          save(i)     = itemp
          swt(itemp)  = wt(itemp)
ccccc     swt(il(i))  = wt(il(i))
   30 continue
      rej = wbrf
c     find next combination
c
   40 i = k
c
c     (Do While, check after doing...)
c
   41 continue
      if (il(i) .lt. nbr - k + i) go to 45
      if (i .le. 1) go to 50
      i = i - 1
      go to 41
c
   45 j = i
c
   46 continue
      il(i) = il(j) + 1
      if (i .ge. k) go to 20
      j = i
      i = i + 1
      go to 46
c
c     all combinations complete
c
   50 wbrf = rej
      if (wbrf .lt. chisq(k-2)) go to 60
c c
c     try smaller k
c
      if (k .le. klim(nbr)) go to 90
      k = k - 1
      go to 10
c
c     output results
c
   60 continue
c
      do 61 i = 1, k
          itemp = save(i)
          il(i) = itemp
          wt(itemp)   = swt(itemp)
ccccc     wt(il(i))   = swt(il(i))
   61 continue
c
      call bpe(1)
      ires = 1
      call confid
      go to 999
c
   90 ires = 2
999   continue
      return
      end

C+*+*+*+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                        FDFPRO
C
C FUNCTIONAL DESCRIPTION:           .
C
C CALLED BY:                        GEOCON
C
C PROGRAMMER:                       DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*-*-*-*|*-*-*-*-
```

```
        subroutine fdfpro

c       process/display df menu function

        character * 80 retstr
        real parms(4)
        logical qmapup
        common /mapup/qmapup
c       map parameters
        logical lton(16),dotem
        integer ipgrid(4),ltyptb(16)
        common /map/ XRNM,XC,YC,LEVEL,CLAT,CLON,XRAD,YRAD,ITPROJ,
     +      IRES,LTYPTB,LUNDAT,LUNIND,LUNLIN,LTON,IPGRID,DOTEM,
     +      ORHALT
        dimension ltypov(16)
        logical ltonov(16),rankt(26,16)
        common /maptoo/ ltypov,ltonov,rankt

        data lcdf/22/

c       print*,'enter fdfpro'
        irchar = 25
        call prompt(1208,retstr,25,irchar)
        if (irchar.gt.0) then
            call mesg (1209)
            ierror = 0
            call procdf (irchar,retstr,ierror)
            if(ierror .eq. 0) then
                ltonov(lcdf-20) = .true.
                if ( .not. qmapup)  then
                    call procov (parms,ierror,'df.dat',6)
                    if (ierror.eq.0) then
c
c***                    calculate map parmameters
c***                    then draw map and df overlays
c
                        call calmap (parms)
                        call drwmap
                    else
                        call mesg (1211)
                        call paws
                    endif
                else
                    call mesg (1210)
                    call drawf(lcdf)
                endif
            else
                call mesg(1211)
                call paws
            endif
        endif
        return
        end


C+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                   GETBRG
C
C FUNCTIONAL DESCRIPTION:
C
C CALLED BY:                   PROCDF
C
C PROGRAMMER:                  DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*|*-*-*-*-
        subroutine getbrg(extflg,lunit)

c       This subroutine reads a set of bearings.  It uses the
c       bearing ID (a digraph) to get the latitude and longitude
c       from the site table.

c       "nst" is the number of stations (sites)
        common /sytdat/ slat(999),slong(999),sigx(999),nst
        character*2 sname
```

```
        common /snam/ sname(999)

c       "nbr" is the number of bearings in this set
        logical used
        common /brguse/ used(30)
        common /brgdat/ brglat(30),brglon(30),brg(30),nbr
        character*2 brgid(30)
        common /brgid/ brgid
        character*2 waste
        character*1 ch

        logical extflg,found,pause

        extflg = .true.

c ----- The following statement is the target of the abnormal
c ----- exit caused by finding an illegal bearing ID.

   10   continue
        read (lunit,20,end=300,err=300) nbr
   20   format (1x,i3)

        if (nbr.le.0) go to 300

        do 200 i=1,nbr
           read (lunit,50,end=300,err=300) brgid(i),brg(i)
   50      format (1x,a2,f5.1)
           found = .false.
           do 100 j=1,nst
              if (brgid(i).eq.sname(j)) then
                 brglat(i) = slat(j)
                 brglon(i) = slong(j)
                 found = .true.
c --------------- ABNORMAL EXIT FROM DO-LOOP
                 go to 150
              endif
  100      continue
  150      continue

           if(.not.(found)) then
c             Read rest of bearings for this set.
              do 180 k=i+1,nbr
                 read (lunit,170,end=300,err=300) waste
  170            format (a2)
  180         continue
              extflg = .true.
              pause = .true.
              call derror (18,'ILLEGAL BEARING ID',pause,idelay,ch)
c ----------- ABNORMAL EXIT FROM DO-LOOP
              go to 10
           endif

  200   continue
        extflg = .false.

  300   continue

        return
        end

C+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                      GETSYT
C
C FUNCTIONAL DESCRIPTION:         .
C
C CALLED BY:                      PROCDF
C
C PROGRAMMER:                     DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*|*-*-*-*-

        subroutine getsyt(filnam,last,iunit)

c       This subroutine reads the site file, converts site locations
```

```
c       to radians, and stores the values in a table of the common
c       area.
c
c       "nst" is the number of stations (sites)
        common /sytdat/ slat(999),slong(999),sigx(999),nst
        character*2 sname
        common /snam/ sname(999)

        character*50 filnam
        character nsind
        character ewind
        data dtr/.01745329/

        open (unit=iunit,file=filnam(1:last),status='old',err=200)
        rewind (iunit)

        read (iunit,20) nst
   20   format (i3)
        do 100 i=1,nst
           read (iunit,40) sname(i),lad,lam,las,nsind,lod,lom,los,
     +                     ewind,sigx(i)
   40      format (a2,1x,i3,2i2,a1,i3,2i2,a1,f5.2)
           slat(i) = lad + (lam + las/60.)/60.
           slong(i) = lod + (lom + los/60.)/60.
           slat(i) = slat(i) * dtr
cccc       slong(i) = - slong(i) * dtr
           slong(i) = slong(i) * dtr
           if (nsind .eq. 'S' .or. nsind .eq. 's') then
               slat(i) = -slat(i)
           endif
           if (ewind .eq. 'W' .or. ewind .eq. 'w') then
               slong(i) = -slong(i)
           endif
  100   continue

        close (iunit)
        goto 300

  200   call mesg(1211)

  300   return
        end

C+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                     PROCDF
C
C FUNCTIONAL DESCRIPTION:        .
C
C CALLED BY:                     READML, FDFPRO
C
C PROGRAMMER:                    DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*-*|*-*-*-*-

        subroutine procdf (brglen,brgfil,ierror)
c
c       this subroutine processes a df bearing file
c
        character*2 sname
        common /snam/ sname(999)
        character*2 brgid(30)
        common /brgid/ brgid
        character*50 mapath
        common /mapath/ mapath
        common /lenmap/ lenmap
        character*50 defpth
        common /defpth/ defpth
        common /lendef/ lendef
        logical used
        integer ierror
        common /brguse/ used(30)
        common /brgdat/ brglat(30),brglon(30),brg(30),nbr
        common /sytdat/ slat(999),slong(999),sigx(999),nst
```

```
      logical extflg
      integer brglen
      integer sytlen
      integer fixed
      integer iunit
      integer dunit
      integer munit
c ----- brgfil = name of bearings file
      character*50 brgfil

c ----- sytfil = name of df sites file
      character*50 sytfil
      character*120 buffer

c ----- iunit = unitid for df sites file
c ----- lunit = unitid for bearings file
      data iunit /8/
      data munit /9/
      data lunit /10/
      data dunit /20/
      data irdwr/0/

      ierror = 0
      sytfil = mapath(1:lenmap) // 'df.sit'
      sytlen =  lenmap + 6
      call getsyt (sytfil,sytlen,iunit)
      open(unit=lunit,file= brgfil(1:brglen), err=253, status='old')

      extflg = .true.
      call getbrg (extflg,lunit)

   50 continue
      if (extflg) go to 200
         call dofix(sname,slat,slong,sigx,nst,nbr,brgid,brg,used,
     1   bpelat,bpelon,sma,smi,azimth,fixed)
         call writer(fixed,bpelat,bpelon,sma,smi,azimth)
         extflg = .true.
         call getbrg(extflg,lunit)
         go to 50
  200 continue
      call closit (lunit)

      open(unit=munit,file= 'df.inp', err=253, status='old')
      rewind(munit)

      open(unit=dunit,file= 'df.dat',err = 250,status='unknown')
c     ---------------------------------------------------
c     read the df data from the sent input file and
c     write the df data into df.dat file
c     ---------------------------------------------------
  125 continue
              read(munit,130,end=140,err=251) buffer
  130         format(a120)
              write(dunit,130,err=252) buffer
              goto 125
  140 continue
       call closit(dunit)
       call closit(lunit)
       call closit(munit)
c     -------------------------------------------------------
c     move any co-located sites so that txt is readable on map
c     -------------------------------------------------------
      call mvtext('df.dat',6)

      goto 300
  250 print*,'error opening df.dat in procdf'
      ierror = 1
      goto 300
  251 print*,'error reading df.inp in procdf'
      ierror = 1
      goto 300
  252 print*,'error writing df.dat in procdf'
      ierror = 1
```

```
      goto 300
 253  print*,'error opening df.inp in procdf'
      ierror = 1
 300  continue

      return
      end


C++++++++++++++++++++++++++++++++++++++++++++++-+++++++++++++++++++|+++++++
C UNIT NAME:                      RTODI
C
C FUNCTIONAL DESCRIPTION:          .
C
C CALLED BY:                      WRITER
C
C PROGRAMMER:                     DATE OF LAST CHANGE    REASON FOR CHANGE
C
C-*-*-*-*-*-*-*-*-*-*-*-*-*-*-*-*-*-*-*-*-*-*-*-*-*-*-*-*-*-*-*-*-*-*-*|*-*-*-*-

      integer function rtodi (rads)

c     RTODI converts radians to deg, min, sec in integer
c     format (dddmmss).

      integer deg,min,sec
      real    rads,degree,dtr

      data    dtr /0.01745329/

      degree = abs(rads) / dtr
      deg    = int(degree)
      min    = int((degree - deg) * 60.0)
      sec    = int((((degree - deg) * 60.0) - min  * 60.0)
      rtodi  = (deg * 10000) + (min * 100) + sec

      return
      end


C++++++++++++++++++++++++++++++++++++++++++++++-+++++++++++++++++++|+++++++
C UNIT NAME:                      SEQ
C
C FUNCTIONAL DESCRIPTION:          .
C
C CALLED BY:                      DOFIX
C
C PROGRAMMER:                     DATE OF LAST CHANGE    REASON FOR CHANGE
C
C-*-*-*-*-*-*-*-*-*-*-*-*-*-*-*-*-*-*-*-*-*-*-*-*-*-*-*-*-*-*-*-*-*-*-*|*-*-*-*-

      subroutine seq
c
      real nxsx(50),nxsy(50),nxsz(50)
      real invar(50)
      integer save(50)
      common nbr,k,ires,nst,wbrf,invar,cost(999),
     1 ista(50),sing(999),cosg(999),stax(999),stay(999),staz(999),
     2 brnx(50),brny(50),brnz(50),il(50),save,swt(50),
     3 nxsx,nxsy,nxsz,wt(50),c11,c22,c33,c13,c12,c23,
     4 tlat,tlon,sma,smi,orien,area,tx,ty,tz,e1,e2,e3,chisq(30),dtr
c
      k = nbr
c
      do 15 i = 1, k
         il(i) = i
15    continue
c
      do 20 i = 1, k
         itemp     = il(i)
         jtemp     = ista(itemp)
         wt(itemp) = invar(jtemp)
ccccc    wt(i)     = invar(ista(il(i)))
20    continue
```

```
c
   21 continue
      call bpe(2)
c
c     test results
c
      m = k - 2
      if (k .ge. 33) go to 25
c
      if (wbrf .lt. chisq(m)) go to 50
      go to 26
   25 rm=m
      xchi = sqrt(2.0*wbrf) - sqrt(2.0*rm-1.)
      if (xchi .lt. 0.842) go to 50
   26 continue
c
c     not acceptable - find bearing to remove
c
      if (k .le. (nbr+1)/2.) go to 900
      emax = 0.
      do 30 i = 1, k
          ib = il(i)
          x  = wt(ib)* (brnx(ib)*tx + brny(ib)*ty + brnz(ib)*tz)**2
          if   (0. .lt. nxsx(ib)*tx + nxsy(ib)*ty + nxsz(ib)*tz)
     +    go to 60
          x  =  2 * wt(ib) - x
60        continue
          if (x .le. emax) go to 30
          emax = x
          is = i
   30 continue
      k = k - 1
c
      do 35 i = is, k
          il(i) = il(i+1)
   35 continue
c
c     is station unique
c
ccccc il = ista(il(1))
      itemp = il(1)
      il    = ista(itemp)
c
      do 40 i = 2, k
          itemp = il(i)
          if (ista(itemp) .ne. il) go to 21
ccccc     if (ista(il(i)) .ne. il) go to 21
   40 continue
c
c     no fix
c
  900 ires = 2
      go to 999
   50 continue
      call bpe(1)
      ires=1
      call confid
  999 return
      end

C+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                         WRITER
C
C FUNCTIONAL DESCRIPTION:            .
C
C CALLED BY:                         PROCDF
C
C PROGRAMMER:                        DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*|*-*-*-*-

      subroutine writer (fixed,bpelat,bpelon,sma,smi,azimth)
```

```
c     Writer writes to an intermediate file 'DF.dat', that contains
c     DF information.  The info. includes bearing site info. and
c     ellipse info. about a specific target.  The info. about each
c     bearing site (up to 999) contains; position (lat/lon),
c     direction of bearing, and a digraph code for each site.
c     The info. about the ellipse for the target area contains;
c     the best point estimate (lat/lon), length of the major and
c     minor axis, and the azimth.
c
c     NOTE:
c         Routine openit, closit, and derror have been
c         commented out.  Also, fortran statements open and
c         close have been inserted.  All this was done
c         inorder to test WRITER.
c
        logical used
        common /brguse/ used(30)
        common /brgdat/ brglat(30),brglon(30),brg(30),nbr
        character*2 brgid(30)
        common /brgid/ brgid
      character*1 dirctn(2)
      integer     fixed,iarray(2),rtodi
      real        rarray(3),size,dtr

      data munit /9/
      data size  /1.0/
      data dtr   /0.01745329/

c
c------open file and check for any errors
c
      call openit ('df.inp',6,munit,0,ierror)
      if (ierror .ne. 0) go to 20
      rewind (munit)
c
c------write info. to the file for each site
c
      do 10 index = 1,nbr,1
         if (brglat(index) .le. 0) then
            dirctn(1) = 's'
         else
            dirctn(1) = 'n'
         endif

         if (brglon(index) .le. 0) then
            dirctn(2) = 'w'
         else
            dirctn(2) = 'e'
         endif

         iarray(1) = rtodi(brglat(index))
         iarray(2) = rtodi(brglon(index))
         rarray(1) = abs(brg(index)) / dtr

         call writfl (munit,'b',iarray,dirctn,1,size,rarray,
     +                brgid(index),used(index))
10    continue
c
c------write info. about ellipse
c
      if (fixed .eq. 1) then
         if (bpelat .le. 0) then
            dirctn(1) = 's'
         else
            dirctn(1) = 'n'
            endif

            if (bpelon .le. 0) then
               dirctn(2) = 'w'
            else
               dirctn(2) = 'e'
            endif

            iarray(1) = rtodi(bpelat)
```

```
         iarray(2) = rtodi(bpelon)
         rarray(1) = sma
         rarray(2) = smi
         rarray(3) = azimth

         call writfl (munit,'e',iarray,dirctn,2,size,rarray,'  ',
     +   used)
      endif

      go to 30

 20   call derror (30,'Problem opening DF.inp file   ',.true.,5,ch)
      call closit (munit)
 30   continue

      return
      end


C+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                  WRITFL
C
C FUNCTIONAL DESCRIPTION:     .
C
C CALLED BY:                  WRITER
C
C PROGRAMMER:                 DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*|*-*-*-*-

      subroutine writfl (unitno,rectyp,coord,dirctn,
     +                   marker,size,ellpse,sitid,used)

c     Writfl writes bearing site and ellipse info. to the file
c     'DF.dat'.  Bearing site and ellipse info. can be distinguished
c     by the first character in the first field of each record.
c     I.e. a 'b' for bearing site and an 'e' for an ellipse.
c     Also included in each record is a marker id and marker size.

      character*1 rectyp,dirctn(2)
      character*2 sitid
      integer     unitno,marker,coord(2)
      real        size,ellpse(3)
      logical used
      integer iused

c
c-----check for the type of record and
c-----write info. to the file
c
      if (rectyp .eq. 'b') then
         if(used) then
               iused = 1
         else
               iused = 0
         endif
         write(unit=unitno,fmt=1000) 'b',coord(1),dirctn(1),coord(2),
     +                               dirctn(2),marker,size,ellpse(1),
     +                               iused,sitid
1000     format(a1,1x,i6,a1,i7,a1,i3,f5.1,1x,f7.2,1x,i1,1x,a2)
      else if (rectyp .eq. 'e') then
         write(unit=unitno,fmt=1010) 'e',coord(1),dirctn(1),coord(2),
     +                               dirctn(2),marker,size,ellpse(1),
     +                               ellpse(2),ellpse(3),' '
1010     format(a1,1x,i6,a1,i7,a1,i3,f5.1,1x,3f8.2,1x,a56)
      endif

      return
      end
C+*+*+*+*+*+*+*+*+*+*+*+*+*+*+*+*+*+*+*+*+*+*+*+*+*+*+*+*+*+*+*+*+*+*+*+*|*+*+*-+-
c  UNIT NAME:                 DETCON
c
c  Functional Description:
c       this subroutine causes the feature detail level menu to appear
```

```
c
c  Input Files/Parameters:
c
c  Output Files/Parameters:
c
c  Subroutines/Functions Called:
c      check                       checks the value of the button re-
c                                  turned from a pick or locate
c      hilite                      highlights menu choices by drawing
c                                  a box around them
c      mpick                       routine to pick from the menu
c
c  Called By:                      SUBCAL
c
c  Local Variables:
c
c  Restrictions:
c
c  Abnormal Return Conditions:
c
c  Location:
c
c  Programmer         Date of Last Change      Reason for Change
c  C.S. Lamb          Jan 1988                jclear logic - detcon
c
C-*-*-*-*-*-*-*-*-*-*-*-*-*-*-*-*-*-*-*-*-*-*-*-*-*-*-*-*-*-*-*-*-*-*-*-*-*-*-*-*-*-*-*-

        subroutine detcon

c       this subroutine causes the feature detail level menu to appear

        Integer qnextm,HLTAB(29)
        Logical qcancl,qext2m,qretrn,qstmnu
        Common /b1/ qcancl,qext2m,qretrn,qstmnu,qnextm
        logical sys
        common /sysdbc/ sys
        logical qexitg
        Common /b5/ qexitg
        logical error,rflag
c       map parameters
        logical lton(16),dotem
        integer ipgrid(4),ltyptb(16)
        common /map/ XRNM,XC,YC,LEVEL,CLAT,CLON,XRAD,YRAD,ITPROJ,
     +      IRES,LTYPTB,LUNDAT,LUNIND,LUNLIN,LTON,IPGRID,DOTEM,
     +      ORHALT
        INTEGER QLEVL(16)
        COMMON /LEVLS/ QLEVL
        dimension ltypov(16)
        logical ltonov(16),rankt(26,16)
        common /maptoo/ ltypov,ltonov,rankt
        data IHLLEN/29/
        data HLTAB/0,0,0,0,0,0,0,0,0,0,10,0,1,0,2,0,3,0,4,0,5,
     +          0,6,0,7,0,8,0,9/
c
c 0 None
c 1 Major Feat.
c 2
c 3
c 4
c 5
c 6
c 7
c 8
c 9 Minor Feat.
c
        rflag = .false.
        qcancl = .false.
        qext2m = .false.
        qretrn = .false.
        qstmnu = .false.
        if (level.gt.9) then
            ix = 9
        else if (level.eq.0) then
            ix = 10
```

```
        else
            ix = level
        endif
c        call hilite(.true.,ix,1,IHLLEN,HLTAB)
        mysegn = 6
 100    continue
c**** CSL erase 10/87
            call hilite(.true.,ix,1,IHLLEN,HLTAB)
            call menupr
            call mpick(ichoic,mysegn,ibuttn)
            if (ichoic.ge.1.and.ichoic.le.10) then
                call hilite(.false.,ix,1,IHLLEN,HLTAB)
                call hilite(.true.,ichoic,1,IHLLEN,HLTAB)
                ix = ichoic
                if (ichoic.eq.9) then
                    level = 26
                else if (ichoice.eq.10) then
                    level = 0
                else
                    level = ichoic
                endif
                do 130 i=1,16
                    qlevl (i) = level
 130            continue
                call chlevl(level)
            else
                call check(ibuttn,mysegn,error,rflag)
            endif
            if (sys)
     +      print*,'detcon--ibuttn mysegn error',ibuttn,mysegn,error,rflag
        if(.not.rflag) go to 100
c
        return
        end

C+*+*+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:                           FTRCON
c
c  Functional Description:
c       this subroutine processes the map feature menu
c
c  Input Files/Parameters:
c
c  Output Files/Parameters:
c
c  Subroutines/Functions Called:
c
c  Called By:                           SUBCAL
c
c  Local Variables:
c
c  Restrictions:
c
c  Abnormal Return Conditions:
c
c  Location:
c
c  Programmer        Date of Last Change        Reason for Change
c
C-*-*-*-*-*-*-*-*-*-*-*-*-*-*-*-*-*-*-*-*-*-*-*-*-*-*-*-*-*-*-*-*-*-*-*-*-*-*|*-*-*-*-

        subroutine ftrcon

c       this subroutine processes the map feature menu

        integer qnextm,HLTAB(33)
        logical qcancl,qext2m,qretrn,qstmnu
        common /b1/ qcancl,qext2m,qretrn,qstmnu,qnextm
        logical sys
        common /sysdbc/ sys
        logical error,rflag
        logical issegm
        integer i
```

```
c       map parameters
        logical lton(16),dotem
        integer ipgrid(4),ltyptb(16)
        common /map/ XRNM,XC,YC,LEVEL,CLAT,CLON,XRAD,YRAD,ITPROJ,
     +      IRES,LTYPTB,LUNDAT,LUNIND,LUNLIN,LTON,IPGRID,DOTEM,
     +      ORHALT
        integer SEGNO,FIRSEG
        common /SEGNO/ SEGNO,FIRSEG
        logical overtb(16)
        common /overly/overtb
        dimension ltypov(16)
        logical ltonov(16),rankt(26,16)
        common /maptoo/ ltypov,ltonov,rankt
        integer ichoic
        logical qmapup
        common /mapup/qmapup
        logical filply,opnply
        common / polycb / filply,opnply
c
c       commons for grids
c
        COMMON/NEWGRD/ NEWGRD,FIRST
        LOGICAL NEWGRD,FIRST
        COMMON/GRIDS/QSW,QGTYPE,QGCOLR,QXINC,QYINC
        REAL    QXINC(3),QYINC(3)
        LOGICAL    QSW(3)
        INTEGER    QGCOLR(3),QGTYPE(3)
        COMMON /GRDSEG/ LLSEG,UTMSEG,GAUSEG
        INTEGER LLSEG,UTMSEG,GAUSEG
        logical bitmod
        common /bitmod/ bitmod

        data IHLLEN/33/
        data HLTAB/0,0,0,0,1,1,0,2,2,0,3,3,0,4,0,5,0,6,0,7,
     +             0,8,0,9,0,10,0,12,0,16,16,0,17/
c
c     Map Features
c    1 Coastlines,
c     islands/lakes
c    2 Political
c       boundaries
c    3 Internal
c       boundaries
c    4 Rivers
c    5 Railroads
c    6 Roads
c    7 Cities
c    8 Earth fill
c    9 Water fill
c   10 Area names
c   12 MD
c   16 Lat/lon
c       grid lines
c   17 Land fill
c   (A Alter color)
c
        rflag = .false.
        qcancl = .false.
        qext2m = .false.
        qretrn = .false.
        qstmnu = .false.
 100    continue
        do 110 i= 1,16
             if(lton(i))
     +       call hilite(.true.,i,1,IHLLEN,HLTAB)
 110    continue
c
c       hilite for Land fill
c
        if (overtb(5)) call hilite (.true.,i,1,IHLLEN,HLTAB)
        mysegn = 3
        call mpick(ichoic,mysegn,ibuttn)
        if (sys) then
```

```
         print*,'ftrcon - ichoic= ',ichoic,llseg,firseg
      endif
      if (ichoic.ge.1.and.ichoic.le.16) then

          segno = firseg + ichoic

            if (lton(ichoic)) then
              call hilite(.false.,ichoic,1,IHLLEN,HLTAB)
              lton(ichoic) = .false.
              if (.not.bitmod.and.issegm(segno))
     +          call jvisbl (segno, 0)
            else
              call hilite(.true.,ichoic,1,IHLLEN,HLTAB)
              lton(ichoic) = .true.
              if (issegm(segno)) then
                 call jvisbl(segno,1)
              else
                do 120 i= 1,26
c                    set up rank table
                  if (i .le. LEVEL) then
                     rankt(i,ichoic)=.true.
                  else
                     rankt(i,ichoic)=.false.
                  endif
 120            continue

c          make sure  double line rivers are added if necessary
              if ((ichoic.eq.4).and.(LEVEL.ge.1)) then
                rankt(5,4) = .true.
              endif

c       turn on indefinite political boundaries
              if ((ichoic.eq.2).and.(LEVEL.ge.1)) rankt(2,2) = .true.

c             "cannot earth fill while map is present"

                if ( ichoic .eq. 8 .and. qmapup) then
                  call mesg(1231)
                  call paws
                else
                  if (sys) then
                     print*,'calling drawf ichoic= ',ichoic
                  endif
                  call drawf (ichoic)
                endif
              endif
              call menupr
            endif
      else if (ichoic .eq. 17) then
            if (overtb(5)) then
                call hilite(.false.,ichoic,1,IHLLEN,HLTAB)
                overtb(5) = .false.
               filply = .false.
            else
               call hilite(.true.,ichoic,1,IHLLEN,HLTAB)
               overtb(5) = .true.
               filply = .true.
            endif
            call menupr
      else
            call check(ibuttn,mysegn,error,rflag)
      endif
      if (sys)
     + print*,'ftrcon--ibuttn mysegn error',ibuttn,mysegn,error,rflag
      if(.not.rflag) go to 100

      return
      end


C+*+*+*+*+*+*+*+*+*+*+*+*+*+*+*+*+*+*+*+*+*+*+*+*+*+*+*+*+*+*+*+*+*+*|*+*+*+*+
c  UNIT NAME:                    GEOCON
c
c  Functional Description:
c       this subroutine processes the alter display submenu
```

```
c
c  Input Files/Parameters:
c
c  Output Files/Parameters:
c
c  Subroutines/Functions Called:
c      mesg                         displays messages in the communica-
c                                    tions area
c
c  Called By:                       SUBCAL
c
c  Local Variables:
c
c  Restrictions:
c
c  Abnormal Return Conditions:
c
c  Location:
c
c  Programmer        Date of Last Change       Reason for Change
c
C-*-*-*-*-*-*-*-*-*-*-*-*-*-*-*-*-*-*-*-*-*-*-*-*-*-*-*-*-*-*-*-*-*-*|*-*-*-*-

      subroutine geocon

c     this subroutine processes the alter display submenu

      Integer qnextm,HLTAB(34)
      Logical qcancl,qext2m,qretrn,qstmnu
      Common /b1/ qcancl,qext2m,qretrn,qstmnu,qnextm
      logical qexitg
      Common /b5/ qexitg
      logical sys
      common /sysdbc/ sys
      character*50 defpth
      common /defpth/ defpth
      common /lendef/ lendef
      character*10 savenm(10)
      integer lsavnm(10)
      common /savenm/ savenm,lsavnm
      logical error,rflag

      data IHLLEN/34/
      data HLTAB/0,0,0,0,1,1,0,2,0,3,0,4,0,5,5,0,6,6,0,7,0,8,8,
     +           0,9,9,0,10,10,0,11,11,11,0/
      data isavnm/0/,nsavnm/10/,savenm/10*'          '/,lsavnm/10*0/

c          Geographic
c            Functions
c         1 Change Width and
c           center point
c         2 Erase map
c         3 Box area
c         4 Draw Current Map
c         5 Annotate on
c           screen
c         6 Distance/Az.
c           between pnts
c         7 Show area
c         8 Display
c           overlay data
c         9 Process/
c           Display DF
c        10 Color area
c           fill

      rflag = .false.
      qcancl = .false.
      qext2m = .false.
      qretrn = .false.
      qstmnu = .false.
100   continue
      mysegn = 2
      call mpick(ichoic,mysegn,ibuttn)
```

```
        if (sys)
     +  print*,'geocon--ichoic mysegn ibuttn',ichoic,mysegn,ibuttn
        if (ichoic.ge.1.and.ichoic.le.10) then
            call hilite(.true.,ichoic,1,IHLLEN,HLTAB)
        endif
            if (ichoic.eq.1) then
                call fchsca
                call menupr
            else if (ichoic.eq.2) then
                call eramap
                call menupr
            else if (ichoic.eq.3) then
                call boxare
                call menupr
            else if (ichoic.eq.4) then
                call drwmap
                call menupr
            else if (ichoic.eq.5) then
                call fannot
                call menupr
            else if (ichoic.eq.6) then
                call distan
c               call paws
                call menupr
            else if (ichoic.eq.7) then
                call fshowa
                call menupr
            else if (ichoic.eq.8) then
                call foverl
                call menupr
            else if (ichoic.eq.9) then
                call fdfpro
                call menupr
            else if (ichoic.eq.10) then
                call fcfill
                call soverl
                call menupr
            else
                call check(ibuttn,mysegn,error,rflag)
            endif
        if (ichoic.ge.1.and.ichoic.le.12) then
            call hilite(.false.,ichoic,1,IHLLEN,HLTAB)
        endif
        if (sys)
     +  print*,'geocon--ibuttn mysegn error',ibuttn,mysegn,error,rflag
        if(.not.rflag) go to 100
c
        return
        end


C+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                       MMCON
C
C FUNCTIONAL DESCRIPTION:          .
C                                  .
C CALLED BY:                       SUBCAL
C
C PROGRAMMER:                      DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*|*-*-*-*-

        subroutine mmcon

c       this subroutine processes the main menu selections

        Integer qnextm
        Logical qcancl,qext2m,qretrn,qstmnu
        Common /b1/ qcancl,qext2m,qretrn,qstmnu,qnextm
        logical qexitg
        Common /b5/ qexitg
        common /commen/ xllmen,yllmen,xurmen,yurmen,ibcmen,iocmen,incmen
        common /comgra/xllgra,yllgra,xurgra,yurgra,ibcgra,iocgra
        common /commvp/ xllmvp,yllmvp,xurmvp,yurmvp
```

```
      character*50 defpth
      common /defpth/ defpth
      common /lendef/ lendef
      logical error,rflag
      logical sys
      common /sysdbc/ sys
      data maxmen/199/

c     main menu level
      rflag = .false.
      qcancl = .false.
      qext2m = .false.
      qretrn = .false.
      qstmnu = .true.
      qnextm = 1
      call menupr
100   continue
         mysegn = 1
         call mpick (ichoic,mysegn,ibuttn)
         if (sys)
     +   print*,'mmcon-- ichoic mysegn ibuttn',ichoic,mysegn,ibuttn
         if (ichoic.eq.1) then
c            Geographic functions
             qnextm = 2
             rflag = .true.
         else if (ichoic.eq.2) then
c            Map Features
             qnextm = 3
             rflag = .true.
         else if (ichoic.eq.3) then
c            Map Overlay
             qnextm = 4
             rflag = .true.
         else if (ichoic.eq.4) then
c            Map Projection
             qnextm = 5
             rflag = .true.
         else if (ichoic.eq.5) then
c            Level of Detail
             qnextm = 6
             rflag = .true.
         else if (ichoic.eq.6) then
c            Map Data Base resolution
             qnextm = 7
             rflag = .true.
         else if (ichoic.eq.7) then
c            Save/Restore menu
             qnextm = 8
             rflag = .true.
         else if (ichoic.eq.8) then
c            Tracking menu
             qnextm = 9
             rflag = .true.
c            print*,'Tracking menu called'
         else if (ichoic.eq.9) then
c            save display
             QNEXTM = 021
             RFLAG = .TRUE.
         else if (ichoic.eq.10) then
c            recall display
             QNEXTM = 020
             RFLAG = .TRUE.
         else
             call check(ibuttn,mysegn,error,rflag)
         endif
      if (.not.(qexitg.or.(qnextm.ne.1))) go to 100

      return
      end

C+*+*+*+*+*+*+*+*+*+*+*+*+*+*+*+*+*+*+*+*+*+*+*+*+*+*+*+*+*+*+*+*+*+*|*+*+*+*+
c  UNIT NAME:                        ovrcon
c
```

```
c  Functional Description:
c       process map overlay feature menu
c
c  Input Files/Parameters:
c
c  Output Files/Parameters: N/A
c
c  Subroutines/Functions Called:
c
c  Called By: subcal
c
c  Local Variables: N/A
c
c  Restrictions: N/A
c
c  Abnormal Return Conditions:  N/A
c
c  Location:
c
c  Programmer       Date of Last Change      Reason for Change
C  L. McCleary      Jan 1988             separate amp & sys - ovrcon
C  T. WESCOTT       JUL 1988             RANGE RINGS - OVRCON
C  L. McCleary      Mar 1989             SATEL. COV. - OVRCON
c
C-*-*-*-*-*-*-*-*-*-*-*-*-*-*-*-*-*-*-*-*-*-*-*-*-*-*-*-*-*-*-*-*-*-*-*-*-*|*-*-*-*-
c
      subroutine ovrcon

c     this subroutine processes the map overlay feature menu

      common/clindx/qmjidx,qarray
      integer qmjidx
      logical qarray(6)

      common /commen/ xllmen,yllmen,xurmen,yurmen,ibcmen,iocmen,incmen
      common /comgvp/ xllgvp,yllgvp,xurgvp,yurgvp
      common /commvp/ xllmvp,yllmvp,xurmvp,yurmvp
      common /comgra/ xllgra,yllgra,xurgra,yurgra,ibcgra,iocgra
      Integer qnextm,HLTAB(20)
      Logical qcancl,qext2m,qretrn,qstmnu
      Common /b1/ qcancl,qext2m,qretrn,qstmnu,qnextm
      logical qexitg
      Common /b5/ qexitg
      logical error,rflag
      logical sys
      common /sysdbc/ sys
      logical overly (16)
      common /overly/ overly
      INTEGER SEGNO,FIRSEG
      COMMON /SEGNO/ SEGNO,FIRSEG
      integer sclseg,clsseg
      common /lnseg/ sclseg,clsseg
c      integer rrgseg
c      common /rrgseg/ rrgseg,rrlat,rrlon,rrincr
      integer ovseg, dfseg
      common /OVSEGS/ ovseg, dfseg
      integer dseg
      logical bitmod
      common /bitmod/ bitmod
      common/ampprm/ampseg
      integer ampseg

c**   map parameters
      integer ovix
      dimension ltypov(16)
      logical ltonov(16),rankt(26,16)
      common /maptoo/ ltypov,ltonov,rankt
      logical lton(16),dotem
      integer ipgrid(4),ltyptb(16)
      common /map/ XRNM,XC,YC,LEVEL,CLAT,CLON,XRAD,YRAD,ITPROJ,
     +    IRES,LTYPTB,LUNDAT,LUNIND,LUNLIN,LTON,IPGRID,DOTEM,
     +    ORHALT
      data IHLLEN/20/
      data HLTAB/0,0,0,0,1,0,2,0,3,0,4,0,5,0,6,0,0,0,0,0/
```

```
c
c    Map Overlay
c       Features
c    1 Overlay data = ltonov(1)
c    2 DF data      = ltonov(2)
c    3 Scale Line   = overly(2)
c    4 Classificat. = overly(4)
c    5 Range rings  = overly(5)
c    6 Satel. cov.  = overly(6)
c

c        print*,'ovrcon ampseg --- ',ampseg
c
        rflag = .false.
        qcancl = .false.
        qext2m = .false.
        qretrn = .false.
        qstmnu = .false.

clj --- The classification on/off flag is now "qmjidx".
clj --- When qmjidx equals 1, there is no classification.
        if (qmjidx.ne.1) then
            overly(4) = .true.
        else
            call hilite(.false.,4,1,IHLLEN,HLTAB)
            overly(4) = .false.
        endif

ctw---  Range rings not yet stored in parameter file and
ctw---  properly recovered.  overly(5) may be random.
c        if (rrgseg.le.0) overly(5) = .false.

c       Satellite coverage not yet stored in parameter file and
c       properly recovered.  overly(6) may be random.
c        if (scvseg.le.0) overly(6) = .false.

 100    continue
        if(ltonov(1))
     +          call hilite(.true.,1,1,IHLLEN,HLTAB)
        if(ltonov(2))
     +          call hilite(.true.,2,1,IHLLEN,HLTAB)
        if (overly(2))
     +          call hilite(.true.,3,1,IHLLEN,HLTAB)
        if (overly(4))
     +          call hilite(.true.,4,1,IHLLEN,HLTAB)
c        if (overly(5))
c     +          call hilite(.true.,5,1,IHLLEN,HLTAB)
c        if (overly(6))
c     +          call hilite(.true.,6,1,IHLLEN,HLTAB)
        mysegn = 4
        call mpick(ichoic,mysegn,ibuttn)
        if (ichoic.eq.1.or.ichoic.eq.2) then
                if (ichoic.eq.1) ix = 21
                if (ichoic.eq.2) ix = 22
c**
c**             check for display overlay data.
c**             if so, use ltonov instead of lton.
c**
                segno = firseg + ix
c**
c**             set dseg to seg# of overlay (ovix=1) or df (ovix=2)
c**
                ovix = ix - 20
                if(ovix .eq. 1) then
                    dseg = ovseg
                else
                    dseg = dfseg
                endif
                if(ltonov(ovix)) then
                    ltonov(ovix) = .false.
                    call hilite(.false.,ichoic,1,IHLLEN,HLTAB)
                    call jvisbl (dseg, 0)
C                    if(ovix .eq. 1)then
```

```
C                   call jpurge(ampseg)
C                endif
                 if(ovix .eq. 2)then
                     call drwamp(' ',0)
                 endif
             else
                 ltonov(ovix) = .true.
                 call hilite(.true.,ichoic,1,IHLLEN,HLTAB)
c ***            Remove interrogation of segment because when map is changed,
c                the segment is no longer displayed.  The feature is always
c                displayed when this feature is selected now.
c                if (issegm(dseg)) then
c                    call jvisbl (dseg, 1)
c                else
                     call drawf(ix)
c                endif
             endif
             call menupr
        else if (ichoic.eq.3) then
             if (overly(2)) then
                 overly(2) = .false.
                 call hilite(.false.,ichoic,1,IHLLEN,HLTAB)
                 call jvisbl(sclseg,0)
             else
                 overly(2) = .true.
                 call hilite(.true.,ichoic,1,IHLLEN,HLTAB)
                 call mapovr
             endif
             call menupr
        else if (ichoic.eq.4) then
c ------------- Classification menu
             QNEXTM = 019
             QSTMNU = .TRUE.
             RFLAG = .TRUE.
        else if (ichoic.eq.5) then
c             if (overly(5)) then
c                 overly(5) = .false.
c                 call hilite(.false.,ichoic,1,IHLLEN,HLTAB)
c                 call jvisbl(rrgseg,0)
c             else
                 overly(5) = .true.
                 call hilite(.true.,ichoic,1,IHLLEN,HLTAB)
                 call ranger
                 call hilite(.false.,ichoic,1,IHLLEN,HLTAB)
c             endif
             call menupr
        else if (ichoic.eq.6) then
             overly(6) = .true.
             call hilite(.true.,ichoic,1,IHLLEN,HLTAB)
             call satcov
             call hilite(.false.,ichoic,1,IHLLEN,HLTAB)
             call menupr
        else
             call check(ibuttn,mysegn,error,rflag)
        endif
        if (sys)
     +  print*,'ovrcon--ibuttn mysegn error',ibuttn,mysegn,error,rflag
        if(.not.rflag) go to 100
c
        return
        end


C+*+*+*+*+*+*+*+*+*+*+*+*+*+*+*+*+*+*+*+*+*+*+*+*+*+*+*+*+*+*+*+*+*|*+*+*+*+
c  UNIT NAME:                  PROCON
c
c  Functional Description:
c       this subroutine processes the map projection menu
c
c  Input Files/Parameters:
c
c  Output Files/Parameters:
c
c  Subroutines/Functions Called:
```

```
c      check                    checks the value of the button re-
c                               turned from a pick or locate
c      hilite                   highlights menu choices by drawing
c                               a box around them
c      mpick                    routine to pick from the menu
c      eramap                   erases the map area
c
c  Called By:                   SUBCAL
c
c  Local Variables:
c
c  Restrictions:
c
c  Abnormal Return Conditions:
c
c  Location:
c
c  Programmer               Date of Last Change        Reason for Change
c    Tom Wescott (NOSC)     Mar 7, 88                  Expanded menu.
C-*-*-*-*-*-*-*-*-*-*-*-*-*-*-*-*-*-*-*-*-*-*-*-*-*-*-*-*-*-*-*-*-*-*-*-*|*-*-*-*-

       subroutine procon

c      this subroutine processes the map projection menu

       parameter (ITEMS=19)
       Integer qnextm,HLTAB(2*ITEMS+2)
       Logical qcancl,qext2m,qretrn,qstmnu
       Common /b1/ qcancl,qext2m,qretrn,qstmnu,qnextm
       logical sys
       common /sysdbc/ sys
       logical qexitg
       Common /b5/ qexitg
       character*50 defpth
       common /defpth/ defpth
       common /lendef/ lendef
       logical error,rflag
c      map parameters
       logical lton(16),dotem
       integer ipgrid(4),ltyptb(16)
       common /map/ XRNM,XC,YC,LEVEL,CLAT,CLON,XRAD,YRAD,ITPROJ,
     +     IRES,LTYPTB,LUNDAT,LUNIND,LUNLIN,LTON,IPGRID,DOTEM,
     +     ORHALT
       data HLTAB/0,0,0,9,0,10,0,11,0,6,0,1,0,12,0,8,0,7,0,13,0,14,0,
     + 4,0,5,0,15,0,16,0,18,0,19,0,17,0,2,0,3/
c
c      menu call parameters for menu,legend,system area, graphics area
c      lower left x,y, upper right x,y, background and outline color indexs
c
c   Map Projection Menu:
C          ITEM#    PROJECTION          ITPROJ
C           (1)   Albers Equal-area        9
C           (2)   Azimuthal Equal-area    10
C           (3)   Azimuthal Equidistant   11
C           (4)   Equirectangular          6
C           (5)   Gnomonic                 1
C           (6)   Kavraisky IV            12
C           (7)   Lambert Conformal        8
C           (8)   Mercator                 7
C           (9)   Miller                  13
C          (10)   Oblique Mercator        14
C          (11)   Orthographic             4
C          (12)   Perspective              5
C          (13)   Polar Stereographic     15
C          (14)   Polyconic               16
C          (15)   Sinusoidal              18
C          (16)   Stereographic           19
C          (17)   UTM                     17
C          (18)   Ortho. Equatorial        2
C          (19)   Ortho. Polar             3
C
      IHLLEN = 2*ITEMS+2
      rflag = .false.
      qcancl = .false.
      qext2m = .false.
```

```
      qretrn = .false.
      qstmnu = .false.
100   continue
          call menupr
          mysegn = 5
          call hilite(.true.,itproj,1,IHLLEN,HLTAB)
          call mpick(ichoic,mysegn,ibuttn)
          if (ichoic.ge.1.and.ichoic.le.ITEMS) then
              if(itproj.ne.ichoic) then
                      call hilite(.false.,itproj,1,IHLLEN,HLTAB)
                      itproj = ichoic
                      call hilite(.true.,ichoic,1,IHLLEN,HLTAB)
                      call drwmap
              endif
          else
              call check(ibuttn,mysegn,error,rflag)
          endif
          if (sys)
     +    print*,'procon--ibuttn mysegn error',ibuttn,mysegn,error,rflag
      if(.not.rflag) go to 100
c
      return
      end

C+*+*+*+*+*+*+*-*+*+*+*+*+*+*+*+*+*+*+*+*+*+*+*+*+*+*+*+*+*+*+*+*+*+*|*+*+*+*+
c  UNIT NAME:                   recdis
c
c  Functional Description:
c       recall display menu controller
c
c  Input Files/Parameters:
c
c  Output Files/Parameters: N/A
c
c  Subroutines/Functions Called:
c
c  Called By: subcal
c
c  Local Variables: N/A
c
c  Restrictions: N/A
c
c  Abnormal Return Conditions:  N/A
c
c  Location:
c
c  Programmer       Date of Last Change     Reason for Change
C  L. McCleary      Jan 1988               delete call eramap - recdis
c  S. Lamb          Feb 1988               detec chg - recdis
c  S. Lamb          Aug 1988               allow DrawMap sel - recdis
c
C-*-*-*-*-*-*-*-*-*-*-*-*-*-*-*-*-*-*-*-*-*-*-*-*-*-*-*-*-*-*-*-*-*-*-*|*-*-*-*-
c
        subroutine recdis

c       recall display menu controller

        integer istats(19)
        common /commen/xllmen,yllmen,xurmen,yurmen,ibcmen,iocmen,incmen
        Integer qnextm,HLTAB(21)
        Logical qcancl,qext2m,qretrn,qstmnu
        Common /b1/ qcancl,qext2m,qretrn,qstmnu,qnextm
        logical error,rflag
        logical sys
        common /sysdbc/ sys
        logical bitmod
        common /bitmod/ bitmod
        character*80 filen
        character*80 savdes(20),line
        common /savdes/ savdes
        common /maxsav/ maxsav,limsav
        logical qmapup
        common /mapup/qmapup
        character*50 defpth
```

```
      common /defpth/ defpth
      common /lendef/ lendef
      common /txtsz/ txtsiz
      character*20 savcha
      common /isegn/ isegn

      data savcha/'123456789abcdefghijk'/
      data IHLLEN/21/
      data HLTAB/0,1,2,3,4,5,6,7,8,9,10,11,12,13,14,15,
     + 16,17,18,19,20/

c
c     RECALL DISPLAY
c     1
c     2
c     3
c     4
c     5
c     6
c     7
c     8
c     9
c    10
c    11
c    12
c    13
c    14
c    15
c    16
c    17
c    18
c    19
c    20
c
      rflag = .false.
      qcancl = .false.
      qext2m = .false.
      qretrn = .false.
      qstmnu = .false.

 100  continue
      mysegn = 20
      call menvpt
      call menwin
      call getseg (isegn)
      call jropen (isegn)
      x = xllmen + 2.
      do 110 i=1,maxsav
          call jpkid (i)
          call jcolor (24)
          y = yurmen - 2. - i * 2.
          call jmove (x,y)
          if (sys) print*,'recdis -- ',i,x,y,savdes(i)
          call xsize (1.,1.)
          line = savdes(i)
          call jlstrg (line(1:20))
 110  continue
      call jrclos
      call jdetec(isegn, 1)
      call mesg (1245)
      call npick(ichoic,mysegn,ibuttn,isegn)
      if (ichoic.ge.1.and.ichoic.le.maxsav) then
          filen = defpth(1:lendef) // 'save'
     +    // savcha(ichoic:ichoic)
          lenfn = lendef + 5
          if (sys) print*,'recdis -- ',filen(1:lenfn),lenfn
          call rparam (lenfn,filen,.true.,ierror)
          if (ierror .eq. 0) then
              call mesg(1221)
c              call eramap
              call enall
              if (bitmod) then
                  call recdat (filen,lenfn)
                  call mapper (.false.)
```

```
              CALL MAPOVR
           else
              call drwmap
           endif
           qmapup = .true.
        else
           call mesg(1230)
           call paws
           call jpurge (isegn)
        endif
     else
        call check(ibuttn,mysegn,error,rflag)
        call jisgmt(isegn,istats)
c             --purge seg if not alrdy deleted due to oper selec
        if (istats(1).ne.0) call jpurge (isegn)
     endif
     if(.not.rflag) go to 100
c
     return
     end

C+*+*+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:                      rescon
c
c  Functional Description:
c       process save/restore menu
c
c  Input Files/Parameters:
c
c  Output Files/Parameters: N/A
c
c  Subroutines/Functions Called:
c
c  Called By: subcal
c
c  Local Variables: N/A
c
c  Restrictions: N/A
c
c  Abnormal Return Conditions:  N/A
c
c  Location:
c
c  Programmer      Date of Last Change     Reason for Change
C  L. McCleary     Jan 1988                fix call setcol - rescon
c
C-*-*-*-*-*-*-*-*-*-*-*-*-*-*-*-*-*-*-*-*-*-*-*-*-*-*-*-*-*-*-*-*-*-*-*-*-*|*-*-*-*-
c
      subroutine rescon

c     this subroutine processes the save/restore selections

      common /tablet/ inpdev
      common /commvp/ xllmvp,yllmvp,xurmvp,yurmvp
      common/scratr/qbox,qbkgrd
      integer     qbox,qbkgrd
      character*50 chatmp
      character*50 defpth
      common /defpth/ defpth
      common /lendef/ lendef
      Integer qnextm,HLTAB(35)
      Logical qcancl,qext2m,qretrn,qstmnu
      Common /b1/ qcancl,qext2m,qretrn,qstmnu,qnextm
      logical error,rflag
      logical qexitg
      Common /b5/ qexitg
      character * 25 retstr
      real hlscol(3,0:255)
      common /hlscol/ hlscol
      integer menclr
      integer mencol
      logical sys
      common /sysdbc/ sys
```

```
c       map parameters
        logical lton(16),dotem
        integer ipgrid(4),ltyptb(16)
        common /map/ XRNM,XC,YC,LEVEL,CLAT,CLON,XRAD,YRAD,ITPROJ,
     +      IRES,LTYPTB,LUNDAT,LUNIND,LUNLIN,LTON,IPGRID,DOTEM,
     +      ORHALT
        logical qmapup
        common /mapup/qmapup
        logical bitmod
        common /bitmod/ bitmod
        data IHLLEN/35/
        data HLTAB/0,0,0,0,1,1,0,2,2,0,0,0,0,0,0,3,0,4,0,5,
     +       0,0,0,0,0,0,6,0,7,0,8,0,9,0,0/
        data MENCLR /10/
        data MENCOL /8/

c       menu call parameters for menu,legend,system area, graphics area
c       lower left x,y, upper right x,y, background and outline color indexs
c    Save/Restore
c      parameters
c    1 Save
c        display
c    2 Restore
c        display
c    Set to system
c      defaults
c    3 Colors
c    4 Map params.
c    5 Boundaries
c     Set to user
c        values
c    6 Colors
c    7 Map params.
c    8 Boundaries
c    9 Alter color
c    0 Save colors

        rflag = .false.
        qcancl = .false.
        qext2m = .false.
        qretrn = .false.
        qstmnu = .false.
        mysegn = 8
 100    continue
            call menupr
            call mpick(ichoic,mysegn,ibuttn)
            if (ichoic .ge. 1 .and. ichoic .le. 9) then
                call hilite(.true.,ichoic,1,IHLLEN,HLTAB)
            endif
            if (ichoic.eq.1) then
c               save display
                call prompt(1219,retstr,25,irchar)
                if (irchar.gt.0) then
                    call mesg (1220)
                    call sparam (irchar,retstr,.true.,ierror)
                    if (bitmod) call savdat (retstr,irchar)
                endif
            else if (ichoic.eq.2) then
c               recall display
                call prompt (1208,retstr,25,irchar)
                if (irchar.gt.0) then
                    call mesg (1221)
                    call rparam (irchar,retstr,.true.,ierror)
                    if (ierror .eq. 0) then
c****CSL*not needed since drwmap calls eramap*
c                        call eramap
                        if (bitmod) then
                            call recdat (retstr,irchar)
                        else
                            call drwmap
                        endif
                        qmapup = .true.
                    else
                        call mesg(1230)
```

```
                    call paws
                endif
            endif
        else if (ichoic.eq.3) then
            call mesg (1222)
            chatmp = defpth(1:lendef) // 'default'
            call rcolor (lendef+7,chatmp)
        else if (ichoic.eq.4) then
            call mesg (1223)
            chatmp = defpth(1:lendef) // 'default'
            call rparam (lendef+7,chatmp,.false.,ierror)
            call eramap
        else if (ichoic.eq.5) then
c           call mesg (1224)
            chatmp = defpth(1:lendef) // 'default'
            call rbound (lendef+7,chatmp,.false.)
        else if (ichoic.eq.6) then
            call prompt (1208,retstr,25,irchar)
            if (irchar.gt.0) then
                call mesg (1222)
                call rcolor (irchar,retstr)
            endif
        else if (ichoic.eq.7) then
            call prompt (1208,retstr,25,irchar)
            if (irchar.gt.0) then
                call mesg (1223)
                call rparam (irchar,retstr,.false.,ierror)
                call eramap
            endif
        else if (ichoic.eq.8) then
            call prompt (1208,retstr,25,irchar)
            if (irchar.gt.0) then
                call rbound (irchar,retstr,.false.)
            endif
        else if (ichoic.eq.9) then
            call prompt (1225,retstr,25,irchar)
            if (irchar.le.0) go to 155
            read (retstr(1:irchar),1200,err=150) icol
 1200       format(i3)
            if (sys) print*,'Color index selected: ',icol
            if (icol.ge.0.and.icol.le.255) then
                call mesg (1226)

c**             clearing menu area
                call drawm (MENCLR,ierror)
                call jvport (xllmvp,xurmvp,yllmvp,yurmvp)
                call enall
c                call setcol (icol,8,248,22,qbkgrd,qbox,
                call setcol (icol,6,248,22,qbkgrd,qbox,
     +          hlscol(1,icol))
c                call boxclr
                call soverl
c**             bring back save/restore menu
                call drawm (MENCOL,ierror)
            endif
            go to 155
  150           continue
                call mesg(1227)
                if (sys)
     +          print*,'Error on color index conversion',icol,
     +          irchar,'  ',retstr(1:irchar)
                call paws
  155       continue
c         else if (ichoic.eq.10) then
c             call prompt(1208,retstr,25,irchar)
c             if (irchar.gt.0) then
c                 call mesg (1228)
c                 call scolor (retstr,irchar)
c             endif
        else
            call check(ibuttn,mysegn,error,rflag)
        endif
    call hilite(.false.,ichoic,1,IHLLEN,HLTAB)
    if(.not.rflag) go to 100
```

```
      return
      end

C+++++++++++++++++++++++++++++++++++++++++++++++++++++++++++++++++++++++|+++++++
c  UNIT NAME:               RSLCON
c
c  Functional Description:
c       this subroutine causes map database resolution menu to appear
c
c  Input Files/Parameters:
c
c  Output Files/Parameters:
c
c  Subroutines/Functions Called:
c      check                  checks the value of the button re-
c                             turned from a pick or locate
c      hilite                 highlights menu choices by drawing
c                             a box around them
c      mpick                  routine to pick from the menu
c
c  Called By:                 SUBCAL
c
c  Local Variables:
c
c  Restrictions:
c
c  Abnormal Return Conditions:
c
c  Location:
c
c  Programmer         Date of Last Change       Reason for Change
c  C.S.Lamb           Jan 1988                jclear logic - rslcon
c
C-*-*-*-*-*-*-*-*-*-*-*-*-*-*-*-*-*-*-*-*-*-*-*-*-*-*-*-*-*-*-*-*-*-*-*-*|*-*-*-*-

      subroutine rslcon
c     this subroutine causes map database resolution menu to appear

      Integer qnextm,HLTAB(30)
      Logical qcancl,qext2m,qretrn,qstmnu
      Common /b1/ qcancl,qext2m,qretrn,qstmnu,qnextm
      logical sys
      common /sysdbc/ sys
      logical qexitg
      Common /b5/ qexitg
      logical error,rflag
c     map parameters
      logical lton(16),dotem
      integer ipgrid(4),ltyptb(16)
      common /map/ XRNM,XC,YC,LEVEL,CLAT,CLON,XRAD,YRAD,ITPROJ,
     +    IRES,LTYPTB,LUNDAT,LUNIND,LUNLIN,LTON,IPGRID,DOTEM,
     +    ORHALT
      character*6 curwdb
      common /curwdb/ curwdb
      logical quickd
      common /quickd/ quickd
      integer fntab(17)
      common /fntab/ fntab
      character suffix(6)
      character*6 wdb
      integer itrtab (6)
      integer is

      data IHLLEN/30/
      data HLTAB/0,0,0,0,0,0,0,0,1,0,2,0,3,0,4,0,5,0,6,
     +           0,0,0,0,0,0,0,0,7,0,8/
      data itrtab/1,5,8,11,14,17/
      data suffix/'a','b','c','d','e','f'/
c      1 Most detail
c      2
c      3
c      4
c      5
```

```
c        6 Least detail
c
c          Quickdraw
c
c             On
c             Off
c
      rflag = .false.
      qcancl = .false.
      qext2m = .false.
      qretrn = .false.
      qstmnu = .false.
      do 110 ix = 1,6
          if(curwdb(6:6).eq.suffix(ix)) is = ix
  110 continue

c        if (quickd) then
c          call hilite (.true.,7,1,IHLLEN,HLTAB)
c        else
c          call hilite (.true.,8,1,IHLLEN,HLTAB)
c        endif

c        call hilite (.true.,is,1,IHLLEN,HLTAB)

      mysegn = 7
  100 continue
          if (quickd) then
            call hilite (.true.,7,1,IHLLEN,HLTAB)
          else
            call hilite (.true.,8,1,IHLLEN,HLTAB)
          endif
          call hilite (.true.,is,1,IHLLEN,HLTAB)
          call menupr
          call mpick(ichoic,mysegn,ibuttn)
          if (ichoic.ge.1.and.ichoic.le.6) then
              call hilite(.false.,is,1,IHLLEN,HLTAB)
              call hilite(.true.,ichoic,1,IHLLEN,HLTAB)
c             translate input # to only those wdbii versions available
c             set up both quickdraw and regular wdbii level
              is = fntab (itrtab(ichoic))
              wdb = 'wdbii' // suffix(is)
              if (wdb.ne.curwdb) then
                  curwdb = wdb
                  call chawdb (6,curwdb)
              endif
          else if ( (ichoic.eq.7) .and. (.not.quickd) ) then

c    turn on quickdraw

                 call hilite (.false.,8,1,IHLLEN,HLTAB)
                 call hilite (.true.,7,1,IHLLEN,HLTAB)
                 quickd = .true.
                 call hilite (.false.,is,1,IHLLEN,HLTAB)
                 is = is + 2
                 if (is .gt. 6) is = 6
                 wdb = 'wdbii' // suffix(is)
                 if (wdb.ne.curwdb) then
                   curwdb = wdb
                   call chawdb (6,curwdb)
                 endif
                 call hilite (.true.,is,1,IHLLEN,HLTAB)
          else if ( (ichoic.eq.8) .and. (quickd) ) then

c    turn off quickdraw

                 call hilite (.false.,7,1,IHLLEN,HLTAB)
                 call hilite (.true.,8,1,IHLLEN,HLTAB)
                 quickd = .false.
                 call hilite (.false.,is,1,IHLLEN,HLTAB)
                 is = is - 2
                 if (is .lt. 1) is = 1
                 wdb = 'wdbii' // suffix(is)
                 if (wdb.ne.curwdb) then
                   curwdb = wdb
```

```
              call chawdb (6,curwdb)
            endif
            call hilite (.true.,is,1,IHLLEN,HLTAB)
        else
            call check(ibuttn,mysegn,error,rflag)
        endif
        if (sys)
     +      print*,'rslcon--ibuttn mysegn error',ibuttn,mysegn,rflag
      if(.not.rflag) go to 100
c
      return
      end

C++++++++++++++++++++++++++++++++++++++++++++++++++++++++++++++++++++|+++++++++
C UNIT NAME:                    SAVDIS
C
C FUNCTIONAL DESCRIPTION:       .
C
C CALLED BY:                    SUBCAL
C
C PROGRAMMER:                   DATE OF LAST CHANGE     REASON FOR CHANGE
c  S. Lamb                  Feb 1988                detec chg - savdis
C
C-*-*-*-*-*-*-*-*-*-*-*-*-*-*-*-*-*-*-*-*-*-*-*-*-*-*-*-*-*-*-*-*-*-*|*-*-*-*-

      subroutine savdis

c     save display menu controller

      common /commen/xllmen,yllmen,xurmen,yurmen,ibcmen,iocmen,incmen
      Integer qnextm,HLTAB(21)
      Logical qcancl,qext2m,qretrn,qstmnu
      Common /b1/ qcancl,qext2m,qretrn,qstmnu,qnextm
      logical error,rflag
      logical sys
      common /sysdbc/ sys
      logical bitmod
      common /bitmod/ bitmod
      character*80 filen,line
      character*80 savdes(20)
      common /savdes/ savdes
      common /maxsav/ maxsav,limsav
      character * 80 retstr
      character*50 defpth
      common /defpth/ defpth
      common /lendef/ lendef
      common /txtsz/ txtsiz
      character*20 savcha
      common /isegn/ isegn

      data savcha/'123456789abcdefghijk'/
      data IHLLEN/21/
      data HLTAB/0,1,2,3,4,5,6,7,8,9,10,11,12,13,14,15,
     + 16,17,18,19,20/
c    SAVE DISPLAY
c     1
c     2
c     3
c     4
c     5
c     6
c     7
c     8
c     9
c    10
c    11
c    12
c    13
c    14
c    15
c    16
c    17
c    18
```

```
c   19
c   20

        if (sys) print*,'savdis -- ',maxsav,limsav,'  ',savdes(1)
        rflag = .false.
        qcancl = .false.
        qext2m = .false.
        qretrn = .false.
        qstmnu = .false.

        mysegn = 21
        call menvpt
        call menwin
        call getseg (isegn)
        call jropen (isegn)
        x = xllmen + 2.
        do 110 i=1,maxsav
            call jpkid (i)
            call jcolor (24)
            y = yurmen - 2. - i * 2.
            call jmove (x,y)
            if (sys) print*,'recdis -- ',i,x,y,savdes(i)
            call xsize (1.,1.)
            line = savdes(i)
            call jlstrg (line(1:20))
 110    continue
        call jrclos
        call jdetec(isegn, 1)
100     continue
        call mesg (1245)
        call npick(ichoic,mysegn,ibuttn,isegn)
        if (ichoic.ge.1.and.ichoic.le.maxsav) then
            call prompt(1219,retstr,25,irchar)
            if (irchar.gt.0) then
                savdes(ichoic) = '                    '
                savdes(ichoic) = retstr(1:irchar)
            endif
            filen = defpth(1:lendef) // 'save'
     +      // savcha(ichoic:ichoic)
            lenfn = lendef + 5
            if (sys) print*,'savdis -- ',filen(1:lenfn),lenfn
            call mesg(1220)
            call sparam (lenfn,filen,.true.,ierror)
            if (bitmod) call savdat (filen,lenfn)
            qretrn = .true.
            rflag = .true.
        else
            call check(ibuttn,mysegn,error,rflag)
        endif
        if(.not.rflag) go to 100
        call jpurge (isegn)

        return
        end

C+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                     TRKCON
C
C FUNCTIONAL DESCRIPTION:        .
C
C CALLED BY:                     SUBCAL
C
C PROGRAMMER:                    DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*|*-*-*-*-

        subroutine trkcon

c       this subroutine processes the tracking menu selection

        logical error
        logical rflag
        integer ichoic
```

```
      integer lctrak
      integer mysegn
      integer ibuttn
      integer line
      integer lpp
      integer secnds
      real xarray(2)
      real yarray(2)

      logical lton(16), dotem
      integer ipgrid(4)
      integer ltyptb(16)
      integer HLTAB(22)
      common /map/ XRNM,XC,YC,LEVEL,CLAT,CLON,XRAD,YRAD,ITPROJ,
     +     IRES,LTYPTB,LUNDAT,LUNIND,LUNLIN,LTON,IPGRID,DOTEM,
     +     ORHALT
      integer ltypov(16)
      common /gphwdo/xllgeo,yllgeo,xurgeo,yurgeo

      logical ltonov(16),rankt(26,16)
      common /maptoo/ ltypov,ltonov,rankt

      data secnds /0/
      data IHLLEN /22/
      data HLTAB
     +      /0,0,0,0,0,0,1,0,2,0,0,3,0,4,0,5,0,6,0,7,0,8/

c    Tracking Menu
c       TRACKING
c    1     ON
c    2     OFF
c    3 Plot Suppress
c    4 Plot UnSuppress
c    5 Set Fade Time
c    6 Replay Tracks
c    7 Interrogate
c    8 Display Text
c <<<<   9 Time window  >>>>> omitted


      lctrak = 3
      if (ltonov(lctrak)) then
          line = 1
      else
          line = 2
      endif
      call hilite(.true.,line,1,IHLLEN,HLTAB)

      mysegn = 9
 100  continue
          call menupr

c         choose which line on the menu to hilite

          call mpick(ichoic,mysegn,ibuttn)
          if (ichoic.ge.1.and.ichoic.le.8) then
              if (ichoic .eq. 1 .and. .not. ltonov(lctrak)) then
                  call hilite(.false.,2,1,IHLLEN,HLTAB)
                  call hilite(.true.,ichoic,1,IHLLEN,HLTAB)
                  call ploton
              else if (ichoic .eq. 2 .and. ltonov(lctrak)) then
                  call hilite(.false.,1,1,IHLLEN,HLTAB)
                  call hilite(.true.,ichoic,1,IHLLEN,HLTAB)
                  call pltoff
              else if (ichoic .eq. 3) then
                  call hilite(.true.,ichoic,1,IHLLEN,HLTAB)
                  call pltsup
              else if (ichoic .eq. 4) then
                  call hilite(.true.,ichoic,1,IHLLEN,HLTAB)
                  call pltuns
              else if (ichoic .eq. 5) then
                  call hilite(.true.,ichoic,1,IHLLEN,HLTAB)
                  call setfad
```

```
                  else if (ichoic .eq. 6) then
                      call hilite(.true.,ichoic,1,IHLLEN,HLTAB)
                      call replay(secnds)
                  else if (ichoic .eq. 7) then
                      call hilite(.true.,ichoic,1,IHLLEN,HLTAB)
                      call tquery
                  else if (ichoic .eq. 8) then
                      call hilite(.true.,ichoic,1,IHLLEN,HLTAB)

c                     set up extent of page for text display
c                     put parms in for lower left/upper right
c                     and lines per page.

                      xarray(1) = xllgeo + 1.0
                      xarray(2) = xurgeo - 1.0
                      yarray(1) = yllgeo + 1.0
                      yarray(2) = yurgeo - 1.0
c                      lpp = 36
                      lpp = 33
                     call writex(xarray,yarray,lpp)
                  endif

cccc                  else if (ichoic .eq. 9) then
cccc                      call hilite(.true.,ichoic,1,IHLLEN,HLTAB)
cccc                      call timwin
                  if (ichoic .gt. 2) then
                      call hilite(.false.,ichoic,1,IHLLEN,HLTAB)
                  endif
              else
                  call check(ibuttn,mysegn,error,rflag)
              endif
          if(.not.rflag) go to 100
c         print*,'exit trkcon'
          return
          end
C+*+*+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME: BOXARE
C
C FUNCTIONAL DESCRIPTION:  THIS SUBROUTINE DOES THE BOX AREA CALCUALTIONS
C
C INPUT FILES/PARAMETERS:
C
C GLOBAL VARIABLES :
C
C OUTPUT FILES/PARAMETERS:  NONE.
C
C SUBROUTINES/FUNCTIONS CALLED : NONE.
C
C CALLED BY:                    GEOCON
C
C LOCAL VARIABLES:
C
C RESTRICTIONS: NONE.
C
C ABNORMAL RETURN CONDITIONS:   NONE.
C
C LOCATION:
C
C PROGRAMMER:                   DATE OF LAST CHANGE     REASON FOR CHANGE
C
C     DAVE NATION                                       ORIGINAL CODE.
C     JERRY FENERTY                                     DOCUMENTATION AND MO
C                                                       FOR A21 PROTOTYPE.
C     Tom Wescott (NOSC)        7/88                    xrnmnw from arc dist.
C
C-*-*-*-*-*-*-*-*-*-*-*-*-*-*-*-*-*-*-*-*-*-*-*-*-*-*-*-*-*-*-*-*-*-*-*-*-*-*-*|*-*-*-*-

        SUBROUTINE BOXARE

C       THIS SUBROUTINE DOES THE BOX AREA CALCUALTIONS

C       MAP PARAMETERS
        LOGICAL LTON(16),DOTEM
        INTEGER IPGRID(4),LTYPTB(16)
```

```
      COMMON /MAP/ XRNM,XC,YC,LEVEL,CLAT,CLON,XRAD,YRAD,ITPROJ,
     +    IRES,LTYPTB,LUNDAT,LUNIND,LUNLIN,LTON,IPGRID,DOTEM,
     +    ORHALT

      integer qdsdev,qpydev,qecho,qlecho
      common /device/ qdsdev,qpydev,qecho,qlecho

      LOGICAL INVALI
      COMMON /INVALI/ INVALI

      LOGICAL map
      common /mapdbc/ map

      LOGICAL vax
      common /vaxdbc/ vax

      INTEGER QCRMNU
      COMMON /B6/ QCRMNU

      INTEGER QFB(26),QMB(4)
      COMMON /BUTONS/ QFB,QMB

      LOGICAL QPREV
      COMMON /PREV/ QPREV

      common /pie/ pie,tpie,pio2,pio4

      COMMON /B1/ QCANCL,QEXT2M,QRETRN,QSTMNU,QNEXTM
      INTEGER QNEXTM
      LOGICAL QCANCL,QEXT2M,QRETRN,QSTMNU

      LOGICAL VALID,ERROR,RFLAG

      ERROR = .FALSE.
      RFLAG = .FALSE.
      MYSEGN = QCRMNU

c     CONVERT MINUTES TO RADIANS BY MULTIPLYING BY CM2RAD
      DATA CM2RAD/2.908882087E-4/
c
      CLA = CLAT
      CLO = CLON

 20   CONTINUE
      CALL MESG(275)
      CALL GRAVPT
      CALL GEOWIN
      cursbx = 0.
      cursby = 0.
      call jconwv (cursbx,cursby,0.,vx,vy)
      call jpecho (1,2,1,vx,vy)
      CALL LOCGEO (IBUT,X,Y,VALID)
      cursbx = x
      cursby = y
      IF (IBUT.NE.QMB(1)) THEN
          CALL CHECK(IBUT,MYSEGN,ERROR,RFLAG)
          IF (ERROR) THEN
              CALL MESG(2)
              CALL PAWS
          ENDIF
          IF (RFLAG) GOTO 66
          GOTO 20
      ENDIF
      IF (map)
     + PRINT*,'IN BOXARE FIRST POINT IS ',VALID
      IF (VALID) GOTO 35
      CALL MESG(288)
      CALL PAWS
      GOTO 20

 35   CONTINUE
      CALL MESG(276)
      CALL GRAVPT
```

```
      CALL GEOWIN
      call jconwv (cursbx,cursby,0.,vx,vy)
      call jpecho (1,2,1,vx,vy)
c     --save echo type; set for Rectangle (except for vax)
      ijkl = qlecho
      qlecho = 6
      if (vax) qlecho = 2
      CALL LOCGEO (IBUT,X2,Y2,VALID)
      qlecho = ijkl
      IF (IBUT.NE.QMB(1)) THEN
          CALL CHECK(IBUT,MYSEGN,ERROR,RFLAG)
          IF (ERROR) THEN
              CALL MESG(2)
              CALL PAWS
          ENDIF
          IF (RFLAG) GOTO 66
          GOTO 35
      ENDIF

      IF (map)
     + PRINT*,'IN BOXARE SECOND POINT IS ',VALID
      IF (VALID) GOTO 45
      CALL MESG(288)
      CALL PAWS
      GOTO 35

 45   CONTINUE
      YC = (Y+Y2)/2.
      XC = (X+X2)/2.
c
      CALL INITIA(XC,YC,CLAT,CLON,XRAD,YRAD,ITPROJ,IRES,XRNM,
     +            ORHALT)
      CALL XYTOLL(XC,YC,CLAT,CLON)

      IF (INVALI) THEN
          IF (map)
     +     PRINT*,'BOXARE CONVERSION OF CENTER POINT IS NOT POSSIBLE'
          CALL MESG(288)
          CALL PAWS
          CLAT=CLA
          CLON=CLO
          GOTO 20
      ENDIF

ctfw  CALL XYTOLL(X,YC,CLA2,CLO2)
      call xytoll(x,y,cla2,clo2)

      IF (INVALI) THEN
          IF (map)
     +     PRINT*,'BOXARE CONVERSION OF SECOND POINT IS NOT POSSIBLE'
          CALL MESG(288)
          CALL PAWS
          CLAT=CLA
          CLON=CLO
          GOTO 20
      ENDIF
ctfw  XRNMNW = ABS(CLON-CLO2)/CM2RAD
ctfw
ctfw  Set map radius to arc distance of box semi-major axis.
      call ll2da(clat,clon,cla2,clo2,rdist,az,range,bering)
      xdist = abs(rdist*sin(az))
      ydist = abs(rdist*cos(az))
      dist = amax1(xdist,ydist)
      xrnmnw = dist/cm2rad
ctfw
      CALL CHSCAL (XRNMNW)
      QPREV = .TRUE.

      CALL UPDTMP

 66   CONTINUE
      QRETRN = .FALSE.
      RETURN
      END
```

```
C+++++++++++++++++++++++++++++++++++++++++++++++++++++++++++++++++++++|+++++++
C UNIT NAME:                  DISTAN
C
C FUNCTIONAL DESCRIPTION:     .
C
C CALLED BY:                  GEOCON
C
C PROGRAMMER:                 DATE OF LAST CHANGE     REASON FOR CHANGE
C Tom Wescott  (NOSC)         Mar 89                  improve accuracy
C
C-*-*-*-*-*-*-*-*-*-*-*-*-*-*-*-*-*-*-*-*-*-*-*-*-*-*-*-*-*-*-*-*-*-*-*|*-*-*-*-

        subroutine distan

c       calculate the distance between two points and display

        COMMON /PIE/ PIE,TPIE,PIO2,PIO4
        COMMON /ER/ ER,ERD
        REAL*8 ERD
c       map parameters
        logical lton(16),dotem
        integer ipgrid(4),ltyptb(16)
        common /map/ XRNM,XC,YC,LEVEL,CLAT,CLON,XRAD,YRAD,ITPROJ,
     +      IRES,LTYPTB,LUNDAT,LUNIND,LUNLIN,LTON,IPGRID,DOTEM,
     +      ORHALT
        logical valid
        common /comsys/ xllsys,yllsys,xursys,yursys,ibcsys,iocsys
        COMMON /RADE/RADE
        common /comgvp/ xllgvp,yllgvp,xurgvp,yurgvp
        common /ctext/ igrtxt,isytxt,iantxt
        character*80 line,blanks
        character*72 amptxt(4)
        integer qdsdev,qpydev,qecho,qlecho
        common /device/ qdsdev,qpydev,qecho,qlecho
        INTEGER QFB(26),QMB(4)
        COMMON /BUTONS/ QFB,QMB
        COMMON /B1/ QCANCL,QEXT2M,QRETRN,QSTMNU,QNEXTM
        INTEGER QNEXTM
        LOGICAL QCANCL,QEXT2M,QRETRN,QSTMNU
        LOGICAL ERROR,RFLAG
        common/llseg/llsgmt,llfrst
        integer llsgmt
        logical llfrst

        integer dstsg1,dstsg2,dstsg3
        logical dstfst
        common/mrkseg/dstsg1,dstsg2,dstsg3,dstfst

        data cdg2ml/69./, cml2km/1.60934/, cnm2mi/1.1508/
        data blanks/'                                        '/
        data x1,y1 / 0.,0. /
C
C  THE FOLLOWING TWO DATA STATEMENTS WERE USED TO ADD THE DISPLAY OF
C  DISTANCE/AZ BEARING TO SCREEN
C
        data ernm /3440.34/
        data steps /60/

        valid = .true.

        ERROR = .FALSE.
        RFLAG = .FALSE.
        MYSEGN = QCRMNU
        isytxt = 16
10      call mesg (1201)
        call jvport (xllgvp,xurgvp,yllgvp,yurgvp)
        call jwindo (-xrad,xrad,-yrad,yrad)
        call jconwv (x1,y1,0.,vx,vy)
        call jpecho (1,2,1,vx,vy)
        call locgeo (ibutn,x1,y1,valid)
c
        IF (IBUTN.NE.QMB(1)) THEN
            CALL CHECK(IBUTN,MYSEGN,ERROR,RFLAG)
            IF (ERROR) THEN
```

```
              CALL MESG(2)
              CALL PAWS
          ENDIF
          IF (RFLAG) GOTO 66
          GOTO 10
      ENDIF
c
      if (.not. valid) then
        call mesg(288)
        call paws
        goto 10
      endif
      IF(.NOT. DSTFST)THEN
           CALL JPURGE(DSTSG1)
           CALL JPURGE(DSTSG2)
           CALL JPURGE(DSTSG3)
      ELSE
          CALL GETSEG(DSTSG1)
          CALL GETSEG(DSTSG2)
          CALL GETSEG(DSTSG3)
          DSTFST = .FALSE.
      END IF
      IF(.NOT. LLFRST)THEN
           CALL JPURGE(LLSGMT)
c ----- updated 7/31/87 CSL
           llfrst = .true.
      END IF
      CALL JROPEN(dstsg1)
      CALL JCMARK(4)
      CALL XCOLOR(32)
      CALL jmark (x1,y1)
      CALL JRCLOS
c
      CALL XYTOLL(X1,Y1,plat,plon)
 20   call mesg (1202)
      call jvport (xllgvp,xurgvp,yllgvp,yurgvp)
      call jwindo (-xrad,xrad,-yrad,yrad)
      call jconwv (x1,y1,0.,vx,vy)
      call jpecho (1,2,1,vx,vy)
c     --save echo type; set for Rubberband line
      ijkl = qlecho
      qlecho = 2
      call locgeo (ibutn,x2,y2,valid)
      qlecho = ijkl
c
      IF (IBUTN.NE.QMB(1)) THEN
          CALL CHECK(IBUTN,MYSEGN,ERROR,RFLAG)
          IF (ERROR) THEN
              CALL MESG(2)
              CALL PAWS
          ENDIF
          IF (RFLAG) THEN
c     -- purge the segment containing first marker
              CALL JPURGE(DSTSG1)
c     -- open & close segs so purges (upon reentry) don't fail
              CALL JROPEN(DSTSG1)
              CALL JRCLOS
              CALL JROPEN(DSTSG2)
              CALL JRCLOS
              CALL JROPEN(DSTSG3)
              CALL JRCLOS
              GOTO 66
          ELSE
              GOTO 20
          ENDIF
      ENDIF
      if (.not. valid) then
        call mesg(288)
        call paws
        goto 20
      endif
      CALL JROPEN(dstsg2)
      CALL JCMARK(4)
      CALL XCOLOR(32)
```

```
      CALL JMARK(X2,Y2)
      CALL JRCLOS
c
      CALL XYTOLL(X2,Y2,plat2,plon2)
C
      call ll2da(plat,plon,plat2,plon2,dist,az,range,bering)
      degazi = bering
      rnmiles = range
      rmiles = rnmiles * cnm2mi
      rkilom = rmiles * cml2km
C
C   FOLLOWING CHANGES (ADDITON OF NEXT 8 LINES) WERE NECESSARY TO DISPLAY
C   THE DISTANCE/AZIMUTH BEARING ARC BETWEEN THE TWO POINTS (RPSMITH 11/87)
C
      RINC = XRNM / (ERNM * STEPS)
      AZMTH = DEGAZI / RADE
      RANGE = DIST / RADE
      CALL JROPEN (dstsg3)
      CALL XCOLOR (32)
      iacc = 1
      call plotgc (plat,plon,AZMTH,RANGE,RINC,itproj,iacc)
      CALL JRCLOS
      line = ' '
      line = ' '
      line(1:8) = 'Points: '
      iegeo = 0
      call formt (plat,plon,iegeo,line(9:24))
      iegeo = 0
      call formt (plat2,plon2,iegeo,line(28:43))
      line(25:27) = ' - '
      amptxt(1) = line
      line = ' '
      write(line(1:8),1100) rnmiles
 1100 format(f8.2)
      line(10:13) = 'NM  '
      write(line(14:22),1100) rmiles
      line(24:27) = 'MI  '
      write(line(28:36),1100) rkilom
      line(38:39) = 'KM'
      amptxt(2) = line
      line = ' '
      write(line(1:8),1100) degazi
      line(10:25) = 'Degrees azimuth'
      amptxt(3) = line
      call clrcom
      call drwamp (amptxt,3)

 66   CONTINUE
      QRETRN = .FALSE.
      return
      end

C+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                  FCHAZU
C
C FUNCTIONAL DESCRIPTION:     Updates azimuth of central great circle for
C                             oblique conics.
C INPUT FILES/PARAMETERS:
C
C GLOBAL VARIABLES:           None.
C
C OUTPUT FILES/PARAMETERS:    az    -  Azumuth, degrees.
C                             azlat -  Latitude where azimuth specified.
C
C SUBROUTINES CALLED:         None.
C
C CALLED BY:                   FCHSCA
C
C LOCAL VARIABLES:            None.
C
C RESTRICTIONS:               None.
C
C ABNORMAL RETURN CONDITIONS: None.
```

```
C
C PROGRAMMER:                      DATE OF LAST CHANGE    REASON FOR CHANGE
C     Tom Wescott (NOSC)           May 88                 Original entry.
C
C-*-*-*-*-*-*-*-*-*-*-*-*-*-*-*-*-*-*-*-*-*-*-*-*-*-*-*-*-*-*-*-*-*-*-*-*-*-*|*-*-*-*-

      subroutine fchazu
c
      character*25 retstr
      character*1 str(25)
      equivalence (retstr,str)
      character chr
      common /center/ clat,clon,cclat,sclat
      common /proj/itproj,wmrad,xoffs,yoffs,scalr,notlst
      common /oblm/ polat,polon,az,azlat,gamma,xshift
      parameter(D2R = 3.14159/180.0)
      logical chazsp
      common /chazsp/ chazsp
c
c
*----------------------------------------------------------------------------|--+
* Itproj:  1  2  3  4  5  6  7  8  9 10 11 12 13 14 15 16 17 18 19 20 21   |
*-------------------------------------------------------------------------------+
*          g  o  o  o  p  e  m  l  a  a  a  k  m  o  p  p  u  s  s          |
*          n  r  r  r  e  q  e  a  l  z  z  a  i  b  o  o  t  i  t          |
*          o  e  p  t  r  r  r  m  b  e  e  v  l  l  s  l  m  n  e          |
*          m  q  o  h  s  e  c  c  r  a  d  r  l  m  t  y  z  u  r          |
*-------------------------------------------------------------------------------+
      goto(1,01,01,01,01,01,01,01,01,01,01,01,01,02,01,01,01,01,01
     +    )itproj
c
c     Case 1:  Map is not oblique, set default azumuth for next map.
 1       continue
         az = 0.0
         azlat = 0.0
         go to 99
c
c     Case 2:  Map is oblique, Allow user to override last values.
 2       continue
c        Prompt user for great circle azimuth.
         call prompt(1212,retstr,25,irchar)
         if (irchar.gt.0) then
            call ascint (retstr,iazu,irchar,ierror)
            if(ierror.eq.0) then
               chazsp = .true.
               az = iazu*D2R
c              Prompt for latitude of azimuth specification.
               call prompt(1213,retstr,25,irchar)
               if (irchar.gt.0) then
                  isign = +1
                  chr = str(irchar)
                  if (chr .eq. 'N' .or. chr .eq. 'n') then
                     irchar = irchar - 1
                  elseif (chr .eq. 'S' .or. chr .eq. 's') then
                     isign = -1
                     irchar = irchar - 1
                  endif
               endif
               if (irchar.gt.0) then
                  call ascint (retstr,iazl,irchar,ierror)
                  if (ierror.eq.0) then
                     azlat = isign*iazl*D2R
                  else
                     azlat = clat
                  endif
               endif
            endif
         endif
c
c        Use Law of Sines to verify that the specified great circle reaches
c        to map center latitude.  If not, alert user to the situation.
         sinAZC = sin(Az)*cos(azlat)/cos(clat)
         if (abs(sinAZC).gt.1.0) call mesg(1214)
c
```

```
         go to 99
c
 99      continue
c     End Cases
c
      return
      end


C+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    FCHSCA
C
C FUNCTIONAL DESCRIPTION:       .
C
C CALLED BY:                    GEOCON
C
C PROGRAMMER:                   DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*|*-*-*-*-

        subroutine fchsca

c       change scale and center point function

        character * 25 retstr
        logical rflag

        common /const/ maxval,rmpv,c,r,ernm
        LOGICAL QLTON(16),QDOTEM
        INTEGER QPGRID(4),QTYPTB(16)
        INTEGER QLEVEL,QITPRO,QIRES,QLUNDA,QLUNIN,QLUNLI
        COMMON /MAP/ QXRNM,QXC,QYC,QLEVEL,QCLAT,QCLON,QXRAD,QYRAD,
     +     QITPRO,
     +     QIRES,QTYPTB,QLUNDA,QLUNIN,QLUNLI,QLTON,QPGRID,QDOTEM,
     +     QORHAL
        logical chazsp
        common /chazsp/ chazsp
c
c
c               Change scale value and center point
                CALL PROMPT(1204,retstr,25,irchar)
                call offst (rflag)
                if (irchar.gt.0) then
                    call ascint (retstr,ixr,irchar,ierror)
                    if(ixr.gt.0.and.ierror.eq.0) then
                        if (qitpro .ne. 5) then
c                          User input is viewport width in nm.
                           xrnmnw = ixr/2
                        else
c                          Interpret user input as perspective altitude,
c                          and calculate corresponding viewport width.
                           qorhal = ixr
                           ah = asin(ernm/(qorhal+ernm))
                           er = asin(1.0) - ah
                           xrnmnw = er*ernm
                        endif
                        call chscal (xrnmnw)
                    endif
                endif
c
                chazsp = .false.
c               Update conic std parallels.
                call fchspl
c               Update oblique conic tilt angle.
                call fchazu
c
                if (.not.rflag.or.irchar.gt.0.or.chazsp) then
                    call drwmap
                endif

      return
      end
C+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    FCHSPL
```

```
C
C FUNCTIONAL DESCRIPTION:       Updates conic standard parallels
C                               to map center or to user input.
C
C INPUT FILES/PARAMETERS:       ispl -  User input, degrees.
C
C GLOBAL VARIABLES:             None.
C
C OUTPUT FILES/PARAMETERS:      spll1,spll2  - Standard parallels, radians.
C
C SUBROUTINES CALLED:           None.
C
C CALLED BY:                     FCHSCA
C
C LOCAL VARIABLES:              None.
C
C RESTRICTIONS:                 None.
C
C ABNORMAL RETURN CONDITIONS:   None.
C
C PROGRAMMER:                   DATE OF LAST CHANGE     REASON FOR CHANGE
C     Tom Wescott (NOSC)        Dec 88                  Original entry.
C
C-*-*-*-*-*-*-*-*-*-*-*-*-*-*-*-*-*-*-*-*-*-*-*-*-*-*-*-*-*-*-*-*-*-*-*-*-*|*-*-*-*-

      subroutine fchspl
c
      character*25 retstr
      character*1 str(25)
      equivalence (retstr,str)
      character chr
      common /center/ clat,clon,cclat,sclat
      common /proj/itproj,wmrad,xoffs,yoffs,scalr,notlst
      common /conic/ spll1,spll2,tranl,trank,tranr,tscale,pole,tilt
      logical chazsp
      common /chazsp/ chazsp
c
c
*-----------------------------------------------------------------------|--+
* Itproj:  1  2  3  4  5  6  7  8  9 10 11 12 13 14 15 16 17 18 19 20 21  |
*-------------------------------------------------------------------------+
*          g  o  o  o  p  e  m  l  a  a  a  k  m  o  p  p  u  s  s        |
*          n  r  r  r  e  q  e  a  l  z  z  a  i  b  o  o  t  i  t        |
*          o  e  p  t  r  r  r  m  b  e  e  v  l  l  s  l  m  n  e        |
*          m  q  o  h  s  e  c  c  r  a  d  r  l  m  t  y  z  u  r        |
*-------------------------------------------------------------------------+
     goto(1,01,01,01,01,01,01,02,02,01,01,02,01,01,01,01,01,01,01
    +     )itproj
c
c     Case 1:  Map is not a conic, prepare default parallels for next conic.
 1       continue
         spll1 = clat
         spll2 = spll1
         go to 99
c
c     Case 2:  Map is a conic, Allow user to override last values.
 2       continue
         d2r = 3.14159/180.
c
c        Prompt user for first parallel.
         call prompt(1248,retstr,25,irchar)
         if (irchar.gt.0) then
            isign = +1
            chr = str(irchar)
            if (chr .eq. 'N' .or. chr .eq. 'n') then
               irchar = irchar - 1
            elseif (chr .eq. 'S' .or. chr .eq. 's') then
               isign = -1
               irchar = irchar - 1
            endif
         endif
         if (irchar.gt.0) then
            call ascint (retstr,ispl,irchar,ierror)
            if(ierror.eq.0) then
```

```
                chazsp = .true.
                spll1 = isign*ispl*d2r
c
c               Set new default 2nd parallel and prompt again.
                spll2 = spll1
                call prompt(1249,retstr,25,irchar)
                if (irchar.gt.0) then
                   isign = +1
                   chr = str(irchar)
                   if (chr .eq. 'N' .or. chr .eq. 'n') then
                      irchar = irchar - 1
                   elseif (chr .eq. 'S'.or. chr .eq. 's') then
                      isign = -1
                      irchar = irchar - 1
                   endif
                endif
                if (irchar.gt.0) then
                   call ascint (retstr,ispl,irchar,ierror)
                   if (ierror.eq.0) then
                      spll2 = isign*ispl*d2r
                   endif
                endif
             endif
          endif
          go to 99
c
 99       continue
c     End Cases
c
      return
      end


C+*+*+*+*+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                         LLCENT
C
C FUNCTIONAL DESCRIPTION:            .
C
C CALLED BY:                         OFFST
C
C PROGRAMMER:                        DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*-*-*-*-*|*-*-*-*-

        subroutine llcent (rflag)

c       this subroutine prompts for a new center of the map in
c       lat/lon format (jit)

        integer          err
        integer          qires
        integer          qitpro
        integer          qlevel
        integer          qlunda
        integer          qlunin
        integer          qlunli
        integer          qpgrid(4)
        integer          qtyptb(16)

        real             lat
        real             lon

        character*50     strng

        logical          qlton(16)
        logical          qdotem
        logical          rflag

        common /map/ qxrnm, qxc, qyc, qlevel, qclat, qclon,
     +               qxrad, qyrad, qitpro, qires, qtyptb, qlunda,
     +               qlunin, qlunli, qlton, qpgrid, qdotem, qorhal

   10   continue
        call prompt(1243, strng, 50, len)
```

```
c       if there is a value and not just <ret>

        if (len .gt. 0) then
           call tocaps(strng,len)
           call lltord(strng(1:len), len, lat, lon, err)
           if (err .gt. 0) then
               call mesg(1244)
               call paws
               goto 10
           endif

c          change map parameters to new center coordinates

           qclat = lat
           qclon = lon
c           call updtmp
        else
           rflag = .true.
        endif

        return
        end

C+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME: LLSHOW
C
C FUNCTIONAL DESCRIPTION:  LLSHOW IS RESPONSIBLE FOR PRINTING THE LATITUDE
C                          AND LONGITUDE OF A POINT ON THE MAP
C                          IN THE COMMUNICATIONS AREA.
C
C INPUT FILES/PARAMETERS:  NONE.
C
C GLOBAL VARIABLES :
C
C        QFB(26)              INTEGER     FUNCTION BUTTON VALUES
C        QMAPUP               LOGICAL     INDICATES WHETHER MAP IS CURRENTLY
C                                         DISPLAYED.
C        INVALI               LOGICAL     INDICATES IF POINT CHOSEN WAS
C                                         CONVERTED FROM X,Y TO LAT/LONG.
C
C OUTPUT FILES/PARAMETERS:  NONE.
C
C SUBROUTINES/FUNCTIONS CALLED : MESG
C
C         MESG                PRINTS MESSAGE IN COMMUNICATIONS AREA.
C         PAWS                PAUSES TILL USER INPUT.
C         GEOWIN              SETS GEOGRAPHIC WINDOW.
C         GRAVPT              SETS GEOGRAPHIC VIEWPORT.
C         LOCGEO              RETURNS WORLD COORDINATES OF POINT PICKED
C                             BY THE USER. (GEOGRAPHIC AREA)
C         XYTOLL              CONVERTS X,Y TO LAT/LONG.
C         FORMT               FORMATS RADIANS INTO LAT/LONG STRING.
C         MESSAG              PRINTS CHARACTER STRING IN COMMUNICATIONS
C                             AREA.
C
C CALLED BY: CHECK.
C
C LOCAL VARIABLES:
C
C       XLAT                  REAL         LATITUDE OF POINT.
C       XLON                  REAL         LONGITUDE OF POINT.
C       GEOSTR                CHARACTER*20 LAT/LONG STRING RETURNED FROM FORMT.
C       STRING                CHARACTER*80 MESSAGE TO BE PRINTED IN
C                                                COMMUNICATIONS AREA.
C       VALID                 LOGICAL      INDICATES WHETHER POINT CHOSEN IS
C                                                IN MAP AREA.
C       IEGEO                 INTEGER      ERROR CONDITION FROM FORMT.
C
C RESTRICTIONS: NONE.
C
C ABNORMAL RETURN CONDITIONS:   NONE.
C
```

```
C LOCATION:                        /ul/a21/gjf/LLSHOW.FTN
C
C PROGRAMMER:                      DATE OF LAST CHANGE     REASON FOR CHANGE
C
C     GJFenerty
c  L McCleary                      1987            call jpecho - llshow
C
C-*-*-*-*-*-*-*-*-*-*-*-*-*-*-*-*-*-*-*-*-*-*-*-*-*-*-*-*-*-*-*-*-*-*-*-*-*|*-*-*-*-

        SUBROUTINE LLSHOW

C  SUBROUTINE TO DETERMINE THE LAT/LONG COORDINATES OF A POINT ON
C  THE MAP.

        INTEGER QFB(26),QMB(4)
        COMMON /BUTONS/ QFB,QMB

        LOGICAL QMAPUP
        COMMON /MAPUP/ QMAPUP

        LOGICAL INVALI
        COMMON /INVALI/ INVALI

        INTEGER QCRMNU
        COMMON /B6/ QCRMNU

        COMMON /B1/ QCANCL,QEXT2M,QRETRN,QSTMNU,QNEXTM
        INTEGER QNEXTM
        LOGICAL QCANCL,QEXT2M,QRETRN,QSTMNU
        common/llseg/llsgmt,llfrst
        integer llsgmt
        logical llfrst
        integer dstsg1,dstsg2,dstsg3
        logical dstfst
        common/mrkseg/dstsg1,dstsg2,dstsg3,dstfst

        REAL XLAT,XLON
        CHARACTER*20 GEOSTR
        CHARACTER*80 STRING
        LOGICAL VALID,ERROR,RFLAG
        INTEGER IEGEO

        data x,y /0.,0./

        MYSEGN = QCRMNU
        RFLAG = .FALSE.
        ERROR = .FALSE.

        STRING(1:80) = ' '
        GEOSTR = ' '
        IEGEO = 0
        STRING(1:29) = 'The LAT/LONG coordinates are '
44      CONTINUE
        CALL MESG(297)
        CALL GEOWIN
        CALL GRAVPT
        call jconwv (x,y,0.,vx,vy)
        call jpecho (1,2,1,vx,vy)
        CALL LOCGEO (IBUT,X,Y,VALID)

C       ** IF LEAVE BUTTON EXIT SUBROUTINE          **
C       ** IF PICK IS INVALID, PRINT ERROR MESSAGE **
C       ** AND ALLOW USER TO REPICK POINT.          **

        IF (IBUT.NE.QMB(1)) THEN
            CALL CHECK(IBUT,MYSEGN,ERROR,RFLAG)
            IF (ERROR) THEN
                CALL MESG(2)
                CALL PAWS
            ENDIF
            IF (RFLAG) GOTO 66
            GOTO 44
        ENDIF
```

```
      IF (VALID) GOTO 38
      CALL MESG(288)
      CALL PAWS
      GOTO 44

38    CONTINUE
      CALL GEOWIN
      CALL GRAVPT

C CONVERT X,Y TO LAT/LONG (RADIANS) THEN TO DDMMSS TYPE CHARACTER STRING.

      CALL XYTOLL(X,Y,XLAT,XLON)

      IF (.NOT.INVALI) THEN
          IF(.NOT. DSTFST)THEN
             CALL JPURGE(DSTSG1)
             CALL JPURGE(DSTSG2)
             CALL JPURGE(DSTSG3)
c ----- updated 7/31/87 CSL                                - llshow
             dstfst = .true.
          END IF
          IF(LLFRST)THEN
              CALL GETSEG(LLSGMT)
              LLFRST = .FALSE.
          ELSE
              CALL JPURGE(LLSGMT)
          END IF
          CALL JROPEN(LLSGMT)
          CALL JCMARK(4)
          CALL XCOLOR(104)
          CALL JMARK(X,Y)
          CALL JRCLOS

          CALL FORMT (XLAT,XLON,IEGEO,GEOSTR)
C IF THERE ARE NO CONVERSION ERRORS PRINT CHARACTER STRING.

          IF (IEGEO.EQ.0) THEN

              STRING(30:50) = GEOSTR
              CALL MESSAG(STRING,50,1)
              CALL JOPEN
              CALL JCMARK(4)
              CALL XCOLOR(104)
              CALL JMARK(X,Y)
              CALL JCLOSE

          ELSE

c            PRINT*,'ERROR IN LLIMIT',IEGEO,GEOSTR
             CALL MESG(288)
             CALL PAWS

          ENDIF

      ELSE

          CALL MESG(288)
          CALL PAWS

      ENDIF

   66 CONTINUE

      QRETRN = .FALSE.

      RETURN
      END

C+++++++++++++++++++++++++++++++++++++++++++++++++++++++++++++++++++++++|+++++++
C UNIT NAME: OFFST
C
C FUNCTIONAL DESCRIPTION:  OFFSETS CENTER POINT OF MAP.
```

```
C
C INPUT FILES/PARAMETERS:  NONE.
C
C GLOBAL VARIABLES :
C
C       QFB                   INTEGER(26) FUNCTION BUTTON VALUES.
C       INVALI                LOGICAL     INDICATES WHETHER CONVERSION
C                                         WAS INVALID.
C       QXC                   REAL        X CENTER OF MAP (WORLD COORD.).
C       QYC                   REAL        Y CENTER OF MAP (WORLD COORD.).
C       QCLAT                 REAL        LATITUDE AT CENTER (RADIANS).
C       QCLON                 REAL        LONGITUDE AT CENTER (RADIANS).
C       QXRAD                 REAL        WIDTH OF HALF OF VIEWPORT.
C       QYRAD                 REAL        HEIGTH OF HALF OF VIEWPORT.
C       QITPRO                INTEGER     CURRENT PROJECTION.
C       QIRES                 REAL        RESOLUTION.
C       QXRNM                 REAL        RADIUS OF MAP (NAUTICAL MILES).
C       QORHAL                REAL        ALTITUDE FOR PERSPECTIVE PROJECTIO
C
C
C OUTPUT FILES/PARAMETERS:  NONE.
C
C SUBROUTINES/FUNCTIONS CALLED :
C
C       GRAVPT                SETS GEOGRAPHY VIEWPORT.
C       GEOWIN                SETS GEOGRAPHY WINDOW.
C       MESG                  PUTS MESSAGE IN COMMUNICATIONS AREA.
C       PAWS                  CAUSES PAUSE IN PROGRAM.
C       LOCGEO                PERFORMS LOCATE IN GEOGRAPHIC AREA.
C       RDRAW                 REDRAWS MAP.
C       XYTOLL                CONVERTS X,Y TO LAT,LONG.
C       INITIA                INITIALIZES MAP PARAMETERS.
C
C CALLED BY:                    FCHSCA
C
C LOCAL VARIABLES:
C
C       VALID                 LOGICAL     INDICATES IF LOCATE WAS LEGAL.
C       IBUT                  INTEGER     BUTTON USED TO TRIGGER LOCATE.
C       X                     REAL        X COORDINATE OF LOCATE.
C       Y                     REAL        Y COORDINATE OF LOCATE.
C
C RESTRICTIONS: NONE.
C
C ABNORMAL RETURN CONDITIONS:   NONE.
C
C LOCATION:                     /a21/gjf/MAPSRC.FTN
C
C PROGRAMMER:                   DATE OF LAST CHANGE     REASON FOR CHANGE
C
C     DAVE NATION                                       ORIGINAL CODE.
C     JERRY FENERTY                                     DOCUMENT AND MODIFY
C                                                       FOR A21 PROTOTYPE.
C
C-*-*-*-*-*-*-*-*-*-*-*-*-*-*-*-*-*-*-*-*-*-*-*-*-*-*-*-*-*-*-*-*-*-*-*|*-*-*-*-

      SUBROUTINE OFFST (rflag)

C     ALLOWS THE OPERATOR TO OFFSET THE CENTER POINT OF A MAP (not redrawn

C     MAP PARAMETERS

      LOGICAL QLTON(16),QDOTEM
      INTEGER QPGRID(4),QTYPTB(16)
      INTEGER QLEVEL,QITPRO,QIRES,QLUNDA,QLUNIN,QLUNLI

      COMMON /MAP/ QXRNM,QXC,QYC,QLEVEL,QCLAT,QCLON,QXRAD,QYRAD,
     +    QITPRO,
     +    QIRES,QTYPTB,QLUNDA,QLUNIN,QLUNLI,QLTON,QPGRID,QDOTEM,
     +    QORHAL
      LOGICAL INVALI
      COMMON /INVALI/ INVALI

      INTEGER QFB(26),QMB(4)
```

```
      COMMON /BUTONS/ QFB,QMB
      integer qdsdev,qpydev,qecho,qlecho
      common /device/ qdsdev,qpydev,qecho,qlecho
      COMMON /B1/ QCANCL,QEXT2M,QRETRN,QSTMNU,QNEXTM
      INTEGER QNEXTM
      LOGICAL QCANCL,QEXT2M,QRETRN,QSTMNU

      INTEGER QCRMNU
      COMMON /B6/ QCRMNU

      LOGICAL QPREV
      COMMON /PREV/ QPREV

      LOGICAL VALID,RFLAG,ERROR

      data curscx,curscy / 0.,0. /

      ierror = 0
      RFLAG = .FALSE.
      ERROR = .FALSE.
      MYSEGN = QCRMNU

      CLA=QCLAT
      CLO=QCLON

 20   CALL MESG(274)
      CALL GRAVPT
      CALL GEOWIN
      call jconwv (curscx,curscy,0.,vx,vy)
      call jpecho (1,2,1,vx,vy)
      ijkl = qlecho
c     --save echo type; set for Rubberband line
      qlecho = 2
      CALL LOCGEO (IBUT,X,Y,VALID)
      qlecho = ijkl
      IF (IBUT.NE.QMB(1)) THEN
          CALL CHECK(IBUT,MYSEGN,ERROR,RFLAG)
          IF (ERROR) THEN
              CALL MESG(2)
              CALL PAWS
          ENDIF
c
c         If <F8> is pressed, then go on to center by lat/lon
c         selection.  Would exit from there.
c
          IF (RFLAG) THEN
             rflag = .false.
             CALL LLCENT (rflag)
             GOTO 66
          ENDIF
          GOTO 20
      ENDIF
      IF (VALID) GOTO 35
      CALL MESG(288)
      CALL PAWS
      GOTO 20

 35   continue
c 35  CALL INITIA(QXC,QYC,QCLAT,QCLON,QXRAD,QYRAD,QITPRO,QIRES,QXRNM,
c    +            QORHAL)
      CALL XYTOLL(X,Y,QCLAT,QCLON)

      IF (INVALI) THEN

c          PRINT*,'CONVERSION OF NEW CENTER POINT IS
c    + NOT NOW POSSIBLE'
          QCLAT=CLA
          QCLON=CLO
          CALL MESG(288)
          CALL PAWS
          GOTO 20

      ELSE
```

```
      QPREV = .TRUE.

    ENDIF

 66 CONTINUE
    QRETRN = .FALSE.
    RETURN
    END

C++++++++++++++++++++++++++++++++++++++++++++++++++++++++++++++++++++|+++++++
C UNIT NAME:                     RANGER
C
C FUNCTIONAL DESCRIPTION:        MMI for range rings/radials about selected point.
C
C INPUT FILES/PARAMETERS:        User input position, range, #rings, #lines
C
C GLOBAL VARIABLES:              None.
C
C OUTPUT FILES/PARAMETERS:       Graphic segment.
C
C SUBROUTINES CALLED:
C
C CALLED BY:                     ovrcon
C
C LOCAL VARIABLES:
C
C RESTRICTIONS:                  Currently does not redraw like other overlays
C                                as ring data are not saved in parameter file.
C
C PROGRAMMER:                    DATE OF LAST CHANGE    REASON FOR CHANGE
C     Tom Wescott (NOSC)         Jul 88                 Original entry.
C     L. McCleary (NOSC)         Mar 89                 Modify MMI
C
C-*-*-*-*-*-*-*-*-*-*-*-*-*-*-*-*-*-*-*-*-*-*-*-*-*-*-*-*-*-*-*-*-*-*|*-*-*-*-
c
      subroutine ranger
c
      INTEGER QFB(26),QMB(4)
      COMMON /BUTONS/ QFB,QMB
      logical valid
      logical rflag, error
      character * 25 retstr
      character * 50 strng
      common /ctext/ igrtxt,isytxt,iantxt
      integer rrgseg
      common /rrgseg/ rrgseg
      data rrgseg /0/
      data ixrnm / 100 /
      data nrings,nlines / 5,8 /

      rflag = .false.
      error = .false.

      rrx = 0.
      rry = 0.
c
c     Get center point for range rings.
c
   10 continue
      call mesg(10)
      call gravpt
      call geowin
      call getseg(rrgseg)
      call jconwv(rrx,rry,0.,vx,vy)
      call jpecho(1,2,1,vx,vy)
      call locgeo(ibutn,rrx,rry,valid)
      IF (IBUTN.NE.QMB(1)) THEN
           CALL CHECK(IBUTN,rrgseg,ERROR,RFLAG)
           IF (ERROR) THEN
               CALL MESG(2)
               CALL PAWS
           ENDIF
           IF (RFLAG) THEN
```

```
          rflag = .false.
          call prompt(11, strng, 50, len)
          if (len .gt. 0) then
              call tocaps(strng,len)
              call lltord(strng(1:len), len, rrlat, rrlon, llerr)
              if (llerr .gt. 0) then
                   call mesg(1244)
                   call paws
                   goto 10
              endif
          else
              rflag = .true.
              go to 900
          endif
          GOTO 16
          ENDIF
          GOTO 10
      ENDIF

      IF (.not.VALID) then
          CALL MESG(288)
          CALL PAWS
          GOTO 10
      endif

      call xytoll(rrx,rry,rrlat,rrlon)
c
c     Specify range incr, nrings, nlines
c
   16 continue
      call prompt(16,retstr,25,irchar)
      if (irchar.gt.0) then
         call ascint (retstr,ixrnm,irchar,ierror)
         if (ixrnm.le.0.or.ierror.ne.0) then
            call mesg(19)
            call paws
            go to 16
         endif
      endif
c
   17 continue
      call prompt(17,retstr,25,irchar)
      if (irchar.gt.0) then
         call ascint (retstr,nrings,irchar,ierror)
         if (nrings.lt.0.or.ierror.ne.0) then
            call mesg(19)
            call paws
            go to 17
         endif
      endif
c
   18 continue
      call prompt(18,retstr,25,irchar)
      if (irchar.gt.0) then
         call ascint (retstr,nlines,irchar,ierror)
         if (nlines.lt.0.or.ierror.ne.0) then
            call mesg(19)
            call paws
            go to 18
         endif
      endif

      call gravpt
      call geowin
      call jropen(rrgseg)
      call xcolor (igrtxt)
c
      call rngrin (rrlon,rrlat,ixrnm,nrings,nlines)

      call jrclos
c
c     allow another ring to be drawn
      goto 10
c
```

```
 900  continue
c
      return
      end

C+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    SATCOV
C
C FUNCTIONAL DESCRIPTION:       Draws satellite coverage area.
C
C INPUT FILES/PARAMETERS:       User input position, altitude,
C                               field of view, look angle from nadir,
C                               azimuth of look angle
C
C GLOBAL VARIABLES:             None.
C
C OUTPUT FILES/PARAMETERS:      Graphic segment.
C
C SUBROUTINES CALLED:           ftprnt
C
C CALLED BY:                    ovrcon
C
C LOCAL VARIABLES:
C
C RESTRICTIONS:                 Currently does not redraw like other overlays
C                               as data are not saved in parameter file.
C
C PROGRAMMER:                   DATE OF LAST CHANGE     REASON FOR CHANGE
C     L. McCleary (NOSC)        Mar 89                  Original entry.
C
C-*-*-*-*-*-*-*-*-*-*-*-*-*-*-*-*-*-*-*-*-*-*-*-*-*-*-*-*-*-*-*-*-*-*-*-*-*|*-*-*-*-
c
      subroutine satcov
c
      INTEGER QFB(26),QMB(4)
      COMMON /BUTONS/ QFB,QMB
      logical valid
      logical rflag, error
      character * 25 retstr
      character * 50 strng
      common /ctext/ igrtxt,isytxt,iantxt
      parameter(D2R = 3.14159/180.0)
      integer scvseg
      common /scvseg/ scvseg
      character*72 amptxt(3)
      data scvseg /0/
      data rotang /0.0/
      data ialt /22300/
      data iafovd /90/
      data itiltd /0/
      data iazid  /0/
      rflag = .false.
      error = .false.

      scx = 0.
      scy = 0.
c
c     Get center point for satellite coverage.
c
   10 continue
      call mesg(10)
      call gravpt
      call geowin
      call getseg(scvseg)
      call jconwv(scx,scy,0.,vx,vy)
      call jpecho(1,2,1,vx,vy)
      call locgeo(ibutn,scx,scy,valid)
      IF (IBUTN.NE.QMB(1)) THEN
          CALL CHECK(IBUTN,scvseg,ERROR,RFLAG)
          IF (ERROR) THEN
              CALL MESG(2)
              CALL PAWS
          ENDIF
```

```
          IF (RFLAG) THEN
              rflag = .false.
              call prompt(11, strng, 50, len)
              if (len .gt. 0) then
                  call tocaps(strng,len)
                  call lltord(strng(1:len), len, scvlat, scvlon, llerr)
                  if (llerr .gt. 0) then
                       call mesg(1244)
                       call paws
                       goto 10
                  endif
              else
                  rflag = .true.
                  go to 900
              endif
              GOTO 12
          ENDIF
          GOTO 10
      ENDIF

      IF (.not.VALID) then
          CALL MESG(288)
          CALL PAWS
          GOTO 10
      endif

      call xytoll(scx,scy,scvlat,scvlon)
c
c     Specify alt, afov, tilt, azi
c
   12 continue
      call prompt(12,retstr,25,irchar)
      if (irchar.gt.0) then
         call ascint (retstr,itemp,irchar,ierror)
         if (itemp.le.0.or.ierror.ne.0) then
            call mesg(19)
            call paws
            go to 12
         else
            ialt = itemp
         endif
      endif
      alt = ialt
c
   13 continue
      call prompt(13,retstr,25,irchar)
      if (irchar.gt.0) then
         call ascint (retstr,itemp,irchar,ierror)
         if (itemp.le.0.or.ierror.ne.0) then
            call mesg(19)
            call paws
            go to 13
         else
            iafovd = itemp
         endif
      endif
      afov = iafovd * d2r
c
   14 continue
      call prompt(14,retstr,25,irchar)
      if (irchar.gt.0) then
         call ascint (retstr,itemp,irchar,ierror)
         if (itemp.lt.0.or.ierror.ne.0) then
            call mesg(19)
            call paws
            go to 14
         else
            itiltd = itemp
         endif
      endif
      tilt = itiltd * d2r
c
   15 continue
      call prompt(15,retstr,25,irchar)
```

```
      if (irchar.gt.0) then
         call ascint (retstr,itemp,irchar,ierror)
         if (ierror.ne.0) then
            call mesg(19)
            call paws
            go to 15
         else
            iazid = itemp
         endif
      endif
      azi = iazid * d2r
c
      amptxt(1) = 'Satellite location: '
      call formt(scvlat,scvlon,0,amptxt(1)(21:))
      write(amptxt(2),22) ialt
 22   format ('Altitude:',I8,' nm.')
      write(amptxt(2)(35:),23) iafovd
 23   format ('Field of view:',I4,' deg.')
      write(amptxt(3),24) itiltd
 24   format ('Look angle from nadir:',I4,' deg.')
      write(amptxt(3)(35:),25) iazid
 25   format ('Azimuth of look angle:',I4,' deg.')
      call drwamp (amptxt,3)
c
      call gravpt
      call geowin
      call jropen(scvseg)
      call xcolor (igrtxt)
c
      XTIE = 0.0
      YTIE = 0.0
      rotang = rotang + .6
      DX = cos(rotang)
      DY = sin(rotang)
      DIST = 5.0
      CALL FTPRNT(scvlon,scvlat,alt,afov,tilt,azi,XTIE,YTIE,DX,DY,DIST)
      call jrclos
c
c     allow another ftprnt
      goto 10
c
 900  continue
c
      return
      end
C+*+*+*+*+*+*+*+*+*+*+*+*+*+*+*+*+*+*+*+*+*+*+*+*+*+*+*+*+*+*+*+*+*+*|*+*+*+*+
C UNIT NAME:                   BL2LL
C
C FUNCTIONAL DESCRIPTION:      Transforms polyline from stereographic
C                              breakline coordinates back to lon,lat.
C
C INPUT FILES/PARAMETERS:      xin,yin       - Polyline in stereographic XY.
C
C GLOBAL VARIABLES:            blclon,blclat - Center of ster. projection.
C
C OUTPUT FILES/PARAMETERS:     plon,plat     - Output polyline in (lon,lat).
C
C SUBROUTINES CALLED:          xpster
C
C CALLED BY:                   blplgn, blplin
C
C LOCAL VARIABLES:
C
C RESTRICTIONS:                None.
C
C ABNORMAL RETURN CONDITIONS:  None.
C
C PROGRAMMER:                  DATE OF LAST CHANGE     REASON FOR CHANGE
C     Tom Wescott (NOSC)       Jan 88                  Original entry.
C
C-*-*-*-*-*-*-*-*-*-*-*-*-*-*-*-*-*-*-*-*-*-*-*-*-*-*-*-*-*-*-*-*-*-*|*-*-*-*-

      subroutine BL2LL(xin,yin,nin,plon,plat)
c
```

```
      real   xin(*),yin(*), plon(*),plat(*)
      common /center/clat,clon,cclat,sclat
      real ax(3),ay(3),bx(3),by(3),alon(3),alat(3),blon(3),blat(3)
      common /break/ blclat,blclon,ax,ay,bx,by,alon,alat,blon,blat
c
c     Save current map center.
      zclat = clat
      zclon = clon
      zcclat = cclat
      zsclat = sclat
c
c     Set center temporarily to the breakline midpoint.
      clon = blclon
      clat = blclat
      cclat = cos(clat)
      sclat = sin(clat)
c
      do 100 i = 1, nin
         call xpster(xin(i),yin(i),plon(i),plat(i))
 100  continue
c
c     Restore map center common.
      clat = zclat
      clon = zclon
      cclat = zcclat
      sclat = zsclat
c
      return
      end

C+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                     BL2XY
C
C FUNCTIONAL DESCRIPTION:        Transforms polyline to a temporary stereo-
C                                graphic projection where breakline clipping
C                                will be performed.
C
C INPUT FILES/PARAMETERS:        plon,plat  - Input polyline in (lon,lat).
C
C GLOBAL VARIABLES:              blclat,blclon  - Center of stereog. projection.
C
C OUTPUT FILES/PARAMETERS:       xout,yout  - Polyline in stereographic (X,Y).
C
C SUBROUTINES CALLED:            pxster
C
C CALLED BY:                     blchk, blplin, blplgn
C
C LOCAL VARIABLES:
C
C RESTRICTIONS:                  none.
C
C ABNORMAL RETURN CONDITIONS:    none.
C
C PROGRAMMER:                    DATE OF LAST CHANGE     REASON FOR CHANGE
C     Tom Wescott  (NOSC)        Jan 88                  Original entry.
C
C-*-*-*-*-*-*-*-*-*-*-*-*-*-*-*-*-*-*-*-*-*-*-*-*-*-*-*-*-*-*-*-*-*-*-*-*-*|*-*-*-*-

      subroutine BL2XY(plon,plat,nin,xout,yout)
c
      real   plon(*),plat(*),xout(*),yout(*)
      common /center/clat,clon,cclat,sclat
      real ax(3),ay(3),bx(3),by(3),alon(3),alat(3),blon(3),blat(3)
      common /break/ blclat,blclon,ax,ay,bx,by,alon,alat,blon,blat
c
c     Save current map center.
      zclat = clat
      zclon = clon
      zcclat = cclat
      zsclat = sclat
c
c     Set center temporarily to the breakline midpoint.
      clon = blclon
```

```
      clat = blclat
      cclat = cos(clat)
      sclat = sin(clat)
c
      call pxster(plon,plat,nin,xout,yout,nout)
c
c     Restore map center common.
      clat = zclat
      clon = zclon
      cclat = zcclat
      sclat = zsclat
c
      return
      end


C++++++++++++++++++++++++++++++++++++++++++++++++++++++++++++++++++++|+++++++
C UNIT NAME:                   BLCHK
C
C FUNCTIONAL DESCRIPTION:      Detects intersection of conic breakline
C                              with a geographic bounding rectangle.
C
C INPUT FILES/PARAMETERS:      alimit(4)    - Geo. rectangle limit array.
C
C GLOBAL VARIABLES:            ax(1),ay(1) - Breakline line segment start.
C                              bx(1),by(1) -     "       "       "    end.
C
C OUTPUT FILES/PARAMETERS:     noclip = .false. with intersection.
C
C SUBROUTINES CALLED:          bl2xy.
C
C CALLED BY:                    DMAPII
C
C LOCAL VARIABLES:             sl            - Sign + for left half plane.
C                              dX, dY, D     - Coefficients of breakline in
C                                              form:    dY*x - dX*y + D = 0
C
C RESTRICTIONS:                Geo. rectangle must span less than pi lon.
C
C ABNORMAL RETURN CONDITIONS:  none.
C
C PROGRAMMER:                  DATE OF LAST CHANGE     REASON FOR CHANGE
C     Tom Wescott (NOSC)       Jan 88                  Original entry.
C
C-*-*-*-*-*-*-*-*-*-*-*-*-*-*-*-*-*-*-*-*-*-*-*-*-*-*-*-*-*-*-*-*-*-*-*|*-*-*-*-

      subroutine BLCHK(noclip,alimit)
c
      real alimit(4)
      logical noclip
      common /pie/ pie,tpie,pio2,pio4
      real ax(3),ay(3),bx(3),by(3),alon(3),alat(3),blon(3),blat(3)
      common /break/ blclat,blclon,ax,ay,bx,by,alon,alat,blon,blat
c
c     Note: Geographic rectangle sides may be curved in a coordinate
c     system where breakline is straight.  Test at least 3 pts per side.
      parameter (NPOINTS = 3)
      real rla(NPOINTS*4),rlo(NPOINTS*4),x(NPOINTS*4),y(NPOINTS*4)
c
cccc
c     Get N,S,E,W sides of rectangle from WDBII limit array.
      rsout = alimit(1)
      rnort = alimit(2)
      rmnlo = alimit(3)
      rmxlo = alimit(4)
      Dlo = rmxlo - rmnlo
      if (Dlo.gt.pie) then
c        Limit array spans the dateline. Convert to continuous coords.
         reast = rmnlo + tpie
         rwest = rmxlo
      else
         reast = rmxlo
         rwest = rmnlo
      endif
```

```
c
c     Load polyline arrays with test points spaced along rectangle border.
      kount = 0
      xincr = (reast-rwest)/(NPOINTS-1)
      yincr = (rnort-rsout)/(NPOINTS-1)
c
      rlon = rwest - xincr
      do 210 icol = 1, NPOINTS
         kount = kount + 1
         rla(kount) = rnort
         rlon = rlon + xincr
         rl = rlon
         if (rl.gt.pie) rl = rl - tpie
         rlo(kount) = rl
 210  continue
c
      rlat = rnort
      do 220 irow = 1, NPOINTS-1
         kount = kount + 1
         rlat = rlat - yincr
         rla(kount) = rlat
         rlo(kount) = reast
 220  continue
c
      rlon = reast
      do 240 icol = 1, NPOINTS-1
         kount = kount + 1
         rla(kount) = rsout
         rlon = rlon - xincr
         rl = rlon
         if (rl.gt.pie) rl = rl - tpie
         rlo(kount) = rl
 240  continue
c
      rlat = rsout
      do 260 irow = 1, NPOINTS-1
         kount = kount + 1
         rlat = rlat + yincr
         rla(kount) = rlat
         rlo(kount) = rwest
 260  continue
c
c
c     Convert test points to breakline coordinate system (x,y).
      call bl2xy(rlo,rla,kount,x,y)
c
c     Compute breakline (also half plane) general form coefficients
c     from directed line segment  (ax(1),ay(1)) to (bx(1),by(1)).
      dY = ay(1) - by(1)
      dX = ax(1) - bx(1)
      D  = ax(1)*by(1) - ay(1)*bx(1)
      d2far = 10.0 * amax1(abs(dX),abs(dY))
c
c     Check polyline segments to find out if any cross the breakline.
      noclip = .true.
      s1 = dY*x(1) - dX*y(1) + D
      do 500 i = 2, kount
         s2 = dY*x(i) - dX*y(i) + D
         if ((s1*s2) .lt. 0.0) then
c           Great circle of the breakline was crossed by the polyline segment.
c           Now test for breakline crossing the line of the segment.
            ddy = y(i-1) - y(i)
            ddx = x(i-1) - x(i)
c           Skip test for segments passing near the breakline antipode.
            if((abs(ddx).lt.d2far).and.(abs(ddy).lt.d2far)) then
               dd = x(i-1)*y(i) - y(i-1)*x(i)
               s3 = ddy*ax(1) - ddx*ay(1) + dd
               s4 = ddy*bx(1) - ddx*by(1) + dd
               if (s3*s4 .lt. 0.0) then
                  noclip = .false.
                  RETURN
               endif
            endif
         endif
```

```
          s1 = s2
 500  continue
c
      return
      end


C+*+*+*+*+*+*+*+*+*+*+*+*+*+*+*+*+*+*+*+*+*+*+*+*+*+*+*+*+*+*+*+*+*+*+|+*+*+*+
C UNIT NAME:                      BLHATC
C
C FUNCTIONAL DESCRIPTION:         Draws a hatch pattern inside a polygon that
C                                 might be clipped by the breakline of a map
C                                 or contain potentially singular points.
C
C INPUT FILES/PARAMETERS:         rla(),rlo() - Input polygon coords.
C                                 nin         - Number of input points.
C                                 xtie,ytie   - Tie point for hatch pattern.
C                                 dx,dy       - direction vector for hatch lines.
C                                 dist        - hatch line spacing (display units)
C
C GLOBAL VARIABLES:               ax(2),ay(2) - Left hemisphere clip line start.
C                                 bx(2),by(2) -    "       "       "     "  end.
C                                 ax(3),ay(3) - Rght hemisphere clip line start.
C
C OUTPUT FILES/PARAMETERS:        Hatched polygon interior.
C
C SUBROUTINES CALLED:             bl2ll, bl2xy, cliplg, hatch, llplxy
C
C CALLED BY:                      ftprnt
C
C LOCAL VARIABLES:                inxt     - linking list for input polygon.
C                                 nxt      - linking list for clipped polygon.
C                                 outply   - pointers to clipped polygon segments.
C
C RESTRICTIONS:                   Blset must have been called to set up breakline.
C
C ABNORMAL RETURN CONDITIONS:     None.
C
C PROGRAMMER:                     DATE OF LAST CHANGE      REASON FOR CHANGE
C     Tom Wescott (NOSC)          Oct 88                   Original entry.
C
C-*-*-*-*-*-*-*-*-*-*-*-*-*-*-*-*-*-*-*-*-*-*-*-*-*-*-*-*-*-*-*-*-*-*-*-*|*-*-*-*-
C     not in 3.0
      subroutine blhatc(rlo,rla,nin,xtie,ytie,dx,dy,dist)
C
      real ax(3),ay(3),bx(3),by(3),alon(3),alat(3),blon(3),blat(3)
      common /break/ blclat,blclon,ax,ay,bx,by,alon,alat,blon,blat
      parameter(NPONBL=13)
      real rlo(*),rla(*)
C
      include  'carmaxdim.inc'
C
      real xx(IDIM),yy(IDIM)
      real x(IDIM),y(IDIM),u(IDIM),v(IDIM)
      integer iinxt(IDIM), inxt(IDIM), nxt(IDIM)
      integer outply(MXPLYS)
C
C
C     Convert input (lon,lat) to breakline coordinate system.
      call bl2xy(rlo,rla,nin,xx,yy)
C
C     Get breakline length.
      dxp2p = ax(1) - bx(1)
      dyp2p = ay(1) - by(1)
      dp2p = sqrt(dxp2p**2 + dyp2p**2)
      toofar = .05*dp2p
C
C     Close the polygon if necessary.
      if ((xx(nin).ne.xx(1)).or.(yy(nin).ne.yy(1))) then
        n = nin + 1
        xx(n) = xx(1)
        yy(n) = yy(1)
      else
        n = nin
```

```
      endif
c
c     Initialize vertex linking list.
      do 120 i = 1, n-1
         iinxt(i) = i+1
 120  continue
      iinxt(n) = 1
      ist = 1
c
c     Force singular points outside linked list version of the polygon.
      call blsing(rlo,rla,n,xx,yy,nout,iinxt,ist)
      n = nout
      if (n.gt.MAXV) write(*,*)'BLHATC... array larger than ',MAXV
c
      do 300 ihemi = 1,2
         ln4clp = ihemi + 1
         cax = ax(ln4clp)
         cay = ay(ln4clp)
         cbx = bx(ln4clp)
         cby = by(ln4clp)
c
c        Reset initial vertex linking list.
         do 150 i = 1, n
            inxt(i) = iinxt(i)
 150     continue
         ist = 1
         mrk = n
c
c        Perform line clip.
         call cliplg(cax,cay,cbx,cby,xx,yy,ist,inxt,mrk,outply,nxt)
         dcx = cbx - cax
         dcy = cby - cay
c
         kountp = 0
c        While (clipped polygon segments remain) Do.
 201        if (outply(kountp+1).eq.0) go to 220
            kountp = kountp + 1
c
c           Get the first vertex from linked list.
            k = 1
            ivrt = outply(kountp)
            u(k) = xx(ivrt)
            v(k) = yy(ivrt)
            ivrt = nxt(ivrt)
            iclose = ivrt
            do 210 knt = 2, MAXV
               uknt = xx(ivrt)
               vknt = yy(ivrt)
c
c              Check polyline segment length in breakline coord system.
               dxx = (uknt-u(k))
               dyy = (vknt-v(k))
               dxxyy = amax1(abs(dxx),abs(dyy))
c
               if((dxxyy.gt.toofar).and.(abs(dxx*dcy-dyy*dcx).lt..0001))
     +            then
c                 If polyline segment is long and parallel to clipline,
c                 add intermediate points tacking it to a great circle.
                  xxincr = dxx/(NPONBL-1)
                  yyincr = dyy/(NPONBL-1)
                  kstart = k
                  do 204 i = 1, NPONBL-2
                     k = k + 1
                     u(k) = u(kstart) + xxincr*i
                     v(k) = v(kstart) + yyincr*i
 204              continue
               endif
c              Append the next point from output from clip.
               k = k + 1
               u(k) = uknt
               v(k) = vknt
c
               ivrt = nxt(ivrt)
               if (ivrt.eq.iclose) go to 211
```

```
 210        continue
 211        continue
            kountv = k

            call bl2ll(u,v,kountv,u,v)
            call llplxy(u,v,kountv,x,y,nout)
CD           ROTANG = ROTANG + .6
CD           DX = DX*COS(ROTANG)
CD           DY = DY*SIN(ROTANG)
            if (nout.gt.2) call hatch(x,y,nout,xtie,ytie,dx,dy,dist)
            go to 201
C
C       End While.
 220    continue
C
 300  continue
C
      return
      end


C+++++++++++++++++++++++++++++++++++++++++++++++++++++++++++++++++++++|+++++++
C UNIT NAME:                      BLPLGN
C
C FUNCTIONAL DESCRIPTION:         Does an area fill (no outline) for the inside of
C                                 a polygon that might require clipping by a map
C                                 breakline or contain potentially singular points.
C
C INPUT FILES/PARAMETERS:         rla(),rlo() - Input polygon coords.
C                                 nin         - Number of input points.
C
C GLOBAL VARIABLES:               ax(2),ay(2) - Left hemisphere clip line start.
C                                 bx(2),by(2) -   "       "      "    "  end.
C                                 ax(3),ay(3) - Rght hemisphere clip line start.
C
C OUTPUT FILES/PARAMETERS:        Filled polygon interior.
C
C SUBROUTINES CALLED:             bl2ll, bl2xy, cliplg, ,jpolg2, llplxy
C
C CALLED BY:                      flsply
C
C LOCAL VARIABLES:                inxt     - linking list for input polygon.
C                                 nxt      - linking list for clipped polygon.
C                                 outply   - pointers to clipped polygon segments.
C
C RESTRICTIONS:                   Blset must have been called to set up breakline.
C
C ABNORMAL RETURN CONDITIONS:     None.
C
C PROGRAMMER:                     DATE OF LAST CHANGE    REASON FOR CHANGE
C     Tom Wescott  (NOSC)         Feb 88                 Original entry.
C      "     "                    Mar 89                 Multiple output polygons.
C
C-*-*-*-*-*-*-*-*-*-*-*-*-*-*-*-*-*-*-*-*-*-*-*-*-*-*-*-*-*-*-*-*-*-*-*|*-*-*-*-
      subroutine blplgn(rlo,rla,nin)
C
      real ax(3),ay(3),bx(3),by(3),alon(3),alat(3),blon(3),blat(3)
      common /break/ blclat,blclon,ax,ay,bx,by,alon,alat,blon,blat
      parameter(NPONBL=13)
      real rlo(*),rla(*)
C
      include   'carmaxdim.inc'
C
      real xx(IDIM),yy(IDIM)
      real x(IDIM),y(IDIM),u(IDIM),v(IDIM)
      integer iinxt(IDIM), inxt(IDIM), nxt(IDIM)
      integer outply(MXPLYS)
C
C
C     Convert input (lon,lat) to breakline coordinate system.
      call bl2xy(rlo,rla,nin,xx,yy)
C
C     Get breakline length.
```

```
      dxp2p = ax(1) - bx(1)
      dyp2p = ay(1) - by(1)
      dp2p = sqrt(dxp2p**2 + dyp2p**2)
      toofar = .05*dp2p
c
c     Close the polygon if necessary.
      if ((xx(nin).ne.xx(1)).or.(yy(nin).ne.yy(1))) then
         n = nin + 1
         xx(n) = xx(1)
         yy(n) = yy(1)
      else
         n = nin
      endif
c
c     Initialize vertex linking list.
      do 120 i = 1, n-1
         iinxt(i) = i+1
 120  continue
      iinxt(n) = 1
      ist = 1
c
c     Force singular points outside linked list version of the polygon.
      call blsing(rlo,rla,n,xx,yy,nout,iinxt,ist)
      n = nout
      if (n.gt.MAXV) write(*,*)'BLPLGN... array larger than ',MAXV
c
      do 300 ihemi = 1,2
         ln4clp = ihemi + 1
         cax = ax(ln4clp)
         cay = ay(ln4clp)
         cbx = bx(ln4clp)
         cby = by(ln4clp)
c
c        Reset initial vertex linking list.
         do 150 i = 1, n
            inxt(i) = iinxt(i)
 150     continue
         ist = 1
         mrk = n
c
c        Perform line clip.
         call cliplg(cax,cay,cbx,cby,xx,yy,ist,inxt,mrk,outply,nxt)
         dcx = cbx - cax
         dcy = cby - cay
c
         kountp = 0
c        While (clipped polygon segments remain) Do.
 201        if (outply(kountp+1).eq.0) go to 220
            kountp = kountp + 1
c
c           Get the first vertex from linked list.
            k = 1
            ivrt = outply(kountp)
            u(k) = xx(ivrt)
            v(k) = yy(ivrt)
            ivrt = nxt(ivrt)
            iclose = ivrt
            do 210 knt = 2, MAXV
               uknt = xx(ivrt)
               vknt = yy(ivrt)
c
c              Check polyline segment length in breakline coord system.
               dxx = (uknt-u(k))
               dyy = (vknt-v(k))
               dxxyy = amax1(abs(dxx),abs(dyy))
c
               if((dxxyy.gt.toofar).and.(abs(dxx*dcy-dyy*dcx).lt..0001))
     +            then
c                 If polyline segment is long and parallel to clipline,
c                 add intermediate points tacking it to a great circle.
                  xxincr = dxx/(NPONBL-1)
                  yyincr = dyy/(NPONBL-1)
                  kstart = k
                  do 204 i = 1, NPONBL-2
```

```
                  k = k + 1
                  u(k) = u(kstart) + xxincr*i
                  v(k) = v(kstart) + yyincr*i
 204           continue
            endif
C           Append the next point from output from clip.
            k = k + 1
            u(k) = uknt
            v(k) = vknt
C
            ivrt = nxt(ivrt)
            if (ivrt.eq.iclose) go to 211
 210     continue
 211     continue
         kountv = k

         call bl2ll(u,v,kountv,u,v)
         call llplxy(u,v,kountv,x,y,nout)
         noedge = 1
         if (nout.gt.2) call jpolg2(x,y,nout,noedge)
         go to 201
C
C       End While.
 220    continue
C
 300  continue
C
      return
      end


C+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    BLPLIN
C
C FUNCTIONAL DESCRIPTION:       Draws a polyline across a map area
C                               containing a conic breakline.
C
C INPUT FILES/PARAMETERS:       rlo(n),rla(n)- Input polyline arrays in LL.
C                               n            - Number of input points.
C
C                               Line segments in breakline coordinate system:
C                               ax(1),ay(1)  - Break line segment start.
C                               bx(1),by(1)  -   "     "     "    end.
C                               ax(2),ay(2)  - Left hemisphere clip line start.
C                               ax(3),ay(3)  - Rght hemisphere clip line start.
C
C GLOBAL VARIABLES:             none.
C
C OUTPUT FILES/PARAMETERS:      This subroutine has graphic output only.
C                               Polyline is broken into sections that do not
C                               cross the breakline, and each of the sections
C                               is drawn on the map.  Pen lifted for invalids.
C
C SUBROUTINES CALLED:           none.
C
C CALLED BY:                    flsply,plotov,plotit,rngrin
C
C LOCAL VARIABLES:              x(n),y(n)   - Polyline in breakline coords.
C                               xmap,ymap   - Output point map position.
C                               s1,s2...    - Sign of sN tells half plane.
C                               dX, dY, D   - Coefficients of clip line in
C                                             form:    dY*x - dX*y + D = 0
C                               ddx,ddy,dd  - Coefs of polyline segment.
C                               far         - Traps segments near BL antipode.
C
C RESTRICTIONS:                 none.
C
C ABNORMAL RETURN CONDITIONS:   none.
C
C PROGRAMMER:                   DATE OF LAST CHANGE     REASON FOR CHANGE
C     Tom Wescott (NOSC)        Dec 87                  Original entry.
C
C-*-*-*-*-*-*-*-*-*-*-*-*-*-*-*-*-*-*-*-*-*-*-*-*-*-*-*-*-*-*-*-*-*-*-*-*-*|*-*-*-*-
C
```

```
      subroutine blplin(rlo,rla,n)
c
      real ax(3),ay(3),bx(3),by(3),alon(3),alat(3),blon(3),blat(3)
      common /break/ blclat,blclon,ax,ay,bx,by,alon,alat,blon,blat
      logical invali, invprv, pen
      common /invali/ invali
c
      include   'carmaxdim.inc'
c
      real rlo(*),rla(*)
      real x(IDIM),y(IDIM)
c
c
      if (n.gt.MAXV) write(*,*)'BLPLIN... array larger than ',MAXV
c
c     Convert input (lon,lat) to breakline coordinate system.
      call bl2xy(rlo,rla,n,x,y)
c
c     Calculate radius of breakline hemisphere.
      radius = sqrt((bx(1))**2.0 + (by(1))**2.0)
      far = 10.0*radius
c
c
      do 500 l = 2,3
c        Compute clip line (also half plane) general form coefficients
c        from directed line segment  (ax,ay) to (bx,by).
         dY = ay(l) - by(l)
         dX = ax(l) - bx(l)
         D  = ax(l)*by(l) - ay(l)*bx(l)
c
c        Process the first point.
         s1 = dY*x(1) - dX*y(1) + D
         call llplxy(rlo(1),rla(1),1,xmap,ymap,nout)
         call jmove(xmap,ymap)
c
         if (n.gt.1) then
            do 100 i = 2, n
               s2 = dY*x(i) - dX*y(i) + D
               if ((s1.lt.0.0).and.(s2.lt.0.0)) then
c                 Output nothing.
               else
                  invprv = invali
                  call llplxy(rlo(i),rla(i),1,xmap,ymap,nout)
                  pen = .true.
                  if ((invali).or.(invprv)) pen = .false.
c
                  if ((s1.ge.0.0).and.(s2.ge.0.0)) then
c                    Output line from point i-1 to point i.
                     if (pen) call jdraw(xmap,ymap)
                     if (.not.pen) call jmove(xmap,ymap)
                  else
c                    Find intersection of polyline segment with clip line.
                     ddy = y(i-1) - y(i)
                     ddx = x(i-1) - x(i)
                     dd = x(i-1)*y(i) - y(i-1)*x(i)
                     xa = -(ddx*D-dX*dd)
                     ya = -(ddy*D-dY*dd)
                     wa = -(ddy*dX -dY*ddx)
                     xintr = xa/wa
                     yintr = ya/wa
                     call bl2ll(xintr,yintr,1,rlon,rlat)
                     call llplxy(rlon,rlat,1,xmintr,ymintr,nvalid)
c
                     dmax = amax1(abs(x(i-1)),abs(y(i-1))
     +               ,abs(x(i)),abs(y(i)))
                     if (dmax.gt.far) then
c                       Polyline segment is near the breakline antipode where
c                       clip is unreqd and can be inaccurate.  Output line.
                        call llplxy(rlo(i-1),rla(i-1),1,xprv,yprv,nout)
                        call jmove(xprv,yprv)
                        if (invali) pen = .false.
                        if (pen) call jdraw(xmap,ymap)
                        if (.not.pen) call jmove(xmap,ymap)
                     else
```

```
                     if (s1.lt.0.0) then
c                       Output line from intersection point to point i.
                        call jmove(xmintr,ymintr)
                        if (pen) call jdraw(xmap,ymap)
                        if (.not.pen) call jmove(xmap,ymap)
                     else
c                       Output line from point i-1 to intersection point.
                        if (pen) call jdraw(xmintr,ymintr)
                        if (.not.pen) call jmove(xmintr,ymintr)
                     endif
                  endif
               endif
            endif
            s1 = s2
 100     continue
      endif
 500  continue
c
      return
      end


C+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                       BLSET
C
C FUNCTIONAL DESCRIPTION:          (1)  Locates end points of conic breakline.
C                                  (2)  Sets a transformation to a special ster-
C                                  eographic projection where the breakline is
C                                  straight, distortion is minimal, and coordinates
C                                  have no nearby discontinuity, so that breakline
C                                  clipping can easily be applied.
C
C INPUT FILES/PARAMETERS:          clat,clon  - Map center point.
C
C GLOBAL VARIABLES:                None.
C
C OUTPUT FILES/PARAMETERS:         nobrl                     - No breakline flag.
C                                  blclon,blclat             - Breakline midpoint
C                                  blaz                      - Azimuth at midpiont.
C                                  ax(1),ay(1),bx(1),by(1)   - Breakline end points.
C                                  ax(2),ay(2),bx(2),by(2)   - Left clip line.
C                                  ax(3),ay(3),bx(3),by(3)   - Right clip line.
C
C SUBROUTINES CALLED:              da2ll, bl2xy
C
C CALLED BY:                       DMAPII
C
C LOCAL VARIABLES:                 EPSLON  - Angular separation of clip lines.
C                                  HILAT   - Slightly less than pi over two.
C
C RESTRICTIONS:                    Breakline assumed to be a great semicircle.
C
C ABNORMAL RETURN CONDITIONS:      None.
C
C PROGRAMMER:                      DATE OF LAST CHANGE     REASON FOR CHANGE
C      Tom Wescott (NOSC)          Jan 88                  Original entry.
C
C-*-*-*-*-*-*-*-*-*-*-*-*-*-*-*-*-*-*-*-*-*-*-*-*-*-*-*-*-*-*-*-*-*-*-*-*-*|*-*-*-*-

      subroutine BLSET(nobrl)
c
      common /pie/ pie,tpie,pio2,pio4
      common /center/clat,clon,cclat,sclat
      common /proj/ itproj,wmrad,xoffs,yoffs,scalr,not1st
      real alon(3),alat(3),blon(3),blat(3),ax(3),ay(3),bx(3),by(3)
      common /break/ blclat,blclon,ax,ay,bx,by,alon,alat,blon,blat
      common /utmz/ zone,cmerid,aaxis,baxis,e2,ep2,ap,bp,cp,dp,ep
      common /oblm/ polat,polon,az,azlat,gamma,xshift
      logical nobrl
CC      REAL DBGX(1300), DBGY(1300), DBGLO(1300), DBGLA(1300)
c
      parameter (HILAT = 3.13/2.0)
      parameter (EPSLON = 1.0E-5)
```

```
c     NOTE:  HILAT and EPSLON are used to position the end points of
c            clipping lines.  If you space these lines too closely,
c            acccuracy limits will cause vector wrap around.
c            1.56, 1.0E-5 seem to work for 32 bit arithmetic.
c
c
      nobrl = .false.
c     Locate breakline midpoint and azimuth.
*------------------------------------------------------------------|--+
* Itproj:  1  2  3  4  5  6  7  8  9 10 11 12 13 14 15 16 17 18 19 20 21  |
*---------------------------------------------------------------------+
*          g  o  o  o  p  e  m  l  a  a  a  k  m  o  p  p  u  s  s    |
*          n  r  r  r  e  q  e  a  l  z  z  a  i  b  o  o  t  i  t    |
*          o  e  p  t  r  r  r  m  b  e  e  v  l  l  s  l  m  n  e    |
*          m  q  o  h  s  e  c  c  r  a  d  r  l  m  t  y  z  u  r    |
*---------------------------------------------------------------------+
      goto(1,01,01,01,01,02,02,02,02,05,05,02,02,04,01,02,03,02,01
     +    )itproj
c
c         Case 1:  There is no breakline.
 1           continue
             nobrl = .true.
c            Proceed to case 2 for dummy values.
c
c         Case 2:  Upright Conics etc.
 2           continue
c            Breakline is meridian opposite center, midpoint at equator.
             blclat = 0.0
             blclon = clon - sign(pie,clon)
             blaz = 0.0
             go to 99
c
c         Case 3:  Universal Transverse Mercator.
 3           continue
c            Breakline is equator, midpoint is opposite central meridian.
             blclat = 0.0
             blclon = cmerid - sign(pie,cmerid)
             blaz = pio2
             go to 99
c
c         Case 4:  Oblique cylindricals.
 4           continue
c            Breakline midpoint is at the antipode.
             blclat = -clat
             blclon = clon - sign(pie,clon)
c            Breakline azimuth is direction to new pole.
             call ll2da(blclat,blclon,polat,polon,pdst,blaz,range,bering)
             go to 99
c
c         Case 5:  Azimuthals displaying the whole world.
 5           continue
c            Obviously azimuthals do not have a breakline, but we can use
c            one to insure rigorous processing of antipodal polygons.
c            Breakline midpoint is at the antipode.
             blclat = -clat
             blclon = clon - sign(pie,clon)
c            Breakline azimuth is not important.
             blaz = 0.0
             go to 99
c
 99       continue
c     End Cases.
c
c     Locate end points of the breakline in lat,lon.
      aznort = blaz
      azsout = aznort - sign(pie,aznort)
      call da2ll(blclat,blclon,pio2,aznort,alat(1),alon(1))
      call da2ll(blclat,blclon,pio2,azsout,blat(1),blon(1))
c
c     Locate end points of the clip line for left hemisphere.
      azsw = azsout + EPSLON
      call da2ll(blclat,blclon,HILAT,azsw,alat(2),alon(2))
      aznw = aznort - EPSLON
```

```
      call da2ll(blclat,blclon,HILAT,aznw,blat(2),blon(2))
c
c     Locate end points of the clip line for right hemisphere.
      azne = aznort + EPSLON
      call da2ll(blclat,blclon,HILAT,azne,alat(3),alon(3))
      azse = azsout - EPSLON
      call da2ll(blclat,blclon,HILAT,azse,blat(3),blon(3))
c
c     Transform all end points to breakline coordinate system.
      call bl2xy(alon,alat,3,ax,ay)
      call bl2xy(blon,blat,3,bx,by)
c
CCccc   DEBUG ... Draw clip lines as calculated piecewise in BL coords.
CCcc      call jcolor(22)
CC        npts = 180
CC        do 690 line = 2,3
CC           xincr = (bx(line)-ax(line))/npts
CC           yincr = (by(line)-ay(line))/npts
CC           do 610 n = 1, npts
CC              dbgx(n) = ax(line) + n*xincr
CC              dbgy(n) = ay(line) + n*yincr
CC 610       continue
CC           call bl2ll(dbgx,dbgy,npts,dbglo,dbgla)
CC           call llplxy(dbglo,dbgla,npts,dbgx,dbgy,nout)
CC           call jmove(dbgx,dbgy)
CC           call jpoly(dbgx,dbgy,nout)
CC 690    continue
CCccc   ...DEBUG
CC
      return
      end


C+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                        BLSING
C
C FUNCTIONAL DESCRIPTION:           Excludes potentially singular points from the
C                                   interior of spherical polygon by inserting small
C                                   keyhole shaped areas which cut them out.
C                                   When outlining the polygon, use original verts.
C                                   When filling the polygon, include the insertions.
C
C INPUT FILES/PARAMETERS:           rlo(),rla() - Input polygon (lon,lat).
C                                   xx(),yy()   - Input polygon (breakline coords).
C                                   nin         - Number of input points.
C                                   list()      - pointers linking xx,yy verticies.
C
C GLOBAL VARIABLES:                 ax(2),ay(2) - Left hemisphere clip line start.
C                                   bx(2),by(2) -    "      "      "    "  end.
C                                   ax(3),ay(3) - Rght hemisphere clip line start.
C
C OUTPUT FILES/PARAMETERS:          xx(),yy()   - Input vtx list, new verts appended.
C                                   nout        - Number of output verticies.
C                                   list()      - Revised linkage.
C
C SUBROUTINES CALLED:               bl2xy, bl2ll, spgtst
C
C CALLED BY:                        blplgn, blhatc
C
C RESTRICTIONS:                     Blset must have been called to set up breakline.
C
C ABNORMAL RETURN CONDITIONS:       None.
C
C PROGRAMMER:                       DATE OF LAST CHANGE     REASON FOR CHANGE
C     Tom Wescott (NOSC)            Oct 88                  Original entry.
C
C-*-*-*-*-*-*-*-*-*-*-*-*-*-*-*-*-*-*-*-*-*-*-*-*-*-*-*-*-*-*-*-*-*-*-*-*-*|*-*-*-*-
C     not in 3.0
      subroutine blsing(rlo,rla,nin,xx,yy,nout,list,lstart)
C
      real ax(3),ay(3),bx(3),by(3),alon(3),alat(3),blon(3),blat(3)
      common /break/ blclat,blclon,ax,ay,bx,by,alon,alat,blon,blat
      real pxx(4),pyy(4)
      common /center/ clat,clon,cclat,sclat
```

```
      common /pie/ pie,tpie,pio2,pio4
      parameter (R2D = 180./3.14159)
      parameter (NCIRCL = 31)
      real rlo(*),rla(*), xx(*),yy(*)
      integer list(*)

      logical inside
C
      nout = nin
C
C     For polygons that intersect the breakline and must be clipped, there
C     are four troublesome points which, if enclosed, can cause problems.
C     1), 2)  The breakline ends (e.g. poles unplottable in many projections)
C         3)  The map center (edge of the world in breakline coord system)
C         4)  The antipode of center (unplottable in azimuthal projections)
C     If any of these lie inside the polygon, cut a keyhole to exclude them.
C
C     Set up an array containing these points in breakline coordinate system.
      pxx(1) = ax(1)
      pyy(1) = ay(1)
      pxx(2) = bx(1)
      pyy(2) = by(1)
      pxx(3) = 0.0
      pyy(3) = 0.0
C     Antipode is undefined, use center point for reference.
      pxx(4) = 0.0
      pyy(4) = 0.0
C
      do 190 ntrble = 1, 4
C        Find (lon,lat) of these points.
         if (ntrble .eq. 3) then
C           Set up to test antipode of map center (which is breakline center).
            trblon = blclon
            trblat = blclat
         else if (ntrble.eq.4) then
C           Set up to test map center (the antipode of breakline system center).
            trblon = blclon - sign(pie,blclon)
            trblat = - blclat
         else
            call bl2ll(pxx(ntrble),pyy(ntrble),1,trblon,trblat)
         endif
C
C        See if troublesome point lies inside the polygon.
C        TBD:  A bounding rectangle screen would make this test faster.
         call spgtst(rlo,rla,nin,trblon,trblat,inside,area)
         if (inside) then
C
C           Use vertex mapping nearest the troublesome point for keyhole start.
C           We need the linkage pointer from this vertex to the next in line.
            dmin = 1.0E9
            do 166 iv = 1, nin
               call llplxy(rlo(iv),rla(iv),1,vx,vy,nvout)
               dist = sqrt((pxx(ntrble)-vx)**2 + (pyy(ntrble)-vy)**2)
               if (dist.lt.dmin) then
                  dmin = dist
                  nearvt = iv
                  p2next = list(iv)
               endif
               key = nearvt
 166        continue

CD          WRITE(*,*)'BLSING... troublesome pt inside polygon',ntrble
CD          WRITE(*,*)'         ...',trblon*R2D,trblat*R2D,'near ',nearvt
CD          CALL LLPLXY(TRBLON*.999,TRBLAT*.999,1,XXX,YYY,IDUM)
CD          CALL JCMARK(3)                 ! MARK KEYHOLE CIRCLE WITH "*"
CD          CALL JMARK(XXX,YYY)

CD          CALL BL2LL(XX(KEY),YY(KEY),1,KEYLO,KEYLA)
CD          CALL LLPLXY(KEYLO,KEYLA,1,KEYX,KEYY,IDUM)
CD          CALL JCMARK(4)                 ! MARK KEYHOLE START/END WITH "0"
CD          CALL JMARK(KEYX,KEYY)

CD          IF (NTRBLE.EQ.2) THEN
CD             WRITE(*,*) ' BLSING...  south pole in plg.'
```

```
CD            DO 334 IPI = 1, NIN
CD            WRITE (*,*)'    south polar polygon  ',rlo(ipi),rla(ipi)
CD334         CONTINUE
CD          ENDIF
C
C           Use interpole distance to set radius for keyhole circle.
            dxp2p = ax(1) - bx(1)
            dyp2p = ay(1) - by(1)
            dp2p = sqrt(dxp2p*dxp2p+dyp2p*dyp2p)
            r = .005*dp2p
C           Or, a very large circle which excludes breakline center antipode.
            if (ntrble .eq. 4) r = 1.0E+4
            theta0 = atan2(dyp2p,dxp2p)
C
C           Make a circle around the trouble point in the direction
C           (cw/ccw) opposite to vertex order in the original polygon.
C           New verticies are appended to (xx,yy).
            do 140 i = 1, NCIRCL
               theta = theta0 + (i-1)*tpie/(NCIRCL-1)
               theta = sign(theta,area)
C
C              Note that when the map center is inside a polygon, the
C              direction of traversal in breakline coords is reversed!
               if (ntrble .eq. 4) theta = -theta
C
               if (i.eq.1) then
C                 Link from keyhole start.
                  list(nearvt) = nout + 1
               else
C                 Continue with keyhole.
                  list(nout) = nout + 1
               endif

               nout = nout + 1
               xx(nout) = pxx(ntrble) + r*cos(theta)
               yy(nout) = pyy(ntrble) + r*sin(theta)
CD              CALL BL2LL(XX(NOUT),YY(NOUT),1,KEYLO,KEYLA)
CD              CALL LLPLXY(KEYLO,KEYLA,1,KEYX,KEYY,IDUM)
CD              CALL JCMARK(5)             ! MARK KEYHOLE PATH WITH "X"
CD              CALL JMARK(KEYX,KEYY)
 140        continue
C
C           Add line from circle back to where we left the original polygon.
            list(nout) = nout + 1
            nout = nout + 1
            xx(nout) = xx(key)
            yy(nout) = yy(key)
            list(nout) = p2next
C
CD           CALL BL2LL(XX(NOUT),YY(NOUT),1,KEYLO,KEYLA)
CD           CALL LLPLXY(KEYLO,KEYLA,1,KEYX,KEYY,IDUM)
CD           CALL JCMARK(5)             ! MARK KEYHOLE START/END WITH "X"
CD           CALL JMARK(KEYX,KEYY)
C
         endif
 190  continue
C
CD     WRITE(*,*) ' BLSING linkage'
CD     DO 2111 j= 1, nout, 10
CD        WRITE(*,9211) (k, list(k),k=j,j+9)
CD9211    FORMAT(' ',10(I3,')',I3,' '))
CD2111 CONTINUE
      return
      end


C+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                       CK4ALL
C
C FUNCTIONAL DESCRIPTION:          Checks for all of a geographic area bounding
C                                  rectangle (BR) being visible in the viewport.
C
C INPUT FILES/PARAMETERS:          alimit(4) - geographic area BR.
C
C GLOBAL VARIABLES:                vpnort,vpsout,vpeast,vpwest - viewport BR
C
```

```
C OUTPUT FILES/PARAMETERS:      allon
C
C SUBROUTINES CALLED:           lltoxy, clipxy
C
C CALLED BY:                    DMAPII
C
C RESTRICTIONS:                 Geo area rectangle delta lon < pi.
C
C ABNORMAL RETURN CONDITIONS:   None.
C
C PROGRAMMER:                   DATE OF LAST CHANGE     REASON FOR CHANGE
C     Tom Wescott   (NOSC)      11/87                   Original entry.
C
C-*-*-*-*-*-*-*-*-*-*-*-*-*-*-*-*-*-*-*-*-*-*-*-*-*-*-*-*-*-*-*-*-*-*-*-*-*|*-*-*-*-

      subroutine ck4all(allon,alimit)
c
      common /viewbr/ vpnort,vpsout,vpeast,vpwest
      logical invali, allon, ison
      common /invali/ invali
      common /pie/ pie,tpie,pio2,pio4
      real  alimit(4)
c
c     To handle case when one side of the viewport arcs through one
c     side of the area rectangle, test at least three pts per side..
      parameter (NPOINTS = 3)
c
cccc
c     Get N,S,E,W sides of rectangle from WDBII limit array.
      rsout = alimit(1)
      rnort = alimit(2)
      rwest = alimit(3)
      reast = alimit(4)
      Dlo = reast - rwest
      if (Dlo.gt.pie) then
         tmp = reast
         reast = rwest
         rwest = tmp
      endif
c
      allon = .false.
      xincr = (reast-rwest)/(NPOINTS-1)
c
      rlon = rwest - xincr
      do 300 icol = 1, NPOINTS
         rlon = rlon + xincr
         if ((icol.eq.1).or.(icol.eq.NPOINTS)) then
            yincr = (rnort-rsout)/(NPOINTS-1)
            npts = NPOINTS
         else
            yincr = rnort - rsout
            npts = 2
         endif
c
         tlat = rsout - yincr
         do 200 irow = 1, npts
            tlat = tlat + yincr
            rlat = tlat
c
c           Nudge any test points off possibly invalid poles.
            if (abs(rlat).ge.pio2) rlat = rlat - sign(.001,rlat)
c
            call lltoxy(rlat,rlon,x,y)
            if (invali) then
               GO TO 900
            else
               call clipxy(x,y,ison)
               if (.not. ison) GO TO 900
            endif
200      continue
300   continue
      allon = .true.
c
900   return
      end
```

```
C+++++++++++++++++++++++++++++++++++++++++++++++++++++++++++++++++++++++|+++++++
C UNIT NAME:                    CK4ANY
C
C FUNCTIONAL DESCRIPTION:       Checks for intersection of a geographic
C                               area with the viewport by comparing bounding
C                               rectangles (BR) in lon,lat.  If rectangles
C                               intersect, visibility is checked.
C
C INPUT FILES/PARAMETERS:       alimit(4) - geographic area BR.
C
C GLOBAL VARIABLES:             vpnort,vpsout,vpeast,vpwest - viewport BR
C
C OUTPUT FILES/PARAMETERS:      someon
C
C SUBROUTINES/FUNCTIONS:        lltoxy, clipxy
C
C CALLED BY:                    DMAPII, LLGRID
C
C RESTRICTIONS:                 Geo rectangle delta lon must be less than pi.
C
C ABNORMAL RETURN CONDITIONS:   None.
C
C PROGRAMMER:                   DATE OF LAST CHANGE     REASON FOR CHANGE
C     Tom Wescott   (NOSC)      11/87                   Original entry.
C
C-*-*-*-*-*-*-*-*-*-*-*-*-*-*-*-*-*-*-*-*-*-*-*-*-*-*-*-*-*-*-*-*-*-*-*-*-*|*-*-*-*-

      subroutine ck4any(someon,alimit)
c
      common /viewp/ xrad,yrad,ixnp,iynp,xc,yc
      common /viewbr/ vpnort,vpsout,vpeast,vpwest
      common /pie/ pie,tpie,pio2,pio4
      logical invali, someon, ison
      common /invali/ invali
c
      real  alimit(4)
c
c     To handle case where one side of the viewport arcs through one
c     side of the area rectangle, test at least three pts per side.
      parameter (NPOINTS = 5)
c
c
c     Get N,S,E,W sides of geo rectangle from WDBII limit array
c     as viewed from side of earth containing the rectangle.
      rsout = alimit(1)
      rnort = alimit(2)
      rmnlo = alimit(3)
      rmxlo = alimit(4)
      Dlo = rmxlo - rmnlo
      if (Dlo.gt.pie) then
c        Limit array spans the dateline.  Convert to continuous coords.
         reast = rmnlo + tpie
         rwest = rmxlo
      else
         reast = rmxlo
         rwest = rmnlo
      endif
c
      someon = .false.
c
c     Speedy return if geographic area N-S does not overlap viewport BR.
      if ((rnort.gt.vpsout) .and. (rsout.lt.vpnort)) then
c
c        We can identify intersection of area with viewport by testing
c        visibility of all points (approximated by NPOINT) along the
c        rectangle sides and making sure any totally invisible rectangle
c        does not surround the viewport.
c
c        Trim large rectangles to viewport size prior to testing
c        to insure all test points dont miss the viewport.
         if (rnort.gt.vpnort) rnort = vpnort + .0001
         if (rsout.lt.vpsout) rsout = vpsout - .0001
c
         nclipt = 0
```

```
         ixt = 0
         iyt = 0
         xincr = (reast-rwest)/(NPOINTS-1)
         yincr = (rnort-rsout)/(NPOINTS-1)
c
         rlon = rwest - xincr
         do 300 icol = 1,NPOINTS
            rlon = rlon + xincr
            rl = rlon
            if (rl.gt.pie) rl = rl - tpie
            tlat = rsout - yincr
            do 200 irow = 1,NPOINTS
               tlat = tlat + yincr
               rlat = tlat
c
c              Nudge any test points off possibly invalid poles.
               if (abs(rlat).ge.pio2) rlat = rlat - sign(.001,rlat)
c
               call lltoxy(rlat,rl,x,y)
               if (.not. invali) then
                  call clipxy(x,y,ison)
                  if (ison) then
                     someon = .true.
                     RETURN
                  else
c                    Totalize viewport space sector containing clipped corner.
                     if (((icol.eq.1).or.(icol.eq.NPOINTS)).and.
     +                  ((irow.eq.1).or.(irow.eq.NPOINTS))) then
                        nclipt = nclipt + 1
                        ixt = ixt + ixnp
                        iyt = iyt + iynp
                     endif
                  endif
               endif
 200        continue
 300     continue
c
c        Set someon to true if rectangle corners straddle the viewport.
         if (nclipt.eq.4) then
            if (((ixt.eq.0).and.(abs(iyt).ne.4)) .or.
     +         ((iyt.eq.0).and.(abs(ixt).ne.4))) then
c              Insure rectangle is not on back side of earth.
               if (abs(reast).gt.pie) reast = reast - sign(tpie,reast)
               if (eastl(reast,rwest) .eq. reast)  someon = .true.
            endif
         endif
c
      endif
c
      return
      end


C+*+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                        CLIP2L
C
C FUNCTIONAL DESCRIPTION:           Clips a polygon by a line.  Output points
C                                   will lie in the half plane to the left of
C                                   a specified directed line segment.
C
C INPUT FILES/PARAMETERS:           x(n), y(n) - Input polygon coords.
C                                   n          - Number of input points.
C                                   ax,ay      - Directed line segment start.
C                                   bx,by      -    "      "     "    end.
C
C GLOBAL VARIABLES:                 none.
C
C OUTPUT FILES/PARAMETERS:          u(m), v(m) - Clipped polygon coords.
C                                   m          - Number of output points.
C
C SUBROUTINES/FUNCTIONS CALLED:     none.
C
C CALLED BY:                        BLPLGN
```

```
C
C LOCAL VARIABLES:                  s1, s2      - Sign of sN tells half plane.
C                                   dX, dY, D   - Coefficients of clip line in
C                                                 form:    dY*x - dX*y + D = 0
C                                   ddx,ddy,dd  - Coefs of polyline segment.
C
C RESTRICTIONS:                     Don't use single buffer for input & output.
C
C ABNORMAL RETURN CONDITIONS:       none.
C
C REFERENCE:                        Sutherland & Hodgeman    CACM 1974
C
C PROGRAMMER:                      DATE OF LAST CHANGE      REASON FOR CHANGE
C    Tom Wescott (NOSC)            Dec 87                   Original entry.
C
C-*-*-*-*-*-*-*-*-*-*-*-*-*-*-*-*-*-*-*-*-*-*-*-*-*-*-*-*-*-*-*-*-*-*-*-*-*-*-*-*|*-*-*-*-
C
      subroutine clip2l(ax,ay,bx,by,x,y,n,u,v,m)
c
      include   'carmaxdim.inc'
c
      dimension x(*),y(*), u(*),v(*)
c
c     Compute clip line (also half plane) general form coefficients
c     from directed line segment  (ax,ay) to (bx,by).
      dY = ay - by
      dX = ax - bx
      D  = ax*by - ay*bx
c
      m = 0
c     Process the first point.
      s1 = dY*x(1) - dX*y(1) + D
      if (s1.ge.0.0) then
         m = m + 1
         u(m) = x(1)
         v(m) = y(1)
      endif
c
      if (n.gt.1) then
         do 100 i = 2, n
c
            if (m.ge.MAXV) then
               write(*,*)' CLIP2L... array exceeded ',MAXV
               STOP
            endif
c
            s2 = dY*x(i) - dX*y(i) + D
            if ((s1.lt.0.0).and.(s2.lt.0.0)) then
c              Output nothing.
            else
               if ((s1.ge.0.0).and.(s2.ge.0.0)) then
c                 Output line from point i-1 to point i.
                  m = m + 1
                  u(m) = x(i)
                  v(m) = y(i)
               else
c                 Find intersection of polyline segment with clip line.
                  ddy = y(i-1) - y(i)
                  ddx = x(i-1) - x(i)
                  dd = x(i-1)*y(i) - y(i-1)*x(i)
                  xa = -(ddx*D-dX*dd)
                  ya = -(ddy*D-dY*dd)
                  wa = -(ddy*dX -dY*ddx)
c                 Note:  wa cannot be 0.0 here, divide check unnecessary.
                  xintr = xa/wa
                  yintr = ya/wa
c
                  if (s1.lt.0.0) then
c                    Output line from intersection point to point i.
                     m = m + 1
                     u(m) = xintr
                     v(m) = yintr
                     m = m + 1
                     u(m) = x(i)
```

```
                  v(m) = y(i)
               else
c                 Output line from point i-1 to intersection point.
                  m = m + 1
                  u(m) = xintr
                  v(m) = yintr
               endif
c
            endif
         endif
         s1 = s2
 100  continue
      endif
c
      return
      end


C+*+*+*+*+*+*+*+*+*+*+*+*+*+*+*+*+*+*+*+*+*+*+*+*+*+*+*+*+*+*+*+*|*+*+*+*+
C UNIT NAME:                   CLIPLG
C
C FUNCTIONAL DESCRIPTION:      Clips a polygon by a line.  Output points
C                              will lie in the half plane to the left of
C                              a specified directed line segment.
C
C INPUT FILES/PARAMETERS:      ax,ay        - Directed line segment start.
C                              bx,by        -     "      "     "    end.
C                              Closed polygon in linked list form:
C                                x(n), y(n) - Vertex coordinate arrays.
C                                inply      - Pointer to polygon start in x,y.
C                                iptr(n)    - Ptr. array to vertex (n+1). Plgn
C                                             (terminated by repeat of 1stvrt).
C                                m          - End of data marker in x,y.
C
C GLOBAL VARIABLES:            None.
C
C OUTPUT FILES/PARAMETERS:     Multiple polygons in linked list form:
C                                outply(k)  - List of starting ptrs. for k
C
C                                             polygons.  (terminated with a 0)
C                                nxt(m+j)   - Pointer array to vertex (n+1).
C                                m          - Updated end of data marker.
C
C SUBROUTINES CALLED:          None.
C
C CALLED BY:                   blhatc, blplgn, jpolg2
C
C LOCAL VARIABLES:             j            - # of intersections with clip line.
C                              xi,yi        - Current point in input polyline.
C                              xprv,yprv    - Previous point.
C                              s1, s2       - Sign of sN tells half plane.
C                              dX, dY, D    - Coefficients of clip line in
C                                             form:    dY*x - dX*y + D = 0
C                              ddx,ddy,dd   - Coefs of polyline segment.
C
C RESTRICTIONS:                None.
C
C ABNORMAL RETURN CONDITIONS:  None.
C
C PROGRAMMER:                  DATE OF LAST CHANGE     REASON FOR CHANGE
C     Tom Wescott  (NOSC)      Aug 88                  Original entry.
C
C-*-*-*-*-*-*-*-*-*-*-*-*-*-*-*-*-*-*-*-*-*-*-*-*-*-*-*-*-*-*-*-*-*-*|*-*-*-*-
C
      subroutine cliplg(ax,ay,bx,by,x,y,inply,iptr,m,outply,nxt)
c
      real x(*),y(*)
      integer iptr(*), nxt(*)
c
      include   'carmaxdim.inc'
c
      integer list(2*MXPLYS), outply(MXPLYS)
c
c     Compute clip line (also half plane) general form coefficients
c     from directed line segment  (ax,ay) to (bx,by).
```

```
      dY = ay - by
      dX = ax - bx
      D  = ax*by - ay*bx
c
c     Initialize counters, and set up loop with previous point.
      nin = 0
      j = 0
      lstptr = inply
      xprv = x(lstptr)
      yprv = y(lstptr)
      s1 = dY*xprv - dX*yprv + D
      inptr = lstptr
c
c     Do Until (input polygon has closed)
 101     inptr = iptr(inptr)
         nin = nin + 1
         if ((nin.gt.idim).or.(inptr.gt.idim).or.(inptr.lt.1)) then
            Write(*,*)'CLIPLG...  bad input polygon linkage'
            STOP
         endif
         xi = x(inptr)
         yi = y(inptr)
c
         s2 = dY*xi - dX*yi + D
cc       if ((s1.lt.0.0).and.(s2.lt.0.0)) then
         if ((s1.le.0.0).and.(s2.le.0.0)) then
c           Output nothing.
         else
            if ((s1.ge.0.0).and.(s2.ge.0.0)) then
c              Output line from previous point to point i.
               nxt(lstptr) = inptr
            else
c              Find intersection of polyline segment with clip line.
               ddy = yprv - yi
               ddx = xprv - xi
               dd = xprv*yi - yprv*xi
               xa = -(ddx*D-dX*dd)
               ya = -(ddy*D-dY*dd)
               wa = -(ddy*dX -dY*ddx)
               xintr = xa/wa
               yintr = ya/wa
c              Append intersection pt to input polyline list.
               j = j + 1
               if (j+m.gt.idim)
     +            write(*,*)' CLIPLG... vertex limit exceeded ',idim
               list(j) = m+j
               x(m+j) = xintr
               y(m+j) = yintr
c
               if (s1.lt.0.0) then
c                 Output line from intersection point to point i.
                  nxt(m+j) = inptr
               else
c                 Output line from previous point to intersection point.
                  nxt(lstptr) = m+j
c                 Flag link from intersection with a zero.  Will fix it later.
                  nxt(m+j) = 0
               endif
            endif
         endif
         s1 = s2
         xprv = xi
         yprv = yi
         lstptr = inptr
         if (inptr.ne.inply) go to 101
c     End do.
c
      if (j.eq.0) then
c        Input lies entirely to one side of the clip line.
         outply(1) = 0
         outply(2) = 0
         if (s1.ge.0) outply(1) = inply
      else
c
c        Sort the list of intersections by position along the clip line.
         do 290 i = 1, j-1
```

```
        do 280 k = i+1, j
           if (abs(dX).gt.abs(dY)) then
              if (x(list(i)).lt.x(list(k))) then
                 itemp = list(i)
                 list(i) = list(k)
                 list(k) = itemp
              endif
           else
              if (y(list(i)).lt.y(list(k))) then
                 itemp = list(i)
                 list(i) = list(k)
                 list(k) = itemp
              endif
           endif
 280    continue
 290  continue
c
c     Bad input recovery:  If each pair of intersections do not contain
c     one nxt=0, we have cut thru two parts of an internally reflexed
c     polygon.  Reorder intersections for least objectionable linkage.
      do 298  i = 1, j-1, 2
         if (((nxt(list(i)).ne.0).and.(nxt(list(i+1)).ne.0)).or.
     +       ((nxt(list(i)).eq.0).and.(nxt(list(i+1)).eq.0))) then
CD          WRITE(*,*)'CLIPLG...reflex',nxt(list(i)),nxt(list(i+1))
c           Swap 2nd element of this bad pair with next linkable.
            ibad = nxt(list(i+1))
            do 295 k = i+2, j
               itry = nxt(list(k))
               if (((ibad.ne.0).and.(itry.eq.0)).or.
     +             ((ibad.eq.0).and.(itry.ne.0))) then
                  itemp = list(k)
                  list(k) = list(i+1)
                  list(i+1) = itemp
                  go to 296
               endif
 295        continue
 296        continue
         endif
 298  continue
c
c     Close polygons by linking alternate pairs of intersections.
      do 300 intr = 1, j-1, 2
         iaddr1 = list(intr)
         iaddr2 = list(intr+1)
         if (nxt(iaddr1).eq.0) nxt(iaddr1) = iaddr2
         if (nxt(iaddr2).eq.0) nxt(iaddr2) = iaddr1
 300  continue
c
c     Make a list of possible start points for output polygons.
      do 410 i = 1, j/2
         outply(i) = list(i*2)
 410  continue
      outply(j/2+1) = 0
c
c     Traverse that list to identify start points and delete extras.
      kountp = 0
      nxtplg = outply(1)
c     While (more polygons) do
 420     if (nxtplg.eq.0) go to 490
         kountp = kountp + 1
         if (kountp.gt.MXPLYS) then
            write(*,*)'CLIPLG... output exceeded max # of polygons'
            STOP
         endif
         istvrt = nxt(nxtplg)
         nxtvrt = nxt(istvrt)
         kountv = 1
c        While (polygon not closed) do
 430        if (nxtvrt.eq.istvrt) go to 480
c           Check remainder of polygon list for a duplicate entry.
            do 460 k = kountp+1, j/2
               if (outply(k).eq.nxtvrt) then
c                 Delete duplicate polygon from start points list.
                  do 450 kk = k, j/2
```

```
                  outply(kk) = outply(kk+1)
 450            continue
              endif
 460        continue
            nxtvrt = nxt(nxtvrt)
            kountv = kountv + 1
            go to 430
 480      continue
          nxtplg = outply(kountp+1)
          go to 420
 490    continue
      endif
c
c     Reset end of data marker.
      m = m+j
c
      return
      end


C+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME: CLIPXY
C
C FUNCTIONAL DESCRIPTION:  CLIPS POINT X,Y AGAINST VIEWPORT.
C
C INPUT FILES/PARAMETERS:
C
C       NEWONS              LOGICAL     INDICATES WHETHER POINT IS ON SCREEN.
C       X                   REAL        X COORDINATE.
C       Y                   REAL        Y COORDINATE.
C
C GLOBAL VARIABLES : NONE.
C
C OUTPUT FILES/PARAMETERS:  NONE.
C
C SUBROUTINES/FUNCTIONS CALLED :
C
C       FPOSIT              POSITIONS POINT X,Y.
C       FDRAWV              DRAWS VECTOR TO X,Y.
C
C CALLED BY:                 BSTMAP, CHECKA, CHECKB, FILLPT, GRDLAT,
C                            GRDLON, LIMITS, LLINXY, PLOTOV,
C                            PLTCIT, PLTNAM
C
C LOCAL VARIABLES: NONE.
C
C RESTRICTIONS: NONE.
C
C ABNORMAL RETURN CONDITIONS:   NONE.
C
C LOCATION:                  /a21/gjf/MAPSRC.FTN
C
C PROGRAMMER:                DATE OF LAST CHANGE     REASON FOR CHANGE
C
C    DAVE NATION
C    JERRY FENERTY                                   ORIGINAL CODE.
C                                                    DOCUMENT AND MODIFY
C                                                    FOR A21 PROTOTYPE.
C-*-*-*-*-*-*-*-*-*-*-*-*-*-*-*-*-*-*-*-*-*-*-*-*-*-*-*-*-*-*-*-*-*-*-*|*-*-*-*-

      SUBROUTINE CLIPXY (X,Y,NEWONS)

      LOGICAL NEWONS
      COMMON /VIEWP/ XRAD,YRAD,IXNP,IYNP,XC,YC

      NEWONS=.FALSE.
          IXNP=0
          IYNP=0
          IF (X.GT.XRAD) IXNP=1
          IF (X.LT.-XRAD) IXNP=-1
          IF (Y.GT.YRAD) IYNP=1
          IF (Y.LT.-YRAD) IYNP=-1
          IF (IXNP.EQ.0.AND.IYNP.EQ.0) NEWONS=.TRUE.
```

```
      RETURN
      END

C+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    D2OUTL
C
C FUNCTIONAL DESCRIPTION:       Draw (fill) map outline.
C
C INPUT FILES/PARAMETERS:       None.
C
C GLOBAL VARIABLES:             clat,clon       - Map center.
C                               xrad,yrad       - Viewport limits.
C                               alat(),alon()   - Conic clip line ends.
C                               blat(),blon()
C
C OUTPUT FILES/PARAMETERS:      Whole earth polygon filled with ocean color.
C
C SUBROUTINES CALLED:           llplxy, xytoll
C
C CALLED BY:                    DMAPII
C
C LOCAL VARIABLES:              None.
C
C RESTRICTIONS:                 None.
C
C ABNORMAL RETURN CONDITIONS:   None.
C
C PROGRAMMER:                   DATE OF LAST CHANGE     REASON FOR CHANGE
C     DAVE NATION                                       Original droutl.
C     Tom Wescott  (NOSC)       11/87                   Generalized.
C
C-*-*-*-*-*-*-*-*-*-*-*-*-*-*-*-*-*-*-*-*-*-*-*-*-*-*-*-*-*-*-*-*-*-*-*-*-*|*-*-*-*-

      subroutine D2OUTL
c
      common /center/ clat,clon,cclat,sclat
      common /viewp/ xrad,yrad,ixnp,iynp,xc,yc
      common /pie/ pie,tpie,pio2,pio4
      common /comgra/xllgra,yllgra,xurgra,yurgra,ibcgra,iocgra,incgra
      logical invali,notlst
      common /invali/ invali
      common /proj/ itproj,wmrad,xoffs,yoffs,scalr,notlst
      real ax(3),ay(3),bx(3),by(3),alon(3),alat(3),blon(3),blat(3)
      common /break/ blclat,blclon,ax,ay,bx,by,alon,alat,blon,blat
      parameter (NLOOPS = 9)
      parameter (NPOINTS = 37)
      real plon(5*NPOINTS),plat(5*NPOINTS),x(5*NPOINTS),y(5*NPOINTS)
c
c
c     Set interior and edge style for outline polygon.
      call jpintr(1)
      call jpedge(1)
c
c-----------------------------------------------------------------------|--+
c Itproj:  1  2  3  4  5  6  7  8  9 10 11 12 13 14 15 16 17 18 19 20 21  |
c--------------------------------------------------------------------------+
c          g  o  o  o  p  e  m  l  a  a  a  k  m  o  p  p  u  s  s        |
c          n  r  r  r  e  q  e  a  l  z  z  a  i  b  o  o  t  i  t        |
c          o  e  p  t  r  r  r  m  b  e  e  v  l  l  s  l  m  n  e        |
c          m  q  o  h  s  e  c  c  r  a  d  r  l  m  t  y  z  u  r        |
c--------------------------------------------------------------------------+
      goto(3,02,02,03,03,05,05,04,04,03,03,04,05,05,02,04,01,04,03
     +    )itproj
c
c       Case #1  For omitting the outline.  Fill entire display.
 01        continue
           call jrect(-xrad,-yrad,xrad,yrad)
           go to 900
c
c       Case #2  For azimuthal projections with offset centers.
 02        continue
              if ((itproj.eq.3).or.(itproj.eq.15)) then
c                For polar stereographic or polar orthographic.
                 polat = sign(pio2,clat)
                 call llplxy(0.0,polat,1,xcntr,ycntr,idummy)
```

```
            elseif (itproj.eq.2) then
c              For equatorial orthographic.
               call llplxy(clon,0.0,1,xcntr,ycntr,idummy)
            endif
c           Jump to general azimuthal process for circle draw.
            go to 302
c
c       Case #3  For general azimuthal projections.
 03        continue
           call llplxy(clon,clat,1,xcntr,ycntr,idummy)
c
c          Set line segment between proj. center and pt. outside viewport.
 302       xearth = xcntr
           yearth = ycntr
           xspace = -xrad*sign(1.1,xearth)
           yspace = -yrad*sign(1.1,yearth)
c
c          Locate possible intersection of map edge with line segment.
           do 304 itest = 1, NLOOPS
              xedge = (xspace+xearth)*0.5
              yedge = (yspace+yearth)*0.5
              call xytoll(xedge,yedge,rlat,rlon)
              if (invali) then
                 xspace = xedge
                 yspace = yedge
              else
                 xearth = xedge
                 yearth = yedge
              endif
 304       continue
c
c          Draw circle with radius slightly larger than map.
           rad = sqrt((xcntr-xedge)**2.+(ycntr-yedge)**2.) + 0.5
           call jcircl(xcntr,ycntr,0.,rad,0)
           go to 900
c
c       Case #4 For conics, etc. with pole to pole breakline opposite center.
 04        continue
c
c          Get geographic limits of the map from clip line ends.
           rnort = alat(3)
           rsout = alat(2)
           reast = alon(3)
           rwest = alon(2)
c
c          Translate longitude limits to continuous scale where  W < E.
           breakl = clon - sign(pie,clon)
           treast = reast
           trwest = rwest
           if (treast.lt.breakl) treast = treast + tpie
           if (trwest.lt.breakl) trwest = trwest + tpie
c
c          Draw a polygon around the curved figure defined by map limits.
           stepla = (rnort-rsout)/(NPOINTS-1)
           steplo = (treast-trwest)/(NPOINTS-1)
           j = 1
        do 402 i = 0, NPOINTS-1
           plon(j) = reast
           plat(j) = rnort - i*stepla
           j = j + 1
402     continue
        do 404 i = 1, NPOINTS-1
           plon(j) = treast - i*steplo
           if (plon(j).gt.pie) plon(j) = plon(j) - tpie
           plat(j) = rsout
           j = j + 1
404     continue
        do 406 i = 1, NPOINTS-1
           plon(j) = rwest
           plat(j) = rsout + i*stepla
           j = j + 1
406     continue
        do 408 i = 1, NPOINTS-1
           plon(j) = trwest + i*steplo
```

```
          if (plon(j).gt.pie) plon(j) = plon(j) - tpie
          plat(j) = rnort
          j = j + 1
 408     continue
         call llplxy(plon,plat,j-1,x,y,nout)
c
         xmax = 10.0*xrad
         ymax = 10.0*yrad
         do 410 k = 1,nout
            if (abs(x(k)).gt.xmax) x(k) = sign(xmax,x(k))
            if (abs(y(k)).gt.ymax) y(k) = sign(ymax,y(k))
 410     continue
         call jpolgn(x,y,nout)
         go to 900
c
c     Case #5  For cylindricals, including obliques.
 05      continue
c        Get rectanglular limits of the map from clip line ends.
         plon(1) = alon(2)
         plat(1) = alat(2)
         plon(2) = blon(2)
         plat(2) = blat(2)
         plon(3) = alon(3)
         plat(3) = alat(3)
         plon(4) = blon(3)
         plat(4) = blat(3)
         plon(5) = plon(1)
         plat(5) = plat(1)
         call llplxy(plon,plat,5,x,y,nout)
         xmax = 10.0*xrad
         ymax = 10.0*yrad
         do 510 k = 1,nout
            if (abs(x(k)).gt.xmax) x(k) = sign(xmax,x(k))
            if (abs(y(k)).gt.ymax) y(k) = sign(ymax,y(k))
 510     continue
         call jpolgn(x,y,nout)
         go to 900
c
c     End cases.
 900  continue
c
c     Draw a box around graphics area to overwrite background color.
      call xcolor (iocgra)
      call jmove (xrad,yrad)
      call jdraw (xrad,-yrad)
      call jdraw (-xrad,-yrad)
      call jdraw (-xrad,yrad)
      call jdraw (xrad,yrad)
c
      return
      end


C+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                     DA2LL
C
C FUNCTIONAL DESCRIPTION:        Converts distance and azimuth from
C                                any point to lat, lon.
C
C INPUT FILES/PARAMETERS:        slat,slon  - Start point coords.
C                                dist       - Arc distance.
C                                az         - Azimuth.
C
C GLOBAL VARIABLES:              pie, pio2
C
C OUTPUT FILES/PARAMETERS:       tlat,tlon  - Target point coords.
C
C SUBROUTINES CALLED:            None.
C
C CALLED BY:                     BLSET, LL2GC, PXOBLM, XPSTER
C
C LOCAL VARIABLES:               S,T,D       - Sides of polar triangle.
C
C RESTRICTIONS:                  None.
```

```
C
C ABNORMAL RETURN CONDITIONS:    Az from poles assumed cw from prime meridian.
C
C PROGRAMMER:                    DATE OF LAST CHANGE     REASON FOR CHANGE
C     Dave Nation                                        Original DATOLL
C     Tom Wescott (NOSC)         Dec 87                  Robust version.
C
C-*-*-*-*-*-*-*-*-*-*-*-*-*-*-*-*-*-*-*-*-*-*-*-*-*-*-*-*-*-*-*-*-*-*-*-*-*-*|*-*-*-*-
      subroutine DA2LL(slat,slon,dist,az,tlat,tlon)
c
      common /pie/ pie,tpie,pio2,pio4
c
      cosT = sin(slat)
      sinT = cos(slat)
      cosD = cos(dist)
      sinD = sin(dist)
c
c     Law of Cosines for polar distance of target point.
      cosS = cosT*cosD + sinT*sinD*cos(az)
      if (abs(cosS).gt.1.0)  cosS = sign(1.0,cosS)
      S = acos(cosS)
      tlat = pio2 - S
c
c     Calculate polar angle.
      sinS = sin(S)
      sinAz = sin(az)
      if ((abs(slat).lt.pio2).and.(abs(tlat).lt.pio2)) then
         denom = sinS*sinT
         dnumr = cosD - cosS*cosT
         cosDlo = dnumr/denom
c
         if (abs(cosDlo) .lt. 0.900) then
c           Law of Cosines works well for most polar angles.
            Dlo = sign(acos(cosDlo),sinAz)
         else
c           Law of Sines is more accurate when Dlo near 0 or pi.
            sinDlo = sinD*sinAz/sinS
            if (abs(sinDlo).gt.1.0)  sinDlo = sign(1.0,sinDlo)
            Dlo = asin(sinDlo)
            if (dnumr.lt.0.0)  Dlo = sign(pie,Dlo) - Dlo
         endif
      else
         if(sinS.eq.0.0) then
c           Target point is a pole.
            Dlo = 0.0
         else
c           Start point is a pole, assume caller has defined az from prime M.
            Dlo = - slon - az*cosT
         endif
      endif
c
      tlon = slon + Dlo
      if (abs(tlon).gt.pie) tlon = tlon - sign(tpie,tlon)
c
      return
      end


C+*+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME: distaz
C
C FUNCTIONAL DESCRIPTION:  Compute distance and azimuth between 2 points
C
C INPUT FILES/PARAMETERS:
C              L1, L2   - Latitude of first and second points in radians.
C              DLo      - Longitude difference between points in radians.
C
C GLOBAL VARIABLES :
C              common /center/
C              common /pie/
C
C OUTPUT FILES/PARAMETERS:
C              dist     - Arc length between points in degrees.
C              az       - Azimuth of second point in radians.
C                         Note... convention is cw positive.
C
```

```
C SUBROUTINES/FUNCTIONS CALLED :
C
C CALLED BY:                    NO LONGER USED BY CARICATURE
C
C LOCAL VARIABLES: NONE.
C
C RESTRICTIONS: NONE.
C
C ABNORMAL RETURN CONDITIONS:   NONE.
C
C LOCATION:
C
C PROGRAMMER:                   DATE OF LAST CHANGE    REASON FOR CHANGE
C
C     DAVE NATION
C     JERRY FENERTY                                    ORIGINAL CODE.
C                                                      DOCUMENT AND MODIFY
C                                                      FOR A21 PROTOTYPE.
C     Tom Wescott (NOSC)        Jan 86            Change to single precision
c     Tom Wescott               1987              fix cosER - distaz
C
C-*-*-*-*-*-*-*-*-*-*-*-*-*-*-*-*-*-*-*-*-*-*-*-*-*-*-*-*-*-*-*-*-*-*-*-*-*|*-*-*-*-

        SUBROUTINE DISTAZ (L1,DLo,L2,DIST,AZ)

c
      real L1, L2
      common /pi/ pie,tpie,pio2,pio4
      common /rade/ rade
      real*8 erd
      common /er/ er,erd
c
c
      sinL1 = sin(L1)
      cosL1 = cos(L1)
      sinL2 = sin(L2)
      cosL2 = cos(L2)
      cosDLo = cos(DLo)
c
c     Use cosine rule for sides to compute arc distance.
      cosER = sinL1*sinL2+cosL1*cosL2*cosDLo
      cosER = amax1(cosER,-1.0)
      cosER = amin1(cosER,1.0)
      er = acos(cosER)
c     Convert arc distance into degrees.
      dist = er * rade

cTemp Set erd for the remaining double precision routines.
      erd = er
c
      sinER = sin(er)
      sercl1 = sinER*cosL1
      if (sercl1 .eq. 0.0) then
c        Points are on same meridian, avoid zero divide.
         if (L2.gt.L1) then
            az = pie
         else
            az = 0.
         endif
      else
c        Use cosine rule again to compute azimuth.
         cosAZ = (sinL2-cosER*sinL1)/sercl1
         cosAz = amax1(cosAz,-1.0)
         cosAz = amin1(cosAz,1.0)
         az = acos(cosAZ)
      endif
c
c     Make azimuth clockwise positive.
      if (Dlo .lt. 0.0) az = tpie - az
c
      return
      end


C+*+*+*+*+*+*+*+*+*+*+*+*+*+*+*+*+*+*+*+*+*+*+*+*+*+*+*+*+*+*+*+*+*+*+*+*+*|*+*+*+*+
```

```
* UNIT NAME: DMAPII
*
* FUNCTIONAL DESCRIPTION:  READS WDBII AND DRAWS MAP.
*
* INPUT FILES/PARAMETERS:
*
*       XRNM    HORIZONTAL RADIUS (X DIRECTION) IN NAUTICAL MILES
*               OF THE DISPLAY VIEWPORT.  THIS IS 1/2 OF THE VIEWPORT WIDTH.
*               (ONE NAUTICAL MILE ROUGHLY EQUATES TO 1 MINUTE LATITUDE)
*       XCN     SCREEN COORDINATES OF THE CENTER OF THE MAP IN THE X DIRECTI
*       YCN     SAME AS ABOVE IN THE Y DIRECTION.
*       LEVEL   LEVELS OF DETAIL (CORRESPONDS TO LINE RANKING VALUES WITHIN
*               CATEGORIES OF WDBII DATA) RANGE IS BETWEEN 1 - LEAST DETAILE
*               AND 15 - MOST DETAILED
*       CLA     LATITUDE OF MAP AT CENTER OF SCREEN IN RADIANS
*               (NORTH IS POSITIVE, SOUTH NEGATIVE)
*       CLO     LONGITUDE OF MAP AT CENTER OF SCREEN IN RADIANS
*               (EAST IS POSITIVE, WEST NEGATIVE)
*       XRA     HALF OF WIDTH OF VIEWPORT IN SCREEN COORDINATES
*       YRA     HALF OF HEIGHT OF VIEWPORT IN SCREEN COORDINATES
*       ITPRO   NUMERIC VALUE REPRESENTING TYPE OF PROJECTION
*                       1 - GNOMONIC
*                       2 - ORTHOGRAPHIC EQUATORIAL
*                       3 - ORTHOGRAPHIC POLAR
*                       4 - ORTHOGRAPHIC (OBLIQUE)
*                       5 - PERSPECTIVE
*                       6 - EQUIRECTANGULAR
*                       7 - MERCATOR
*                       8 - LAMBERT CONFORMAL
*       IRES    MINIMUM RESOLUTION OF LINES IN SCREEN COORDINATES
*               A LINE WILL NOT BE DRAWN UNLESS IT IS IRES UNITS LONG
*               (UNLESS IT IS THE LAST VECTOR IN A STRING)
*       LTYPTB  THIS IS A TABLE OF 16 VARIABLES CONTAINING AN INTEGER
*               VALUE REPRESENTING LINE TYPE FOR THE WDBII LINE
*               CATEGORIES.  THE CATEGORIES ARE AS FOLLOWS:
*                    1       COASTLINES, ISLANDS, LAKES
*                    2       POLITICAL BOUNDARIES
*                    3       INTERNAL POLITICAL BOUNDARIES
*                    4       RIVERS
*                    5       RAILROADS
*                    6       ROADS
*                    7       CITY NAMES
*                    8       OUTLINE OF EARTH (ORTHOGRAPHIC PROJECTIONS)
*                    9       WATER FILL
*                   10       COUNTRY NAMES
*                   11
*                   12       MILITARY DISTRICTS
*                   13
*                   14
*                   15       SCALES
*                   16       GRIDS
*               THE VALUE REPRESENTS A VALUE RELATED TO THE HARDWARE
*               GRAPHICS DEVICE (COLOR, PLANE OR INTENSITY FOR RASTER SYSTEM
*               LINE TEXTURE FOR STORAGE TUBES)
*       LUNDAT  LOGICAL UNIT NUMBER FOR WDBII DATA FILE
*       LUNIND  LOGICAL UNIT NUMBER FOR WDBII INDEX FILE (REPRESENTS LINES)
*       LUNLIN  LOGICAL UNIT NUMBER FOR WDBII LINE INDEX FILE
*       LTON    TABLE OF 16 LOGICAL VALUES.  DETERMINES WHETHER THE
*               LINE TYPES REFERENCED BY LTYPTB ARE TO BE DISPLAYED
*       IPGRID  LAT/LON GRID DISPLAY PARAMETERS:
*               A FOUR VALUE INTEGER ARRAY CONSISTING OF THE FOLLOWING
*               1 - LATSTP - THE # OF MINUTES BETWEEN DISPLAYED LATITUDE LIN
*               2 - LONSTP - AS ABOVE WITH LONGITUDE
*               3 - LATINC - THE # OF MINUTES BETWEEN LINE SEGMENTS IN THE
*                       LINES REPRESENTING LATITUDE (RESOLUTION OF THE LINE)
*               4 - LONINC - AS ABOVE WITH LONGITUDE
*       DOTEM   A LOGICAL VALUE INDICATING TO USE DOTS TO REPRESENT LINES
*               OF LATITUDE AND LONGITUDE IF TRUE.
*       ORHALT  ALTITUDE FOR PERSPECTIVE
*       LTYPOV  THIS IS A TABLE OF 16 VARIABLES CONTAINING AN INTEGER
*               VALUE REPRESENTING LINE TYPE FOR OVERLAY FEATURES.
*       LTONOV  TABLE OF 16 LOGICAL VALUES.  DETERMINES WHETHER THE
*               LINE TYPES REFERENCED BY LTYPOV ARE TO BE DISPLAYED.
*       RANKT   RANK TABLE  -- LOGICAL TABLE OF UP TO 26 RANKS FOR EACH
```

```
*               OF THE 16 MAP LINE TYPES.
*
* GLOBAL VARIABLES :
*
*      INTERR      INTERR  LOGICAL    FLAG TO INDICATE IF MAP
*                                     DRAWING IS TO BE INTERRUPTED.
*      INVALI      INVALI  LOGICAL    INDICATES VALIDITY OF XYTOLL
*                                     AND LLTOXY CONVERSIONS.
*      LTYPS       LTYPS   INTEGER    CURRENT LINE TYPE.
*      ISEMAX      ISEMAX  INTEGER
*      XRAD        VIEWP   REAL       HALF OF VIEPORT WIDTH.
*      YRAD        VIEWP   REAL       HALF OF VIEWPORT HIEGHT
*      KB          TERMIN  INTEGER    WRITE UNIT NUMBER.
*      ICRT        TERMAIN INTEGER    READ UNIT NUMBER.
*      IGNOMN      PROJT   INTEGER    GNOMONIC PROJECTION.
*      IORTEQ      PROJT   INTEGER    ORTHOGRAPHIC EQUATORIAL PROJECTION.
*      IORTPO      PROJT   INTEGER    ORTHOGRAPHIC POLAR PROJECTION.
*      IORTHO      PROJT   INTEGER    ORTHOGRAPHIC PROJECTION.
*      IPERSP      PROJT   INTEGER    PERSPECTIVE PROJECTION.
*      IEQREC      PROJT2  INTEGER    EQUIRECTANGULAR PROJECTION.
*      IMERCA      PROJT2  INTEGER    MERCATOR PROJECTION.
*      ILAMCN      PROJT2  INTEGER    LAMBERT CONFORMAL PROJECTION.
*      ICNTGP      COUNTS  INTEGER
*      ICNTDV      COUNTS  INTEGER
*      PIE         PIE     REAL       3.14 ...
*      TPIE        PIE     REAL       TWO * PIE.
*      PIO2        PIE     REAL       PIE / 2.
*      PIO4        PIE     REAL       PIE / 4.
*      FILPLY    POLYCB  LOGICAL    WHETHER OR NOT POLYGON FILL HAS BEEN
*                                SELECTED FROM MENU.
*      OPNPLY    POLYCB  LOGICAL    WHETHER OR NOT POLYGON FILL FILE
*                                HAS OPENED PROPERLY.
*
* OUTPUT FILES/PARAMETERS:  NONE.
*
* SUBROUTINES/FUNCTIONS CALLED :
*
*      INITIA       INITIALIZE MAP PARAMETERS.
*      LIMITS       CALCULATE THE GEOGRAPHIC LIMITS.
*      MAPMSG       PRINTS MESSAGE INDICATING WHICH FEATURE
*                   IS BEING DRAWN.
*      GLTYPE       SETS COLOR TYPE AND OPENS NEXT SEGMENT.
*      DROUTL       DRAWS OUTLINE  OF EARTH.
*      FLUSHB       FLUSHES GRAPHIC BUFFER.
*      CHINT        CHECKS FOR INTERRUPT.
*      CHECKA       CHECKS RECTANGULAR AREA FOR INTERSECTION
*                   WITH VIEWPORT.
*      CHECKM       CHECKS RECTANGULAR AREA FOR INTERSECTION
*                   WITH VIEWPORT (MERCATOR & EQUIRECTANGULAR).
*      GTLIN        GETS LINE RECORD FROM WDBII.
*      GETPOI       GETS A POINT FROM WDBII.
*      GETLND       GETS A LINE INDEX RECORD
*      INVTES       CHECKS INVISIBILITY OF A POINT.
*      INVTS2       CHECKS MERCATOR AND EQUIRECTANGULAR FOR LINES
*                   TO BE CLIPPED AT LEFT AND RIGHT OF SCREEN.
*      LLTOXY       CONVERTS LAT/LONG TO X,Y.
*      CLIPXY       CLIPS X,Y AGAINST VIEPORT.
*      PROCPO       POSITIONS POINT X,Y.
*      GETSEG       RETURNS NEXT SEGMENT NUMBER.
*      FILLPT       SEED FILL AT POINT X,Y.
*      FILLIT       PERFORMS SEED FILL AT X,Y IF X,Y IS ON SCREEN.
*      GRID         DRAWS LAT/LONG, UTM OR GAUSS GRID.
*      SCLRET       DRAWS MAP SCALES.
*      NAMLIM       PLOTS NAMES ON MAP.
*
* CALLED BY:                  MAPPER
*
* LOCAL VARIABLES:
*
*      MAXCAT            INTEGER    MAXIMUM CATEGORY VALUE.
*      LCGRID            INTEGER    GRID FEATURE NUMBER.
*      LCOUTL            INTEGER    EARTH OUTLINE FEATURE NUMBER.
*      LCFILL            INTEGER    FILL FEATURE NUMBER.
*      LCNAME            INTEGER    NAMES FEATURE NUMBER.
*      LCCITY            INTEGER    CITY NAMES FEATURE NUMBER.
*      LSCALE            INTEGER    SCALES FEATURE NUMBER
```

```
*        LCWTR                    INTEGER     WATER FILL FEATURE NUMBER
*        EOF                      LOGICAL     END OF FILE FLAG.
*        ERF                      LOGICAL     END OF FILE FOR WDBII DATA
*                                             FILE.
*        SETINV                   LOGICAL     WHETHER OR NOT TO CHECK LINES
*                                             AND/OR POINTS FOR VISIBILITY
*                                             ON SPHERE.
*        CHINV                    LOGICAL     SAME AS SETINV.
*        SOMEON                   LOGICAL     INDICATES THAT AT LEAST ONE POINT
*                                             CHECKED IS ON THE SCREEN.
*        ALLON                    LOGICAL     INDICATES ALL POINTS ARE ON SCREEN
*        ISINV                    LOGICAL     INDICATES IF POINT WAS
*                                             INVISIBLE.
*        ISGOOD                   LOGICAL     WHETHER OR NOT TWO POINTS SHOULD
*                                     BE CONNECTED (MERC. & EQUIREC.).
*        DOFILL                   LOGICAL     WHETHER OR NOT POLYGON FILL
*                                     WILL BE EXECUTED.
*        NEWONS                   LOGICAL     INDICATES IF NEW POINT IS
*                                             INVISIBLE.
*        NEWSEQ                   LOGICAL     INDICATES IF POINT IS PART
*                                             OF NEW SEQUENCE OF POINTS
*                                             OR PART OF PREVIOUS LINE.
*        SEGCDE                   INTEGER     0 - NORMAL FILL
*                                             1 - INTERIOR SEGMENT FILL
*        LINCDE                   INTEGER     NULL    - DEFAULT
*                                    CONCAT - CONCATENATE LINES
*                                    TPL    - 2 PT. LINE
*                                           (SHOULD NOT OCCUR)
*                                    SLP    - SINGLE LINE POLYGON
*                                    EOP    - END OF POLYGON
*                                           (MULTIPLE LINES)
*                                    EOS    - END OF STRING OF LINES
*                                           (MULTIPLE LINES PLUS
*                                           POLYGON FILL FILE DATA).
* RESTRICTIONS: NONE.
*
* ABNORMAL RETURN CONDITIONS:   NONE.
*
* LOCATION:                     /gl/dmapii.ftn
*
* PROGRAMMER:                   DATE OF LAST CHANGE     REASON FOR CHANGE
*
*    DANation
*    GJFenerty                                           Original code
*    DAN BERKICH -SAIC-         OCTOBER 1986            POLYGON FILL
*    for L MCCLEARY -NOSC-
*
C-*-*-*-*-*-*-*-*-*-*-*-*-*-*-*-*-*-*-*-*-*-*-*-*-*-*-*-*-*-*-*-*-*-*-*-*-*|*-*-*-*-

      SUBROUTINE DMAPII (XRNM,XCN,YCN,LEVEL,CLA,CLO,XRA,YRA,ITPRO,
     +          IRES,LTYPTB,LUNDAT,LUNIND,LUNLIN,LTON,IPGRID,DOTEM,
     +          ORHALT,ltypov,ltonov,rankt)

      INTEGER LEVEL(16)
      logical select

      LOGICAL EOF,ERF,CHINV,SETINV,SOMEON,allon,ISINV
      LOGICAL LTON(16)
      LOGICAL DOTEM
      logical rankt(26,16)
      logical ltonov(16)
      dimension ltypov(16)

      DIMENSION ALIMIT(4),LTYPTB(16),IPGRID(4)

      CHARACTER*1 CH
      logical savchi
      LOGICAL INTERR
      COMMON /INTERR/ INTERR
      COMMON /LTYPS/ LTYPS
      COMMON /ISEMAX/ ISEMAX
      COMMON /VIEWP/ XRAD,YRAD,IXNP,IYNP,XC,YC
      COMMON /TERMIN/ KB,ICRT
      COMMON /PROJT/ IGNOMN,IORTEQ,IORTPO,IORTHO,IPERSP
```

```
      COMMON /PROJT2/ IEQREC,IMERCA,ILAMCN
      COMMON /COUNTS/ ICNTGP,ICNTDV,icntpl
      COMMON /PIE/ PIE,TPIE,PIO2,PIO4
      common/scratr/qbox,qbkgrd
      integer     qbox,qbkgrd
      LOGICAL INVALI
      COMMON /INVALI/ INVALI

      COMMON /LWDBII/ NLINDE,LENLIN,icntli

      logical map,vax,count
      common /mapdbc/ map
      common /vaxdbc/ vax
      common /cntdbc/ count
      logical bitmod
      common /bitmod/ bitmod
      common /viewbr/ vpnort,vpsout,vpeast,vpwest
      INTEGER SEGNO,FIRSEG
      COMMON /SEGNO/ SEGNO,FIRSEG
      integer boxseg
      integer oldlca
      common /gmcom/ oldlca,irnk

      EQUIVALENCE (RMINLA,ALIMIT(1)),(RMAXLA,ALIMIT(2))
      EQUIVALENCE (RMINLO,ALIMIT(3)),(RMAXLO,ALIMIT(4))

      logical filply,opnply
      common /polycb/ filply,opnply
      LOGICAL isgood,DOFILL,savfil
      common /dofill/DOFILL
      real maxx,maxx2
      common /maxx/ maxx,maxx2
      INTEGER   pntblk,POICNT,LINBLK

      integer pblack
      INTEGER null,concat,tpl,slp,eop,eos
      PARAMETER (Null   = 0)
      PARAMETER (CONCAT = 1)
      PARAMETER (TPL    = 2)
      PARAMETER (SLP    = 5)
      PARAMETER (EOP    = 6)
      PARAMETER (EOS    = 7)
      PARAMETER (PBLACK = 0)
      integer   lincde
      integer*2 segcde
      INTEGER   iprojection
      COMMON   /con001/ iprojection

      DATA MAXCAT/16/
      DATA ISEMAX/15/
      DATA LCCIL/1/
      DATA LCGRID/16/,LCOUTL/8/,ICRT/5/,KB/6/,LCNAME/10/
      DATA LCCITY/7/,LSCALE/15/,LCWTR/9/

c     placement in overlay values for polygon fill

C      DATA LCFILL/5/

      iprojection = itpro
      DOFILL = (filply.and.opnply)
      INTERR = .FALSE.
      if (map) then
         print*,' ********** IN DMAPII ************'
         print*,
     1    'XRNM,XCN,YCN,LEVEL,CLA,CLO,XRA,YRA,ITPRO,LTYPTB,LTON'
         print*,XRNM,XCN,YCN,LEVEL,CLA,CLO,XRA,YRA,ITPRO,
     1        LTYPTB,LTON
      endif

C     MAKE SURE THE NEXT COLOR IS SET IN GLTYPE
      LTYPS = -1

C     DO SOME LIMITING ON THE NAUTICAL MILE RADIUS VALUE
      IF (XRNM.LT..1) XRNM = .1
```

```
      IF (XRNM.GT.30000.) XRNM = 30000.

      XRAD = XRA
      YRAD = YRA

      CALL INITIA (XCN,YCN,CLA,CLO,XRA,YRA,ITPRO,IRES,XRNM,ORHALT)
      ICNTGP=0
      ICNTDV=0
      icntpl=0
c
c     Determine NSEW geographic limits of viewport's bounding rectangle.
      call limit2
c
c     Set up the breakline for conics.
      call blset(setinv)
c
C     DRAW OUTLINE OF EARTH
      IF (LTON(LCOUTL)) THEN
          if (DOFILL) then
            LTYPE=LTYPTB(lcwtr)
            CALL GLTYPE(LTYPE,lcwtr)
          else
            ltype=ltyptb(LCOUTL)
            CALL GLTYPE(LTYPE,lcoutl)
          endif

C         POLYGON COLOR = CURRENT LINE COLOR
          CALL XPIDEX (LTYPE,0)
          call d2outl
c
          CALL FLUSHB
          if (bitmod) then
            call jclose
            call jopen
          else
            CALL JRCLOS
            CALL JPURGE(FIRSEG)
            CALL JROPEN(FIRSEG)
          endif
          CALL XPIDEX (qbox,0)
          CALL JPINTR (0)
          CALL JPEDGE (1)
          CALL XCOLOR(qbox)
          CALL JRECT (-XRAD,-YRAD,XRAD,YRAD)
      ENDIF
c
C ----- REMOVE WHEN USING C I/O ROUTINES
      if (vax) then
c        no need for rewind
      else
         rewind lunlin
      endif

      EOF=.FALSE.
c     initializing variable icntli so that getlnd starts at the beginning
c     of the file after an interrupt
      ICNTLI=0
      ICGLIN=0
      INVALI=.FALSE.
      CALL lltoxy(cla,clo+pie,maxx,y1)
      maxx = abs(maxx)
      lastcat = 0
      oldlca = -1
c   -----------------  Top of Segment Loop  -----------------------
C     LOOP THROUGH SECTIONS IN FILE
      nseg = 0
  810 CONTINUE

        CHINV=SETINV
        CALL getlnd (lunlin,icglin,lblk,loffs,nlines,lcateg,
     +           rminla,rmaxla,rminlo,rmaxlo,eof)
        IF (EOF) GO TO 890
        nseg = nseg + 1

        DOFILL = (filply.and.opnply)
```

```
C  don't  READ TO END OF FILE IF INTERRUPTED WITHOUT DRAWING
          CALL CHINT (INTERR,CH)
          IF (INTERR) GO TO 969
          IF (LCATEG.GE.1.AND.LCATEG.LE.MAXCAT.AND.
     +    ((LTON(LCATEG)).or.
     +     ((LCATEG.EQ.1).and.(DOFILL)))) then
          IF (LCATEG.GT.1) DOFILL = .FALSE.
            if (lcateg.ne.oldlca) then
                LTYPE=LTYPTB(LCATEG)
                CALL GLTYPE(LTYPE,lcateg)
                if (level(lcateg).lt.1) level(lcateg) = 1
                ICNTDV=0
                oldlca = lcateg
            endif
          segcde = 0
          IF (DOFILL) CALL rdseg(icglin,linblk,lincnt,
     +                segcde,rminla,rminlo,rmaxla,rmaxlo,ierror)
c         Check segment for intersection with viewport.
          call ck4any(someon,alimit)
          if (someon)  call ck4all(allon,alimit)
c
          savchi = chinv
          IF (SOMEON) then
             IF (lastcat.NE.lcateg) then
               lastcat = lcateg
               if (opnply) then
                 maxrank = 0
                 if ((lcateg.eq.5.).or.(lcateg.eq.6)) then
                   i = 9
                 else if (lcateg.eq.11) then
                   i = 26
                 else
                   i = 15
                 endif
                 do 100 irnk = 1,i
                   if (rankt(irnk,lcateg)) maxrank = irnk
100              continue
               endif
            endif
c
            if (.not.chinv) then
c              Conic breakline is possible, segment may need clipping.
               call blchk(isgood,alimit)
            else
               isgood = .true.
            endif
c
            IF (segcde.EQ.1) THEN
c             Segment is interior to shoreline.  Use add file for background.
              if (lton(LCCIL)) then
                CALL jcolor(ltyptb(lccil))
              else
                CALL jcolor(ltyptb(lcoutl))
              endif
              CALL jpidex(ltyptb(lcoutl),0)
c
              CALL intpoi(isgood)
              CALL mrkpoi
              CALL rdline(linblk,pntblk,poicnt,
     +             rsmnla,rsmnlo,rsmxla,rsmxlo,lblkoff,ierror)
              call sveadd(pntblk,poicnt)
              call flsply(ECS,lton,isgood)
            ENDIF
            CALL intpoi(isgood)
c
c ------------------------------------------------------------------
c           T o p   o f   L i n e   L o o p
c
               DO 880 J=1,NLINES
                   savfil = dofill
                   chinv = savchi
                   CALL CHINT (INTERR,CH)
                   IF (INTERR) GO TO 969
```

```
                  lblksav = lblk
                  loffsav = loffs
                  CALL gtlin(lunind,lblk,loffs,iblk,ioffs,
     +                       npoint,irnk,
     +                       rminla,rmaxla,rminlo,rmaxlo,ios)
                 IF (lcateg.ne.1) THEN
                    lincde = 0
                 ELSE
                    IF (DOFILL) THEN
                      lincde = irnk/2**8
                    ELSE
                      lincde = 0
                    ENDIF
                    irnk = MOD(irnk,2**8)
                    IF (mod(irnk,100).GT.15) THEN
                        ityp = irnk/16
                        irnk  = mod(irnk,16)
                    ELSE
                        ITYP = irnk/100
                        irnk  = mod(irnk,100)
                    ENDIF
                    if (irnk.eq.8) then
c                      Avoid trying to fill reefs.
                       dofill = .false.
                    endif

                    IF (ityp.EQ.2) THEN
                       if (lton(LCCIL)) then
                         call jcolor (ltyptb(lccil))
                       else if (lton(lcoutl)) then
                         CALL jcolor(ltyptb(lcwtr))
                       else
                         call jcolor(qbkgrd)
                       endif
                       if (lton(lcoutl)) then
                          CALL jpidex(ltyptb(lcwtr),1)
                       else
                          call jpidex(qbkgrd,1)
                       endif
                   ELSE
                      if (dofill) then
                         if (lton(LCCIL)) then
                           CALL jcolor(ltyptb(lccil))
                         else
                           CALL jcolor(ltyptb(lcoutl))
                         endif
                      else
                         CALL jcolor(ltyptb(lccil))
                      endif
                         CALL jpidex(ltyptb(lcoutl),0)
                   ENDIF
                ENDIF
               IF ((lincde.EQ.eos)
     +              .AND.DOFILL) THEN
                CALL rdline(linblk,pntblk,poicnt,
     +               rminla,rminlo,rmaxla,rmaxlo,lblkoff,ierror)
                    IF (pntblk.ne.0) THEN
c                      Make sure that the line in the polygon fill file
c                      is a mate to the WDB line.
                     IF (lblkoff/2**8.ne.lblksav.or.
     +                        mod(lblkoff,2**8).ne.loffsav) THEN
                    PRINT *,
     +              'Polygon fill line DOES NOT match WDB line...'
                            print *,icglin
 821  format(x,'WDB blk/off =',i5,'/',i2,' CHG blk/off =',i5,'/',i2)
                    PRINT 821,lblksav,loffsav
     1               ,lblkoff/2**8,mod(lblkoff,2**8)
c                      do not append points
                       poicnt = 0
                     ENDIF
                  ENDIF
               ENDIF


c                ****** use combination of digits of rrr and rds rank
```

```
         if (lcateg.eq.5.or.lcateg.eq.6) irnk = irnk/10
         if ((opnply).and.(irnk.gt.maxrank)) goto 882
         select = rankt(irnk,lcateg)
       . IF (select) then
c
           Polyline visibility check.
           if (.not.allon) call ck4any(someon,alimit)

           IF (SOMEON.or.(dofill.and.
     +     (lincde.eq.CONCAT.or.lincde.ge.EOP))) then
C             NEWSEQ=.TRUE.
              PNTCNT=0
              ERF=.FALSE.
              ISINV=.FALSE.
              ipcnt = 0
c
c      ---------------------------------------------------
c        T o p   o f   P o i n t s   L o o p
c
c
              Concatenate WDBII polyline to polyline buffers.
              DO 860 K=1,NPOINT
                CALL getpoi(lundat,iblk,ioffs,plat,plon,erf)
                IF (ERF) GO TO 865
                CALL svepoi(plon,plat)
  860         CONTINUE
c
           IF (lincde.EQ.EOS)
     +     THEN
c             Concatenate ADD FILE polyline to polyline buffers.
              CALL mrkpoi
              call sveadd(pntblk,poicnt)
           ENDIF
c
c        B o t t o m   o f   P o i n t s   L o o p
c      ---------------------------------------------------
c
           IF (lincde.NE.concat) THEN
c             Process the completed polygon.
              CALL flsply(lincde,lton,isgood)
              CALL intpoi(isgood)
           ENDIF
  865            CONTINUE
              endif
         endif
         dofill = savfil
  880    CONTINUE
  882    CONTINUE
c
c         B o t t o m  o f   L i n e   L o o p
c ------------------------------------------------------------------------
c
          endif
        endif
c       check the size of the current retained segment and create a new on
c         call chksiz
      GO TO 810
  890 CONTINUE

      if ((count) .and. icntdr.gt.0) then
          print*,'dmapii -- moves, draws, polylines : ',icntgp,
     +    icntdv,icntpl,' (',icntmv,icntdr,')'
      endif

      CALL FLUSHB

      call areafl

      if(lton(lcwtr)) then
         ltype = ltyptb(lcwtr)
         call gltype(ltype,lcwtr)
         call fillit(ltype,xrnm,level(lcwtr))
      endif
      if(lton(lcname)) then
         ltype = ltyptb(lcname)
         call gltype(ltype,lcname)
```

```
            call namlim('namlim.dat',10,lton,xrnm)
         endif
         if(lton(lccity)) then
            ltype = ltyptb(lccity)
            call gltype(ltype,lccity)
            call pltcit(xrnm,'cities.dat',10)
         endif
         if (lton(lcgrid)) then
            ltype=ltyptb(lcgrid)
            call gltype(ltype,lcgrid)
c
c           The grid drawing routines still use numeric vs spatial limits:
            vmaxla = vpnort
            vminla = vpsout
            vmaxlo = vpeast
            vminlo = vpwest
            if (vmaxlo.lt.vminlo) then
               vmaxlo = +pie
               vminlo = -pie
            endif
            call dgrid(ipgrid,vmaxla,vminla,vmaxlo,vminlo,dotem,itpro)
         endif
  969    CONTINUE

         if (interr) then
             call flushb
         endif

C       PATCH EDGES

        if (dofill) then
c                                        put box in its own segment
          if (.not.bitmod) then
           call jrclos
           call getseg(boxseg)
           call jropen(boxseg)
          endif
          CALL xcolor(qbox)
          CALL jmove(-xrad,-yrad)
          CALL jdraw(-xrad,yrad)
          CALL jdraw(xrad,yrad)
          CALL jdraw(xrad,-yrad)
          CALL jdraw(-xrad,-yrad)
          CALL jupdat
        endif

         RETURN
         END

C+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                       eastl
C
C FUNCTIONAL DESCRIPTION:          Finds the eastmost of two longitudes
C                                  as viewed from map center
C
C INPUT FILES/PARAMETERS:          rlon1,rlon2 - Two longitudes.
C
C GLOBAL VARIABLES:                clon        - Map center longitude
C
C OUTPUT FILES/PARAMETERS:         eastl       - The eastmost.
C
C SUBROUTINES/FUNCTIONS CALLED:    None.
C
C CALLED BY:                       CK4ANY
C
C LOCAL VARIABLES:                 Breakl    - Conic break line longitude.
C                                  r1, r2    - Conditionally offset rlon1,rlon2.
C
C RESTRICTIONS:                    None.
C
C ABNORMAL RETURN CONDITIONS:      None.
C
C LOCATION:
```

```
C
C PROGRAMMER:                          DATE OF LAST CHANGE     REASON FOR CHANGE
C
C     Tom Wescott  (NOSC)              11/87                   Original entry.
C
C-*-*-*-*-*-*-*-*-*-*-*-*-*-*-*-*-*-*-*-*-*-*-*-*-*-*-*-*-*-*-*-*-*-*-*-*-*-*-*-*|*-*-*-*-
c
      function east1(rlon1,rlon2)
c
      common/center/ clat,clon,cclat,sclat
      common/pie/ pie,tpie,pio2,pio4
c
      break1 = clon - sign(pie,clon)
c
      r1 = rlon1
      r2 = rlon2
      if (r1 .lt. break1) r1 = rlon1 + tpie
      if (r2 .lt. break1) r2 = rlon2 + tpie
c
      if (r1 .lt. r2) then
         east1 = rlon2
      else
         east1 = rlon1
      endif
c
      return
      end

C+*+*+*+*+*+*+*+*+*+*+*+*+*+*+*+*+*+*+*+*+*+*+*+*+*+*+*+*+*+*+*+*+*+*+*+*+*+*+*+|*+*+*+*+
C UNIT NAME:                          FTPRNT
C
C FUNCTIONAL DESCRIPTION:             Cross hatches the footprint (instantaneous
C                                     viewing area) for an aerial platform.
C
C INPUT FILES/PARAMETERS:             plo,pla     - Platform (lon,lat).
C                                     alt         - Platform altitude, nm.
C                                     afov        - Angular field of view, radians.
C                                     tilt        - Look angle from nadir, radians.
C                                     azi         - Azimuth of look angle, radians.
C                                     x0,y0       - Point justifying the hatch.
C                                     dx,dy       - Hatch line direction vector.
C                                     dist        - Distance between hatch lines.
C
C GLOBAL VARIABLES:                   None.
C
C OUTPUT FILES/PARAMETERS:            Array of line segments forming hatch pattern.
C
C SUBROUTINES CALLED:                 blplin, blhatc, da2ll
C
C CALLED BY:                          satcov
C
C LOCAL VARIABLES:                    plo(),pla()- Polyline in geographic coords.
C                                     EARTHR     - Earth radius, nm
C
C RESTRICTIONS:                       None.
C
C PROGRAMMER:                         DATE OF LAST CHANGE     REASON FOR CHANGE
C     Tom Wescott (NOSC)              Oct 88                  Original entry.
C
C-*-*-*-*-*-*-*-*-*-*-*-*-*-*-*-*-*-*-*-*-*-*-*-*-*-*-*-*-*-*-*-*-*-*-*-*-*-*-*-*|*-*-*-*-
C     not in 3.0
      subroutine ftprnt(plo,pla,alt,afov,tilt,azi,x0,y0,dx,dy,dist)
C
      parameter (NPTS=61, IDIM=10*NPTS)
      real rlo(2*NPTS),rla(2*NPTS), ulo(IDIM),ula(IDIM)
      common /pie/ pie,tpie,pio2,pio4
      logical invali
      common /invali/ invali
      parameter (EARTHR = 3440.1)
C
C
C     Find horizon - platform - center of earth angle.
      pc = EARTHR + alt
```

```
      hpc = asin(EARTHR/pc)
C
C     To calculate tilt and azimuth angles for any ray from the platform,
C     consider a sphere of radius alt tangent to the earth at nadir.
C     Get spherical (pseudolat;azimuth) coords of viewing cone center line.
      cphi = tilt - pio2
      ctheta = azi
      razmax = 0.0
      razmin = 0.0
C
C     Does viewing cone miss the earth?
      halfov = afov/2.0
      if (hpc .lt. (tilt-halfov)) RETURN
C
C     Generate closed polyline for the projected cone rays.
      do 100 i = 1, NPTS
         azz = i*tpie/(NPTS-1.)
C
C        Get tilt and azimuth for the ray at angle azz around the cone.
         call da2ll(cphi,ctheta,halfov,azz,phi,theta)
C        Convert pseudolat to tilt angle from nadir.
         rtilt = pio2 + phi
         razmth = theta
C
C        Truncate polyline radially at the horizon.
         rtilt = amin1(rtilt,hpc)

C        Law of Sines calculates arc from nadir to intersection with earth.
         sinEXT = amin1(1.0,pc*sin(rtilt)/EARTHR)
         arc = asin(sinEXT) - rtilt
C
         call da2ll(pla,plo,arc,razmth,rla(i),rlo(i))
C
 100  continue
C
C
C     Condition polyline for uniform pt spacing in current projection.
      call ll2gc(rlo,rla,npts,IDIM,ulo,ula,nout)
C
C     Area outline is an option.
      call blplin(uio,ula,nout)
C
C     Fill area viewed with a hatch pattern.
      call blhatc(ulo,ula,nout,x0,y0,dx,dy,dist)
C
C     Mark sub-platform point if view is oblique.
      if ((tilt.gt.0.0).and.(.not.invali)) then
         call llplxy(plo,pla,1,px,py,idummy)
         call jcmark(2)
         call jmark(px,py)
      endif
C
      return
      end


C+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                  HATCH
C
C FUNCTIONAL DESCRIPTION:     Cross hatches a polygon by parallel lines.
C
C INPUT FILES/PARAMETERS:     x(n), y(n) - Vertex coordinate arrays.
C                             n          - Number of verticies.
C                             xtie,ytie  - Point justifying the hatch.
C                             dX,dY      - Hatch line direction vector.
C                             dist       - Distance between hatch lines.
C
C GLOBAL VARIABLES:           None.
C
C OUTPUT FILES/PARAMETERS:    Array of line segments forming hatch pattern.
C
C SUBROUTINES CALLED:         jdraw, jmove
C
C CALLED BY:                  blhatc
C
C LOCAL VARIABLES:            xi,yi        - Current point in input polyline.
```

```
C                                  s1, s2       - Sign of sN tells half plane.
C                                  dX, dY, D    - Coefficients of hatch line in
C                                                 form:    dY*x - dX*y + D = 0
C                                  ddx,ddy,dd   - Coefs of polyline segment.
C
C RESTRICTIONS:                    None.
C
C PROGRAMMER:                      DATE OF LAST CHANGE    REASON FOR CHANGE
C     Tom Wescott  (NOSC)          Oct 88                 Original entry.
C
C-*-*-*-*-*-*-*-*-*-*-*-*-*-*-*-*-*-*-*-*-*-*-*-*-*-*-*-*-*-*-*-*-*-*-*-*-*|*-*-*-*-
C
      subroutine hatch(x,y,nin,xtie,ytie,dX,dY,dist)
      dimension x(*),y(*)
c
      include   'carmaxdim.inc'
c
      dimension xout(MAXV),yout(MAXV)
c
c     Insure that we are dealing with a closed polygon.
      if ((x(nin).ne.x(1)).or.(y(nin).ne.y(1))) then
         n = nin + 1
         x(n) = x(1)
         y(n) = y(1)
      else
         n = nin
      endif
c
c     Bracket coefficient D for hatch lines that intersect the polygon.
      Dmin = dX*y(1) - dY*x(1)
      Dmax = dmin
      do 100 i = 2, n
         D = dX*y(i) - dY*x(i)
         Dmin = amin1(Dmin,D)
         Dmax = amax1(Dmax,D)
 100  continue
      Dtie = dX*ytie - dY*xtie
c
c     Construct a distance vector s perpendicular to hatch vector.
      dmod = sqrt(dX*dX+dY*dY)
      sx = -dist/dmod*dY
      sy = +dist/dmod*dX
c
c     Vector q = tie + ks will locate base for hatch lines.  k = kmin...kmax.
      kmin = (Dmin-Dtie)/(dist*dmod)
      kmax = (Dmax-Dtie)/(dist*dmod)
c
      do 400 k = kmin, kmax
         nintr = 0
         qx = xtie + k*sx
         qy = ytie + k*sy
         D = dX*qy - dY*qx
c
c        Process the first point.
         s1 = dY*x(1) - dX*y(1) + D
c
         if (n.gt.1) then
            do 200 i = 2, n
               s2 = dY*x(i) - dX*y(i) + D
               if ((s1.le.0.0).and.(s2.le.0.0)) then
c                 Do nothing.
               else if ((s1.gt.0.0).and.(s2.gt.0.0)) then
c                 Do nothing.
               else
c                 Find intersection of polyline segment with hatch line.
                  ddy = y(i-1) - y(i)
                  ddx = x(i-1) - x(i)
                  dd = x(i-1)*y(i) - y(i-1)*x(i)
                  xa = -(ddx*D-dX*dd)
                  ya = -(ddy*D-dY*dd)
                  wa = -(ddy*dX-dY*ddx)
                  nintr = nintr + 1
c                 if (nintr.ge.MAXV) return
                  xout(nintr) = xa/wa
```

```
                  yout(nintr) = ya/wa
               endif
               s1 = s2
 200        continue
         endif
c
c        Sort the list of intersections by position along the hatch line.
         if (nintr.gt.1) then
            do 290 ii = 1, nintr-1
               do 280 kk = ii+1, nintr
                  if (abs(dX).gt.abs(dY)) then
                     if (xout(ii).lt.xout(kk)) then
                        temp = xout(ii)
                        xout(ii) = xout(kk)
                        xout(kk) = temp
                        temp = yout(ii)
                        yout(ii) = yout(kk)
                        yout(kk) = temp
                     endif
                  else
                     if (yout(ii).lt.yout(kk)) then
                        temp = xout(ii)
                        xout(ii) = xout(kk)
                        xout(kk) = temp
                        temp = yout(ii)
                        yout(ii) = yout(kk)
                        yout(kk) = temp
                     endif
                  endif
 280           continue
 290        continue
         endif
c        Draw lines between adjacent pairs of intersections.
         if (nintr.gt.1) then
            do 500 i = 1, nintr-1, 2
               call jmove(xout(i),yout(i))
               call jdraw(xout(i+1),yout(i+1))
 500        continue
         endif
 400  continue
c
      return
      end


C+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME: initia
C
C FUNCTIONAL DESCRIPTION: Initialize variables for dmapii
C
C INPUT FILES/PARAMETERS:
C
C GLOBAL VARIABLES : NONE.
C
C OUTPUT FILES/PARAMETERS:  NONE.
C
C SUBROUTINES/FUNCTIONS CALLED :
C
C CALLED BY:                    BOXARE, BSTMAP, DMAPII, MAPPER, RPARAM
C
C LOCAL VARIABLES: NONE.
C
C RESTRICTIONS: NONE.
C
C ABNORMAL RETURN CONDITIONS:   NONE.
C
C LOCATION:
C
C PROGRAMMER:                     DATE OF LAST CHANGE    REASON FOR CHANGE
C
C     DAVE NATION                                       ORIGINAL CODE.
C     JERRY FENERTY                                     DOCUMENTATION AND MODIFI
C                                                       FOR A21 PROTOTYPE.
C     Tom Wescott   (NOSC)         10/87                Partial cleanup.
```

```
C
C-*-*-*-*-*-*-*-*-*-*-*-*-*-*-*-*-*-*-*-*-*-*-*-*-*-*-*-*-*-*-*-*-*-*-*-*-*-*-*|*-*-*-*-

      SUBROUTINE INITIA (XCN,YCN,CLA,CLO,XRA,YRA,ITPRO,IRES,XRNM,
     + ORHAL)

C     Initialize variables for dmapii

c      COMMON /PROJT/ IGNOMN,IORTEQ,IORTPO,IORTHO,IPERSP
c      COMMON /PROJT2/ IEQREC,IMERCA,ILAMCN
      COMMON /PIE/ PIE,TPIE,PIO2,PIO4
      LOGICAL SAVEXY
      COMMON /STMSGS/ XPREV,YPREV,IRESSQ,XSAV,YSAV,SAVEXY
      COMMON /CONST/ MAXVAL,RMPV,C,R,ERNM
      COMMON /CENTER/ CLAT,CLON,CCLAT,SCLAT
      COMMON /VIEWP/ XRAD,YRAD,IXNP,IYNP,XC,YC
      LOGICAL OLDONS,OLDINV
      COMMON /OLDXY/ XOLD,YOLD,IXOP,IYOP,OLDONS,OLDINV
      COMMON /ECCEN/ ECCEN,EC2
      COMMON /RADE/RADE
      logical notlst
      common /proj/ itproj,wmrad,xoffs,yoffs,scalr,notlst
      common /conic/ splll,spll2,tranl,trank,tranr,tscale,pole,tilt
      LOGICAL NEWONS,NEWSEQ
      logical map
      common /mapdbc/ map

      if (map)
     + print*,'initia -- enter ',xcn,ycn,cla,clo,xra,yra,itpro,ires,
     + xrnm,orhal
c     limit xrnm to >= 1.0
      if (xrnm.lt.1.0) xrnm = 1.0

      EC2=ECCEN**2
      RMPV=1.0E-7
      MAXVAL=27000
      SAVEXY=.FALSE.
      OLDONS=.FALSE.
      NEWONS=.FALSE.
      NEWSEQ=.FALSE.
      ITPROJ=ITPRO
      CLAT=CLA
      CLON=CLO
      XRAD=XRA
      YRAD=YRA
      XC=XCN
      YC=YCN
      R1=XRAD
      R2=XRNM
      WMRAD=R1*ERNM/R2
      IRESSQ=IRES**2
      SCLAT=SIN(CLAT)
      CCLAT=COS(CLAT)
      RXRNM=XRNM*C
      R=XRAD*COS(RXRNM)/SIN(RXRNM)
      XOFFS=0
      YOFFS=0
c
c     Make an initial call to calculate and store projection constants.
      notlst = .false.
      call lltoxy(clat,clon,x,y)
c
c     Translate map center point to display center.
      XOFFS = -X
      YOFFS = -Y
c
      if (map)
     + print*,'initia -- exit ',wmrad,r,maxval,rmpv,itproj

      RETURN
      END

C+*+*+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                        INVTES
C
```

```
C FUNCTIONAL DESCRIPTION:          CHECKS POINT FOR INVISIBILITY
C
C      NOTE: . Usefullness of invtes reduced in caricature 3.0 or later. Where
C              invisibility, independant of projection, is checked by calling
C              lltoxy with the point in question, then looking at the invali
C              flag in common /invali/.  It will be set to .true. for any
C              point lying over the viewing horizon.   TFW.
C
C                       COMMON
C      VARIABLE         BLOCK          TYPE           DESCRIPTION
C
C GLOBAL VARIABLES:
C
C     CCLAT            CENTER         REAL           COSINE OF CLAT
C     CLAT             CENTER         REAL           LATITUDE
C     CLON             CENTER         REAL           LONGITUDE
C     ER               ER             REAL
C     IGNOMN           PROJT          INTEGER        GNEMONIC PROJECTION
C     INVALI           INVALI         LOGICAL        CHECKS FOR INVALID COORDS
C     IORTEQ           PROJT          INTEGER        ORTHO. EQUATORIAL PROJECTION
C     IORTPO           PROJT          INTEGER        ORTHO. POLAR PROJECTION
C     IORTHO           PROJT          INTEGER        OBLIQUE PROJECTION
C     IPERSP           PROJT          INTEGER        PERSPECTIVE PROJECTION
C     ITPROJ           PROJ           INTEGER        CURRENT PROJECTION
C     PIE              PIE            REAL           THE CONSTANT (22/7)
C     TPIE             PIE            REAL           PIE * 2
C
C INPUT FILES/PARAMETERS:
C
C     VARIABLE                        TYPE           DESCRIPTION
C
C     PLAT                            REAL            LATITUDE IN RADIANS
C     PLON                            REAL            LONGITUDE IN RADIANS
C
C OUTPUT FILES/PARAMETERS:          NONE
C     ISINV                         LOGICAL          FLAG OF INVISIBILITY
C
C SUBROUTINES/FUNCTIONS CALLED:  NONE.
C
C CALLED BY:                        CHECKA, CHECKM, DMAPII, FILLIT, GRDLAT,
C                                   GRDLON, HILPLT, LIMITS, LLINXY
C                                   PLOTOV, PLTCIT, PLTDAT, PLTNAM
C
C LOCAL VARIABLES: NONE
C
C ABNORMAL RETURN CONDITIONS:  N/A
C
C PROGRAMMER:                       DATE OF LAST CHANGE    REASON FOR CHANGE
C
C GJFENERTY                                                INTIAL ENTRY
C Tom Wescott   (NOSC)              10/87                  Change perspective
C
C-*-*-*-*-*-*-*-*-*-*-*-*-*-*-*-*-*-*-*-*-*-*-*-*-*-*-*-*-*-*-*-*-*-*-*-*-*|*-*-*-*-

      SUBROUTINE INVTES (PLAT,PLON,ISINV)
C    THIS SUBROUTINE TESTS A POINT FOR INVISIBILITY (ON OPPOSITE HEMISPHERE
C           OF EARTH FROM CENTER POINT OF PROJECTION)
C             . (USING THE LAW OF COSINES)

      LOGICAL ISINV
      COMMON /PROJT/ IGNOMN,IORTEQ,IORTPO,IORTHO,IPERSP
      COMMON /PROJT2/ IEQREC,IMERCA,ILAMCN
      COMMON /PIE/ PIE,TPIE,PIO2,PIO4
      COMMON /CONST/ MAXVAL,RMPV,C,R,ERNM
      COMMON /CENTER/ CLAT,CLON,CCLAT,SCLAT
      logical invali,notlst
      common /invali/ invali
      common /proj/ itproj,wmrad,xoffs,yoffs,scalr,notlst
      REAL*8 ERD
      COMMON /ER/ ER,ERD

      ISINV=.FALSE.

      IF (ITPROJ.EQ.IORTEQ) THEN
```

```
          DLON=PLON-CLON
          IF (ABS(DLON).GT.PIE) DLON=DLON-SIGN(TPIE,DLON)
          IF (ABS(DLON).GT.PIO2) ISINV=.TRUE.

      ELSE IF (ITPROJ.EQ.IORTPO) THEN

          IF ((CLAT.LT.0..AND.PLAT.GT.0.).OR.(CLAT.GE.0..AND.PLAT
     +        .LT.0.))ISINV=.TRUE.

      ELSE IF (ITPROJ.EQ.IGNOMN.OR.ITPROJ.EQ.IORTHO) THEN

          R1=SCLAT*SIN(PLAT)+CCLAT*COS(PLAT)*COS(PLON-CLON)
          GCD=ACOS(R1)
          IF (GCD.GT.PIE) GCD=TPIE-GCD
          IF (GCD.LT.-PIE) GCD=-TPIE-GCD
          IF (ABS(GCD).GT.PIO2) ISINV=.TRUE.

      ELSE IF (ITPROJ.EQ.IPERSP) THEN

C        Over the horizon points are returned from lltoxy invalid.
         call lltoxy(plat,plon,x,y)
         isinv = invali

      ENDIF

      RETURN
      END

C+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                   jpolg2
C
C FUNCTIONAL DESCRIPTION:      This subroutine is used to overcome limits
C                              on the # of verticies for filled polygons
C                              in some display systems.  It disects limit
C                              exceeding polygons into smaller contiguous
C                              sections as required before filling.
C
C INPUT FILES/PARAMETERS:      x(n), y(n) - Vertex coordinate arrays.
C                              n          - Number of verticies.
C                              jedge      - 0 plots edge, 1 omits edge.
C
C GLOBAL VARIABLES:            MXVOUT     - Max number of output verticies.
C                              IDIM       - Max array size.
C                              MXPLYS     - Max number of reduced polygons
C
C OUTPUT FILES/PARAMETERS:     Multiple polygons are drawn via jpolgn.
C
C SUBROUTINES CALLED:          jpedge, jpolgn, cliplg
C
C CALLED BY:                   blplgn
C
C LOCAL VARIABLES:             Linked list form of closed input polygon.
C                                iptr(n)    - Pointer array to vertex (n+1).
C                                marker     - End of data marker in x,y.
C                              Multiple output polygons in linked list form:
C                                outplg(k)  - Starting ptrs. for k polygons.
C                                nxt()      - Pointer array to vertex (n+1).
C
C RESTRICTIONS:                None.
C
C ABNORMAL RETURN CONDITIONS:  None.
C
C PROGRAMMER:                  DATE OF LAST CHANGE    REASON FOR CHANGE
C     Tom Wescott  (NOSC)      Aug 88                 Original entry.
C
C-*-*-*-*-*-*-*-*-*-*-*-*-*-*-*-*-*-*-*-*-*-*-*-*-*-*-*-*-*-*-*-*-*-*-*-*|*-*-*-*-
      subroutine jpolg2(x,y,nin,jedge)
c
      dimension x(*),y(*)
c
      include   'carmaxdim.inc'
c
      dimension xx(IDIM),yy(IDIM)
```

```
      integer iptr(IDIM), nxt(IDIM)
      integer  outplg(MXPLYS),outmp(MXPLYS)
c
      if (nin.le.MXVOUT) then
         call jpedge(jedge)
         call jpolgn(x,y,nin)
      else
c        Temporarily turn the edge off.
         call jpedge(1)
c
c        Close polygon if necessary.
         if ((x(nin).ne.x(1)).or.(y(nin).ne.y(1))) then
            n = nin + 1
            x(n) = x(1)
            y(n) = y(1)
         else
            n = nin
         endif
c
c        Init output list linking to next input vertex.
         do 100 i = 1, n-1
            nxt(i) = i+1
 100     continue
         nxt(n) = 1
         marker = n
c
c        Initialize array of output polygon start points.
         outplg(1) = 1
         iend = 1
         outplg(2) = 0
c
         iplg = 1
c        While (more polygons in output list) do
 201        if (outplg(iplg) .eq. 0) go to 290
c           Temp save the new polygon from the output array.  Get stats.
            istvrt = outplg(iplg)
            ymax = y(istvrt)
            ymin = y(istvrt)
            ivrt = istvrt
            kount = 0
c           Do Until (polygon traversed)
 220           continue
               kount = kount + 1
               if ((kount.gt.IDIM).or.(ivrt.lt.1).or.(ivrt.gt.IDIM))
     +            write(*,*)'JPOLG2... bad polygon linkage '
c
c              Convert linked list polygon into polyline format.
               xx(kount) = x(ivrt)
               yy(kount) = y(ivrt)
               ymax = amax1(ymax,y(ivrt))
               ymin = amin1(ymin,y(ivrt))
c
c              Save polygon linkage prior to alteration by clipping.
               ivrt = nxt(ivrt)
               iptr(ivrt) = nxt(ivrt)
               if (ivrt.ne.istvrt) go to 220
c           End do.
c
            if (kount.le.MXVOUT) then
c              Send current polygon to ordinary drawing process.
               call jpolgn(xx,yy,kount)
            else
c              Bisect current polygon and append sections to outplg list.
               ymid = (ymax+ymin)/2.0
               ax = 1.0
               ay = ymid
               bx = -1.0
               by = ymid
c
               call cliplg(ax,ay,bx,by,x,y,istvrt,iptr,
     +                     marker,outmp,nxt)
c
c              Catenate output polygons onto output list.
               ii = 1
```

```
c
291          While (output polygons remain) do
                if (outmp(ii).eq.0) go to 292
                iend = iend + 1
                outplg(iend) = outmp(ii)
                ii = ii + 1
                go to 291
c            End while.
292          continue
             outplg(iend+1) = 0
c
             call cliplg(bx,by,ax,ay,x,y,istvrt,iptr,
     +                   marker,outmp,nxt)
c
             ii = 1
c            While (output polygons remain) do
293             if (outmp(ii).eq.0) go to 294
                iend = iend + 1
                outplg(iend) = outmp(ii)
                ii = ii + 1
                go to 293
c            End while.
294          continue
             outplg(iend+1) = 0
          endif
c
          iplg = iplg + 1
          go to 201
c       End While.
290     continue
c
c       Draw the polygon outline?
        call jpedge(jedge)
        if (jedge.ne.1) call jpolgn(x,y,nin)
      endif
c
      return
      end

C+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                   LIMIT2
C
C FUNCTIONAL DESCRIPTION:      Finds the viewport's bounding rectangle
C                              in a rectilinear lon,lat grid.
C
C INPUT FILES/PARAMETERS:      none.
C
C GLOBAL VARIABLES :           clat,clon      - Map center
C                              xrad,yrad      - Viewport half widths
C
C OUTPUT FILES/PARAMETERS:     common/viewBR/ - Lon,lat Coordinates of the
C                              vpnort,vpsout    bounding rectangle for that
C                              vpeast,vpwest    portion of the world within
C                                               the viewport.  Limits are
C                                               spatial (not numeric) and can
C                                               straddle the int'l date line.
C
C SUBROUTINES CALLED :         xytoll, lltoxy, clipxy
C
C CALLED BY:                   DMAPII
C
C LOCAL VARIABLES:             NPOINTS        - Parameter specifying the # of
C                                               points on each viewport side
C                                               to search for lon,lat extrema.
C                              NLOOPS         - Parameter determining accuracy
C                                               of horizon location.
C RESTRICTIONS:                None.  Works with all well behaved projections
C
C ABNORMAL RETURN CONDITIONS:  None.
C
C PROGRAMMER:              DATE OF LAST CHANGE       REASON FOR CHANGE
C     Tom Wescott  (NOSC)      10/87                 original entry
C
C-*-*-*-*-*-*-*-*-*-*-*-*-*-*-*-*-*-*-*-*-*-*-*-*-*-*-*-*-*-*-*-*-*-*-*|*-*-*-*-
```

```
      subroutine limit2
c
      common /viewp/ xrad,yrad,ixnp,iynp,xc,yc
      common /viewBR/ vpnort,vpsout,vpeast,vpwest
      common /pie/ pie,tpie,pio2,pio4
      common /center/ clat,clon,cclat,sclat
      logical nponsc, sponsc
      logical invali
      common /invali/ invali
c
c     Set No. of points to be tested on each viewport side.
c     (use an odd integer >= 3 to handle graticle concavities.
      parameter(NPOINTS=3)
c
c     Set accuracy level of binary search for the horizon.
      parameter (NLOOPS=9)
c
      if ((abs(clat).gt.pio2).or.(abs(clon).gt.pie).or.(xrad.le.0.))
     +   write(*,*) ' Bad map parameters found in LIMIT2'
c
c     Store break line (longitude at edge of conic projections).
      breakl = clon  - sign(pie,clon)
c
      vpnort = -pio2
      vpsout = +pio2
      vpeast = -pie
      vpwest = tpie+tpie
c
c     Find bounding rectangle by checking (lon,lat) at regular
c     intervals along the viewport frame or along the map edge.
      yincr = (yrad+yrad)/(NPOINTS-1)
c
      do 300 y = -yrad, yrad, yincr
         if (abs(y) .eq. yrad) then
            xincr = (xrad+xrad)/(NPOINTS-1)
         else
            xincr = xrad+xrad
         endif
c
         do 200 x = -xrad, xrad, xincr
            call xytoll(x,y,rlat,rlon)
            if (invali) then
c              This point on the viewport frame lies off the earth.  Locate
c              map edge (lon,lat) by searching along line from map center.
c              Use last pt on map to calculate minimum bounding coords.
               call lltoxy(clat,clon,xearth,yearth)
               xspace = x
               yspace = y
               do 100 itest = 1, NLOOPS
                  xtest = (xspace+xearth)*0.5
                  ytest = (yspace+yearth)*0.5
                  call xytoll(xtest,ytest,rrlat,rrlon)
                  if (invali) then
                     xspace = xtest
                     yspace = ytest
                  else
                     xearth = xtest
                     yearth = ytest
                     rlat = rrlat
                     rlon = rrlon
                  endif
100            continue
c
            endif
c
c           Update bounds in conditionally biased lon. where west < east.
            if (rlon .lt. breakl) rlon = rlon + tpie
            vpnort = amax1(vpnort,rlat)
            vpsout = amin1(vpsout,rlat)
            vpeast = amax1(vpeast,rlon)
            vpwest = amin1(vpwest,rlon)
200      continue
300   continue
```

```
c       Convert to unbiased longitude.
        if (abs(vpeast).gt.pie) vpeast = vpeast - sign(tpie,vpeast)
        if (abs(vpwest).gt.pie) vpwest = vpwest - sign(tpie,vpwest)
c
c       Check for presence of poles inside the viewport.
        call lltoxy(pio2,0.0,x,y)
        call clipxy(x,y,nponsc)
        if (invali) nponsc = .false.
        call lltoxy(-pio2,0.0,x,y)
        call clipxy(x,y,sponsc)
        if (invali) sponsc = .false.
c
        if ((nponsc).or.(sponsc)) then
c          Open limits to include area around poles.
           vpwest = breakl
           vpeast = breakl - .00001
           if (nponsc) then
              vpnort = +pio2
           endif
           if (sponsc) then
              vpsout = -pio2
           endif
        endif
c
        R2D = 180./PIE
c        WRITE (*,9010) vpnort*R2D,vpsout*R2D,vpeast*R2D,vpwest*R2D
c 9010   FORMAT(' LIMIT2... Bounding (N,S,E,W) = ',4(1X,F7.1),/)
c
        return
        end


C+*+*+*+*+*+*+*+*+*+*+*+*+*+*+*+*+*+*+*+*+*+*+*+*+*+*+*+*+*+*+*+*+*+*|*+*+*+*+
C UNIT NAME:                    LL2DA
C
C FUNCTIONAL DESCRIPTION:       Converts geographic location (lat,lon)
C                               into distance azimuth from any point.
C
C INPUT FILES/PARAMETERS:       slat,slon  - Start point coords.
C                               tlat,tlon  - Target point coords.
C
C OUTPUT FILES/PARAMETERS:      dist       - Arc distance in radians.
C                               az         - Azimuth in radians, -pi to pi.
C                               range      - Approx. distance, nautical miles.
C                               bering     - Azimuth in degrees, 0 to 360.
C
C LOCAL VARIABLES:              S,T,D      - Sides of polar triangle.
C
C ABNORMAL RETURN CONDITIONS:   1) Az from poles defined cw from prime meridian.
C                               2) When dist=0,pi  returned az is meaningless.
C
C PROGRAMMER:                   DATE OF LAST CHANGE     REASON FOR CHANGE
C     Tom Wescott (NOSC)        Dec 87                  Original entry.
C         "                     Feb 89                  Improved accuracy.
C
C-*-*-*-*-*-*-*-*-*-*-*-*-*-*-*-*-*-*-*-*-*-*-*-*-*-*-*-*-*-*-*-*-*-*|*-*-*-*-
      subroutine LL2DA(slat,slon,tlat,tlon,dist,az,range,bering)
C
      common /pie/ pie,tpie,pio2,pio4
      parameter (CCLOSE = .9999)
C
      Dlo = tlon - slon
      if (abs(Dlo).gt.pie) Dlo = Dlo - sign(tpie,Dlo)
      sinT = cos(slat)
      cosT = sin(slat)
      sinS = cos(tlat)
      cosS = sin(tlat)
C
C     Law of Cosines for arc distance between points.
      cosD = cosT*cosS + sinT*sinS*cos(Dlo)
      if (cosD.lt.CCLOSE) then
         dist = acos(amax1(cosD,-1.0))
      else
C        Plane geometry approximation better for very close targets.
         dist = sqrt((tlat-slat)**2. + (Dlo*sinS)**2.)
```

```
      endif
C
C     Using both Law of Cosines and Sines insures accurate azimuths.
      az = - tlon*cosT
      sinD = sin(dist)
      denom = sinD*sinT
      if ((denom.ne.0.0).and.(abs(cosT).ne.1.0)) then
         cosAz = (cosS-cosD*cosT)/denom
         sinAz = sinS*sin(Dlo)/sinD
         if ((sinAZ.ne.0.).or.(cosAZ.ne.0.))  az = atan2(sinAz,cosAz)
      endif
C
C     Also output range and bearing.
      r2d = 180.0/pie
      range = dist*R2D*60.0
      bering = az*R2D
      if (bering.lt.0.0) bering = 360.0 + bering
C
      return
      end

C+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                      LL2GC
C
C FUNCTIONAL DESCRIPTION:         Conditions a Lon,lat polyline by inserting
C                                 equidistant points so that the segments
C                                 smoothly follow great circles in the current
C                                 map projection.
C
C INPUT FILES/PARAMETERS:         plat,plon - Input polyline
C                                 nin       - # of input points.
C                                 maxpts    - output array size limit.
C
C GLOBAL VARIABLES:               None.
C
C OUTPUT FILES/PARAMETERS:        gclon,gclat - output polyline.
C                                 nout        - # of output points.
C
C SUBROUTINES CALLED:             ll2da, da2ll, llplxy
C
C CALLED BY:                      plotit, plotov, ftprnt, ranger
C
C LOCAL VARIABLES:                DSTMAX,MIN - Limits for output segment length.
C                                 distxy     - Display distance between input pts.
C
C RESTRICTIONS:                   None.
C
C PROGRAMMER:                     DATE OF LAST CHANGE     REASON FOR CHANGE
C     Tom Wescott (NOSC)          Dec 87                  Original entry.
C      "     "                    Apr 89                  Improve pt spacing.
C
C-*-*-*-*-*-*-*-*-*-*-*-*-*-*-*-*-*-*-*-*-*-*-*-*-*-*-*-*-*-*-*-*-*-*-*|*-*-*-*-
      subroutine LL2GC(plon,plat,nin,maxpts,gclon,gclat,nout)
C
C     Set screen units per inch of display.
      parameter (SUNITS=400., SINCHS=15.0, UPERI=SUNITS/SINCHS)
C     Set max segment length to about .25" on the display, min to .01".
      parameter (DSTMAX=0.25*UPERI, DSTMIN=0.01*UPERI)
      parameter(EPSLON=.001)
      parameter(ARCMAX=.05)
      real plon(*),plat(*),gclon(*),gclat(*),lon1,lat1,lon2,lat2
      logical invali, offsc1, offsc2
      common /invali/ invali
C
      nout = 1
      nover = 0
      lon1 = plon(1)
      lat1 = plat(1)
      call llplxy(lon1,lat1,1,x1,y1,nout)
      gclon(1) = lon1
      gclat(1) = lat1
      if (nin.lt.2) RETURN
C
```

```
      do 200 n = 2, nin
         lon2 = plon(n)
         lat2 = plat(n)
         offsc2 = .false.
         call llplxy(lon2,lat2,1,x2,y2,idummy)
         if (invali) offsc2 = .true.
C
C        Test for point 2 being off screen.
         if (amax1(abs(x2),abs(y2)).gt.SUNITS) offsc2 = .true.
C
C        Init intermediate point to  pt 1.
         tlat = lat1
         tlon = lon1
         dstold = SUNITS
C
C        While (distance to pt2 too big) do
 101        continue
            offsc1 = .false.
            call llplxy(tlon,tlat,1,tx,ty,idummy)
            if (invali) offsc1 = .true.
            if (amax1(abs(tx),abs(ty)).gt.SUNITS) offsc1 = .true.
C
            distxy = sqrt((x2-tx)**2 + (y2-ty)**2)
            if (distxy .le. DSTMAX) go to 190
C
            call ll2da(tlat,tlon,lat2,lon2,arc,az,range,bering)
            if (offsc1.and.offsc2) then
C              Off the map.  Don't waste time adding too many points.
C              Calculate nadd from a maximum arc distance parameter.
               nadd = int(arc/ARCMAX)
               if (nadd .eq. 0) go to 190
            else
C              Estimate nadd based on xy distance to next point,
               nadd = max0(1, int(distxy/DSTMAX))
CDEBUG
CD              CALL JCMARK(3)     ! asterisk
C
               if (distxy.gt.dstold) then
C                 We are approaching a discontinuity or distorted area where
C                 distxy increases as points are added.  A better estimate for
C                 nadd can be made from differential arc dist between pts.

                  call da2ll(tlat,tlon,EPSLON*arc,az,elat,elon)
                  call llplxy(elon,elat,1,ex,ey,idummy)
                  dxy = sqrt((tx-ex)**2 + (ty-ey)**2)
                  nadd = max0(1, int(dxy/(DSTMAX*EPSLON)))
CDEBUG
CD                 CALL JCMARK(4)
               endif
            endif
C
C           Calculate next add point on great circle between t and pt 2.
            dincr = arc/(nadd+1)
            call da2ll(tlat,tlon,dincr,az,tlat,tlon)
CDEBUG
CD           CALL LLPLXY(TLON,TLAT,1,XX,YY,IDUMMY)
CD           CALL JMARK(XX,YY)
C
            if (nout .le. maxpts-2) then
               nout = nout + 1
               gclat(nout) = tlat
               gclon(nout) = tlon
            else
               nover = nover + 1
               kount = maxpts + nover
               write(*,*)'LL2GC... Output array overflow ',kount
               write(*,*)' xx,yy,arc,nadd = ',xx,yy,arc,nadd
            endif
C
            dstold = distxy
            go to 101
C        End while.
 190     continue
C
```

```
         if ((distxy.ge.DSTMIN).or.(n.eq.nin)) then
C           Output segment end point and update next segment start point.
            nout = nout + 1
            gclat(nout) = lat2
            gclon(nout) = lon2
            lon1 = lon2
            lat1 = lat2
            x1 = x2
            y1 = y2
         else
C           Skip output and update for extremely short segments
         endif
 200  continue
C
      return
      end


C+*+*+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                     LLPLXY
C
C FUNCTIONAL DESCRIPTION:      Converts geographic polyline to display coords.
C                                                                                +
C         PROJECTION           ITPROJ  PROPERTY     COVERAGE     APPL.    |
C                                           c e e a s    w h o s l    p t n a   |
C                                           o q q z p    o e c e o    r o a r   |
C                                           n u u i e    r m e a c    e p v e   |
C                                           f i i m c    l i a / a    s o / a   |
C                                           o a d u i    d s n r l    e g t     |
C                                           r r i t a      p / e      n r r m   |
C                                           m e s h l      h c g      t a a e   |
C                                           a a t a        e o i      a p c a   |
C                                           l     l        r n o      t h k s   |
C                                                          e t n      n c   u   |
C    (1)  Albers Equal-area           9       .                .      .     .   |
C    (2)  Azimuthal Equal-area       10       .   .      . . .        .     .   |
C    (3)  Azimuthal Equidistant      11         . .      . . .        .         |
C    (4)  Equirectangular             6         .        . . . .      .         |
C    (5)  Gnomonic                    1           .          .            .     |
C    (6)  Kavraisky IV               12             .    . . .        .         |
C    (7)  Lambert Conformal           8     .              . . .      .   .     |
C    (8)  Mercator                    7     .            . . . .      .   .     |
C    (9)  Miller                     13             .    .            .         |
C   (10)  Oblique Mercator           14     .       .    . . .        . . .     |
C   (11)  Orthographic                4           .        . . .      .         |
C   (12)  Perspective                 5           .        . . .      .         |
C   (13)  Polar Stereographic        15     .     .        . . .      .   .     |
C   (14)  Polyconic                  16             .          .        .       |
C   (15)  Sinusoidal                 18       .          . . .        .     ..  |
C   (16)  Stereographic              19     .     .        . . .      .   .     |
C   (17)  Ortho. Equatorial           2           .        .          .         |
C   (18)  Ortho. Polar                3           .        .          .         |
C   (19)  Univ. Transverse Mercator  17     .            . . . .      .   .     |
C
C                                                                                +
C INPUT FILES/PARAMETERS:       plon(), plat() - input polyline arrays
C                               nin            - number of input points
C
C GLOBAL VARIABLES:             itproj         - projection identification no.
C
C OUTPUT FILES/PARAMETERS:      x(),y()        - output polyline arrays
C                               nout           - number of output points
C                               invali         - flag for last input point
C
C SUBROUTINES CALLED:           px????   All (lon,lat) to (x,y) transformations.
C
C CALLED BY:                    BLPLGN, BLPLIN, D2OUTL, FLSPLY, LLTOXY, rngrin
C
C LOCAL VARIABLES:              None.
C
C RESTRICTIONS:                 None.
C
C ABNORMAL RETURN CONDITIONS:   PX??? error convention:  If a point cannot be
C                               sensibly mapped or lies over the horizon:
C                               1.  Point is omitted from output polyline.
C                               2.  Invalid flag set if point is a singlton.
```

```
C
C PROGRAMMER:                    DATE OF LAST CHANGE      REASON FOR CHANGE
C     Dave Nation                                         Original lltoxy
C     Tom Wescott   (NOSC)       Mar 88                   Polyline version.
C
C-*-*-*-*-*-*-*-*-*-*-*-*-*-*-*-*-*-*-*-*-*-*-*-*-*-*-*-*-*-*-*-*-*-*-*-*-*|*-*-*-*-

      subroutine LLPLXY(plon,plat,nin,x,y,nout)
c
      logical invali,notlst
      common /invali/ invali
      common /proj/ itproj,wmrad,xoffs,yoffs,scalr,notlst
      real plon(*), plat(*), x(*), y(*)
c
c
*------------------------------------------------------------------------|--+
* Itproj:  1  2  3  4  5  6  7  8  9 10 11 12 13 14 15 16 17 18 19 20 21  |
*-------------------------------------------------------------------------+
*          g  o  o  o  p  e  m  l  a  a  a  k  m  o  p  p  u  s  s        |
*          n  r  r  r  e  q  e  a  l  z  z  a  i  b  o  o  t  i  t        |
*          o  e  p  t  r  r  r  m  b  e  e  v  l  l  s  l  m  n  e        |
*          m  q  o  h  s  e  c  c  r  a  d  r  l  m  t  y  z  u  r        |
*-------------------------------------------------------------------------+
      goto(1,02,03,04,05,06,07,08,09,10,11,12,13,14,15,16,17,18,19
     +    )itproj
c
c             Proj. #0  Bad input trap.
              write(*,*)' LLPLXY... Bad projection ID#.'
              go to 900
c
c             Proj. #1  Gnomonic
  1           call pxgnom(plon,plat,nin,x,y,nout)
              go to 900
c
c             Proj. #2  Orthographic Equatorial
  2           call pxoreq(plon,plat,nin,x,y,nout)
              go to 900
c
c             Proj. #3  Orthographic Polar
  3           call pxorpo(plon,plat,nin,x,y,nout)
              go to 900
c
c             Proj. #4  Orthographic
  4           call pxorth(plon,plat,nin,x,y,nout)
              go to 900
c
c             Proj. #5  Perspective
  5           call pxpers(plon,plat,nin,x,y,nout)
              go to 900
c
c             Proj. #6  Equirectangular
  6           call pxeqre(plon,plat,nin,x,y,nout)
              go to 900
c
c             Proj. #7  Mercator
  7           call pxmerc(plon,plat,nin,x,y,nout)
              go to 900
c
c             Proj. #8  Lambert Conformal
  8           call pxlamc(plon,plat,nin,x,y,nout)
              go to 900
c
c             Proj. #9  Albers Equal-area Conic.
  9           call pxalbr(plon,plat,nin,x,y,nout)
              go to 900
c
c             Proj. #10  Azimuthal Equal-area
 10           call pxazea(plon,plat,nin,x,y,nout)
              go to 900
c
c             Proj. #11  Azimuthal Equidistant
 11           call pxazed(plon,plat,nin,x,y,nout)
              go to 900
c
```

```
c           Proj. #12  Kavraisky IV
 12         call pxkavr(plon,plat,nin,x,y,nout)
            go to 900
c
c           Proj. #13  Miller
 13         call pxmill(plon,plat,nin,x,y,nout)
            go to 900
c
c           Proj. #14 Oblique Mercator
 14         call pxoblm(plon,plat,nin,x,y,nout)
            go to 900
c
c           Proj. #15  Polar Stereographic
 15         call pxpost(plon,plat,nin,x,y,nout)
            go to 900
c
c           Proj. #16  Polyconic
 16         call pxpoly(plon,plat,nin,x,y,nout)
            go to 900
c
c           Proj. #17  Universal Transverse Mercator
 17         call pxutmz(plon,plat,nin,x,y,nout)
            go to 900
c
c           Proj. #18  Sinusoidal
 18         call pxsinu(plon,plat,nin,x,y,nout)
            go to 900
c
c           Proj. #19  Stereographic
 19         call pxster(plon,plat,nin,x,y,nout)
            go to 900
c
c     End cases.
 900  continue
c
      return
      end
C+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                   LLTOXY
C
C FUNCTIONAL DESCRIPTION:      Converts a (lon,lat) point to display (x,y).
C                              This subroutine has been functionally
C                              replaced by LLPLXY.  Its call remains for
C                              compatibility.
C
C INPUT FILES/PARAMETERS:      plon, plat     - input point
C
C GLOBAL VARIABLES:            None.
C
C OUTPUT FILES/PARAMETERS:     x,y            -  output point
C                              invali         -  flag for bad input point
C
C SUBROUTINES CALLED:          llplxy         -  Polyline conversion.
C
C CALLED BY:                    BSTMAP, CHECKA, CHECKB, CHECKM, CURBOX
C                               DMAPII, DROUTL, FDRAWV, FILLPT
C                               GRDLAT, GRDLON, HILPLT, INITIA, LIMITS
C                               LLINXY, PLOTOV, PLTCIT, PLTNAM
C
C LOCAL VARIABLES:             None.
C
C RESTRICTIONS:                None.
C
C ABNORMAL RETURN CONDITIONS:  Invalid flag set for input points which
C                              are over the horizon or can't be computed.
C
C LOCATION:
C
C PROGRAMMER:                DATE OF LAST CHANGE     REASON FOR CHANGE
C     DAVE NATION                                    ORIGINAL CODE.
C     JERRY FENERTY                                  DOCUMENTATION AND MO
C                                                    FOR A21 PROTOTYPE.
C     Tom Wescott  (NOSC)    Jan 87                  optimization, add invali
C
```

```
c
c         Now interchange, except if the pivot element is already on
c         the diagonal, don't need to.
          if (ipvt .ne. i) then
             do 20 jcol = 1, np
                save = ab(i, jcol)
                ab(i,jcol) = ab(ipvt,jcol)
                ab(ipvt,jcol) = save
 20          continue
          endif
c
c         Now reduce all elements below the diagonal in the ith row.
c         Check first to see if a zero is already present.  If so, we
c         can skip the reduction on that row.
          do 32 jrow = ip1, n
             if (ab(jrow,i) .eq. 0) go to 32
             ratio = ab(jrow,i) / ab(i,i)
             ab(jrow,i) = ratio
             do 30 kcol = ip1, np
                ab(jrow,kcol) = ab(jrow,kcol) - ratio*ab(i,kcol)
 30          continue
 32       continue
 35    continue
c
c      We still need to check ab(n,n) for size.
       if (abs(ab(n,n)) .lt. 1.0E-6) then
CC         write(*,100)
          return
       endif
c
c      Back substitute.
       np1 = n + 1
       do 50 kcol = np1, np
          ab(n,kcol) = ab(n,kcol) / ab(n,n)
          do 45 j = 2, n
             nvbl = np1 - j
             l = nvbl + 1
             value = ab(nvbl,kcol)
             do 40 k = l, n
                value = value - ab(nvbl,k) * ab(k,kcol)
 40          continue
             ab(nvbl,kcol) = value / ab(nvbl,nvbl)
 45       continue
 50    continue
c
       return
       end

C+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    NRFCN
C
C FUNCTIONAL DESCRIPTION:       Evaluates system equations for NRSYST.
C
C INPUT FILES/PARAMETERS:       x(n)   - Contains current guess for vector
C                                        (x1,x2...xN).  Should be preloaded with
C                                        an initial guess, and will ultimately
C                                        contain a nearby solution.
C
C GLOBAL VARIABLES:             None.
C
C OUTPUT FILES/PARAMETERS:      f(n)   - Functions evaluated at position x(n).
C
C SUBROUTINES CALLED:           None
C
C LOCAL VARIABLES:              None
C
C RESTRICTIONS:                 None.
C
C ABNORMAL RETURN CONDITIONS:   None.
C
C PROGRAMMER:                   DATE OF LAST CHANGE    REASON FOR CHANGE
C     Tom Wescott (NOSC)        Dec 87                 Original entry.
C
C-*-*-*-*-*-*-*-*-*-*-*-*-*-*-*-*-*-*-*-*-*-*-*-*-*-*-*-*-*-*-*-*-*-*-*-*|*-*-*-*-
```

```
C-*-*-*-*-*-*-*-*-*-*-*-*-*-*-*-*-*-*-*-*-*-*-*-*-*-*-*-*-*-*-*-*-*-*-*-*-*-*-*|*-*-*-*-

      subroutine lltoxy(plat,plon,x,y)
c
      nin = 1
      call llplxy(plon,plat,nin,x,y,nout)
c
      return
      end


C+++++++++++++++++++++++++++++++++++++++++++++++++++++++++++++++++++++++++|+++++++
C UNIT NAME:                          NRELIM
C
C FUNCTIONAL DESCRIPTION:
C             This subroutine solves a set of linear equations and gives an LU
C             decomposition of the coefficient matrix.  The Gauss elimination
C             method is used, with partial pivoting.  Multiple right hand sides
C             are permitted, they should be supplied as columns that augment
C             the coefficient matrix.
C
C REFERENCE:                          APPLIED NUMERICAL ANALYSIS  Gerald & Wheatly 1985
C
C INPUT FILES/PARAMETERS:
C
C                                     ab     - Coefficient matrix augmented with
C                                              R.H.S. vectors.
C                                     n      - Number of equations.
C                                     np     - No. of columns in the augmented matrix.
C                                     ndim   - First dimension of matrix ab.
C
C GLOBAL VARIABLES:                   None.
C
C OUTPUT FILES/PARAMETERS:            The solution vector(s) are returned in the
C                                     augmentation columns of ab.
C
C SUBROUTINES CALLED:                 None.
C
C LOCAL VARIABLES:
C
C RESTRICTIONS:                       None.
C
C ABNORMAL RETURN CONDITIONS:         None.
C
C PROGRAMMER:
C     Tom Wescott  (NOSC)             DATE OF LAST CHANGE      REASON FOR CHANGE
C                                     Dec 87                   Original entry.
C-*-*-*-*-*-*-*-*-*-*-*-*-*-*-*-*-*-*-*-*-*-*-*-*-*-*-*-*-*-*-*-*-*-*-*-*-*-*-*|*-*-*-*-

      subroutine nrelim(ab,n,np,ndim)
c
      real ab(ndim,np)
      integer n,np,ndim
      real save,ratio,value
      integer nml,ipvt,ipl,j,nvbl,l,kcol,jcol,jrow
c
cccc
c     Begin the reduction.
      nml = n - 1
      do 35 i = 1,.nml
c
c        Find the row number of the pivot row.  We will then
c        interchange rows to put the pivot element on the diagonal.
         ipvt = i
         ipl = i + 1
         do 10 j = ipl, n
            if (abs(ab(ipvt,i)) .lt. abs(ab(j,i))) ipvt = j
10       continue
c
c        Check for a near singular matrix.
         if (abs(ab(ipvt,i)) .lt. 1.0 E-6) then
cc          write(*,100)
100         format(' NRELIM... Gauss elimination solution not feasable')
            return
         endif
```

```
      subroutine nrfcn(x,f)
c
      real x(2), f(2)
      common /pie/ pie,tpie,pio2,pio4
      common /xymap/ projx,projy,xytol,ftol,delta
c
c     Convert longitude to normal domain.
      if(abs(x(1)) .gt. pie) x(1) = x(1) - sign(tpie,x(1))
c
c     Calculate iterated map position from current (lon,lat) guess.
      rlon = x(1)
      rlat = x(2)
      call lltoxy(rlat,rlon,calcx,calcy)
c
c     Set function values to distance between map position and input point.
      f(1) = calcx - projx
      f(2) = calcy - projy
c
c     Set sign of delta to insure next perturbation stays in Lat domain.
      delta = -sign(delta,x(2))
c
      return
      end


C+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    NRSYST
C
C FUNCTIONAL DESCRIPTION:
C         This subroutine solves a system of n nonlinear equations by the
C         Newton Raphson-Method.  The partial derivatives of the functions
C         are estimated by difference quotients when a variable is
C         purturbed by an amount equal to delta.  (Delta is added).
C         This is done for each variable in the function.  Increments
C         to improve the estimates for the X-values are computed from
C         a system of equations using subroutine NRELIM.
C
C REFERENCE:  APPLIED NUMERICAL ANALYSIS  Gerald & Wheatly 1885
C         The reference algorithm has been modified to increase the prob-
C         ability of global convergence limiting the size of any correction,
C         and by making half sized corrections on every third iteration.
C
C INPUT FILES/PARAMETERS:
C         nrfcn - Subroutine that computes values of the functions.
C                 Must be declared external to the calling program.
C         n     - The number of equations.
C         maxit - Limit to the number of iterations that will be used.
C         x     - Array to hold the x-values. Initially this array holds
C                 the initial guesses.  It returns the final values.
C         f     - An array that holds values of the functions.
C         delta - A small value used to perturb the x values so partial
C                 derivatives can be computed by difference quotient.
C         xtol  - Tolerance value for change in x values to stop iter-
C                 ations.  When the largest change in any x meets xtol
C                 the subroutine terminates.
C         ftol  - Tolerance on the value of f to terminate.  When the
C                 largest f value is less than ftol, termination.
C         i     - Status variable.
C                 Calling with  i = 0  displays progress of the iteration.
C
C GLOBAL VARIABLES:              none.
C
C OUTPUT FILES/PARAMETERS:
C                      x(n)  - Final values of the iteration process.
C                      i     - Status variable indicates termination method.
C                              i = 1   - xtol was met
C                              i = 2   - ftol was met
C                              i = -1  - Maxit was exceeded, tolerances not met
C                              i = -2  - Very small pivot encountered in Gaussian
C                                        elimination step.  No results obtained.
C                              i = -3  - Bad n input.  Must be between 2 and 10.
C
C SUBROUTINES CALLED:            nrfcn, nrelim
C
```

```
C LOCAL VARIABLES:
C
C RESTRICTIONS:          .        none.
C
C ABNORMAL RETURN CONDITIONS:     none.
C
C PROGRAMMER:                     DATE OF LAST CHANGE     REASON FOR CHANGE
C     Tom Wescott (NOSC)          Dec 87                  Original entry.
C
C-*-*-*-*-*-*-*-*-*-*-*-*-*-*-*-*-*-*-*-*-*-*-*-*-*-*-*-*-*-*-*-*-*-*-*-*-*-*|*-*-*-*-

      subroutine nrsyst(fcn,n,maxit,x,f,delta,xtol,ftol,i)
c
      real x(n), f(n), delta, xtol, ftol
      integer n, maxit, i
      real a(10,11), xsave(10), fsave(10)
      integer np, it, ivbl, itest, ifcn, irow, jcol
      real xmin(10), xmax(10), chgmax(10)
      common /domain/ xmin, xmax, chgmax
c
c     Check validity of value of n.
      if (n .lt. 2 .or. n .gt. 10) then
         i = -3
         write(*,1004) n
         return
      endif
c
c     Begin iterations - Get f values, then, save x values.
      np = n + 1
      do 100 it = 1, maxit
         call nrfcn(x,f)
         do 10 ivbl = 1, n
            xsave(ivbl) = x(ivbl)
 10      continue
c
c        Test f Values and save them.
         itest = 0
         do 20 ifcn = 1, n
            if (abs(f(ifcn)) .gt. ftol) itest = itest + 1
            fsave(ifcn) = f(ifcn)
 20      continue
         if (i .eq. 0) then
            write(*,1000) it, (x(ii)*180./3.14159,ii=1,n)
            write(*,1001) f
         endif
c
c        See if Ftol is met. If not continue, If so set i and return.
         if (itest .eq. 0) then
            if (i.eq.0) write(*,1005) it, F
            i = 2
            return
         endif
c
c        This double loop computes the partial derivatives of each
c        function for each variable and stores them in a coef array.
         do 50 jcol = 1, n
            x(jcol) = xsave(jcol) + delta
            call nrfcn(x,f)
            do 40 irow = 1, n
               a(irow,jcol) = (f(irow)-fsave(irow))/delta
 40         continue
c
c           Reset x values for the next column of partials.
            x(jcol) = xsave(jcol)
 50      continue
c
c        Now we put negative values as right hand sides and call nrelim.
         do 60 irow = 1, n
            a(irow,np) = -fsave(irow)
 60      continue
         call nrelim(a,n,np,10)
c
c        Be sure that the coefficient matrix is not to ill-conditioned.
         do 70 irow = 1, n
```

```
            if (abs(a(irow,irow)) .le. 1.0E-6) then
               if (i.eq.0) write(*,1003)
               i = -2
               return
            endif
 70      continue
c
c        Apply the corrections to the x values, and see if xtol is met.
         itest = 0
         do 80 ivbl = 1, n
c           Calculate maximum allowable correction.
            chg = a(ivbl,np)
            cmax = chgmax(ivbl)
            if (abs(chg) .gt. cmax)  chg = sign(cmax,chg)
c
c           Destablize possible oscillation with occasional half correction.
            if (mod(it,3) .eq. 0) chg = 0.5*chg

c           Apply correction and constrain x values to domain.
            x(ivbl) = xsave(ivbl) + chg
            x(ivbl) = amin1(x(ivbl),xmax(ivbl))
            x(ivbl) = amax1(x(ivbl),xmin(ivbl))
            if (abs(a(ivbl,np)) .gt. xtol) itest = itest + 1
 80      continue
c
c        If xtol is met, print the last values and return, else do
c        another iteration.
         if (itest .eq. 0) then
            if (i .eq. 0) write(*,1002)it,(x(ii)*180./3.14159,ii=1,n)
            i = 1
            return
         endif
 100  continue
c
c     We have done maxit iterations, set i = -1 and return.
      i = -1
      return
c
cccc
 1000 format(' nrsyst... After iteration ',i3,':'
     +       ,/,'  X(n) = ',10F13.5)
 1001 format  ('  F(n) = ',10F13.5)
 1002 format(/' nrsyst... After iteration ',I3,'    X values (meeting '
     +       ,'xtol) are: ',/,'  X(n) = ',10F13.5)
 1003 format(' nrsyst... Cannot solve system, matrix nearly singular.')
 1004 format(/' nrsyst... Number of equations passed in is invalid')
 1005 format(/' nrsyst... After iteration ',I3,'    F values (meeting '
     +       ,'ftol) are: ',/,'  F(n) = ',10F13.5)
c
      end


C+*+*+*+*+*+*+*+*+*+*+*+*+*+*+*+*+*+*+*+*+*+*+*+*+*+*+*+*+*+*+*+*+*|*+*+*+*+
C UNIT NAME:                PINSPG
C
C FUNCTIONAL DESCRIPTION:   Test for point being inside the smaller of the
C                           two regions defined by a spherical polygon.
C
C INPUT FILES/PARAMETERS:   rlo, rla   - Vertex coordinate arrays.
C                           n          - Number of verticies.
C                           plo,pla    - Point to be tested.
C
C GLOBAL VARIABLES:                    - Multiples of pi.
C
C OUTPUT FILES/PARAMETERS:  pinspg     - Returned true if point is inside.
C                                        Internally reflex areas are true.
C                           area       - Area of smaller region, signed radians.
C
C SUBROUTINES CALLED:       ll2da.
C
C CALLED BY:                blhatc
C
C RESTRICTIONS:             None.
C
```

```
C PROGRAMMER:                  DATE OF LAST CHANGE     REASON FOR CHANGE
C     Tom Wescott (NOSC)       Nov 88                  Original entry.
C
C-*-*-*-*-*-*-*-*-*-*-*-*-*-*-*-*-*-*-*-*-*-*-*-*-*-*-*-*-*-*-*-*-*-*-*-*-*|*-*-*-*-
      logical function pinspg(rlo,rla,nin,plo,pla,area)
c
      common /pie/ pie,tpie,pio2,pio4
      dimension rlo(*),rla(*)
c
c     Insure that we are dealing with a closed polygon.
      if ((rlo(nin).ne.rlo(1)).or.(rla(nin).ne.rla(1))) then
         n = nin + 1
         rlo(n) = rlo(1)
         rla(n) = rla(1)
      else
         n = nin
      endif
c
c     Get azimuth and its reciprocal from test point to first vertex.
      call ll2da(pla,plo,rla(1),rlo(1),d,azt2l,rng,bering)
      if (d .gt. 0.0001) then
         call ll2da(rla(1),rlo(1),pla,plo,d,azl2t,rng,bering)
      else
         azl2t = azt2l - sign(pie,azt2l)
      endif
c
      totang = 0.0
      totare = 0.0
      do 200 i = 2, n
c
c        Get azimuth and its reciprocal from test point to current vertex.
         call ll2da(pla,plo,rla(i),rlo(i),dist,azt2v,range,bering)
         if (d .gt. 0.0001) then
            call ll2da(rla(i),rlo(i),pla,plo,d,azv2t,rng,bering)
         else
            azv2t = azt2v - sign(pie,azt2t)
         endif
c        Sum angles about the test point.
         anglet = azt2v - azt2l
         if (abs(anglet).gt.pie) anglet = anglet - sign(tpie,anglet)
         totang = totang + anglet
c
c        Get azimuth and its reciprocal from current vertex to last vertex.
         call ll2da(rla(i),rlo(i),rla(i-1),rlo(i-1),d,azv2l,rng,bering)
         if (d .gt. 0.0001) then
            call ll2da(rla(i-1),rlo(i-1),rla(i),rlo(i),d,azl2v,rng,ber)
         else
            azl2v = azv2l - sign(pie,azvtl)
         endif

c        Calculate area of triangle tvl from its spherical excess.
         anglev = azv2l-azv2t
         if (abs(anglev).gt.pie) anglev = anglev - sign(tpie,anglev)
         anglel = azl2v-azl2t
         if (abs(anglel).gt.pie) anglel = anglel - sign(tpie,anglel)

         area = abs(anglet) + abs(anglev) + abs(anglel) - pie
         totare = totare + sign(area,anglet)
c
         azt2l = azt2v
         azl2t = azv2t
 200  continue
c
      area = totare
      pinspg = .true.
      if (abs(totang) .le. pie) pinspg = .false.
      if (abs(totare) .gt. tpie) then
         pinspg = .not.(pinspg)
         area = sign(tpie,area) - area
      endif
c
      return
      end
```

```
C+*+*+*+*+*+*+*+*+*+*+*+*+*+*+*+*+*+*+*+*+*+*+*+*+*+*+*+*+*+*+*+*+*+*|*+*+*+*+
C UNIT NAME:                   PXALBR
C
C FUNCTIONAL DESCRIPTION:      ALBERS EQUAL AREA CONIC PROJECTION INTO X/Y
C                                      Elliptical earth model.
C
C INPUT FILES/PARAMETERS:      plon(), plat() - input polyline arrays
C                              nin            - number of input points
C
C GLOBAL VARIABLES:            clat,clon      - map center lat,lon
C                              pie,pio2       - multiples of pi
C                              eccen          - earth eccentricity
C                              wmrad          - earth radius, world units
C                              xoffs, yoffs   - display offset, world units
C
C OUTPUT FILES/PARAMETERS:     x(),y()        - output polyline arrays
C                              nout           - number of valid output points
C                              invali         - flag for last input point
C                              tranl          - transformation constant
C                              trank          -        "         "
C                              tranr          -        "         "
C                              trank2,const   -        "         "
C                              tscale         - trans. dependent scale factor
C                              pole           - latitude of near pole
C
C SUBROUTINES CALLED:          None.
C
C CALLED BY:                   llplxy
C
C LOCAL VARIABLES:
C
C RESTRICTIONS:                Initial call must be with:   notlst = .false.
C
C ABNORMAL RETURN CONDITIONS:  Far pole is invalid.
C
C REFERENCE:                   CAM program documentation,  CIA 1986
C
C PROGRAMMER:                  DATE OF LAST CHANGE     REASON FOR CHANGE
C     Tom Wescott   (NOSC)     Feb 88                  Initial entry.
C
C-*-*-*-*-*-*-*-*-*-*-*-*-*-*-*-*-*-*-*-*-*-*-*-*-*-*-*-*-*-*-*-*-*-*-*|*-*-*-*-

      subroutine PXALBR(plon,plat,nin,x,y,nout)
c
      common /pie/ pie,tpie,pio2,pio4
      common /eccen/ eccen,ec2
      common /eco2/ eco2
      logical invali,notlst
      common /invali/ invali
      common /proj/ itproj,wmrad,xoffs,yoffs,scalr,notlst
      common /conic/ spll1,spll2,tranl,trank,tranr,tscale,pole,tilt
      common /albers/ dnom,trank2,const,sinBl
      common /center/clat,clon,cclat,sclat
      real plat(*), plon(*), x(*), y(*)
      parameter (SAFETY = .004)
      parameter (HILAT = 3.14159265/2.0-SAFETY)
c
c------------------- INITIALIZATION SECTION------------------------
      if (notlst) then
c        Skip calculation of map constants.
      else
         notlst = .true.
         ec2 = eccen*eccen
         eco2 = eccen/2.0
c
c        Condition standard parallels to avoid special angle singularities.
c        (This has a negligible effect on map geometry.)
         if (abs(spll1).gt.HILAT) spll1 = sign(HILAT,spll1)
         if (abs(spll2).gt.HILAT) spll2 = sign(HILAT,spll2)
         if (abs(abs(spll1)-abs(spll2)) .lt. SAFETY) then
            spll1 = spll1 - sign(SAFETY,spll1)
         endif
c
c        Compute Albers Conic transformation constants.
```

```
         spll0 = (spll1 + spll2)/2.0
         pole = sign(pio2,spll0)
         dnom = 1. + ec2*2./3. + ec2*ec2*3./5. + ec2*ec2*ec2*4./7.
c
         es02 = (eccen*sin(spll0))**2.0
         dnum = 1. + es02*2./3. + es02*es02*3./5. + es02*es02*es02*4./7.
         sinB0 = sin(spll0)*(dnum/dnom)
c
         es12 = (eccen*sin(spll1))**2.0
         dnum = 1. + es12*2./3. + es12*es12*3./5. + es12*es12*es12*4./7.
         sinB1 = sin(spll1)*(dnum/dnom)
c
         es22 = (eccen*sin(spll2))**2.0
         dnum = 1. + es22*2./3. + es22*es22*3./5. + es22*es22*es22*4./7.
         sinB2 = sin(spll2)*(dnum/dnom)
c
         c2 = wmrad*wmrad*(1.0-ec2)*
     +       (0.5/(1.0-ec2)+(.25/eccen)*alog((1.0+eccen)/(1.0-eccen)))
         t1 = (wmrad*cos(spll1))**2.0/(1.0-es12)
         t2 = (wmrad*cos(spll2))**2.0/(1.0-es22)
c
         tranl = (t1-t2)/(2.0*c2*(sinB2-sinB1))
         const = 2.0*c2/tranl
         trank = wmrad*cos(spll1)/(tranl*sqrt(1.0-es12))
         trank2 = trank*trank
         tranr = sqrt(trank2 + const*(sinB1-sinB0))
c
c        Compute a map dependant scale factor which normalizes a small
c        one nm E-W distance along a key latitude (clat) for any cone.
         scalat = clat
         if (abs(scalat).gt.HILAT) scalat = sign(HILAT,scalat)
         Dlo = .01745
         es2 = (eccen*sin(scalat))**2.0
         dnum = 1.+es2*2./3. + es2*es2*3./5. + es2*es2*es2*4./7.
         sinB = sin(scalat)*dnum/dnom
         rm = sqrt(trank2+const*(sinB1-sinB))
         deltax = rm * sin(tranl*Dlo)
         dxmap = Dlo*wmrad*cos(scalat)
         tscale = dxmap/deltax
         scalr = tscale
c
      endif
c
c-------------------- COMPUTATIONAL SECTION------------------------
      eterm = 1.0
      nout = 0
      do 100 n = 1, nin
c
         invali = .false.
         ptlat = plat(n)
         Dlo = plon(n) - clon
         if (abs(Dlo).gt.pie) Dlo = Dlo - sign(tpie,Dlo)
c
         if (ptlat.eq.-pole) then
            invali = .true.
         else
            if (eccen .ne. 0.0) then
               es2 = (eccen*sin(ptlat))**2.0
               dnum = 1.+es2*2./3. + es2*es2*3./5. + es2*es2*es2*4./7.
               eterm = dnum/dnom
            endif
c
            sinB = sin(ptlat)*eterm
            rm = sqrt(trank2+const*(sinB1-sinB))
            rx = rm*sin(tranl*Dlo)
            ry = tranr - rm*cos(tranl*Dlo)
c
c           Apply viewing transformation.
            nout = nout + 1
            x(nout) = rx*scalr + xoffs
            y(nout) = ry*scalr + yoffs
         endif
c
 100  continue
```

```
c
      return
      end

C+*+*+*+*+*+*+*+*+*+*+*+*+*+*+*+*+*+*+*+*+*+*+*+*+*+*+*+*+*+*+*+*+*+*|*+*+*+*+
C UNIT NAME:                      PXAZEA
C
C FUNCTIONAL DESCRIPTION:           AZIMUTHAL EQUAL AREA INTO X/Y
C                                       Spherical earth model.
C
C INPUT FILES/PARAMETERS:         plon(), plat() - input polyline arrays
C                                 nin            - number of input points
C
C GLOBAL VARIABLES:               clat,clon      - map center lat,lon
C                                 cclat,sclat    - cos,sin of center lat
C                                 wmrad          - earth radius, world units
C                                 xoffs, yoffs   - display offset, world units
C
C OUTPUT FILES/PARAMETERS:        x(),y()        - output polyline arrays
C                                 nout           - number of valid output points
C                                 invali         - flag for last input point, true
C                                                  unless pt. very near antipode.
C SUBROUTINES CALLED:             None.
C
C CALLED BY:                      lltoxy, llplxy
C
C LOCAL VARIABLES:                er             - arc from center to point
C
C RESTRICTIONS:                   Declares antipode invalid.
C
C ABNORMAL RETURN CONDITIONS:     None.
C
C PROGRAMMER:                     DATE OF LAST CHANGE      REASON FOR CHANGE
C     Tom Wescott   (NOSC)        Jan 87                   Original entry.
C                                 OCT 88
C
C-*-*-*-*-*-*-*-*-*-*-*-*-*-*-*-*-*-*-*-*-*-*-*-*-*-*-*-*-*-*-*-*-*-*-*-*|*-*-*-*-
        subroutine pxazea(plon,plat,nin,x,y,nout)
c
        common /center/ clat,clon,cclat,sclat
        logical invali,notlst
        common /invali/ invali
        common /proj/ itproj,wmrad,xoffs,yoffs,scalr,notlst
        real plat(*), plon(*), x(*), y(*)
        parameter(COSHZN = -0.999999)
c
        if (notlst) then
c          Skip calculation of map constant.
        else
           notlst = .true.
           scalr = wmrad
        endif
c
        nout = 0
        do 100 i = 1, nin
c
           invali = .false.
           sinL1 = sin(plat(i))
           cosL1 = cos(plat(i))
           Dlo = plon(i) - clon
           sinDlo = sin(Dlo)
           cosDlo = cos(Dlo)
c
c          Calculate arc from map center to point (plon,plat).
           cosER = sclat*sinL1 + cclat*cosL1*cosDlo
           if (abs(cosER) .gt. 1.0) cosER = sign(1.0,cosER)
c
           if (cosER .lt. COSHZN) then
c             The point is beyond the defined map boundary.
              invali = .true.
              cosER = COSHZN
           endif
c
```

```
c           Calculate output point on plane of projection.
            er = acos(cosER)
            sinER = sin(er)
            if (sinER .eq. 0.0) then
c              Point is at the projection center.
               rx = 0.0
               ry = 0.0
            else
               const = 2.0*sin(er/2.0)/sinER
               rx = const*cosL1*sinDlo
               ry = const*(cclat*sinL1-sclat*cosL1*cosDlo)
            endif
c
c           Apply viewing transformation.
            nout = nout + 1
            x(nout) = rx*scalr - xoffs
            y(nout) = ry*scalr - yoffs
c
 100    continue
c
        return
        end

C+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                       PXAZED
C
C FUNCTIONAL DESCRIPTION:          AZIMUTHAL EQUIDISTANT PROJECTION INTO X/Y
C                                          Spherical earth model.
C
C INPUT FILES/PARAMETERS:          plon(), plat() - input polyline arrays
C                                  nin            - number of input points
C
C GLOBAL VARIABLES:                clat,clon      - map center lat,lon
C                                  cclat,sclat    - cos,sin of center lat
C                                  wmrad          - earth radius, world units
C                                  xoffs, yoffs   - display offset, world units
C
C OUTPUT FILES/PARAMETERS:         x(),y()        - output polyline arrays
C                                  nout           - number of valid output points
C                                  invali         - flag for last input point, true
C                                                   unless point very near antipode.
C
C SUBROUTINES CALLED:              None.
C
C CALLED BY:                       lltoxy, llplxy
C
C LOCAL VARIABLES:                 er             - arc from center to point
C
C RESTRICTIONS:                    None.
C
C ABNORMAL RETURN CONDITIONS:      None.
C
C PROGRAMMER:                      DATE OF LAST CHANGE     REASON FOR CHANGE
C      Tom Wescott   (NOSC)        Jan 87                  Original entry.
C                                  OCT 88
C
C-*-*-*-*-*-*-*-*-*-*-*-*-*-*-*-*-*-*-*-*-*-*-*-*-*-*-*-*-*-*-*-*-*-*-*-*-*|*-*-*-*-
        subroutine pxazed(plon,plat,nin,x,y,nout)
c
        common /center/ clat,clon,cclat,sclat
        logical invali,notlst
        common /invali/ invali
        common /proj/ itproj,wmrad,xoffs,yoffs,scalr,notlst
        real plat(*), plon(*), x(*), y(*)
        parameter(COSHZN = -0.999999)
c
c
        if (notlst) then
c          Skip calculation of map constant.
        else
           notlst = .true.
           scalr = wmrad
        endif
c
        nout = 0
```

```
        do 100 i = 1, nin
c
           invali = .false.
           sinL1 = sin(plat(i))
           cosL1 = cos(plat(i))
           Dlo = plon(i) - clon
           sinDlo = sin(Dlo)
           cosDlo = cos(Dlo)
c
c          Calculate arc from map center to point (plon,plat).
           cosER = sclat*sinL1 + cclat*cosL1*cosDlo
           if (abs(cosER) .gt. 1.0) cosER = sign(1.0,cosER)
c
           if (cosER .lt. COSHZN) then
c             The point is outside valid map area.
              invali = .true.
              cosER = COSHZN
           endif
c
c          Calculate output point on plane of projection.
           er = acos(cosER)
           sinER = sin(er)
           if (sinER .eq. 0.0) then
c             Point is at the projection center.
              rx = 0.0
              ry = 0.0
           else
              const = er/sinER
              rx = const*cosL1*sinDlo
              ry = const*(cclat*sinL1-sclat*cosL1*cosDlo)
           endif
c
c          Apply viewing transformation.
           nout = nout + 1
           x(nout) = rx*scalr - xoffs
           y(nout) = ry*scalr - yoffs
c
 100    continue
c
        return
        end

C+*+*+*+*+*+*+*+*+*+*+*+*+*+*+*+*+*+*+*+*+*+*+*+*+*+*+*+*+*+*+*+*+*+*+*+*+*+*+*+*+*
C UNIT NAME:                    PXEQRE
C
C FUNCTIONAL DESCRIPTION:          EQUIRECTANGULAR PROJECTION INTO X/Y
C                                     spherical earth model.
C
C INPUT FILES/PARAMETERS:       plon(), plat() - input polyline arrays
C                               nin            - number of input points
C
C GLOBAL VARIABLES:             clat,clon      - map center lat,lon
C                               cclat,sclat    - cos,sin of center lat
C                               pio2           - multiple of pi
C                               wmrad          - earth radius, world units
C                               xoffs, yoffs   - display offset, world units
C
C OUTPUT FILES/PARAMETERS:      x(),y()        - output polyline arrays
C                               nout           - number of valid output points
C                               invali         - flag for last input point
C
C SUBROUTINES CALLED:           None.
C
C CALLED BY:                    lltoxy, llplxy
C
C LOCAL VARIABLES:              None.
C
C RESTRICTIONS:                 None.
C
C ABNORMAL RETURN CONDITIONS:   Invalid flag set for pts. at poles.
C
C LOCATION:
C
```

```
C PROGRAMMER:                   DATE OF LAST CHANGE     REASON FOR CHANGE
C     DAVE NATION                                       ORIGINAL CODE.
C     JERRY FENERTY                                     DOCUMENTATION AND MO
C                                                       FOR A21 PROTOTYPE.
C     Tom Wescott  (NOSC)       Jan 87                  optimization, add invali
C
C-*-*-*-*-*-*-*-*-*-*-*-*-*-*-*-*-*-*-*-*-*-*-*-*-*-*-*-*-*-*-*-*-*-*-*-*-*-*-*-*-*-*-*|*-*-*-*-

        subroutine PXEQRE(plon,plat,nin,x,y,nout)
c
        common /center/ clat,clon,cclat,sclat
        common /pie/ pie,tpie,pio2,pio4
        logical invali,notlst
        common /invali/ invali
        common /proj/ itproj,wmrad,xoffs,yoffs,scalr,notlst
        real plat(*), plon(*), x(*), y(*)
c
c
        if (notlst) then
c          Skip calculation of scale factor.
        else
           notlst = .true.
           scalr = wmrad*cclat
CC         IF (INDEX(IDEBUG,'oldhldf') .ne. 0) scalr = wmrad
        endif
c
        nout = 0
        do 100 i = 1, nin
c
           invali = .false.
           if (abs(plat(i)).ge.pio2) then
c             The point lies on a pole.
              invali = .true.
           else
c             Calculate output point on cylinder of projection.
              rx = plon(i) - clon
              if (abs(rx).gt.pie) rx = rx - sign(tpie,rx)
c
              ry = plat(i) - clat
c
c             Apply viewing transformation.
              nout = nout + 1
              x(nout) = rx*scalr + xoffs
              y(nout) = ry*scalr + yoffs
           endif
c
 100    continue
c
        return
        end


C+*+*+*+*+*+*+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    PXGNOM
C
C FUNCTIONAL DESCRIPTION:          GNOMONIC PROJECTION INTO X/Y
C                                     Spherical earth model.
C
C INPUT FILES/PARAMETERS:       plon(), plat() - input polyline arrays
C                               nin            - number of input points
C
C GLOBAL VARIABLES:             clat,clon      - map center lat,lon
C                               cclat,sclat    - cos,sin of center lat
C                               wmrad          - earth radius, world units
C                               xoffs, yoffs   - display offset, world units
C
C OUTPUT FILES/PARAMETERS:      x(),y()        - output polyline arrays
C                               nout           - number of valid output points
C                               invali         - flag for last input point
C
C SUBROUTINES CALLED:           None.
C
C CALLED BY:                    lltoxy, llplxy
C
C LOCAL VARIABLES:              er             - arc from center to point
```

```
C
C RESTRICTIONS:                  Declares points more than 80 degrees from
C                                the center invalid, and does not output them.
C
C ABNORMAL RETURN CONDITIONS:  None.
C
C PROGRAMMER:                  DATE OF LAST CHANGE     REASON FOR CHANGE
C
C     DAVE NATION                                      ORIGINAL CODE.
C     JERRY FENERTY                                    DOCUMENTATION AND MO
C                                                      FOR A21 PROTOTYPE.
C     Tom Wescott  (NOSC)      Jan 87                  optimization, add invali
C
C-*-*-*-*-*-*-*-*-*-*-*-*-*-*-*-*-*-*-*-*-*-*-*-*-*-*-*-*-*-*-*-*-*-*-*-*-*|*-*-*-*-
c
        subroutine pxgnom(plon,plat,nin,x,y,nout)
c
        common /center/ clat,clon,cclat,sclat
        logical invali,notlst
        common /invali/ invali
        common /proj/ itproj,wmrad,xoffs,yoffs,scalr,notlst
        real plat(*), plon(*), x(*), y(*)
        parameter (COSHZN=0.17)
c
c
        if (notlst) then
c          Skip calculation of map constant.
        else
           notlst = .true.
           scalr = wmrad
        endif
c
        nout = 0
        do 100 i = 1, nin
c
           invali = .false.
           sinL1 = sin(plat(i))
           cosL1 = cos(plat(i))
           Dlo = plon(i)-clon
           sinDlo = sin(Dlo)
           cosDlo = cos(Dlo)
c
c          Calculate arc from map center to point (plon,plat).
           cosER = sclat*sinL1 + cclat*cosL1*cosDlo
c
           if (cosER .le. COSHZN) then
c             The point lies beyond the map limit.
              invali = .true.
           else
c             Calculate output point on plane of projection.
              const = 1.0/cosER
              rx = const*cosL1*sinDlo
              ry = const*(cclat*sinL1-sclat*cosL1*cosDlo)
c
c             Apply viewing transformation.
              nout = nout+1
              x(nout) = rx*scalr + xoffs
              y(nout) = ry*scalr + yoffs
           endif
c
 100    continue
c
        return
        end


C+++++++++++++++++++++++++++++++++++++++++++++++++++++++++++++++++++++++++|+++++++
C UNIT NAME:                    PXKAVR
C
C FUNCTIONAL DESCRIPTION:       KAVRAISKY IV  CONIC PROJECTION INTO X/Y
C                                       Spherical earth model.
C
C INPUT FILES/PARAMETERS:       plon(), plat() - input polyline arrays
C                               nin            - number of input points
C
```

```
C GLOBAL VARIABLES:          clat,clon       - map center lat,lon
C                            pie,pio2        - multiples of pi
C                            wmrad           - earth radius, world units
C                            xoffs, yoffs    - display offset, world units
C
C OUTPUT FILES/PARAMETERS:   x(),y()         - output polyline arrays
C                            nout            - number of valid output points
C                            tranl           - transformation constant
C                            trank           -        "          "
C                            tranr           -        "          "
C                            tscale          - trans. dependent scale factor
C
C SUBROUTINES CALLED:        None.
C
C CALLED BY:                 llplxy
C
C LOCAL VARIABLES:
C
C RESTRICTIONS:              Initial call must be with:   notlst = .false.
C
C ABNORMAL RETURN CONDITIONS: None.
C
C REFERENCE:                 CAM program documentation,  CIA 1986
C
C PROGRAMMER:                DATE OF LAST CHANGE     REASON FOR CHANGE
C     Tom Wescott   (NOSC)   Feb 88                  Initial entry.
C
C-*-*-*-*-*-*-*-*-*-*-*-*-*-*-*-*-*-*-*-*-*-*-*-*-*-*-*-*-*-*-*-*-*-*-*-*|*-*-*-*-

      subroutine PXKAVR(plon,plat,nin,x,y,nout)
c
      common /pie/ pie,tpie,pio2,pio4
      logical invali,notlst
      common /invali/ invali
      common /proj/ itproj,wmrad,xoffs,yoffs,scalr,notlst
      common /conic/ spll1,spll2,tranl,trank,tranr,tscale,pole,tilt
      common /center/clat,clon,cclat,sclat
      real plat(*), plon(*), x(*), y(*)
      parameter (SAFETY = .004)
      parameter (HILAT = 3.14159265/2.0-SAFETY)
c
c------------------- INITIALIZATION SECTION------------------------
      if (notlst) then
c        Skip calculation of map constants.
      else
         notlst = .true.
c
c        Condition standard parallels to avoid special angle singularities.
c        (This has a negligible effect on map geometry.)
         if (abs(spll1).gt.HILAT) spll1 = sign(HILAT,spll1)
         if (abs(spll2).gt.HILAT) spll2 = sign(HILAT,spll2)
         if (abs(abs(spll1)-abs(spll2)) .lt. SAFETY) then
            spll1 = spll1 - sign(SAFETY,spll1)
         endif
c
c        Compute KAVRAISKY IV transformation constants.
         tranl = (cos(spll1)-cos(spll2))/(spll2-spll1)
         trank = ((cos(spll1)+cos(spll2))/tranl+spll1+spll2)*wmrad/2.
         tranr = trank-wmrad*clat
c
c        Compute a scale factor which normalizes a small one nautical
c        mile E-W distance along a key latitude (clat) for any cone.
         scalat = clat
         if (abs(scalat).gt.HILAT) scalat = sign(HILAT,scalat)
         Dlo = .01745
         rm = trank-wmrad*scalat
         deltax = rm*sin(tranl*Dlo)
         dxmap = Dlo*wmrad*cos(scalat)
         tscale = dxmap/deltax
         scalr = tscale
c
      endif
c
c------------------- COMPUTATIONAL SECTION------------------------
```

```
      nout = 0
      do 100 n = 1, nin
c
         invali = .false.
         ptlat = plat(n)
         Dlo = plon(n) - clon
         if (abs(Dlo).gt.pie) Dlo = Dlo - sign(tpie,Dlo)
c
         rm = trank - wmrad*ptlat
         rx = rm*sin(tranl*Dlo)
         ry = tranr - rm*cos(tranl*Dlo)
c
c        Apply viewing transformation.
         nout = nout + 1
         x(nout) = rx*scalr + xoffs
         y(nout) = ry*scalr + yoffs
c
 100  continue
c
      return
      end


C+*+*+*+*+*+*+*+*+*+*+*+*+*+*+*+*+*+*+*+*+*+*+*+*+*+*+*+*+*+*+*+*+*+*+*+*|*+*+*+*-
C UNIT NAME:                    PXLAMC
C
C FUNCTIONAL DESCRIPTION:       LAMBERT CONFORMAL PROJECTION INTO X/Y
C                                     Elliptical earth model.
C
C INPUT FILES/PARAMETERS:       plon(), plat() - input polyline arrays
C                               nin            - number of input points
C
C GLOBAL VARIABLES:             clat,clon      - map center lat,lon
C                               pio4           - multiple of pi
C                               eccen          - earth eccentricity
C                               wmrad          - earth radius, world units
C                               xoffs, yoffs   - display offset, world units
C
C OUTPUT FILES/PARAMETERS:      x(),y()        - output polyline arrays
C                               nout           - number of valid output points
C                               invali         - flag for last input point
C                               pole            +.5 if cone over N, -.5 over S
C                               tranl          - transformation constant
C                               trank          -        "          "
C                               tranr          -        "          "
C                               tscale         - trans. dependent scale factor
C
C SUBROUTINES CALLED:           None.
C
C CALLED BY:                     llplxy
C
C LOCAL VARIABLES:
C
C RESTRICTIONS:                 Initial call must be with:   notlst = .false.
C
C ABNORMAL RETURN CONDITIONS:   Invalid returned for pts. near far pole.
C
C REFERENCE:                    CAM Program Documentation   CIA 1986
C
C PROGRAMMER:                   DATE OF LAST CHANGE     REASON FOR CHANGE
C     DAVE NATION                                       ORIGINAL CODE.
C     JERRY FENERTY                                     DOCUMENTATION AND MO
C     Tom Wescott   (NOSC)      Jan 87                  Added polyline loop.
C     Tom Wescott               Jul 87                  Use CIA CAM formulas.
C
C-*-*-*-*-*-*-*-*-*-*-*-*-*-*-*-*-*-*-*-*-*-*-*-*-*-*-*-*-*-*-*-*-*-*-*-*|*-*-*-*-

      subroutine pxlamc(plon,plat,nin,x,y,nout)
c
      common /pie/ pie,tpie,pio2,pio4
      common /eccen/ eccen,ec2
      common /eco2/ eco2
      logical invali,notlst
      common /invali/ invali
```

```
      common /proj/ itproj,wmrad,xoffs,yoffs,scalr,notlst
      common /conic/ spll1,spll2,tranl,trank,tranr,tscale,pole,tilt
      common /center/clat,clon,cclat,sclat
      real plat(*), plon(*), x(*), y(*)
      parameter (SAFETY = .004)
      parameter (HILAT = 3.1415/2.0 )
      parameter (HHILAT = HILAT/2.0)
c
c-------------------- INITIALIZATION SECTION------------------------
      if (notlst) then
c        Skip calculation of map constants.
      else
         notlst = .true.
         ec2 = eccen*eccen
         eco2 = eccen/2.0
c
c        Condition standard parallels to avoid singularities.
c        (This has a negligible effect on map geometry.)
         if (spll1 .eq. 0.0) spll1 = SAFETY
         if (spll2 .eq. 0.0) spll2 = SAFETY
         if (abs(spll1).gt.HILAT) spll1 = sign(HILAT,spll1)
         if (abs(spll2).gt.HILAT) spll2 = sign(HILAT,spll2)
         if (spll1 .eq. -spll2) then
            spll1 = SAFETY
            spll2 = SAFETY
         endif
c
c        Compute Lambert Conformal Conic transformation constants.
         spll0 = (spll1 + spll2)/2.0
         pole = sign(0.5,spll0)
c
         esinl = eccen*sin(clat)
         eterm = ((1.0 + esinl)/(1.0 - esinl))**eco2
         tanZ02 = eterm*tan(pio4 - pole*abs(clat))
c
         esinl = eccen*sin(spll1)
         eterm = ((1.0 + esinl)/(1.0 - esinl))**eco2
         tanZ12 = eterm*tan(pio4 - pole*abs(spll1))
c
         esinl = eccen*sin(spll2)
         eterm = ((1.0 + esinl)/(1.0 - esinl))**eco2
         tanZ22 = eterm*tan(pio4 - pole*abs(spll2))
c
         r1 = wmrad/(sqrt(1.0 - ec2*sin(spll1)*sin(spll1)))
         r2 = wmrad/(sqrt(1.0 - ec2*sin(spll2)*sin(spll2)))
         denom = alog(tanZ12) - alog(tanZ22)
         if (denom .ne. 0.0) then
            sinPHI = alog(cos(spll1))-alog(cos(spll2))+alog(r1)-alog(r2)
            sinPHI = sinPHI/denom
         else
c           Avoid zero divide if parallels same.  Replace with limit.
            sinPHI = sin(spll1)
         endif
         tranl = abs(sinPHI)
c
         trank = 0.5*((r1*cos(spll1)/(tranl*tanZ12**tranl))
     +                +(r2*cos(spll2)/(tranl*tanZ22**tranl)))
c
         tranr = trank*(tanZ02**tranl)
c
c        Compute a map dependant scale factor which normalizes a small
c        one nm E-W distance along a key latitude (clat) for any cone.
         scalat = clat
         if (abs(scalat).gt.HILAT) scalat = sign(HILAT,scalat)
         Dlo = .01745
         tanZM2 = eterm*tan(pio4 - pole*scalat)
         rm = abs(trank*(tanZM2**tranl))
         deltax = rm * sin(tranl*abs(Dlo))
         if (pole*Dlo .lt. 0.0) deltax = - deltax
         dxmap = Dlo*wmrad*cos(scalat)
         tscale = dxmap/deltax
         scalr = tscale
c
      endif
c
c------------------- COMPUTATIONAL SECTION------------------------
```

```
      eterm = 1.0
      nout = 0
      do 100 n = 1, nin
c
         invali = .false.
         ptlat = plat(n)
         Dlo = plon(n) - clon
         if (abs(Dlo).gt.pie) Dlo = Dlo - sign(tpie,Dlo)
         absDlo = abs(Dlo)
c
         if ((abs(ptlat).gt.pio2).or.(pole*ptlat.le.-HHILAT)) then
            invali = .true.
         else
            if (eccen .ne. 0.0) then
               esinl = eccen * sin(ptlat)
               eterm = ((1.0 + esinl)/(1.0 - esinl))**eco2
            endif
c
            tanZM2 = eterm*tan(pio4 - pole*ptlat)
c
            rm = abs(trank*(tanZM2**tranl))
            rx = rm * sin(tranl*absDlo)
            if (pole*Dlo .lt. 0.0) rx = -rx
            ry = tranr - rm*cos(tranl*absDlo)
c
c           Apply viewing transformation.
            nout = nout + 1
            x(nout) = rx*scalr + xoffs
            y(nout) = ry*scalr + yoffs
         endif
c
 100  continue
c
      return
      end


C+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    PXMERC
C
C FUNCTIONAL DESCRIPTION:          MERCATOR PROJECTION INTO X/Y
C                                     Elliptical earth model.
C
C INPUT FILES/PARAMETERS:       plon(), plat() - input polyline arrays
C                               nin            - number of input points
C
C GLOBAL VARIABLES:             clat,clon      - map center lat,lon
C                               cclat,sclat    - cos,sin of center lat
C                               pio2,pio4      - multiples of pi
C                               eccen          - earth eccentricity
C                               wmrad          - earth radius, world units
C                               xoffs, yoffs   - display offset, world units
C                               scalr          - display scale factor
C
C OUTPUT FILES/PARAMETERS:      x(),y()        - output polyline arrays
C                               nout           - number of valid output points
C                               invali         - flag for last input point
C
C SUBROUTINES CALLED:           None.
C
C CALLED BY:                    llplxy
C
C LOCAL VARIABLES:              None.
C
C RESTRICTIONS:                 None.
C
C ABNORMAL RETURN CONDITIONS:   Invalid flag set for pts at poles.
C
C PROGRAMMER:                   DATE OF LAST CHANGE    REASON FOR CHANGE
C     DAVE NATION                                      ORIGINAL CODE.
C     JERRY FENERTY                                    DOCUMENTATION AND MO
C                                                      FOR A21 PROTOTYPE.
C     Tom Wescott  (NOSC)       Jan 87                 optimization, add invali
C
C-*-*-*-*-*-*-*-*-*-*-*-*-*-*-*-*-*-*-*-*-*-*-*-*-*-*-*-*-*-*-*-*-*-*-*-*-*|*-*-*-*-
```

```
      subroutine PXMERC(plon,plat,nin,x,y,nout)
c
      common /center/ clat,clon,cclat,sclat
      common /pie/ pie,tpie,pio2,pio4
      common /eccen/ eccen,ec2
      logical invali,notlst
      common /invali/ invali
      common /proj/ itproj,wmrad,xoffs,yoffs,scalr,notlst
      real plat(*), plon(*), x(*), y(*)
      parameter (HILAT=3.13/2.0)
c
c
      if (notlst) then
c        Skip calculation of scale factor.
      else
         notlst = .true.
         scalr = wmrad*cos(clat)
      endif
c
      nout = 0
      do 100 i = 1, nin
c
         invali = .false.
         ptlat = plat(i)
c
         if (abs(ptlat).ge.HILAT) then
            if (abs(ptlat).ge.pio2) invali = .true.
            ptlat = sign(HILAT,ptlat)
         endif
c
c        Calculate output point on cylinder of projection.
         rx = plon(i) - clon
         if (abs(rx).gt.pie) rx = rx - sign(tpie,rx)
c
         ry = alog(tan(pio4+0.5*ptlat))
         if (eccen .ne. 0.0) then
c           Add on eccentricity term.
            esinL = eccen*sin(ptlat)
            ry = ry + 0.5*eccen*alog((1.0-esinL)/(1.0+esinL))
         endif
         ry = ry - clat
c
c        Apply viewing transformation.
         nout = nout + 1
         x(nout) = rx*scalr + xoffs
         y(nout) = ry*scalr + yoffs
c
 100  continue
c
      return
      end


C+*+*+*+*+*+*+*+*+*+*+*+*+*+*+*+*+*+*+*+*+*+*+*+*+*+*+*+*+*+*+*+*+*+*|*+*+*+*+
C UNIT NAME:                    PXMILL
C
C FUNCTIONAL DESCRIPTION:        MILLER CYLINDRICAL PROJECTION INTO X/Y
C                                      Spherical earth model.
C
C INPUT FILES/PARAMETERS:       plon(), plat() - input polyline arrays
C                               nin            - number of input points
C
C GLOBAL VARIABLES:             clat,clon      - map center lat,lon
C                               cclat,sclat    - cos,sin of center lat
C                               pio2,pio4      - multiples of pi
C                               wmrad          - earth radius, world units
C                               xoffs, yoffs   - display offset, world units
C
C OUTPUT FILES/PARAMETERS:      x(),y()        - output polyline arrays
C                               nout           - number of valid output points
C                               invali         - flag for last input point
C
C SUBROUTINES CALLED:           None.
C
```

```
C CALLED BY:                    llplxy
C
C LOCAL VARIABLES:              None.
C
C RESTRICTIONS:                 None.
C
C ABNORMAL RETURN CONDITIONS:   Invalid flag set for pts at poles.
C
C PROGRAMMER:                   DATE OF LAST CHANGE   REASON FOR CHANGE
C     DAVE NATION                                     ORIGINAL CODE.
C     JERRY FENERTY                                   DOCUMENTATION AND MO
C                                                     FOR A21 PROTOTYPE.
C     Tom Wescott  (NOSC)       Jan 87                optimization, add invali
C
C-*-*-*-*-*-*-*-*-*-*-*-*-*-*-*-*-*-*-*-*-*-*-*-*-*-*-*-*-*-*-*-*-*-*-*-*-*-*-*|*-*-*-*-

       subroutine PXMILL(plon,plat,nin,x,y,nout)
c
       common /center/ clat,clon,cclat,sclat
       common /pie/ pie,tpie,pio2,pio4
       logical invali,notlst
       common /invali/ invali
       common /proj/ itproj,wmrad,xoffs,yoffs,scalr,notlst
       real plat(*), plon(*), x(*), y(*)
c
c
       if (notlst) then
c         Skip calculation of map constant.
       else
          notlst = .true.
          scalr = wmrad*cclat
       endif
c
       nout = 0
       do 100 i = 1, nin
c
          invali = .false.
          ptlat = plat(i)
          ptlon = plon(i)
c
          if (abs(ptlat).ge.pio2) then
             invali = .true.
          else
c            Calculate output point on cylinder of projection.
             rx = ptlon - clon
             if (abs(rx).gt.pie) rx = rx - sign(tpie,rx)
c
             ry = 1.25 + alog(tan(pio4+0.4*ptlat))
             ry = ry - clat
c
c            Apply viewing transformation.
             nout = nout + 1
             x(nout) = rx*scalr + xoffs
             y(nout) = ry*scalr + yoffs
          endif
c
 100   continue
c
       return
       end


C+*+*+*+*+*+*+*+*+*+*+*+*+*+*+*+*+*+*+*+*+*+*+*+*+*+*+*+*+*+*+*+*+*+*+*+*+*+*-*+*|*+*+*+*+
C UNIT NAME:                    PXOBLM
C
C FUNCTIONAL DESCRIPTION:       OBLIQUE MERCATOR PROJECTION INTO X/Y
C                                     Spherical earth model.
C
C INPUT FILES/PARAMETERS:       plon(), plat() - input polyline arrays
C                               nin            - number of input points
C
C GLOBAL VARIABLES:             clat,clon      - map center lat,lon
C                               cclat,sclat    - cos,sin of center lat
C                               wmrad          - earth radius, world units
```

```
C                               xoffs, yoffs    - display offset, world units
C                               az,azlat        - Gt. circle azimuth at azlat.
C                               tilt            - GT. circle azimuth at equator.
C
C OUTPUT FILES/PARAMETERS:      x(),y()         - output polyline arrays
C                               nout            - number of valid output points
C                               invali          - flag for last input point
C
C SUBROUTINES CALLED:           da211
C
C CALLED BY:                    lltoxy, llplxy
C
C LOCAL VARIABLES:              SINMAX          - sin of max angle from great c.
C
C RESTRICTIONS:                 Declares points beyond MAX from central great
C                               circle invalid, and truncates them there to work
C                               around polygon clipping problems near new poles.
C
C ABNORMAL RETURN CONDITIONS:   None.
C
C PROGRAMMER:                   DATE OF LAST CHANGE     REASON FOR CHANGE
C     Tom Wescott  (NOSC)       Apr 88                  original entry
C
C-*-*-*-*-*-*-*-*-*-*-*-*-*-*-*-*-*-*-*-*-*-*-*-*-*-*-*-*-*-*-*-*-*-*-*-*-*|*-*-*-*-

      subroutine PXOBLM(plon,plat,nin,x,y,nout)
c
      common /center/ clat,clon,cclat,sclat
      common /pie/ pie,tpie,pio2,pio4
      logical invali,notlst
      common /invali/ invali
      common /proj/ itproj,wmrad,xoffs,yoffs,scalr,notlst
      common /conic/ spll1,spll2,tranl,trank,tranr,tscale,pole,tilt
      common /oblm/ polat,polon,az,azlat,gamma,xshift
      real plat(*), plon(*), x(*), y(*)
      parameter (SINMAX=.99)
c
c----------------------- INITIALIZATION SECTION ----------------------------
      if (notlst) then
c        Skip calculation of constants.
      else
         notlst = .true.
c
c        Specify central great circle by lat,azimuth, and center pt.
c        Convert great circle azimuth to range  -pio2 < az < pio2.
         if (abs(az).gt.pie) az = az - sign(tpie,az)
         if (abs(az).gt.pio2) az = az - sign(pie,az)
c
c        Calculate north rotation angle for map center.
         sinB0 = sin(az)*cos(azlat)/cos(clat)
         if (abs(sinB0).gt.1.0) then
            sinB0 = sign(1.0,sinB0)
CCCC        WRITE(*,*)'PXOBLM... gt. circle doesnt go thru map center'
         endif
         b0 = asin(sinB0)
c        Resolve asin() ambiguity by larger side rule.
         if (pio2-azlat .gt. pio2-clat)  b0 = sign(1.0,b0)*(pie-abs(b0))
c        Redefine central great circle azimuth at map center point.
         az = b0
         azlat = clat
         azlon = clon

         gamma = asin(sinB0) - sign(pio2,b0)
         sinG = sin(gamma)
         cosG = cos(gamma)
c
c        Calculate equatorial tilt (azimuth of gt. circle at equator).
         blat = 0.0
         b = asin(sin(az)*cos(azlat)/cos(blat))
c        Resolve asin() ambiguity by larger side rule.
         if (pio2-azlat .gt. pio2-blat)  b = sign(1.0,b)*(pie-abs(b))
c
         a = az
         tilt = b
```

```
      if (azlat.lt.0.0)  tilt = sign(1.0,az)*(pie-abs(b))
c
c     Find longitude of gt. circle-equator intersection.
      if ((a.ne.b).or.(azlat.ne.0.0)) then
         Dlo = 2.*atan2(sin(azlat/2.),tan((a-b)/2.)*cos(azlat/2.))
      else
         Dlo = 0.0
      endif
c     Find nearest intersection, where sign of tilt is correct.
      if (Dlo.gt.pio2) Dlo = Dlo -sign(pie,Dlo)
      dnode = azlon + Dlo
      if (abs(dnode).gt.pie) dnode = dnode - sign(tpie,dnode)
c
c     Calculate lat,lon coordinates of positive new pole.
      az2new = tilt - sign(pio2,tilt)
      call da2ll(0.0,dnode,pio2,az2new,polat,polon)
      sinPL = sin(polat)
      cosPL = cos(polat)
c
c     Calculate x position (parallel to great circle) of center point.
      cplon = clon - polon
      xshift=atan2(sin(cplon)*cclat,
     +        cclat*sin(polat)*cos(cplon)-cos(polat)*sclat)
c
      scalr = wmrad
   endif
c
c------------------------ COMPUTATIONAL SECTION ---------------------------
   sinPl = sin(polat)
   cosPl = cos(polat)
   nout = 0
   do 100 i = 1, nin
c
      invali = .false.
      ptlon = plon(i)
c     Rotate points with respect to great. circle.
      ptlon = ptlon - polon
      cosLO = cos(ptlon)
      sinLO = sin(ptlon)
      sinLA = sin(plat(i))
      cosLA = cos(plat(i))
c
c     Calculate output point on cylinder of projection.
      sinfnc = sinLA*sinPL+cosLA*cosPL*cosLO
      if (abs(sinfnc) .gt. SINMAX) then
c        Point is too far from central great circle.  Truncate.
         invali =.true.
         sinfnc = sign(SINMAX,sinfnc)
      endif
c
      rx = atan2(sinLO*cosLA, cosLA*sinPL*cosLO-cosPL*sinLA)
      deltax = rx - xshift
      if (abs(deltax).gt.pie) rx = rx - sign(tpie,deltax)
c
      ry = 0.5*alog((1+sinfnc)/(1-sinfnc))
c
c     Apply north up viewing transformation.
      nout = nout + 1
      x(nout) = (+rx*cosG + ry*sinG)*scalr + xoffs
      y(nout) = (-rx*sinG + ry*cosG)*scalr + yoffs
c
 100  continue
c
      return
      end


C+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                 PXOREQ
C
C FUNCTIONAL DESCRIPTION:     EQUATORIAL ORTHOGRAPHIC PROJECTION INTO X/Y
C                                     Spherical earth model.
C
C INPUT FILES/PARAMETERS:     plon(), plat() - input polyline arrays
```

```
C                                   nin              - number of input points
C
C GLOBAL VARIABLES:                 clat,clon        - map center lat,lon
C                                   cclat,sclat      - cos,sin of center lat
C                                   wmrad            - earth radius, world units
C                                   xoffs, yoffs     - display offset, world units
C
C OUTPUT FILES/PARAMETERS:          x(),y()          - output polyline arrays
C                                   nout             - number of valid output points
C                                   invali           - flag for last input point
C
C SUBROUTINES CALLED:               None.
C
C CALLED BY:                        lltoxy, llplxy
C
C LOCAL VARIABLES:                  er               - arc from center to point
C
C RESTRICTIONS:                     None.
C
C ABNORMAL RETURN CONDITIONS:  Declares points over the horizon invalid
C                              and does not output them.
C
C PROGRAMMER:                  DATE OF LAST CHANGE      REASON FOR CHANGE
C     DAVE NATION                                       ORIGINAL CODE.
C     JERRY FENERTY                                     DOCUMENTATION AND MO
C                                                       FOR A21 PROTOTYPE.
C     Tom Wescott  (NOSC)      Jan 87                   optimization, add invali
C
C-*-*-*-*-*-*-*-*-*-*-*-*-*-*-*-*-*-*-*-*-*-*-*-*-*-*-*-*-*-*-*-*-*-*-*-*-*-*-*|*-*-*-*-

        subroutine PXOREQ(plon,plat,nin,x,y,nout)
c
        common /center/ clat,clon,cclat,sclat
        logical invali,notlst
        common /invali/ invali
        common /proj/ itproj,wmrad,xoffs,yoffs,scalr,notlst
        real plat(*), plon(*), x(*), y(*)
c
c
        if (notlst) then
c          Skip calculation of scaling constant.
        else
           notlst = .true.
           scalr = wmrad
        endif
c
        nout = 0
        do 100 i = 1, nin
c
           invali = .false.
           sinL1 = sin(plat(i))
           cosL1 = cos(plat(i))
           Dlo = plon(i) - clon
c
c          Calculate arc from equatorial center, to point (plon,plat).
           cosER = cosL1*cos(Dlo)
c
           if (cosER .lt. 0.0) then
c             The point lies over the horizon.
              invali = .true.
           else
c             Calculate output point on plane of projection.
              rx = cosL1*sin(Dlo)
              ry = sinL1
c
c             Apply viewing transformation.
              nout = nout + 1
              x(nout) = rx*scalr + xoffs
              y(nout) = ry*scalr + yoffs
           endif
c
 100    continue
c
        return
        end
```

```
C+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    PXORPO
C
C FUNCTIONAL DESCRIPTION:        POLAR ORTHOGRAPHIC PROJECTION INTO X/Y
C                                     Spherical earth model.
C
C INPUT FILES/PARAMETERS:       plon(), plat() - input polyline arrays
C                               nin            - number of input points
C
C GLOBAL VARIABLES:             clat,clon      - map center lat,lon
C                               cclat,sclat    - cos,sin of center lat
C                               wmrad          - earth radius, world units
C                               xoffs, yoffs   - display offset, world units
C
C OUTPUT FILES/PARAMETERS:      x(),y()        - output polyline arrays
C                               nout           - number of valid output points
C                               invali         - flag for last input point
C
C SUBROUTINES CALLED:           None.
C
C CALLED BY:                    lltoxy, llplxy
C
C LOCAL VARIABLES:              cosER          - cos of arc from cntr to point.
C                               spolat         - sin of pole latitude.
C
C RESTRICTIONS:                 None.
C
C ABNORMAL RETURN CONDITIONS:   Points < 90 from center are invalid.
C
C PROGRAMMER:                   DATE OF LAST CHANGE     REASON FOR CHANGE
C      DAVE NATION                                      ORIGINAL CODE.
C      JERRY FENERTY                                    DOCUMENTATION AND MO
C                                                       FOR A21 PROTOTYPE.
C      Tom Wescott   (NOSC)     Jan 87                  optimization, add invali
C
C-*-*-*-*-*-*-*-*-*-*-*-*-*-*-*-*-*-*-*-*-*-*-*-*-*-*-*-*-*-*-*-*-*-*-*-*|*-*-*-*-

        subroutine PXORPO(plon,plat,nin,x,y,nout)
c
        common /center/ clat,clon,cclat,sclat
        common /pie/ pie,tpie,pio2,pio4
        logical invali,notlst
        common /invali/ invali
        common /proj/ itproj,wmrad,xoffs,yoffs,scalr,notlst
        real plat(*), plon(*), x(*), y(*)
c
c
        if (notlst) then
c          Skip calculation of constants.
        else
           notlst = .true.
           scalr = wmrad
        endif
c
        nout = 0
        do 100 i = 1, nin
c
           invali = .false.
           sinL1 = sin(plat(i))
           cosL1 = cos(plat(i))
           Dlo = plon(i) - clon
           spolat = sign(1.0,clat)
c
c          Calculate arc from map center to point (plon,plat).
           cosER = spolat*sinL1
c
           if (cosER .lt. -0.0) then
c             The point lies over the horizon.
              invali = .true.
           else
c             Calculate output point on plane of projection.
              rx = cosL1*sin(Dlo)
              ry = spolat*(-cosL1*cos(Dlo))
```

```
c            Apply viewing transformation.
             nout = nout + 1
             x(nout) = rx*scalr + xoffs
             y(nout) = ry*scalr + yoffs
          endif
c
 100   continue
c
       return
       end


C+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                     PXORTH
C
C FUNCTIONAL DESCRIPTION:           ORTHOGRAPHIC PROJECTION INTO X/Y
C                                      Spherical earth model.
C
C INPUT FILES/PARAMETERS:        plon(), plat() - input polyline arrays
C                                nin            - number of input points
C
C GLOBAL VARIABLES:              clat,clon      - map center lat,lon
C                                cclat,sclat    - cos,sin of center lat
C                                wmrad          - earth radius, world units
C                                xoffs, yoffs   - display offset, world units
C
C OUTPUT FILES/PARAMETERS:       x(),y()        - output polyline arrays
C                                nout           - number of valid output points
C                                invali         - flag for last input point
C
C SUBROUTINES CALLED:            None.
C
C CALLED BY:                     llplxy,lltoxy
C
C LOCAL VARIABLES:               er             - arc from center to point
C
C RESTRICTIONS:                  Declares points over the horizon invalid
C                                and does not output them.
C
C ABNORMAL RETURN CONDITIONS:    None.
C
C PROGRAMMER:                    DATE OF LAST CHANGE     REASON FOR CHANGE
C     DAVE NATION                                        ORIGINAL CODE.
C     JERRY FENERTY                                      DOCUMENTATION AND MO
C                                                        FOR A21 PROTOTYPE.
C     Tom Wescott   (NOSC)       Jan 87                  optimization, add invali
C-*-*-*-*-*-*-*-*-*-*-*-*-*-*-*-*-*-*-*-*-*-*-*-*-*-*-*-*-*-*-*-*-*-*-*-*|*-*-*-*-

       subroutine PXORTH(plon,plat,nin,x,y,nout)
c
       common /center/ clat,clon,cclat,sclat
       logical invali,notlst
       common /invali/ invali
       common /proj/ itproj,wmrad,xoffs,yoffs,scalr,notlst
       real plat(*), plon(*), x(*), y(*)
c
c
       if (notlst) then
c         Skip calculation of map constant.
       else
          notlst = .true.
          scalr = wmrad
       endif
c
       nout = 0
       do 100 i = 1, nin
c
          invali = .false.
          sinL1 = sin(plat(i))
          cosL1 = cos(plat(i))
          Dlo = plon(i)-clon
          sinDlo = sin(Dlo)
          cosDlo = cos(Dlo)
c
```

```
c          Calculate arc from map center to point (plon,plat).
           cosER = sclat*sinL1 + cclat*cosL1*cosDlo
c
           if (cosER .lt. 0.0) then
c             The point lies over the horizon.
              invali = .true.
           else
c             Calculate output point on plane of projection.
              rx = cosL1*sinDlo
              ry = cclat*sinL1 - sclat*cosL1*cosDlo
c
c             Apply viewing transformation.
              nout = nout+1
              x(nout) = rx*scalr + xoffs
              y(nout) = ry*scalr + yoffs
           endif
c
 100    continue
c
        return
        end

C++++++++++++++++++++++++++++++++++++++++++++++++++++++++++++++++++++++|+++++++
C UNIT NAME:                     PXPERS
C
C FUNCTIONAL DESCRIPTION:        PERSPECTIVE PROJECTION INTO X/Y
C                                     Spherical earth model.
C
C INPUT FILES/PARAMETERS:        plon(), plat() - input polyline arrays
C                                nin            - number of input points
C
C GLOBAL VARIABLES:              clat,clon      - map center lat,lon
C                                cclat,sclat    - cos,sin of center lat
C                                xrnm           - map half width, nm
C                                wmrad          - earth radius, world units
C                                xrad           - screen radius, world units
C                                xoffs, yoffs   - display offset, world units
C
C OUTPUT FILES/PARAMETERS:       x(),y()        - output polyline arrays
C                                nout           - number of output points
C                                invali         - flag for last input point
C                                orhalt         - view point altitude, nm
C                                orhc           - earth center to viewpoint
C                                cosERM         - cos of max value for arc er
C                                radmax         - horizon dist. in proj. plane
C
C SUBROUTINES CALLED:            None.
C
C CALLED BY:                     lltoxy, llplxy
C
C LOCAL VARIABLES:               cosER          - cos of tangency to point arc.
C
C RESTRICTIONS:
C
C ABNORMAL RETURN CONDITIONS:    Declares points over the horizon invalid.
C                                and places output values on the horizon.
C LOCATION:
C
C PROGRAMMER:                    DATE OF LAST CHANGE    REASON FOR CHANGE
C     DAVE NATION                                       ORIGINAL CODE.
C     JERRY FENERTY                                     DOCUMENTATION AND MO
C                                                       FOR A21 PROTOTYPE.
C     Tom Wescott  (NOSC)        Jan 87                 Optimization, add invali.
C     Tom Wescott                Jul 87                 Clamp ivalids to horizon.
C
C-*-*-*-*-*-*-*-*-*-*-*-*-*-*-*-*-*-*-*-*-*-*-*-*-*-*-*-*-*-*-*-*-*-*-*|*-*-*-*-

        subroutine pxpers(plon,plat,nin,x,y,nout)
c
        common /center/ clat,clon,cclat,sclat
        common /pie/ pie,tpie,pio2,pio4
        common /viewp/ xrad,yrad,ixnp,iynp,xc,yc
        common /const/ maxval,rmpv,c,r,ernm
```

```
      logical invali,notlst
      common /invali/ invali
      common /proj/ itproj,wmrad,xoffs,yoffs,scalr,notlst
      common /pers/ orhalt,orhc,pconst,cosERM,radmax
      real plat(*), plon(*), x(*), y(*)
      parameter (ALTMAX = 99999.)
c
c
c---------------------- INITIALIZATION SECTION--------------------------
      if (notlst) then
c        Skip calculation of map constants.
      else
         notlst = .true.
c
c        Calculate view point altitude in nm based on wmrad.
         xrnm = ernm*xrad/wmrad
         ermax = xrnm/ernm
         if (ermax.ge.pio2) ermax = pio2 - .00001
         orhalt = ernm/cos(ermax) - ernm
         orhalt = amin1(orhalt,ALTMAX)
c
c        Calculate all map constants based on altitude.
c        Distance from view point to earth center in world units.
         worhal = orhalt*wmrad/ernm
         orhc = wmrad + worhal
         pconst = wmrad*(orhc+wmrad)
c
c        Cosine of center to horizon arc distance.
         cosERM = -wmrad/orhc
c
c        Radius of horizon circle on far side projection plane.
         ahmax = asin(wmrad/orhc)
         radmax = (orhc + wmrad)*(tan(ahmax))
c
c        Scale factor to view full world.
         if (yrad.lt.xrad) then
            scalr = yrad/radmax
         else
            scalr = xrad/radmax
         endif
      endif
c
c----------------------- COMPUTATION SECTION --------------------------
      nout = 0
      do 100 i = 1, nin
c
         invali = .false.
         sinL1 = sin(plat(i))
         cosL1 = cos(plat(i))
         Dlo = plon(i) - clon + pie
         sinDlo = sin(Dlo)
         cosDlo = cos(Dlo)
c
c        Calculate arc distance from center point to point (plon,plat).
         cosER = -sclat*sinL1 + cclat*cosL1*cosDlo
c
c        Calculate output point on plane of projection.
         const = pconst/(orhc+wmrad*cosER)
         rx = -const*cosL1*sinDlo
         ry = const*(cclat*sinL1+sclat*cosL1*cosDlo)
c
         if (cosER.Gt.cosERM) then
            invali = .true.
c
c           A radial clip is required to properly handle polygons
c           which cross the horizon.  For now, approximate this by
c           moving over the horizon points back to the horizon.
c           This will minimize thru the earth visibility, and
c           artifacts from otherwise unplotted invalid verticies.
c
            radius = sqrt(rx*rx + ry*ry)
            if (radius .ne. 0.0) then
               rmult = radmax/radius
               rx = rx*rmult
```

```
                ry = ry*rmult
             else
                go to 100
             endif
c
          endif
c
c         Apply viewing transformation.
          nout = nout + 1
          x(nout) = rx*scalr + xoffs
          y(nout) = ry*scalr + yoffs
c
 100   continue
c
       return
       end


C+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                     PXPOLY
C
C FUNCTIONAL DESCRIPTION:           POLYCONIC PROJECTION INTO X/Y
C                                      Elliptical earth model.
C
C INPUT FILES/PARAMETERS:        plon(), plat() - input polyline arrays
C                                nin            - number of input points
C
C GLOBAL VARIABLES:              clat,clon      - map center lat,lon
C                                wmrad          - earth radius, world units
C                                xoffs, yoffs   - display offset, world units
C
C OUTPUT FILES/PARAMETERS:       x(),y()        - output polyline arrays
C                                nout           - number of valid output points
C                                invali         - flag for last input point
C                                ap,bp,cp,dp,ep - transformation constants
C
C SUBROUTINES CALLED:            None.
C
C CALLED BY:                      llplxy
C
C LOCAL VARIABLES:               aaxix          - major axis of spheriod, m
C                                baxis          - minor axis, m
C
C RESTRICTIONS:                  Initial call must be with:   notlst = .false.
C
C ABNORMAL RETURN CONDITIONS:    Invalid returned for pts. near far pole.
C
C REFERENCE:                     CAM Program Documentation   CIA 1986
C
C PROGRAMMER:                    DATE OF LAST CHANGE      REASON FOR CHANGE
C     Tom Wescott                Feb 88                   Original entry.
C
C-*-*-*-*-*-*-*-*-*-*-*-*-*-*-*-*-*-*-*-*-*-*-*-*-*-*-*-*-*-*-*-*-*-*-*-*|*-*-*-*-

      subroutine PXPOLY(plon,plat,nin,x,y,nout)
c
      common /pie/ pie,tpie,pio2,pio4
      logical invali,notlst
      common /invali/ invali
      common /proj/ itproj,wmrad,xoffs,yoffs,scalr,notlst
      common /poly/ ap,bp,cp,dp,ep,e2,aaxis,baxis
      common /center/clat,clon,cclat,sclat
      real plat(*), plon(*), x(*), y(*)
c
c------------------- INITIALIZATION SECTION------------------------
      if (notlst) then
c        Skip calculation of map constants.
      else
         notlst = .true.
c
c        From Int'l Astronomical Union figure of the earth (1968)
         aaxis = 1.00111887
         baxis = 0.99776226
c
```

```
        e2 = (aaxis**2.0-baxis**2.0)/(aaxis**2.0)
        an1 = (aaxis-baxis)/(aaxis+baxis)
        an2 = an1*an1
        an3 = an2*an1
        an4 = an3*an1
        an5 = an4*an1
c
        ap = aaxis*(1.0 - an1 + 5./4.*(an2-an3) + 81./64.*(an4-an5))
        bp = 3.0/2.0*aaxis*(an1 - an2 + 7./8.*(an3-an4) + 55./64.*an5)
        cp = 15./16.*aaxis*(an2 - an3 + 3./4.*(an4-an5))
        dp = 35./48.*aaxis*(an3 - an4 + 11./16.*an5)
        ep = 315./512.*aaxis*(an4 - an5)
c
        scalr = wmrad
      endif
c
c------------------- COMPUTATIONAL SECTION------------------------
      nout = 0
      do 100 n = 1, nin
c
         invali = .false.
         ptlat = plat(n)
         absLat = abs(plat(n))
         delf = clon - plon(n)
         if (abs(delf).gt.pie) delf = delf - sign(tpie,delf)
         absDel = abs(delf)
         s = (ap*absLat-bp*sin(2.0*absLat)+cp*sin(4.*absLat)
     &         -dp*sin(6.*absLat) + ep*sin(8.*absLat))
         rh = aaxis/(1.0-e2*sin(2.0*absLat))
c
         if (ptlat.ne.0) then
            theta = absDel*sin(absLat)
            xl = rh*cos(absLat)/sin(absLat)
            ry = s + 2.0*xl*(sin(theta/2.0))**2.0
            rx = xl*sin(theta)
         else
            ry = 0.0
            rx = aaxis*absDel
         endif
c
c        Give proper signs to rx and ry.
         rx = -sign(rx,delf)
         ry = sign(ry,ptlat)
c
c        Apply viewing transformation.
         nout = nout + 1
         x(nout) = rx*scalr + xoffs
         y(nout) = ry*scalr + yoffs
c
 100  continue
c
      return
      end


C+*+*+*+*+*+*+*+*+*+*+*+*+*+*+*+*+*+*+*+*+*+*+*+*+*+*+*+*+*+*+*+*+*+*|*+*+*+*+
C UNIT NAME:                   PXPOST
C
C FUNCTIONAL DESCRIPTION:       POLAR STEREOGRAPHIC PROJECTION INTO X/Y
C                                      Elliptical earth model.
C
C INPUT FILES/PARAMETERS:      plon(), plat() - input polyline arrays
C                              nin            - number of input points
C
C GLOBAL VARIABLES:            clat,clon      - map center lat,lon
C                              wmrad          - earth radius, world units
C                              eccen          - earth eccentricity
C                              xoffs, yoffs   - display offset, world units
C
C OUTPUT FILES/PARAMETERS:     x(),y()        - output polyline arrays
C                              nout           - number of valid output points
C                              invali         - flag for last input point
C
C SUBROUTINES CALLED:          None.
C
C CALLED BY:                   lltoxy, llplxy
```

```
C
C LOCAL VARIABLES:             cosER         - cos of arc from cntr to point.
C                              spolat        - sin of near pole latitude.
C
C RESTRICTIONS:                None.
C
C ABNORMAL RETURN CONDITIONS:  Last points > 170 from center flagged invalid.
C
C PROGRAMMER:                  DATE OF LAST CHANGE    REASON FOR CHANGE
C     Tom Wescott  (NOSC)      Jan 87                 Initial entry.
C
C-*-*-*-*-*-*-*-*-*-*-*-*-*-*-*-*-*-*-*-*-*-*-*-*-*-*-*-*-*-*-*-*-*-*-*-*-*|*-*-*-*-

      subroutine PXPOST(plon,plat,nin,x,y,nout)
c
      common /center/ clat,clon,cclat,sclat
      logical invali,notlst
      common /invali/ invali
      common /proj/ itproj,wmrad,xoffs,yoffs,scalr,notlst
      real plat(*), plon(*), x(*), y(*)
      parameter (COSHZN = -0.985)
c
c
      if (notlst) then
c        Skip calculation of constants.
      else
         notlst = .true.
         scalr = wmrad
      endif
c
      efactr = 1.0
      nout = 0
      do 100 i = 1, nin
c
         invali = .false.
         sinL1 = sin(plat(i))
         cosL1 = cos(plat(i))
         Dlo = plon(i) - clon
         spolat = sign(1.0,clat)
c
c        Calculate arc from map center to point (plon,plat).
         cosER = spolat*sinL1
c
         if (cosER.le.COSHZN) then
            invali = .true.
         else
c           Calculate output point on plane of projection.
            if (eccen.ne.0.0) then
c              Calculate eccentricity factor.
               esinl = eccen*sinL1
               efactr = ((1.0-esinl)/(1.0+esinl))**(eccen/2.0)
            endif
            const = (2.0*efactr)/(1.0+cosER)
            rx = const*cosL1*sin(Dlo)
            ry = const*(-spolat*cosL1*cos(Dlo))
c
c           Apply viewing transformation.
            nout = nout + 1
            x(nout) = rx*scalr + xoffs
            y(nout) = ry*scalr + yoffs
         endif
c
 100  continue
c
      return
      end

C+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                   PXSINU
C
C FUNCTIONAL DESCRIPTION:         SINUSOIDAL PROJECTION INTO X/Y
C                                    spherical earth model.
C
```

```
C INPUT FILES/PARAMETERS:       plon(), plat() - input polyline arrays
C                               nin            - number of input points
C
C GLOBAL VARIABLES:             clat,clon      - map center lat,lon
C                               cclat,sclat    - cos,sin of center lat
C                               pio2           - multiple of pi
C                               wmrad          - earth radius, world units
C                               xoffs, yoffs   - display offset, world units
C
C OUTPUT FILES/PARAMETERS:      x(),y()        - output polyline arrays
C                               nout           - number of valid output points
C                               invali         - flag for last input point
C
C SUBROUTINES CALLED:           None.
C
C CALLED BY:                    lltoxy, llplxy
C
C LOCAL VARIABLES:              None.
C
C RESTRICTIONS:                 None.
C
C ABNORMAL RETURN CONDITIONS:   Invalid flag set for pts. at poles.
C
C LOCATION:
C
C PROGRAMMER:                   DATE OF LAST CHANGE      REASON FOR CHANGE
C     Tom Wescott   (NOSC)      Jan 87                   Original entry
C
C-*-*-*-*-*-*-*-*-*-*-*-*-*-*-*-*-*-*-*-*-*-*-*-*-*-*-*-*-*-*-*-*-*-*-*-*-*|*-*-*-*-

        subroutine PXSINU(plon,plat,nin,x,y,nout)
c
        common /center/ clat,clon,cclat,sclat
        common /pie/ pie,tpie,pio2,pio4
        logical invali,notlst
        common /invali/ invali
        common /proj/ itproj,wmrad,xoffs,yoffs,scalr,notlst
        real plat(*), plon(*), x(*), y(*)
c
c
        if (notlst) then
c          Skip calculation of map constant.
        else
           notlst = .true.
           scalr = wmrad
        endif
c
        nout = 0
        do 100 i = 1, nin
c
           invali = .false.
           if (abs(plat(i)).gt.pio2) then
              invali = .true.
           else
              rx = plon(i) - clon
              if (abs(rx).gt.pie) rx = rx - sign(tpie,rx)
              rx = cos(plat(i))*rx
              ry = plat(i) - clat
c
c             Apply viewing transformation.
              nout = nout + 1
              x(nout) = rx*scalr - xoffs
              y(nout) = ry*scalr - yoffs
           endif
c
 100    continue
c
        return
        end


C+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    PXSTER
C
```

```
C FUNCTIONAL DESCRIPTION:         STEREOGRAPHIC PROJECTION INTO X/Y
C                                      Spherical earth model.
C
C INPUT FILES/PARAMETERS:      plon(), plat() - input polyline arrays
C                              nin            - number of input points
C
C GLOBAL VARIABLES:            clat,clon      - map center lat,lon
C                              cclat,sclat    - cos,sin of center lat
C                              wmrad          - earth radius, world units
C                              xoffs, yoffs   - display offset, world units
C
C OUTPUT FILES/PARAMETERS:     x(),y()        - output polyline arrays
C                              nout           - number of valid output points
C                              invali         - flag for last input point
C
C SUBROUTINES CALLED:          none.
C
C CALLED BY:                   lltoxy, llplxy, blplgn, blplin
C
C LOCAL VARIABLES:             er             - arc from center to point
C
C RESTRICTIONS:                None.  All input points are converted.
C
C ABNORMAL RETURN CONDITIONS:  Last points > 170 from center flagged invalid.
C                              Points very close to the antipode are nudged.
C LOCATION:
C
C PROGRAMMER:                  DATE OF LAST CHANGE     REASON FOR CHANGE
C     Tom Wescott  (NOSC)      Jan 87                  Initial entry.
C
C-*-*-*-*-*-*-*-*-*-*-*-*-*-*-*-*-*-*-*-*-*-*-*-*-*-*-*-*-*-*-*-*-*-*|*-*-*-*-

        subroutine PXSTER(plon,plat,nin,x,y,nout)
c
        common /center/ clat,clon,cclat,sclat
        logical invali,notlst
        common /invali/ invali
        common /proj/ itproj,wmrad,xoffs,yoffs,scalr,notlst
        real plat(*), plon(*), x(*), y(*)
        parameter (COSHZN = -0.984)
        parameter (ANTIPO = -.999999)
c
c
        if (notlst) then
c          Skip calculation of map constant.
        else
           notlst = .true.
           scalr = wmrad
        endif
c
        nout = 0
        do 100 i = 1, nin
c
           invali = .false.
           sinL1 = sin(plat(i))
           cosL1 = cos(plat(i))
           Dlo = plon(i)-clon
           sinDlo = sin(Dlo)
           cosDlo = cos(Dlo)
c
c          Calculate arc from map center to point (plon,plat).
           cosER = sclat*sinL1 + cclat*cosL1*cosDlo
           if (cosER .le. COSHZN)  invali = .true.
c
c          Insure that all points can be calculated.
           cosER = amax1(cosER,ANTIPO)
c
c          Calculate output point on plane of projection.
           const = 2.0/(1.0+cosER)
           rx = const*cosL1*sinDlo
           ry = const*(cclat*sinL1-sclat*cosL1*cosDlo)
c
c          Apply viewing transformation.
           nout = nout + 1
           x(nout) = rx*scalr + xoffs
           y(nout) = ry*scalr + yoffs
```

```
c
 100    continue
c
        return
        end


C+++++++++++++++++++++++++++++++++++++++++++++++++++++++++++++++++++++++|+++++++
C UNIT NAME:                        PXUTMZ
C
C FUNCTIONAL DESCRIPTION:           UNIVERSAL TRANSVERSE MERCATOR INTO X/Y
C                                        Elliptical earth model.
C
C INPUT FILES/PARAMETERS:           plon(), plat() - input polyline arrays
C                                   nin            - number of input points
C
C GLOBAL VARIABLES:                 clat,clon      - map center lat,lon
C                                   wmrad          - earth radius, world units
C                                   xoffs, yoffs   - display offset, world units
C
C OUTPUT FILES/PARAMETERS:          x(),y()        - output polyline arrays
C                                   nout           - number of valid output points
C                                   invali         - flag for last input point
C                                   ap,bp,cp,dp,ep - transformation constants
C
C SUBROUTINES CALLED:               None.
C
C CALLED BY:                         llplxy
C
C LOCAL VARIABLES:                  aaxix        - major axis of spheriod, m
C                                   baxis        - minor axis, m
C
C RESTRICTIONS:                     None.
C
C ABNORMAL RETURN CONDITIONS:       Invalid returned for pts. at new poles.
C
C REFERENCE:                        CAM Program Documentation   CIA 1986
C
C PROGRAMMER:                       DATE OF LAST CHANGE     REASON FOR CHANGE
C     Tom Wescott                   Feb 88                  Original entry.
C
C-*-*-*-*-*-*-*-*-*-*-*-*-*-*-*-*-*-*-*-*-*-*-*-*-*-*-*-*-*-*-*-*-*-*-*-*|*-*-*-*-

      subroutine PXUTMZ(plon,plat,nin,x,y,nout)
c
      common /pie/ pie,tpie,pio2,pio4
      logical invali,notlst
      common /invali/ invali
      common /proj/ itproj,wmrad,xoffs,yoffs,scalr,notlst
      common /utmz/ ap,bp,cp,dp,ep,e2,ep2,aaxis,baxis,cmerid,zone
      common /center/clat,clon,cclat,sclat
      real plat(*), plon(*), x(*), y(*)
      parameter (HILAT=1.5709)
c
c
c------------------- INITIALIZATION SECTION-----------------------
      if (notlst) then
c        Skip calculation of map constants.
      else
         notlst = .true.
c
c        Calculate UTM zone and its central meridian.
         zwidth = tpie/60.0
         zone = 1.0 + int((clon+pie)/zwidth)
         cmerid = zwidth*(zone-0.5) - pie
c
c        From Int'l Astronomical Union figure of the earth (1968)
         aaxis = 1.00111887
         baxis = 0.99776226
c
         ep2 = (aaxis**2.0-baxis**2.0)/(baxis**2.0)
         e2 = (aaxis**2.0-baxis**2.0)/(aaxis**2.0)
         an1 = (aaxis-baxis)/(aaxis+baxis)
         an2 = an1*an1
```

```
          an3 = an2*an1
          an4 = an3*an1
          an5 = an4*an1
c
          ap = aaxis*(1.0 - an1 + 5./4.*(an2-an3) + 81./64.*(an4-an5))
          bp = 3.0/2.0*aaxis*(an1 - an2 + 7./8.*(an3-an4) + 55./64.*an5)
          cp = 15./16.*aaxis*(an2 - an3 + 3./4.*(an4-an5))
          dp = 35./48.*aaxis*(an3 - an4 + 11./16.*an5)
          ep = 315./512.*aaxis*(an4 - an5)
          zkphi = .9996
c
          scalr = wmrad
       endif
c
c-------------------- COMPUTATIONAL SECTION------------------------
       nout = 0
       do 100 n = 1, nin
c
          invali = .false.
          delf = cmerid - plon(n)
          if (delf.gt.pie) delf = delf - sign(tpie,delf)
          absDel = abs(delf)
          ptlat = plat(n)
          absLat = abs(ptlat)
c
c         Exact position of poles is too hard to calculate by series.
          absLat = amin1(absLat,HILAT)
c
          if ((absLat.eq.0.0).and.(absDel.eq.pio2)) then
c            Point at a new pole is undefined.
             invali = .true.
          else if (absDel.gt.pio2*1.3) then
c            Problems exist near cmerid + 180.  Until they are resolved...
             invali = .true.
          else
             sinAl = sin(absLat)
             sinAl2 = sinAl*sinAl
             cosAl = cos(absLat)
             cosAl2 = cosAl*cosAl
             cosAl3 = cosAl*cosAl2
             cosAl4 = cosAl*cosAl3
             cosAl5 = cosAl*cosAl4
             tanAl2 = tan(absLat)**2.0
             tanAl4 = tanAl2*tanAl2
c
             s = zkphi*(ap*absLat-bp*sin(2.0*absLat)+cp*sin(4.*absLat)
     +           -dp*sin(6.*absLat)+ep*sin(8.*absLat))
c
             ve = aaxis/sqrt(1.0-e2*sinAl2)
c
             sr = ve/2.0*sinAl*cosAl*zkphi
c
             st = ve*sinAl*cosAl3*(5.0-tanAl2+9.0*
     +            ep2*cosAl2+4.0*ep2*ep2*cosAl4)*zkphi/24.0
c
             su = ve*cosAl*zkphi
c
             sv = ve/6.0*cosAl3*(1.0-tanAl2+ep2*cosAl2)*zkphi
c
             sa = absDel**6.0/720.0*ve*sinAl*cosAl5*(61.0-58.0*tanAl2
     +            +tanAl4+270.0*ep2*cosAl2-330.0*ep2*sinAl2)*zkphi
c
             sb = absDel**5.0/120.0*ve*cosAl5*(5.0-18.0*tanAl2+tanAl4
     +            +14.0*ep2*cosAl2-58.0*ep2*sinAl2)*zkphi
c
c
             rx = su*absDel + sv*absDel**3.0 + sb
             rx = -sign(rx,delf)
c
             ry = s + sr*absDel**2.0 + st*absDel**4.0 + sa
             ry = sign(ry,ptlat)
c
c            Apply viewing transformation.
             nout = nout + 1
```

```
          x(nout) = rx*scalr + xoffs
          y(nout) = ry*scalr + yoffs
        endif
c
 100  continue
c
      return
      end


C+++++++++++++++++++++++++++++++++++++++++++++++++++++++++++++++++++|+++++++
C UNIT NAME:                       PXVDGN
C
C FUNCTIONAL DESCRIPTION:             VAN DER GRINTEN I PROJECTION INTO X/Y
C                                        spherical earth model.
C
C INPUT FILES/PARAMETERS:          plon(), plat() - input polyline arrays
C                                  nin            - number of input points
C
C GLOBAL VARIABLES:                clat,clon      - map center lat,lon
C                                  cclat,sclat    - cos,sin of center lat
C                                  pio2           - multiple of pi
C                                  wmrad          - earth radius, world units
C                                  xoffs, yoffs   - display offset, world units
C
C OUTPUT FILES/PARAMETERS:         x(),y()        - output polyline arrays
C                                  nout           - number of valid output points
C                                  invali         - flag for last input point
C
C SUBROUTINES CALLED:              None.
C
C CALLED BY:                       lltoxy, llplxy
C
C LOCAL VARIABLES:                 None.
C
C RESTRICTIONS:                    None.
C
C ABNORMAL RETURN CONDITIONS:  Invalid flag set for pts. at poles.
C
C REFERENCE:                       NOAA/USGS map projection package   version 1.0.2
C
C PROGRAMMER:                      DATE OF LAST CHANGE     REASON FOR CHANGE
C     Tom Wescott  (NOSC)          Jun 89                  Original entry
C
C-*-*-*-*-*-*-*-*-*-*-*-*-*-*-*-*-*-*-*-*-*-*-*-*-*-*-*-*-*-*-*-*-*-*|*-*-*-*-
c       not in 3.0, not yet used in 3.1
CTESTING        subroutine pxsinu(plon,plat,nin,x,y,nout)
        subroutine pxvdgn(plon,plat,nin,x,y,nout)
c
        common /center/ clat,clon,cclat,sclat
        common /pie/ pie,tpie,pio2,pio4
        logical invali,notlst
        common /invali/ invali
        common /proj/ itproj,wmrad,xoffs,yoffs,scalr,notlst
        real plat(*), plon(*), x(*), y(*)
        real lat,lon,m,m2
c
        parameter(SAFETY = 1.0E-5, EQTORL = 1.0E-2)
c
        if (notlst) then
c          Skip calculation of map constant.
        else
           notlst = .true.
           scalr = wmrad
        endif
c
        nout = 0
        do 100 i = 1, nin
c
           invali = .false.
           lat = plat(i)
           lon = plon(i) - clon
           if (abs(lon).gt.pie) lon = lon - sign(tpie,lon)

           if (abs(plat(i)).gt.pio2) then
              invali = .true.
```

```
          else
             theta = asin(abs(lat/pio2))
             if (abs(plat(i)).lt.EQTORL) then
c               Near equatorial case, use rectangular approximation.
                rx =  lon
                ry =  lat
             else if ((abs(lon).lt.SAFETY).or.
     +          ((pio2-abs(lat)).lt.SAFETY)) then
c               Central meridian case, use Tom's guess approximation.
                rx = lon * (cos(lat))**.33
                ry = pie  * sign(tan(0.5*theta),lat)
             else
c               Ordinary case.
                al = .5 * abs(pie/lon - lon/pie)
                a2 = al * al
                sinTHT = sin(theta)
                cosTHT = cos(theta)
                g = cosTHT/(sinTHT + cosTHT - 1.0)
                g2 = g * g
                m = g * (2.0/sinTHT - 1)
                m2 = m * m
                square = abs(a2*(g-m2)**2 - (m2+a2)*(g2-m2))
                con = pie * (al * (g-m2) + sqrt(square)) / (m2+a2)
                rx = sign(con,lon)
                con = abs(con/pie)
                square = abs(1.0 - con*con - 2.0*al*con)
                ry = sign(pie*sqrt(square),lat)
             endif
c
c            Apply viewing transformation.
             nout = nout + 1
             x(nout) = rx*scalr - xoffs
             y(nout) = ry*scalr - yoffs
          endif
c
 100    continue
c
        return
        end

C+*+*+*+*+*+*+*+*+*+*+*+*+*+*+*+*+*+*+*+*+*+*+*+*+*+*+*+*+*+*+*+*+*+*+*+*+*+|*+*+*+*+
C UNIT NAME:                    RNGRIN
C
C FUNCTIONAL DESCRIPTION:       Draws range rings/radials about selected point.
C
C INPUT FILES/PARAMETERS:       rrlon,rrlat - center lon,lat
C                               ixrnm       - range (radius) in nm
C                               nrings      - # rings
C                               nlines      - # radial lines
C
C GLOBAL VARIABLES:             None.
C
C OUTPUT FILES/PARAMETERS:      Graphic segment.
C
C SUBROUTINES CALLED:
C
C CALLED BY:                    ranger
C
C LOCAL VARIABLES:
C
C RESTRICTIONS:                 Currently does not redraw like other overlays
C                               as ring data are not saved in parameter file.
C
C PROGRAMMER:                   DATE OF LAST CHANGE     REASON FOR CHANGE
C     Tom Wescott (NOSC)        Jul 88                  Original entry.
C     L. McCleary (NOSC)        Mar 89                  Seperate routine
C
C-*-*-*-*-*-*-*-*-*-*-*-*-*-*-*-*-*-*-*-*-*-*-*-*-*-*-*-*-*-*-*-*-*-*-*-*-*-|*-*-*-*-
c
      subroutine  rngrin (rrlon,rrlat,ixrnm,nrings,nlines)

      logical first
      common /pie/ pie,tpie,pio2,pio4
```

```
      common /viewp/ xrad,yrad,ixnp,iynp,xc,yc

      parameter (MAXPTS = 361)
      real plon(MAXPTS),plat(MAXPTS)

      data rrincr/.01745329/

c     User input is in nm, convert to radians.
      rrincr = ixrnm*(1./60.)*(pie/180.)

c     Draw the range rings.
      rngmax = amin1(pie,nrings*rrincr)
      lastrr = rngmax/rrincr + 0.5
      do 500 irng = 1, lastrr
         rngrad = irng * rrincr
c
c        Test ring radius a few places and calculate central
c        angle that keeps cord to arc distance below map resolution.
         radius = 0.0
         do 200 itest = 0, 3
            tstaz = pio4*(itest) + .001
            call da2ll(rrlat,rrlon,rngrad,tstaz,rtlat,rtlon)
            call llplxy(rtlon,rtlat,1,rtx,rty,nout)
            tstrad = sqrt((rrx-rtx)**2.+(rry-rty)**2.)
            radius = amax1(tstrad,radius)
 200     continue
c
         resolu = .001*xrad
         arg = 1.0 - resolu/radius
         if (abs(arg).gt.1.0) arg = sign(1.0,arg)
         deltaz = acos(arg)
         deltaz = amax1(deltaz,tpie/360.)
         deltaz = amin1(deltaz,tpie/8.)
c
         npts = 1.0 + tpie/deltaz
         azincr = tpie/(npts-1)

         ipt = 1
         first = .true.
         do 400 i = 1, npts
            az = (i + 0.6) * azincr
            call da2ll(rrlat,rrlon,rngrad,az,plat(ipt),plon(ipt))
            dlo = abs(plon(ipt)-prevlo)
            if((dlo.gt.pie*.1).and.(dlo.lt.pie*1.9).and.
     +         (.not.first))then
c              Crossed near a pole where with several projections, higher point
c              density is reqd.   To avoid artifacts, process ring in sections.
               call blplin(plon,plat,ipt-1)
               plat(1) = plat(ipt)
               plon(1) = plon(ipt)
               ipt = 1
               first = .true.
            else
               first = .false.
            endif
            prevlo = plon(ipt)
            ipt = ipt + 1
            if (ipt.gt.maxpts) go to 401
 400     continue
 401     continue
         call blplin(plon,plat,ipt-1)
 500  continue
c
c     Draw a few polylines along lines of bearing.
      dincr = pie/90.0
      dincr = amin1(dincr,0.5*rrincr)
      rngmax = (nrings + 1) * rrincr - dincr
      rngmax = amin1(rngmax,pie)
      do 700 line = 1, nlines
         az = line * tpie/nlines
         npts = rngmax/dincr + 0.5
         ipt = 1
         first = .true.
         do 600 i = 1, npts
```

```
          dist = i * dincr
          call da2ll(rrlat,rrlon,dist,az,plat(ipt),plon(ipt))
          dlo = abs(plon(ipt)-prevlo)
          if((dlo.gt.pie*.1).and.(dlo.lt.pie*1.9).and.
     +       (.not.first))then
c            Crossed near a pole.  Process line of bearing in sections.
             call blplin(plon,plat,ipt-1)
             plat(1) = plat(ipt)
             plon(1) = plon(ipt)
             ipt = 1
             first = .true.
          else
             first = .false.
          endif
          prevlo = plon(ipt)
          ipt = ipt + 1
          if (ipt.gt.maxpts) go to 601
 600   continue
 601   continue
       call blplin(plon,plat,ipt-1)
 700  continue

      return
      end


C+*+*+*+*+*+*+*+*+*+*+*+*+*+*+*+*+*+*+*+*+*+*+*+*+*+*+*+*+*+*+*+*+*|*+*+*+*+
C UNIT NAME:                  SPGCVX
C
C FUNCTIONAL DESCRIPTION:     Test for convex property in spherical polygons.
C
C INPUT FILES/PARAMETERS:     plo, pla  - Vertex coordinate arrays, lon,lat.
C                             plen      - Number of verticies.
C
C OUTPUT FILES/PARAMETERS:    convex    - Returned true if polygon is convex.
C
C SUBROUTINES CALLED:         ll2da.
C
C RESTRICTIONS:               Polygons must span less than one hemisphere.
C
C PROGRAMMER:                 DATE OF LAST CHANGE      REASON FOR CHANGE
C     Tom Wescott (NOSC)      Feb 89                   Original entry.
C
C-*-*-*-*-*-*-*-*-*-*-*-*-*-*-*-*-*-*-*-*-*-*-*-*-*-*-*-*-*-*-*-*-*-*|*-*-*-*-
c       not in 3.0, not yet used in 3.1
      subroutine spgcvx(plo,pla,plen,convex)
C
      common /pie/ pie,tpie,pio2,pio4
      integer plen
      real plo(plen),pla(plen)
      logical convex
C
C      pie = 2.0*acos(0.0)                                   !_TESTING
C      tpie = 2.0*pie                                        !_TESTING
      convex = .true.
      if (plen.le.3) return
      hemi = 0.0
C
      do 200 n = 1, plen
         i = n+1
         if (i.gt.plen) i = 1
C
C        Define hemispheres by great circle from vertex n to vertex i.
         call ll2da(pla(n),plo(n),pla(i),plo(i),dist,az1,rng,bear)
         if (dist.gt.0.0) then
C
            do 100 jj = i+1, i+plen-1
               j = jj
               if (j.gt.plen) j = j-plen
C
               call ll2da(pla(n),plo(n),pla(j),plo(j),dist,az2,rng,bear)
               if (dist.ne.0.0) then
                  azrel = az2 - az1
                  if (abs(azrel).gt.pie) azrel = azrel-sign(tpie,azrel)
                  if (azrel.ne.0.0) then
C
```

```
                  if (hemi.eq.0.0) then
C                    Init hemisphere by first point.
                     hemi = sign(1.0,azrel)
                  else
C                    Look for any point in opposite hemisphere.
                     hhemi = sign(1.0,azrel)
                     if (hhemi.ne.hemi) then
                        convex = .false.
                        RETURN
                     endif
                  endif
C
               endif
            endif
 100     continue
      endif
 200  continue
C
      return
      end


C+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    SPGINT
C
C FUNCTIONAL DESCRIPTION:       Flags the intersection of two spherical polygons
C                               by looking for intersection between great circle
C                               segments of one polygon and those of the other.
C                               If none found, it checks for containment.
C
C INPUT FILES/PARAMETERS:       xlo(),yla()  - Polygon #1. (lon,lat), radians.
C                               ulo(),vla()  - Polygon #2.     "        "
C                               nvrt1,nvrt2  - Number of verticies in polygons.
C
C OUTPUT FILES/PARAMETERS:      isect        - .true. if intersection exists.
C
C SUBROUTINES CALLED:           ll2da, spgtst
C
C LOCAL VARIABLES:              H1,H2..      - Sign of Hn identifies half sphere
C                                              containing pt. n.   Half sphere is
C                                              defined (+/-) as (L/R) of a directed
C                                              great circle segment.
C RESTRICTIONS:                 None.
C
C PROGRAMMER:                   DATE OF LAST CHANGE     REASON FOR CHANGE
C     Tom Wescott (NOSC)        Feb 89                  Original code.
C
C-*-*-*-*-*-*-*-*-*-*-*-*-*-*-*-*-*-*-*-*-*-*-*-*-*-*-*-*-*-*-*-*-*-*-*|*-*-*-*-
c       not in 3.0, not yet used in 3.1
      subroutine spgint(xlo,yla,nvrt1,ulo,vla,nvrt2,isect)
C
      real xlo(nvrt1),yla(nvrt1), ulo(nvrt2),vla(nvrt2)
      logical isect,inside
C
      pie = 2.0*acos(0.0)
      tpie = 2.0*pie
      isect = .true.
      H1 = 0.
C
      do 500 i = 1, nvrt1
         inxt = i + 1
         if (inxt.gt.nvrt1) inxt = 1
C
C        Azimuth (az0) of line segment i to inxt to defines half spheres.
         call ll2da(yla(i),xlo(i),yla(inxt),xlo(inxt),dist,az0,rng,bear)
C
C        Avoid processing of coincident sequential verticies.
         if (dist.le.0.0) go to 500
C
         do 400 j = 0, nvrt2
            jnxt = j + 1
            if (jnxt.gt.nvrt2) jnxt = 1
C
C           Find half sphere of the point jnxt of polygon 2.
```

```
            call ll2da(yla(i),xlo(i),vla(jnxt),ulo(jnxt),dst,azjnxt,r,b)
c
            if (dist.le.0.0) RETURN
            deltaz = azjnxt-az0
            if (abs(deltaz).gt.pie) deltaz = deltaz-sign(tpie,deltaz)
            H2 = sign(1.0,deltaz)
c
c           Did j to jnxt segment of polygon2 cross between half spheres?
            if ((H1.ne.H2).and.(jnxt.gt.1)) then
c
c              Intersection will be proven if segment of polygon 1 crosses
c              between half spheres defined by the segment of polygon 2.
               call ll2da(vla(j),ulo(j),vla(jnxt),ulo(jnxt),d,az20,r,b)
c
               call ll2da(vla(j),ulo(j),yla(i),xlo(i),d,az21,r,b)
               deltaz = az21-az20
               if (abs(deltaz).gt.pie) deltaz = deltaz-sign(tpie,deltaz)
               H21 = sign(1.0,deltaz)
c
               call ll2da(vla(j),ulo(j),yla(inxt),xlo(inxt),d,az22,r,b)
               deltaz = az22-az20
               if (abs(deltaz).gt.pie) deltaz = deltaz-sign(tpie,deltaz)
               H22 = sign(1.0,deltaz)

               if (H21.ne.H22) RETURN
            endif
c
            H1 = H2
 400     continue
c
 500  continue
c
c     If we haven't returned by now the polygon segments don't intersect.
c     Any polygon point inside the alternate polygon proves containment.
c
      call spgtst(xlo,yla,nvrt1,ulo(1),vla(1),inside,area)
      if (inside) RETURN
c
      call spgtst(ulo,vla,nvrt2,xlo(1),yla(1),inside,area)
      if (inside) RETURN
c
      isect = .false.
      return
      end


C+*+*+*+*+*+*+*+*+*+*+*+*+*+*+*+*+*+*+*+*+*+*+*+*+*+*+*+*+*+*+*+*+*+*+*+|*+*+*+*+
C UNIT NAME:                SPGRAD
C
C FUNCTIONAL DESCRIPTION:   Uses iteration to find the radius and center point
C                           for minumum bounding circle of a spherical polygon.
C
C INPUT FILES/PARAMETERS:   plat,plon   - Polygon vertex arrays, radians.
C                           nvrts       - # of verticies
C
C OUTPUT FILES/PARAMETERS:  radius      - Containment arc, radians
C                           cla,clo     - lat,lon of center, radians
C
C SUBROUTINES CALLED:       ll2da, da2ll
C
C LOCAL VARIABLES:          CONVRG      - Parameter determining the speed and
C                                         accuracy of convergence.  Use .7 to .99
C RESTRICTIONS:             None.
C
C PROGRAMMER:               DATE OF LAST CHANGE     REASON FOR CHANGE
C      Tom Wescott (NOSC)   Feb 89                  Original code.
C
C-*-*-*-*-*-*-*-*-*-*-*-*-*-*-*-*-*-*-*-*-*-*-*-*-*-*-*-*-*-*-*-*-*-*-*-|*-*-*-*-
c       not in 3.0, not yet used in 3.1
      subroutine spgrad(plon,plat,nvrts,radius,clo,cla)
c
      parameter (MAXIT = 1000)
      parameter (TOLER = .0001)
      parameter (CONVRG = .9)
```

```
      real plon(nvrts),plat(nvrts)
C
      clo = plon(1)
      cla = plat(1)
      do 300 iter = 1, MAXIT
         radius = 0.0
C        Find distance and azimuth to vertex farthest from center pt. guess.
         do 100 i = 1, nvrts
            call ll2da(cla,clo,plat(i),plon(i),dst,az,range,bering)
            if (dst.gt.radius) then
               radius = dst
               azim = az
            endif
 100     continue
C
C        Apply a correction in direction azim.
         prevlo = clo
         prevla = cla
         if (iter.eq.1) rjump = radius
         rjump = CONVRG*rjump
         call da2ll(prevla,prevlo,rjump,azim,cla,clo)
c
         if (rjump.lt.TOLER) go to 900
 300  continue
C
 900  continue
c
      return
      end


C+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                SPGTST
C
C FUNCTIONAL DESCRIPTION:   Spherical polygon utility.
C                           1)  Tests for point being inside the smaller of the
C                               two regions defined by a spherical polygon.
C                           2)  Computes area of the smaller region.
C                           3)  Sign of area identifies direction of traversal
C                               (+cw/-ccw) about the smaller region.
C
C INPUT FILES/PARAMETERS:   vlo, vla  - Vertex coordinate arrays, lon,lat.
C                           n         - Number of verticies.
C                           plo,pla   - Point to be tested.
C
C GLOBAL VARIABLES:         None.
C
C OUTPUT FILES/PARAMETERS:  inside    - Returned true if point is inside.
C                                       (Internally reflexed areas are inside).
C                                       (border points inside smaller region).
C                           area      - Polygon area on unit sphere, radians.
C
C SUBROUTINES CALLED:       ll2da.
C
C RESTRICTIONS:             None.
C
C PROGRAMMER:               DATE OF LAST CHANGE     REASON FOR CHANGE
C     Tom Wescott (NOSC)    Feb 89                  Original entry.
C
C-*-*-*-*-*-*-*-*-*-*-*-*-*-*-*-*-*-*-*-*-*-*-*-*-*-*-*-*-*-*-*-*-*-*-*|*-*-*-*-
c       not in 3.0
      subroutine spgtst(vlo,vla,n,plo,pla,inside,area)
C
      logical inside
      parameter (COINCI = 1.0E-5)
      dimension vlo(n),vla(n)

CD     write(*,*) 'SPGTST... test point lon,lat = ',plo,pla
CD     write(*,'(5(1X,F6.3))') (vlo(j),j=1,n)
CD     write(*,'(5(1X,F6.3))') (vla(j),j=1,n)
CD     write(*,*)
C
      pie = 2.0*acos(0.0)
      tpie = 2.0*pie
      totang = 0.0
      totare = 0.0
```

```
C
      do 200 lst = 0, n
         i = lst + 1
         if (i.gt.n) i = 1
C
C        Get azimuth and its reciprocal from test point to i-th vertex.
         call ll2da(pla,plo,vla(i),vlo(i),dist,azT2V,range,bering)
         call ll2da(vla(i),vlo(i),pla,plo,dist,azV2T,range,bering)
C        When points are coincident, must flip defined azimuth for reciprocal !
         if (dist.le.COINCI) azV2T = azT2V - sign(pie,azT2V)
C
         if (lst.gt.0) then
C           Totalize angle at test point angle between last and i-th verticies.
            angleT = azT2V - azT2L
            if (abs(angleT).gt.pie) angleT = angleT - sign(tpie,angleT)
            totang = totang + angleT
C
C           Get azimuth and its reciprocal from i-th vertex to last vertex.
            call ll2da(vla(i),vlo(i),vla(lst),vlo(lst),dist,azV2L,rng,b)
            call ll2da(vla(lst),vlo(lst),vla(i),vlo(i),dist,azL2V,rng,b)
            if (dist.le.COINCI) azL2V = azV2L - sign(pie,azV2L)
C
C           Calculate area of triangle TVL via its spherical excess.  Totalize.
            angleV = azV2L - azV2T
            if (abs(angleV).gt.pie) angleV = angleV - sign(tpie,angleV)
            angleL = azL2V - azL2T
            if (abs(angleL).gt.pie) angleL = angleL - sign(tpie,angleL)
            area = abs(angleT) + abs(angleV) + abs(angleL) - pie
            totare = totare + sign(area,angleT)
C
CD            WRITE(*,*)'AR,AN,TAR,TAN =',AREA,ANGLET,TOTARE,TOTANG
         endif
C
         azT2L = azT2V
         azL2T = azV2T
 200  continue
C
      area = totare
      inside = .true.
      if (abs(totang).lt.pie) inside = .false.
C
C     Reverse the results for polygons covering more than a half sphere.
      if (abs(totare).gt.tpie) then
         inside = .not.(inside)
         area = area - sign(4.0*pie,area)
      endif
C
CD     WRITE(*,*)'inside = ',inside,'  smaller area = ',area
      return
      end


C+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    XPAZEA
C
C FUNCTIONAL DESCRIPTION:       (X,Y) TO (LON,LAT) FOR AZIMUTHAL EQUAL AREA
C                                  Spherical earth model.
C
C INPUT FILES/PARAMETERS:       x,y            - map coordinates.
C
C GLOBAL VARIABLES :            clon, clat     - map center.
C                               scalr          - Map scale factor.
C                               xoffs, yoffs   - display offset, world units.
C
C OUTPUT FILES/PARAMETERS:      plat, plon     - geographic coordinates.
C                               invali         - Set true when pt. is off the
C                                                earth or at the antipode.
C
C SUBROUTINES CALLED:           da2ll
C
C CALLED BY:                    xytoll
C
C LOCAL VARIABLES:              az     - Azimuth of pt. x,y from map center.
C                               er     - Arc distance from map center to x,y.
```

```
C
C RESTRICTIONS:                 None.
C
C ABNORMAL RETURN CONDITIONS:   None.
C
C PROGRAMMER:                   DATE OF LAST CHANGE      REASON FOR CHANGE
C     Tom Wescott (NOSC)        Jan 87                   Initial entry.
C
C-*-*-*-*-*-*-*-*-*-*-*-*-*-*-*-*-*-*-*-*-*-*-*-*-*-*-*-*-*-*-*-*-*-*-*|*-*-*-*-
      subroutine xpazea(x,y,plon,plat)
c
      common /center/ clat,clon,cclat,sclat
      common /pie/ pie,tpie,poi2,pio4
      logical notlst,invali
      common /proj/ itproj,wmrad,xoffs,yoffs,scalr,notlst
      common /invali/ invali
c
c     Invert the viewing transformation.
      dx = (x-xoffs)/scalr
      dy = (y-yoffs)/scalr
c
c     Compute azimuth from map center.
      if ((dx.ne.0.0).or.(dy.ne.0.0)) az = atan2(dx,dy)
c
c     Compute arc distance from map center.
      ro2 = (sqrt(dx*dx+dy*dy))/2.0
      invali = .false.
      if (ro2.ge.1.0) then
c        Point is off the map.
         invali = .true.
      else
         er = 2.0*asin(ro2)
c        Convert to lat, lon
         call da2ll(clat,clon,er,az,plat,plon)
      endif
c
      return
      end
C+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    XPAZED
C
C FUNCTIONAL DESCRIPTION:       (X,Y) TO (LON,LAT) FOR AZIMUTHAL EQUIDISTANT
C                                   Spherical earth model.
C
C INPUT FILES/PARAMETERS:       x,y            - map coordinates.
C
C GLOBAL VARIABLES :            clon, clat     - map center.
C                               scalr          - Map scale factor.
C                               xoffs, yoffs   - display offset, world units.
C
C OUTPUT FILES/PARAMETERS:      plat, plon     - geographic coordinates.
C                               invali         - Set true when pt. is off the
C                                                earth or at the antipode.
C
C SUBROUTINES CALLED:           da2ll
C
C CALLED BY:                    xytoll
C
C LOCAL VARIABLES:              az     - Azimuth of pt. x,y from map center.
C                               er     - Arc distance from map center to x,y.
C
C RESTRICTIONS:                 None.
C
C ABNORMAL RETURN CONDITIONS:   None.
C
C PROGRAMMER:                   DATE OF LAST CHANGE      REASON FOR CHANGE
C     Tom Wescott (NOSC)        Jan 87                   Initial entry.
C
C-*-*-*-*-*-*-*-*-*-*-*-*-*-*-*-*-*-*-*-*-*-*-*-*-*-*-*-*-*-*-*-*-*-*-*|*-*-*-*-
      subroutine xpazed(x,y,plon,plat)
c
      common /center/ clat,clon,cclat,sclat
      common /pie/ pie,tpie,poi2,pio4
      logical notlst,invali
```

```
      common /proj/ itproj,wmrad,xoffs,yoffs,scalr,notlst
      common /invali/ invali
c
c     Invert the viewing transformation.
      dx = (x-xoffs)/scalr
      dy = (y-yoffs)/scalr
c
c     Compute azimuth from map center.
      if ((dx.ne.0.0).or.(dy.ne.0.0)) az = atan2(dx,dy)
c
c     Compute arc distance from map center.
      er = sqrt(dx*dx+dy*dy)
c
      invali = .false.
      if (er .ge. pie) then
c        Point is off the map.
         invali = .true.
      else
c        Convert to lat, lon
         call da2ll(clat,clon,er,az,plat,plon)
      endif
c
      return
      end


C+++++++++++++++++++++++++++++++++++++++++++++++++++++++++++++++++|+++++++
C UNIT NAME:                   xpgenr
C
C FUNCTIONAL DESCRIPTION:      GENERIC CONVERSION OF (X,Y) TO (LON,LAT)
C                              Solves a 2x2 system of nonlinear mapping
C                              equations to convert xy to ll on any well
C                              behaved projection.
C
C INPUT FILES/PARAMETERS:      xmap, ymap      - point on a map
C
C GLOBAL VARIABLES:            clat,clon       - map center lat,lon
C
C OUTPUT FILES/PARAMETERS:     plon(), plat() - geographic location of input point
C                              invali          - flag for bad input point
C
C SUBROUTINES CALLED:          nrsyst
C
C CALLED BY:                   xytoll
C
C LOCAL VARIABLES:             x(n)            - array of output coords.
C                              f(n)            - array of function values.
C                              XTOL            - iteration tolerance for ll
C                              FTOL            - tolerance for map position
C                              DELTA           - small dist for partial calc.
C                              MAXIT           - max # of iterations
C                              N               - number of eqtns in system
C                              i               - solution status & debug switch
C
C RESTRICTIONS:                Method will fail to locate a valid point if
C                              iteration wanders out of the range of the
C                              lltoxy functions (possible with gnomonic).
C
C
C ABNORMAL RETURN CONDITIONS:  invali = .true. if the method fails to converge.
C                              This happens when x,y is off the map.
C
C LOCATION:
C
C PROGRAMMER:                  DATE OF LAST CHANGE     REASON FOR CHANGE
C
C    Tom Wescott  (NOSC)       Aug 87                  Original entry
C
C-*-*-*-*-*-*-*-*-*-*-*-*-*-*-*-*-*-*-*-*-*-*-*-*-*-*-*-*-*-*-*-*-*-*-*|*-*-*-*-

      subroutine xpgenr(xmap,ymap,plon,plat)
c
      real x(2),f(2),delta,xtol,ftol
      integer maxit,n,i
```

```
      external nrfcn
      logical invali
      common /invali/ invali
      common /xymap/ projx,projy,xytol,ftol,delta
      common /center/ clat,clon,cclat,sclat
      common /pie/ pie,tpie,pio2,pio4
      real xmin(10),xmax(10),chgmax(10)
      common /domain/ xmin, xmax, chgmax
c
c     Set iteration tolerance for system solution, function values, and
c     the perturbation distance used to estimate partial derivatives.
      MAXIT = 30
      N = 2
      XTOL = .00005
      FTOL = .0001
      DELTA = 0.003
c
c     Set domain.  Allow Lon iteration to cross dateline or conic break.
      xmin(1) = clon - tpie
      xmax(1) = clon + tpie
c     Dont allow Lat to iterate quite all the way to a pole.
      xmin(2) = -pio2 + 0.4*FTOL
      xmax(2) = +pio2 - 0.4*FTOL
c     Restrict maximum change per iteration to avoid wild jumps.
      chgmax(1) = 0.025 * (xmax(1)-xmin(1))
      chgmax(2) = 0.100 * (xmax(2)-xmin(2))
c
c     Set status var for debug.  (i = 0 prints progress of iteration ).
      i = 10
c
 100  continue
      projx = xmap
      projy = ymap
      xytol = xtol
      invali = .false.
c
c     Set initial guess at map center.
      x(1) = clon
      x(2) = clat
      if (x(2) .lt. xmin(2)) x(2) = xmin(2)
      if (x(2) .gt. xmax(2)) x(2) = xmax(2)
c
c     Solve the system of nonlinear mapping equations.
      call nrsyst(nrfcn,N,MAXIT,x,f,DELTA,XTOL,FTOL,i)
c
      if (i .lt. 0) then
         invali = .true.
CC          write(*,*)'xpgenr... Solution invalid,  nrsyst status = ',i
      else
         plon = x(1)
         plat = x(2)
c        Insure solution coordinates are in the normal lon,lat range.
101      if((abs(plon) .gt. pie) .or. (abs(plat) .gt. pio2)) then
            if(abs(plon) .gt. pie) plon = plon - sign(tpie,plon)
            if(abs(plat) .gt. pio2) then
               plat = sign(pie,plat) - plat
               plon = plon - sign(pie,plon)
            endif
            go to 101
         endif
      endif
c
      return
      end

C+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    XPGNOM
C
C FUNCTIONAL DESCRIPTION:       GNOMONIC PROJ.  (X,Y) TO (LON,LAT)
C                                     Spherical earth model
C
C INPUT FILES/PARAMETERS:       x,y             - map coordinates
C
```

```
C GLOBAL VARIABLES :              clat, clon      - map center
C                                 wmrad           - earth radius, world units
C                                 xoffs, yoffs    - display offset, world units
C
C OUTPUT FILES/PARAMETERS:        lat, lon        - geographic coordinates
C
C SUBROUTINES CALLED:             da2ll
C
C CALLED BY:                      bl2ll,xytoll
C
C LOCAL VARIABLES:                None.
C
C RESTRICTIONS:                   None.  All points converted.
C
C PROGRAMMER:                 DATE OF LAST CHANGE       REASON FOR CHANGE
C     Tom Wescott (NOSC)      Jan 87                    Initial entry.
C
C-*-*-*-*-*-*-*-*-*-*-*-*-*-*-*-*-*-*-*-*-*-*-*-*-*-*-*-*-*-*-*-*-*-*-*-*|*-*-*-*-
c
        subroutine xpgnom(x,y,plon,plat)
c
        common /center/ clat,clon,cclat,sclat
        logical notlst
        common /proj/ itproj,wmrad,xoffs,yoffs,scalr,notlst
c
c       Invert the viewing transformation.
        dx = (x-xoffs)/scalr
        dy = (y-yoffs)/scalr
c
c       Compute azimuth from map center.
        if ((dx.ne.0.0).or.(dy.ne.0.0))  az = atan2(dx,dy)
c
c       Compute arc distance for gnomonic projection.
        r = sqrt(dx*dx+dy*dy)
        er = atan(r)
c
c       Convert to lat,lon.
        call da2ll(clat,clon,er,az,plat,plon)
c
        return
        end


C+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                      XPSTER
C
C FUNCTIONAL DESCRIPTION:         STEREOGRAPHIC PROJ.  (X,Y) TO (LON,LAT)
C                                         Spherical earth model
C
C INPUT FILES/PARAMETERS:         x,y             - map coordinates
C
C GLOBAL VARIABLES :              clat, clon      - map center
C                                 wmrad           - earth radius, world units
C                                 xoffs, yoffs    - display offset, world units
C
C OUTPUT FILES/PARAMETERS:        lat, lon        - geographic coordinates
C
C SUBROUTINES CALLED:             da2ll
C
C CALLED BY:                      bl2ll,xytoll
C
C LOCAL VARIABLES:                None.
C
C RESTRICTIONS:                   None.  All points are converted.
C
C ABNORMAL RETURN CONDITIONS:     None.
C
C PROGRAMMER:                 DATE OF LAST CHANGE       REASON FOR CHANGE
C     Tom Wescott (NOSC)      Jan 87                    Initial entry.
C
C-*-*-*-*-*-*-*-*-*-*-*-*-*-*-*-*-*-*-*-*-*-*-*-*-*-*-*-*-*-*-*-*-*-*-*-*|*-*-*-*-
c
        subroutine XPSTER(x,y,plon,plat)
c
```

```
      common /center/ clat,clon,cclat,sclat
      logical notlst
      common /proj/ itproj,wmrad,xoffs,yoffs,scalr,notlst
c
c     Invert the viewing transformation.
      dx = (x-xoffs)/scalr
      dy = (y-yoffs)/scalr
c
c     Compute azimuth from map center.
      if ((dx.ne.0.0).or.(dy.ne.0.0)) az = atan2(dx,dy)
c
c     Compute arc distance for stereographic projection.
      r = sqrt(dx*dx+dy*dy)
      er = 2.0*atan(r/2.0)
c
c     Convert to lat,lon.
      call da2ll(clat,clon,er,az,plat,plon)
c
      return
      end
C+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                        XYTOLL
C
C FUNCTIONAL DESCRIPTION:           Convert screen location to geographic coords.
C
C INPUT FILES/PARAMETERS:           (x,y)      - Display coordinates.
C
C GLOBAL VARIABLES:                 itproj     - Projection ID#.
C
C OUTPUT FILES/PARAMETERS:          (lon,lat)  - Geographic coordinates.
C                                   invali     - Flag for bad input.
C
C SUBROUTINES CALLED:               xp????     - Inverse mapping routines.
C
C CALLED BY:                        The multitudes.
C
C LOCAL VARIABLES:                  None.
C
C RESTRICTIONS:                     None.
C
C ABNORMAL RETURN CONDITIONS:       Invalid set if input point is off the map.
C
C PROGRAMMER:                       DATE OF LAST CHANGE     REASON FOR CHANGE
C     DAVE NATION                                           ORIGINAL CODE.
C     Tom Wescott  (NOSC)           10/87                   Add generic capability.
C                                   OCT 88
C
C-*-*-*-*-*-*-*-*-*-*-*-*-*-*-*-*-*-*-*-*-*-*-*-*-*-*-*-*-*-*-*-*-*-*-*-*|*-*-*-*-
c
      subroutine XYTOLL(x,y,plat,plon)
c
      common /pie/ pie,tpie,pio2,pio4
      logical invali,notlst
      common /invali/ invali
      common /proj/ itproj,wmrad,xoffs,yoffs,scalr,notlst
c
c
      invali = .false.
*---------------------------------------------------------------|--+
* Itproj:  1  2  3  4  5  6  7  8  9 10 11 12 13 14 15 16 17 18 19 20 21  |
*------------------------------------------------------------------+
*          g  o  o  o  p  e  m  l  a  a  a  k  m  o  p  p  u  s  s      |
*          n  r  r  r  e  q  e  a  l  z  z  a  i  b  o  c  t  i  t      |
*          o  e  p  t  r  r  r  m  b  e  e  v  l  l  s  l  m  n  e      |
*          m  q  o  h  s  e  c  c  r  a  d  r  l  m  t  y  z  u  r      |
*------------------------------------------------------------------+
      goto(1,99,99,99,99,99,99,99,99,10,11,99,99,99,99,99,99,99,19
     +    )itproj
c
c           Generic iterative method works for all well behaved projections.
 99         call xpgenr(x,y,plon,plat)
            go to 900
c
c           Proj. #1  Gnomonic
```

```
c           Explicit inverse avoids iteration problems in limited domain.
  1         call xpgnom(x,y,plon,plat)
            go to 900
c
c           Proj. #10  Azimuthal Equal Area
c           Has convergence problems.
  10        call xpazea(x,y,plon,plat)
            go to 900
c
c           Proj. #11  Azimuthal Equidistant
c           Has convergence problems.
  11        call xpazed(x,y,plon,plat)
            go to 900
c
c           Proj. #19  Stereographic
c           Explicit inverse required for efficient breakline clipping.
 19         call xpster(x,y,plon,plat)
            go to 900
c
 900    continue
c
        return
        end
C+*+*+*+*+*+*+*+*+*+*+  +*+*+*+*+*+*+*+*+*+*+*+*+*+  *+*+*+*+*+*+*+*+*|*+*+*+*+
C UNIT NAME:                     carmaxdim.inc
C
C FUNCTIONAL DESCRIPTION:        INCLUDE FILE FOR MAX DIMENSIONS
C
C       MAXV    -       max vertices per polygon on input from data
C                       = 5000 for wdbiia-wdbiif
C                       = 1200 for wdbiib-wdbiif
C       MXVOUT  -       max vertices per polygon on output to device driver
C                       = 1200 on VAX DI-3000
C                       = 1000 on SUN DI-3000
C                       = 66 on SUNCORE vanilla version for Sun 3
C                       = 2000 on SUNCORE special version for Sun 3
C                       = 200 on SUNCORE vanilla version for Sun SPARC
C       MXPLYS  -       MAXV OR ?
C       IDIM    -       MAXV*2
C
C-*-*-*-*-*-*-*-*-*-*-*-*-*-*-*-*-*-*-*-*-*-*-*-*-*-*-*-*-*-*-*-*-*-*-*|*-*-*-*-
c
        integer         MAXV, MXVOUT, MXPLYS
        parameter       (MAXV = 1200)
        parameter       (MXVOUT = 200)
C       parameter       (MXVOUT = 66)
        parameter       (MXPLYS = MAXV)
c
        integer         IDIM
        parameter       (IDIM = MAXV*2)
C+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                     SAVARC
C
C FUNCTIONAL DESCRIPTION:        .
C
C CALLED BY:                     APARCS
C
C PROGRAMMER:                    DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*|*-*-*-*-

        subroutine savarc(xsave1,ysave1,xsave2,ysave2,xsave3,ysave3,
     +          arccnt,ifl)

c       This routine writes out the points needed to redraw arcs.
c         The three points along the arc that the user input are
c         written to the file, along with the number of arcs
c         that are being saved.
c         The opcode for the arcs is written in position 1
c         of the first line written out.
c         This routine is used by both the create and the conversion
c         routines of the Icon Editor.  When saving a newly-created
c         icon, the .icon file is written to.  When saving a
c         converted icon, the .conv file is written to.  This
```

```
c         is controlled by the ifl variable which is the logical
c         unit number of the file to be written to.
c     VARIABLES:
c         xsaveX/ysaveX- arrays holding the three points of each arc
c         fullfl- flag set when all positions of the record being
c           built for output have been filled
c         iarray- holds elements to be written
c         arccnt- number of arcs to be saved
c         maxlen- maximum number of positions allowed in record
c           (in this case, an 80-position record will hold 26
c            integers in I3 format)
c         icount- counter used to load arrays
c         ifl- logical unit number of the file to be accessed
c   PROGRAMMER:  Nancy Detrich, A215, March, 1984
C------  MODIFIED BY A692 FOR COMPLETION

        real xsave1(*),ysave1(*),xsave2(*)
        real ysave2(*),xsave3(*),ysave3(*)
        logical fullfl
        integer iarray(26),arccnt,ifl,maxlen,icount
        data maxlen/26/

c       only process if there are arcs to be saved
        if (arccnt .gt. 0 ) then
c         put op code for arcs in position 1
          iarray(1) = 8
c         number of arcs saved in position 2
          iarray(2) = arccnt
c         set counter ahead to start saving points
          icount = 3
          do 100 i = 1,arccnt
            fullfl = .false.
c           load the points of the each arc
            iarray(icount)   = INT(xsave1(i))
            iarray(icount+1) = INT(ysave1(i))
            iarray(icount+2) = INT(xsave2(i))
            iarray(icount+3) = INT(ysave2(i))
            iarray(icount+4) = INT(xsave3(i))
            iarray(icount+5) = INT(ysave3(i))
            icount = icount + 6
c           a record is full if the arc count is 4 or 8, so write
c                    out record and set full flag
            if (i .eq. 4 .or. i .eq.8) then
              call writit(ifl,iarray,icount-1,ierror)
              fullfl = .true.
              icount = 1
            endif
 100      continue

c         write out (last) record that is not full
          if (.not.fullfl) then
            call writit(ifl,iarray,icount-1,ierror)
          endif
        endif
        return
        end


C+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                        SAVCIR
C
C FUNCTIONAL DESCRIPTION:           .
C
C CALLED BY:                        APCIRC
C
C PROGRAMMER:                       DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*|*-*-*-*-

        subroutine savcir(icode,numcir,radius,xcentr,ycentr,ifl)

c       This routine is passed the arrays holding the center coordinates
c       and radius.length of the circles to be written to the savefile.
c       The routine loads an array with the radius,x, and y center
```

```
c       point of each circle and writes out a record to the file when
c       26 values have been put into the array (78 positions of the
c       80-position record).
c   VARIABLES:
c       xcentr - array holding x center coordinate of circles
c       ycentr - array holding y center coordinate of circles
c       radius - array holding radius length of circles
c       icode - integer value (2) to be read and used by redraw routine
c       numcir - number of circles being saved off
c       fullfl - flag to indicate when 26 positions have been filled
c              in iarray meaning the record is ready to be written out
c       maxlen - indicates the length of iarray--dependent on the record
c              length of the file being written to
c       iarray - array to hold the record being built to be written out
c       icount - counter used to step through iarray
c       i - counter used to step through the arrays passed with points
c           and radius of circles
c       ifl - logical unit number associated with file to be
c           accessed
c   PROGRAMMER:  Nancy Detrich, A215, March, 1984

        real xcentr(*),ycentr(*),radius(*)
        integer icode,numcir
        integer maxlen,iarray(26),icount,i,ifl
        logical fullfl
        data maxlen/26/

c       only write out a record if at least 1 circle has been created
        if (numcir .gt. 0) then
          iarray(1) = icode
          iarray(2) = numcir
c         set counter ahead on first record because of icode and numcir
          icount = 3
c         load the iarray and write out a record when one is full
          do 100 i=1,numcir
            fullfl = .false.
            iarray(icount) = INT(radius(i) )
            iarray(icount+1) = INT(xcentr(i))
            iarray(icount+2) = INT(ycentr(i))
            icount = icount +3
c           a record is full when 8 or 16 points have been put into it, so
c              write it out
            if(MOD(i,8) .eq. 0) then
              call writit(ifl,iarray,maxlen,ierror)
              fullfl = .true.
c             reset counter to start in 1st position of iarray to fill
c               next record
              icount = 1
            endif
 100      continue
c         if fullfl is false here, means a partial record must be written
c             to the file
          if(.not.fullfl) then
            call writit(ifl,iarray,icount-1,ierror)
          endif
        endif
        return
        end


C+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                     SAVE
C
C FUNCTIONAL DESCRIPTION:        .
C
C CALLED BY:                     APFILL, APLINE, APMARK, APRECT, APSMOO
C
C PROGRAMMER:                    DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*|*-*-*-*-
        subroutine save(icode,numpts,xarray,yarray,ifl)

c       This routine calls the writit routine to write parameters
c         and points to the savefile.  An array of integers is
```

```
c          passed to writit and 12 x and y values may be written
c          in the first record, 13 on the second and 9 on the
c          third.
c          This routine is used by the create and convert routines
c          of the Icon Editor and the file to be written to is
c          controlled by the logical unit number, ifl.
c       VARIABLES:
c         xarray/yarray- points to be saved
c         numpts- number of points in each array
c         maxlen- maximum number of elements allowed to be written per
c          record
c         fullfl- flag set when a record is full
c         iarray- array loaded and sent to writit to be written to file
c         icode- the op code to be saved with the information
c               being saved
c    PROGRAMMER:  Nancy Detrich, A215, March, 1984

          real xarray(*),yarray(*)
          integer ifl,maxlen,icount
          logical  fullfl
c        array set to 26 because being written to 80 pos record in I3 format
          integer iarray(26),numpts,icode
          data  maxlen/26/

c          do not write a record if no points were passed
           if (numpts.gt.0) then
c            put op code in first position
             iarray(1) = icode
c            put number of points being written in position 2
             iarray(2) = numpts
c            set array value ahead on first record
             icount = 3
             do 100 i=1,numpts
c              truncate on entry into integer array
               fullfl=.false.
               iarray(icount) = INT(xarray(i))
               iarray(icount + 1) = INT(yarray(i))
               icount = icount + 2

c              a record is full if the points count is 12 or 25, so write
c                out record and set full flag
               if (i .eq. 12 .or. i .eq.25) then
                 call writit(ifl,iarray,maxlen,ierror)
                 fullfl = .true.
                 icount = 1
               endif
  100        continue

c            write out record that is not full
             if (.not.fullfl) then
               call writit(ifl,iarray,icount-1,ierror)
             endif

          endif
          return
          end

C+*+*+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:                   saveco
c
c  Functional Description:
c       this subroutine saves the screen definition common areas
c
c  Input Files/Parameters:
c
c  Output Files/Parameters: N/A
c
c  Subroutines/Functions Called:
c      Note: Subroutines preceded by a "j" are explained in the DI-3000 manual.
c
c  Called By:                   FMAIN
c
c  Local Variables: N/A
```

```
c
c  Restrictions: N/A
c
c  Abnormal Return Conditions:  N/A
c
c  Location:      /a21/dave
c
c  Programmer         Date of Last Change       Reason for Change
c
C-*-*-*-*-*-*-*-*-*-*-*-*-*-*-*-*-*-*-*-*-*-*-*-*-*-*-*-*-*-*-*-*-*-*-*-*-*|*-*-*-*-
c
       subroutine saveco
c
c      this subroutine saves the screen definition common areas
c
       common /aspect/ parvie(6)
       common /saveta/ savevi(6)
c
       do 110 i=1,6
           savevi(i) = parvie(i)
  110  continue
c
       return
       end


C+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                       SAVEST
C
C FUNCTIONAL DESCRIPTION:          .
C
C CALLED BY:                       STATEC
C
C PROGRAMMER:                      DATE OF LAST CHANGE     REASON FOR CHANGE
c  S. Lamb                   Feb 1988                   command fix - savest
C
C-*-*-*-*-*-*-*-*-*-*-*-*-*-*-*-*-*-*-*-*-*-*-*-*-*-*-*-*-*-*-*-*-*-*-*-*-*|*-*-*-*-
c
       subroutine savest
c
c      this subroutine is the save state interpreter (28)
c
       common /states/ nextst
       logical eol,eoc
       common /comnds/ lenl,indxw,lenw,eol,eoc
       logical wordis,iseoc
c
       initls = nextst
c      do until nextst not = initial state
  100  continue
           call getwrd
c ****  change all of this
           if (wordis('COMMAND').or.wordis('FILE').or.wordis(':'))
     +         then
c * ** *** **** ***** ****** ******* not understood / implem.
               nextst = 15
           else if (iseoc()) then
c              prompt for filename
               nextst = 1
           else
c              put word into filename
               nextst = 1
           endif
       if (nextst.eq.initls) go to 100
       if (lenfn.gt.0) then
c          open file using default path
c          if error, putwrd, msg
c          else cmdfil = .true.
       endif
c
       return
       end


C+*+*+*+*+*+*+*+*+*+*+*+*+*+*+*+*+*+*+*+*+*+*+*+*+*+*+*+*+*+*+*+*+*+*+*+*+*|*+*+*+*+
```

```
C UNIT NAME:                     SAVTXT
C
C FUNCTIONAL DESCRIPTION:        .
C
C CALLED BY:                     APTEXT
C
C PROGRAMMER:                    DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*-*-*|*-*-*-*-

      subroutine savtxt(size,height,style,nchars,retstr,x,y,ifl)

c     this subroutine saves the necessary parameters to be used
c     by the redraw routine when the icon is requested.
c     The icode is set to 7 to indicate the records being written
c     pertain to text, and the size, height, style, number of characters
c     in the text string and the x and y positions of that text
c     string are output.  Any real variables are converted to integer
c     values before being output.
c     The actual character string is output on a separate line as
c     characters.
c   VARIABLES:
c     retstr- the text string to be displayed
c     nchars- number of characters in text string
c     x/y- coordinate for positioning text string
c     height- height of characters in text string
c     style- determines font setting
c     size- selection made from menu
c     icode -op code for text
c     ierror- integer flag set if error occurs during write
c  PROGRAMMER:  Nancy Detrich, A215, March, 1984

      character*80 retstr
      integer x,y
      integer height
      integer style,size,ifl,nchars,ix,iy,icode,ierror

      icode = 7
      ix = INT(x)
      iy = INT(y)
c     write the parameters needed for redrawing
      write (ifl,1100) icode,size,height,style,nchars,ix,iy
c     write the text string (character format)
      call writch(ifl,retstr,nchars,len,ierror)

 1100 format (15i3)
      return
      end


C+*+*+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                     SCENTE
C
C FUNCTIONAL DESCRIPTION:        .
C
C CALLED BY:                     STATEC
C
C PROGRAMMER:                    DATE OF LAST CHANGE     REASON FOR CHANGE
c  S. Lamb              Feb 1988                     command fix - scente
C
C-*-*-*-*-*-*-*-*-*-*-*-*-*-*-*-*-*-*-*-*-*-*-*-*-*-*-*-*-*-*-*-*-*-*-*-*-*-*-*|*-*-*-*-
c
      subroutine scente
c
c     this subroutine is the center point state interpreter (18)
c
      common /states/ nextst
      logical wordis,iseoc
      logical iscoor
c
      initls = nextst
c     do until nextst not = initial state
 100  continue
         call getwrd
```

```
           if (wordis('POINT').or.wordis('TO')) then
c * ** *** **** ***** ****** ******* not understood / implem.
               nextst = 15
           else if (iscoor()) then
               nextst = 19
           else if (iseoc()) then
               nextst = 7
           else
               call putwrd
               nextst = 7
           endif
       if (nextst.eq.initls) go to 100
c
       return
       end

C+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                      SCLRET
C
C FUNCTIONAL DESCRIPTION:         .
C
C CALLED BY:                      DOVERL
C
C PROGRAMMER:                     DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*|*-*-*-*-

       subroutine sclret
       return
       end

C+*+*+*+*+*+*+*+*+*+*+*+*+*+*+*+*+*+*+*+*+*+*+*+*+*+*+*+*+*+*+*+*+*+*+*|*+*+*+*+
C UNIT NAME: SCRDIA
C
C FUNCTIONAL DESCRIPTION:  SCRDIA IS RESPONSIBLE FOR PRINTING THE CURRENT
C                          MAP DIAMETER IN THE COMMUNICATIONS AREA.
C
C INPUT FILES/PARAMETERS:  NONE.
C
C GLOBAL VARIABLES :
C
C        QXRNM                  REAL         RADIUS OF MAP. (NAUTICAL MILES)
C        QMAPUP                 LOGICAL      INDICATES WHETHER MAP IS CURRENTLY
C                                            DISPLAYED.
C
C OUTPUT FILES/PARAMETERS:  NONE.
C
C SUBROUTINES/FUNCTIONS CALLED : MESG
C
C         MESSAG               PRINTS CHARACTER STRING IN COMMUNICATIONS
C                              AREA.
C
C CALLED BY:                      CHECK, MAPPER
C
C LOCAL VARIABLES:
C
C       DIAM                   CHARACTER*80 CHARACTER STRING HOLDING CURRENT
C                                           DIAMETER.
C
C RESTRICTIONS: NONE.
C
C ABNORMAL RETURN CONDITIONS:   NONE.
C
C LOCATION:                       /u1/a21/gjf/SCRDIA.FTN
C
C PROGRAMMER:                     DATE OF LAST CHANGE     REASON FOR CHANGE
C
C     GJFenerty
C     Tom Wescott   (NOSC)        10/87                   Added map constnts
C
C-*-*-*-*-*-*-*-*-*-*-*-*-*-*-*-*-*-*-*-*-*-*-*-*-*-*-*-*-*-*-*-*-*-*-*|*-*-*-*-

       subroutine SCRDIA
```

```
C  SUBROUTINE TO CALCULATE AND DISPLAY THE CURRENT MAP DIAMETER IN
C  NAUTICAL MILES, KILOMETERS, MILES AND DEGREES.  USUALLY CALLED
C  FROM CHECK.

      LOGICAL QLTON(16),QDOTEM
      INTEGER QPGRID(4),QTYPTB(16)
      INTEGER QLEVEL,QITPRO,QIRES,QLUNDA,QLUNIN,QLUNLI
      REAL QXRNM,QXC,QYC,QCLAT,QCLON,QXRAD,QYRAD,QORHAL
      COMMON /MAP/ QXRNM,QXC,QYC,QLEVEL,QCLAT,QCLON,QXRAD,QYRAD,
     +    QITPRO,
     +    QIRES,QTYPTB,QLUNDA,QLUNIN,QLUNLI,QLTON,QPGRID,QDOTEM,
     +    QORHAL

      LOGICAL QMAPUP
      COMMON /MAPUP/ QMAPUP
      common /conic/ spll1,spll2,tranl,trank,tranr,tscale,pole,tilt
      common /pers/ orhalt,orhc,pconst,cosERM,radmax
      common /utmz/ ap,bp,cp,dp,ep,e2,ep2,aaxis,baxis,cmerid,zone

    CHARACTER*72 line,amptxt(4)


    CHARACTER*6 QCURWD
    COMMON /CURWDB/ QCURWD
    CHARACTER*15 MAPROJ(19)
    DATA MAPROJ /
   + 'Gnomonic      ', 'Equat. Ortho.  ', 'Polar Ortho.   ',
   + 'Orthographic  ', 'Perspective    ', 'Equirectangular',
   + 'Mercator      ', 'Lambert Conf.  ', 'Albers         ',
   + 'Az. Equal-area ', 'Az. Equidistant', 'Kavraisky IV   ',
   + 'Miller        ', 'Obliq. Mercator', 'Polar Stereo.  ',
   + 'Polyconic     ', 'UTM            ', 'Sinusoidal     ',
   + 'Stereographic  '/

      IF (QMAPUP) THEN

C     ** LOAD STRING DIAM WITH SCALE,CENTER POINT,WDBII,DETAIL,PROJ.
      IEGEO = 0
      line = ' '
      IXRNM = QXRNM * 2

      WRITE (line(1:18),101) IXRNM
 101    FORMAT('Width:',I5,' NM  ')
      IXRNM = QXRNM*1.15*2
      WRITE (line(19:28),102) IXRNM
 102    FORMAT(I5,' MI  ')
      IXRNM = QXRNM*1.852*2
      WRITE (line(29:37),103) IXRNM
 103    FORMAT(I6,' KM')
      amptxt(1) = line
      line = ' '
      WRITE (line(1:8),104)
 104    FORMAT('Center: ')
      CALL FORMT (QCLAT,QCLON,IEGEO,line(9:24))
c
*-------------------------------------------------------------------|--+
* Itproj:  1  2  3  4  5  6  7  8  9 10 11 12 13 14 15 16 17 18 19 20 21  |
*----------------------------------------------------------------------+
*          g  o  o  o  p  e  m  l  a  a  a  k  m  o  p  p  u  s  s        |
*          n  r  r  r  e  q  e  a  l  z  z  a  i  b  o  o  t  i  t        |
*          o  e  p  t  r  r  r  m  b  e  e  v  l  l  s  l  m  n  e        |
*          m  q  o  h  s  e  c  c  r  a  d  r  l  m  t  y  z  u  r        |
*----------------------------------------------------------------------+
     goto(1,01,01,01,02,01,01,03,03,01,01,03,01,05,01,01,04,01,01
    +    )qitpro
c
c       Default case:  Maps without special constants.
 1          continue
            go to 99
c
c       Perspective case:  Display view point altitide.
 2          continue
            iorhal = int(orhalt + 0.5)
            write (line(28:50),1002) iorhal
```

```
 1002      format(1X,'Altitude: ',i5,' NM ')
           go to 99
c
c       Conics case:  Display standard parallels.
 3         continue
           ispll1 = anint(spll1*180./3.14159)
           ispll2 = anint(spll2*180./3.14159)
           write (line(28:55),1003) abs(ispll1),abs(ispll2)
 1003      format(1X,'Std parallels: ',I2,' ,',I2)
           if (spll1.ge.0.) line(46:46) = 'N'
           if (spll1.lt.0.) line(46:46) = 'S'
           if (spll2.ge.0.) line(50:50) = 'N'
           if (spll2.lt.0.) line(50:50) = 'S'
           go to 99
c
c       UTM case:  Display zone number.
 4         continue
           izone = zone
           write (line(28:50),1004) izone
 1004      format(1X,'Zone: ',i5)
           go to 99
c
c       Oblique case:  Display tilt angle:
 5         continue
           itilt = anint(tilt*180./3.14159)
           write (line(28:55),1005) itilt
 1005      format(1X,'Equatorial Tilt: ',I3,' deg.')
           go to 99
c
 99        continue
c       end cases
c
        amptxt(2) = line
        line = ' '
        WRITE (line(1:8),105) QCURWD
  105     FORMAT(A6,2X)
        WRITE (line(9:24),106) QLEVEL
  106     FORMAT('detail:',I3,6X)
        WRITE (line(28:55),107) MAPROJ(QITPRO)
  107     FORMAT(' Projection: ',A15)
        amptxt(3) = line
c        call clrcom
        call drwamp(amptxt,3)
        ELSE

          CALL MESG(294)
          CALL PAWS

        ENDIF

        RETURN
        END


C+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                     SEGHND
C
C FUNCTIONAL DESCRIPTION:        .
C
C CALLED BY:                     ADDTRK, CHGIND, PLOTON, PLTUNS, REPLAY
C
C PROGRAMMER:                    DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*|*-*-*-*-

        subroutine seghnd (segnr, data)

c this routine sets up the graphics window and viewport, opens the new
c segment, displays the data, closes the segment, and sets the
c detectability and visibility
c programmer: avw

        integer          segnr
```

```
        character*(160)   data
        logical trackn
        common /trkdbc/ trackn

        if (trackn) then
           print *, 'enter seghnd'
           print *, '   segnr = ', segnr
        end if

c set window and viewport

        call jrclos

        call gravpt
        call geowin

c open new retained segment

        call jropen (segnr)

c display the new data
c       print*,'in seghnd/seg#= ',segnr

        call pltdat (data)

c close segment

        call jrclos

c set detectability and visibility

        call jdetec (segnr, 1)
        call jvisbl (segnr, 1)

        if (trackn)  print *, 'exit seghnd'

        return
        end

C+*+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME: SEGMAP
C
C FUNCTIONAL DESCRIPTION:  SETS UP RETAINED SEGMENT NUMBERS FOR MAP.
C
C INPUT FILES/PARAMETERS:  NONE.
C
C GLOBAL VARIABLES :
C
C       FIRSEG        INTEGER      FIRST MAP SEGMENT NUMBER
C
C OUTPUT FILES/PARAMETERS:  NONE.
C
C SUBROUTINES/FUNCTIONS CALLED :
C
C       GETSEG         GETS NEXT SEGMENT NUMBER.
C
C CALLED BY:                      DRWMAP
C
C LOCAL VARIABLES: NONE.
C
C RESTRICTIONS: NONE.
C
C ABNORMAL RETURN CONDITIONS:   NONE.
C
C LOCATION:                       /ul/a21/gjf/cntrl.f
C
C PROGRAMMER:                     DATE OF LAST CHANGE     REASON FOR CHANGE
C
C     GJFenerty
C
C-*-*-*-*-*-*-*-*-*-*-*-*-*-*-*-*-*-*-*-*-*-*-*-*-*-*-*-*-*-*-*-*-*-*-*-*-*-*|*-*-*-*-

       SUBROUTINE SEGMAP
```

```
C  SETS SEGMENT NUMBERS FOR DRAWING MAP

      INTEGER SEGNO,FIRSEG
      COMMON /SEGNO/ SEGNO,FIRSEG
      INTEGER I

      CALL GETSEG(FIRSEG)
      DO 20 I=1,16
         CALL GETSEG(SEGNO)
 20   CONTINUE

      SEGNO = FIRSEG

      RETURN
      END

C+++++++++++++++++++++++++++++++++++++++++++++++++++++++++++++++++++++++++|+++++++
c UNIT NAME:   setcol
c
c Purpose:
c subroutine to set map feature colors
c
c Access: call setcol
c
c Parameters:
c
c Returns: none
c
c Globals:
c
c Calls: arrow
c
c Called by:                      RESCON
c
c Author: Ellen Jenkins, R531, September 30, 1982
c
c Location: file: setcol.f
c           directory: /u3/dave/hlpd
c           archive: /u3/dave/archive/hlspsrc
c
c History:
c version date    who                history or reason for change.
c   1   10/7/82   D. A. Nation       Rearranged arrow calls to save space
c   2   1/4/83    D. A. Nation       Function key F8 used for exit on Apollo
c       Jan 1988  L. McCleary        call jpecho - setcol
c       Jan 1988  L. McCleary        continuous hue - setcol
c
c
c      ________________________________________________
c     |                                    |           |
c     |  _______________________________   |           |
c     | |                               |  |           |
c     | |     Current Color Choice      |  |           |
c     | |_______________________________|  |           |
c     |                     /\   ___/\     |           |
c     |  Text Example      /  \/      \___ |           |
c     |                                    |           |
c     |  _______________________________   |           |
c     | |   |                |      |   |  |           |
c     | |   | Color          | Pallette |  |           |
c     | |___|________________|______|___|  |           |
c     |                                    |           |
c     |              Hue                   |           |
c     |                                    |           |
c     |  _________________________________ |           |
c     |                                    |           |
c     |           Saturation               |           |
c     |                                    |           |
c     |  _________________________________ |           |
c     |                                    |           |
c     |           Lightness                |           |
c     |  _________________________________ |           |
c     |                                    |           |
c     |                                    |           |
c     -------------------------------------------------
c
c
c
```

```
C-*-*-*-*-*-*-*-*-*-*-*-*-*-*-*-*-*-*-*-*-*-*-*-*-*-*-*-*-*-*-*-*-*-*-*-*-*-*-*-*-*|*-*-*-*-
c
      subroutine setcol (icolor,nhues,ishue,ifcol,ibcol,ioucol,hls)
c
c     this subroutine does the color selection graphics
c
      real hls(3)
      character*1 ch
      integer*2 ikey
      logical sys
      common /sysdbc/ sys
      integer qfb(26),qmb(4)
      common /butons/qfb,qmb
      data vx,vy /0.,0./
      data xlow,xhigh,ylow,yhigh/1.,100.,1.,100./

      if (sys)
     + print*,'enter setcol ',icolor,nhues,ishue,ifcol,
     + ibcol,ioucol,hls

      intcol = ifcol
      call jwindo (xlow,xhigh,ylow,yhigh)
      call jwclip (.true.)
      call jopen
c
c     clear given area with background color
c
      CALL XPIDEX (ibcol,0)
      CALL XCOLOR (ioucol)
      CALL JRECT (xlow,ylow,xhigh,yhigh)
c
c     draw initial display
c
      xrange = xhigh - xlow
      yrange = yhigh - ylow
      CALL XCOLOR (icolor)
      CALL XPIDEX (icolor,0)
      xlmarg = xlow + .05 * xrange
      xrmarg = xhigh - .05 * xrange
      xsrang = xrmarg - xlmarg
      xcentr = (xrmarg - xlmarg) / 2. + xlmarg
      y1 = ylow + .85 * yrange
      y2 = yhigh - .05 * yrange
      CALL JRECT (xlmarg,y1,xrmarg,y2)
      call jupdat
      yfigur = yhigh - .25 * yrange
      call jmove (xlmarg, yfigur)
c      call jsize (xrange / 50., yrange / 40.)
      call jsize(5.0,2.5)
      call j1strg ('Text')
      call jmove (xlmarg, yfigur-.05*yrange)
      call j1strg ('Example')
      call jmove (xcentr, yfigur)
      call jrdraw (.2 * xrange, .05 * yrange)
      call jrdraw (.1 * xrange, -.1 * yrange)
      call jdraw (xrmarg, yfigur)
      yhues = ylow + .5 * yrange
      ysatur = ylow + .3 * yrange
      ylight = ylow + .1 * yrange
c      CALL XCOLOR (ifcol)
c      call jjust (2,1)
      space=(xrmarg-xlmarg)/nhues
      x1=xlmarg
      half = space/2.
      x2 = x1 + half
      do 50 kk=1,nhues
         numcol=(360/nhues)*(kk-1)
         mcolor=ishue+(kk-1)
         call jclose
c         print *,'mcolor,numcol',mcolor,numcol,x1,x2
         call jcotbl(1,1,mcolor,numcol,32767,16384)
         call jopen
         call xpidex(mcolor,0)
         call xcolor(mcolor)
```

```
      call jrect (x1,yhues+.10*yrange,x2,yhues)
      x1=x2
      x2=x1+space
50    continue
      x2 = x2 - half
      call xpidex(ishue,0)
      call xcolor(ishue)
c         print *,'ishue ,numcol',ishue ,numcol,x1,x2
      call jrect (x1,yhues+.10*yrange,x2,yhues)
      call xcolor (ifcol)
      call jjust (2,1)
      call jmove (xcentr,yhues + .14 * yrange)
      call jsize(5.0,2.5)
      call j1strg ('Hue')
      call jmove (xlmarg,ysatur)
      call jdraw (xrmarg,ysatur)
      call jmove (xlmarg,ysatur + .01 * yrange)
      call jdraw (xlmarg,ysatur - .01 * yrange)
      call jmove (xcentr,ysatur + .05 * yrange)
      call j1strg ('Saturation')
      call jmove (xcentr,ysatur + .01 * yrange)
      call jdraw (xcentr,ysatur - .01 * yrange)
      call jmove (xrmarg,ysatur + .01 * yrange)
      call jdraw (xrmarg,ysatur - .01 * yrange)
      call jmove (xlmarg,ylight)
      call jdraw (xrmarg,ylight)
      call jmove (xlmarg,ylight + .01 * yrange)
      call jdraw (xlmarg,ylight - .01 * yrange)
      call jmove (xcentr,ylight + .05 * yrange)
      call j1strg ('Lightness')
      call jmove (xcentr,ylight + .01 * yrange)
      call jdraw (xcentr,ylight - .01 * yrange)
      call jmove (xrmarg,ylight + .01 * yrange)
      call jdraw (xrmarg,ylight - .01 * yrange)
      call jjust (1,1)
      call jmove (xlmarg,yhues + .10 * yrange)
      call j1strg ('0')
      call jjust (3,1)
      call jmove (xrmarg,yhues + .10 * yrange)
      call j1strg ('360')
      call jjust (1,1)
      call jmove (xlmarg,ysatur + .03 * yrange)
      call j1strg ('0')
      call jjust (3,1)
      call jmove (xrmarg,ysatur + .03 * yrange)
      call j1strg ('100')
      call jjust (1,1)
      call jmove (xlmarg,ylight + .03 * yrange)
      call j1strg ('0')
      call jjust (3,1)
      call jmove (xrmarg,ylight + .03 * yrange)
      call j1strg ('100')
      call jclose
      x1prev = xlmarg + ((hls(3)/100.)*xsrang)
      x2prev = xlmarg + ((hls(2)/100.)*xsrang)
      x3prev = xlmarg + ((hls(1)/360.)*xsrang)
      hue = hls(1)
      satur = hls(3)
      rlight = hls(2)
c         print 101,hue,satur,rlight
c  DAN1 call arrw (x3prev,yhues,intcol,xsrang,yrange,hue)
c  DAN1 call arrw (x1prev,ysatur,intcol,xsrang,yrange,satur)
c  DAN1 call arrw (x2prev,ylight,intcol,xsrang,yrange,rlight)
c       Loop until end ('E' key)
100   continue
c  DAN1     addition
            call arrw (x3prev,yhues,intcol,xsrang,yrange,hue)
            call arrw (x1prev,ysatur,intcol,xsrang,yrange,satur)
            call arrw (x2prev,ylight,intcol,xsrang,yrange,rlight)
c  DAN1     end
            ihue = hue
            isatur = satur/100.*32767.
            light = rlight/100.*32767.
            call jcotbl (1,1,icolor,ihue,isatur,light)
```

```
c            print 101,hue,satur,rlight
c  101       format(' hue, sat, lit ',3f6.1)
            call jpecho (1,2,1,vx,vy)
            call jlocat (1,1,1,ik,vx,vy)
            ikey = ik
            ch = char(ikey)
c           print*,'setcol -- ikey, ch : ',ikey,'  ',ch
c           translate to world coord.
            call jconvw (vx,vy,x,y,z)
c DAN2
            if (ch.eq.'R'.or.ch.eq.'r'.or.ch.eq.'.'
     +      .or.ikey.eq.qmb(3)
     +      .or.ikey.eq.8) go to 190
c DAN2
c
c           process locator selection
c
            if (x.lt.xlmarg) x = xlmarg
            if (x.gt.xrmarg) x = xrmarg
            if (y.gt.(yhues-((yhues-ysatur)*.25))) then
               call arrw (x3prev,yhues,ibcol,xsrang,yrange,hue)
c               if (x.lt.(xlmarg + half)) then
c                  x = xlmarg
c                  hue = 0
c               else if (x.ge.(xrmarg-half)) then
c                  x = xrmarg
c                  hue = 360
c               else
c                  prtion=xsrang/nhues
c                  half = prtion/2.
c                  iratio = (x - xlmarg + half)/prtion
c                  ratio = iratio * prtion
c                  hue = (ratio) / xsrang * 360.
c                  x = xlmarg + iratio * prtion
c               endif
c  DAN1        call arrw (x,yhues,intcol,xsrang,yrange,hue)
               x3prev = x
               hue = (x - xlmarg) / xsrang * 360.
            else if (y.gt.(ysatur-((ysatur-ylight)*.25))) then
               call arrw (x1prev,ysatur,ibcol,xsrang,yrange,satur)
               x1prev = x
               satur = (x - xlmarg) / xsrang * 100.
c  DAN1        call arrw (x,ysatur,intcol,xsrang,yrange,satur)
            else
               call arrw (x2prev,ylight,ibcol,xsrang,yrange,rlight)
               x2prev = x
               rlight = (x - xlmarg) / xsrang * 100.
c  DAN1        call arrw (x,ylight,intcol,xsrang,yrange,rlight)
            endif
            go to 100
  190    continue
         hls(1) = hue
         hls(2) = rlight
         hls(3) = satur
         if (sys)  print*,'exit setcol'
         return
         end


C+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                  SETCOR
C
C FUNCTIONAL DESCRIPTION:      .
C
C CALLED BY:                   STATEC
C
C PROGRAMMER:                  DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*|*-*-*-*-

      subroutine setcor
c
c     this subroutine is the set coordinates state interpreter (19)
c
      common /states/ nextst
```

```
c
c  **   set new coordinates
        nextst = 14
c
        return
        end


C++++++++++++++++++++++++++++++++++++++++++++++++++++++++++++++++++++++|+++++++
C UNIT NAME:                         SETDBG
C
C FUNCTIONAL DESCRIPTION:
c  subroutine setdbg - sets up array of flags for the debugs
C
C CALLED BY:
C
C PROGRAMMER:                         DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*|*-*-*-*-

      subroutine setdbg

      character*80 idebug
      common /idebug/ idebug
      logical map,rdkey,savkey,sys,noscal,vax,olhldf,aed,batch
      logical frame,square,noblnk,bxclr,txtsiz,metafl,nolabl,nologo
      logical nobitm,malbox,trackn,bit,mask,forma,plain,count
      logical timeot,fill,jsub,sr8,rel2,clr

      common /mapdbc/ map
      common /rkdbc/ rdkey
      common /svkdbc/ savkey
      common /sysdbc/ sys
      common /nsldbc/ noscal
      common /vaxdbc/ vax
      common /ohfdbc/ olhldf
      common /aeddbc/ aed
      common /batdbc/ batch
      common /frmdbc/ frame
      common /sqrdbc/ square
      common /nbldbc/ noblnk
      common /bxcdbc/ bxclr
      common /txsdbc/ txtsiz
      common /metdbc/ metafl
      common /nlbdbc/ nolabl
      common /nlgdbc/ nologo
      common /nbtdbc/ nobitm
      common /mlbdbc/ malbox
      common /trkdbc/ trackn
      common /bitdbc/ bit
      common /mskdbc/ mask
      common /fmadbc/ forma
      common /plndbc/ plain
      common /cntdbc/ count
      common /timdbc/ timeot
      common /fildbc/ fill
      common /jsbdbc/ jsub
      common /sr8dbc/ sr8
      common /rl2dbc/ rel2
      common /clrdbc/ clr

c     --convert the string to lower case (for reference consistency)
      call tolowr(idebug, len(idebug))

      if (index(idebug,'map').ne.0) then
         map = .true.
      else
         map = .false.
      endif

      if (index(idebug,'read_keys').ne.0) then
        rdkey =.true.
      else
        rdkey = .false.
```

```
endif

if (index(idebug,'save_keys').ne.0) then
  savkey = .true.
else
  savkey = .false.
endif

if (index(idebug,'sys').ne.0) then
  sys = .true.
else
  sys = .false.
endif

if (index(idebug,'noscal').ne.0) then
  noscal = .true.
else
  noscal = .false.
endif

if (index(idebug,'vax').ne.0) then
  vax = .true.
else
  vax = .false.
endif

if (index(idebug,'oldhldf').ne.0) then
  olhldf = .true.
else
  olhldf = .false.
endif

if (index(idebug,'aed').ne.0) then
  aed = .true.
else
  aed = .false.
endif

if (index(idebug,'batch').ne.0) then
  batch = .true.
else
  batch = .false.
endif

if (index(idebug,'frame').ne.0) then
  frame = .true.
else
  frame = .false.
endif

if (index(idebug,'square').ne.0) then
  square = .true.
else
  square = .false.
endif

if (index(idebug,'noblanks').ne.0) then
   noblnk = .true.
else
   noblnk = .false.
endif

if (index(idebug,'bxclr').ne.0) then
   bxclr = .true.
else
   bxclr = .false.
endif

if (index(idebug,'txtsiz').ne.0) then
   txtsiz = .true.
else
   txtsiz = .false.
endif
```

```
if (index(idebug,'metafile').ne.0) then
   metafl = .true.
else
   metafl = .false.
endif

if (index(idebug,'nolables').ne.0) then
   nolabl = .true.
else
   nolabl = .false.
endif

if (index(idebug,'nologo').ne.0) then
   nologo = .true.
else
   nologo = .false.
endif

if (index(idebug,'nobitm').ne.0) then
   nobitm = .true.
else
   nobitm = .false.
endif

if (index(idebug,'mailbox').ne.0) then
   malbox = .true.
else
   malbox = .false.
endif
if (index(idebug,'tracking').ne.0) then
   trackn = .true.
else
   trackn = .false.
endif

if (index(idebug,'bit').ne.0) then
   bit = .true.
else
   bit = .false.
endif

if (index(idebug,'mask').ne.0) then
   mask = .true.
else
   mask = .false.
endif

if (index(idebug,'forma').ne.0) then
   forma = .true.
else
   forma = .false.
endif

if (index(idebug,'plain').ne.0) then
   plain = .true.
else
   plain = .false.
endif

if (index(idebug,'count').ne.0) then
   count = .true.
else
   count = .false.
endif

if (index(idebug,'timeout').ne.0) then
   timeot = .true.
else
   timeot = .false.
endif

if (index(idebug,'fill').ne.0) then
   fill = .true.
else
```

```
            fill = .false.
         endif

         if (index(idebug,'jsub').ne.0) then
            jsub = .true.
         else
            jsub = .false.
         endif

         if (index(idebug,'sr8').ne.0) then
            sr8 = .true.
         else
            sr8 = .false.
         endif

         if (index(idebug,'rel2').ne.0) then
            rel2 = .true.
         else
            rel2 = .false.
         endif

         if (index(idebug,'jclear').ne.0) then
            clr = .true.
         else
            clr = .false.
         endif

         return
         end

C+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    SETFAD
C
C FUNCTIONAL DESCRIPTION:       .
C
C CALLED BY:                    TRKCON
C
C PROGRAMMER:                   DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*|*-*-*-*-

      subroutine setfad

c
c     this subroutine sets the fade time based upon users request
c     and then updates the screen to reflect the new fade time

      logical longer

      character*2 chmin
      character*2 chhour
      character*80 line
      character*5 newfad

      integer*4 error
      integer*4 hours
      integer*4 minute
      integer*4 icolcm
      integer*4 lctrak
      integer*4 temptm
      integer*4 txtseg

      integer tfaddx
      integer tfadtm
      common /tfadez/ tfaddx, tfadtm
      integer tnewst
      integer toldst
      common /tarbou/ tnewst, toldst
      integer ltypov(16)
      logical ltonov(16)
      logical rankt(26,16)
      logical trackn
```

```
      common /trkdbc/ trackn
      common /maptoo/ ltypov,ltonov,rankt
      real qcxmn
      real qcymn
      real qcxmx
      real qcymx
      common/comwdo/qcxmn,qcymn,qcxmx,qcymx
      character*9 tfddtg
      common /tfddtg/ tfddtg
      integer qdsdev,qpydev,qecho,qlecho
      common /device/ qdsdev,qpydev,qecho,qlecho

      data lctrak /3/
      data icolcm /16/

c     if tracking is not turned on, then cannot set the fade time.

c jit      if (.not. ltonov(lctrak)) then
c jit         call mesg(1247)
c jit         call paws
c jit         goto 300
c jit      endif

      if (trackn) then
         print *, 'enter setfad'
         print *, '   tfadtm = ', tfadtm
      end if

c     print out msg to user to enter new fade time
c
      call mesg(1235)
c
c     back up one row and print out msg to show current fade time
c
      call comvpt
      call comwin
      call getseg(txtseg)
      call jrclos
      call jropen (txtseg)

      hours = tfadtm / 60
      call cvitoc (hours,chhour)
      minute = mod(tfadtm,60)
      call cvitoc (minute,chmin)
      line(1:38) ='Current fade time in hh:mm format is: '
      line(39:43) = chhour // ':' // chmin
      call jmove(qcxmn + 1,qcymx - 1.3)
      call xsize (1.,1.)
      call xcolor (icolcm)
      call j1strg(line(1:43))
      call jrclos

c
c     get keyboard input
c
      error = 0
      call jkeybs(qdsdev,qpydev,qecho,5,newfad,ilen)
c
c     if user hit carriage return, then go to end of subroutine
c
      if (ilen .eq. 0) then
         call jpurge(txtseg)
         goto 300
      endif
c
c     convert fade time input of hh:mm input to integer minutes
c
      call convfad(newfad,temptm,ilen,error)
c
c     set longer flag true if new fade time is larger than old fade time
c     set longer false if new fade time is smaller than old fade time
c
      if (error .eq. 0) then
         if (temptm .ne. tfadtm) then
```

```
          if (temptm .lt. tfadtm) then
               longer = .false.
          else if (temptm .gt. tfadtm) then
               longer = .true.
          endif

c          if (trackn) then
c          end if

          tfadtm = temptm
c
c         if tnewst is 0 then no tracking data has been put on list,
c         else we know that at least 1 track has been processed.
c
          if (tnewst .ne. 0) then
c
c            reset the dtg
c
             call fadchg(tfddtg)
c
c            jit: call routine to set boxes to invisible if faded.
c
             call fadbox(tfddtg)
c
c            reset the fade index and display or erase tracks
c
             call chgind(tfddtg,longer,tfaddx)

          endif
       endif
      endif
      goto 200
100   print*,'Error in fade time input'
200   continue
      call jpurge(txtseg)

300   continue

      if (trackn) print *, 'exit setfad'

      return
      end


C+*+*+*+*+*+*+*+*+*+*+*+*+*+*+*+*+*+*+*+*+*+*+*+*+*+*+*+*+*+*+*+*+*+*+*+*|*+*+*+*+
c  Unit Name : seticn
c
c  Functional Desription:   Sets scaling factor to make icons same
c                           size as in the construction area.
c
c  Global
c        qbxwmn,qbxwmx   Window coordinates of box area
c        qbywmn,qbywmx
c        xllbvp,yllbvp   Virtual coordinates of box area
c        xurbvp,yurbvp
c
c  Subroutines/functions called
c
c         JXXXX   Di-3000 Subroutines       See user's manual
c
c  Local
c     vx,vy,vz       window coordinates of current window
c     xl,yl,xh,yh    virtual coordinates of current viewport
c     dimvpt         minimum virtual distance of box
c                    (used for square area { if call bsqvpt is used} )
c     xscale         scaling factor to use if icon in box is to be
c                    same as icon in graphics area.
c     yscale         same as xscale
c
c  Programmer
c     Dirk Butson              8/13/85      Initial Entry
c
C-*-*-*-*-*-*-*-*-*-*-*-*-*-*-*-*-*-*-*-*-*-*-*-*-*-*-*-*-*-*-*-*-*-*-*-*|*-*-*-*-
```

```
      subroutine seticn(xscale,yscale)

      common /boxdim/ qbxwmn,qbxwmx,qbywmn,qbywmx
      real            qbxwmn,qbxwmx,qbywmn,qbywmx

      common /combvp/ xllbvp,yllbvp,xurbvp,yurbvp

      real vx(4),vy(4),vz(4)
      call jiwind(vx,vy,vz)
      call jconwv(vx(1),vy(1),vz(1),xl,yl)
      call jconwv(vx(3),vy(3),vz(3),xh,yh)
      dimvpt = amin1(xurbvp-xllbvp,yurbvp-yllbvp)
      xscale = ((vx(3) - vx(1))/(qbxwmx-qbxwmn)) /
     +         ((xh    - xl    )/(dimvpt))
      yscale = ((vy(3) - vy(1))/(qbywmx-qbywmn)) /
     +         ((yh    - yl    )/(dimvpt))
      return
      end

C+*+*+*+*+*+*+*+*+*+*+*+*+*+*+*+*+*+*+*+*+*+*+*+*+*+*+*+*+*+*+*+*+*+*|*+*+*+*+
C UNIT NAME:                     SETPRO
C
C FUNCTIONAL DESCRIPTION:        .
C
C CALLED BY:                     STATEC
C
C PROGRAMMER:                    DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*|*-*-*-*-

      subroutine setpro
c
c     this subroutine is the set projection state interpreter (13)
c
      common /states/ nextst
      common /indpar/ indpro,indftr
c     map parameters
      logical lton(16),dotem
      integer ipgrid(4),ltyptb(16)
      common /map/ XRNM,XC,YC,LEVEL,CLAT,CLON,XRAD,YRAD,ITPROJ,
     +    IRES,LTYPTB,LUNDAT,LUNIND,LUNLIN,LTON,IPGRID,DOTEM,
     +    ORHALT
c
      itproj = indpro
      nextst = 14
c
      return
      end

C+*+*+*+*+*+*+*+*+*+*+*+*+*+*+*+*+*+*+*+*+*+*+*+*+*+*+*+*+*+*+*+*+*+*|*+*+*+*+
C UNIT NAME:                     SETSCA
C
C FUNCTIONAL DESCRIPTION:        .
C
C CALLED BY:                     STATEC
C
C PROGRAMMER:                    DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*|*-*-*-*-

      subroutine setsca
c
c     this subroutine is the set scale state interpreter (17)
c
      common /states/ nextst
      logical iseoc
      logical isnm,iskilo,ismile
c     map parameters
      logical lton(16),dotem
      integer ipgrid(4),ltyptb(16)
      common /map/ XRNM,XC,YC,LEVEL,CLAT,CLON,XRAD,YRAD,ITPROJ,
     +    IRES,LTYPTB,LUNDAT,LUNIND,LUNLIN,LTON,IPGRID,DOTEM,
```

```
     +       ORHALT
c
        initls = nextst
c       do until nextst not = initial state
  100   continue
            call getwrd
            if (iseoc().or.isnm()) then
c ***           set scale
                nextst = 14
            else if (iskilo()) then
c ***           convert number
c ***           set scale
                nextst = 14
            else if (ismile()) then
c ***           convert number
c ***           set scale
                nextst = 14
            else
c ***           set scale
                call putwrd
                nextst = 1
            endif
        if (nextst.eq.initls) go to 100
c
        return
        end


C+*+*+*+*+*+*+*+*+*+*+*+*+*+*+*+*+*+*+*+*+*+*+*+*+*+*+*+*+*+*+*+*+*+*+*+*+|*+*+*+*+
C* UNIT NAME:                    setvar
C*
C* FUNCTIONAL DESCRIPTION:
C*
C*   Block data routine which initializes control variables to point
C* to the main menu (a block data routine is used in Fortran77 to
C* initialize large areas of common blocks).
C*
C*
C* INPUT FILES/PARAMETERS:
C*
C*       global variables described below
C*
C* OUTPUT FILES/PARAMETERS:
C*
C*     Global Variables
C*       qcancl          logical; cancel flag
C*       qext2m          logical; exit to main menu flag
C*       qretrn          logical; return to previous menu flag
C*       qstmnu          logical; flag to put current menu on the stack
C*       qmloc           integer; current location in the stack
C*       qnextm          integer; next menu to be displayed
C*       qcmpfl          logical; compass is present flag
C*
C* RESTRICTIONS:
C*
C*       not restricted
C*
C* SUBROUTINES CALLED:
C*
C*       no subroutines called
C*
C* CALLED BY:                    INIT, MHAND
C*
C* LOCAL VARIABLES:
C*
C*       no local variables
C*
C* ABNORMAL RETURN CONDITIONS:
C*
C*       no abnormal return conditions
C*
C* LOCATION:
C*
C*       /u2/vcn/a21proto/setvar
```

```
C*
C* PROGRAMMER:              DATE OF LAST CHANGE:    REASON FOR CHANGE:
C*
C*  VCNewton                    15 August 1983        initial entry
C*
C-*-*-*-*-*-*-*-*-*-*-*-*-*-*-*-*-*-*-*-*-*-*-*-*-*-*-*-*-*-*-*-*-*-*-*|*-*-*-*-

        subroutine setvar

C       Block data routine, initializes control variables to point to the
C       main menu

C        (**Declare common blocks and common block variables**)
         Integer qmloc,qnextm
         Logical qcancl,qext2m,qretrn,qstmnu
         Common /b1/ qcancl,qext2m,qretrn,qstmnu,qnextm
         Common /b4/ qmloc
         Common /comflg/qcmpfl
            Logical qcmpfl
c        print*,'Setvar -- enter'
C        (**Initialize control variables**)
         qcancl=.false.
         qext2m=.false.
         qretrn=.false.
         qstmnu=.false.
         qnextm=1
         qmloc=1
         qcmpfl = .false.
c        print*,'Setvar -- exit',qnextm
      End

C+*+*+*+*+*+*+*+*+*+*+*+*+*+*+*+*+*+*+*+*+*+*+*+*+*+*+*+*+*+*+*+*+*+*+*|*+*+*+*+
C UNIT NAME: sgn
C
C FUNCTIONAL DESCRIPTION:  Arithmetic signum function
C
C INPUT FILES/PARAMETERS:
C
C GLOBAL VARIABLES : NONE.
C
C OUTPUT FILES/PARAMETERS:  Returns true if x >= 0 (in ispos)
C
C SUBROUTINES/FUNCTIONS CALLED :
C
C CALLED BY:                    FDRAWV
C
C LOCAL VARIABLES: NONE.
C
C RESTRICTIONS: NONE.
C
C ABNORMAL RETURN CONDITIONS:   NONE.
C
C LOCATION:
C
C PROGRAMMER:                   DATE OF LAST CHANGE     REASON FOR CHANGE
C
C     Edward Swing                                      ORIGINAL CODE.
C
C-*-*-*-*-*-*-*-*-*-*-*-*-*-*-*-*-*-*-*-*-*-*-*-*-*-*-*-*-*-*-*-*-*-*-*|*-*-*-*-

        subroutine sgn(x,ispos)

        logical ispos

        if (x.ge.0.) then
            ispos = .true.
        else
            ispos = .false.
        endif

        return
        end
```

```
C+*+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:          SHOVPT
c
c  Functional Description:
c       this subroutines sets the short menu area viewport
c
c  Input Files/Parameters:
c       xllmvp          REAL
c       xurmvp          REAL
c       yurmvp          REAL
c       yurbvp          REAL
c
c  Output Files/Parameters:          N/A
c
c  Subroutines/Functions Called:
c       Note: Subroutines preceded by a "j" are explained in the DI-3000 manual.
c
c  Called By:                      MAKSHO
c
c  Local Variables:    N/A
c
c  Restrictions:       N/A
c
c  Abnormal Return Conditions: N/A
c
c  Location:   /a21/dave
c
c  Programmer          Date of Last Change        Reason for Change
c
C-*-*-*-*-*-*-*-*-*-*-*-*-*-*-*-*-*-*-*-*-*-*-*-*-*-*-*-*-*-*-*-*-*-*-*-*-*|*-*-*-*-
c
       subroutine shovpt
c
c      this subroutines sets the short menu area viewport
c
       common /commvp/ xllmvp,yllmvp,xurmvp,yurmvp
       common /combvp/ xllbvp,yllbvp,xurbvp,yurbvp
c
       call jvport (xllmvp,xurmvp,yurbvp,yurmvp)
c
       return
       end


C+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME: SHOWNM
C
C FUNCTIONAL DESCRIPTION:  FINDS AREA NAME AND RETURNS MAP PARAMETERS.
C
C INPUT FILES/PARAMETERS:
C
C        MSG                     CHAR*80     AREA NAME.
C        ISL                     INTEGER     LENGTH OF AREA NAME.
C
C GLOBAL VARIABLES :
C
C        QLUNNA                  INTEGER     LOGICAL UNIT NUMBER FOR NAMES
C                                            FILE.
C
C OUTPUT FILES/PARAMETERS:
C
C        PARMS                   INTEGER(4)  MINLAT,MAXLAT,MINLON,MAXLON.
C        FOUND                   LOGICAL     INDICATES WHETHER AREA NAME WAS FOUND.
C
C SUBROUTINES/FUNCTIONS CALLED :
C
C        TOCAPS                  CONVERTS LETTERS TO CAPITALS.
C
C CALLED BY:                      FSHOWA, ISAREA
C
C LOCAL VARIABLES:
C
C        CHATMP                  CHAR*50     PATHNAME.
C
```

```
C RESTRICTIONS: NONE.
C
C ABNORMAL RETURN CONDITIONS:    NONE.
C
C LOCATION:                      /a21/gjf/MAPADD.FTN
C
C PROGRAMMER:                    DATE OF LAST CHANGE     REASON FOR CHANGE
C
C     DAVE NATION                                        ORIGINAL CODE.
C     JERRY FENERTY                                      DOCUMENT AND MODIFY
C                                                        FOR A21 PROTOTYPE.
C
C-*-*-*-*-*-*-*-*-*-*-*-*-*-*-*-*-*-*-*-*-*-*-*-*-*-*-*-*-*-*-*-*-*-*-*-*-*|*-*-*-*-

        SUBROUTINE SHOWNM (MSG,ISL,PARMS,FOUND,TYPEC)

C       THIS SUBROUTINE FINDS AN AREA NAME AND RETURNS MAP PARAMETERS

        REAL PARMS(4)

        INTEGER QKB,QICRT
        COMMON /TERMIN/ QKB,QICRT

        INTEGER QLUNNA
        COMMON /NMLIM/ QLUNNA,QAREAN,QAREAX

        CHARACTER*80 MSG
        CHARACTER*20 NAME
        CHARACTER*80 CHATMP
        CHARACTER TYPEC

        CHARACTER*50 QDFPTH
        common /mapath/ QDFPTH
        INTEGER QLENDF
        common /lenmap/ QLENDF
        INTEGER   isecs,imins
        REAL      c,cs
        COMMON    /c/ c,isecs,cs,imins

        LOGICAL FOUND
        DTORAD=C*60.

        CALL TOCAPS (MSG,ISL)
        if (qlendf.gt.0) then
            CHATMP = QDFPTH(1:QLENDF) // 'namlim.dat'
            lentmp = qlendf+10
        else
            chatmp = 'namlim.dat'
            lentmp = 10
        endif
        OPEN(UNIT=QLUNNA,FILE=CHATMP(1:lentmp),STATUS='OLD',
     +  ERR=671)
        REWIND QLUNNA
        FOUND=.FALSE.

 100    CONTINUE

            READ(QLUNNA,1110,ERR=182,END=190) NAME(1:20),
     +      (PARMS(I),I=1,4),
     +      QCLAT,QCLON,QDLAT,QDLON,TYPEC
1110        FORMAT(A20,2(F5.1,1X),6(F6.1,1X),A1)

            IF (NAME(1:ISL).EQ.MSG(1:ISL)) THEN

                FOUND=.TRUE.

                DO 150 I=1,4

                    IF (PARMS(I).GT.180.) PARMS(I)=PARMS(I)-360.
                    PARMS(I)=PARMS(I)*DTORAD

 150            CONTINUE

                GO TO 190
```

```
          ENDIF

          GO TO 100

  182     CONTINUE
c               PRINT*,'DECODE ERROR ON NAME LIMITS FILE'

  190     CONTINUE
          GO TO 699

  671     CONTINUE
c               PRINT*,'PLOT -- ERROR ON OPEN OF NAME LIMITS FILE'

  699     CONTINUE

C         MYCROFT CLOSE

          CLOSE(QLUNNA)

          RETURN
          END

C+*+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:                          SOVERL
c
c  Functional Description:             Utility to set write mask to the viewing
c                                      planes.  Sets mask for overlay planes.
c
c  Input Files/Parameters:             N/A
c
c  Output Files/Parameters:            N/A
c
c  Called By:                          CLRCOM, CLRFUL, CLRGRA, CLRVPT, DRWAMP,
C                                      FCFILL, GLTYPE, INIPIC, MAPPER
C                                      RESCON, GEOCON
c
c  Local Variables:
c    code        integer               escape code number
c    ilist       integer               array of integer parameters
c    ninteg      integer               number of integer parameters
c    nreal       integer               number of real paramenters
c    rlist       real                  array of real parameters
c
c  Restrictions:                       N/A
c
c  Subroutines/Functions Called:               N/A
c
c  Abnormal Return Conditions:                 N/A
c
c  Location:                                   /u1/a21/bap/sbakovr.f
c
c  Programmer: Brian A. Pelletier
c
C-*-*-*-*-*-*-*-*-*-*-*-*-*-*-*-*-*-*-*-*-*-*-*-*-*-*-*-*-*-*-*-*-*-*-*-*|*-*-*-*-

      SUBROUTINE SOVERL

c     set write mask to the viewing planes.  Sets mask for overlay planes.

        integer code, ninteg, nreal, ilist(1)
        real rlist(1)
        data code, ninteg, nreal/5127, 1, 0/
        data ilist(1)/248/
        call jescap(code, ninteg, nreal, ilist, rlist)
      return
      end

C+*+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:                          sparam

c  Functional Description:
c       this subroutine saves map parameters
```

```
c
c  Input Files/Parameters:

c  Output Files/Parameters: N/A

c  Subroutines/Functions Called:

c  Called By:                       RESCON, SAVDIS

c  Local Variables: N/A

c  Restrictions: N/A

c  Abnormal Return Conditions:  N/A
c  Location:      /a21/dave

c  Programmer        Date of Last Change       Reason for Change
c                                              Original entry.
c  Tom Wescott  (NOSC)     11/87               Add std parallels.
C
C-*-*-*-*-*-*-*-*-*-*-*-*-*-*-*-*-*-*-*-*-*-*-*-*-*-*-*-*-*-*-*-*-*-*-*-*-*|*-*-*-*-

        subroutine sparam (len,name,dataon,ierror)

c       this subroutine saves map parameters

        character*6 curwdb
        common /curwdb/ curwdb
        common /lenwdb/ lenwdb
        character*(*) name
        logical dataon
        character*50 filenm
        character*17 chastr
        logical lton(16),dotem
        integer ipgrid(4),ltyptb(16)
        common /map/ XRNM,XC,YC,LEVEL,CLAT,CLON,XRAD,YRAD,ITPROJ,
     +      IRES,LTYPTB,LUNDAT,LUNIND,LUNLIN,LTON,IPGRID,DOTEM,
     +      ORHALT
        common /conic/ spll1,spll2,tranl,trank,tranr,tscale,pole,tilt
        dimension ltypov(16)
        logical ltonov(16),rankt(26,16)
        common /maptoo/ ltypov,ltonov,rankt
        real retabl(4)
        integer intabl(17)
        character*50 classi
        common /classi/ classi
        common /lencla/ lencla
        common /overly/ overtb
        logical overtb(16)
        character*80 ovfnam
        common /ovfnam/ ovfnam
        common /lenovf/ lenovf
        logical filply,opnply
        common / polycb / filply,opnply
        data iversn/7/
        data ifl/9/,irdwr/1/

c       print*,'Enter sparam ',len,name
        filenm = name(1:len) // '.prm'
        call openit (filenm,len+4,ifl,irdwr,ierror)
        if (ierror.ne.0) go to 150
        call writin (ifl,iversn,1,ierror)
        retabl(1) = xc
        retabl(2) = yc
        retabl(3) = xrad
        retabl(4) = yrad
        call writre (ifl,retabl,4,ierror)
        retabl(1) = xrnm
        retabl(2) = clat
        retabl(3) = clon
        retabl(4) = orhalt
        call writre (ifl,retabl,4,ierror)
        do 120 i=1,4
            intabl(i) = ipgrid(i)
```

```
  120   continue
        intabl(5) = level
        intabl(6) = itproj
        intabl(7) = ires
        call writin (ifl,intabl,7,ierror)
        call logasc(lton,16,chastr(1:16))
        call logasc(dotem,1,chastr(17:17))
        call writch (ifl,chastr,17,ierror)
        call writch (ifl,curwdb,lenwdb,ierror)
        call writch (ifl,classi,lencla,ierror)
        overtb(5) = filply
        call logasc(overtb,16,chastr)
        call writch (ifl,chastr,16,ierror)
        call writch (ifl,ovfnam,lenovf,ierror)
c
c       Save the standard parallels.
        retabl(1) = splll
        retabl(2) = spll2
        retabl(3) = tilt
        call writre (ifl,retabl,3,ierror)
c
        go to 155
  150       continue
            ierror = 2
            print*,'Error in parameter file save'
c           call derror(30,'Problem saving parameter file ',.true.,5,ch)
  155   continue
        call closit (ifl)

        return
        end


C+*+*+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:                  SPCNWV
c
c  Functional Description:     SPCNWV is a special conversion routine
c                              for world-to-virtual conversions where
c                              the virtual value may be outside of the
c                              specified virtual space.  (This corrects
c                              errors which occurred by calling the
c                              routine JCONWV.)
c
c  Input Files/Parameters:
c    xpt      real        world x-value
c    ypt      real        world y-value
c
c  Output Files/Parameters:
c    xvpt     real        virtual x-value
c    yvpt     real        virtual y-value
c
c  Subroutines/Functions Called:
c    All subroutine names preceeded by a "j" are DI3000 subroutines.
c    For more information see the DI3000 Users Guide.
c
c  Called by:
c
c  Local Variables:
c    xllv     real        lower bound virtual x-value
c    xllw     real        lower bound world x-value
c    xurv     real        upper bound virtual x-value
c    xurw     real        upper bound world x-value
c    yllv     real        lower bound virtual y-value
c    yllw     real        lower bound world y-value
c    yurv     real        upper bound virtual y-value
c    yurw     real        upper bound world y-value
c
c  Restrictions: N/A
c
c  Abnormal Return Conditions: N/A
c
c  Location: N/A
c
c  Programmer: Alan V. Wenell
```

```
c
C-*-*-*-*-*-*-*-*-*-*-*-*-*-*-*-*-*-*-*-*-*-*-*-*-*-*-*-*-*-*-*-*-*-*-*-*-*-*-*-*-*-*-*|*-*-*-*-
c
       subroutine spcnwv (xpt, ypt, xvpt, yvpt)

       real           xllv
       real           xllw
       real           xpt
       real           xurv
       real           xurw
       real           xvpt
       real           yllv
       real           yllw
       real           ypt
       real           yurv
       real           yurw
       real           yvpt

c      print *, 'enter spcnwv'
c      print *, 'xpt, ypt = ', xpt, ypt

c ----- get current world parameters
       call j4rget (1, xllw, xurw, yllw, yurw)
c      print *, 'xllw, xurw, yllw, yurw: ', xllw, xurw, yllw, yurw

c ----- get current virtual parameters
       call j4rget (2, xllv, xurv, yllv, yurv)
c      print *, 'xllv, xurv, yllv, yurv: ', xllv, xurv, yllv, yurv

c ----- solve following equations for xvpt, yvpt:
c -----    (xvpt-xllv) / (xurv-xllv) = (xpt-xllw) / (xurw-xllw)
c -----    (yvpt-yllv) / (yurv-yllv) = (ypt-yllw) / (yurw-yllw)

       xvpt = (((xpt - xllw) * (xurv - xllv)) /
     +       (xurw - xllw)) + xllv

       yvpt = (((ypt - yllw) * (yurv - yllv)) /
     +       (yurw - yllw)) + yllv

c      print *, 'exit spcnwv'
c      print *, 'xvpt, yvpt = ', xvpt, yvpt

       return
       end


C+*+*+*+*+*+*+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    SPROJE
C
C FUNCTIONAL DESCRIPTION:       .
C
C CALLED BY:                    STATEC
C
C PROGRAMMER:                   DATE OF LAST CHANGE     REASON FOR CHANGE
c  S. Lamb               Feb 1988                  command fix - sproje
C
C-*-*-*-*-*-*-*-*-*-*-*-*-*-*-*-*-*-*-*-*-*-*-*-*-*-*-*-*-*-*-*-*-*-*-*-*-*-*-*-*-*-*-*|*-*-*-*-
c
       subroutine sproje
c
c      this subroutine is the projection state interpreter (12)
c
       common /states/ nextst
       logical isproj
       logical wordis,iseoc
c
       initls = nextst
c      do until nextst not = initial state
 100   continue
           call getwrd
           if (wordis('TO')) then
c * ** *** **** ***** ****** ******* not understood / implem.
               nextst = 15
           else if (iseoc()) then
```

```
            nextst = 5
        else if (isproj()) then
            nextst = 13
        else
            call putwrd
            nextst = 5
        endif
      if (nextst.eq.initls) go to 100
c
      return
      end


C+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                   SSCALE
C
C FUNCTIONAL DESCRIPTION:      .
C
C CALLED BY:                   STATEC
C
C PROGRAMMER:                  DATE OF LAST CHANGE     REASON FOR CHANGE
c  S. Lamb               Feb 1988                 command fix - sscale
C
C-*-*-*-*-*-*-*-*-*-*-*-*-*-*-*-*-*-*-*-*-*-*-*-*-*-*-*-*-*-*-*-*-*-*-*-*-*|*-*-*-*-
c
      subroutine sscale
c
c     this subroutine is the scale state interpreter (16)
c
      common /states/ nextst
      logical wordis,iseoc
      logical isnumb
c
      initls = nextst
c     do until nextst not = initial state
  100 continue
          call getwrd
          if (wordis('TO')) then
c * ** *** **** ***** ****** ******* not understood / implem.
              nextst = 15
          else if (iseoc()) then
              nextst = 6
          else if (isnumb()) then
              nextst = 17
          else
              call putwrd
              nextst = 6
          endif
      if (nextst.eq.initls) go to 100
c
      return
      end


C+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                   STATEC
C
C FUNCTIONAL DESCRIPTION:      .
C
C CALLED BY:                   COMMND
C
C PROGRAMMER:                  DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*|*-*-*-*-

      subroutine statec
c
c     this subroutine handles control of command states
c
      common /states/ nextst
c     print*,'statec -- enter'
      call getcmd
      nextst = 1
c     do until nextst = 0
```

```
 100   continue
c          print*,'statec -- next state is ',nextst
           if (nextst.eq.1) then
                                   call cmdmai
           else if (nextst.eq.2) then
                                   call drawst
           else if (nextst.eq.3) then
                                   call drcmap
           else if (nextst.eq.4) then
                                   call inqsta
           else if (nextst.eq.5) then
                                   call dispro
           else if (nextst.eq.6) then
                                   call dissca
           else if (nextst.eq.7) then
                                   call discen
           else if (nextst.eq.8) then
                                   call drawft
           else if (nextst.eq.9) then
                                   call majors
           else if (nextst.eq.10) then
                                   call minors
           else if (nextst.eq.11) then
                                   call calcpr
           else if (nextst.eq.12) then
                                   call sproje
           else if (nextst.eq.13) then
                                   call setpro
           else if (nextst.eq.14) then
                                   call erasem
           else if (nextst.eq.15) then
                                   call notund
           else if (nextst.eq.16) then
                                   call sscale
           else if (nextst.eq.17) then
                                   call setsca
           else if (nextst.eq.18) then
                                   call scente
           else if (nextst.eq.19) then
                                   call setcor
           else if (nextst.eq.20) then
                                   call areanf
           else if (nextst.eq.21) then
                                   call incdet
           else if (nextst.eq.22) then
                                   call decdet
           else if (nextst.eq.23) then
                                   call incsca
           else if (nextst.eq.24) then
                                   call decsca
           else if (nextst.eq.25) then
                                   call erases
           else if (nextst.eq.26) then
                                   call turnst
           else if (nextst.eq.27) then
                                   call execut
           else if (nextst.eq.28) then
                                   call savest
           else if (nextst.eq.29) then
                                   call closes
           else if(nextst.eq.30) then
                                   call removf
           else
               print*,'statec -- nextst not known ',nextst
               nextst = 1
           endif
       if (nextst.ne.0) go to 100
 190   continue
c      print*,'statec -- exit'
c
       return
       end


C+*+*+*+*+*+*+*+*+*+*+*+*+*+*+*+*+*+*+*+*+*+*+*+*+*+*+*+*+*+*+*+*+*+*+*|*+*+*+*+
```

```
C UNIT NAME:                        STORE
C
C FUNCTIONAL DESCRIPTION:           .
C
C CALLED BY:                        INTSCN, MHAND, SUBCHK
C
C PROGRAMMER:                       DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*|*-*-*-*-

      subroutine store
      return
      end

C++++++++++++++++++++++++++++++++++++++++++++++++++++++++++++++++++++++++|+++++++
C UNIT NAME:                        STOTXT
C
C FUNCTIONAL DESCRIPTION:           .
C
C CALLED BY:                        ANNOTA
C
C PROGRAMMER:                       DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*|*-*-*-*-

      subroutine stotxt

c     stub subroutine
      return
      end

C++++++++++++++++++++++++++++++++++++++++++++++++++++++++++++++++++++++++|+++++++
C UNIT NAME:                        STRIND
C
C FUNCTIONAL DESCRIPTION:           .
C
C CALLED BY:                        MHAND, SUBCHK
C
C PROGRAMMER:                       DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*|*-*-*-*-

      subroutine strind
      return
      end

C++++++++++++++++++++++++++++++++++++++++++++++++++++++++++++++++++++++++|+++++++
C UNIT NAME:                        SUBCAL
C
C FUNCTIONAL DESCRIPTION:           .
C
C CALLED BY:                        MHAND
C
C PROGRAMMER:                       DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*|*-*-*-*-

    Subroutine SUBCAL (menun,ierror)

C       (**Declare variables and common blocks**)

        Integer qcrmnu
        Common /b6/qcrmnu
        common /logseg/ nsglog
        logical logoon
        common /logoon/logoon
        logical sys
        common /sysdbc/ sys

        if (sys)
     +     print*,'subcal -- enter  menun qcrmnu : ',menun,qcrmnu
```

```
C         (**Draw menu**)
          mensav = qcrmnu
          call drawm (menun,ierror)
          if (ierror.eq.0) then
C            (**Execute appropriate menu controller**)
             if (qcrmnu.eq.1) then
                if (logoon) then
                  call jvisbl (nsglog,1)
                  call MMCON
                  call jvisbl (nsglog,0)
                  logoon = .false.
                  call jpurge (nsglog)
                else
                  call MMCON
                endif
             else if (qcrmnu.eq.2) then
                call GEOCON
             else if (qcrmnu.eq.3) then
                call FTRCON
             else if (qcrmnu.eq.4) then
                call OVRCON
             else if (qcrmnu.eq.5) then
                call PROCON
             else if (qcrmnu.eq.6) then
                call DETCON
             else if (qcrmnu.eq.7) then
                call RSLCON
             else if (qcrmnu.eq.8) then
                call RESCON
             else if (qcrmnu.eq.9) then
                call TRKCON
             else if (qcrmnu.eq.19) then
                call CLASS
                call mesg(1)
             else if (qcrmnu.eq.20) then
                call recdis
             else if (qcrmnu.eq.21) then
                call savdis
             else
                ierror = 3
                print*,'Missing menu controller for menu number ',qcrmnu
C               (**Else qcrmnu value is invalid, execute system**)
C               (**error routine                                **)
c               call MESG(1)
c               (**Set current menu back to previous menu**)
                qcrmnu = mensav
             endif
C            (**End case**)
          endif
          if (ierror.ne.0) then
             call mesg(ierror)
             call paws
          endif
          if (sys)
     +    print*,'subcal -- exit  ierror: ',ierror
      End


C+*+*+*+*+*+*+*+*+*+*+*+*+*+*+*+*+*+*+*+*+*+*+*+*+*+*+*+*+*+*+*+*+*+*+*+|*+*+*+*+
C UNIT NAME:                       subchk
C
C FUNCTIONAL DESCRIPTION:          Do essential check functions.
C
C INPUT FILES/PARAMETERS:
C     Menu control globals
C       qcancl      bl       logical  cancel flag
C       qext2m      bl       logical  exit to main menu flag
C       qretrn      bl       logical  return to previous action/menu
C
C     General globals
C       qfb         butons   integer  array of values for function buttons
C       qmb         butons   integer  array of values for the mouse buttons
C
```

```
C
C
C OUTPUT FILES/PARAMETERS:
C
C     error                   logical  true if an error is detected by
C                                      check
C     rflag                   logical  true if exiting the calling menu
C
C SUBROUTINES/FUNCTIONS CALLED
C
C     prompt                  displays a message on the screen and
C                             gets input from the user
C     redraw                  clear the screen and redraw it from segment
C                             storage
C     tmpstr                  temporary store the graphic
C
C
C CALLED BY:                   CHECK, HELP
C
C LOCAL VARIABLES:
C
C     ans                     char     answer returned from a prompt
C     button                  integer  button passed to check
C     cmenu                   integer  menu id of routine calling check
C     len                     integer  length of the answer returned
C                                      by a prompt
C
C RESTRICTIONS:
C
C
C ABNORMAL RETURN CONDITIONS:  n/a
C
C LOCATION:                    /u2/say/TEXT/source/check.f
C
C PROGRAMMER:                  DATE OF LAST CHANGE    REASON FOR CHANGE
C
C     SAYates                         10/27/83        initial entry
C
C-*-*-*-*-*-*-*-*-*-*-*-*-*-*-*-*-*-*-*-*-*-*-*-*-*-*-*-*-*-*-*-*-*-*-*-*|*-*-*-*-

      subroutine subchk (button,cmenu,error,rflag)

c     Do essential check functions

c*****definition and declaration of common blocks

      integer     qnextm
      logical     qcancl,qext2m,qretrn,qstmnu,qexitg
      common/b1/qcancl,qext2m,qretrn,qstmnu,qnextm
      common/b5/qexitg

      integer     qfb(26),qmb(4)
      common/butons/qfb,qmb

      common /msgold/ msgold,msgonm
      integer     qsegid,qpick
      logical     qmodfl
      common/picks/qsegid,qpick,qmodfl

c*****declaration of local variables

      integer     cmenu,button,len
      logical     rflag,error
      character*1 ans
      logical sys
      common /sysdbc/ sys

      if (sys) print*,'subchk -- enter ',button,cmenu

      qretrn = .false.
      rflag = .false.
      error = .false.


c*****beginning of routine
```

```
c*****leave
c      if((button .eq. qfb(26) .or. button .eq. qmb(2))
       if((button .eq. qfb(26) .or. button .eq. qmb(3))
     +      .and. cmenu .ne. 1) then
          qretrn = .true.
          rflag = .true.
c*****exit to main menu
       else if(button .eq. qfb(22)) then
          call prompt(4,ans,1,len)
          if(ans(1:1) .eq. 'y' .or. ans(1:1) .eq. 'Y') then
             qext2m = .true.
          endif
c*****temporary store
       else if(button .eq. qfb(25)) then
          call mesg(74)
          call store
          call strind
          if(qretrn) then
             rflag = .true.
          endif
          qretrn = .false.
c*****cancel
       else if(button .eq. qfb(21)) then
          call prompt(360,ans,1,len)
          if(ans .eq. 'y' .or. ans .eq. 'Y') then
             qcancl = .true.
          endif
c*****redraw
       else if(button .eq. qfb(20)) then
          call redraw
c*****exit graphics
       else if (button .eq. 95) then
          call prompt(4,ans,1,len)
          if(ans(1:1) .eq. 'y' .or. ans(1:1) .eq. 'Y') then
             qexitg = .true.
          else
             call menupr
          endif
       else
          error = .true.
       endif
       if (qcancl.or.qext2m.or.qexitg) rflag = .true.
       if (sys) print*,'subchk -- exit ',error,rflag
       return
       end


C+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                       SUPBOX
C
C FUNCTIONAL DESCRIPTION:          .
C
C CALLED BY:                       PLTSUP
C
C PROGRAMMER:                      DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*|*-*-*-*-

      subroutine supbox(trec)

c     this subroutine is called to turn invisible a box around a plot which has
c     been suppressed. (jit)

      integer     tnum

      character*9 tbuf
      character*160 trec

      character*2 actmrk(260)
      integer*4 mrkcnt
      integer*4 trklst(260)
      integer*4 curseg(260)
      character*9 boxdtg(260)
      logical boxvis(260)
```

```
      common /actmrk/ trklst,mrkcnt,actmrk,curseg,
     +                boxdtg, boxvis

c     pull out the date time group from the record.

      read(trec,10) tnum,tbuf
  10  format(17x,i4,a9)

      do 20 i = 1,mrkcnt
         if (tnum .eq. trklst(i)) then
c            print *, 'trklst(i) is ', trklst(i)
c            print *, 'curseg(i) is ', curseg(i)
c            print *, ' '
            if (boxdtg(i) .eq. tbuf) then
               call jvisbl(curseg(i),0)
               boxvis(i) = .false.
            endif
         endif
  20  continue

      return

      end

C+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                     SYSNAM
C
C FUNCTIONAL DESCRIPTION:        RETURNS A PATHNAME FOR HLDF FILE WITHIN
C                                SYSTEM ADMINISTRATOR'S DIRECTORY
C
C INPUT PARAMETERS:
C
C   OLDNAM  -  CHAR*(*)  NAME OF HLDF FILE
C
C OUTPUT PARAMETERS:
C
C   NEWNAM  -  CHAR*(*)  COPY OF HLDF FILE BEING PRINTED IN SYSTEM
C                        ADMINISTRATOR'S DIRECTORY
C
C CALLED BY:
C
C   INTSCN - CHANGES VIEWPORT TO FULL SCREEN, REDRAWS PICTURE, SAVES FILE
C            IN SYSTEM ADMINISTRATOR'S DIRECTORY
C
C LOCAL VARIABLES:
C
C   I - INCREMENT THROUGH CHARACTER STRING OF NAMED HLDF FILE
C   LENGTH - THE MAXIMUM LENGTH TO INCREMENT THROUGH NAMED HLDF FILE
C
C RESTRICTIONS:
C
C   APOLLO DEPENDENT SUBROUTINE
C
C WRITTEN BY:
C
C    PROGRAMMER           DATE       REASON FOR CHANGE
C   DIRK BUTSON          850116        INITIAL ENTRY
C
C-*-*-*-*-*-*-*-*-*-*-*-*-*-*-*-*-*-*-*-*-*-*-*-*-*-*-*-*-*-*-*-*-*-*-*-*|*-*-*-*-
C
      SUBROUTINE SYSNAM(OLDNAM,NEWNAM)
C
C  RENAMES QNAME TO SAVE HLDF FILE IN SYSTEM ADMINISTRATOR'S DIRECTORY
C
      CHARACTER*(*) OLDNAM,NEWNAM
      INTEGER I,LENGTH

      NEWNAM(1:12) = '/A21/SYSTEM/'
      I = 1
      LENGTH = MIN ( LEN(NEWNAM)-12 , LEN(OLDNAM))
C ---- LOOP UNTIL END OF FILE NAME OR ALL OF SPACE FOR EITHER
```

```
C       CHARACTER STRING IS FILLED
   10 CONTINUE
      IF (I .LE. LENGTH .AND. OLDNAM(I:I) .NE. ' ') THEN
          NEWNAM((12+I):(12+I)) = OLDNAM(I:I)
          I = I+1
          GOTO 10
      ENDIF
      RETURN
      END


C+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    TIMCHK
C
C FUNCTIONAL DESCRIPTION:       .
C
C CALLED BY:                    DATPOL
C
C PROGRAMMER:                   DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*|*-*-*-*-

      subroutine timchk
c
c     this subroutine checks if at least one minute has gone by
c     on the system clock since this routine was last called.
c     IF so, it fades out all tracks that are no longer in the fade time window
c

      logical click
      logical done
      character*9 curdtg
      character*9 olddtg

      character*160  trkrec (1000)
      common /trkrec/ trkrec
      integer trkndx (1000)
      common /trkndx/ trkndx
      integer tfaddx
      integer tfadtm
      common /tfadez/ tfaddx, tfadtm
      character*9 tfddtg
      common /tfddtg/ tfddtg
      integer numrcs
      common /numrcs/ numrcs
      integer tnewst
      integer toldst
      common /tarbou/ tnewst, toldst
      integer bgnpos
      integer endpos
      common /timpos/ bgnpos,endpos
      logical trackn
      common /trkdbc/ trackn

c
c      curdtg - current time from system clock
c      tfddtg - latest time that can be on the list to be displayed
c      olddtg - oldest time currently on the list being displayed
c      tfaddx - index to oldest non-faded track on the display list
c      click  - true if 1 min. has gone off clock since last check
c

c      check for a time click (one minute) gone by

       if (trackn)  print *, 'enter timchk'

c      if tfaddx is 0 then either no data on list or nothing visible

       if (tfaddx .ne. 0) then
          call chkclk(click,curdtg)
          if(click) then

c              function to compute cur. time - fade time
c              so that all tracks not in time range can
```

```
c               be set invisible.
c               tfddtg is globally used

                call fadtim(curdtg, tfddtg)
c
c               turn off all tracks that are later than lasdtg
c
                done = .false.
 100            if (done) goto 200
c                  get oldest dtg on current display list

                   olddtg(1:9) = trkrec(trkndx(tfaddx))(bgnpos:endpos)

c                  flag is true if first time is later than second

                   call cmptim(olddtg,tfddtg, done)

c                  when lasdtg is older than olddtg, we must
c                  make the track containing olddtg invisible

                   if (.not. done) then
                        if (trackn) then
                            print*,'timchk-- oldtime= ',olddtg
                            print*,'         fadtime= ',tfddtg
                            print *, '   tfaddx = ', tfaddx
                        end if

                        call makinv(tfaddx)
c
c***                    jit: Check to see if point is most recent for that track.
c***                    If it is, then delete box also.
c
                        call fadbox(tfddtg)
c
c                       check for end of circular list
c
                        if (tfaddx .eq. tnewst) then
                            done = .true.
                            tfaddx = 0
c
c                       check for nothing left on list, set tfaddx as flag
c
                        else
                            tfaddx = mod(tfaddx,numrcs) + 1
                        endif
                   endif
               goto 100
 200           continue
           endif
       endif

       if (trackn)  print *, 'exit timchk'

       return
       end


C+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                     TKINFO
C
C FUNCTIONAL DESCRIPTION:        .
C
C CALLED BY:                     FINDTK, TQUERY
C
C PROGRAMMER:                    DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*|*-*-*-*-

      subroutine tkinfo(chkndx,chkseg)

c
c     this subroutine prints info related to the track being interrogated
c     into the communications area
c
```

```
      character*160 line
      character*160 newlin
      character*7 lat
      character*8 lon

      integer button
      integer chkndx
      integer chkseg
      integer icolcm
      integer maxcol
      integer maxtxt
      integer tempseg
      integer trkcol

      integer latbeg,lonbeg,trkbeg,dtgbeg
      integer wrnbeg,pdgbeg,serbeg,repbeg
      integer fdibeg,altbeg,iffbeg,spdbeg
      integer latend,lonend,trkend,dtgend
      integer wrnend,pdgend,serend,repend
      integer fdiend,altend,iffend,spdend
      real qcxmn
      real qcymn
      real qcxmx
      real qcymx
      common/comwdo/qcxmn,qcymn,qcxmx,qcymx

      character*160  trkrec (1000)
      common /trkrec/ trkrec
      integer trkndx(1000)
      common /trkndx/ trkndx

      logical timout
      integer*2 time
      common /timout/ timout,time

      integer qdsdev,qpydev,qecho,qlecho
      common /device/ qdsdev,qpydev,qecho,qlecho
      logical boxon
      integer boxcur
      common /boxcur/ boxon,boxcur


      data latbeg,lonbeg,trkbeg,dtgbeg /3,10,18,22/
      data wrnbeg,pdgbeg,serbeg,repbeg /31,36,38,40/
      data fdibeg,altbeg,iffbeg,spdbeg /42,45,48,50/

      data latend,lonend,trkend,dtgend /9,17,21,30/
      data wrnend,pdgend,serend,repend /35,37,39,41/
      data fdiend,altend,iffend,spdend /44,47,49,52/
      data icolcm /16/
      data maxcol /53/
      data maxtxt /134/
      data trkcol /224/

      line = ' '
      line(1:maxtxt) = trkrec(trkndx(chkndx))(1:maxtxt)
      newlin = ' '
c
c***  add blanks to the text line between each field of data
c
      newlin(1:maxcol) = line(latbeg:latend)//' '//line(lonbeg:lonend)//' '//
     +                   line(trkbeg:trkend)//' '//line(dtgbeg:dtgend)//' '//
     +                   line(wrnbeg:wrnend)//' '//line(pdgbeg:pdgend)//' '//
     +                   line(serbeg:serend)//' '//line(repbeg:repend)//' '//
     +                   line(fdibeg:fdiend)//' '//line(altbeg:altend)//' '//
     +                   line(iffbeg:iffend)//' '//line(spdbeg:spdend)
c
c     move to geographics area and
c     box the current plot that is being interrogated

      lat = line(latbeg:latend)
      lon = line(lonbeg:lonend)
      call gravpt
      call geowin
c
```

```
c***  boxon is set in fmain to false initially, to indicate
c***  that no box has ever been drawn around an interrogated
c***  track.  When the box is drawn for first time, get a
c***  segment# and use it every time for an interrogated plot.
c
      if (.not. boxon) then
            call getseg(boxcur)
            boxon = .true.
      endif

      call jropen(boxcur)
      call xcolor (trkcol)
      call hilplt(lat,lon)
      call jrclos
c
c***  move to communications area viewport,
c***  and put up text from track record.
c
      call comvpt
      call comwin
      call mesg(1203)
      call getseg(tempseg)

      call jropen(tempseg)
      call jmove(qcxmn + .6,qcymx - 1.3)
      call xsize (1.,1.)
      call xcolor (icolcm)
      call j1strg(newlin(1:maxcol))
      newlin(1:80) = line(maxcol+1:maxtxt)
      call jmove(qcxmn + .6,qcymx - 2.6)
      call j1strg(newlin(1:80))
      call jrclos
c
c***  wait for user to hit <f8> to continue
c
c***  set wait time to 360 so that data stays on screen for that long
c
      call buttn(button)
c
c***  set time back to 15 so that incoming tracking data gets checked
c***  every 15 seconds, as usual.
c
      call jpurge(boxcur)
      call jpurge(tempseg)
      call clrmsg


      return
      end


C+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:                        tocaps
c
c  Functional Description:
c       this subroutine converts a character string to all caps for letters
c
c  Input Files/Parameters:
c
c  Output Files/Parameters: N/A
c
c  Subroutines/Functions Called:
c      Note: Subroutines preceded by a "j" are explained in the DI-3000 manual.
c
c  Called By:                        GETCMD, LLCENT, PLTCIT, SHOWNM,
C                                    CLASS, OTHCLS
c
c  Local Variables: N/A
c
c  Restrictions: N/A
c
c  Abnormal Return Conditions:  N/A
c
c  Location:      /a21/dave
```

```
c
c  Programmer          Date of Last Change        Reason for Change
c
C-*-*-*-*-*-*-*-*-*-*-*-*-*-*-*-*-*-*-*-*-*-*-*-*-*-*-*-*-*-*-*-*-*-*-*-*-*-*-*-*-*|*-*-*-*-
c
       subroutine tocaps (char,len)
c
c      this subroutine converts a character string to all caps for letters
c
       character*(*) char
       character*1 ch1
       character*26 small,large
       data small/'abcdefghijklmnopqrstuvwxyz'/
       data large/'ABCDEFGHIJKLMNOPQRSTUVWXYZ'/
c
c      print*,'tocaps -- enter ',char(1:len),'    ',len
       do 110 i=1,len
           ch1 = char(i:i)
           indx = index(small,ch1)
           if (indx .ne. 0) then
               char(i:i) = large(indx:indx)
           endif
110   continue
c      print*,'tocaps -- exit  ',char(1:len),'    ',len
c
       return
       end


C+*+*+*+*+*+*+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:                      tolowr
c
c  Functional Description:
c       this subroutine converts a character string to all lower case
c
c  Called By:                      SETDBG
c
c  Programmer          Date of Last Change        Reason for Change
c
C-*-*-*-*-*-*-*-*-*-*-*-*-*-*-*-*-*-*-*-*-*-*-*-*-*-*-*-*-*-*-*-*-*-*-*-*-*-*-*-*-*|*-*-*-*-
c
       subroutine tolowr (char,len)
c
c      this subroutine converts a character string to all lower case
c
       character*(*) char
       character*1 ch1
       character*26 small,large
       data small/'abcdefghijklmnopqrstuvwxyz'/
       data large/'ABCDEFGHIJKLMNOPQRSTUVWXYZ'/
c
c      print*,'tolowr -- enter ',char(1:len),'    ',len
       do 110 i=1,len
           ch1 = char(i:i)
           indx = index(large,ch1)
           if (indx .ne. 0) then
               char(i:i) = small(indx:indx)
           endif
110   continue
c      print*,'tolowr -- exit  ',char(1:len),'    ',len
c
       return
       end


C+*+*+*+*+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                      TQUERY
C
C FUNCTIONAL DESCRIPTION:
C
C CALLED BY:                      TRKCON
C
C PROGRAMMER:                     DATE OF LAST CHANGE      REASON FOR CHANGE
C
C-*-*-*-*-*-*-*-*-*-*-*-*-*-*-*-*-*-*-*-*-*-*-*-*-*-*-*-*-*-*-*-*-*-*-*-*-*-*-*-*-*|*-*-*-*-
```

```
      subroutine tquery

c
c     this subroutine allows user to interrogate a visible track
c     on the screen to retrieve more info on the track.
c
      logical abort
      logical endlst
      logical found

      integer chkndx
      integer chkseg
      integer pickid
      integer lctrak
      integer segnam

      integer qfb(26)
      integer qmb(4)
      common /butons/ qfb,qmb
      integer ltypov (16)
      logical ltonov (16)
      logical rankt (26, 16)
      common /maptoo/ ltypov, ltonov, rankt
      integer tkoset
      common /tkoset/ tkoset
      integer trkndx(1000)
      common /trkndx/ trkndx
      integer tfaddx
      integer tfadtm
      common /tfadez/ tfaddx, tfadtm
      integer tnewst
      integer toldst
      common /tarbou/ tnewst, toldst
      integer numrcs
      common /numrcs/ numrcs
      logical trackn
      common /trkdbc/ trackn

      data lctrak  /3/

c
c      if tracking  is on ... proceed with operations
c
       if (ltonov(lctrak)) then
c
c          ask user to pick a track for interrogation
c
           abort = .false.

           if (trackn) then
              print*,'tquery- tnewst/abort= ',tnewst,abort
           end if

 100       if (abort) goto 200
              if (tnewst .ne. 0) then
                 call mesg(1237)
                 call pick(ibuttn, segnam, pickid)
                 if (ibuttn .ne. 8 .and. ibuttn .ne. qfb(26)) then
                    if (trackn) then
                       print*,'in tquery-segnam/tfaddx/tnewst = ',
     +                       segnam,tfaddx,tnewst
                    end if
                    chkndx = mod(tfaddx,numrcs) - 1
                    found = .false.
                    endlst = .false.
c
c                   search list until a segment match is found
c                   or the end of the list is reached
c
 150                if (found .or. endlst) goto 175
                       chkndx = mod(chkndx,numrcs) + 1
                       chkseg = trkndx(chkndx) + tkoset
                       if (chkseg .eq. segnam) then
                          found = .true.
```

```
                        else
                            if (chkndx .eq. tnewst) then
                                endlst = .true.
                            endif
                        endif
                    goto 150
 175                continue
c
c                   if match is found, then print information related
c                   to that particular track in the communications area
c
                    if (found) then
                        call tkinfo(chkndx,chkseg)
                    endif
                else
                    abort = .true.
                endif
            else
                abort = .true.
            endif
        goto 100
 200    continue
      endif

      return
      end


C+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                       TSTINI
C
C FUNCTIONAL DESCRIPTION:          .
C
C CALLED BY:                       INIT
C
C PROGRAMMER:                      DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*|*-*-*-*-

        subroutine tstini
c
c       (**Initialize variables for test of individual menus**)
c
        return
        end


C+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                       TURNST
C
C FUNCTIONAL DESCRIPTION:          .
C
C CALLED BY:                       STATEC
C
C PROGRAMMER:                      DATE OF LAST CHANGE     REASON FOR CHANGE
c  S. Lamb                   Feb 1988                command fix - turnst
C
C-*-*-*-*-*-*-*-*-*-*-*-*-*-*-*-*-*-*-*-*-*-*-*-*-*-*-*-*-*-*-*-*-*-*-*-*|*-*-*-*-

        subroutine turnst
c
c       this subroutine is the 'turn' state interpreter (26)
c
        common /states/ nextst
        logical wordis,iseoc
c
        initls = nextst
c       do until nextst not = initial state
 100    continue
            call getwrd
            if (wordis('ON')) then
                nextst = 2
            else if (iseoc()) then
                nextst = 15
```

```
            else if (wordis('OFF')) then
                nextst = 25
            else
                nextst = 15
            endif
        if (nextst.eq.initls) go to 100
c
        return
        end


C+*+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                      TXWRIT
C
C FUNCTIONAL DESCRIPTION:          .
C
C CALLED BY:                      WRITEX
C
C PROGRAMMER:                     DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*-*|*-*-*-*-

        subroutine txwrit(xarray,yarray,lpp,txline,lcnt)

c       this subroutine puts out textual information from a user
c       supplied input file.  The text overlays the graphics area and
c       is displayed in row order as 80 column records.


        character*80 txline(*)
        real xarray(2)
        real yarray(2)
        integer*4 boxseg
        integer*4 edgcol
        integer*4 txtseg
        integer*4 ibuttn
        integer*4 maxlen
        integer*4 lcnt
        integer*4 lpp
        integer*4 page
        integer*4 mysegn
        integer*4 nxtpag
c        integer*4 polcol
        integer*4 qbox,qbkgrd,qmcolr
        common/scratr/qbox,qbkgrd,qmcolr
        integer*4 prvpag
        logical rflag
        common/butons/qfb,qmb
        integer qfb(26),qmb(4)

c  jit  nplane used to check for polygon fill.
        common /nplane/ nplane

        data edgcol /32/
c        data polcol /0/
        data maxlen /20/

        call geowin
        call gravpt

c       create new seg for filled polygon and
c       create new seg for text data

        call getseg(boxseg)
        call getseg(txtseg)
c        call jrclos

c       draw the rectangle to block out current
c       geographic data and move to first text position

        call jropen(boxseg)

c       this is a gold rectangle w/ background color of grey
```

```
        call xcolor(edgcol)
c        call jpidex(polcol,500)
        call jpidex(qbkgrd,500)
c  If on 4 plane node, then don't fill the polygon.
        if (nplane .ne. 4) then
           call jpintr(1)
        else
           call jpintr(0)
        endif

        call jrect(xarray(1)+.5,yarray(1)+.5,xarray(2)-.5,yarray(2)-.5)
        call jsize(1.,2.)
        call jjust(1,1)
        call jrclos

        nxtpag = qfb( 15 )
        prvpag = qfb( 16 )
        rflag = .false.
        page = 1

c       read each line in the file up to page limit or end of file
c       and display the text in the graphics area.

        call distxt(txtseg,txline,page,lpp,lcnt)

c       Initialize the constants 'next page' and 'previous page' to their
c       function buttn values.

 150    continue
           call mpick( ichoic, mysegn, ibuttn)

c          Check to see if one of the paging buttons has been picked.

           if ((ibuttn.eq.nxtpag).or.(ibuttn.eq.prvpag)) then

c               If a paging button has been picked but no paging can occur
c               because # of lines < lines per page, then inform user.

                if( lcnt .lt. lpp ) then
c                     "No previous/last page."
                      call mesg( 495 )
                      call paws
                      call clrmsg
                      call geowin
                      call gravpt


c               Else if 'ibuttn' = next page, then increment 'page'
c               and call 'distxt'.

                else if ( ibuttn.eq.nxtpag ) then
                     if ( page .lt. (int(lcnt / lpp)) + 1 ) then
                        page = page + 1
                        call jpurge(txtseg)
                            call redraw
                        call distxt(txtseg,txline,page,lpp,lcnt)

c                    If no more pages to scroll down, inform user.

                     else
c                       "This is the last page."
                         call mesg( 571 )
                         call paws
                         call clrmsg
                         call geowin
                         call gravpt
                     endif

c                    Else if 'ibuttn' = previous page, then decrement 'page'
c                    and call 'distxt'.

                else if ( ibuttn .eq. prvpag ) then
                     if ( page .gt. 1 ) then
                        page = page - 1
```

```
                    call jpurge(txtseg)
                        call redraw
                    call distxt(txtseg,txline,page,lpp,lcnt)

c                    If no more pages to scroll up, inform user.

                 else
c                   "This is the first page."
                    call mesg( 570 )
                    call paws
                    call clrmsg
                    call geowin
                    call gravpt
                 endif
              endif

c             Else, check for a system menu call.

          else
              call check( ibuttn, mysegn, error, rflag )
              if (rflag ) then
                  goto 180
              endif
          endif
          goto 150
180    continue
       call jpurge(txtseg)
       call jpurge(boxseg)
           call redraw

       return
       end

C+*+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                      UPDTMP
C
C FUNCTIONAL DESCRIPTION:         .
C
C CALLED BY:                      BOXARE, INTSCN, LLCENT
C
C PROGRAMMER:                     DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*-*|*-*-*-*-

       subroutine updtmp

c      substitute for CELEBRATION updtmp

       call drwmap

       return
       end

C+*+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                      VISCHK
C
C FUNCTIONAL DESCRIPTION:         .
C
C CALLED BY:                      NO LONGER USED BY CARICATURE
C
C PROGRAMMER:                     DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*-*|*-*-*-*-

      subroutine vischk (length,vizibl,savef,newlat,newlon,longfl,
     1                   alat,alon,df,arc,itproj,icnt)

c     This subroutine divides the bearing into 10 parts of equal
c     length (i.e. if the bearing is to be drawn for 90 degrees,
c     one quarter of a great circle, then the bearing is divided
c     into segments of 9 degrees each).  It checks each of the 10
c     segments to see if any part of that segment is on the screen.
c
```

```
      real LNP,LNM,L0
      real minlat,maxlat,minlon,maxlon,length,newlat(30),newlon(30)
      real alimit(4),savef(30)
      integer icnt
      logical vizibl(30),longfl,chinv,allinv,someon
      common/constx/sazi,slat,cosazi,scazi,coslat,sinazi,cosi,
     1              sini,cosl0,cosf0,L0,lnp,lnm,f,f0
c     chinv = .true.

      do 200 i=1,icnt
         savef(i) = f
         call nextpt (longfl,alat,alon,df,arc,itproj)
         newlat(i) = alat
         newlon(i) = alon
         maxlat = alat
         maxlon = alon
         f = f + length/real(icnt)
         call nextpt (longfl,alat,alon,df,arc,itproj)
         if (maxlat .lt. alat) then
            minlat = maxlat
            maxlat = alat
         else
            minlat = alat
         endif
         if (maxlon .lt. alon) then
            minlon = maxlon
            maxlon = alon
         else
            minlon = alon
         endif

         alimit(1) = minlat
         alimit(2) = maxlat
         alimit(3) = minlon
         alimit(4) = maxlon

         chinv = .true.

         call checka(chinv,allinv,someon,alimit)

c        print*,'After checka -- chinv,allinv,someon,alimit : ',
c    +   chinv,allinv,someon,alimit

         if (someon) then
            vizibl(i) = .true.
         else
            vizibl(i) = .false.
         endif

  200 continue

      return
      end


C+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    WORDIS
C
C FUNCTIONAL DESCRIPTION:       .
C
C CALLED BY:                    21 subroutines
C
C PROGRAMMER:                   DATE OF LAST CHANGE    REASON FOR CHANGE
C
C-*-*-*-*-*-*-*-*-*-*-*-*-*-*-*-*-*-*-*-*-*-*-*-*-*-*-*-*-*-*-*-*-*-*-*-*-*|*-*-*-*-

        logical function wordis (testwd)
c
c       this function compares the current word to a test word
c
        character*(*) testwd
        logical eol,eoc
        common /comnds/ lenl,indxw,lenw,eol,eoc
        character * 80 comlin
```

```
      common /comlin/ comlin
c
c     print*,'wordis -- enter ',testwd,lenw
      lent = len(testwd)
      if (lenw.gt.lent.or.lenw.le.0.or.
     + comlin(indxw:indxw+lenw-1).ne.testwd(1:lenw)) then
         wordis = .false.
      else
         wordis = .true.
      endif
c     print*,'wordis -- exit ',wordis
c
      return
      end

C+*+*+*+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:                    writch

c  Functional Description:
c       this subroutine writes to ifl in character format
c
c  Input Files/Parameters:

c  Output Files/Parameters: N/A

c  Subroutines/Functions Called:

c  Called By:                    SAVTXT, SPARAM, WSAVPR

c  Local Variables: N/A

c  Restrictions: N/A

c  Abnormal Return Conditions:  N/A

c  Location:     /a21/dave

c  Programmer        Date of Last Change      Reason for Change
c  CS Lamb           1987           system dependent code - writch

C-*-*-*-*-*-*-*-*-*-*-*-*-*-*-*-*-*-*-*-*-*-*-*-*-*-*-*-*-*-*-*-*-*-*-*-*-*-*-*|*-*-*-*-

      subroutine writch (ifl,charar,len,ierror)

c     this subroutine writes to ifl in character format

      character*(*) charar

      ierror = 0
C      write(ifl,*,err=199) '''',charar (1:len),''''
      write(ifl,1100,err=199) charar (1:len)
c ----- updated 7/31/87 CSL
C     USE THIS FORMAT FOR APOLLO, VAX, ...
c 1100  format(' ''', (a), '''')
C     USE THIS FORMAT FOR SUN
 1100 format("'", (a), "'")
c1100 format(a<len>)
      go to 200
  199    continue
         ierror = 2
c        call derror(30,'Problem writing parameter     ',.true.,5,ch)
  200 continue
c     print*,'writch -- charar,len,ierror : ',len,ierror

      return
      end

C+*+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    WRITEX
C
C FUNCTIONAL DESCRIPTION:
C
```

```
C CALLED BY:                     TRKCON
C
C PROGRAMMER:                    DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*-*-*-*|*-*-*-*-

        subroutine writex(xarray,yarray,lpp)

        real xarray(2)
        real yarray(2)
        integer lpp
        character*20 filen
        character*80 txline(300)
        integer maxlen
        integer lunnum
        data lunnum /18/
        data maxlen /20/

c
c       prompt for file name to be read
c
        CALL PROMPT (1208,filen,MAXLEN,lenf)
        if (lenf .le. 0) then
           goto 400
        endif
        call clrmsg
c
c       open file and set graphics viewport
c
        open(unit=lunnum,file=filen(1:lenf),err=200,status='old')
        rewind(lunnum)

        lcnt = 0
        do 100 i= 1, 300
             txline(i) = ' '
             read(lunnum,10,err=110,end=110) txline(i)
 10          format(a80)
             lcnt = lcnt + 1
100     continue
110     close(lunnum)

        call txwrit(xarray,yarray,lpp,txline,lcnt)
        goto 400

200     print*,'could not open file for text output'
        goto 400
300     print*,'error in reading from text output file'

400     continue
        return
        end

C+*+*+*+*+*+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:                    writin

c  Functional Description:
c       this subroutine writes to ifl in integer format (I5)
c
c  Input Files/Parameters:

c  Output Files/Parameters: N/A

c  Subroutines/Functions Called:

c  Called By:                    SPARAM, WSAVPR

c  Local Variables: N/A

c  Restrictions: N/A

c  Abnormal Return Conditions:  N/A

c  Location:      /a21/dave
```

```
c  Programmer          Date of Last Change        Reason for Change

C-*-*-*-*-*-*-*-*-*-*-*-*-*-*-*-*-*-*-*-*-*-*-*-*-*-*-*-*-*-*-*-*-*-*-*-*-*-*-*|*-*-*-*-

        subroutine writin (ifl,iarray,len,ierror)

c       this subroutine writes to ifl in integer format (I5)

        integer iarray(*)

        ierror = 0
        write(ifl,*,err=199) (iarray(i),i=1,len)
c       write(ifl,1100,err=199) (iarray(i),i=1,len)
c1100   format(<len>i5)
        go to 200
  199       continue
            ierror = 2
            print*,'Error on writin ',len,iarray(1)
c           call derror(30,'Problem writing parameter     ',.true.,5,ch)
  200   continue
c       print*,'writin -- iarray,len,ierror : ',(iarray(i),i=1,len),len,ierror

        return
        end

C+*+*+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                     WRITIT
C
C FUNCTIONAL DESCRIPTION:
C
C CALLED BY:                     SAVARC, SAVCIR, SAVE
C
C PROGRAMMER:                    DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*-*-*|*-*-*-*-

        subroutine writit(ifl,iarray,len,ierror)

c       this routine writes a passed array to a file in I3 format

c     VARIABLES:
c       iarray- points to be written to file
c       ifl- logical unit number of the file to be accessed
c       ierror- integer flag set if error occurs during write


        integer iarray(*),ifl,ierror

c       initialize error to off
        ierror = 0

        write(ifl,1100,err=199) (iarray(i),i=1,len)
 1100   format(100i3)
        go to 200

  199   continue
          ierror = 2

 200   continue
       return
       end

C+*+*+*+*+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:                    writre

c  Functional Description:
c       this subroutine writes to ifl in real format
c
c  Input Files/Parameters:

c  Output Files/Parameters: N/A

c  Subroutines/Functions Called:
```

```
c  Called By:                   SPARAM

c  Local Variables: N/A

c  Restrictions: N/A

c  Abnormal Return Conditions:  N/A

c  Location:      /a21/dave

c  Programmer        Date of Last Change       Reason for Change

C-*-*-*-*-*-*-*-*-*-*-*-*-*-*-*-*-*-*-*-*-*-*-*-*-*-*-*-*-*-*-*-*-*-*-*-*-*-*-*|*-*-*-*-

        subroutine writre (ifl,rarray,len,ierror)

c       this subroutine writes to ifl in real format

        real rarray(*)

c       print*,'Enter writre ',len
        ierror = 0
c       write(ifl,*,err=199) (rarray(i),i=1,len)
        write(ifl,1100,err=199) (rarray(i),i=1,len)
 1100   format(4f12.5)
        go to 200
  199       continue
            ierror = 2
            print*,'Error on writre ',len,rarray(1)
c           call derror(30,'Problem writing parameter     ',.true.,5,ch)
  200   continue
c       print*,'writre -- rarray,len,ierror : ',(rarray(i),i=1,4),len,ierror

        return
        end


C+*+*+*+*+*+*+*+*+*+*+*+*+*+*+*+*+*+*+*+*+*+*+*+*+*+*+*+*+*+*+*+*+*+*+*+*+*+*+*|*+*+*+*+
c  UNIT NAME:                   wsavpr
c
c  Functional Description:
c       write save file parameters
c
c  Input Files/Parameters:
c
c  Output Files/Parameters: N/A
c
c  Subroutines/Functions Called:
c
c  Called By:                   FMAIN
c
c  Local Variables: N/A
c
c  Restrictions: N/A
c
c  Abnormal Return Conditions:  N/A
c
c  Location:      /a21/dave
c
c  Programmer        Date of Last Change       Reason for Change
c
C-*-*-*-*-*-*-*-*-*-*-*-*-*-*-*-*-*-*-*-*-*-*-*-*-*-*-*-*-*-*-*-*-*-*-*-*-*-*-*|*-*-*-*-
c
        subroutine wsavpr (len,name)
c
c       write save file parameters
c
        character*(*) name
        character*80 savdes(20),filenm
        common /savdes/ savdes
        common /maxsav/ maxsav,limsav
        data ifl/9/,irdwr/0/
c
        filenm = name(1:len) // '.des'
```

```
        call openit (filenm,len+4,ifl,irdwr,ierror)
        if (ierror.ne.0) then
            print*,'Error on save descriptor open - using default'
            call openit ('default.des',11,ifl,irdwr,ierror)
            if (ierror.ne.0) go to 150
        endif
        call writin (ifl,maxsav,1,ierror)
        if (ierror.ne.0) go to 150
        if (maxsav.gt.0) then
            do 110 i=1,maxsav
                call writch (ifl,savdes(i),80,ierror)
                if (ierror.ne.0) go to 150
  110       continue
        endif
  150   continue
        call closit (ifl)
c
        return
        end

C+*+*+*+*+*+*+*+*+*+*+*+*+*+*+*+*+*+*+*+*+*+*+*+*+*+*+*+*+*+*+*+*+*+*|*+*+*+*+
C UNIT NAME:                     XCOLOR
C
C FUNCTIONAL DESCRIPTION:        .
C
C CALLED BY:                     34 subroutines
C
C PROGRAMMER:                    DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*|*-*-*-*-

        subroutine xcolor(index)
        integer index,coltab(256)
        common /coltab/ coltab
        common/oneflg/oneflg
        logical oneflg

        if(oneflg)then
                call jcolor(1)
        else
                call jcolor(coltab(index+1))
        endif
        return
        end

C+*+*+*+*+*+*+*+*+*+*+*+*+*+*+*+*+*+*+*+*+*+*+*+*+*+*+*+*+*+*+*+*+*+*|*+*+*+*+
C UNIT NAME:                     XPIDEX
C
C FUNCTIONAL DESCRIPTION:        .
C
C CALLED BY:                     BOXCLR, CLRBVP, CLRVPT, DMAPII, DRICON
C                                SETCOL
C
C PROGRAMMER:                    DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*|*-*-*-*-

        subroutine xpidex(index,inten)
        integer index,inten,coltab(256)
        common /coltab/ coltab
        call jpidex(coltab(index+1),inten)
        return
        end

C+*+*+*+*+*+*+*+*+*+*+*+*+*+*+*+*+*+*+*+*+*+*+*+*+*+*+*+*+*+*+*+*+*+*|*+*+*+*+
C UNIT NAME:                     XSIZE
C
C FUNCTIONAL DESCRIPTION:        .
C
C CALLED BY:                     CREATM, CRMESG, DISP5, MESGJF,
C                                RECDIS, SAVDIS, SETFAD, TKINFO
```

```
C
C PROGRAMMER:                  DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*|*-*-*-*-

        subroutine xsize(x,y)
c
c       allows the system administrator to change the text size
c       of menus and messages
c
        common /txtsz/ txtsiz

        w = y * txtsiz
        z = x * txtsiz
        call jsize(z,w)
        return
        end

C+++++++++++++++++++++++++++++++++++++++++++++++++++++++++++++++++++++++++|+++++++
C UNIT NAME:                  FLSPLY
C
C FUNCTIONAL DESCRIPTION:     Processes a polygon which has been catenated
C                             from WDBII file and appended with data from
C                             the polygon fill file.  Polygons intersecting
C                             a map breakline are clipped into sections.
C
C INPUT FILES/PARAMETERS:     code        - Tells how polygon was catenated.
C                             lton(16)    - WDBII line types switched on.
C                             noclip      - No conic breakline flag.
C
C GLOBAL VARIABLES:           xplp,yplp   - Catenated polygon lon,lat coords.
C                             iplp        - Ptr to last point in WDB section.
C                             aplp        - Ptr to last point in ADD section.
C
C OUTPUT FILES/PARAMETERS:    Polygon is output to the display.
C
C SUBROUTINES CALLED:         llplxy,jpoly,jpolgn,blplin,blplgn
C
C CALLED BY:                   DMAPII
C
C LOCAL VARIABLES:
C
C RESTRICTIONS:               none.
C
C ABNORMAL RETURN CONDITIONS: none.
C
C PROGRAMMER:                 DATE OF LAST CHANGE     REASON FOR CHANGE
C     Tom Wescott  (NOSC)     Dec 87                  Original entry.
C
C-*-*-*-*-*-*-*-*-*-*-*-*-*-*-*-*-*-*-*-*-*-*-*-*-*-*-*-*-*-*-*-*-*-*-*-*-*|*-*-*-*-

      subroutine flsply(code,lton,noclip)

      logical lton(16), noclip
      integer code,null,concat,tpl,slp,eop,eos
      parameter (NULL   = 0)
      parameter (CONCAT = 1)
      parameter (TPL    = 2)
      parameter (SLP    = 5)
      parameter (EOP    = 6)
      parameter (EOS    = 7)

      include   'carmaxdim.inc'
c
c     Variables and Array for the Positive buffer
      integer   iplp,aplp
      real      xplp(IDIM),yplp(IDIM)
      common /bufptrp/ iplp,aplp
      common /bufaryp/ xplp,yplp
c
cccc
      if (code.eq.NULL.or.code.eq.TPL) then
c        This block of code is executed for two point lines or
c        lines which do not have line codes associated with them
```

```
c         (i.e. WDB files which have not been reordered using the
c              WDB_REORDER program).
c
          if (noclip) then
c            Transform the polygon.
             call llplxy(xplp,yplp,iplp,xplp,yplp,nout)
             iplp = nout
             if (iplp.gt.1) then
c               Draw the polygon outline.
                call jmove(xplp,yplp)
                call jpoly(xplp,yplp,iplp)
             endif
          else
c            Clip, transform, and draw the polygon outline.
             call blplin(xplp,yplp,iplp)
          endif
          call jupdat
c
       elseif (code.eq.SLP.or.code.eq.EOP) then
c         This block is executed for single and multiple line polygons
c
          if (noclip) then
c            Transform the polygon.
             call llplxy(xplp,yplp,iplp,xplp,yplp,nout)
             iplp = nout
             if (iplp.ge.3) then
c                Draw polygon with outline and fill.
                 jedge = 0
                 call jpolg2(xplp,yplp,iplp,jedge)
             endif
          else
c            Clip, transform, and draw polygon interior sections.
             call blplgn(xplp,yplp,iplp)
c            Clip, transform, and draw the polygon outline.
             call blplin(xplp,yplp,iplp)
          endif
          call jupdat
c
       elseif (code.eq.EOS) then
c         This block is executed when an End Of String code is encountered,
c         indicating fill file add points have been appended to the polyline.
c
          if (noclip) then
c            Transform the WDBII section.
             nin = iplp
             call llplxy(xplp,yplp,nin,xplp,yplp,nout)
             if (aplp.gt.iplp) then
c               Transform the appended section.
                nin = aplp - iplp
                j = iplp + 1
                k = nout + 1
                call llplxy(xplp(j),yplp(j),nin,xplp(k),yplp(k),nadd)
                aplp = nout + nadd
             endif
             iplp = nout
c
             maxplp = max0(iplp,aplp)
             if (maxplp.ge.3) then
c               Fill the appended polygon.
                jedge = 1
                call jpolg2(xplp,yplp,maxplp,jedge)
             endif
             if (lton(1) .and. iplp.ge.2) then
c               Draw outline for the WDBII section.
                call jmove(xplp,yplp)
                call jpoly(xplp,yplp,iplp)
             endif
c
          else
c            Clip, transform, and, fill the appended polygon.
             maxplp = max0(iplp,aplp)
             call blplgn(xplp,yplp,maxplp)
             if (lton(1) .and. iplp.ge.2) then
c               Clip, transform, and draw outline of the WDBII section.
```

```
            call blplin(xplp,yplp,iplp)
         endif
      endif
      call jupdat
   endif
c
   return
   end


C+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    FLSPOI
C
C FUNCTIONAL DESCRIPTION:
c -        This routine displays the positive and negative point buffers.
c -        If negative buffer (XPLN and YPLN) are only displayed for
c -        Mercator and Equirectangular projections.
C
C CALLED BY:                    NO LONGER USED BY CARICATURE
C
C PROGRAMMER:                   DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*|*-*-*-*-
c
      subroutine flspoi(code,lton)

      INTEGER null,concat,tpl,slp,eop,eos
      PARAMETER (Null   = 0)
      PARAMETER (CONCAT = 1)
      PARAMETER (TPL    = 2)
      PARAMETER (SLP    = 5)
      PARAMETER (EOP    = 6)
      PARAMETER (EOS    = 7)

      LOGICAL lton(16)

      include   'carmaxdim.inc'
c
c     Variables and Array for the Positive buffer
      integer   iplp,aplp
      real      xplp(IDIM),yplp(IDIM)
      common /bufptrp/ iplp,aplp
      common /bufaryp/ xplp,yplp
c
c     Variables and Array for the Negative buffer
      integer   ipln,apln
      real      xpln(IDIM),ypln(IDIM)
      common /bufptrn/ ipln,apln
      common /bufaryn/ xpln,ypln

      INTEGER   code

      IF (code.EQ.null.OR.code.EQ.TPL) THEN
c
c        This block of code is executed for two point lines or
c        lines which do not have line codes associated with them
c        (i.e. WDB files which have not been reordered using the
c             WDB_REORDER program).
c
         IF (iplp.GT.1) THEN
            CALL jmove(xplp,yplp)
            CALL jpoly(xplp,yplp,iplp)
         ENDIF
         IF (ipln.GT.1) THEN
            CALL jmove(xpln,ypln)
            CALL jpoly(xpln,ypln,ipln)
         ENDIF
         CALL jupdat
      ELSEIF (code.EQ.SLP.OR.code.EQ.EOP) THEN
c
c        This block is executed for single and multiple line polygons
c

         IF (iplp.GE.3) THEN
```

```
            call jpedge(0)
            CALL jpolgn(xplp,yplp,iplp)
         ENDIF
         IF (ipln.GE.3) THEN
            call jpedge(0)
            CALL jpolgn(xpln,ypln,ipln)
         ENDIF
         CALL jupdat
      ELSEIF (code.EQ.EOS) THEN
c
c        This block is executed when an End Of String code is encountered.
c
         IF (aplp.GT.iplp.AND.aplp.GE.3) THEN
            call jpedge(1)
            CALL jpolgn(xplp,yplp,aplp)
         ENDIF
         if (lton(1) .and. iplp.GE.2) THEN
            CALL jmove(xplp,yplp)
            CALL jpoly(xplp,yplp,iplp)
         ENDIF
         CALL jupdat
         IF (apln.GT.ipln.AND.apln.GE.3) THEN
            call jpedge(1)
            CALL jpolgn(xpln,ypln,apln)
         ENDIF
         IF (lton(1) .and. ipln.GE.2) THEN
            CALL jmove(xpln,ypln)
            CALL jpoly(xpln,ypln,ipln)
         ENDIF
         CALL jupdat
      ENDIF

      RETURN
      END


C+*+*+*+*+*+*+*+*+*+*+*+*+*+*+*+*+*+*+*+*+*+*+*+*+*+*+*+*+*+*+*+*+*+*+*|*+*+*+*+
C UNIT NAME: GETLND
C
C FUNCTIONAL DESCRIPTION:  GETS A LINE INDEX RECORD.
C
C INPUT FILES/PARAMETERS:
C
C       LUNLIN                INTEGER     LOGICAL UNIT NUMBER FOR WDBII LINE
C                                         INDEX FILE.
C       LBLK                  INTEGER     BLOCK IN INDEX FILE WHERE LINES
C                                         ASSOCIATED WITH THIS AREA ARE STOR
C       LCATEG                INTEGER     CATEGORY OF LINES.
C       NLINES                INTEGER     NUMBER OF LINES.
C       RMINLA                REAL        MINIMUM LATITUDE.
C       RMAXLA                REAL        MAXIMUM LATITUDE.
C       RMINLO                REAL        MINIMUM LONGITUDE.
C       RMAXLO                REAL        MAXIMUM LONGITUDE.
C       LOFFS                 INTEGER     POINTS TO CURRENT LINE WITHIN CURR
C                                         LINE INDEX RECORD.
C       EOF                   LOGICAL     END OF FILE FLAG.
C       ICNTGE                INTEGER     CURRENT LINE INDEX RECORD
C                                         WITHIN CURRENT BLOCK.
C
C GLOBAL VARIABLES :
C
C       IMINS                 INTEGER     MINUTES IN 180 DEGREES.
C       C                     REAL        CONVERTS MINUTES TO RADIANS.
C       NLINDE                INTEGER     MAXIMUM NUMBER OF LINES IN LINE
C                                         INDEX RECORD.
C
C OUTPUT FILES/PARAMETERS:  NONE.
C
C SUBROUTINES/FUNCTIONS CALLED : NONE.
C
C CALLED BY: DMAPII.
C
C LOCAL VARIABLES: NONE.
C
```

```
C RESTRICTIONS: NONE.
C
C ABNORMAL RETURN CONDITIONS:   NONE.
C
C LOCATION:                     /gl
C
C PROGRAMMER:                   DATE OF LAST CHANGE     REASON FOR CHANGE
C
C     DAVE NATION                                       ORIGINAL CODE.
C     JERRY FENERTY                                     DOCUMENT AND MODIFY
C                                                       FOR A21 PROTOTYPE.
C     DANIEL BERKICH (SAIC) NOSC                        Read both forms of
C                                                       Data base.
C
C-*-*-*-*-*-*-*-*-*-*-*-*-*-*-*-*-*-*-*-*-*-*-*-*-*-*-*-*-*-*-*-*-*-*-*|*-*-*-*-

        SUBROUTINE getlnd(lunlin,isblk,lblk,loffs,nlines,lcateg,
     +                rminla,rmaxla,rminlo,rmaxlo,eof)

      integer lunlin
      INTEGER   nlinde,lenlin,icntli
      COMMON    /lwdbii/ nlinde,lenlin,icntli
      INTEGER   isecs,imins
      REAL      c,cs
      COMMON    /c/ c,isecs,cs,imins
      INTEGER   ios
      INTEGER*2 segblk(8,32)
      common    /segblk/ segblk
      INTEGER   isblk
      INTEGER   sblk,soffs,lblk,loffs
      INTEGER   csblk,clblk,cpblk
      LOGICAL   va,eof
      common /inopen/ csblk,clblk,cpblk,va
      INTEGER*2 i2(2)
      INTEGER   i4
      EQUIVALENCE (i2,i4)
      INTEGER    two8
      PARAMETER (two8 = 2**8)
      REAL      rminla,rmaxla,rminlo,rmaxlo
      INTEGER   lcateg,nlines

      sblk = (isblk/nlinde) + 1
      soffs = mod(isblk,nlinde) + 1
      isblk = isblk + 1
      IF (csblk.NE.sblk) THEN
          csblk = sblk
          READ (lunlin,REC=sblk,IOSTAT=ios)
     +      segblk
        IF (ios.NE.0) THEN
           PRINT *,'GETSGM - Segment read error=',ios,'  Block=',sblk
           RETURN
        ENDIF
       ENDIF
 700   CONTINUE

      IF (va) THEN
c        Version A format (long form)
         i2(1)  =  segblk(1,soffs)
         i2(2)  =  segblk(2,soffs)
         lblk   =  i4
         lcateg =  segblk(3,soffs)/two8
         loffs  =  mod(segblk(3,soffs),two8)
         nlines =  segblk(4,soffs)
         rminla = (segblk(5,soffs)-imins)*c
         rmaxla = (segblk(6,soffs)-imins)*c
         rminlo = (segblk(7,soffs)-imins)*c
         rmaxlo = (segblk(8,soffs)-imins)*c
      ELSE
c        Version S format (short form)
         lblk   =  segblk(1,soffs)
         lcateg =  segblk(2,soffs)
         nlines =  segblk(3,soffs)
         rminla = (segblk(4,soffs)-imins)*c
         rmaxla = (segblk(5,soffs)-imins)*c
```

```
         rminlo = (segblk(6,soffs)-imins)*c
         rmaxlo = (segblk(7,soffs)-imins)*c
         loffs  =  segblk(8,soffs)
      ENDIF

      IF (nlines.LT.1) eof = .true.

      RETURN
      END


C++++++++++++++++++++++++++++++++++++++++++++++++++++++++++++++++++++++|+++++++
C UNIT NAME:                   GETPLY
C
C FUNCTIONAL DESCRIPTION:      GETS A POLYLINE FROM WDBII FILE.
C
C INPUT FILES/PARAMETERS:
C
C       LUNDAT                 INTEGER     LOGICAL UNIT NUMBER FOR WDBII
C                                          DATA FILE.
C       PLAT                   REAL        LATITUDE OF POINT.
C       PLON                   REAL        LONGITUDE OF POINT.
C       IBLK                   INTEGER     CURRENT BLOCK OF DATA POINTS.
C       IOFFS                  INTEGER     CURRENT RECORD IN IBLK.
C       ERF                    INTEGER     ERROR CONDITION.
C
C GLOBAL VARIABLES :
C
C       ISECS                  INTEGER     MINUTES IN 180 DEGREES.
C       CS                     REAL        CONVERTS MINUTES TO RADIANS.
C       IRECDA                 INTEGER     RECORD INFO.
C       NDATAR                 INTEGER     NUMBER OF RECORDS IN BLOCK.
C       LENDAT                 INTEGER     NUMBER OF FIELDS IN EACH POINT REC
C       ICURPB                 INTEGER     CURRENT BLOCK IN DATA FILE WHERE P
C                                          ASSOCIATED WITH THIS AREA ARE STOR
C
C OUTPUT FILES/PARAMETERS:       NONE.
C
C SUBROUTINES/FUNCTIONS CALLED:  NONE.
C
C CALLED BY:                     NO LONGER USED BY CARICATURE
C
C LOCAL VARIABLES:               NONE.
C
C RESTRICTIONS: NONE.
C
C ABNORMAL RETURN CONDITIONS:    NONE.
C
C LOCATION:
C
C PROGRAMMER:             DATE OF LAST CHANGE         REASON FOR CHANGE
C     Tom Wescott                12/87                Extension of getpoi.
C
C-*-*-*-*-*-*-*-*-*-*-*-*-*-*-*-*-*-*-*-*-*-*-*-*-*-*-*-*-*-*-*-*-*-*-*|*-*-*-*-

      subroutine getply(lundat,pblk,poffs,npoint,lats,lons,ios)

      INTEGER   nlinde,lenlin,icntli
      COMMON    /lwdbii/ nlinde,lenlin,icntli
      INTEGER   nindex,lenind
      COMMON    /iwdbii/ nindex,lenind
      INTEGER   ndatar,lendat
      COMMON    /dwdbii/ ndatar,lendat
      INTEGER   isecs,imins
      REAL      c,cs
      COMMON    /c/ c,isecs,cs,imins
      INTEGER   lundat,ios
      INTEGER   poiblk(2,64)
      common    /poiblk/ poiblk
      INTEGER   pblk,poffs
      INTEGER   csblk,clblk,cpblk
      LOGICAL   va
      common /inopen/ csblk,clblk,cpblk,va
      INTEGER*2 i2(2)
```

```
      INTEGER   i4
      EQUIVALENCE (i2,i4)
      INTEGER    two8
      PARAMETER (two8 = 2**8)

      INTEGER   npoint
c
      INTEGER   plyblk(128), coffs
      REAL      lats(*), lons(*)
      INTEGER   ncoord, k

c
      coffs = poffs*lendat - 1
      ncoord = ndatar*lendat
      do 110 k = 1, npoint
         if (cpblk.ne.pblk) then
            read (lundat,rec=pblk,iostat=ios)
     +      plyblk
            cpblk = pblk
            if (ios.ne.0) then
               write(*)' GETPLY-read error=',ios,'Block=',pblk
               RETURN
            endif
         endif
         lats(k) = (plyblk(coffs)-isecs)*cs
         lons(k) = (plyblk(coffs+1)-isecs)*cs
         coffs = coffs + 2
         if (coffs.gt.ncoord) then
            pblk = pblk + 1
            coffs = 1
         endif
 110  continue
      return
      end

C+*+*+*+*+*+*+*+*+*+*+*+*+*+*+*+*+*+*+*+*+*+*+*+*+*+*+*+*+*+*+*+*+*+*+*|*+*+*+*+
C UNIT NAME: GETPOI
C
C FUNCTIONAL DESCRIPTION:  GETS A POINT FROM WDBII FILE.
C
C INPUT FILES/PARAMETERS:
C
C        LUNDAT                  INTEGER     LOGICAL UNIT NUMBER FOR WDBII
C                                            DATA FILE.
C        PLAT                    REAL        LATITUDE OF POINT.
C        PLON                    REAL        LONGITUDE OF POINT.
C        IBLK                    INTEGER     CURRENT BLOCK OF DATA POINTS.
C        IOFFS                   INTEGER     CURRENT RECORD IN IBLK.
C        ERF                     INTEGER     ERROR CONDITION.
C
C GLOBAL VARIABLES :
C
C        ISECS                   INTEGER     MINUTES IN 180 DEGREES.
C        CS                      REAL        CONVERTS MINUTES TO RADIANS.
C        IRECDA                  INTEGER     RECORD INFO.
C        NDATAR                  INTEGER     NUMBER OF RECORDS IN BLOCK.
C        LENDAT                  INTEGER     NUMBER OF FIELDS IN EACH POINT REC
C        ICURPB                  INTEGER     CURRENT BLOCK IN DATA FILE WHERE P
C                                            ASSOCIATED WITH THIS AREA ARE STOR
C
C OUTPUT FILES/PARAMETERS:  NONE.
C
C SUBROUTINES/FUNCTIONS CALLED : NONE.
C
C CALLED BY: DMAPII.
C
C LOCAL VARIABLES: NONE.
C
C RESTRICTIONS: NONE.
C
C ABNORMAL RETURN CONDITIONS:   NONE.
C
C LOCATION:                   /a21/gjf/L3REA.FTN
```

```
C
C PROGRAMMER:                   DATE OF LAST CHANGE     REASON FOR CHANGE
C
C     DAVE NATION                                      ORIGINAL CODE.
C     JERRY FENERTY                                    DOCUMENT AND MODIFY
C                                                      FOR A21 PROTOTYPE.
C     DANIEL BERKICH (SAIC) NOSC                       Read both forms of
C                                                      Data base.
C
C-*-*-*-*-*-*-*-*-*-*-*-*-*-*-*-*-*-*-*-*-*-*-*-*-*-*-*-*-*-*-*-*-*-*-*-*-*-*|*-*-*-*-

      SUBROUTINE getpoi(lundat,pblk,poffs,plat,plon,ios)

      INTEGER   nlinde,lenlin,icntli
      COMMON    /lwdbii/ nlinde,lenlin,icntli
      INTEGER   nindex,lenind
      COMMON    /iwdbii/ nindex,lenind
      INTEGER   ndatar,lendat
      COMMON    /dwdbii/ ndatar,lendat
      INTEGER   isecs,imins
      REAL      c,cs
      COMMON    /c/ c,isecs,cs,imins
      INTEGER   lundat,ios
      INTEGER   poiblk(2,64)
      common    /poiblk/ poiblk
      INTEGER   pblk,poffs
      INTEGER   csblk,clblk,cpblk
      LOGICAL   va
      common /inopen/ csblk,clblk,cpblk,va
      INTEGER*2 i2(2)
      INTEGER   i4
      EQUIVALENCE (i2,i4)
      INTEGER    two8
      PARAMETER (two8 = 2**8)
      REAL      plat,plon

      IF (cpblk.NE.pblk) THEN
         READ (lundat,REC=pblk,IOSTAT=ios)
     +      poiblk
         cpblk = pblk
         IF (ios.NE.0) THEN
            print *,'GETPOI - Point read error=',ios,'  Block=',pblk
            RETURN
         ENDIF
      ENDIF
      plat  = (poiblk(1,poffs)-isecs)*cs
      plon  = (poiblk(2,poffs)-isecs)*cs
      poffs = poffs + 1
      IF (poffs.GT.ndatar) THEN
         pblk  = pblk + 1
         poffs = 1
      ENDIF

      RETURN
      END


C+*+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME: GTLIN
C
C FUNCTIONAL DESCRIPTION:  GETS A LINE.
C
C INPUT FILES/PARAMETERS:
C
C        LUNIND              INTEGER     LOGICAL UNIT NUMBER FOR WDBII
C                                        INDEX FILE.
C        IBLK                INTEGER     CURRENT BLOCK OF DATA POINTS.
C        IRNK                INTEGER     RANK OF LINE.
C        NPOINT              INTEGER     NUMBER OF POINTS IN LINE.
C        RMINLA              REAL        MINIMUM LATITUDE.
C        RMAXLA              REAL        MAXIMUM LATITUDE.
C        RMINLO              REAL        MINIMUM LONGITUDE.
C        RMAXLO              REAL        MAXIMUM LONGITUDE.
C        IOFFS               INTEGER     CURRENT DATA POINT WITHIN IBLK.
```

```
C        LBLK                 INTEGER     BLOCK IN INDEX FILE WHERE LINES
C                                         ASSOCIATED WITH THIS AREA ARE STOR
C
C GLOBAL VARIABLES :
C
C        IMINS                INTEGER     MINUTES IN 180 DEGREES.
C        C                    REAL        CONVERTS MINUTES TO RADIANS.
C        ICNTLI               INTEGER     CURRENT LINE INDEX RECORD.
C        IRECIN               INTEGER     RECORD INFO.
C        NINDEX               INTEGER     MAXIMUM NUMBER OF LINES IN RECORD.
C        LENIND               INTEGER     NUMBER OF FIELDS IN EACH LINE RECO
C        ICURLB               INTEGER     CURRENT BLOCK IN INDEX FILE WHERE
C                                         ASSOCIATED WITH THIS AREA ARE STOR
C
C OUTPUT FILES/PARAMETERS:  NONE.
C
C SUBROUTINES/FUNCTIONS CALLED : NONE.
C
C CALLED BY: DMAPII.
C
C LOCAL VARIABLES: NONE.
C
C RESTRICTIONS: NONE.
C
C ABNORMAL RETURN CONDITIONS:   NONE.
C
C LOCATION:                     /gl
C
C PROGRAMMER:                   DATE OF LAST CHANGE     REASON FOR CHANGE
C
C     DAVE NATION                                       ORIGINAL CODE.
C     JERRY FENERTY                                     DOCUMENT AND MODIFY
C                                                       FOR A21 PROTOTYPE.
C     DANIEL BERKICH (SAIC) NOSC                        Read both forms of
C                                                       Data base.
C
C-*-*-*-*-*-*-*-*-*-*-*-*-*-*-*-*-*-*-*-*-*-*-*-*-*-*-*-*-*-*-*-*-*-*-*-*-*-*-*|*-*-*-*-

      SUBROUTINE gtlin(lunind,lblk,loffs,pblk,poffs,npoint,irnk,
     +             rminla,rmaxla,rminlo,rmaxlo,ios)

      INTEGER nindex,lenind
      COMMON /iwdbii/ nindex,lenind
      INTEGER isecs,imins
      REAL    c,cs
      COMMON /c/ c,ISECS,CS,imins
      INTEGER   lunind,ios
      INTEGER*2 linblk(8,32)
      common    /linblk/ linblk
      INTEGER   lblk,loffs,pblk,poffs
      INTEGER   csblk,clblk,cpblk
      LOGICAL   va
      common /inopen/ csblk,clblk,cpblk,va
      INTEGER*2 i2(2)
      INTEGER   i4
      EQUIVALENCE (i2,i4)
      INTEGER    two8
      logical vax
      common /vaxdbc/ vax
      PARAMETER (two8 = 2**8)
      REAL       rminla,rmaxla,rminlo,rmaxlo
      INTEGER   npoint,irnk

      IF (clblk.NE.lblk) THEN
         READ (lunind,REC=lblk,IOSTAT=ios)
     +      linblk
         clblk = lblk
         IF (ios.NE.0) THEN
            PRINT *,'GETLIN - Line read error=',ios,'  Block=',lblk
            RETURN
         ENDIF
      ENDIF
      IF (va) THEN
c        Version A format (long form)
         if (vax) then
```

```
          i2(1)   =  linblk(1,loffs)
          i2(2)   =  mod(linblk(2,loffs),two8)
          pblk    =  i4
c       ---- Convert rank to short index form ----
          irnk    =  (linblk(2,loffs)/two8)*two8 +
     +                mod(linblk(3,loffs),two8)
        else
          i2(1)   =  mod(linblk(1,loffs),two8)
          i2(2)   =  linblk(2,loffs)
          pblk    =  i4
c       ---- Convert rank to short index form ----
          irnk    =  mod(linblk(3,loffs),two8)
        endif
        poffs  =  linblk(3,loffs)/two8
        npoint =  linblk(4,loffs)
        rminla = (linblk(5,loffs)-imins)*c
        rmaxla = (linblk(6,loffs)-imins)*c
        rminlo = (linblk(7,loffs)-imins)*c
        rmaxlo = (linblk(8,loffs)-imins)*c
      ELSE
c       Version S format (short form)
        pblk    =  linblk(1,loffs)
        irnk    =  linblk(2,loffs)
        npoint =  linblk(3,loffs)
        rminla = (linblk(4,loffs)-imins)*c
        rmaxla = (linblk(5,loffs)-imins)*c
        rminlo = (linblk(6,loffs)-imins)*c
        rmaxlo = (linblk(7,loffs)-imins)*c
        poffs   =  linblk(8,loffs)
      ENDIF
      loffs = loffs + 1
      IF (loffs.GT.nindex) THEN
         lblk  = lblk + 1
         loffs = 1
      ENDIF

      RETURN
      END


C+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                       INTPOI
C
C FUNCTIONAL DESCRIPTION:          .
c -   Description: This routine intializes the point buffer indices.
C
C CALLED BY:                       DMAPII
C
C PROGRAMMER:                      DATE OF LAST CHANGE      REASON FOR CHANGE
C -   DAN BERKICH -SAIC-              OCTOBER 1986          POLYGON FILL
C
C-*-*-*-*-*-*-*-*-*-*-*-*-*-*-*-*-*-*-*-*-*-*-*-*-*-*-*-*-*-*-*-*-*-*-*-*|*-*-*-*-
c
        SUBROUTINE intpoi(isgood)

      include   'carmaxdim.inc'
c
c     Variables and Array for the Positive buffer
      integer   iplp,aplp
      real      xplp(IDIM),yplp(IDIM)
      common /bufptrp/ iplp,aplp
      common /bufaryp/ xplp,yplp
c
c     Variables and Array for the Negative buffer
      integer   ipln,apln
      real      xpln(IDIM),ypln(IDIM)
      common /bufptrn/ ipln,apln
      common /bufaryn/ xpln,ypln

      LOGICAL   isgood
      LOGICAL   posbuf

      REAL maxx,maxx2
      COMMON /maxx/ maxx,maxx2
```

```
      common /posbuf/posbuf
 800  FORMAT(x,'Warning... Exceeded point buffer size of ',i4)

      iplp = 0
      ipln = 0
      aplp = 0
      apln = 0
      posbuf = isgood
      maxx2 = 2 * maxx

      RETURN
      END


C+*+*+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                       MRKPOI
C
C FUNCTIONAL DESCRIPTION:
c -   Description: This entry is for marking the begining of the change
c -                points in the positive and negative buffers.
C
C CALLED BY:                       DMAPII
C
C PROGRAMMER:                      DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*-*-*|*-*-*-*-
c
      subroutine mrkpoi

      include   'carmaxdim.inc'
c
c     Variables and Array for the Positive buffer
      integer   iplp,aplp
      real      xplp(IDIM),yplp(IDIM)
      common /bufptrp/ iplp,aplp
      common /bufaryp/ xplp,yplp
c
c     Variables and Array for the Negative buffer
      integer   ipln,apln
      real      xpln(IDIM),ypln(IDIM)
      common /bufptrn/ ipln,apln
      common /bufaryn/ xpln,ypln

      aplp = iplp
      apln = ipln

      RETURN
      END


C+*+*+*+*+*+*+*+*+*+*+*+*+*+*+*+*+*+*+*+*+*+*+*+*+*+*+*+*+*+*+*+*+*+*+*+*+*+*+*|*+*+*+*-
C UNIT NAME:                       RDLINE
C
C FUNCTIONAL DESCRIPTION:
c -   Description: read a line index record
c -
c -     LBLK -  index to line record, obtained initially from segemnt
c -             record and incremented after each read.
c -     PBLK -  index where first point exists in the point file.
c -     PCNT -  number of points for the line
C
C CALLED BY:                       DMAPII
C
C PROGRAMMER:                      DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*-*-*|*-*-*-*-
c
      SUBROUTINE rdline(line,ppblk,pcnt
     +                ,rminlat,rminlon,rmaxlat,rmaxlon,lblkoff,ios)

      INTEGER  lunit
      PARAMETER (lunit = 68)

      INTEGER   ios
```

```
      INTEGER   lblk,ppblk,pcnt,lblkoff
      INTEGER   line,loffs
      INTEGER*2 i2(2)
      REAL      rminlat,rminlon,rmaxlat,rmaxlon
      INTEGER   i4
      EQUIVALENCE (i2,i4)

      INTEGER isecs,imins
      REAL    c,cs
      COMMON /c/ c,ISECS,CS,imins

      INTEGER   cpsblk,cplblk,cppblk
      COMMON /cpblks/ cpsblk,cplblk,cppblk,va

      INTEGER*2 clnblk(8,32)
      COMMON /clnblk/ clnblk

      INTEGER nindex,lenind
      COMMON /IWDBII/ NINDEX,LENIND

      ppblk = 0
      pcnt = 0

      IF (line.gt.0) THEN
        lblk = ((line-1)/nindex) + 1
        loffs = mod((line-1),nindex) + 1
        line = line + 1
        IF (cplblk.NE.lblk) THEN
           READ (lunit,REC=lblk,IOSTAT=ios)
     +        clnblk
           cplblk = lblk
        ENDIF
        ppblk   =  clnblk(1,loffs)
        pcnt    =  clnblk(2,loffs)
        rminlat = (clnblk(3,loffs)-imins)*c
        rminlon = (clnblk(4,loffs)-imins)*c
        rmaxlat = (clnblk(5,loffs)-imins)*c
        rmaxlon = (clnblk(6,loffs)-imins)*c
        i2(1)   =  clnblk(7,loffs)
        i2(2)   =  clnblk(8,loffs)
        lblkoff =  i4
      ENDIF

      RETURN
      END


C+*+*+*+*+*+*+*+*+*+*+*+*+*+*+*+*+*+*+*+*+*+*+*+*+*+*+*+*+*+*+*+*+*+*|*+*+*+*+
C UNIT NAME:                       RDPNT
C
C FUNCTIONAL DESCRIPTION:
c -   Description: read a POINT record
c -             PBLK -  Point block for read,  obtained from line
c -                     record.  Incremented after read.
c -             RLAT -  latitude
c -             RLON -  longitude
C
C CALLED BY:                       DMAPII
C
C PROGRAMMER:                      DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*|*-*-*-*-
c
      SUBROUTINE rdpnt(point,rlat,rlon,ios)

      INTEGER   punit
      PARAMETER (punit = 67)

      INTEGER   ios
      INTEGER   point,pblk,poffs
      REAL      rlat,rlon

      INTEGER isecs,imins
      REAL    c,cs
      COMMON /c/ c,ISECS,CS,imins
```

```
      INTEGER   cpsblk,cplblk,cppblk
      COMMON /cpblks/ cpsblk,cplblk,cppblk,va

      INTEGER   cptblk(2,64)
      COMMON  /cptblk/ cptblk

      INTEGER ndatar,lendat
      COMMON /DWDBII/ NDATAR,LENDAT

      IF (point.gt.0) THEN
        pblk = ((point-1)/ndatar) + 1
        poffs = mod((point-1),ndatar) + 1
        point = point + 1
        IF (cppblk.NE.pblk) THEN
           READ (punit,REC=pblk,IOSTAT=ios)
     +        cptblk
           cppblk = pblk
        ENDIF
        rlat  = (cptblk(1,poffs)-isecs)*cs
        rlon  = (cptblk(2,poffs)-isecs)*cs
      ENDIF

      RETURN
      END


C+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                       RDSEG
C
C FUNCTIONAL DESCRIPTION:
c -   Description: read a segment record
c -     SEGMENT-index to segment record, incremented after each read.
c -     LBLK  - index where first line exists in the line file.
c -     LCODE - Code indicating whether or not to fill entire segment
C
C CALLED BY:                       DMAPII
C
C PROGRAMMER:                      DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*-*|*-*-*-*-
c
      SUBROUTINE rdseg(segment,llblk,lcnt,lcode
     +                 ,rminlat,rminlon,rmaxlat,rmaxlon,ios)
c
c    start read
c
      INTEGER   sunit
      PARAMETER (sunit = 69)

      INTEGER   ios
      INTEGER   llblk,lcnt
      INTEGER*2 lcode
      INTEGER   segment,sblk,soffs
      REAL      rminlat,rminlon,rmaxlat,rmaxlon

      INTEGER isecs,imins
      REAL    c,cs
      COMMON /c/ c,ISECS,CS,imins

      INTEGER   cpsblk,cplblk,cppblk
      COMMON /cpblks/ cpsblk,cplblk,cppblk,va

      INTEGER*2 csgblk(8,32)
      COMMON /csgblk/csgblk

      INTEGER nlinde,lenlin
      COMMON /LWDBII/ NLINDE,LENLIN,icntli

      sblk = ((segment-1)/nlinde) + 1
      soffs = mod((segment-1),nlinde) + 1
      IF (cpsblk.NE.sblk) THEN
         cpsblk = sblk
         READ (sunit,REC=sblk,IOSTAT=ios)
     +       csgblk
      ENDIF
```

```
      llblk    =  csgblk(1,soffs)
      lcnt     =  csgblk(2,soffs)
      lcode    =  csgblk(3,soffs)
      rminlat = (csgblk(5,soffs)-imins)*c
      rminlon = (csgblk(6,soffs)-imins)*c
      rmaxlat = (csgblk(7,soffs)-imins)*c
      rmaxlon = (csgblk(8,soffs)-imins)*c

      RETURN
      END


C+++++++++++++++++++++++++++++++++++++++++++++++++++++++++++++++++++++|+++++++
C UNIT NAME:                        SAVCPT
C
C FUNCTIONAL DESCRIPTION:
c -        This routine is for saving points read from the change file.
c -        These are the points added to complete a polygon.
C
C CALLED BY:                        NO LONGER USED BY CARICATURE
C
C PROGRAMMER:                       DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*|*-*-*-*-
c
      subroutine savcpt(xpl,ypl)

      real xpl,ypl

      include   'carmaxdim.inc'
c
c     Variables and Array for the Positive buffer
      integer   iplp,aplp
      real      xplp(IDIM),yplp(IDIM)
      common /bufptrp/ iplp,aplp
      common /bufaryp/ xplp,yplp
c
c     Variables and Array for the Negative buffer
      integer   ipln,apln
      real      xpln(IDIM),ypln(IDIM)
      common /bufptrn/ ipln,apln
      common /bufaryn/ xpln,ypln

      LOGICAL   posbuf

      REAL maxx,maxx2
      COMMON /maxx/ maxx,maxx2
      common /posbuf/posbuf

      IF (aplp.LT.IDIM) THEN
         aplp = aplp + 1
         yplp(aplp) = ypl
         IF (xpl.GE.0.OR.posbuf) THEN
            xplp(aplp) = xpl
         ELSE
            xplp(aplp) = amin1(maxx,maxx2 + xpl)
         ENDIF
         IF (.NOT.posbuf) THEN
            apln = apln + 1
            ypln(apln) = ypl
            IF (xpl.GE.0) THEN
               xpln(apln) = amax1(-maxx,-maxx2 + xpl)
            ELSE
               xpln(apln) = xpl
            ENDIF
         ENDIF
      ELSE
         PRINT 800,IDIM
      ENDIF

800   FORMAT(x,'Warning... Exceeded point buffer size of ',i4)

      RETURN
      END
```

```
C+*+*+*+*+*+*+*+*+*+*+*+*+*+*+*+*+*+*+*+*+*+*+*+*+*+*+*+*+*+*+*+*+*+*|*+*+*+*+
C UNIT NAME:                      SAVPOI
C
C FUNCTIONAL DESCRIPTION:
c -   This routine is for saving points read from the WDBIIx point file.
C
C CALLED BY:                      NO LONGER USED BY CARICATURE
C
C PROGRAMMER:                     DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*|*-*-*-*-
c
      subroutine savpoi(xpl,ypl)

      real xpl,ypl

      include   'carmaxdim.inc'
c
c     Variables and Array for the Positive buffer
      integer   iplp,aplp
      real      xplp(IDIM),yplp(IDIM)
      common /bufptrp/ iplp,aplp
      common /bufaryp/ xplp,yplp
c
c     Variables and Array for the Negative buffer
      integer   ipln,apln
      real      xpln(IDIM),ypln(IDIM)
      common /bufptrn/ ipln,apln
      common /bufaryn/ xpln,ypln

      LOGICAL   posbuf

      REAL maxx,maxx2
      COMMON /maxx/ maxx,maxx2
      common /posbuf/posbuf

      IF (iplp.LT.IDIM) THEN
        iplp = iplp + 1
        yplp(iplp) = ypl
        IF (xpl.GE.0.OR.posbuf) THEN
           xplp(iplp) = xpl
        ELSE
           xplp(iplp) = amin1(maxx,maxx2 + xpl)
        ENDIF
        IF (.NOT.posbuf) THEN
           ipln = ipln + 1
           ypln(ipln) = ypl
           IF (xpl.GE.0) THEN
              xpln(ipln) = amax1(-maxx,-maxx2 + xpl)
           ELSE
              xpln(ipln) = xpl
           ENDIF
        ENDIF
      ELSE
         PRINT 800,IDIM
      ENDIF

800   FORMAT(x,'Warning... Exceeded point buffer size of ',i4)

      RETURN
      END


C+*+*+*+*+*+*+*+*+*+*+*+*+*+*+*+*+*+*+*+*+*+*+*+*+*+*+*+*+*+*+*+*+*+*|*+*+*+*+
C UNIT NAME:                      SVEADD
C
C FUNCTIONAL DESCRIPTION:         Reads points for the change file, and
C                                 appends them to the polyline buffer.
C                                 Appended segments forced to great circles.
C
C INPUT FILES/PARAMETERS:         pntblk,poicnt - location and # of add points.
C                                 xplp,yplp     - Polyline buffers
C                                 iplp,aplp     - ptrs to polyline section ends.
C
```

```
C OUTPUT FILES/PARAMETERS:      xplp,yplp,aplp  - Including appendix
C
C SUBROUTINES CALLED:           ll2gc
C
C CALLED BY:                    DMAPII
C
C PROGRAMMER:                   DATE OF LAST CHANGE     REASON FOR CHANGE
C    Tom Wescott  (NOSC)        Apr 89                  Replace svecpt
C-*-*-*-*-*-*-*-*-*-*-*-*-*-*-*-*-*-*-*-*-*-*-*-*-*-*-*-*-*-*-*-*-*-*-*-*-*-*|*-*-*-*-
c       not in 3.0
      subroutine sveadd(pntblk,poicnt)

      parameter (MAX=1000)
      real xtmp(MAX), ytmp(MAX)
      integer pntblk,poicnt
      logical append

      include   'carmaxdim.inc'
C
C     Variables and Array for the polyline buffer
      integer   iplp,aplp
      real      xplp(IDIM),yplp(IDIM)
      common /bufptrp/ iplp,aplp
      common /bufaryp/ xplp,yplp
C
      if (iplp.gt.0) then
C        This will be an appendix, get original end point.
         i = 1
         xtmp(i) = xplp(iplp)
         ytmp(i) = yplp(iplp)
         append = .true.
      else
C        Not an appendix, This will be the entire polygon.
         i = 0
         append = .false.
      endif
C
C     Get all verticies in the add polyline.
      if (poicnt.gt.0) then
         do 110 ii = 1, poicnt
            call rdpnt(pntblk,plat,plon,ios)
            i = i + 1
            ytmp(i) = plat
            xtmp(i) = plon
C           Truncate those damn add points near the south pole.
            ytmp(i) = amax1(ytmp(i),-1.55)
 110     continue
C
C        Insure polygon closure.
         if ((ytmp(i).ne.yplp(1)).or.(xtmp(i).ne.xplp(1))) then
            i = i + 1
            if (append) then
               ytmp(i) = yplp(1)
               xtmp(i) = xplp(1)
            else
               ytmp(i) = ytmp(1)
               xtmp(i) = xtmp(1)
            endif
         endif
C
C        Great circlize the added section of polygon.
         istout = max0(1,iplp)
         call ll2gc(xtmp,ytmp,i,MAX,xplp(istout),yplp(istout),nout)
         aplp = (istout-1) + nout
      endif
C
      return
      end


C+*+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                    SVECPT
C
```

```
C FUNCTIONAL DESCRIPTION:
c -       This routine is for saving points read from the change file.
c -       These are the points added to complete a polygon.
C
C CALLED BY:                       DMAPII
C
C PROGRAMMER:                      DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*|*-*-*-*-
c
      subroutine svecpt(xpl,ypl)

      real xpl,ypl

      include   'carmaxdim.inc'
c
c     Variables and Array for the Positive buffer
      integer   iplp,aplp
      real      xplp(IDIM),yplp(IDIM)
      common /bufptrp/ iplp,aplp
      common /bufaryp/ xplp,yplp

      IF (aplp.LT.IDIM) THEN
         aplp = aplp + 1
         yplp(aplp) = ypl
         xplp(aplp) = xpl
      ELSE
         PRINT 800,IDIM
      ENDIF

800   FORMAT(x,'Warning... Exceeded point buffer size of ',i4)

      RETURN
      END


C+*+*+*+*+*+*+*+*+*+*+*+*+*+*+*+*+*+*+*+*+*+*+*+*+*+*+*+*+*+*+*+*+*+*+*+*+*|*+*+*+*+
C UNIT NAME:                       SVEPOI
C
C FUNCTIONAL DESCRIPTION:
c -   This routine is for saving points read from the WDBIIx point file.
C
C CALLED BY:                       DMAPII
C
C PROGRAMMER:                      DATE OF LAST CHANGE     REASON FOR CHANGE
C
C-*-*-*-*-*-*-*-*-*-*-*-*-*-*-*-*-*-*-*-*-*-*-*-*-*-*-*-*-*-*-*-*-*-*-*-*-*|*-*-*-*-
c
      subroutine svepoi(xpl,ypl)

      real xpl,ypl

      include   'carmaxdim.inc'
c
c     Variables and Array for the Positive buffer
      integer   iplp,aplp
      real      xplp(IDIM),yplp(IDIM)
      common /bufptrp/ iplp,aplp
      common /bufaryp/ xplp,yplp

      IF (iplp.LT.IDIM) THEN
        iplp = iplp + 1
        yplp(iplp) = ypl
        xplp(iplp) = xpl
      ELSE
         PRINT 800,IDIM
      ENDIF

800   FORMAT(x,'Warning... Exceeded point buffer size of ',i4)
c
      RETURN
      END
```

What is claimed is:

1. An apparatus for storing and retrieving data, wherein the apparatus comprises:

(A) a first memory;

(B) a second memory;

(C) a multiline bus for coupling the first and second memories and for carrying control information, addresses, and the data, wherein the multiline bus has a total number of lines less than a total number of bits in any single address, wherein the control information includes information for selecting one of the first and second memories without using any separate memory select line;

(D) a multiline transceiver bus;

(E) means for initiating data transmission coupled to the multiline transceiver bus;

(F) a transceiver for coupling the multiline transceiver bus to the multiline bus, for coupling the means for initiating data transmission to the first and second memories, and for carrying the control information, addresses, and the data, wherein the multiline transceiver bus has a total number of lines less than a total number of bits in any single address, wherein the control information includes information for selecting one of the first and second memories without using any separate memory select line;

(G) configuration means for assigning a first identification value to the first memory and a second identification value to the second memory, wherein the configuration means further comprises:

(i) a first reset line for coupling the means for initiating data transmission to the first memory;

(ii) a second reset line for coupling the first memory to the second memory;

(iii) a first identification register for the first memory, wherein the first identification register is coupled to the first reset line and the multiline bus;

(iv) a second identification register for the second memory, wherein the second identification register is coupled to the second reset line and the multiline bus;

(v) means for generating a first reset signal and a second reset signal and for sending the first reset signal and the second reset signal to the first identification register of the first memory, wherein the generating means is coupled to the first reset line and the multiline bus, wherein the generating means also generates the first identification value and the second identification value;

(vi) means for propagating the first reset signal and the second reset signal from the first identification register of the first memory to the second identification register of the second memory, wherein the propagating means is coupled to the first identification register and the second reset line;

(vii) means in each of the first and second identification registers for resetting the first and second identification registers in response to the first reset signal, wherein the resetting means receives the first reset signal in the first identification register from the first reset line and in the second identified register from the second reset line;

(viii) means in each of the first and second identification registers for setting the first identification register to the first identification value and the second identification register to the second identification value in response to the second reset signal, wherein the setting means causes the first identification register to receive the first identification value from the generating means (1) the first reset line or (2) the multiline bus when the first identification register receives the second reset signal via the first reset line, wherein the setting means causes the second identification register to receive the second identification value from the generating means via (1) the first and second reset lines or (2) the multiline bus when the second identification register receives the second reset signal via the second reset line.

2. The apparatus of claim 1 for storing and retrieving data, wherein the first memory is a dynamic random access memory and the second memory is a dynamic random access memory.

3. The apparatus of claim 1 for storing and retrieving data, wherein the means for initiating data transmission is a processing unit.

4. The apparatus of claim 1 for storing and retrieving data, wherein the means for initiating data transmission is a central processing unit.

5. The apparatus of claim 1 for storing and retrieving data, wherein the means for initiating data transmission is a direct memory access unit.

6. The apparatus of claim 1 for storing and retrieving data, wherein the means for initiating data transmission is a floating point unit.

7. The apparatus of claim 1 for storing and retrieving data, wherein the means for initiating data transmission is a master.

8. The apparatus of claim 7 for storing and retrieving data, wherein the first memory and the second memory are each a slave.

9. The apparatus of claim 1 for storing and retrieving data, further comprising a master, wherein the means for initiating data transmission, the first memory, and the second memory are each a slave, wherein the master includes the means for generating the first reset signal and the second reset signal, and wherein the master is coupled to the multiline transceiver bus.

10. The apparatus of claim 1 for storing and retrieving data, further comprising a peripheral device coupled to the multiline transceiver bus.

11. The apparatus of claim 10 for storing and retrieving data, wherein the peripheral device is an input/output interface port.

12. The apparatus of claim 10 for storing and retrieving data, wherein the peripheral device is a video controller.

13. The apparatus of claim 10 for storing and retrieving data, wherein the peripheral device is a disk controller.

14. The apparatus of claim 1 for storing and retrieving data, wherein the multiline transceiver bus is in a different plane than a plane in which the multiline bus resides.

15. The apparatus of claim 1 for storing and retrieving data, wherein the multiline bus lies in a first plane and the multiline transceiver bus lies in a second plane orthogonal to the first plane.

16. The apparatus of claim 1 for storing and retrieving data, further comprising:

a second multiline transceiver bus;

a second transceiver for coupling the second multiline transceiver bus to the multiline transceiver bus, wherein the second multiline transceiver bus carries the control information, addresses, and data, and wherein the second multiline transceiver bus has a total number of lines less than a total number of bits in any single address.

17. An apparatus for storing and retrieving data for a system that includes a means for initiating data transmission, wherein the apparatus comprises:

(A) a first memory;

(B) a second memory;

(C) a multiline bus for coupling the means for initiating data transmission to the first and second memories, and for carrying control information, addresses, and the data, wherein the multiline bus has a total number of lines less than a total number of bits in any single address, wherein the control information includes information for selecting one of the first and second memories without using any separate memory select line;

(D) configuration means for assigning a first identification value to the first memory and a second identification value to the second memory, wherein the configuration means further comprises:

(i) a first reset line for coupling the means for initiating data transmission to the first memory;

(ii) a second reset line for coupling the first memory to the second memory;

(iii) a first identification register for the first memory, wherein the first identification register is coupled to the first reset line and the multiline bus;

(iv) a second identification register for the second memory, wherein the second identification register is coupled to the second reset line and the multiline bus;

(v) means for generating a first reset signal and a second reset signal and for sending the first reset signal and the second reset signal to the first identification register of the first memory, wherein the generating means is coupled to the first reset lien and the multiline bus, wherein the generating means also generates the first identification value and the second identification value;

(vi) means for propagating the first reset signal and the second reset signal from the first identification register of the first memory to the second identification register of the second memory, wherein the propagating means is coupled to the first identification register and the second reset line;

(vii) means in each of the first and second identification registers for resetting the first and second identification registers in response to the first reset signal, wherein the resetting means receives the first reset signal in the first identification register from the first reset line and in the second identification register from the second reset line;

(viii) means in each of the first and second identification registers for setting the first identification register to the first identification value and the second identification register to the second identification value in response to the second reset signal, wherein the setting means causes the first identification register to receive the first identification value from the generating means via (1) the first reset line or (2) the multiline bus when the first identification register receives the second reset signal via the first reset line, wherein the setting means causes the second identification register to receive the second identification value from the generating means via (1) the first and second reset lines or (2) the multiline bus when the second identification register receives the second reset signal via the second reset line.

18. An apparatus for storing and retrieving data, wherein the apparatus comprises:

(a) a master;

(b) a first memory;

(c) a second memory;

(d) a multiline bus for coupling the master to the first and second memories and for carrying control information, addresses, and the data, wherein the multiline bus has a total number of lines less than a total number of bits in any single address, wherein the control information includes information for selecting one of the first and second memories without using any separate memory select line;

(e) configuration means for assigning a first identification value to the first memory and a second identification value to the second memory, wherein the configuration means further comprises:

(i) a first reset line for coupling the master to the first memory;

(ii) a second reset line for coupling the first memory to the second memory;

(iii) a first identification register for the first memory, wherein the first identification register is coupled to the first reset line and the multiline bus;

(iv) a second identification register for the second memory, wherein the second identification register is coupled to the second reset line and the multiline bus;

(v) means for generating a first reset signal and a second reset signal and for sending the first reset signal and the second reset signal to the first identification register of the first memory, wherein the generating means is coupled to the first reset line and the multiline bus, wherein the generating means also generates the first identification value and the second identification value;

(vi) means for propagating the first reset signal and the second reset signal from the first identification register of the first memory to the second identification register of the second memory, wherein the propagating means is coupled to the first identification register and the second reset line;

(vii) means in each of the first and second identification registers for resetting the first and second identification registers in response to the first reset signal, wherein the resetting means receives the first reset signal from the first reset line in the first identification register and from the second reset line in the second identification register;

(viii) means in each of the first and the second identification registers for setting the first identification register to the first identification value and the second identification register to the second identification value in response to the second reset signal, wherein the setting means causes the first identification register to receive the first identification value from the generating means via (1) the first reset line or (2) the multiline bus when the first identification register receives the second reset signal via the first reset line, wherein the setting means causes the second identification register to receive the second identification value from the generating means via (1) the first and second reset lines or (2) the multiline bus when the second identification register receives the second reset signal via the second reset line.

19. The apparatus of claim 18 for storing and retrieving data, wherein the master is a central processing unit.

20. The apparatus of claim 18 for storing and retrieving data, wherein the master is a direct memory access unit.

21. The apparatus of claim 18 for storing and retrieving data, wherein the master is a floating point unit.

22. The apparatus of claim 18 for storing and retrieving data, wherein the first memory further comprises:

(A) at least one discrete memory section and (B) a modifiable address register adapted to store memory address information that corresponds to each discrete memory section.

23. The apparatus of claim 22 for storing and retrieving data, further comprising means for the master to request the first memory to prepare for a bus transaction by sending a request packet along the bus, wherein the first memory and the master each includes (1) a means for initiating an internal phase for preparing a bus access phase of the bus transaction and (2) a bus access means to effect the bus transaction during the bus access phase, wherein the request packet comprises a sequence of bytes containing first control information and a first address, wherein the first control information includes information about the requested bus transaction and about an access time, wherein the access time corresponds to a number of bus cycles that must intervene before beginning the bus access phase, and wherein the first address points to a memory location within the discrete memory section of the first memory.

24. The apparatus of claim 23 for storing and retrieving data, wherein the first memory includes means to read the first control information.

25. The apparatus of claim 23 for storing and retrieving data, wherein the first control information comprises an op code.

26. The apparatus of claim 25 for storing and retrieving data, wherein the first memory further comprises:

(A) a sense amplifier;

(B) means for transferring a data block during the bus transaction;

(C) response means, wherein the op code instructs the first memory to activate the response means, wherein the response means comprises means to (1) initiate the data block transfer;

(2) select a size of the data block;

(3) select a time to initiate the data block transfer;

(4) access a control register;

(5) precharge the sense amplifier before and after the data block transfer is complete;

(6) hold data the sense amplifier after the data block transfer is complete; and (7) select normal and page-mode access.

27. The apparatus of claim 26 for storing and retrieving data, wherein the data block transfer selectively comprises a read from and write to the first memory.

28. The apparatus of claim 23 for storing and retrieving data, further comprising means for the master to send to a specific one of the first and second memories via the bus a request packet containing first control information by including in the request packet an identification number unique to one of the first and second memories.

29. The apparatus of claim 23 for storing and retrieving data, further comprising means for the master to send to both the first and second memories via the bus a request packet containing first control information by including in the request packet a special identification number that is recognized by both the first and second memories.

30. The apparatus of claim 23 for storing and retrieving data, wherein the bus transaction is a data block transfer, and wherein the first control information further comprises a block-size value that specifies a size of the block of data to be transferred.

31. The apparatus of claim 23 for storing and retrieving data, further comprising means for generating and controlling a plurality of bus cycles during which the bus carries the control information, addresses, and data, and wherein alternate bus cycles are designated odd cycles and even cycles, respectively, and wherein the request packet begins only on an even cycle.

32. The apparatus of claim 22 for storing and retrieving data, wherein the first memory is a dynamic random access memory further comprising:

(A) a plurality of sense amplifiers;

(B) means to hold the sense amplifiers in an unmodified state after a selective read and write operation, wherein the first memory is left in page mode;

(C) means to precharge the sense amplifiers;

(D) means for selecting whether to (1) precharge the sense amplifiers or (2) hold the sense amplifiers in an unmodified state.

33. An apparatus for storing and retrieving data, wherein the apparatus comprises:

(a) means for initiating data transmission;

(b) a first memory;

(c) a second memory;

(d) a multiline bus for coupling the means for initiating data transmission to the first and second memories and for carrying control information, addresses, and the data, wherein the multiline bus has a total number of lines less than a total number of bits in any single address, wherein the control information includes information for selecting one of the first and second memories without using any separate memory select line;

(e) configuration means for assigning a first identification value to the first memory and a second identification value to the second memory, wherein the configuration means further comprises:

(i) a first reset line for coupling the means for initiating data transmission to the first memory;

(ii) a second reset line for coupling the first memory to the second memory;

(iii) a first identification register for the first memory, wherein the first identification register is coupled to the first reset line and the multiline bus;

(iv) a second identification register for the second memory, wherein the second identification register is coupled to the second reset line and the multiline bus;

(v) means for generating a first reset signal and a second reset signal and for sending the first reset signal and the second reset signal to the first identification register of the first memory, wherein the generating means is coupled to the first reset line and the multiline bus, wherein the generating means also generates the first identification value and the second identification value;

(vi) means for propagating the first reset signal and the second reset signal from the first identification register of the first memory to the second identification register of the second memory, wherein the propagating means is coupled to the first identification register and the second reset line;

(vii) means in each of the first and second identification registers for resetting the first and second identification registers in response to the first reset signal, wherein the resetting means receives the first reset signal from the first reset line in the first identification register and from the second reset line in the second identification register;

(viii) means in each of the first and second identification registers for setting the first identification register to the first identification value and the second identification register to the second identification value in response to the second reset signal, wherein the setting means causes the first identification register to receive the first identification value from the generating means via (1) the first reset line or (2) the multiline bus when the first identification register receives the second reset signal via the first reset line, wherein the setting means causes the second identification register to receive the second identification value from the generating means via (1) the first and second reset lines or (2) the multiline bus when the second identification register receives the second reset signal via the second reset line.

34. The apparatus of claim 33 for storing and retrieving data, wherein the means for setting the first identification register to the first identification value and the second identification register to the second identification value comprises circuitry for retrieving the first and second identification values from the multiline bus in response to the second reset signal.

35. The apparatus of claim 33 for storing and retrieving data, wherein the means for setting the first identification register to the first identification value and the second identification register to the second identification value comprises circuitry for retrieving the first and second identification values from the second reset signal.

36. The apparatus of claim 33 for storing and retrieving data, wherein the means propagating the first and second reset signals comprises a shift register.

37. The apparatus of claim 33 for storing and retrieving data, wherein the first memory is a dynamic random access memory and the second memory is a dynamic random access memory.

38. The apparatus of claim 33 for storing and retrieving data, wherein the means for initiating data transmission is a processing unit.

39. The apparatus of claim 33 for storing and retrieving data, wherein the means for initiating data transmission is a central processing unit.

40. The apparatus of claim 33 for storing and retrieving data, wherein the means for initiating data transmission is a direct memory access unit.

41. The apparatus of claim 33 for storing and retrieving data, wherein the means for initiating data transmission is a floating point unit.

42. The apparatus of claim 33 for storing and retrieving data, wherein the means for initiating data transmission is a master.

43. The apparatus of claim 42 for storing and retrieving data, wherein the first memory and the second memory are each a slave.

44. The apparatus of claim 42 for storing and retrieving data, wherein (A) the first memory includes:

(1) at least one discrete memory section;

(2) a modifiable address register;

(B) the master includes:

(1) means for selecting and testing each discrete memory section of the first memory;

(2) means for avoiding a nonfunctional discrete memory section, wherein the avoiding means is responsive to the means for selecting and testing, wherein the avoiding means stores in the modifiable address register address information corresponding to each discrete memory section.

45. The apparatus of claim 33 for storing and retrieving data, wherein the first memory is a master.

46. The apparatus of claim 33 for storing and retrieving data, wherein the means for initiating data transmission and the first memory are each a master.

47. The apparatus of claim 33 for storing and retrieving data, further comprising a master, wherein the means for initiating data transmission, the first memory, and the second memory are each a slave, and wherein the means for generating the first and second reset signals reside within the master.

48. The apparatus of claim 33 for storing and retrieving data, wherein the means for initiating data transmission comprises a first master and wherein the means for generating the first and second reset signals resides within the means for initiating data transmission.

49. The apparatus of claim 48 for storing and retrieving data, wherein the means for initiating data transmission further comprises means for assigning a first master identification value to the means for initiating data transmission.

50. The apparatus of claim 49 for storing and retrieving data, further comprising:

a second master;

means for the first master to assign a second master identification value to the second master.

51. The apparatus of claim 33 for storing and retrieving data, wherein the first memory includes a first memory type register and a first access time register;

the second memory includes a second memory type register and a second access time register.

52. The apparatus of claim 51 for storing and retrieving data, wherein the means for initiating data transmission is a master that comprises:

means for reading the first memory type register and determining a memory type of the first memory;

means for reading the first access time register and determining an access time of the first memory;

means for reading the second memory type register and determining a memory type of the second memory;

means for reading the second access time register and determining an access time of the second memory.

53. The apparatus of claim 33 for storing and retrieving data, wherein (A) each line of the multiline bus is a transmission line and (B) the control information, addresses, and data carried by the bus are all low-voltage swing signals.

54. The apparatus of claim 53 for storing and retrieving data, wherein each transmission line is terminated.

55. The apparatus of claim 53 for storing and retrieving data, wherein (A) the first memory includes a first current mode driver coupled to a line of the multibit bus.;

(B) the second memory includes a second current mode driver coupled to the line of the multibit bus.

56. The apparatus of claim 5 for storing and retrieving data, wherein the low-voltage swing signals swing between an upper voltage and a lower voltage.

57. The apparatus of claim 56 for storing and retrieving data, wherein the upper voltage is approximately two volts.

58. The apparatus of claim 56 for storing and retrieving data, wherein a difference between the upper voltage and the lower voltage is approximately 500 millivolts.

59. The apparatus of claim 53 for storing and retrieving data, wherein the first memory further comprises (A) two input receivers coupled to a line of the multibit bus;

(B) selection means for maximizing bandwidth by selecting the two input receivers alternately to sense the low voltage swing signals.

* * * * *